US011937500B2

(12) United States Patent
Kim et al.

(10) Patent No.: US 11,937,500 B2
(45) Date of Patent: Mar. 19, 2024

(54) ORGANIC LIGHT-EMITTING DEVICE

(71) Applicant: Samsung Display Co., Ltd., Yongin-si (KR)

(72) Inventors: Younsun Kim, Yongin-si (KR); Seulong Kim, Yongin-si (KR); Dongwoo Shin, Yongin-si (KR); Jungsub Lee, Yongin-si (KR); Naoyuki Ito, Yongin-si (KR); Jino Lim, Yongin-si (KR); Hyein Jeong, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 15/197,621

(22) Filed: Jun. 29, 2016

(65) Prior Publication Data

US 2017/0179402 A1 Jun. 22, 2017

(30) Foreign Application Priority Data

Dec. 22, 2015 (KR) ........................ 10-2015-0184072

(51) Int. Cl.
*H10K 85/60* (2023.01)
*H10K 50/11* (2023.01)
(Continued)

(52) U.S. Cl.
CPC ........... *H10K 85/654* (2023.02); *H10K 50/11* (2023.02); *H10K 50/13* (2023.02); *H10K 50/155* (2023.02);
(Continued)

(58) Field of Classification Search
CPC .............. H01L 51/0067; H01L 51/0071–0074
See application file for complete search history.

(56) References Cited

U.S. PATENT DOCUMENTS 5,393,614 A * 2/1995 Nakada .................. H05B 33/12 313/504
6,387,544 B1 5/2002 Thompson et al.
(Continued)

FOREIGN PATENT DOCUMENTS

CN 1708475 A 12/2005
CN 101079472 A 11/2007
(Continued)

OTHER PUBLICATIONS

Machine Translation of WO2015133804 A1. Sep. 11, 2015.*
Definition of buffer. http://www.dictionary.com/browse/buffer?s=t. As viewed on Apr. 12, 2018. (Year: 2018).*
Machine Translation of JP2006-256979A. Sep. 28, 2006. (Year: 2006).*
Machine Translation of WO2015099481 A1. Jul. 2, 2015. (Year: 2015).*
Machine Translation of JP2008-243932A. Oct. 9, 2008. (Year: 2008).*
(Continued)

*Primary Examiner* — Stephen E Rieth
(74) *Attorney, Agent, or Firm* — Lewis Roca Rothgerber Christie LLP

(57) ABSTRACT

An organic light emitting device including a first electrode, a second electrode facing the first electrode, an emission layer between the first electrode and the second electrode, a hole transport region between the first electrode and the emission layer, and an electron transport region between the emission layer and the second electrode, wherein the electron transport region may include a first compound represented by one selected from Formulae 1A to 1E, and at least one selected from the hole transport region and the electron transport region may include a second compound represented by Formula 2A or 2B:

Formula 1A

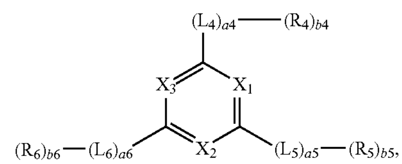

Formula 1B

Formula 1C

Formula 1D (Continued)

-continued

Formula 1E

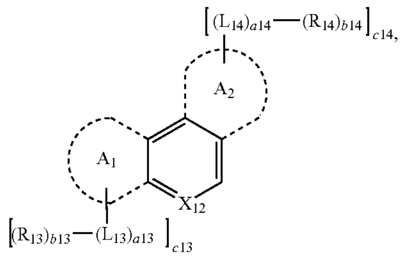

Formula 2A

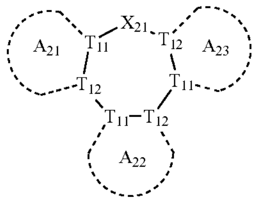

Formula 2B

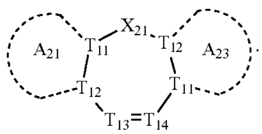

12 Claims, 2 Drawing Sheets

(51) Int. Cl.

| | |
|---|---|
| ***H10K 50/13*** | (2023.01) |
| ***H10K 50/155*** | (2023.01) |
| ***H10K 50/16*** | (2023.01) |
| ***H10K 50/17*** | (2023.01) |
| ***H10K 50/852*** | (2023.01) |
| ***H10K 85/30*** | (2023.01) |
| *H10K 50/15* | (2023.01) |
| *H10K 101/30* | (2023.01) |
| *H10K 101/40* | (2023.01) |

(52) U.S. Cl.

CPC ........... *H10K 50/16* (2023.02); *H10K 50/171* (2023.02); *H10K 50/852* (2023.02); *H10K 85/30* (2023.02); *H10K 85/615* (2023.02); *H10K 85/626* (2023.02); *H10K 85/657* (2023.02); *H10K 85/6572* (2023.02); *H10K 85/6574* (2023.02); *H10K 85/6576* (2023.02); *H10K 50/15* (2023.02); *H10K 2101/30* (2023.02); *H10K 2101/40* (2023.02)

(56) References Cited

U.S. PATENT DOCUMENTS 7,833,632 B2 11/2010 Kawamura et al.
8,154,195 B2 4/2012 Nishimura et al.
8,512,875 B2 8/2013 Kawamura et al.
8,859,111 B2 10/2014 Parham et al.
9,076,978 B2 7/2015 Lee et al.
9,093,652 B2 7/2015 Jung et al.
9,224,969 B2 12/2015 Song et al.
9,331,287 B2 5/2016 Hong et al.
9,520,567 B2 12/2016 Lee et al.
9,691,991 B2 6/2017 Hong et al.
10,164,195 B2 12/2018 Kim et al.
10,297,756 B2 5/2019 Lee et al.
2002/0096995 A1 7/2002 Mishima et al.
2003/0039858 A1 2/2003 Igarashi et al.
2003/0072965 A1 4/2003 Kimura
2003/0157364 A1 8/2003 Senoo et al.
2005/0089717 A1 4/2005 Cosimbescu et al.
2006/0061265 A1 3/2006 Kawamura et al.
2006/0105202 A1 5/2006 Kitamura
2006/0269781 A1 11/2006 Lai et al.
2007/0054151 A1 3/2007 Iwakuma et al.
2007/0200490 A1 8/2007 Kawamura et al.
2007/0215867 A1 9/2007 Kawakami et al.
2007/0267958 A1* 11/2007 Kitazawa ............... C09K 11/06 313/483
2007/0273273 A1 11/2007 Kim et al.
2008/0138654 A1 6/2008 Kathirgamanathan et al.
2009/0009065 A1 1/2009 Nishimura et al.
2009/0045730 A1 2/2009 Nishimura et al.
2009/0096357 A1 4/2009 Lee et al.
2009/0309492 A1 12/2009 Hofmann et al.
2010/0289008 A1* 11/2010 Jang .................... H01L 51/5052 257/40
2011/0156013 A1* 6/2011 Kim ..................... C07D 401/10 257/40
2011/0315965 A1 12/2011 Takashima et al.
2012/0091438 A1 4/2012 Yabunouchi et al.
2012/0104940 A1 5/2012 Shin et al.
2012/0153268 A1 6/2012 Kawamura et al.
2012/0217492 A1 8/2012 Kim et al.
2012/0235123 A1 9/2012 Lee et al.
2012/0256174 A1* 10/2012 Jung ...................... C09K 11/06 257/40
2013/0207082 A1 8/2013 Cho et al.
2014/0027744 A1 1/2014 Yoshida et al.
2014/0054564 A1 2/2014 Kim et al.
2014/0159005 A1 6/2014 Kawamura et al.
2014/0183466 A1 7/2014 Lee et al.
2014/0197394 A1 7/2014 Kim et al.
2014/0217393 A1 8/2014 Kato et al.
2014/0225072 A1 8/2014 Kim et al.
2014/0291631 A1* 10/2014 Lee ....................... H01L 51/508 257/40
2014/0336392 A1 11/2014 Kim et al.
2015/0053933 A1 2/2015 Lee et al.
2015/0060808 A1 3/2015 Kim et al.
2015/0102301 A1 4/2015 Cho et al.
2015/0155491 A1 6/2015 Mujica-Fernaud et al.
2015/0171348 A1 6/2015 Stoessel et al.
2015/0194610 A1 7/2015 Hwang et al.
2015/0207093 A1 7/2015 Kim et al.
2015/0325794 A1 11/2015 Nishimura et al.
2015/0340618 A1 11/2015 Lee et al.
2015/0340621 A1 11/2015 Parham et al.
2016/0226000 A1 8/2016 Kim et al.
2016/0308146 A1 10/2016 Parham et al.
2016/0322583 A1 11/2016 Kim et al.
2016/0351825 A1 12/2016 Kim et al.
2017/0179395 A1 6/2017 Kim et al.
2017/0179396 A1 6/2017 Kim et al.

FOREIGN PATENT DOCUMENTS

CN 101159316 A 4/2008
CN 101384560 A 3/2009
CN 101400757 A 4/2009
CN 102803437 A 11/2012
CN 103140564 A 6/2013
CN 103833507 A 6/2014
CN 103904252 A 7/2014
CN 104103765 A 10/2014
CN 104520308 A 4/2015
CN 104835921 A 8/2015
CN 106981576 B 7/2017
EP 2163550 A1 3/2010
EP 2484665 A1 8/2012
EP 2599851 A2 6/2013
JP 10-88119 A 4/1998
JP 2002234888 A 8/2002
JP 2006256979 A * 9/2006 .......... C07C 211/61

(56) References Cited

FOREIGN PATENT DOCUMENTS

| | | | | | |
|---|---|---|---|---|---|
| JP | 2008-177455 | A | | 7/2008 | |
| JP | 2008243932 | A | * | 10/2008 | |
| JP | 2011-100942 | A | | 5/2011 | |
| JP | 2015-13804 | A | | 1/2015 | |
| KR | 10-2007-0023676 | A | | 2/2007 | |
| KR | 10-2008-0080513 | A | | 9/2008 | |
| KR | 10-2010-0017136 | A | | 2/2010 | |
| KR | 10-2010-0039369 | A | | 4/2010 | |
| KR | 10-2010-0040901 | A | | 4/2010 | |
| KR | 10-2011-0008619 | A | | 1/2011 | |
| KR | 10-2011-0106193 | A | | 9/2011 | |
| KR | 10-2011-0117549 | | | 10/2011 | |
| KR | 10-2012-0022861 | A | | 3/2012 | |
| KR | 10-2012-0052316 | A | | 5/2012 | |
| KR | 10-2012-0092550 | A | | 8/2012 | |
| KR | 10-2012-0092555 | A | | 8/2012 | |
| KR | 10-2012-0100709 | A | | 9/2012 | |
| KR | 10-2013-0028813 | A | | 3/2013 | |
| KR | 10-2013-0093327 | A | | 8/2013 | |
| KR | 10-2013-0098225 | A | | 9/2013 | |
| KR | 10-2013-0098229 | A | | 9/2013 | |
| KR | 10-2014-0034709 | A | | 3/2014 | |
| KR | 10-2014-0074286 | A | | 6/2014 | |
| KR | 10-2014-0085110 | A | | 7/2014 | |
| KR | 10-2014-0087882 | A | | 7/2014 | |
| KR | 10-2014-0102089 | A | | 8/2014 | |
| KR | 10-2014-0103007 | A | | 8/2014 | |
| KR | 10-2014-0119642 | A | | 10/2014 | |
| KR | 10-2014-0128653 | A | | 11/2014 | |
| KR | 10-2014-0135525 | A | | 11/2014 | |
| KR | 10-2015-0001101 | A | | 1/2015 | |
| KR | 10-2015-0008678 | A | | 1/2015 | |
| KR | 10-2015-0021861 | A | | 3/2015 | |
| KR | 10-2015-0024491 | A | | 3/2015 | |
| KR | 10-2015-0026114 | A | | 3/2015 | |
| KR | 10-2015-0034612 | A | | 4/2015 | |
| KR | 10-2015-0037119 | A | | 4/2015 | |
| KR | 10-2015-0039136 | A | | 4/2015 | |
| KR | 10-2015-0041931 | A | | 4/2015 | |
| KR | 10-2015-0070897 | A | | 6/2015 | |
| KR | 10-2015-0077284 | A | | 7/2015 | |
| KR | 10-2015-0081736 | A | | 7/2015 | |
| KR | 10-2015-0086095 | A | | 7/2015 | |
| KR | 10-2015-0088066 | A | | 7/2015 | |
| KR | 2015080966 | A | * | 7/2015 | .......... C07D 403/10 |
| KR | 10-2015-0103945 | A | | 9/2015 | |
| KR | 20150121394 | A | * | 10/2015 | |
| KR | 20150124609 | A | * | 11/2015 | |
| KR | 20150135626 | A | * | 12/2015 | |
| KR | 10-2016-0094834 | A | | 8/2016 | |
| WO | 00/033617 | A1 | | 6/2000 | |
| WO | 2004/041774 | A1 | | 5/2004 | |
| WO | WO 2007/029403 | A1 | | 3/2007 | |
| WO | WO 2007/063986 | A1 | | 6/2007 | |
| WO | WO 2011/010839 | A1 | | 1/2011 | |
| WO | WO 2011/055932 | A2 | | 5/2011 | |
| WO | 2012/005364 | A1 | | 1/2012 | |
| WO | WO 2012/015274 | A2 | | 2/2012 | |
| WO | WO 2012/070233 | A1 | | 5/2012 | |
| WO | WO 2013/035329 | A1 | | 3/2013 | |
| WO | WO 2013/039184 | A1 | | 3/2013 | |
| WO | WO 2013/182263 | A1 | | 12/2013 | |
| WO | WO 2014/094964 | A1 | | 6/2014 | |
| WO | 2014/129869 | A1 | | 8/2014 | |
| WO | WO 2015/082046 | A2 | | 6/2015 | |
| WO | WO 2015/093812 | A1 | | 6/2015 | |
| WO | WO-2015099481 | A1 | * | 7/2015 | ......... H01L 51/0054 |
| WO | WO-2015133804 | A1 | * | 9/2015 | .......... C07D 487/14 |
| WO | WO 2015/160224 | A1 | | 10/2015 | |
| WO | 2015/167259 | A1 | | 11/2015 | |
| WO | WO 2015/190718 | A1 | | 12/2015 | |
| WO | 2016/058504 | A1 | | 4/2016 | |
| WO | 2016/122178 | A2 | | 8/2016 | |

OTHER PUBLICATIONS

Definition of alkylenes. IUPAC Compendium of Chemical Terminology. 2014. (Year: 2014).*

Machine Translation of KR2015-0121394A. Oct. 29, 2015. (Year: 2015).*

Machine Translation of KR2015-0124609A. Nov. 6, 2015. (Year: 2015).*

Machine Translation of KR2015-0135626A. Dec. 3, 2015. (Year: 2015).*

Machine Translation of KR2015-0080966A. Jul. 13, 2015. (Year: 2015).*

Rodrigo et al., "Cancentrine. IV. Acetolysis Products of Cancentrine Methiodide," Canadian Journal of Chemistry, Aug. 2, 1972, 50, pp. 3900-3910.

EPO Extended Search Report dated May 3, 2017, for corresponding European Patent Application No. 16191373.6 (6 pages).

EPO Extended Search Report dated Nov. 4, 2016, corresponding to European Patent Application No. 16191351.2 (6 pages).

EPO Extended Search Report dated May 2, 2017, corresponding to European Patent Application No. 16195444.1 (8 pages).

EPO Extended Search Report dated May 2, 2017, corresponding to European Patent Application No. 16195460.7 (8 pages).

U.S. Office Action dated Oct. 5, 2017, issued in U.S. Appl. No. 15/187,665 (17 pages).

U.S. Office Action dated Oct. 19, 2017, issued in U.S. Appl. No. 15/192,848 (23 pages).

U.S. Office Action dated Feb. 22, 2018, issued in U.S. Appl. No. 15/284,371 (15 pages).

U.S. Final Office Action dated Mar. 27, 2018, issued in U.S. Appl. No. 15/187,665 (13 pages).

U.S. Office Action dated Apr. 12, 2018, issued in U.S. Appl. No. 15/177,360 (12 pages).

U.S. Notice of Allowance dated Jul. 18, 2018, issued in U.S. Appl. No. 15/284,371 (10 pages).

U.S. Final Office Action dated Oct. 1, 2018, issued in U.S. Appl. No. 15/177,360 (12 pages).

U.S. Office Action dated Oct. 16, 2018, issued in U.S. Appl. No. 15/220,636 (10 pages).

U.S. Office Action dated Jan. 18, 2019, issued in U.S. Appl. No. 15/177,360 (6 pages).

Extended European Search Report for European Application No. 16191328.0, dated May 3, 2017, 7 pages.

Wei, Yi, et al.; Emission Mechanism of Doubly ortho-Linked Quinoxaline/Diphenylfluorene or cis-Stilbene/Fluorene Hybrid Compounds Based on the Transient Absorption and Emission Measurements during Pulse Radiolysis, Article, Journal of the American Chemical Society, The Society, vol. 131, No. 19, May 20, 2009, pp. 6698-6707.

Machine Translation of KR 10-2015-0001101 listed above, 55 pages.

U.S. Office Action dated Feb. 21, 2019, issued in U.S. Appl. No. 15/292,040 (13 pages).

European Patent Office Extended Search Report, dated May 3, 2017, for Patent Application No. EP 16191361.1, 7 pages.

Ran, Xue-Qin et al., "Structural, electronic, and optical properties of doubly ortho-linked quinoxaline/diphenylfluorene hybrids", Journal of Physical Organic Chemistry, Nov. 9, 2010, pp. 646-656, John Wiley & Sons, Ltd.

English machine translation of CN 104835921 A, published Aug. 12, 2015, 28 pages.

Office action issued in U.S. Appl. No. 15/220,636 by the USPTO, dated Jun. 27, 2019, 11 pages.

U.S. Office Action dated May 14, 2019, for U.S. Appl. No. 15/192,848, 20 pages.

U.S. Final Office action dated Apr. 10, 2020, issued in U.S. Appl. No. 15/192,848 (21 pages).

Koene, Bryan E., et al.; Asymmetric Triaryldiamines as Thermally Stable Hole Transporting Layers for Organic Light-Emitting Devices, American Chemical Society, 1998, Chemical Materials, vol. 10, pp. 2235-2250.

Office Action issued in U.S. Appl. No. 15/292,040 by the USPTO, dated Dec. 16, 2019, 16 pages.

(56) References Cited

OTHER PUBLICATIONS

Office Action issued in U.S. Appl. No. 15/294,638 by the USPTO, dated Dec. 17, 2019, 14 pages.
Office Action issued in U.S. Appl. No. 15/220,636 by the USPTO, dated Mar. 12, 2020, 12 pages.
Office Action issued in U.S. Appl. No. 15/192,848 by the USPTO, dated Nov. 20, 2019, 23 pages.
Office Action issued in U.S. Appl. No. 15/220,636 by the USPTO, dated Dec. 2, 2019, 11 pages.
Machine English Translation of Enomoto et al. (JP 10088119 A). Jun. 18, 2020.
Hu, J-Y and Yamato, T. Synthesis and photophysical properties of pyrene-based multiply conjugated shaped light-emitting architectures: toward efficient organic-light-emitting diodes. Organic Light Emitting Diode—Material, Process and Devices. InTech. Chapter 2, pp. 21-60. Jul. 27, 2011. (Year: 2011).
U.S. Final Office Action dated Jun. 23, 2020, issued in U.S. Appl. No. 15/292,040 (17 pages).
U.S. Office Action dated Jul. 31, 2020, issued in U.S. Appl. No. 15/187,665 (16 pages).
U.S. Final Office action dated Mar. 8, 2021, issued in U.S. Appl. No. 15/192,848 (29 pages).
Google Patents translation for WO 2016/122178 A2 (publication date: Aug. 2016). (Year: 2016).
European Patent Office Summons to attend oral proceedings pursuant to Rule 115(1) EPC, for European Patent Application No. 16191351.2, dated Sep. 8, 2020, 5 pages.
U.S. Office Action dated Dec. 7, 2020, issued in U.S. Appl. No. 15/220,636 (10 pages).
Machine Translation of WO 2014/129869 A1. Aug. 28, 2014. (Year: 2014).
U.S. Office Action dated Sep. 30, 2020, issued in U.S. Appl. No. 15/192,848, citing references listed above (37 pages).
Machine English translation of Huang et al. (WO-2016/058504 A1 ). Nov. 16, 2020.
U.S. Office Action dated Nov. 19, 2020, issued in U.S. Appl. No. 15/292,040 (17 pages).
Machine English translation of Mizuki et al. (JP 2015013804 A). May 20, 2021.
Dyes and Pigments, vol. 114, (2015), pp. 184-195. (Year: 2015).
Machine Translation of WO2016/122178A. Aug. 4, 2016 (Year: 2016).
Application KR10-2015-0012223. Filed Jan. 6, 2015. (Year: 2015).
Machine Translation of KR20160091735A, corresponding to application KR10-2015-0012223. Filed Jan. 6, 2015. (Year: 2015).
U.S. Advisory Action dated Mar. 29, 2021, issued in U.S. Appl. No. 15/187,665 (6 pages).
U.S. Final Office Action dated May 4, 2021, issued in U.S. Appl. No. 15/294,638 (18 pages).
U.S. Notice of Allowance dated May 5, 2021, issued in U.S. Appl. No. 15/220,636 (9 pages).
U.S. Final Office Action dated May 25, 2021, issued in U.S. Appl. No. 15/292,040 (16 pages).
U.S. Office Action dated Jun. 28, 2021, issued in U.S. Appl. No. 15/192,848 (23 pages).
Chinese Office Action dated Jan. 6, 2022, for Application No. 201911253625.8, 6 pages.
Interview Summary for for U.S. Appl. No. 15/220,636 dated Oct. 9, 2020, 4 pages.
Office Action for U.S. Appl. No. 15/294,638 dated Apr. 4, 2019, 14 pages.
Partial English Translation of relevant parts of JP 2008-177455 A dated Jul. 31, 2008, listed above.
Partial English Translation of relevant parts of KR 10-2015-0103945 A dated Sep. 14, 2015, listed above.
Final Office Action for U.S. Appl. No. 15/294,638 dated Oct. 5, 2022, 25 pages.
Notice of Allowance for U.S. Appl. No. 15/177,360 dated Aug. 29, 2022, 5 pages.
Notice of Allowance for U.S. Appl. No. 15/220,636 dated Sep. 29, 2022, 5 pages.
Notice of Allowance for U.S. Appl. No. 15/220,636 dated Feb. 25, 2022, 5 pages.
Notice of Allowance for U.S. Appl. No. 15/220,636 dated Jun. 1, 2022, 9 pages.
Office Action for U.S. Appl. No. 15/292,040 dated Jun. 7, 2022, 15 pages.
Office Action for U.S. Appl. No. 15/294,638 dated May 10, 2022, 25 pages.
Wang, L. et al., "Synthesis and Characterization of Dibenzo[a,d]cyclohepten-5-one Derivatives for Light-Emitting Diodes," Chinese Journal of Chemistry, vol. 33, Issue 8, Aug. 2015, pp. 948-954.
Final Rejection for U.S. Appl. No. 15/292,040 dated Dec. 2, 2022, 15 pages.
Advisory Action for U.S. Appl. No. 15/177,360 dated Aug. 19, 2019,2 pages.
Advisory Action for U.S. Appl. No. 15/177,360 dated Dec. 6, 2018, 2 pages.
Advisory Action for U.S. Appl. No. 15/187,665 dated Apr. 13, 2020, 6 pages.
Advisory Action for U.S. Appl. No. 15/187,665 dated Jun. 28, 2019, 4 pages.
Advisory Action for U.S. Appl. No. 15/187,665 dated Jun. 6, 2018, 5 pages.
Advisory Action for U.S. Appl. No. 15/192,848 dated May 14, 2021, 4 pages.
Advisory Action for U.S. Appl. No. 15/192,848 dated Jun. 17, 2020, 4 pages.
Advisory Action for U.S. Appl. No. 15/192,848 dated Jul. 5, 2019, 5 pages.
Advisory Action for U.S. Appl. No. 15/192,848 dated Jul. 9, 2018, 5 pages.
Advisory Action for U.S. Appl. No. 15/220,636 dated Oct. 19, 2020, 3 pages.
Advisory Action for U.S. Appl. No. 15/220,636 dated Feb. 12, 2020, 3 pages.
Advisory Action for U.S. Appl. No. 15/220,636 dated May 24, 2019, 3 pages.
Advisory Action for U.S. Appl. No. 15/292,040 dated Jan. 26, 2023, 3 pages.
Advisory Action for U.S. Appl. No. 15/292,040 dated Jul. 26, 2021, 3 pages.
Advisory Action for U.S. Appl. No. 15/292,040 dated Sep. 4, 2020, 3 pages.
Advisory Action for U.S. Appl. No. 15/292,040 dated Sep. 26, 2019, 3 pages.
Advisory Action for U.S. Appl. No. 15/294,638 dated Dec. 19, 2022,3 pages.
Advisory Action for U.S. Appl. No. 15/294,638 dated Jul. 12, 2021, 3 pages.
Advisory Action for U.S. Appl. No. 15/294,638 dated Sep. 8, 2020, 3 pages.
Advisory Action for U.S. Appl. No. 15/294,638 dated Nov. 12, 2019, 3 pages.
Final Office Action for U.S. Appl. No. 15/177,360 dated Jun. 14, 2019, 11 pages.
Final Office Action for U.S. Appl. No. 15/177,360 dated Oct. 1, 2018, 12 pages.
Final Office Action for U.S. Appl. No. 15/187,665 dated Jan. 19, 2021, 10 pages.
Final Office Action for U.S. Appl. No. 15/187,665 dated Feb. 7, 2020, 14 pages.
Final Office Action for U.S. Appl. No. 15/187,665 dated Apr. 19, 2019, 12 pages.
Final Office Action for U.S. Appl. No. 15/192,848 dated Apr. 23, 2018, 9 pages.
Final Office Action for U.S. Appl. No. 15/220,636 dated Aug. 11, 2020, 13 pages.
Final Office Action for U.S. Appl. No. 15/220,636 dated Mar. 28, 2019, 10 pages.

(56) References Cited

OTHER PUBLICATIONS

Final Office Action for U.S. Appl. No. 15/292,040 dated Jul. 3, 2019, 11 pages.
Final Office Action for U.S. Appl. No. 15/294,638 dated Jun. 26, 2020, 11 pages.
Final Office Action for U.S. Appl. No. 15/294,638 dated Aug. 28, 2019, 18 pages.
Notice of Allowance for U.S. Appl. No. 15/177,360 dated Dec. 22, 2021, 5 pages.
Notice of Allowance for U.S. Appl. No. 15/177,360 dated Dec. 21, 2022, 5 pages.
Notice of Allowance for U.S. Appl. No. 15/177,360 dated May 10, 2022, 5 pages.
Notice of Allowance for U.S. Appl. No. 15/177,360 dated Jul. 21, 2021, 5 pages.
Notice of Allowance for U.S. Appl. No. 15/177,360 dated Mar. 24, 2021, 5 pages.
Notice of Allowance for U.S. Appl. No. 15/177,360 dated Dec. 2, 2020, 5 pages.
Notice of Allowance for U.S. Appl. No. 15/177,360 dated Aug. 12, 2020, 5 pages.
Notice of Allowance for U.S. Appl. No. 15/177,360 dated Apr. 23, 2020, 8 pages.
Notice of Allowance for U.S. Appl. No. 15/220,636 dated Nov. 18, 2021, 5 pages.
Notice of Allowance for U.S. Appl. No. 15/220,636 dated Aug. 6, 2021, 7 pages.
Notice of Allowance for U.S. Appl. No. 15/220,636 dated Feb. 1, 2023, 5 pages.
Office Action for U.S. Appl. No. 15/177,360 dated Sep. 26, 2019, 10 pages.
Office Action for U.S. Appl. No. 15/187,665 dated Oct. 25, 2018, 15 pages.
Office Action for U.S. Appl. No. 15/187,665 dated Sep. 23, 2019, 12 pages.
Office Action for U.S. Appl. No. 15/192,848 dated Dec. 4, 2018, 16 pages.
Office Action for U.S. Appl. No. 15/294,638 dated Apr. 4, 2019, 13 pages.
Office Action for U.S. Appl. No. 15/294,638 dated Nov. 30, 2020, 11 pages.
Restriction Requirement for U.S. Appl. No. 15/177,360 dated Dec. 19, 2017, 7 pages.
Restriction Requirement for U.S. Appl. No. 15/220,636 dated Jun. 22, 2018, 6 pages.
Restriction Requirement for U.S. Appl. No. 15/284,371 dated Nov. 27, 2017, 7 pages.
Restriction Requirement for U.S. Appl. No. 15/292,040 dated Oct. 4, 2018, 5 pages.
Chinese Office Action for CN Application No. 202010755903.6 dated Jan. 12, 2023, 13 pages.
Office Action for U.S. Appl. No. 15/294,638 dated Feb. 23, 2023, 20 pages.
Notice of Allowance for U.S. Appl. No. 15/177,360 dated Apr. 10, 2023, 5 pages.

* cited by examiner

ORGANIC LIGHT-EMITTING DEVICE

CROSS-REFERENCE TO RELATED APPLICATION

This application claims priority to and the benefit of Korean Patent Application No. 10-2015-0184072, filed on Dec. 22, 2015, in the Korean Intellectual Property Office, the entire content of which is incorporated herein by reference.

BACKGROUND

1. Field

One or more aspects of example embodiments of the present disclosure are related to an organic light-emitting device.

2. Description of the Related Art

Organic light-emitting devices are self-emission devices that have wide viewing angles, high contrast ratios, short response times, and/or excellent brightness, driving voltage, and/or response speed characteristics, and may produce full-color images.

An example organic light-emitting device may include a first electrode on a substrate, and a hole transport region, an emission layer, an electron transport region, and a second electrode sequentially positioned on the first electrode. Holes provided from the first electrode may move toward the emission layer through the hole transport region, and electrons provided from the second electrode may move toward the emission layer through the electron transport region. Carriers (such as holes and electrons) may recombine in the emission layer to produce excitons. These excitons may transition (e.g., radiatively decay) from an excited state to the ground state to thereby generate light.

SUMMARY

One or more aspects of example embodiments of the present disclosure are directed toward an organic light-emitting device that has a low driving voltage and high efficiency.

Additional aspects will be set forth in part in the description which follows and, in part, will be apparent from the description, or may be learned by practice of the presented embodiments.

One or more example embodiments of the present disclosure provide an organic light-emitting device including:

a first electrode;

a second electrode facing the first electrode;

an emission layer between the first electrode and the second electrode;

a hole transport region between the first electrode and the emission layer; and an electron transport region between the emission layer and the second electrode;

wherein the electron transport region includes a first compound, at least one selected from the hole transport region and the electron transport region includes a second compound, the first compound is represented by one selected from Formulae 1A to 1E, and the second compound is represented by Formula 2A or 2B:

Formula 1A

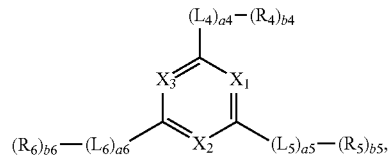

Formula 1B

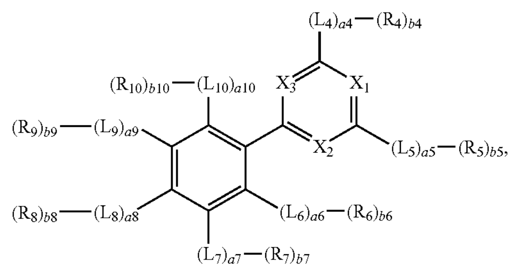

Formula 1C

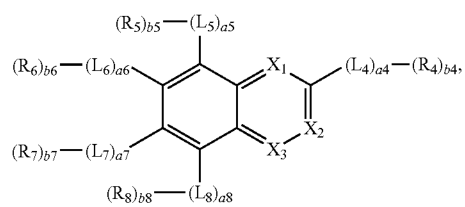

Formula 1D

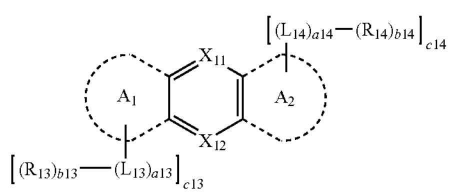

Formula 1E

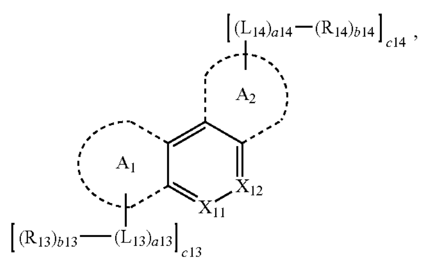

Formula 2A

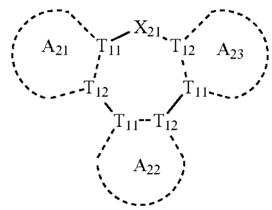

Formula 2B

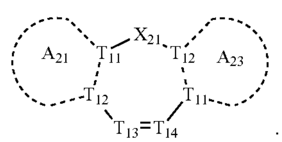

In Formulae 1A to 1E, 2A, and 2B, rings $A_1$ and $A_2$ may each independently be a $C_5$-$C_{60}$ carbocyclic group or a $C_1$-$C_{30}$ heterocyclic group, rings $A_{21}$, $A_{22}$, and $A_{23}$ may each independently be a $C_5$-$C_{60}$ carbocyclic group or a $C_1$-$C_{30}$ heterocyclic group, each substituted with at least one *-[$(L_{22})_{a22}$-$(R_{22})_{b22}$], each $T_{11}$ and each $T_{12}$ may independently be carbon (C) or nitrogen (N), any two or more of the three $T_{11}$(s) in Formula 2A may be identical to or different from each other, $T_{13}$ may be N or C($R_{27}$), $T_{14}$ may be N or C($R_{28}$), any two or more of the three $T_{12}$(s) in Formula 2A may be identical to or different from each other, the two $T_{11}$(s) in Formula 2B may be identical to or different from each other, the two $T_{12}$(s) in Formula 2B may be identical to or different from each other, and each bond between $T_{11}$ and $T_{12}$ may be a single bond or a double bond; wherein the three $T_{11}$(s) and three $T_{12}$(s) in Formula 2A are not all nitrogen, and the two $T_{11}$(s), two $T_{12}$(s), $T_{13}$, and $T_{14}$ in Formula 2B are not all nitrogen, rings $A_{21}$, $A_{22}$, and $A_{23}$ may each be condensed (e.g., fused) with a central 7-membered ring in Formulae 2A and 2B, such that they each share a $T_{11}$ and a $T_{12}$ with the central 7-membered ring, $X_1$ may be N or C-$(L_1)_{a1}$-$(R_1)_{b1}$, $X_2$ may be N or C-$(L_2)_{a2}$-$(R_2)_{b2}$, $X_3$ may be N or C-$(L_3)_{a3}$-$(R_3)_{b3}$, and at least one selected from $X_1$ to $X_3$ may be N, $X_{11}$ may be N or C-$(L_{11})_{a11}$-$(R_{11})_{b11}$, and $X_{12}$ may be N or C-$(L_{12})_{a12}$-$(R_{12})_{b12}$, $X_{21}$ may be selected from O, S, Se, C($R_{23}$)($R_{24}$), Si($R_{23}$)($R_{24}$), and N-[$(L_{21})_{a21}$-$(R_{21})_{b21}$], $L_1$ to $L_{14}$, $L_{21}$, and $L_{22}$ may each independently be selected from a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group, a1 to a14, a21, and a22 may each independently be an integer selected from 0 to 5, $R_1$ to $R_{14}$, $R_{21}$ to $R_{24}$, $R_{27}$, and $R_{28}$ may each independently be selected from hydrogen, deuterium, —F, —Cl, —Br, —I, a hydroxyl group, a cyano group, a nitro group, an amidino group, a hydrazino group, a hydrazono group, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —Si($Q_1$)($Q_2$)($Q_3$), —N($Q_1$)($Q_2$), —B($Q_1$)($Q_2$), —C(=O)($Q_1$), —S(=O)$_2$($Q_1$), and —P(=O)($Q_1$)($Q_2$), b1 to b14, b21, and b22 may each independently be an integer selected from 0 to 4, c13 and c14 may each independently be an integer selected from 0 to 5, $R_1$ and $R_4$ may be optionally connected (e.g., coupled) to form a saturated or unsaturated ring, and $R_1$ and $R_5$ may be optionally connected (e.g., coupled) to form a saturated or unsaturated ring, and at least one substituent of the substituted $C_3$-$C_{10}$ cycloalkylene group, the substituted $C_1$-$C_{10}$ heterocycloalkylene group, the substituted $C_3$-$C_{10}$ cycloalkenylene group, the substituted $C_1$-$C_{10}$ heterocycloalkenylene group, the substituted $C_6$-$C_{60}$ arylene group, the substituted $C_1$-$C_{60}$ heteroarylene group, the substituted divalent non-aromatic condensed polycyclic group, the substituted divalent non-aromatic condensed heteropolycyclic group, the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_6$-$C_{60}$ aryloxy group, the substituted $C_6$-$C_{60}$ arylthio group, the substituted $C_1$-$C_{60}$ heteroaryl group, the substituted monovalent non-aromatic condensed polycyclic group, and the substituted monovalent non-aromatic condensed heteropolycyclic group may be selected from the group consisting of:

deuterium, —F, —Cl, —Br, —I, a hydroxyl group, a cyano group, a nitro group, an amidino group, a hydrazino group, a hydrazono group, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from deuterium, —F, —Cl, —Br, —I, a hydroxyl group, a cyano group, a nitro group, an amidino group, a hydrazino group, a hydrazono group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —Si($Q_{11}$)($Q_{12}$)($Q_{13}$), —N($Q_{11}$)($Q_{12}$), —B($Q_{11}$)($Q_{12}$), —C(=O)($Q_{11}$), —S(=O)$_2$($Q_{11}$), and —P(=O)($Q_{11}$)($Q_{12}$), a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, a biphenyl group, and a terphenyl group;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group, each substituted with at least one selected from deuterium, —F, —Cl, —Br, —I, a hydroxyl group, a cyano group, a nitro group, an amidino group, a hydrazino group, a hydrazono group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —Si($Q_{21}$)($Q_{22}$)($Q_{23}$), —N($Q_{21}$)($Q_{22}$), —B($Q_{21}$)($Q_{22}$), —(=O)($Q_{21}$), —S(=O)$_2$($Q_{21}$), and —P(=O)($Q_{21}$)($Q_{22}$); and —Si($Q_{31}$)($Q_{32}$)($Q_{33}$), —N($Q_{31}$)($Q_{32}$), —B($Q_{31}$)($Q_{32}$), —C(=O)($Q_{31}$), —S(=O)$_2$($Q_{31}$), and —P(=O)($Q_{31}$)($Q_{32}$), wherein $Q_1$ to $Q_3$, $Q_{11}$ to $Q_{13}$, $Q_{21}$ to $Q_{23}$, and $Q_{31}$ to $Q_{33}$ may each independently be selected from hydrogen, deuterium, —F, —Cl, —Br, —I, a hydroxyl group, a cyano group, a nitro group, an amidino group, a hydrazino group, a hydrazono group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryl group substituted with a $C_1$-$C_{60}$ alkyl group, a $C_6$-$C_{60}$ aryl group substituted with a $C_6$-$C_{60}$ aryl group, a terphenyl group, a $C_1$-$C_{60}$ heteroaryl group, a $C_1$-$C_{60}$ heteroaryl group substituted with a $C_1$-$C_{60}$ alkyl group, a $C_1$-$C_{60}$ heteroaryl group substituted with a $C_6$-$C_{60}$ aryl group, a monovalent non-aromatic condensed polycyclic group, and a monovalent non-aromatic condensed heteropolycyclic group.

BRIEF DESCRIPTION OF THE DRAWINGS

These and/or other aspects will become apparent and more readily appreciated from the following description of the example embodiments, taken in conjunction with the accompanying drawings in which.

DETAILED DESCRIPTION

Figure 1:
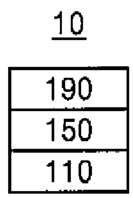
FIGS. 1 to 6 are schematic views of organic light-emitting devices according to one or more embodiments of the present disclosure.

Reference will now be made in more detail to example embodiments, examples of which are illustrated in the accompanying drawings, wherein like reference numerals refer to like elements throughout and duplicative descriptions thereof may not be provided. In this regard, the present example embodiments may have different forms and should not be construed as being limited to the descriptions set forth herein. Accordingly, the example embodiments are merely described below, by referring to the drawings, to explain aspects of the present description. Expressions such as "at least one selected from", "one of", and "selected from", when preceding a list of elements, modify the entire list of elements and do not modify the individual elements of the list.

The thicknesses of layers, films, panels, regions, etc., may be exaggerated in the drawings for clarity. It will be understood that when an element such as a layer, film, region, or substrate is referred to as being "on" another element, it can be directly on the other element or intervening element(s) may also be present. In contrast, when an element is referred to as being "directly on" another element, no intervening elements are present.

An organic light-emitting device according to an embodiment of the present disclosure may include a first electrode, a second electrode facing the first electrode, an emission layer between the first electrode and the second electrode, a hole transport region between the first electrode and the emission layer, and an electron transport region between the emission layer and the second electrode, wherein the electron transport region may include a first compound, and at least one selected from the hole transport region and the electron transport region may include a second compound.

The first compound may be represented by one selected from Formulae 1A to 1E, and the second compound may be represented by Formula 2A or 2B:

Formula 1A

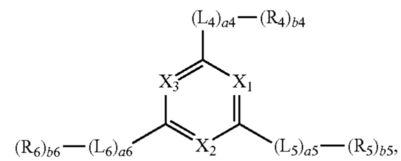

Formula 1B

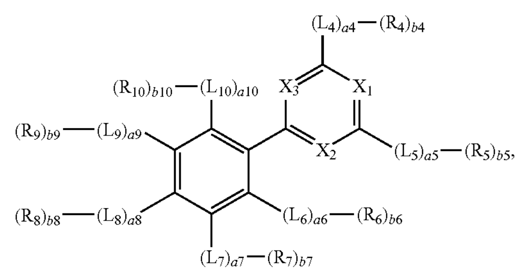

Formula 1C

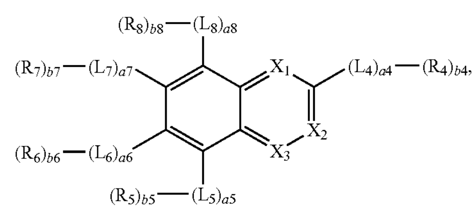

Formula 1D

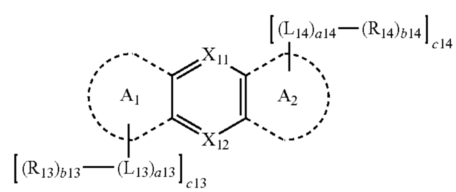

Formula 1E

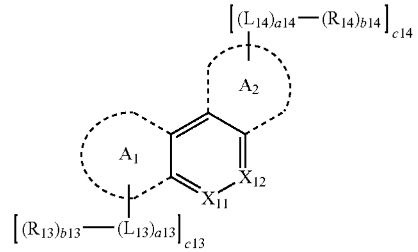

-continued

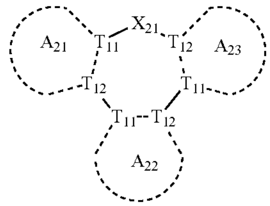

Formula 2A

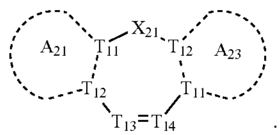

Formula 2B

In Formulae 1D and 1E, rings $A_1$ and $A_2$ may each independently be a $C_5$-$C_{60}$ carbocyclic group or a $C_1$-$C_{30}$ heterocyclic group.

For example, rings $A_1$ and $A_2$ in Formulae 1D and 1E may each independently be selected from a benzene group, a naphthalene group, an anthracene group, an indene group, a fluorene group, a pyridine group, a pyrimidine group, a pyrazine group, a pyridazine group, a quinoline group, and an isoquinoline group.

In one or more embodiments, in Formulae 1D and 1E, i) when at least one selected from $X_{11}$ and $X_{12}$ is N, rings $A_1$ and $A_2$ may each independently be selected from a benzene group, a naphthalene group, an anthracene group, an indene group, a fluorene group, a pyridine group, a pyrimidine group, a pyrazine group, a pyridazine group, a quinoline group, and an isoquinoline group, and ii) when $X_{11}$ is C-$(L_{11})_{a11}$-$(R_{11})_{b11}$ and $X_{12}$ is C-$(L_{12})_{a12}$-$(R_{12})_{b12}$, rings $A_1$ and $A_2$ may each independently be selected from a pyridine group, a pyrimidine group, a pyrazine group, a pyridazine group, a quinoline group, and an isoquinoline group.

In one or more embodiments, in Formula 1D, when at least one selected from $X_{11}$ and $X_{12}$ is N, rings $A_1$ and $A_2$ may each independently be a benzene group or a naphthalene group.

In one or more embodiments, in Formula 1E, i) when at least one selected from $X_{11}$ and $X_{12}$ is N, ring $A_1$ may be a benzene group, and ring $A_2$ may be selected from a benzene group, a naphthalene group, a pyrimidine group, and a quinoline group, and ii) when $X_{11}$ is C-$(L_{11})_{a11}$-$(R_{11})_{b11}$ and $X_{12}$ is C-$(L_{12})_{a12}$-$(R_{12})_{b12}$, ring $A_1$ may be selected from a benzene group, a pyridine group, a pyrimidine group, and an isoquinoline group, and ring $A_2$ may be selected from a pyridine group, a pyrimidine group, and a quinoline group.

Rings $A_{21}$, $A_{22}$, and $A_{23}$ in Formulae 2A and 2B may each independently be a $C_5$-$C_{60}$ carbocyclic group or a $C_1$-$C_{60}$ heterocyclic group, each substituted with at least one *-[$(L_{22})_{a22}$-$(R_{22})_{b22}$]. $L_{22}$, a22, $R_{22}$, and b22 may each independently be the same as described below.

Each $T_{11}$ and each $T_{12}$ in Formulae 2A and 2B may independently be carbon or nitrogen, two or more selected from the three $T_{11}$(s) in Formula 2A may be identical to or different from each other, $T_{13}$ may be N or C($R_{27}$), $T_{14}$ may be N or C($R_{28}$), two or more selected from the three $T_{12}$(s) in Formula 2A may be identical to or different from each other, the two $T_{11}$(s) in Formula 2B may be identical to or different from each other, the two $T_{12}$(s) in Formula 2B may be identical to or different from each other, and each bond between $T_{11}$ and $T_{12}$ may be a single bond or a double bond; wherein the three $T_{11}$(s) and three $T_{12}$(s) in Formula 2A are not all nitrogen, and the two $T_{11}$(s), two $T_{12}$(s), $T_{13}$, and $T_{14}$ in Formula 2B are all not nitrogen. Rings $A_{21}$, $A_{22}$, and $A_{23}$ may each be condensed (e.g., fused) with a central 7-membered ring in Formulae 2A and 2B, such that they each share a $T_{11}$ and a $T_{12}$ with the central 7-membered ring.

Each *-[$(L_{22})_{a22}$-$(R_{22})_{b22}$] substituted in ring $A_{21}$, *-[$(L_{22})_{a22}$-$(R_{22})_{b22}$] substituted in ring $A_{22}$, and *-[$(L_{22})_{a22}$-$(R_{22})_{b22}$] substituted in ring $A_{23}$ may be identical to or different from one another.

In some embodiments, when the number of *-[$(L_{22})_{a22}$-$(R_{22})_{b22}$](s) substituted in $A_{21}$ is two or more, two or more *-[$(L_{22})_{a22}$-$(R_{22})_{b22}$](s) may be identical to or different from each other; when the number of *-[$(L_{22})_{a22}$-$(R_{22})_{b22}$](s) substituted in $A_{22}$ is two or more, two or more *-[$(L_{22})_{a22}$-$(R_{22})_{b22}$](s) may be identical to or different from each other; and when the number of *-[$(L_{22})_{a22}$-$(R_{22})_{b22}$](s) substituted in $A_{23}$ is two or more, two or more *-[$(L_{22})_{a22}$-$(R_{22})_{b22}$](s) may be identical to or different from each other.

In one or more embodiments, rings $A_{21}$, $A_{22}$, and $A_{23}$ in Formulae 2A and 2B may each independently be selected from a benzene group, a naphthalene group, an anthracene group, an indene group, a fluorene group, a pyridine group, a pyrimidine group, a pyrazine group, a pyridazine group, a quinoline group, an isoquinoline group, a pyrrole group, a pyrazole group, an imidazole group, an oxazole group, a thiazole group, a cyclopentadiene group, a silole group, a selenophene group, a furan group, a thiophene group, an indole group, a benzimidazole group, a benzoxazole group, a benzothiazole group, an indene group, a benzosilole group, a benzoselenophene group, a benzofuran group, a benzothiophene group, a carbazole group, a fluorene group, a dibenzosilole group, a dibenzoselenophene group, a dibenzofuran group, a dibenzothiophene group, a pyrrolopyridine group, a cyclopentapyridine group, a silolopyridine group, a selenophenopyridine group, a furopyridine group, a thienopyridine group, a pyrrolopyrimidine group, a cyclopentapyrimidine group, a silolopyrimidine group, a selenophenopyrimidine group, a furopyrimidine group, a thienopyrimidine group, a pyrrolopyrazine group, a cyclopentapyrazine group, a silolopyrazine group, a selenophenopyrazine group, a furopyrazine group, a thienopyrazine group, a naphthopyrrole group, a cyclopentanaphthalene group, a naphthosilole group, a naphthoselenophene group, a naphthofuran group, a naphthothienophene group, a pyrroloquinoline group, a cyclopentaquinoline group, a siloloquinoline group, a selenophenoquinoline group, a furoquinoline group, a thienoquinoline group, a pyrroloisoquinoline group, a cyclopentaisoquinoline group, a siloloisoquinoline group, a selenophenoisoquinoline group, a furoisoquinoline group, a thienoisoquinoline group, an azacarbazole group, an azafluorene group, an azadibenzosilole group, an azadibenzoselenophene group, an azadibenzofuran group, an azadibenzothiophene group, an indenoquinoline group, an indenoisoquinoline group, an indenoquinoxaline group, a phenanthroline group, and an naphthoindole group, each substituted with at least one *-[$(L_{22})_{a22}$-$(R_{22})_{b22}$].

In one or more embodiments, rings $A_{21}$, $A_{22}$, and $A_{23}$ in Formulae 2A and 2B may each independently be selected from groups represented by Formulae 2-1 to 2-36, each substituted with at least one *-[$(L_{22})_{a22}$-$(R_{22})_{b22}$]:

Formula 2-1
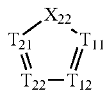
Formula 2-2
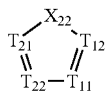
Formula 2-3
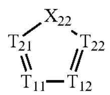
Formula 2-4
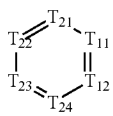
Formula 2-5
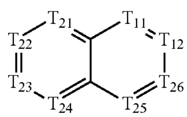
Formula 2-6
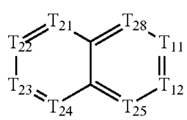
Formula 2-7
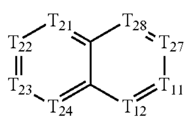
Formula 2-8
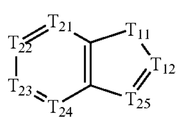
Formula 2-9
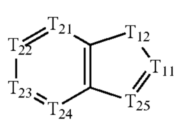
Formula 2-10
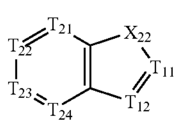
Formula 2-11
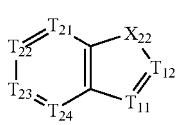
Formula 2-12
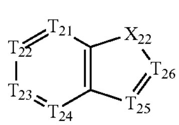
Formula 2-13
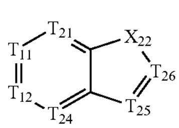
-continued
Formula 2-14
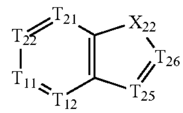
Formula 2-15
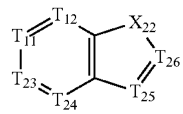
Formula 2-16
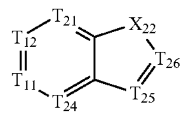
Formula 2-17
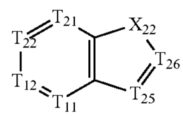
Formula 2-18
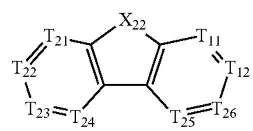
Formula 2-19
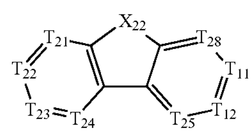
Formula 2-20
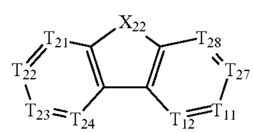
Formula 2-21
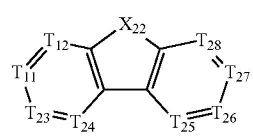
Formula 2-22
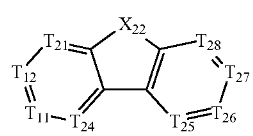
Formula 2-23
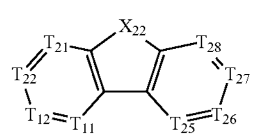
Formula 2-24
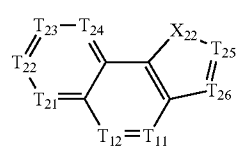
Formula 2-25
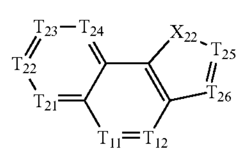

-continued

Formula 2-26

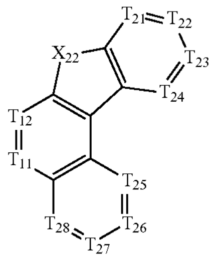

Formula 2-27

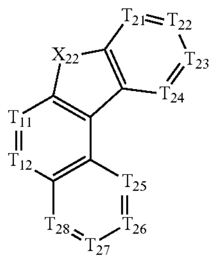

Formula 2-28

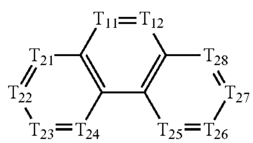

Formula 2-29

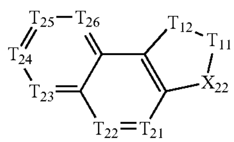

Formula 2-30

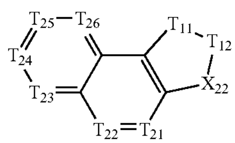

Formula 2-31

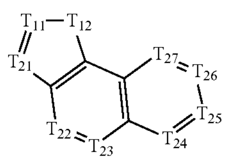

Formula 2-32

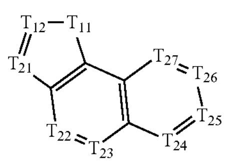

Formula 2-33

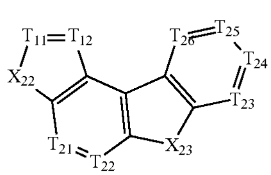

-continued

Formula 2-34

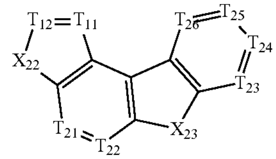

Formula 2-35

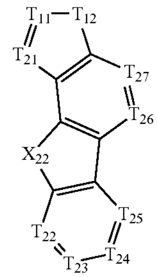

Formula 2-36

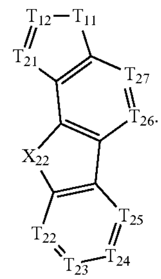

In Formulae 2-1 to 2-36, $T_{11}$ and $T_{12}$ may each independently be the same as described herein, $X_{22}$ and $X_{23}$ may each independently be oxygen (O), sulfur (S), selenium (Se), or a moiety including C, N, and/or silicon (Si), and $T_{21}$ to $T_{28}$ may each independently be N or a moiety including C.

For example, in Formulae 2-1 to 2-36, $X_{22}$ and $X_{23}$ may each independently be selected from O, S, Se, $C(R_{25})(R_{26})$, $N-[(L_{22})_{a22}-(R_{22})_{b22}]$, and $Si(R_{25})(R_{26})$, and $T_{21}$ to $T_{28}$ may each independently be N or $C-[(L_{22})_{a22}-(R_{22})_{b22}]$. $R_{25}$, $R_{26}$, and $R_{30}$ may each independently be selected from groups represented by $*-[(L_{22})_{a22}-(R_{22})_{b22})]$ as described herein.

In one or more embodiments, rings $A_{21}$, $A_{22}$, and $A_{23}$ in Formulae 2A and 2B may each independently be selected from groups represented by Formulae 2-101 to 2-229:

Formula 2-101

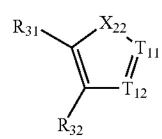

Formula 2-102

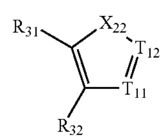

Formula 2-103

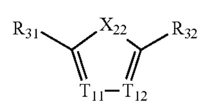

-continued
Formula 2-104
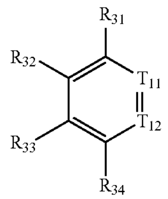
Formula 2-105
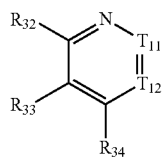
Formula 2-106
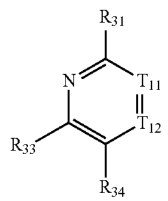
Formula 2-107
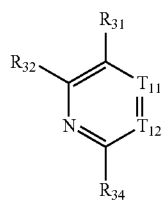
Formula 2-108
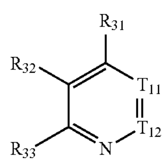
Formula 2-109
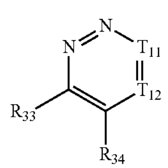
Formula 2-110
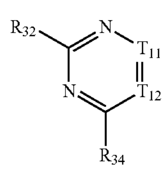
Formula 2-111
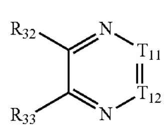
Formula 2-112
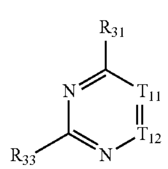
-continued
Formula 2-113
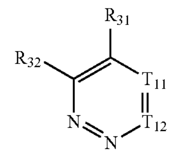
Formula 2-114
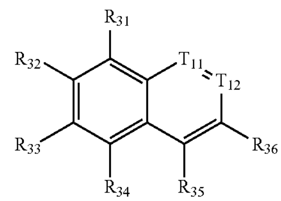
Formula 2-115
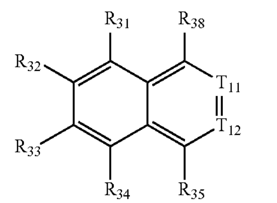
Formula 2-116
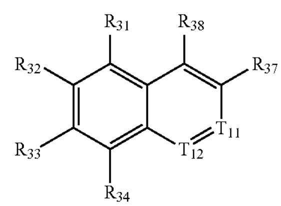
Formula 2-117
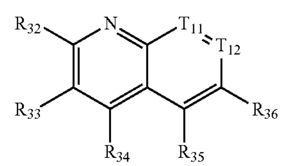
Formula 2-118
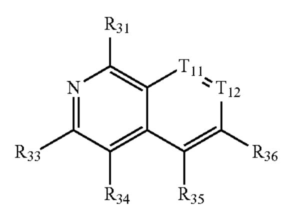
Formula 2-119
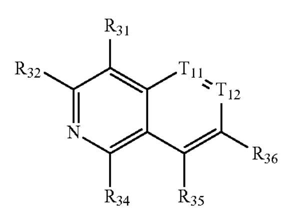
Formula 2-120
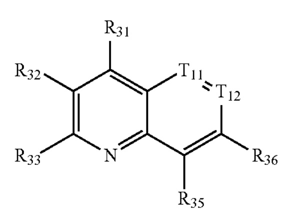

-continued
Formula 2-121
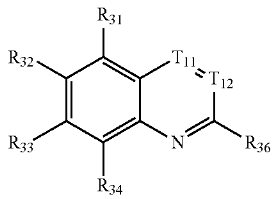
Formula 2-122
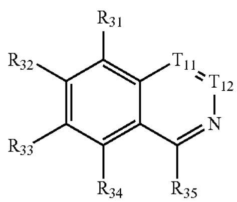
Formula 2-123
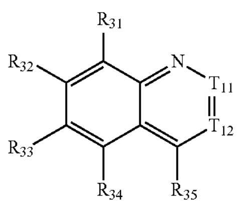
Formula 2-124
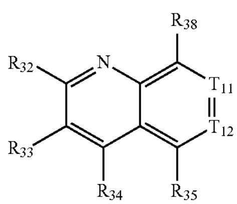
Formula 2-125
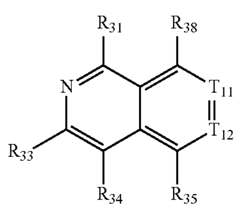
Formula 2-126
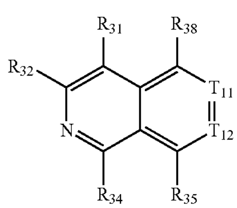
Formula 2-127
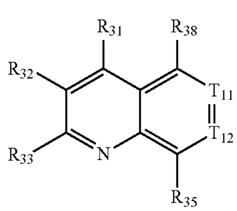
-continued
Formula 2-128
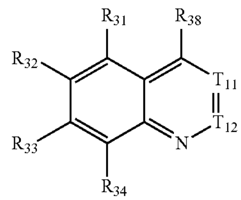
Formula 2-129
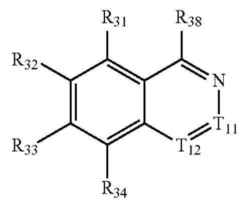
Formula 2-130
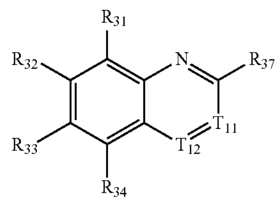
Formula 2-131
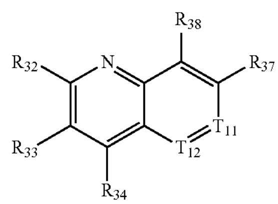
Formula 2-132
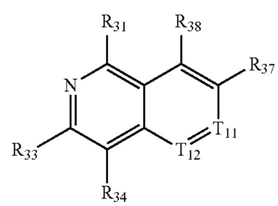
Formula 2-133
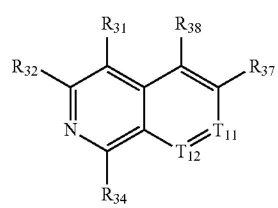
Formula 2-134
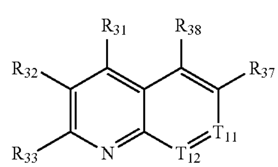
Formula 2-135
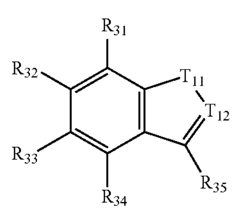

-continued
Formula 2-136
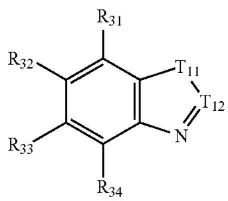
Formula 2-137
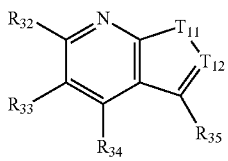
Formula 2-138
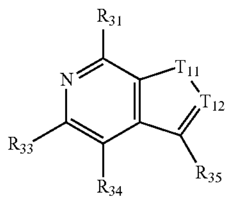
Formula 2-139
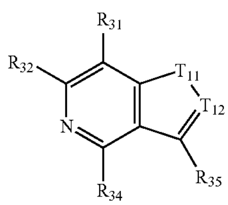
Formula 2-140
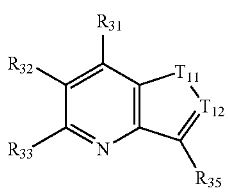
Formula 2-141
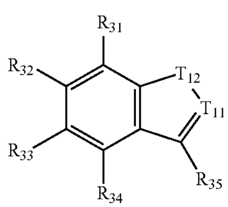
Formula 2-142
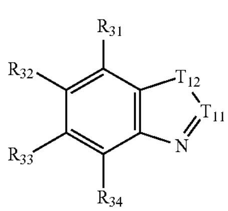
Formula 2-143
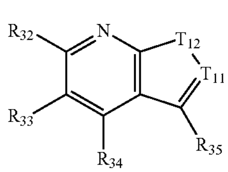
-continued
Formula 2-144
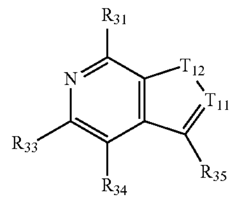
Formula 2-145
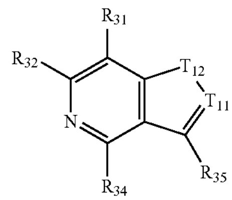
Formula 2-146
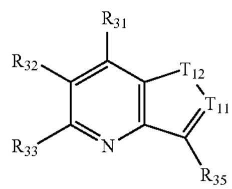
Formula 2-147
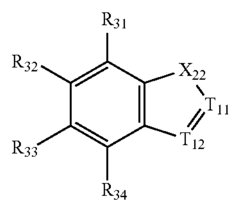
Formula 2-148
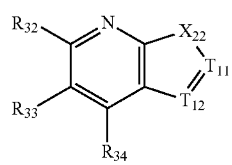
Formula 2-149
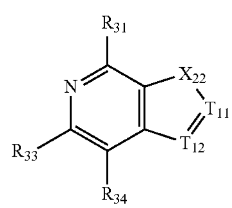
Formula 2-150
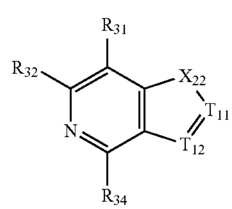
Formula 2-151
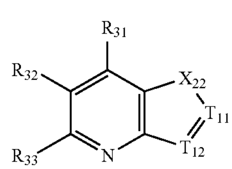

-continued
Formula 2-152
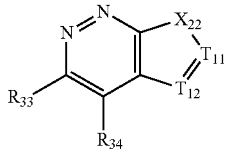
Formula 2-153
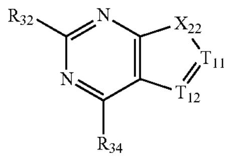
Formula 2-154
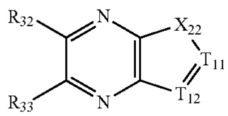
Formula 2-155
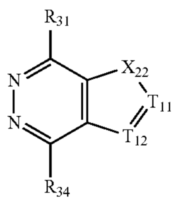
Formula 2-156
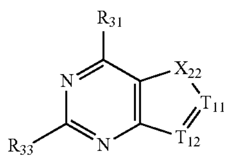
Formula 2-157
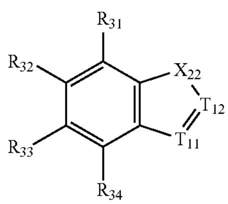
Formula 2-158
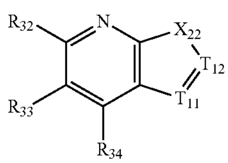
Formula 2-159
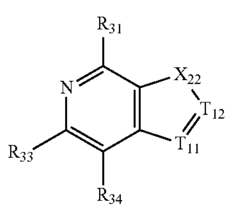
Formula 2-160
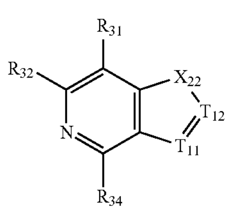
-continued
Formula 2-161
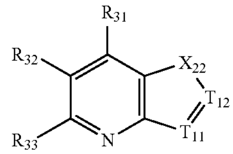
Formula 2-162
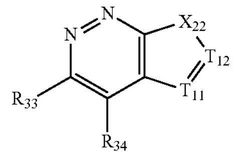
Formula 2-163
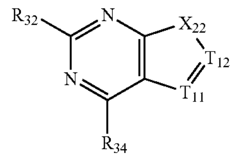
Formula 2-164
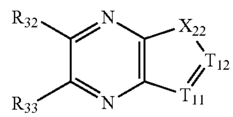
Formula 2-165
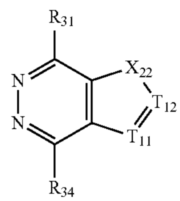
Formula 2-166
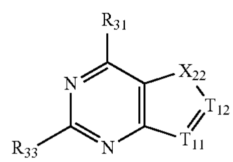
Formula 2-167
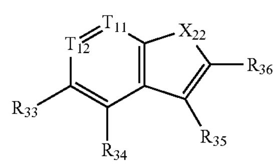
Formula 2-168
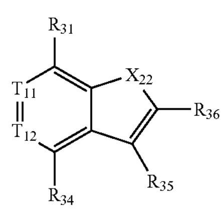
Formula 2-169
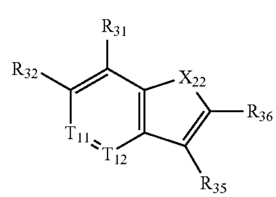

Formula 2-170
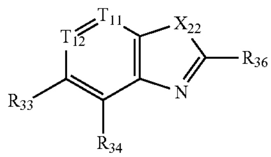
Formula 2-171
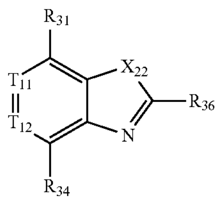
Formula 2-172
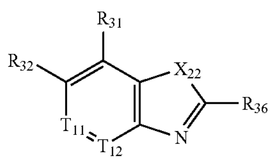
Formula 2-173
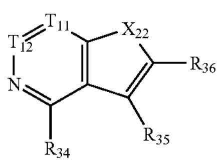
Formula 2-174
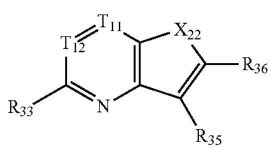
Formula 2-175
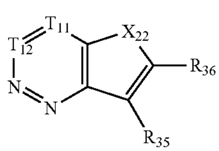
Formula 2-176
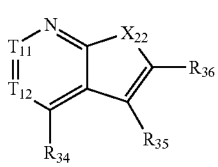
Formula 2-177
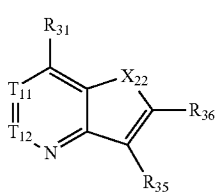
Formula 2-178
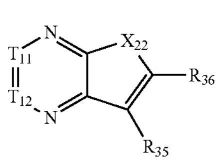
Formula 2-179
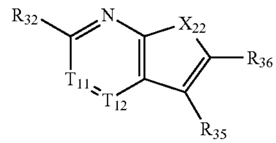
Formula 2-180
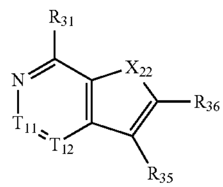
Formula 2-181
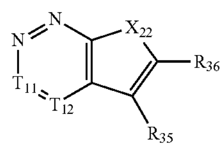
Formula 2-182
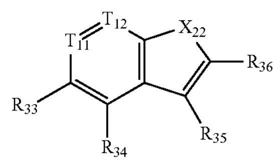
Formula 2-183
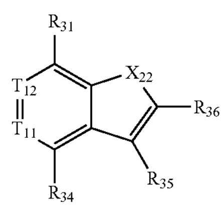
Formula 2-184
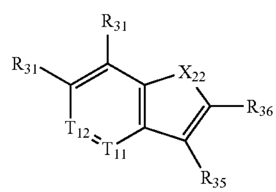
Formula 2-185
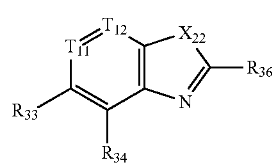
Formula 2-186
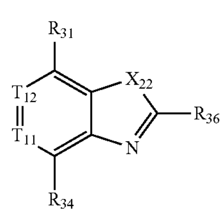
Formula 2-187
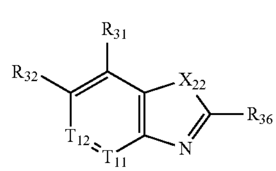

-continued
Formula 2-188
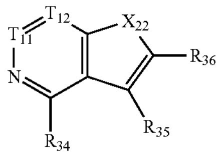
Formula 2-189
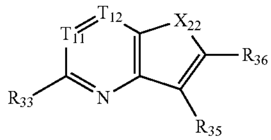
Formula 2-190
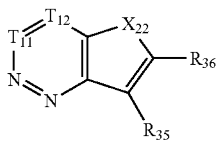
Formula 2-191
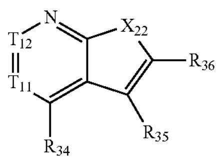
Formula 2-192
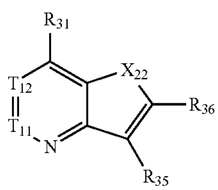
Formula 2-193
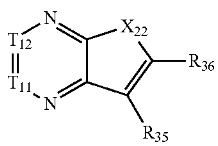
Formula 2-194
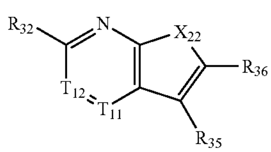
Formula 2-195
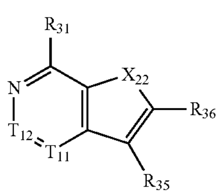
Formula 2-196
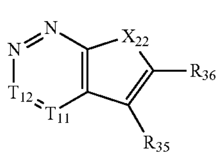
-continued
Formula 2-197
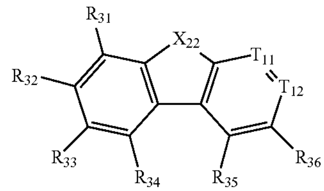
Formula 2-198
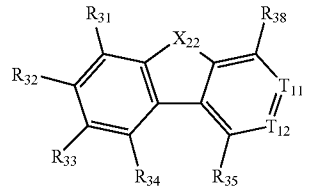
Formula 2-199
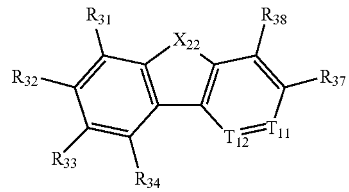
Formula 2-200
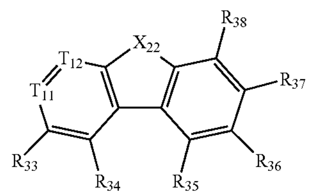
Formula 2-201
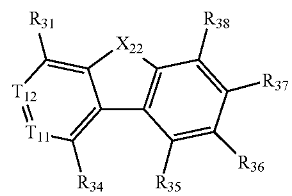
Formula 2-202
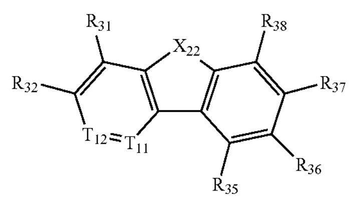
Formula 2-203
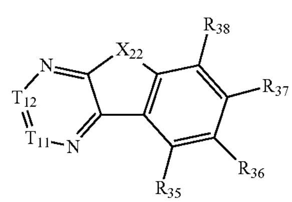
Formula 2-204
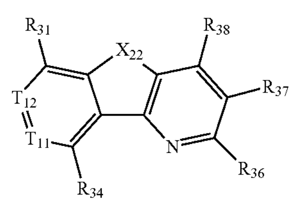

-continued
Formula 2-205
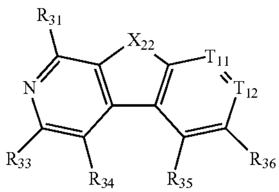
Formula 2-206
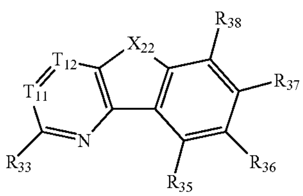
Formula 2-207
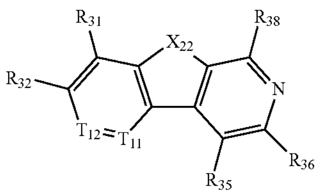
Formula 2-208
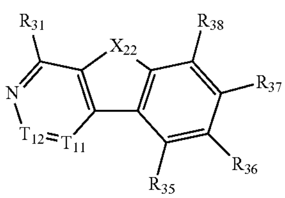
Formula 2-209
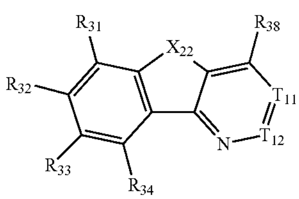
Formula 2-210
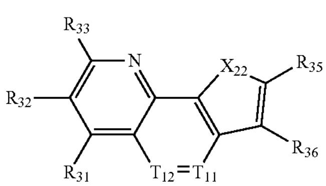
Formula 2-211
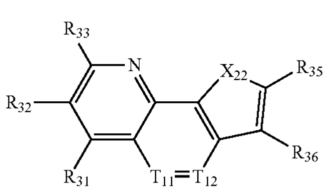
Formula 2-212
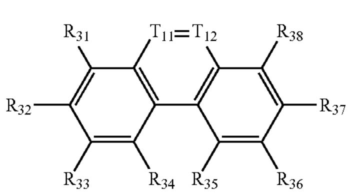
-continued
Formula 2-213
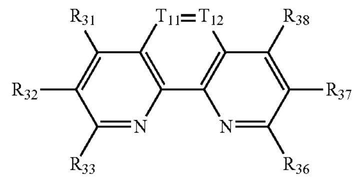
Formula 2-214
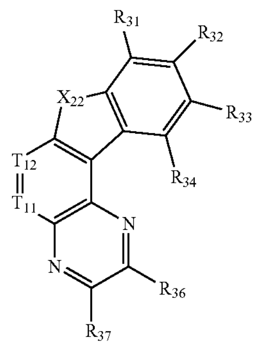
Formula 2-215
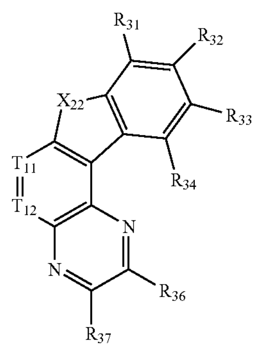
Formula 2-216
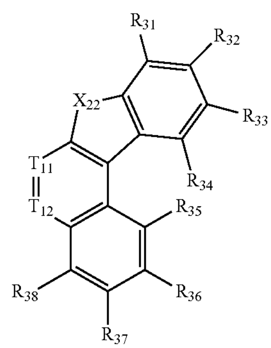
Formula 2-217
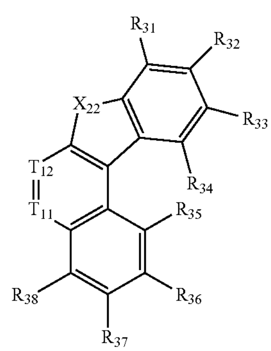

-continued

Formula 2-218

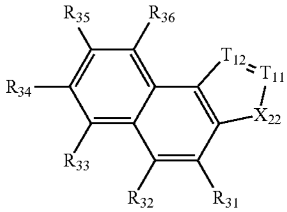

Formula 2-219

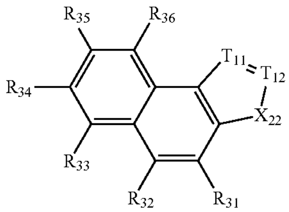

Formula 2-220

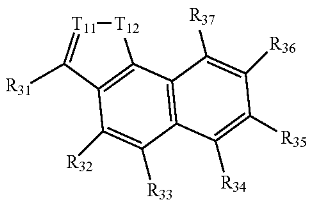

Formula 2-221

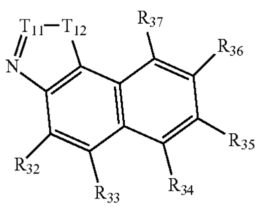

Formula 2-222

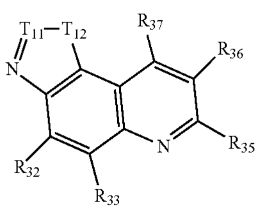

Formula 2-223

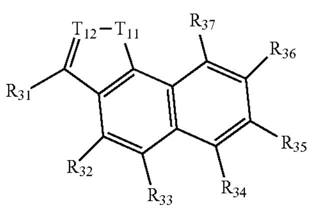

Formula 2-224

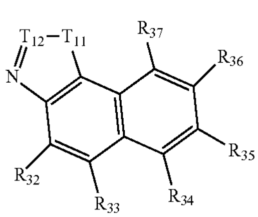

-continued

Formula 2-225

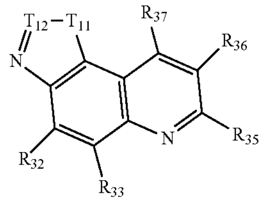

Formula 2-226

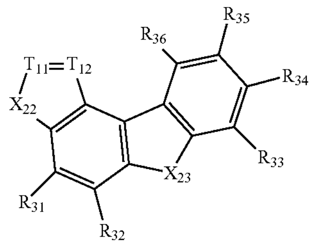

Formula 2-227

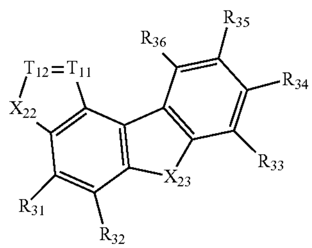

Formula 2-228

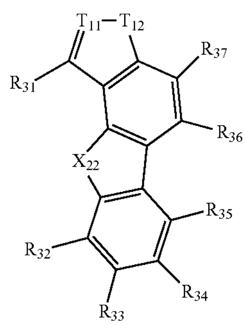

Formula 2-229

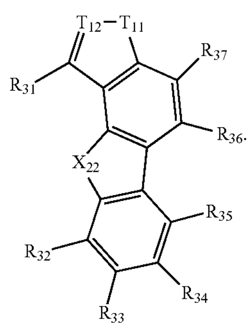

In Formulae 2-101 to 2-229, $T_{11}$ and $T_{12}$ may each independently be the same as described herein, $X_{22}$ and $X_{23}$ may each independently be O, S, Se, or a moiety including C, N, and/or Si, and $R_{31}$ to $R_{38}$ may each independently be selected from substituents represented by $*-[(L_{22})_{a22}-(R_{22})_{b22}]$ as described herein.

In one or more embodiments, the second compound may be represented by one selected from Formulae 2-201A to 2-269A (denoting a structure based on Formula 2A), and rings $A_{21}$, $A_{22}$, and $A_{23}$ in Formulae 2-201A to 2-269A may each independently be selected from the Formulae shown in Table 1:

TABLE 1

| Formula No. | Formula No. of ring $A_{21}$ | Formula No. of ring $A_{22}$ | Formula No. of ring $A_{23}$ |
|---|---|---|---|
| 2-201A | 2-2 | 2-4 | 2-4 |
| 2-202A | 2-4 | 2-4 | 2-1 |
| 2-203A | 2-4 | 2-4 | 2-2 |
| 2-204A | 2-4 | 2-4 | 2-3 |
| 2-205A | 2-4 | 2-1 | 2-4 |
| 2-206A | 2-4 | 2-2 | 2-4 |
| 2-207A | 2-4 | 2-4 | 2-10 |
| 2-208A | 2-11 | 2-4 | 2-4 |
| 2-209A | 2-4 | 2-4 | 2-11 |
| 2-210A | 2-4 | 2-10 | 2-4 |
| 2-211A | 2-4 | 2-4 | 2-8 |
| 2-212A | 2-4 | 2-9 | 2-4 |
| 2-213A | 2-4 | 2-4 | 2-14 |
| 2-214A | 2-17 | 2-4 | 2-4 |
| 2-215A | 2-4 | 2-4 | 2-15 |
| 2-216A | 2-13 | 2-4 | 2-4 |
| 2-217A | 2-4 | 2-4 | 2-16 |
| 2-218A | 2-4 | 2-4 | 2-13 |
| 2-219A | 2-16 | 2-4 | 2-4 |
| 2-220A | 2-4 | 2-4 | 2-12 |
| 2-221A | 2-4 | 2-4 | 2-17 |
| 2-222A | 2-4 | 2-16 | 2-4 |
| 2-223A | 2-4 | 2-15 | 2-4 |
| 2-224A | 2-4 | 2-14 | 2-4 |
| 2-225A | 2-4 | 2-17 | 2-4 |
| 2-226A | 2-19 | 2-4 | 2-4 |
| 2-227A | 2-22 | 2-4 | 2-4 |
| 2-228A | 2-18 | 2-4 | 2-4 |
| 2-229A | 2-23 | 2-4 | 2-4 |
| 2-230A | 2-21 | 2-4 | 2-4 |
| 2-231A | 2-20 | 2-4 | 2-4 |
| 2-232A | 2-4 | 2-23 | 2-4 |
| 2-233A | 2-4 | 2-18 | 2-4 |
| 2-234A | 2-4 | 2-21 | 2-4 |
| 2-235A | 2-4 | 2-19 | 2-4 |
| 2-236A | 2-5 | 2-2 | 2-4 |
| 2-237A | 2-5 | 2-1 | 2-4 |
| 2-238A | 2-2 | 2-2 | 2-4 |
| 2-239A | 2-4 | 2-23 | 2-1 |
| 2-240A | 2-6 | 2-10 | 2-4 |
| 2-241A | 2-4 | 2-4 | 2-29 |
| 2-242A | 2-7 | 2-4 | 2-10 |
| 2-243A | 2-11 | 2-4 | 2-10 |
| 2-244A | 2-4 | 2-10 | 2-6 |
| 2-245A | 2-11 | 2-11 | 2-4 |
| 2-246A | 2-11 | 2-11 | 2-5 |
| 2-247A | 2-11 | 2-11 | 2-10 |
| 2-248A | 2-7 | 2-9 | 2-4 |
| 2-249A | 2-4 | 2-4 | 2-25 |
| 2-250A | 2-11 | 2-15 | 2-4 |
| 2-251A | 2-18 | 2-28 | 2-4 |
| 2-252A | 2-23 | 2-10 | 2-4 |
| 2-253A | 2-4 | 2-27 | 2-4 |
| 2-254A | 2-6 | 2-18 | 2-4 |
| 2-255A | 2-4 | 2-23 | 2-5 |
| 2-256A | 2-23 | 2-4 | 2-14 |
| 2-257A | 2-17 | 2-4 | 2-14 |
| 2-258A | 2-14 | 2-4 | 2-12 |
| 2-259A | 2-17 | 2-4 | 2-12 |
| 2-260A | 2-14 | 2-16 | 2-2 |
| 2-261A | 2-17 | 2-5 | 2-14 |
| 2-262A | 2-17 | 2-13 | 2-17 |
| 2-263A | 2-17 | 2-14 | 2-12 |
| 2-264A | 2-17 | 2-12 | 2-12 |
| 2-265A | 2-5 | 2-1 | 2-18 |
| 2-266A | 2-4 | 2-29 | 2-4 |
| 2-267A | 2-4 | 2-31 | 2-4 |
| 2-268A | 2-4 | 2-33 | 2-4 |
| 2-269A | 2-4 | 2-35 | 2-4 |

In one or more embodiments, the second compound may be represented by one selected from Formulae 2-201B to 2-215B (denoting a structure based on Formula 2B), and rings $A_{21}$ and $A_{23}$ in Formulae 2-201B to 2-215B may each independently be selected from the Formulae shown in Table 2:

TABLE 2

| Formula No. | Formula No. or ring $A_{21}$ | Formula No. or ring $A_{22}$ | Formula No. or ring $A_{23}$ |
|---|---|---|---|
| 2-201B | 2-4 | — | 2-19 |
| 2-202B | 2-4 | — | 2-22 |
| 2-203B | 2-4 | — | 2-18 |
| 2-204B | 2-4 | — | 2-23 |
| 2-205B | 2-4 | — | 2-21 |
| 2-206B | 2-4 | — | 2-20 |
| 2-207B | 2-5 | — | 2-23 |
| 2-208B | 2-7 | — | 2-23 |
| 2-209B | 2-4 | — | 2-26 |
| 2-210B | 2-7 | — | 2-22 |
| 2-211B | 2-13 | — | 2-16 |
| 2-212B | 2-5 | — | 2-19 |
| 2-213B | 2-7 | — | 2-20 |
| 2-214B | 2-19 | — | 2-18 |
| 2-215B | 2-18 | — | 2-18 |

In one or more embodiments, the second compound may be represented by one selected from Formulae 2-301A to 2-419A and 2-421A to 2-432A (denoting a structure based on Formula 2A), and rings $A_{21}$, $A_{22}$, and $A_{23}$ in Formulae 2-301A to 2-419A and 2-421A to 2-432A may each independently be selected from the Formulae shown in Table 3:

TABLE 3

| Formula No. | Formula No. or ring $A_{21}$ | Formula No. or ring $A_{22}$ | Formula No. or ring $A_{23}$ |
|---|---|---|---|
| 2-301A | 2-104 | 2-147 | 2-104 |
| 2-302A | 2-102 | 2-104 | 2-104 |
| 2-303A | 2-104 | 2-104 | 2-101 |
| 2-304A | 2-104 | 2-104 | 2-102 |
| 2-305A | 2-104 | 2-104 | 2-103 |
| 2-306A | 2-104 | 2-101 | 2-104 |
| 2-307A | 2-104 | 2-102 | 2-104 |
| 2-308A | 2-104 | 2-104 | 2-147 |
| 2-309A | 2-157 | 2-104 | 2-104 |
| 2-310A | 2-104 | 2-104 | 2-157 |
| 2-311A | 2-104 | 2-147 | 2-107 |
| 2-312A | 2-104 | 2-149 | 2-104 |
| 2-313A | 2-104 | 2-156 | 2-104 |
| 2-314A | 2-107 | 2-147 | 2-106 |
| 2-315A | 2-104 | 2-151 | 2-104 |
| 2-316A | 2-104 | 2-147 | 2-106 |
| 2-317A | 2-104 | 2-148 | 2-104 |
| 2-318A | 2-104 | 2-150 | 2-104 |
| 2-319A | 2-106 | 2-147 | 2-104 |
| 2-320A | 2-104 | 2-106 | 2-147 |
| 2-321A | 2-157 | 2-107 | 2-104 |
| 2-322A | 2-106 | 2-104 | 2-147 |
| 2-323A | 2-104 | 2-107 | 2-147 |
| 2-324A | 2-107 | 2-104 | 2-147 |
| 2-325A | 2-104 | 2-104 | 2-160 |
| 2-326A | 2-104 | 2-111 | 2-157 |
| 2-327A | 2-108 | 2-104 | 2-158 |
| 2-328A | 2-111 | 2-104 | 2-157 |
| 2-329A | 2-107 | 2-147 | 2-104 |
| 2-330A | 2-104 | 2-104 | 2-135 |
| 2-331A | 2-104 | 2-141 | 2-104 |
| 2-332A | 2-104 | 2-142 | 2-104 |
| 2-333A | 2-107 | 2-104 | 2-135 |
| 2-334A | 2-104 | 2-111 | 2-135 |
| 2-335A | 2-104 | 2-143 | 2-104 |
| 2-336A | 2-106 | 2-142 | 2-104 |
| 2-337A | 2-107 | 2-142 | 2-106 |
| 2-338A | 2-104 | 2-104 | 2-169 |
| 2-339A | 2-184 | 2-104 | 2-104 |
| 2-340A | 2-104 | 2-104 | 2-182 |

TABLE 3-continued

| Formula No. | Formula No. or ring $A_{21}$ | Formula No. or ring $A_{22}$ | Formula No. or ring $A_{23}$ |
|---|---|---|---|
| 2-341A | 2-168 | 2-104 | 2-104 |
| 2-342A | 2-104 | 2-104 | 2-183 |
| 2-343A | 2-104 | 2-104 | 2-168 |
| 2-344A | 2-183 | 2-104 | 2-104 |
| 2-345A | 2-104 | 2-104 | 2-167 |
| 2-346A | 2-104 | 2-104 | 2-184 |
| 2-347A | 2-104 | 2-183 | 2-104 |
| 2-348A | 2-104 | 2-182 | 2-104 |
| 2-349A | 2-104 | 2-169 | 2-104 |
| 2-350A | 2-104 | 2-184 | 2-104 |
| 2-351A | 2-107 | 2-104 | 2-179 |
| 2-352A | 2-111 | 2-104 | 2-169 |
| 2-353A | 2-104 | 2-111 | 2-182 |
| 2-354A | 2-106 | 2-104 | 2-185 |
| 2-355A | 2-171 | 2-104 | 2-104 |
| 2-356A | 2-104 | 2-104 | 2-115 |
| 2-357A | 2-104 | 2-104 | 2-178 |
| 2-358A | 2-104 | 2-106 | 2-167 |
| 2-359A | 2-108 | 2-105 | 2-167 |
| 2-360A | 2-105 | 2-104 | 2-167 |
| 2-361A | 2-112 | 2-104 | 2-184 |
| 2-362A | 2-104 | 2-192 | 2-104 |
| 2-363A | 2-107 | 2-182 | 2-106 |
| 2-364A | 2-104 | 2-169 | 2-105 |
| 2-365A | 2-105 | 2-184 | 2-104 |
| 2-366A | 2-105 | 2-169 | 2-105 |
| 2-367A | 2-198 | 2-104 | 2-104 |
| 2-368A | 2-201 | 2-104 | 2-104 |
| 2-369A | 2-197 | 2-104 | 2-104 |
| 2-370A | 2-202 | 2-104 | 2-104 |
| 2-371A | 2-200 | 2-104 | 2-104 |
| 2-372A | 2-199 | 2-104 | 2-104 |
| 2-373A | 2-104 | 2-202 | 2-104 |
| 2-374A | 2-104 | 2-197 | 2-104 |
| 2-375A | 2-104 | 2-200 | 2-104 |
| 2-376A | 2-104 | 2-198 | 2-104 |
| 2-377A | 2-209 | 2-104 | 2-104 |
| 2-378A | 2-207 | 2-104 | 2-104 |
| 2-379A | 2-200 | 2-106 | 2-104 |
| 2-380A | 2-104 | 2-208 | 2-104 |
| 2-381A | 2-105 | 2-198 | 2-108 |
| 2-382A | 2-202 | 2-102 | 2-104 |
| 2-383A | 2-202 | 2-101 | 2-106 |
| 2-384A | 2-102 | 2-102 | 2-107 |
| 2-385A | 2-104 | 2-202 | 2-101 |
| 2-386A | 2-123 | 2-147 | 2-104 |
| 2-387A | 2-104 | 2-104 | 2-218 |
| 2-388A | 2-116 | 2-104 | 2-147 |
| 2-389A | 2-157 | 2-104 | 2-147 |
| 2-390A | 2-107 | 2-147 | 2-115 |
| 2-391A | 2-157 | 2-157 | 2-104 |
| 2-392A | 2-157 | 2-157 | 2-114 |
| 2-393A | 2-157 | 2-157 | 2-147 |
| 2-394A | 2-116 | 2-147 | 2-104 |
| 2-395A | 2-104 | 2-104 | 2-210 |
| 2-396A | 2-157 | 2-182 | 2-104 |
| 2-397A | 2-197 | 2-213 | 2-104 |
| 2-398A | 2-202 | 2-167 | 2-104 |
| 2-399A | 2-104 | 2-216 | 2-104 |
| 2-400A | 2-124 | 2-197 | 2-104 |
| 2-401A | 2-104 | 2-202 | 2-114 |
| 2-402A | 2-168 | 2-104 | 2-169 |
| 2-403A | 2-184 | 2-104 | 2-169 |
| 2-404A | 2-169 | 2-104 | 2-167 |
| 2-405A | 2-184 | 2-106 | 2-167 |
| 2-406A | 2-169 | 2-183 | 2-102 |
| 2-407A | 2-184 | 2-114 | 2-169 |
| 2-408A | 2-184 | 2-168 | 2-184 |
| 2-409A | 2-184 | 2-104 | 2-167 |
| 2-410A | 2-184 | 2-167 | 2-167 |
| 2-411A | 2-114 | 2-101 | 2-197 |
| 2-412A | 2-104 | 2-149 | 2-104 |
| 2-413A | 2-106 | 2-104 | 2-147 |
| 2-414A | 2-104 | 2-104 | 2-168 |
| 2-415A | 2-200 | 2-106 | 2-104 |
| 2-416A | 2-104 | 2-104 | 2-183 |
| 2-417A | 2-104 | 2-104 | 2-101 |

TABLE 3-continued

| Formula No. | Formula No. or ring $A_{21}$ | Formula No. or ring $A_{22}$ | Formula No. or ring $A_{23}$ |
|---|---|---|---|
| 2-418A | 2-105 | 2-169 | 2-105 |
| 2-419A | 2-104 | 2-147 | 2-107 |
| 2-421A | 2-104 | 2-218 | 2-104 |
| 2-422A | 2-104 | 2-226 | 2-104 |
| 2-423A | 2-104 | 2-222 | 2-104 |
| 2-424A | 2-104 | 2-228 | 2-104 |
| 2-425A | 2-104 | 2-151 | 2-104 |
| 2-426A | 2-106 | 2-147 | 2-107 |
| 2-427A | 2-104 | 2-147 | 2-106 |
| 2-428A | 2-107 | 2-150 | 2-104 |
| 2-429A | 2-104 | 2-143 | 2-104 |
| 2-430A | 2-107 | 2-142 | 2-106 |
| 2-431A | 2-104 | 2-142 | 2-104 |
| 2-432A | 2-104 | 2-104 | 2-104 |

In one or more embodiments, the second compound may be represented by one selected from Formulae 2-301B to 2-320B (denoting a structure based on Formula 2B), and rings $A_{21}$ and $A_{23}$ in Formulae 2-301B to 2-320B may each independently be selected from the Formulae shown in Table 4:

TABLE 4

| Formula No. | Formula No. or ring $A_{21}$ | Formula No. of ring $A_{22}$ | Formula No. of ring $A_{23}$ |
|---|---|---|---|
| 2-301B | 2-104 | — | 2-198 |
| 2-302B | 2-104 | — | 2-201 |
| 2-303B | 2-104 | — | 2-197 |
| 2-304B | 2-104 | — | 2-202 |
| 2-305B | 2-104 | — | 2-200 |
| 2-306B | 2-104 | — | 2-199 |
| 2-307B | 2-104 | — | 2-203 |
| 2-308B | 2-104 | — | 2-204 |
| 2-309B | 2-106 | — | 2-205 |
| 2-310B | 2-104 | — | 2-206 |
| 2-311B | 2-112 | — | 2-199 |
| 2-312B | 2-114 | — | 2-202 |
| 2-313B | 2-116 | — | 2-202 |
| 2-314B | 2-104 | — | 2-214 |
| 2-315B | 2-130 | — | 2-201 |
| 2-316B | 2-168 | — | 2-183 |
| 2-317B | 2-114 | — | 2-198 |
| 2-318B | 2-116 | — | 2-199 |
| 2-319B | 2-198 | — | 2-197 |
| 2-320B | 2-197 | — | 2-197 |

In Formulae 1A to 1E, $X_1$ may be N or C-$(L_1)_{a1}$-$(R_1)_{b1}$, $X_2$ may be N or C-$(L_2)_{a2}$-$(R_2)_{b2}$, $X_3$ may be N or C-$(L_3)_{a3}$-$(R_3)_{b3}$, and at least one selected from $X_1$ to $X_3$ may be N, $X_{11}$ may be N or C-$(L_{11})_{a11}$-$(R_{11})_{b11}$, and $X_{12}$ may be N or C-$(L_{12})_{a12}$-$(R_{12})_{b12}$.

For example, i) in Formulae 1A and 1B, $X_1$ may be N, $X_2$ may be C-$(L_2)_{a2}$-$(R_2)_{b2}$, and $X_3$ may be C-$(L_3)_{a3}$-$(R_3)_{b3}$, $X_1$ may be N, $X_2$ may be N, and $X_3$ may be C-$(L_3)_{a3}$-$(R_3)_{b3}$, or $X_1$, $X_2$, and $X_3$ may be N, ii) in Formula 1C, $X_1$ may be N, $X_2$ may be C-$(L_2)_{a2}$-$(R_2)_{b2}$, and $X_3$ may be C-$(L_3)_{a3}$-$(R_3)_{b3}$, $X_1$ may be C-$(L_1)_{a1}$-$(R_1)_{b1}$, $X_2$ may be N, and $X_3$ may be C-$(L_3)_{a3}$-$(R_3)_{b3}$, $X_1$ and $X_2$ may be N, and $X_3$ may be C-$(L_3)_{a3}$-$(R_3)_{b3}$, or $X_1$ and $X_3$ may be N, and $X_2$ may be C-$(L_2)_{a2}$-$(R_2)_{b2}$, iii) in Formula 1D, $X_{11}$ may be N, and $X_{12}$ may be C-$(L_{12})_{a12}$-$(R_{12})_{b12}$, and iv) in Formula 1E, $X_{11}$ may be C-$(L_{11})_{a11}$-$(R_{11})_{b11}$, and $X_{12}$ may be N or C-$(L_{12})_{a12}$-$(R_{12})_{b12}$.

In one or more embodiments, $X_{21}$ in Formulae 2A and 2B may be selected from O, S, Se, C($R_{23}$)($R_{24}$), Si($R_{23}$)($R_{24}$), and N-[$(L_{21})_{a21}$-$(R_{21})_{b21}$].

In one or more embodiments, $X_{21}$ in Formulae 2A and 2B may be N[$(L_{21})_{a21}$-$(R_{21})_{b21}$].

In one or more embodiments, $X_{21}$ in Formulae 2A and 2B may be selected from O, S, Se, C($R_{23}$)($R_{24}$), and Si($R_{23}$)($R_{24}$), and at least one selected from rings $A_{21}$, $A_{22}$, and $A_{23}$ in Formula 2A and at least one selected from rings $A_{21}$ and $A_{23}$ in Formula 2B may each independently be selected from groups represented by Formulae 2-1 to 2-3, 2-10 to 2-27, and 2-33 to 2-36, and $X_{22}$ or $X_{23}$ in Formulae 2-1 to 2-3, 2-10 to 2-27, and 2-33 to 2-36 may be N-[$(L_{22})_{a22}$-$(R_{22})_{b22}$].

In one or more embodiments, $X_{21}$ in Formulae 2A and 2B may be selected from O, S, Se, C($R_{23}$)($R_{24}$), and Si($R_{23}$)($R_{24}$), and at least one selected from rings $A_{21}$, $A_{22}$, and $A_{23}$ in Formula 2A and at least one selected from rings $A_{21}$ and $A_{23}$ in Formula 2B may be selected from groups represented by Formulae 2-101 to 2-103, 2-147 to 2-211, 2-214 to 2-219, and 2-226 to 2-229, and $X_{22}$ or $X_{23}$ in Formulae 2-101 to 2-103, 2-147 to 2-211, 2-214 to 2-219, and 2-226 to 2-229 may be N-[$(L_{22})_{a22}$-$(R_{22})_{b22}$], but embodiments of the present disclosure are not limited thereto.

In Formulae 2A and 2B, $X_{21}$ may be selected from O, S, Se, C($R_{23}$)($R_{24}$), Si($R_{23}$)($R_{24}$), and N-[$(L_{21})_{a21}$-$(R_{21})_{b21}$], and $X_{22}$ and $X_{23}$ may each independently be selected from O, S, Se, C($R_{25}$)($R_{26}$), Si($R_{25}$)($R_{26}$), and N-[$(L_{22})_{a22}$-$(R_{22})_{b22}$]. $L_{21}$, $L_{22}$, a21, a22, $R_{21}$ to $R_{26}$, b21, and b22 may each independently be the same as described below.

$L_1$ to $L_{14}$, $L_{21}$, and $L_{22}$ in Formulae 1A to 1E, 2A, and 2B may each independently be selected from a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group.

For example, in Formulae 1A to 1E, 2A, and 2B, $L_1$ to $L_{14}$ may each independently be selected from the group consisting of:

a phenylene group, a pentalenylene group, an indenylene group, a naphthylene group, an azulenylene group, a heptalenylene group, an indacenylene group, an acenaphthylene group, a fluorenylene group, a spiro-bifluorenylene group, a spiro-benzofluorene-fluorenylene group, a benzofluorenylene group, a dibenzofluorenylene group, a phenalenylene group, a phenanthrenylene group, an anthracenylene group, a fluoranthenylene group, a triphenylenylene group, a pyrenylene group, a chrysenylene group, a naphthacenylene group, a picenylene group, a perylenylene group, a pentaphenylene group, a hexacenylene group, a pentacenylene group, a rubicenylene group, a coronenylene group, an ovalenylene group, a pyridinylene group, a pyrazinylene group, a pyrimidinylene group, a pyridazinylene group, a quinolinylene group, an isoquinolinylene group, a benzoquinolinylene group, a phthalazinylene group, a naphthyridinylene group, a quinoxalinylene group, a quinazolinylene group, a cinnolinylene group, a phenanthridinylene group, an acridinylene group, a phenanthrolinylene group, a phenazinylene group, a triazinylene group, a dibenzofuranylene group, a dibenzothiophenylene group, a dibenzosilolylene group, a carbazolylene group, a benzocarbazolylene group, a dibenzocarbazolylene group, a benzonaphthyridinylene group, an azafluorenylene group, an azaspiro-bifluorenylene group, an azacarbazolylene group, an azadibenzofuranylene group, an azadibenzothiophenylene group, and an azadibenzosilolylene group; and a phenylene group, a pentalenylene group, an indenylene group, a naphthylene group, an azulenylene group, a heptalenylene group, an indacenylene group, an acenaphthylene group, a fluorenylene group, a spiro-bifluorenylene group, a spiro-benzofluorene-fluorenylene group, a benzofluorenylene group, a dibenzofluorenylene group, a phenalenylene group, a phenanthrenylene group, an anthracenylene group, a fluoranthenylene group, a triphenylenylene group, a pyrenylene group, a chrysenylene group, a naphthacenylene group, a picenylene group, a perylenylene group, a pentaphenylene group, a hexacenylene group, a pentacenylene group, a rubicenylene group, a coronenylene group, an ovalenylene group, a pyridinylene group, a pyrazinylene group, a pyrimidinylene group, a pyridazinylene group, a quinolinylene group, an isoquinolinylene group, a benzoquinolinylene group, a phthalazinylene group, a naphthyridinylene group, a quinoxalinylene group, a quinazolinylene group, a cinnolinylene group, a phenanthridinylene group, an acridinylene group, a phenanthrolinylene group, a phenazinylene group, a triazinylene group, a dibenzofuranylene group, a dibenzothiophenylene group, a dibenzosilolylene group, a carbazolylene group, a benzocarbazolylene group, a dibenzocarbazolylene group, a benzonaphthyridinylene group, an azafluorenylene group, an azaspiro-bifluorenylene group, an azacarbazolylene group, an azadibenzofuranylene group, an azadibenzothiophenylene group, and an azadibenzosilolylene group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_1$-$C_{60}$ heteroaryl group, a monovalent non-aromatic condensed polycyclic group, a monovalent non-aromatic condensed heteropolycyclic group, a biphenyl group, a terphenyl group, —Si($Q_{31}$)($Q_{32}$)($Q_{33}$), —N($Q_{31}$)($Q_{32}$), —B($Q_{31}$)($Q_{32}$), —C(=O)($Q_{31}$), —S(=O)$_2$($Q_{31}$), and —P(=O)($Q_{31}$)($Q_{32}$), and $L_{21}$ and $L_{22}$ may each independently be selected from the group consisting of:

a phenylene group, a pentalenylene group, an indenylene group, a naphthylene group, an azulenylene group, a heptalenylene group, an indacenylene group, an acenaphthylene group, a fluorenylene group, a spiro-bifluorenylene group, a spiro-benzofluorene-fluorenylene group, a benzofluorenylene group, a dibenzofluorenylene group, a phenalenylene group, a phenanthrenylene group, an anthracenylene group, a fluoranthenylene group, a triphenylenylene group, a pyrenylene group, a chrysenylene group, a naphthacenylene group, a picenylene group, a perylenylene group, a pentaphenylene group, a hexacenylene group, a pentacenylene group, a rubicenylene group, a coronenylene group, an ovalenylene group, a pyrrolylene group, a thiophenylene group, a furanylene group, a silolylene group, an imidazolylene group, a pyrazolylene group, a thiazolylene group, an isothiazolylene group, an oxazolylene group, an isoxazolylene group, a pyridinylene group, a pyrazinylene group, a pyrimidinylene group, a pyridazinylene group, an indolylene group, an isoindolylene group, an indazolylene group, a purinylene group, a quinolinylene group, an isoquinolinylene group, a benzoquinolinylene group, a phthalazinylene group, a naphthyridinylene group, a quinoxalinylene group, a quinazolinylene group, a cinnolinylene group, a phenanthridinylene group, an acridinylene group, a phenanthrolinylene group, a phenazinylene group, a benzimidazolylene group, a benzofuranylene group, a benzothiophenylene group, a benzosilolylene group, an isobenzothiazolylene group, a benzoxazolylene group, an isobenzoxazolylene group, a triazolylene group, a tetrazolylene group, an oxadiazolylene group, a triazinylene group, a dibenzofuranylene group, a dibenzothiophenylene group, a dibenzosilolylene group, a carbazolylene group, a benzocarbazolylene group, a dibenzocarbazolylene group, a thiadiazolylene group, an imidazopyridinylene group, an imidazopyrimidinylene group, an oxazolopyridinylene group, a thiazolopyridinylene group, a benzonaphthyridinylene group, an azafluorenylene group, an azaspiro-bifluorenylene group, an azacarbazolylene group, an azadibenzofuranylene group, an azadibenzothiophenylene group, and an azadibenzosilolylene group; and a phenylene group, a pentalenylene group, an indenylene group, a naphthylene group, an azulenylene group, a heptalenylene group, an indacenylene group, an acenaphthylene group, a fluorenylene group, a spiro-bifluorenylene group, a spiro-benzofluorene-fluorenylene group, a benzofluorenylene group, a dibenzofluorenylene group, a phenalenylene group, a phenanthrenylene group, an anthracenylene group, a fluoranthenylene group, a triphenylenylene group, a pyrenylene group, a chrysenylene group, a naphthacenylene group, a picenylene group, a perylenylene group, a pentaphenylene group, a hexacenylene group, a pentacenylene group, a rubicenylene group, a coronenylene group, an ovalenylene group, a pyrrolylene group, a thiophenylene group, a furanylene group, a silolylene group, an imidazolylene group, a pyrazolylene group, a thiazolylene group, an isothiazolylene group, an oxazolylene group, an isoxazolylene group, a pyridinylene group, a pyrazinylene group, a pyrimidinylene group, a pyridazinylene group, an indolylene group, an isoindolylene group, an indazolylene group, a purinylene group, a quinolinylene group, an isoquinolinylene group, a benzoquinolinylene group, a phthalazinylene group, a naphthyridinylene group, a quinoxalinylene group, a quinazolinylene group, a cinnolinylene group, a phenanthridinylene group, an acridinylene group, a phenanthrolinylene group, a phenazinylene group, a benzimidazolylene group, a benzofuranylene group, a benzothiophenylene group, a benzosilolylene group, an isobenzothiazolylene group, a benzoxazolylene group, an isobenzoxazolylene group, a triazolylene group, a tetrazolylene group, an oxadiazolylene group, a triazinylene group, a dibenzofuranylene group, a dibenzothiophenylene group, a dibenzosilolylene group, a carbazolylene group, a benzocarbazolylene group, a dibenzocarbazolylene group, a thiadiazolylene group, an imidazopyridinylene group, an imidazopyrimidinylene group, an oxazolopyridinylene group, a thiazolopyridinylene group, a benzonaphthyridinylene group, an azafluorenylene group, an azaspiro-bifluorenylene group, an azacarbazolylene group, an azadibenzofuranylene group, an azadibenzothiophenylene group, and an azadibenzosilolylene group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_1$-$C_{60}$ heteroaryl group, a monovalent non-aromatic condensed polycyclic group, a monovalent non-aromatic condensed heteropolycyclic group, a biphenyl group, a terphenyl group, —Si($Q_{31}$)($Q_{32}$)($Q_{33}$), —N($Q_{31}$)($Q_{32}$), —B($Q_{31}$)($Q_{32}$), —C(═O)($Q_{31}$), —S(═O)$_2$($Q_{31}$), and —P(═O)($Q_{31}$)($Q_{32}$), wherein $Q_1$ to $Q_3$ and $Q_{31}$ to $Q_{33}$ may each independently be selected from the group consisting of:

a $C_1$-$C_{10}$ alkyl group, a $C_1$-$C_{10}$ alkoxy group, a phenyl group, a biphenyl group, a terphenyl group, a naphthyl group, a pyridinyl group, a pyrimidinyl group, a pyrazinyl group, a quinolinyl group, an isoquinolinyl group, a quinoxalinyl group, and a quinazolinyl group; and a phenyl group, a biphenyl group, a terphenyl group, a naphthyl group, a pyridinyl group, a pyrimidinyl group, a pyrazinyl group, a quinolinyl group, an isoquinolinyl group, a quinoxalinyl group, and a quinazolinyl group, each substituted with at least one selected from a $C_1$-$C_{10}$ alkyl group, a $C_1$-$C_{10}$ alkoxy group, and a phenyl group, but embodiments of the present disclosure are not limited thereto.

In one or more embodiments, $L_1$ to $L_{14}$ in Formulae 1A to 1E may each independently be selected from groups represented by Formulae 3-1 to 3-14 and 3-17 to 3-101, and $L_{21}$ and $L_{22}$ in Formulae 2A and 2B may each independently be selected from groups represented by Formulae 3-1 to 3-101:

Formula 3-1

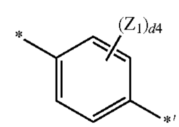

Formula 3-2

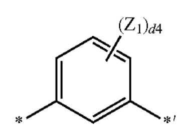

Formula 3-3

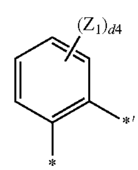

Formula 3-4

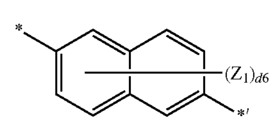

-continued
Formula 3-5
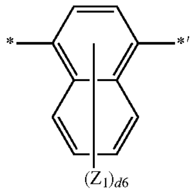
Formula 3-6
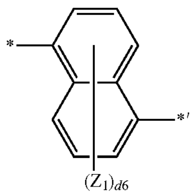
Formula 3-7
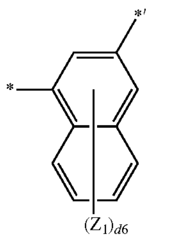
Formula 3-8
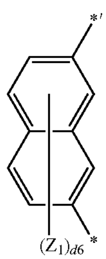
Formula 3-9
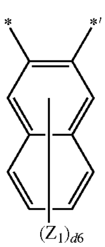
Formula 3-10
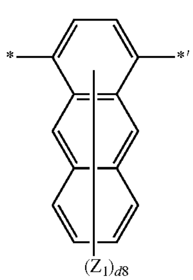
-continued
Formula 3-11
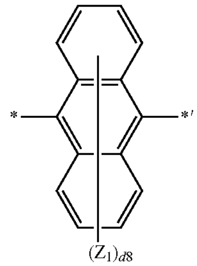
Formula 3-12
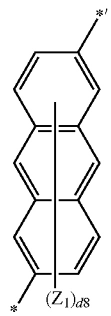
Formula 3-13
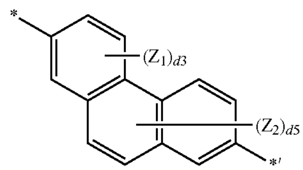
Formula 3-14
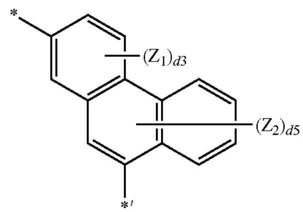
Formula 3-15
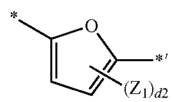
Formula 3-16
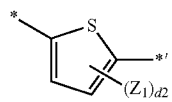
Formula 3-17
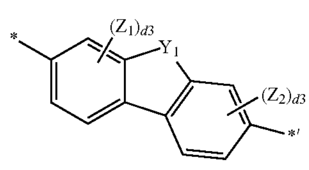
Formula 3-18
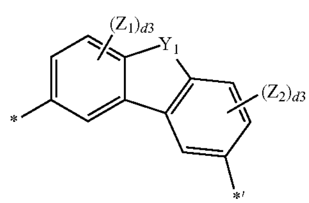

-continued
Formula 3-19
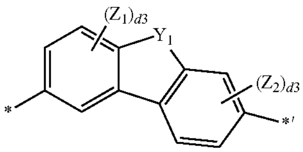
Formula 3-20
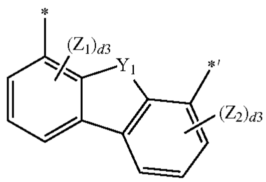
Formula 3-21
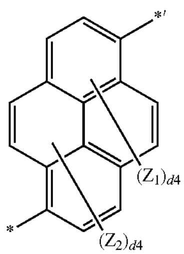
Formula 3-22
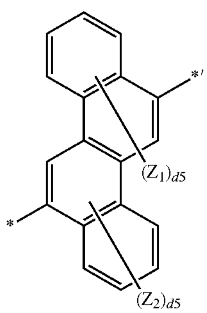
Formula 3-23
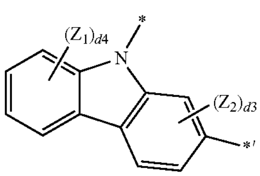
Formula 3-24
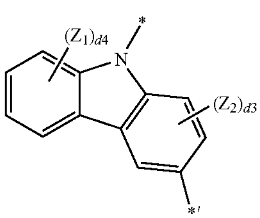
Formula 3-25
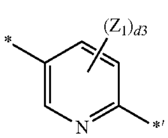
Formula 3-26
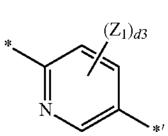
-continued
Formula 3-27
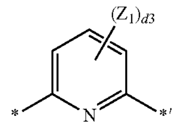
Formula 3-28
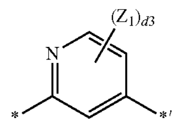
Formula 3-29
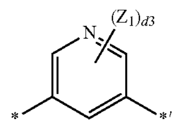
Formula 3-30
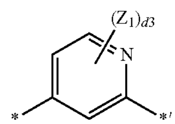
Formula 3-31
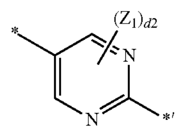
Formula 3-32
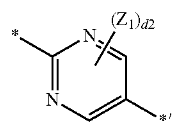
Formula 3-33
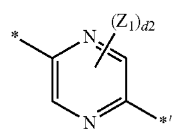
Formula 3-34
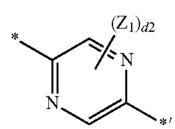
Formula 3-35
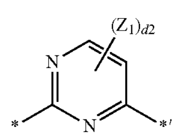
Formula 3-36
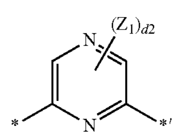
Formula 3-37
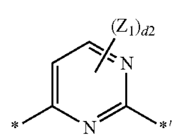
Formula 3-38
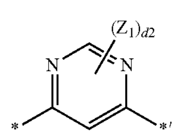

-continued
Formula 3-39
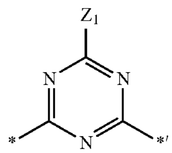
Formula 3-40
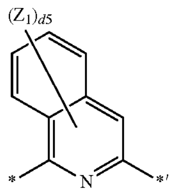
Formula 3-41
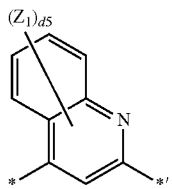
Formula 3-42
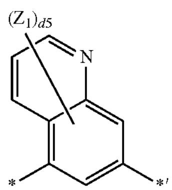
Formula 3-43
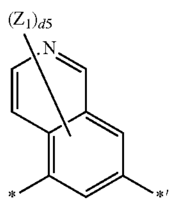
Formula 3-44
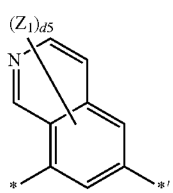
Formula 3-45
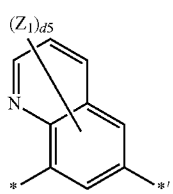
Formula 3-46
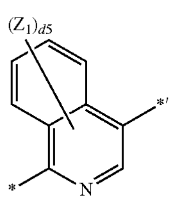
-continued
Formula 3-47
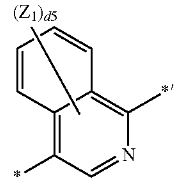
Formula 3-48
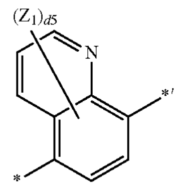
Formula 3-49
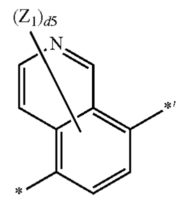
Formula 3-50
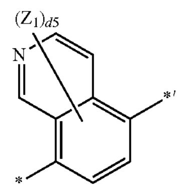
Formula 3-51
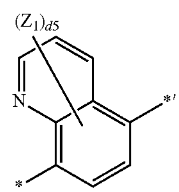
Formula 3-52
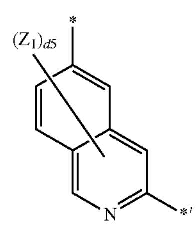
Formula 3-53
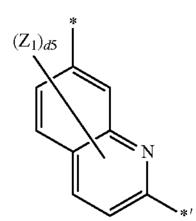
Formula 3-54
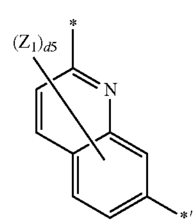

-continued
Formula 3-55
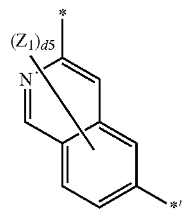
Formula 3-56
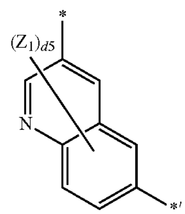
Formula 3-57
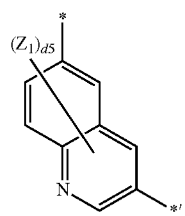
Formula 3-58
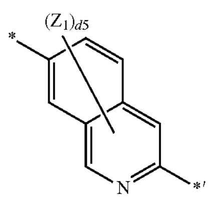
Formula 3-59
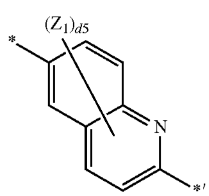
Formula 3-61
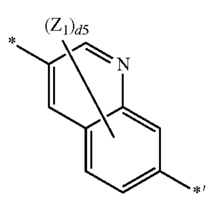
Formula 3-62
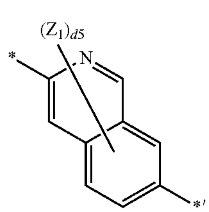
-continued
Formula 3-63
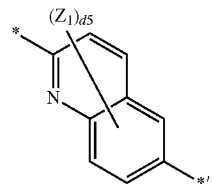
Formula 3-64
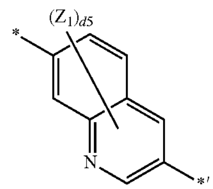
Formula 3-65
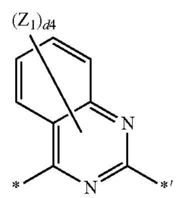
Formula 3-66
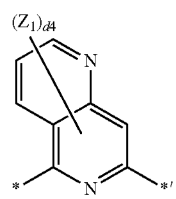
Formula 3-67
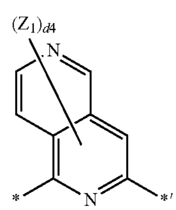
Formula 3-68
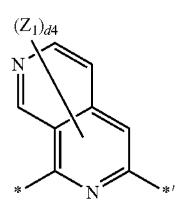
Formula 3-69
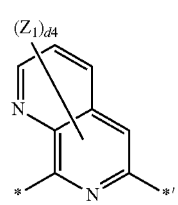
Formula 3-70
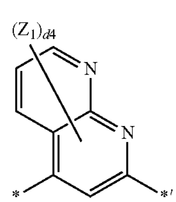

-continued
Formula 3-71
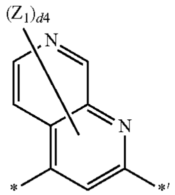
Formula 3-72
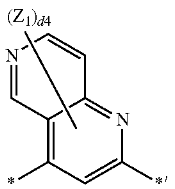
Formula 3-73
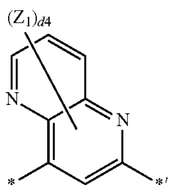
Formula 3-74
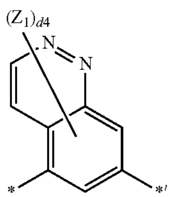
Formula 3-75
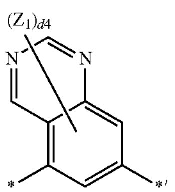
Formula 3-76
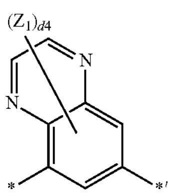
Formula 3-77
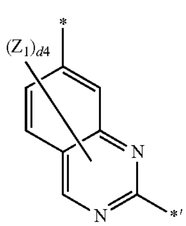
Formula 3-78
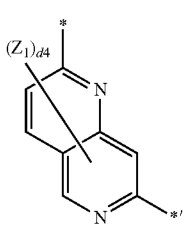
-continued
Formula 3-79
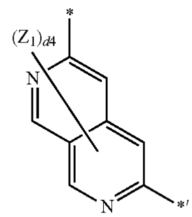
Formula 3-80
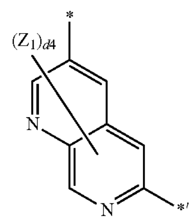
Formula 3-81
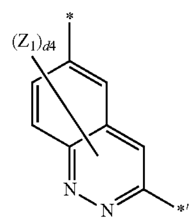
Formula 3-82
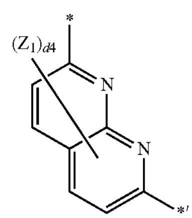
Formula 3-83
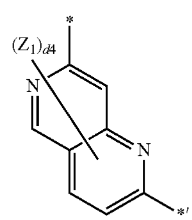
Formula 3-84
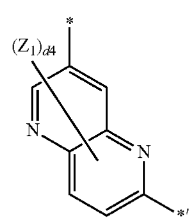
Formula 3-85
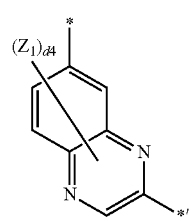

-continued
Formula 3-86
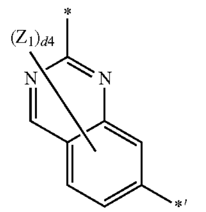
Formula 3-87
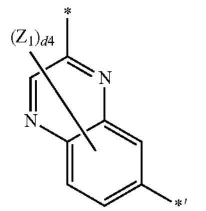
Formula 3-88
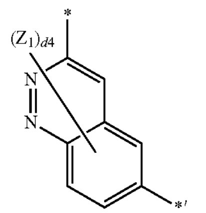
Formula 3-89
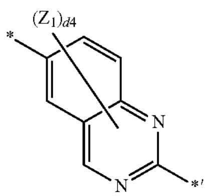
Formula 3-90
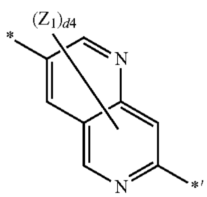
Formula 3-91
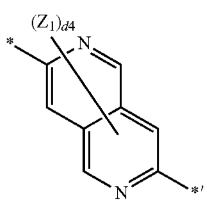
Formula 3-92
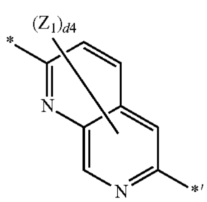
-continued
Formula 3-93
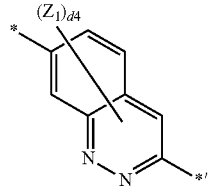
Formula 3-94
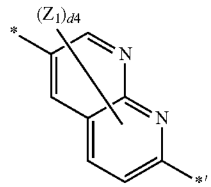
Formula 3-95
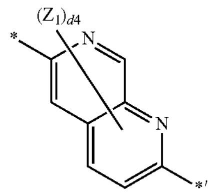
Formula 3-96
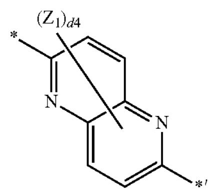
Formula 3-97
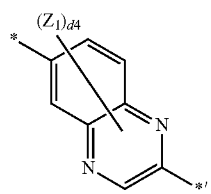
Formula 3-98
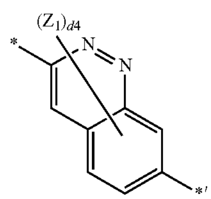
Formula 3-99
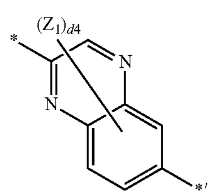
Formula 3-100
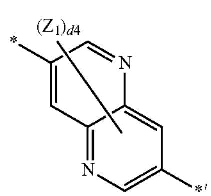

-continued

Formula 3-101

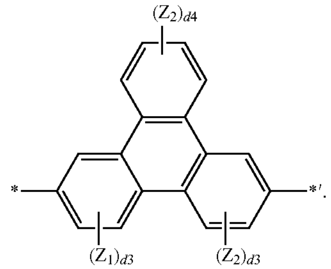

In Formulae 3-1 to 3-101, $Y_1$ may be selected from O, S, $C(Z_4)(Z_5)$, $N(Z_6)$, and $Si(Z_7)(4)$, $Z_1$ to $Z_8$ may each independently be selected from hydrogen, deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a biphenyl group, a terphenyl group, a pentalenyl group, an indenyl group, a naphthyl group, an azulenyl group, a heptalenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a pyrrolyl group, a thiophenyl group, a furanyl group, a silolyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an indolyl group, an isoindolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, a benzofuranyl group, a benzothiophenyl group, a benzosilolyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a dibenzosilolyl group, a carbazolyl group, a benzocarbazolyl group, a dibenzocarbazolyl group, a thiadiazolyl group, an imidazopyridinyl group, an imidazopyrimidinyl group, a benzonaphthyridinyl group, an azafluorenyl group, an azaspiro-bifluorenyl group, an azacarbazolyl group, an azadibenzofuranyl group, an azadibenzothiophenyl group, an azadibenzosilolyl group, $—Si(Q_{31})(Q_{32})(Q_{33})$, $—N(Q_{31})(Q_{32})$, $—B(Q_{31})(Q_{32})$, $—C(=O)(Q_{31})$, $—S(=O)_2(Q_{31})$, and $—P(=O)(Q_{31})(Q_{32})$, $Z_4$ and $Z_5$ may be optionally connected (e.g., coupled) to form a saturated or unsaturated ring, $Q_{31}$ to $Q_{33}$ may each independently be the same as described herein, d2 may be an integer selected from 0 to 2, d3 may be an integer selected from 0 to 3, d4 may be an integer selected from 0 to 4, d5 may be an integer selected from 0 to 5, d6 may be an integer selected from 0 to 6, d8 may be an integer selected from 0 to 8, and

* and *' may each independently indicate a binding site to a neighboring atom.

a1 in Formulae 1A to 1E, 2A, and 2B indicates the number of $L_1$(s), and may be an integer selected from 0 to 5. When a1 is zero, $*-(L_1)_{a1}-*'$ may be a single bond, and when a1 is two or more, two or more $L_1$(s) may be identical to or different from each other. a2 to a14, a21, and a22 may each independently be the same as described herein in connection with a1 and the structures of Formulae 1A to 1E, 2A, and 2B.

For example, a1 to a14, a21, and a22 may each independently be 0, 1, 2, or 3.

$R_1$ to $R_{14}$, $R_{21}$ to $R_{24}$, $R_{27}$, and $R_{28}$ may each independently be selected from hydrogen, deuterium, —F, —Cl, —Br, —I, a hydroxyl group, a cyano group, a nitro group, an amidino group, a hydrazino group, a hydrazono group, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, $—Si(Q_1)(Q_2)(Q_3)$, $—N(Q_1)(Q_2)$, $—B(Q_1)(Q_2)$, $—C(=O)(Q_1)$, $—S(=O)_2(Q_1)$, and $—P(=O)(Q_1)(Q_2)$.

For example, $R_1$ to $R_{14}$ may each independently be selected from the group consisting of:

hydrogen, deuterium, —F, —Cl, —Br, —I, a hydroxyl group, a cyano group, a nitro group, an amidino group, a hydrazino group, a hydrazono group, a $C_1$-$C_{20}$ alkyl group, and a $C_1$-$C_{20}$ alkoxy group;

a $C_1$-$C_{20}$ alkyl group and a $C_1$-$C_{20}$ alkoxy group, each substituted with at least one selected from deuterium, —F, —Cl, —Br, —I, a hydroxyl group, a cyano group, a nitro group, an amidino group, a hydrazino group, and a hydrazono group;

a phenyl group, a biphenyl group, a terphenyl group, a pentalenyl group, an indenyl group, a naphthyl group, an azulenyl group, an indacenyl group, an acenaphthyl group, a fluorenyl group, a spiro-bifluorenyl group, a benzofluorenyl group, a dibenzofluorenyl group, a spiro-benzofluorene-fluorenyl group, an indenofluorenyl group, a phenalenyl group, a phenanthrenyl group, an anthracenyl group, a fluoranthenyl group, a triphenylenyl group, a pyrenyl group, a chrysenyl group, a perylenyl group, a pentaphenyl group, a tetraphenyl group, a pyridinyl group, a pyrazinyl group, a pyrimidinyl group, a pyridazinyl group, a quinolinyl group, an isoquinolinyl group, a benzoquinolinyl group, a phthalazinyl group, a naphthyridinyl group, a quinoxalinyl group, a quinazolinyl group, a carbazolyl group, a phenanthridinyl group, an acridinyl group, a phenanthrolinyl group, a phenazinyl group, a triazinyl group, a dibenzofuranyl group, a dibenzothiophenyl group, a benzocarbazolyl group, a dibenzocarbazolyl group, a dibenzosilolyl group, an azafluorenyl group, an azaspiro-bifluorenyl group, an azacarbazolyl group, an azadibenzofuranyl group, an azadibenzothiophenyl group, an azadibenzosilolyl group, a benzofuranopyrimidinyl group, a benzothiophenopyrimidyl group, a pyrimidinoquinoxalinyl group, and an azaindenopyridinyl group; and a phenyl group, a biphenyl group, a terphenyl group, a pentalenyl group, an indenyl group, a naphthyl group, an azulenyl group, an indacenyl group, an acenaphthyl group, a fluorenyl group, a spiro-bifluorenyl group, a benzofluorenyl group, a dibenzofluorenyl group, a spiro-benzofluorene-fluorenyl group, an indenofluorenyl group, a phenalenyl group, a phenanthrenyl group, an anthracenyl group, a fluoranthenyl group, a triphenylenyl group, a pyrenyl group, a chrysenyl group, a perylenyl group, a pentaphenyl group, a tetraphenyl group, a pyridinyl group, a pyrazinyl group, a pyrimidinyl group, a pyridazinyl group, a quinolinyl group, an isoquinolinyl group, a benzoquinolinyl group, a phthalazinyl group, a naphthyridinyl group, a quinoxalinyl group, a quinazolinyl group, a carbazolyl group, a phenanthridinyl group, an acridinyl group, a phenanthrolinyl group, a phenazinyl group, a triazinyl group, a dibenzofuranyl group, a dibenzothiophenyl group, a benzocarbazolyl group, a dibenzocarbazolyl group, a dibenzosilolyl group, an azafluorenyl group, an azaspiro-bifluorenyl group, an azacarbazolyl group, an azadibenzofuranyl group, an azadibenzothiophenyl group, an azadibenzosilolyl group, a benzofuranopyrimidinyl group, a benzothienopyrimidyl group, a pyrimidinoquinoxalinyl group, and an azaindenopyridinyl group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a $C_3$-$C_{20}$ cycloalkyl group, a $C_6$-$C_{20}$ aryl group, a $C_3$-$C_{20}$ heteroaryl group, —$Si(Q_{31})(Q_{32})(Q_{33})$, —$N(Q_{31})(Q_{32})$, —$B(Q_{31})(Q_{32})$, —$C({=}O)(Q_{31})$, —$S({=}O)_2(Q_{31})$, and —$P({=}O)(Q_{31})(Q_{32})$, wherein $Q_1$ to $Q_3$ and $Q_{31}$ to $Q_{33}$ may each independently be the same as described herein.

In one or more embodiments, $R_{21}$ to $R_{24}$, $R_{27}$, and $R_{28}$ may each independently be selected from the group consisting of:

a cyclopentyl group, a cyclohexyl group, a cycloheptyl group, a cyclopentenyl group, a cyclohexenyl group, a phenyl group, a biphenyl group, a terphenyl group, a pentalenyl group, an indenyl group, a naphthyl group, an azulenyl group, an indacenyl group, an acenaphthyl group, a fluorenyl group, a spiro-bifluorenyl group, a spiro-benzofluorene-fluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a perylenyl group, a pentaphenyl group, a pyrrolyl group, a thiophenyl group, a furanyl group, a silolyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an indolyl group, an isoindolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, a benzofuranyl group, a benzothiophenyl group, a benzosilolyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a dibenzosilolyl group, a carbazolyl group, a benzocarbazolyl group, a dibenzocarbazolyl group, a thiadiazolyl group, an imidazopyridinyl group, an imidazopyrimidinyl group, an oxazolopyridinyl group, a thiazolopyridinyl group, a benzonaphthyridinyl group, an azafluorenyl group, an azaspiro-bifluorenyl group, an azacarbazolyl group, an azadibenzofuranyl group, an azadibenzothiophenyl group, and an azadibenzosilolyl group; and a cyclopentyl group, a cyclohexyl group, a cycloheptyl group, a cyclopentenyl group, a cyclohexenyl group, a phenyl group, a biphenyl group, a terphenyl group, a pentalenyl group, an indenyl group, a naphthyl group, an azulenyl group, an indacenyl group, an acenaphthyl group, a fluorenyl group, a spiro-bifluorenyl group, a spiro-benzofluorene-fluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a perylenyl group, a pentaphenyl group, a pyrrolyl group, a thiophenyl group, a furanyl group, a silolyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an indolyl group, an isoindolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, a benzofuranyl group, a benzothiophenyl group, a benzosilolyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a dibenzosilolyl group, a carbazolyl group, a benzocarbazolyl group, a dibenzocarbazolyl group, a thiadiazolyl group, an imidazopyridinyl group, an imidazopyrimidinyl group, an oxazolopyridinyl group, a thiazolopyridinyl group, a benzonaphthyridinyl group, an azafluorenyl group, an azaspiro-bifluorenyl group, an azacarbazolyl group, an azadibenzofuranyl group, an azadibenzothiophenyl group, and an azadibenzosilolyl group, each substituted with deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_1$-$C_{60}$ heteroaryl group, a monovalent non-aromatic condensed polycyclic group, a monovalent non-aromatic condensed heteropolycyclic group, a biphenyl group, a terphenyl group, —$Si(Q_{31})(Q_{32})(Q_{33})$, —$N(Q_{31})(Q_{32})$, —$B(Q_{31})(Q_{32})$, —$C(=O)(Q_{31})$, —$S(=O)_2(Q_{31})$, and —$P(=O)(Q_{31})(Q_{32})$, or $R_{22}$ may be selected from hydrogen, deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, —$Si(Q_1)(Q_2)(Q_3)$, —$S(=O)_2(Q_1)$, and —$P(=O)(Q_1)(Q_2)$, wherein $Q_1$ to $Q_3$ and $Q_{31}$ to $Q_{33}$ may each independently be the same as described herein.

In one or more embodiments, $R_1$ to $R_{14}$ in Formulae 1A to 1E may each independently be selected from hydrogen, deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, and a group represented by any of Formulae 5-1 to 5-48, 6-1 to 6-49, and 6-78 to 6-122, $R_{21}$, $R_{23}$, $R_{24}$, $R_{27}$, and $R_{28}$ in Formulae 2A and 2B may each independently be selected from groups represented by Formulae 5-1 to 5-48 and 6-1 to 6-124, and $R_{22}$ may be selected from hydrogen, deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a group represented by any of Formulae 5-1 to 5-48 and 6-1 to 6-124, —$Si(Q_1)(Q_2)(Q_3)$, —$S(=O)_2(Q_1)$, and —$P(=O)(Q_1)(Q_2)$, but embodiments of the present disclosure are not limited thereto:

Formula 5-1

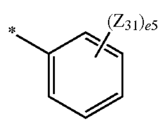

Formula 5-2

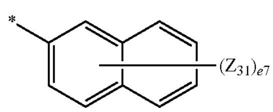

Formula 5-3

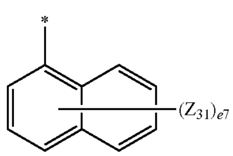

Formula 5-4

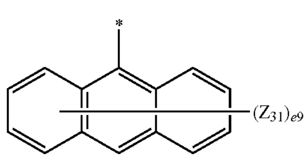

Formula 5-5

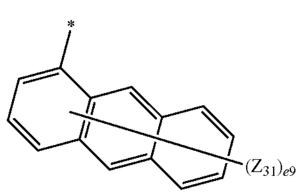

-continued

Formula 5-6

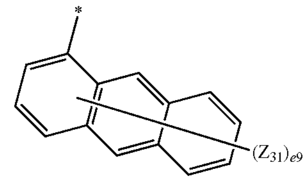

Formula 5-7

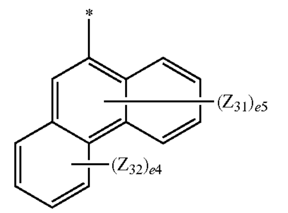

Formula 5-8

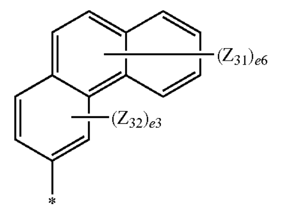

Formula 5-9

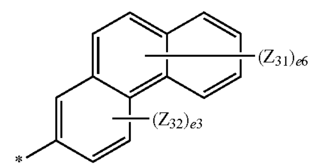

Formula 5-10

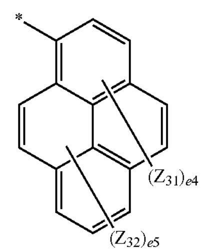

Formula 5-11

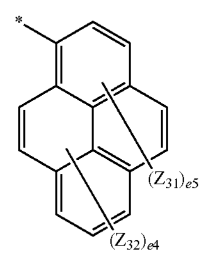

Formula 5-12

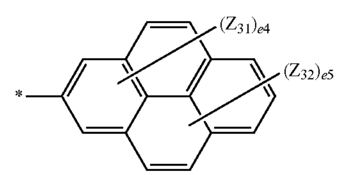

Formula 5-13

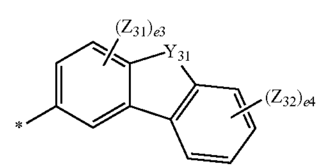

-continued
Formula 5-14
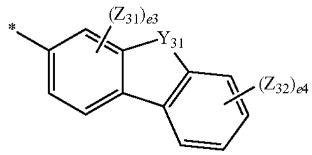
Formula 5-15
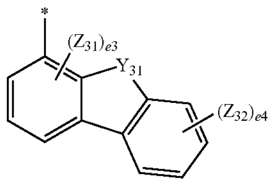
Formula 5-16
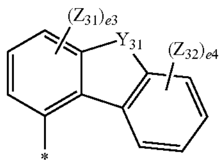
Formula 5-17
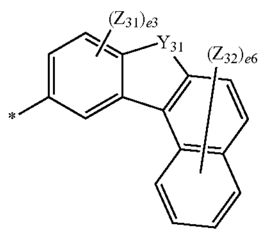
Formula 5-18
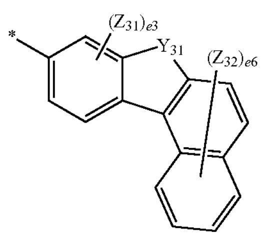
Formula 5-19
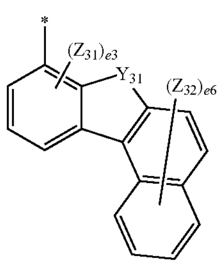
Formula 5-20
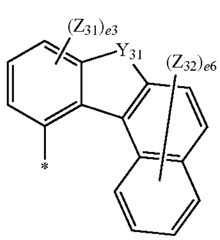
-continued
Formula 5-21
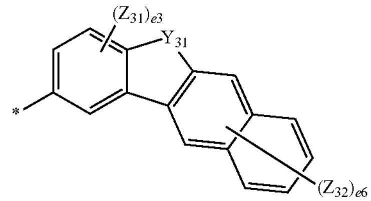
Formula 5-22
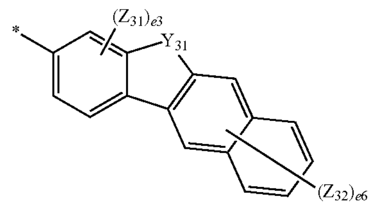
Formula 5-23
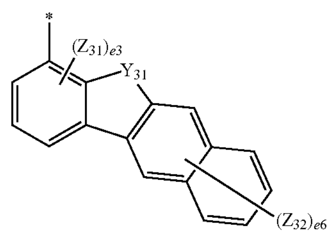
Formula 5-24
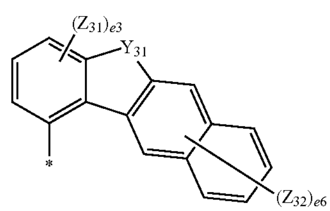
Formula 5-25
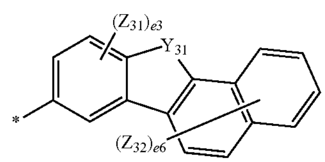
Formula 5-26
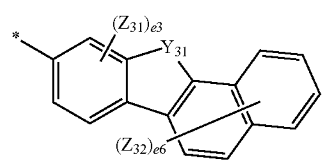
Formula 5-27
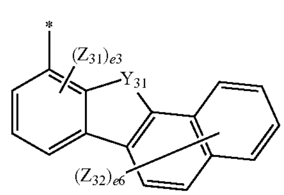
Formula 5-28
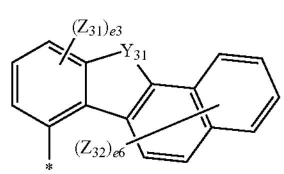

-continued
Formula 5-29
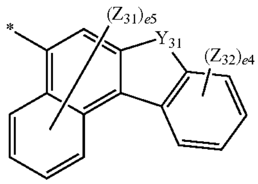
Formula 5-30
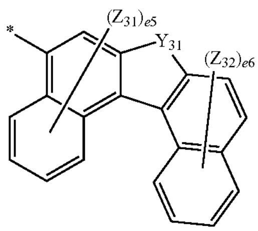
Formula 5-31
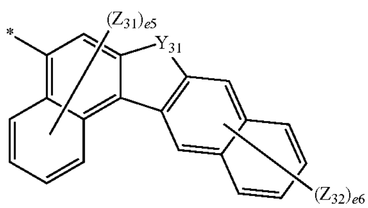
Formula 5-32
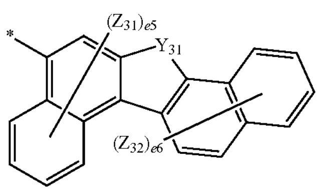
Formula 5-33
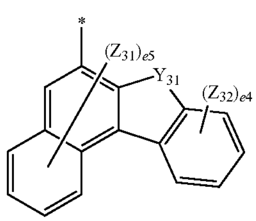
Formula 5-34
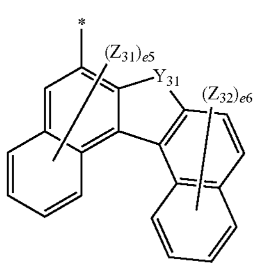
Formula 5-35
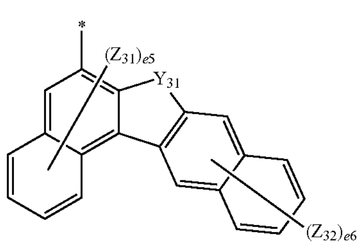
-continued
Formula 5-36
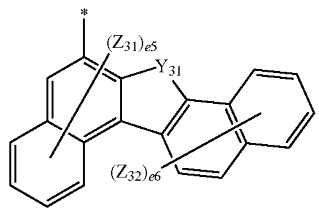
Formula 5-37
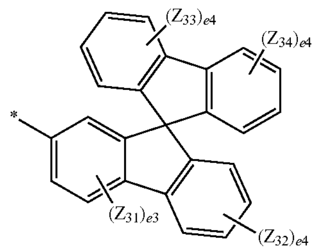
Formula 5-38
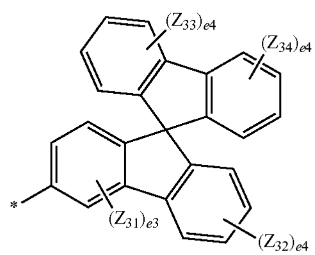
Formula 5-39
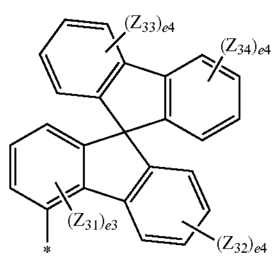
Formula 5-40
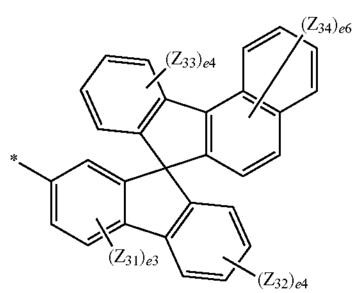
Formula 5-41
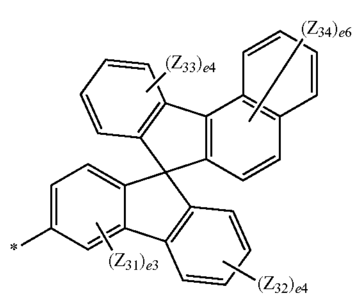

-continued
Formula 5-42
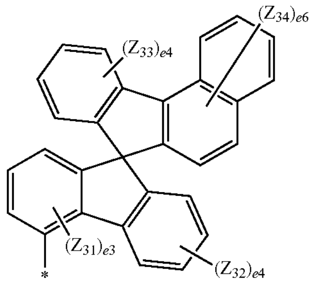
Formula 5-43
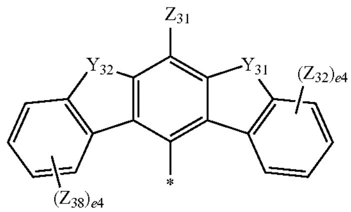
Formula 5-44
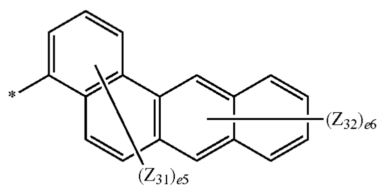
Formula 5-45
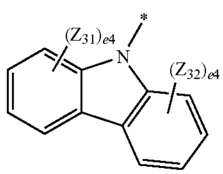
Formula 5-46
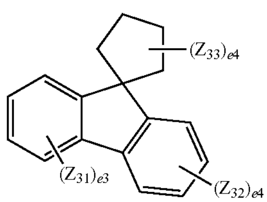
Formula 5-47
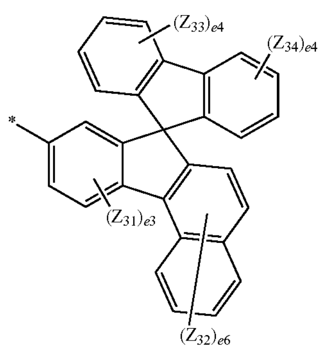
Formula 5-48
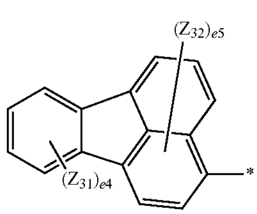
-continued
Formula 6-1
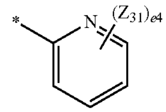
Formula 6-2
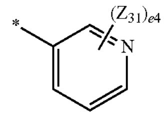
Formula 6-3
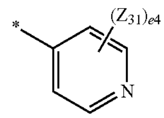
Formula 6-4
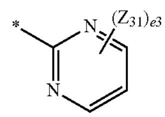
Formula 6-5
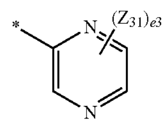
Formula 6-6
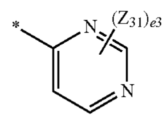
Formula 6-7
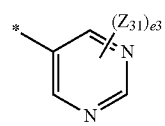
Formula 6-8
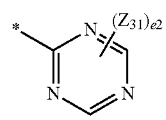
Formula 6-9
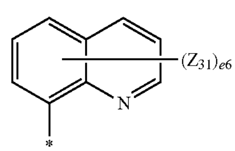
Formula 6-10
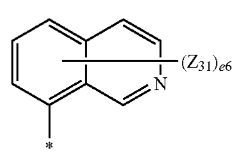
Formula 6-11
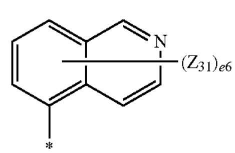
Formula 6-12
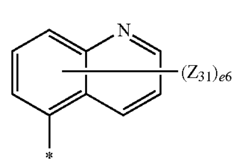

-continued
Formula 6-13
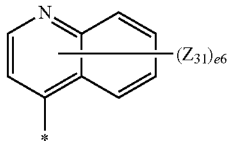
Formula 6-14
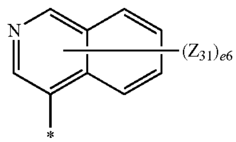
Formula 6-15
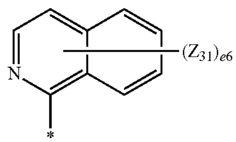
Formula 6-16
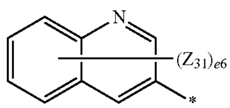
Formula 6-17
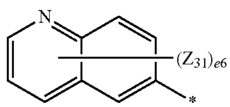
Formula 6-18
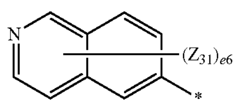
Formula 6-19
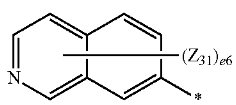
Formula 6-20
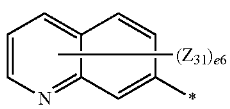
Formula 6-21
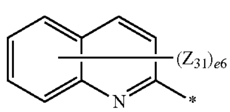
Formula 6-22
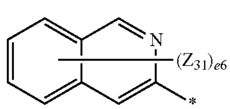
Formula 6-23
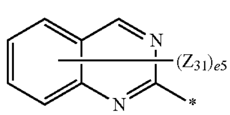
Formula 6-24
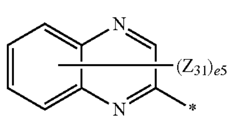
Formula 6-25
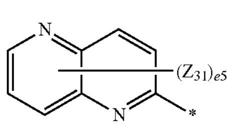
-continued
Formula 6-26
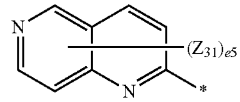
Formula 6-27
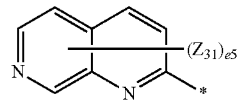
Formula 6-28
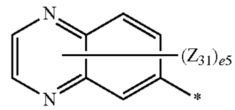
Formula 6-29
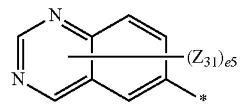
Formula 6-30
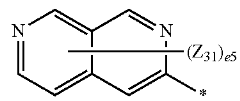
Formula 6-31
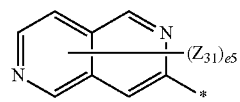
Formula 6-32
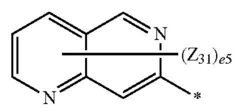
Formula 6-33
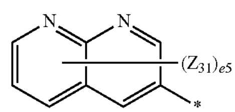
Formula 6-34
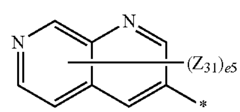
Formula 6-35
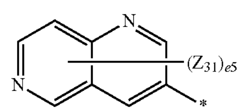
Formula 6-36
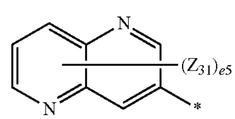
Formula 6-37
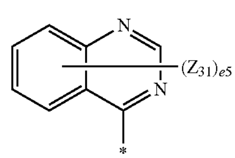
Formula 6-38
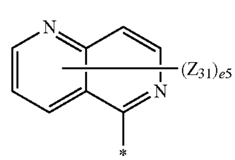

-continued
Formula 6-39
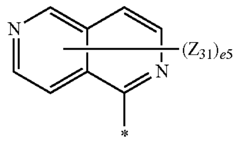
Formula 6-40
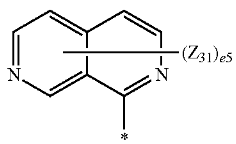
Formula 6-41
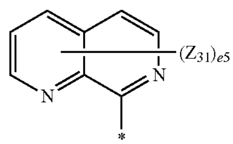
Formula 6-42
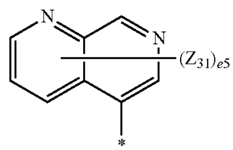
Formula 6-43
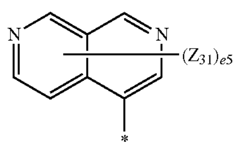
Formula 6-44
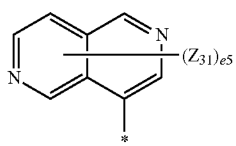
Formula 6-45
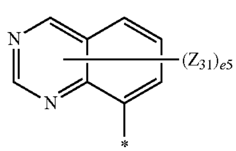
Formula 6-46
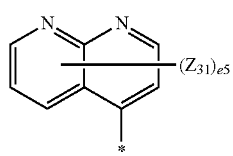
Formula 6-47
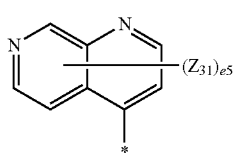
Formula 6-48
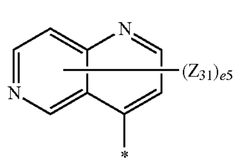
-continued
Formula 6-49
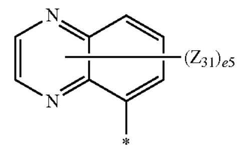
Formula 6-50
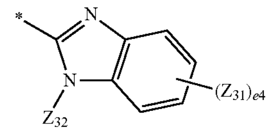
Formula 6-51
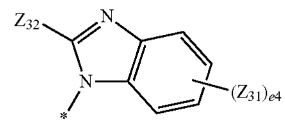
Formula 6-52
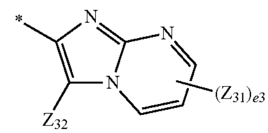
Formula 6-53
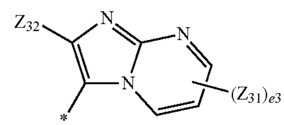
Formula 6-54
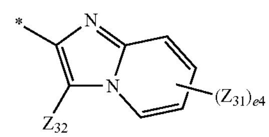
Formula 6-55
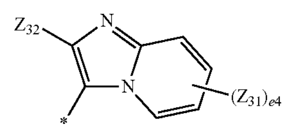
Formula 6-56
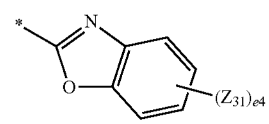
Formula 6-57
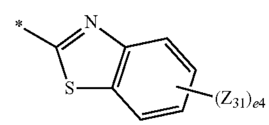
Formula 6-58
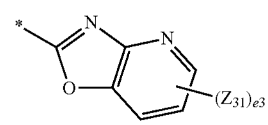
Formula 6-59
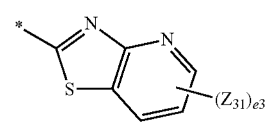
Formula 6-60
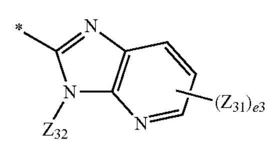

-continued
Formula 6-61
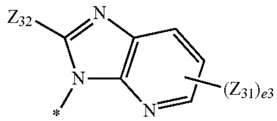
Formula 6-62
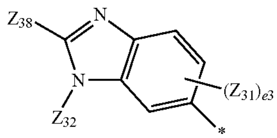
Formula 6-63
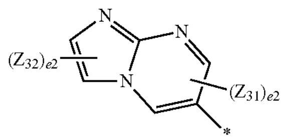
Formula 6-64
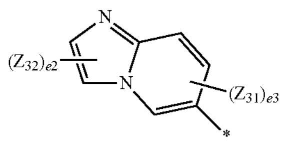
Formula 6-65
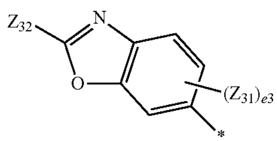
Formula 6-66
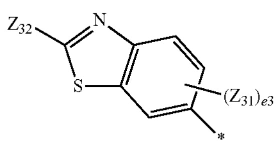
Formula 6-67
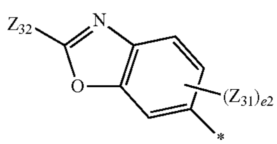
Formula 6-68
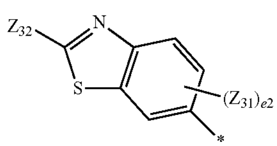
Formula 6-69
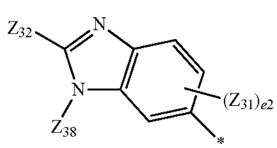
Formula 6-70
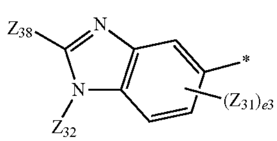
Formula 6-71
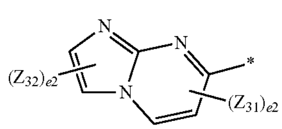
-continued
Formula 6-72
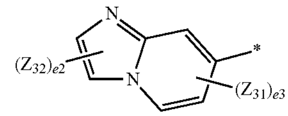
Formula 6-73
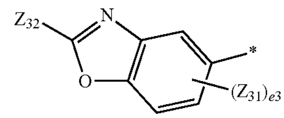
Formula 6-74
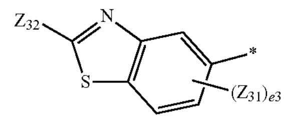
Formula 6-75
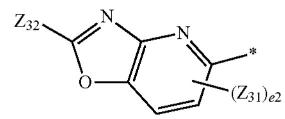
Formula 6-76
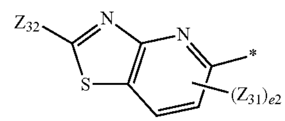
Formula 6-77
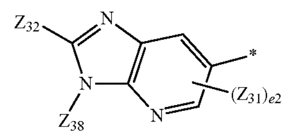
Formula 6-78
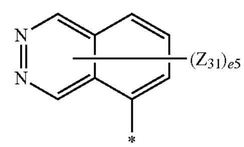
Formula 6-79
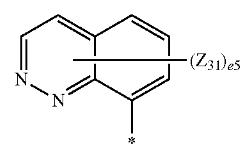
Formula 6-80
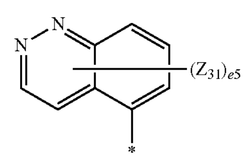
Formula 6-81
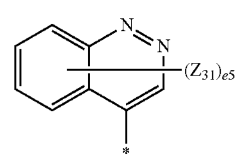
Formula 6-82
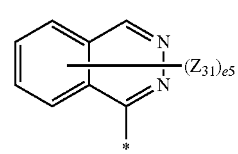

-continued
Formula 6-83
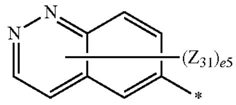
Formula 6-84
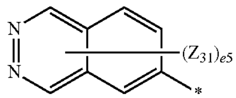
Formula 6-85
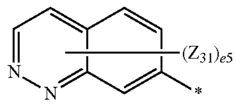
Formula 6-86
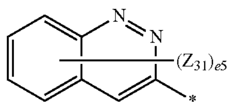
Formula 6-87
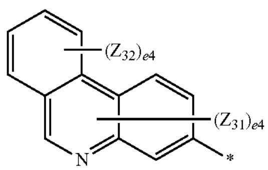
Formula 6-88
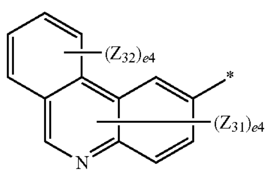
Formula 6-89
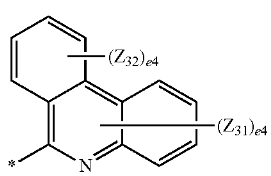
Formula 6-90
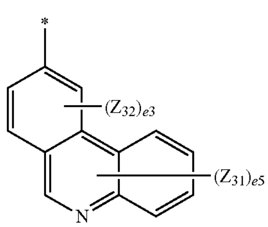
Formula 6-91
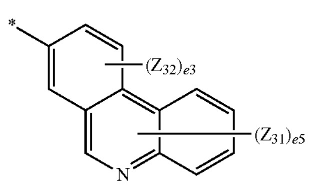
Formula 6-92
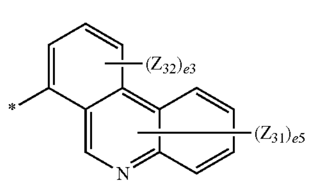
-continued
Formula 6-93
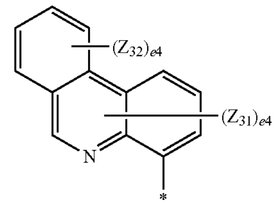
Formula 6-94
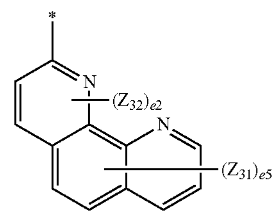
Formula 6-95
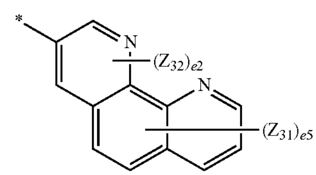
Formula 6-96
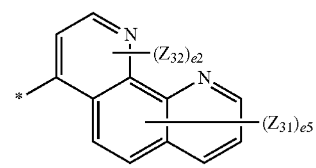
Formula 6-97
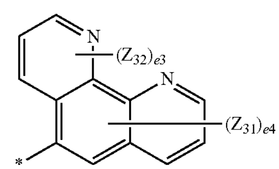
Formula 6-98
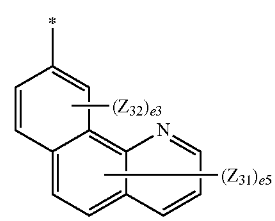
Formula 6-99
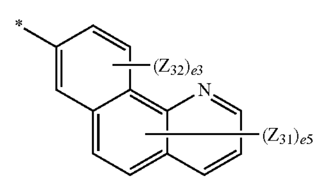
Formula 6-100
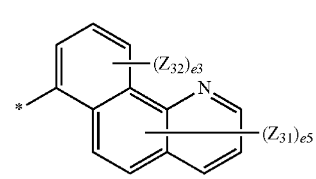

-continued
Formula 6-101
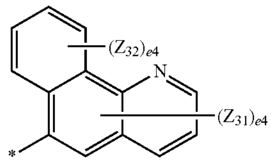
Formula 6-102
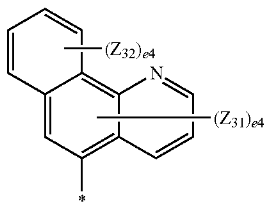
Formula 6-103
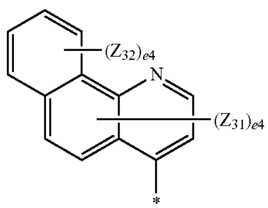
Formula 6-104
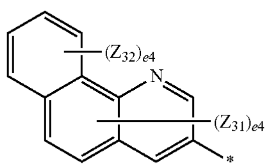
Formula 6-105
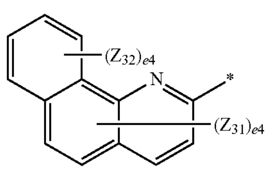
Formula 6-106
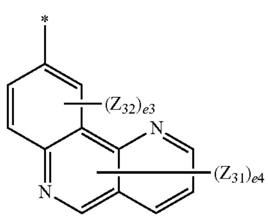
Formula 6-107
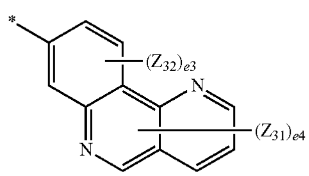
Formula 6-108
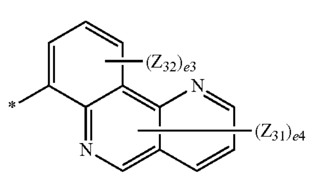
-continued
Formula 6-109
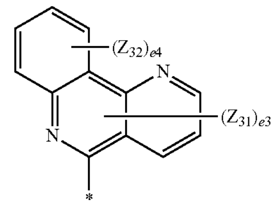
Formula 6-110
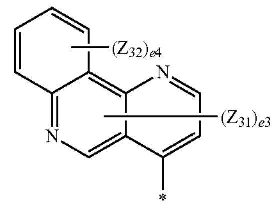
Formula 6-111
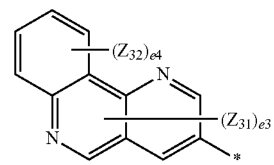
Formula 6-112
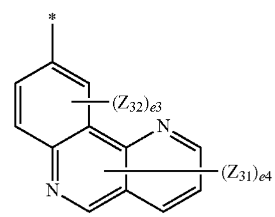
Formula 6-113
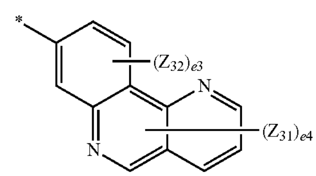
Formula 6-114
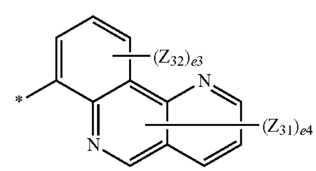
Formula 6-115
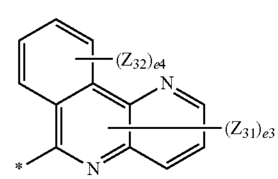
Formula 6-116
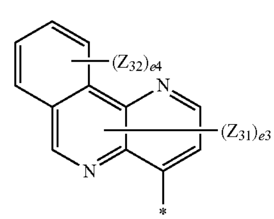

-continued

Formula 6-117

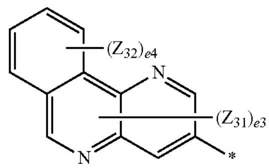

Formula 6-118

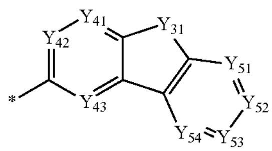

Formula 6-119

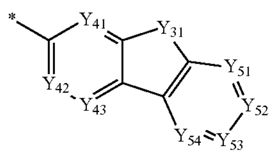

Formula 6-120

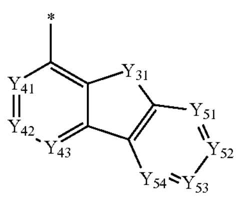

Formula 6-121

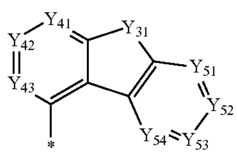

Formula 6-122

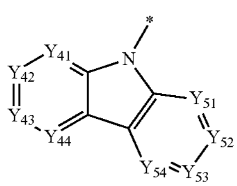

Formula 6-123

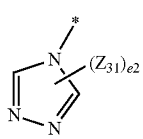

Formula 6-124

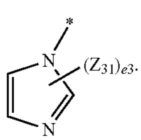

In Formulae 5-1 to 5-48 and 6-1 to 6-124, $Y_{31}$ and $Y_{32}$ may each independently be selected from O, S, $C(Z_{33})(Z_{34})$, $N(Z_{35})$, and $Si(Z_{36})(Z_{37})$, $Y_{41}$ may be N or $C(Z_{41})$, $Y_{42}$ may be N or $C(Z_{42})$, $Y_{43}$ may be N or $C(Z_{43})$, $Y_{44}$ may be N or $C(Z_{44})$, $Y_{51}$ may be N or $C(Z_{51})$, $Y_{52}$ may be N or $C(Z_{52})$, $Y_{53}$ may be N or $C(Z_{53})$, $Y_{54}$ may be N or $C(Z_{54})$, at least one selected from $Y_{41}$ to $Y_{43}$ and $Y_{51}$ to $Y_{54}$ in Formulae 5-118 to 5-121 may be N, and at least one selected from $Y_{41}$ to $Y_{44}$ and $Y_{51}$ to $Y_{54}$ in Formula 5-122 may be N, $Z_{31}$ to $Z_{37}$, $Z_{41}$ to $Z_{44}$, and $Z_{51}$ to $Z_{54}$ may each independently be selected from hydrogen, deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a biphenyl group, a terphenyl group, a pentalenyl group, an indenyl group, a naphthyl group, an azulenyl group, a heptalenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a pyrrolyl group, a thiophenyl group, a furanyl group, a silolyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an indolyl group, an isoindolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, a benzofuranyl group, a benzothiophenyl group, a benzosilolyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a dibenzosilolyl group, a carbazolyl group, a benzocarbazolyl group, a dibenzocarbazolyl group, a thiadiazolyl group, an imidazopyridinyl group, an imidazopyrimidinyl group, a benzonaphthyridinyl group, an azafluorenyl group, an azaspiro-bifluorenyl group, an azacarbazolyl group, an azadibenzofuranyl group, an azadibenzothiophenyl group, an azadibenzosilolyl group, $—Si(Q_{31})(Q_{32})(Q_{33})$, and $—P(=O)(Q_{31})(Q_{32})$, $Q_{31}$ to $Q_{33}$ may each independently be the same as described herein, and $Q_1$ to $Q_3$ may each independently be the same as described herein in connection with $Q_{31}$, e2 may be an integer selected from 0 to 2, e3 may be an integer selected from 0 to 3, e4 may be an integer selected from 0 to 4, e5 may be an integer selected from 0 to 5, e6 may be an integer selected from 0 to 6, e7 may be an integer selected from 0 to 7, e9 may be an integer selected from 0 to 9, and

* may indicate a binding site to a neighboring atom.

In one or more embodiments, $R_1$ to $R_{14}$ in Formulae 1A to 1E may each independently be selected from hydrogen, deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, and a group represented by any of Formulae 9-1 to 9-100, 10-1 to 10-105, and 10-112 to 10-121, $R_{21}$, $R_{23}$, $R_{24}$, $R_{27}$, and $R_{28}$ in Formulae 2A and 2B may each independently be selected from groups represented by Formulae 9-1 to 9-100 and 10-1 to 10-121, and $R_{22}$ in Formulae 2A and 2B may be selected from hydrogen, deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a group represented by any of Formulae 9-1 to 9-100 and 10-1 to 10-121, —Si($Q_1$)($Q_2$)($Q_3$), —S(=O)$_2$($Q_1$), and —P(=O)($Q_1$)($Q_2$), but embodiments of the present disclosure are not limited thereto:

Formula 9-1

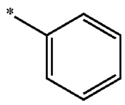

Formula 9-2

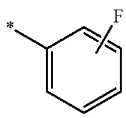

Formula 9-3

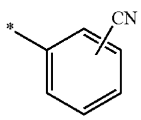

Formula 9-4

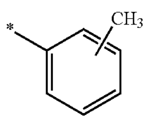

Formula 9-5

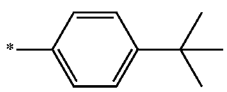

Formula 9-6

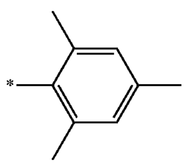

Formula 9-7

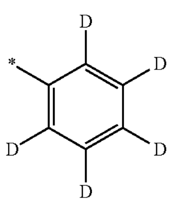

Formula 9-8

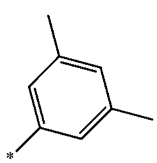

Formula 9-9

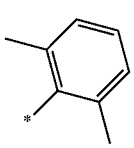

Formula 9-10

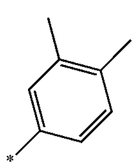

-continued

Formula 9-11

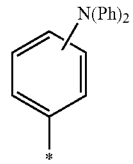

Formula 9-12

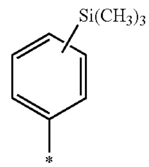

Formula 9-13

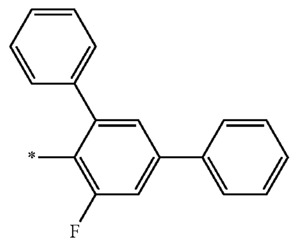

Formula 9-14

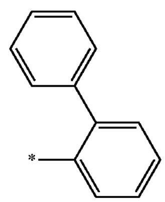

Formula 9-15

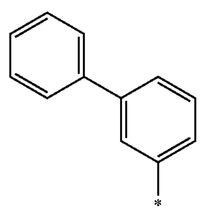

Formula 9-16

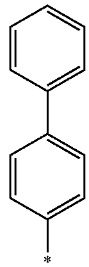

Formula 9-17

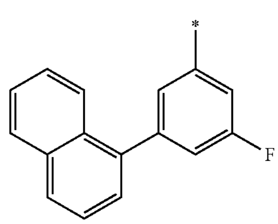

-continued
Formula 9-18
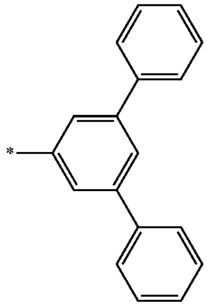
Formula 9-19
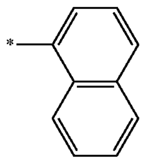
Formula 9-20
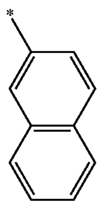
Formula 9-21
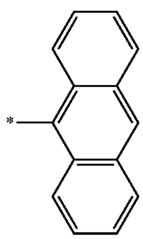
Formula 9-22
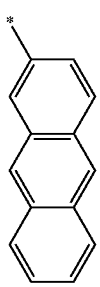
Formula 9-23
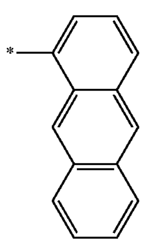
-continued
Formula 9-24
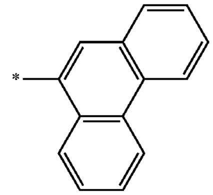
Formula 9-25
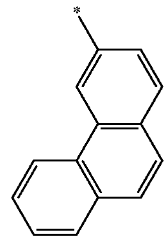
Formula 9-26
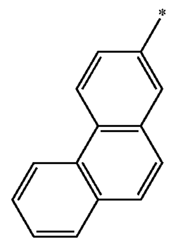
Formula 9-27
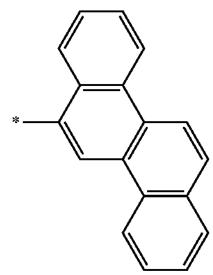
Formula 9-28
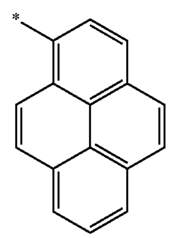
Formula 9-29
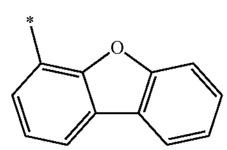
Formula 9-30
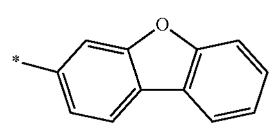
Formula 9-31
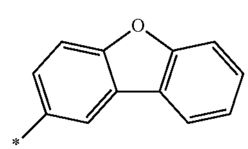

-continued
Formula 9-32
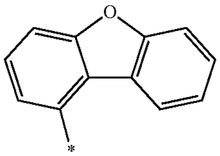
Formula 9-33
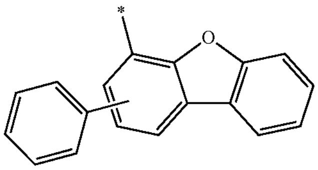
Formula 9-34
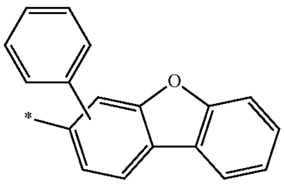
Formula 9-35
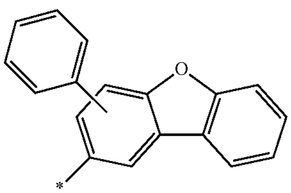
Formula 9-36
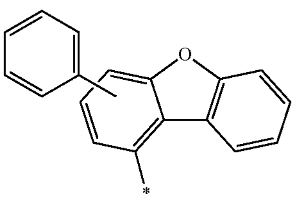
Formula 9-37
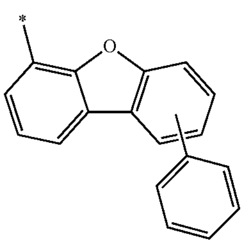
Formula 9-38
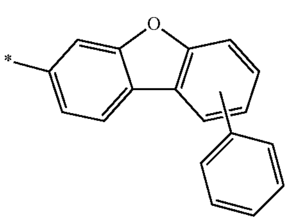
Formula 9-39
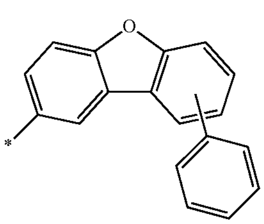
-continued
Formula 9-40
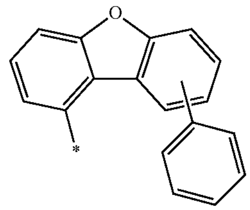
Formula 9-41
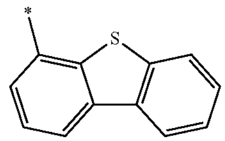
Formula 9-42
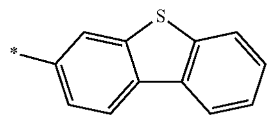
Formula 9-43
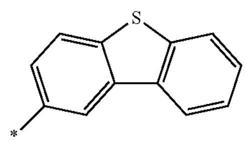
Formula 9-44
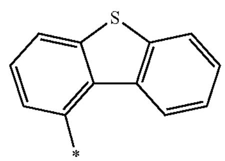
Formula 9-45
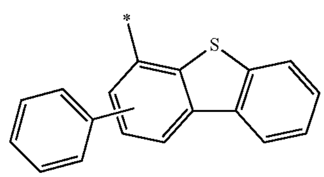
Formula 9-46
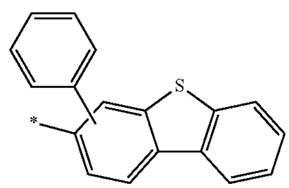
Formula 9-47
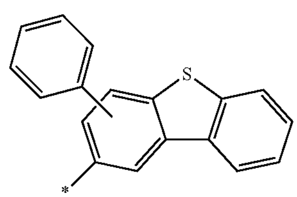
Formula 9-48
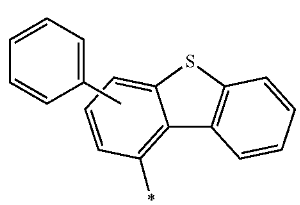

-continued
Formula 9-49
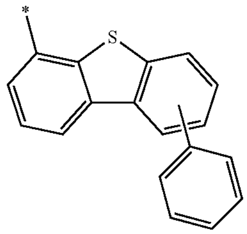
Formula 9-50
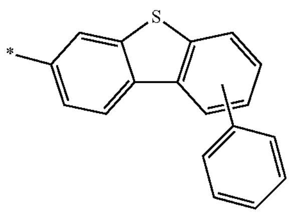
Formula 9-51
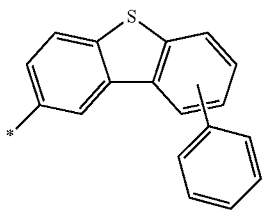
Formula 9-52
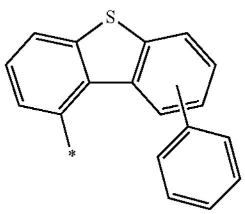
Formula 9-53
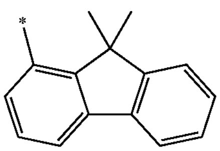
Formula 9-54
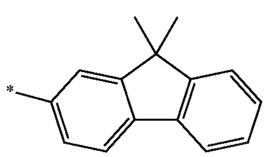
Formula 9-55
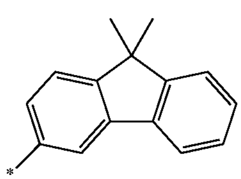
Formula 9-56
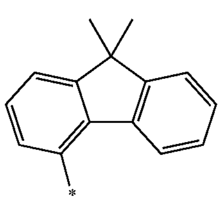
-continued
Formula 9-57
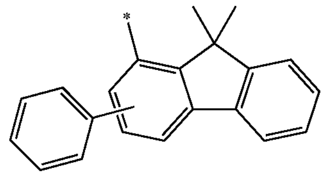
Formula 9-58
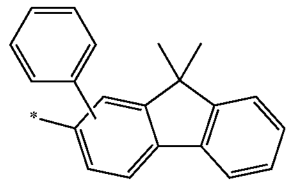
Formula 9-59
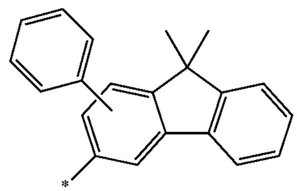
Formula 9-60
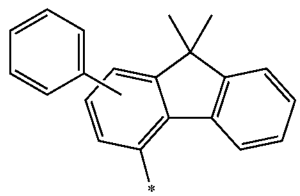
Formula 9-61
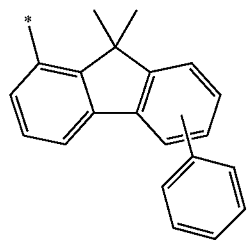
Formula 9-62
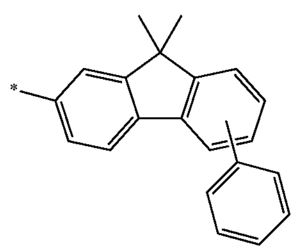
Formula 9-63
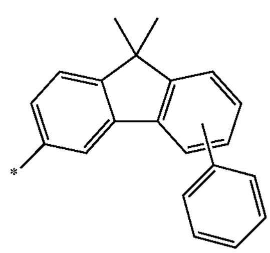

-continued
Formula 9-64
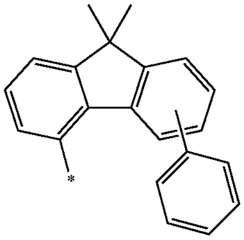
Formula 9-65
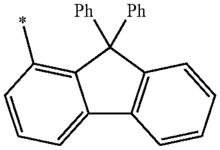
Formula 9-66
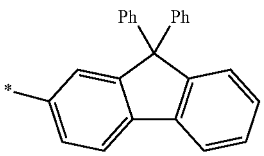
Formula 9-67
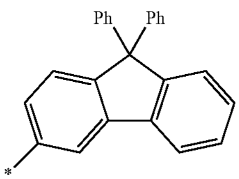
Formula 9-68
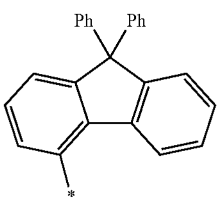
Formula 9-69
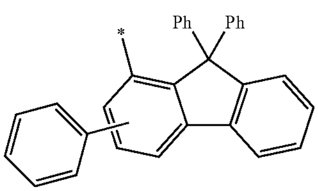
Formula 9-70
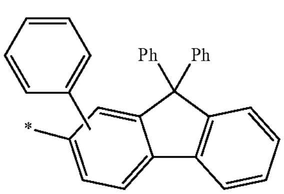
Formula 9-71
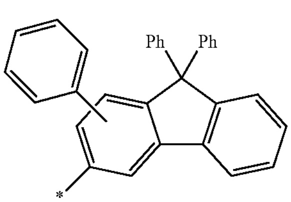
-continued
Formula 9-72
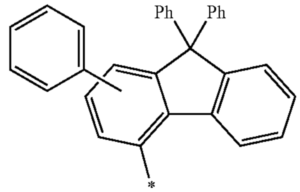
Formula 9-73
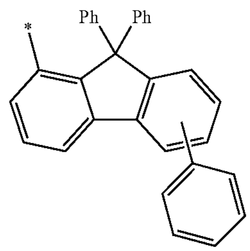
Formula 9-74
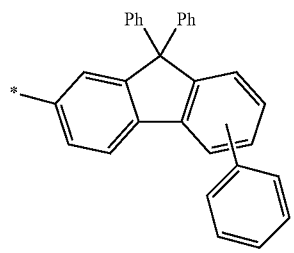
Formula 9-75
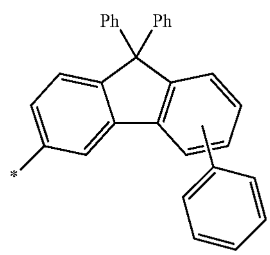
Formula 9-76
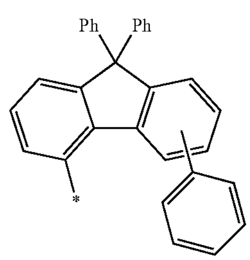
Formula 9-77
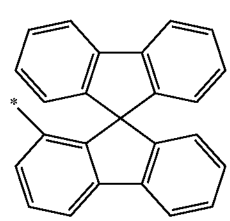

-continued
Formula 9-78
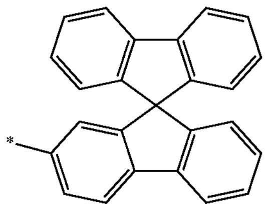
Formula 9-79
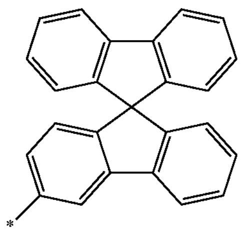
Formula 9-80
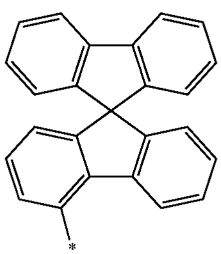
Formula 9-81
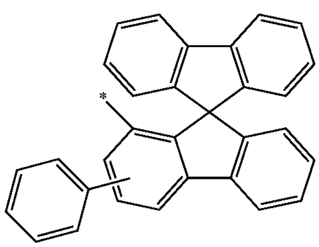
Formula 9-82
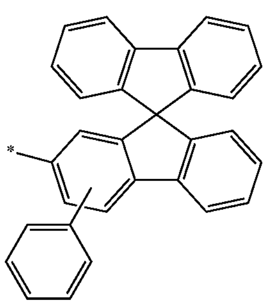
Formula 9-83
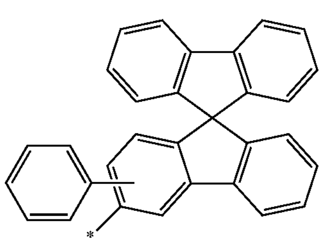
-continued
Formula 9-84
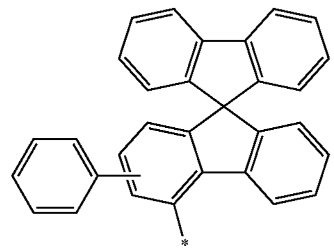
Formula 9-85
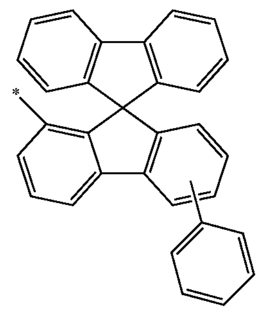
Formula 9-86
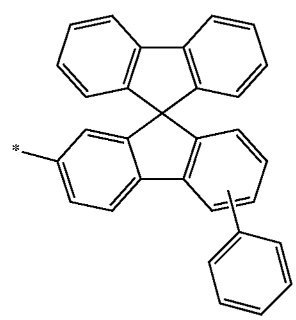
Formula 9-87
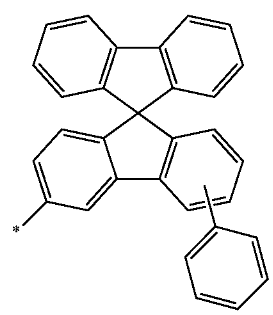
Formula 9-88
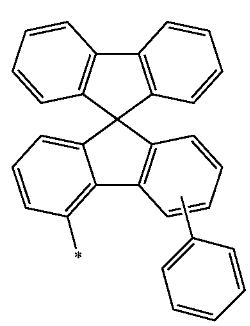

Formula 9-89
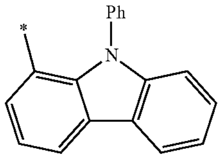
Formula 9-90
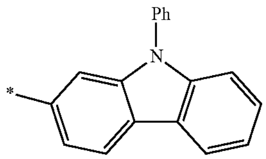
Formula 9-91
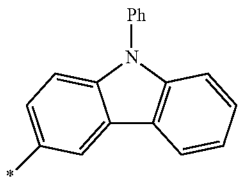
Formula 9-92
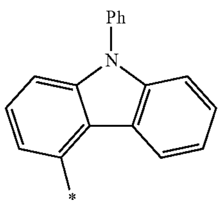
Formula 9-93
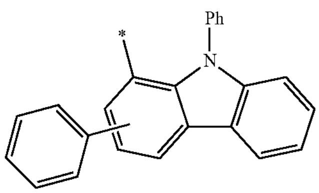
Formula 9-94
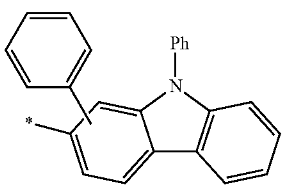
Formula 9-95
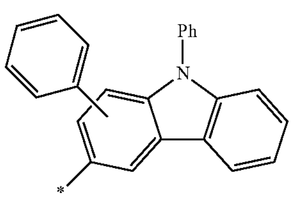
Formula 9-96
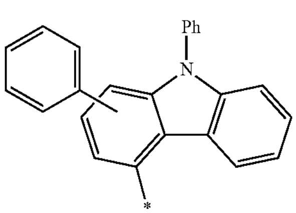
Formula 9-97
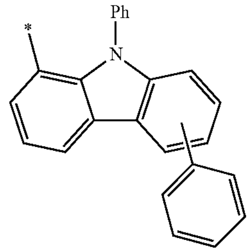
Formula 9-98
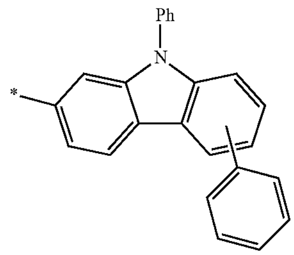
Formula 9-99
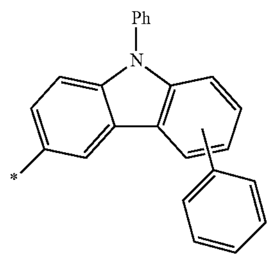
Formula 9-100
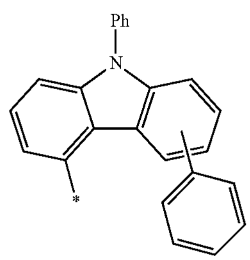
Formula 10-1
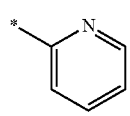
Formula 10-2
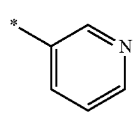
Formula 10-3
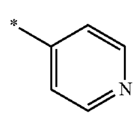
Formula 10-4
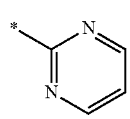
Formula 10-5
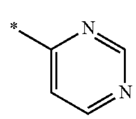

-continued
Formula 10-6
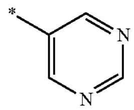
Formula 10-7
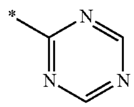
Formula 10-8
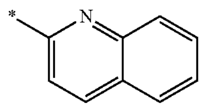
Formula 10-9
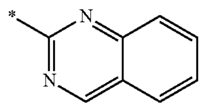
Formula 10-10
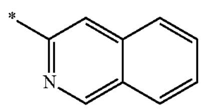
Formula 10-11
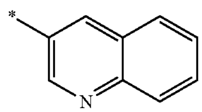
Formula 10-12
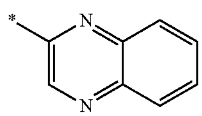
Formula 10-13
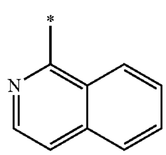
Formula 10-14
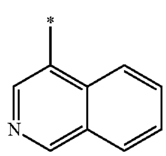
Formula 10-15
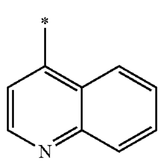
Formula 10-16
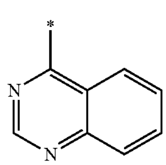
Formula 10-17
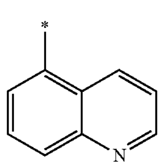
-continued
Formula 10-18
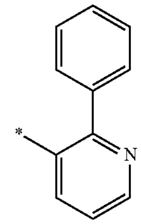
Formula 10-19
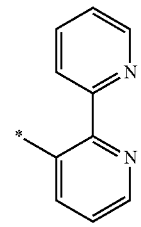
Formula 10-20
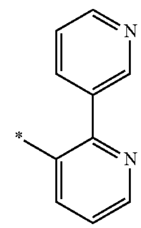
Formula 10-21
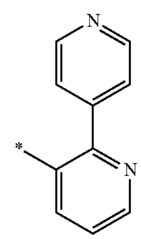
Formula 10-22
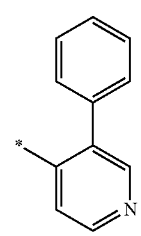
Formula 10-23
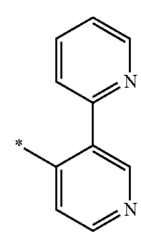
Formula 10-24
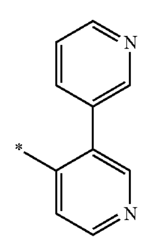

Formula 10-25
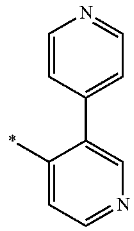
Formula 10-26
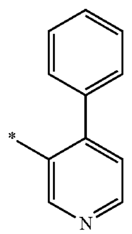
Formula 10-27
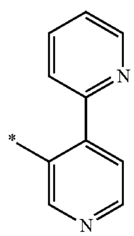
Formula 10-28
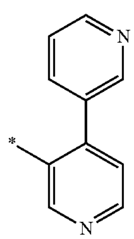
Formula 10-29
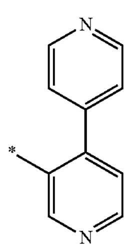
Formula 10-30
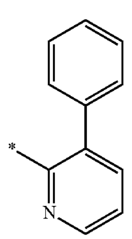
Formula 10-31
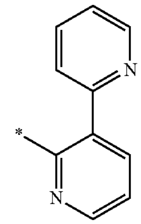
Formula 10-32
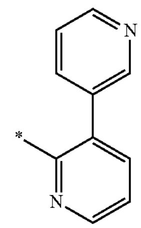
Formula 10-33
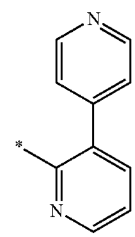
Formula 10-34
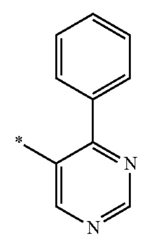
Formula 10-35
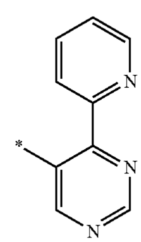
Formula 10-36
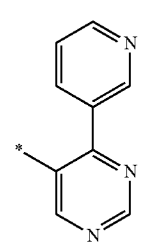

-continued
Formula 10-37
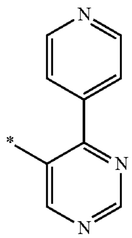
Formula 10-38
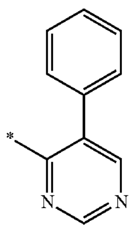
Formula 10-39
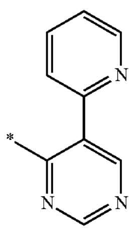
Formula 10-40
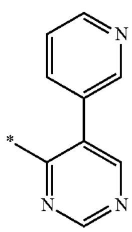
Formula 10-41
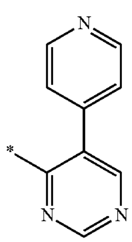
Formula 10-42
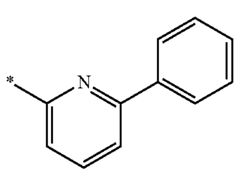
Formula 10-43
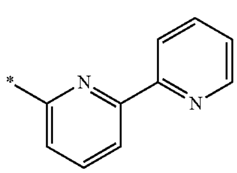
-continued
Formula 10-44
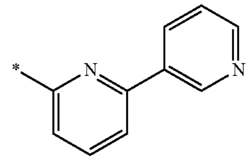
Formula 10-45
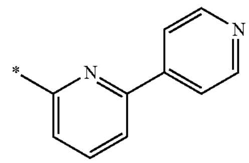
Formula 10-46
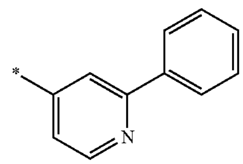
Formula 10-47
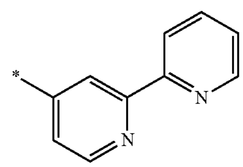
Formula 10-48
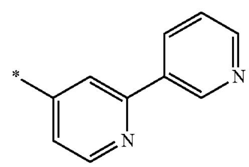
Formula 10-49
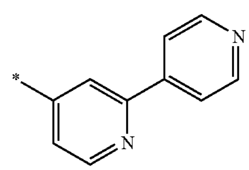
Formula 10-50
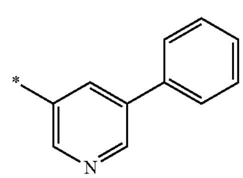
Formula 10-51
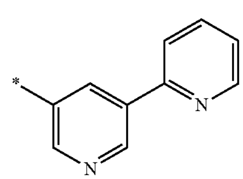
Formula 10-52
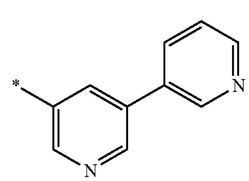

Formula 10-53
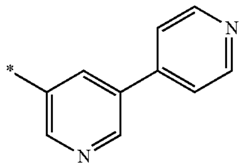
Formula 10-54
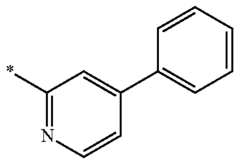
Formula 10-55
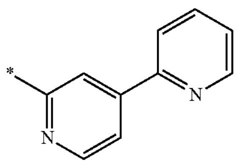
Formula 10-56
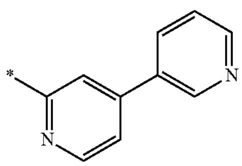
Formula 10-57
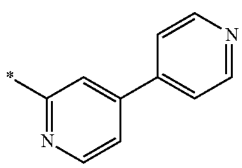
Formula 10-58
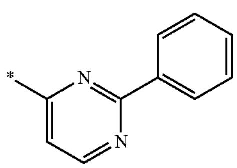
Formula 10-59
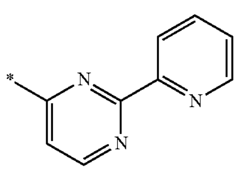
Formula 10-60
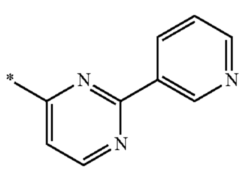
Formula 10-61
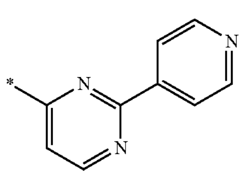
Formula 10-62
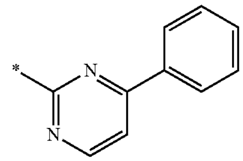
Formula 10-63
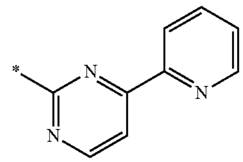
Formula 10-64
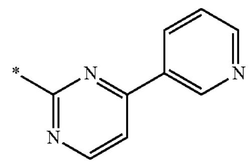
Formula 10-65
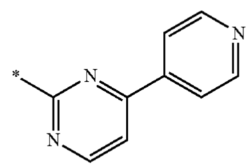
Formula 10-66
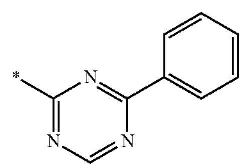
Formula 10-67
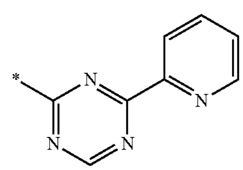
Formula 10-68
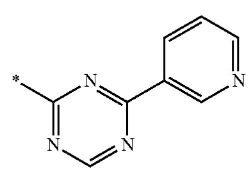
Formula 10-69
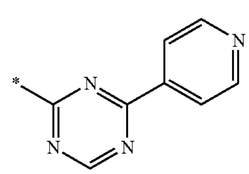
Formula 10-78
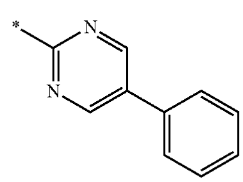

-continued
Formula 10-79
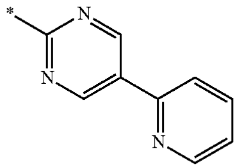
Formula 10-80
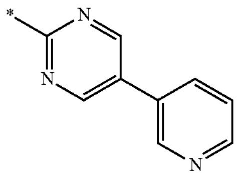
Formula 10-81
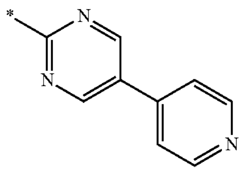
Formula 10-82
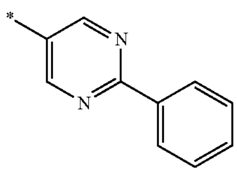
Formula 10-83
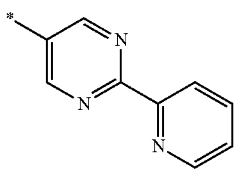
Formula 10-84
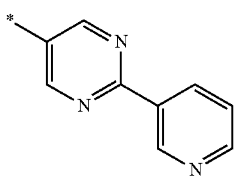
Formula 10-85
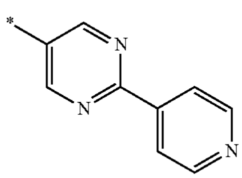
Formula 10-70
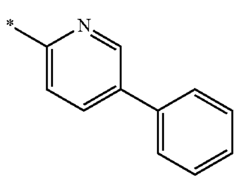
Formula 10-71
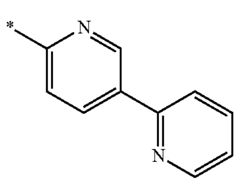
-continued
Formula 10-72
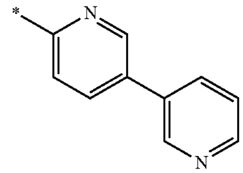
Formula 10-73
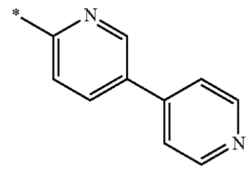
Formula 10-74
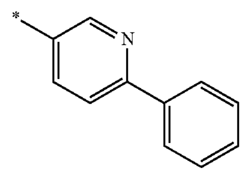
Formula 10-75
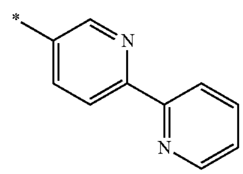
Formula 10-76
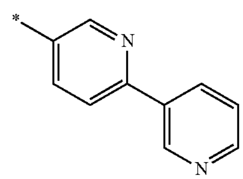
Formula 10-77
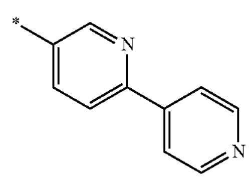
Formula 10-86
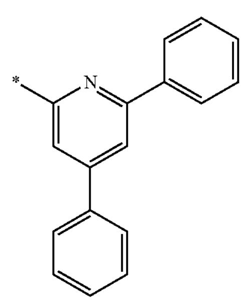

-continued
Formula 10-87
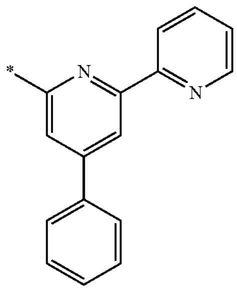
Formula 10-88
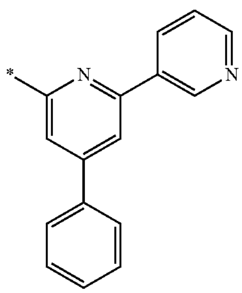
Formula 10-89
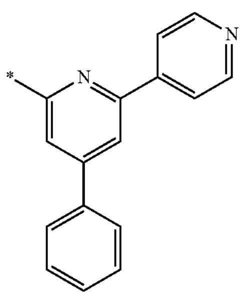
Formula 10-90
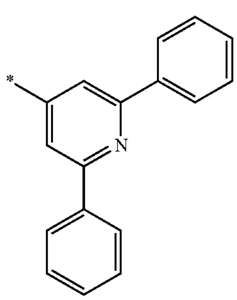
Formula 10-91
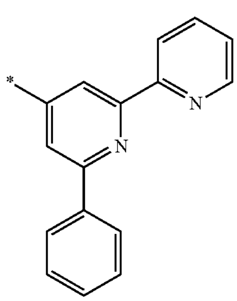
-continued
Formula 10-92
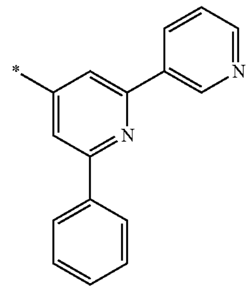
Formula 10-93
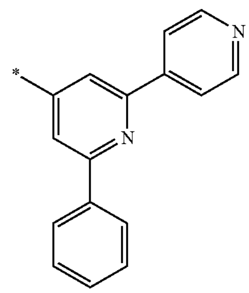
Formula 10-94
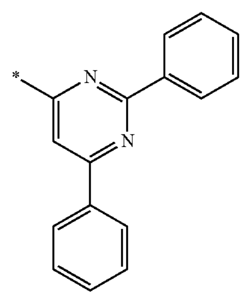
Formula 10-95
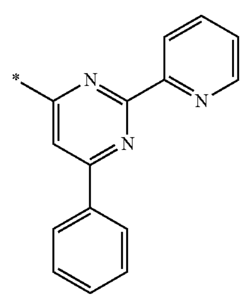
Formula 10-96
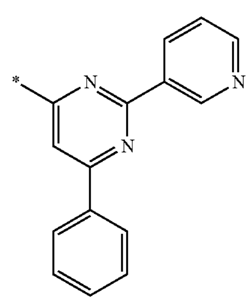

-continued
Formula 10-97
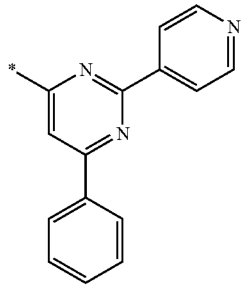
Formula 10-98
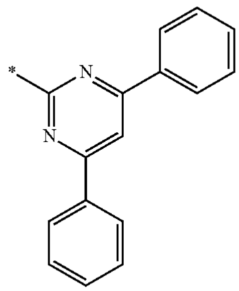
Formula 10-99
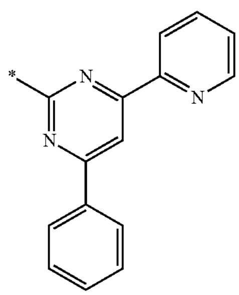
Formula 10-100
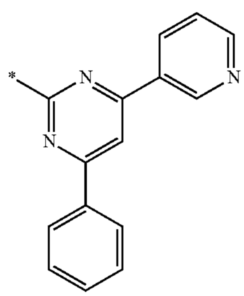
Formula 10-101
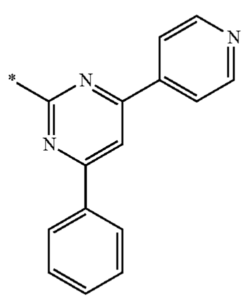
-continued
Formula 10-102
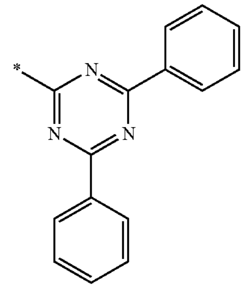
Formula 10-103
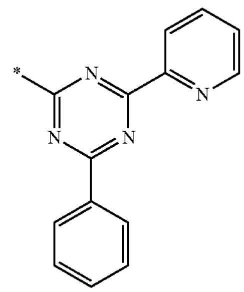
Formula 10-104
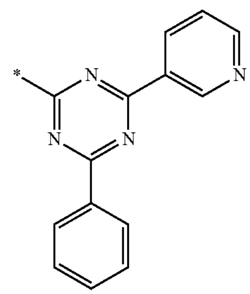
Formula 10-105
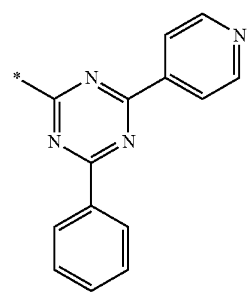
Formula 10-106
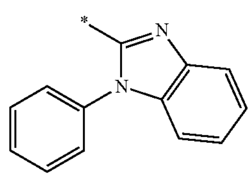
Formula 10-107
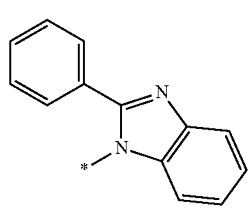

-continued

Formula 10-108

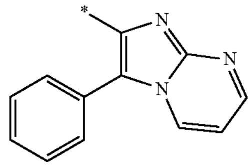

Formula 10-109

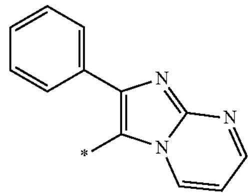

Formula 10-110

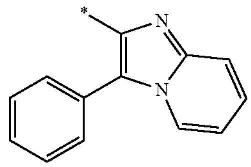

Formula 10-111

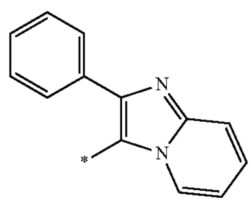

Formula 10-112

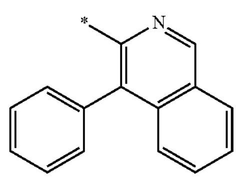

Formula 10-113

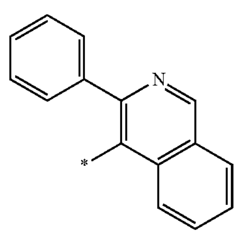

Formula 10-114

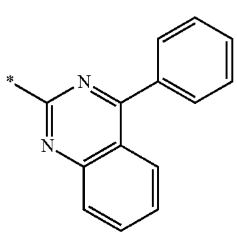

Formula 10-115

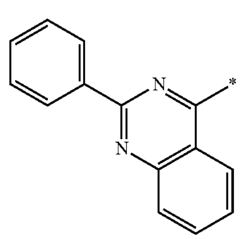

-continued

Formula 10-116

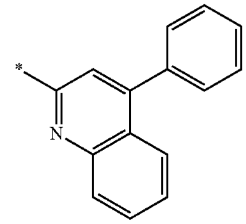

Formula 10-117

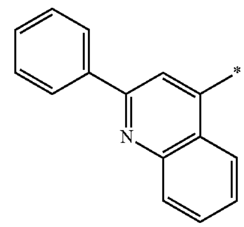

Formula 10-118

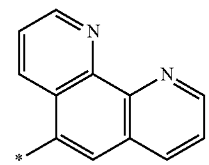

Formula 10-119

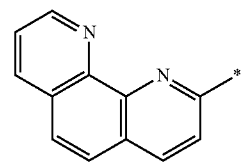

Formula 10-120

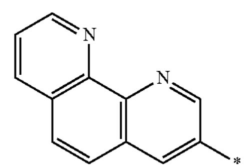

Formula 10-121

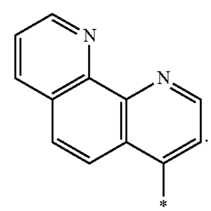

In Formulae 9-1 to 9-100 and 10-1 to 10-121, Ph represents a phenyl group and * indicates a binding site to a neighboring atom.

In Formulae 1A to 1E, $R_1$ and $R_4$ may be optionally connected (e.g., coupled) to form a saturated or unsaturated ring, and $R_1$ and $R_5$ may be optionally connected (e.g., coupled) to form a saturated or unsaturated ring.

b1 in Formulae 1A to 1E indicates the number of $R_1$(s), and when b1 is two or more, two or more $R_1$(s) may be identical to or different from each other. b2 to b14 may each independently be the same as described herein in connection with b1 and the structures of Formulae 1A to 1E.

b1 to b14 in Formulae 1A to 1E may each independently be an integer selected from 0 to 4. For example, b1 to b14 may each independently be 0 or 1, but embodiments of the present disclosure are not limited thereto.

c13 in Formulae 1D and 1E indicates the number of *-[$(L_{13})_{a13}$-$(R_{13})_{b13}$](s), and when c13 is two or more, two or more *-[$(L_{13})_{a13}$-$(R_{13})_{b13}$](s) may be identical to or different from each other. c14 may be the same as described herein in connection with c13 and the structures of Formulae 1D and 1E.

c13 and c14 in Formulae 1D and 1E may each independently be an integer selected from 0 to 5. For example, c13 and c14 may each independently be 0 or 1, but embodiments of the present disclosure are not limited thereto.

b21 in Formulae 2A and 2B indicates the number of $R_{21}$(s), and when b21 is two or more, two or more $R_{21}$(s) may be identical to or different from each other. b22 may be the same as described herein in connection with b21 and the structures of Formulae 2A and 2B.

b21 and b22 in Formulae 2A and 2B may each independently be an integer selected from 0 to 4. For example, b21 and b22 may each independently be 1 or 2, but embodiments of the present disclosure are not limited thereto.

In one or more embodiments, the first compound represented by one selected from Formulae 1A to 1E may be represented by one selected from Formulae 1A(1) to 1A(3), 1B(1) to 1B(5), 1C(1) to 1C(4), 1D(1) to 1D(3), and 1E(1) to 1E(12):

Formula 1A(1)

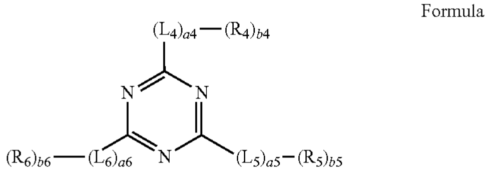

Formula 1A(2)

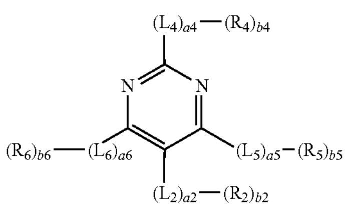

Formula 1A(3)

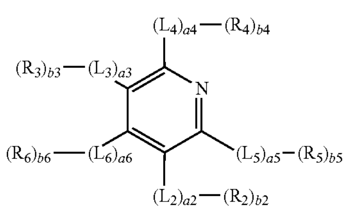

Formula 1B(1)

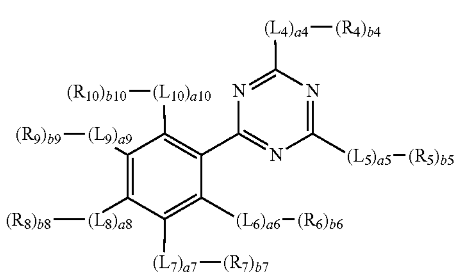

-continued

Formula 1B(2)

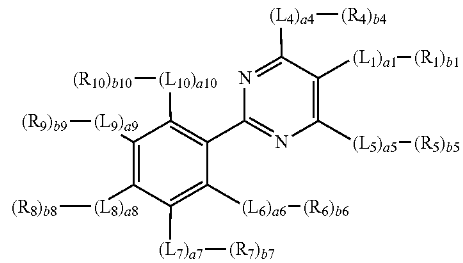

Formula 1B(3)

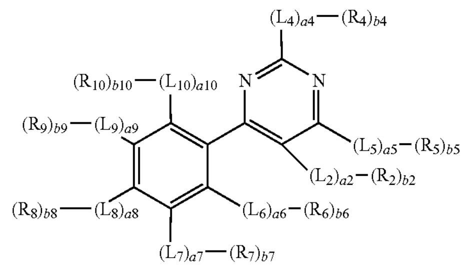

Formula 1B(4)

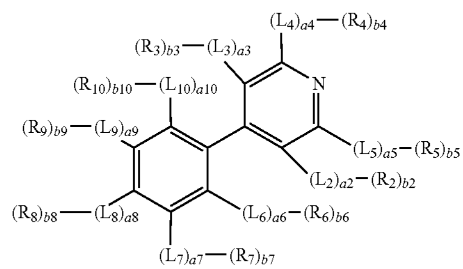

Formula 1B(5)

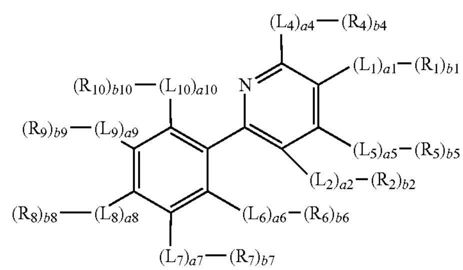

Formula 1C(1)

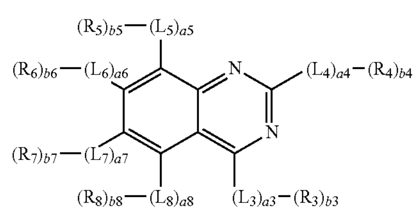

Formula 1C(2)

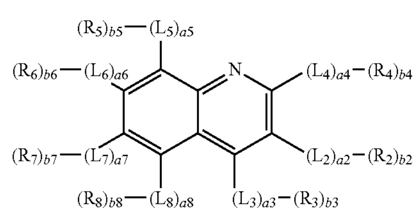

-continued
Formula 1C(3)
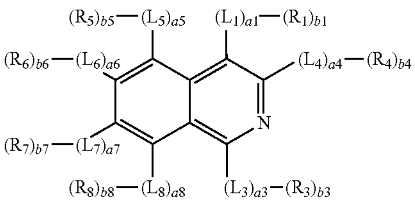
Formula 1C(4)
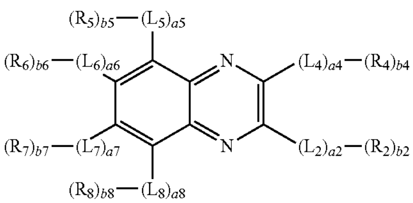
Formula 1D(1)
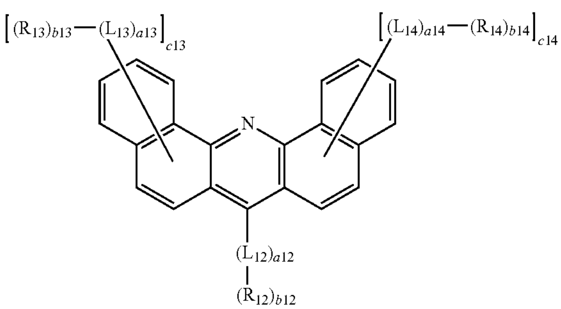
Formula 1D(2)
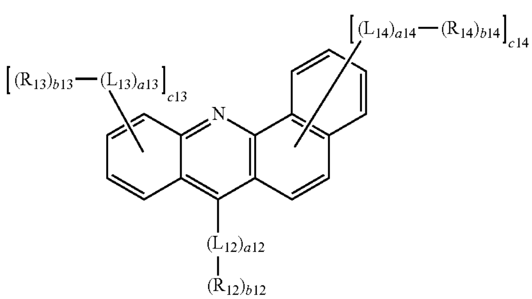
Formula 1D(3)
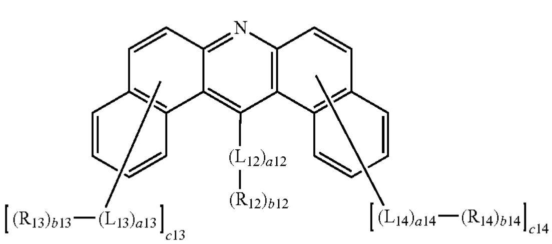
Formula 1E(1)
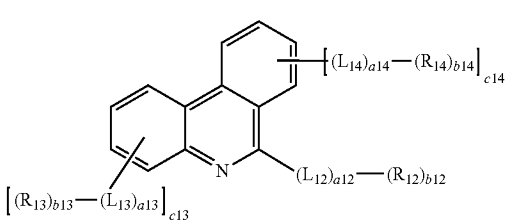
-continued
Formula 1E(2)
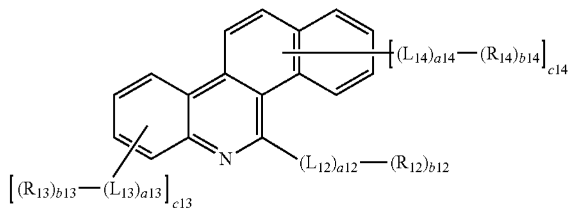
Formula 1E(3)
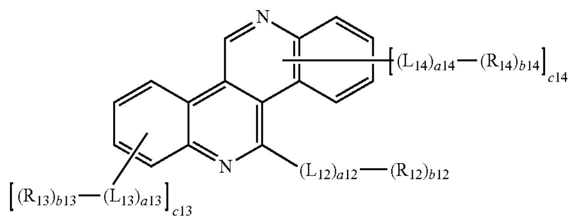
Formula 1E(4)
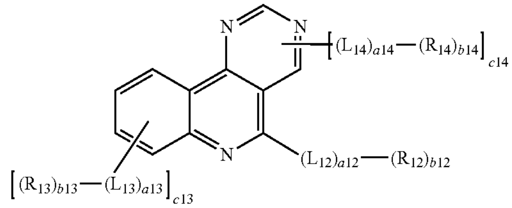
Formula 1E(5)
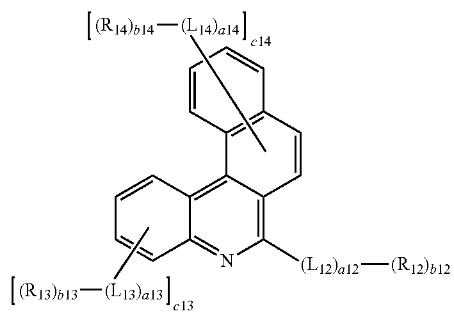
Formula 1E(6)
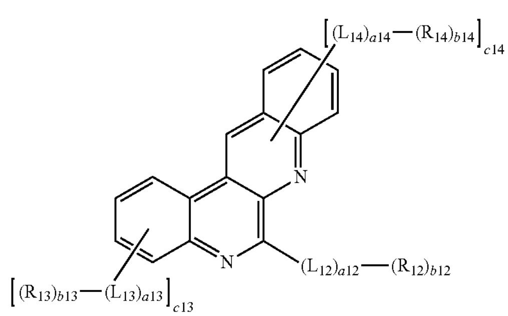
Formula 1E(7)
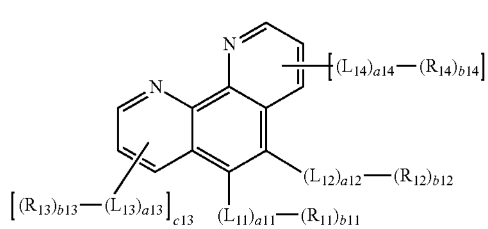

-continued

Formula 1E(8)

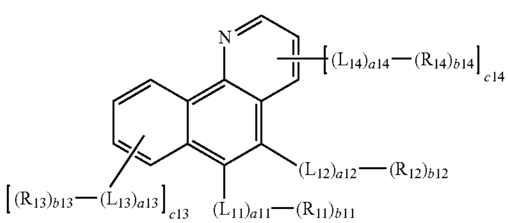

Formula 1E(9)

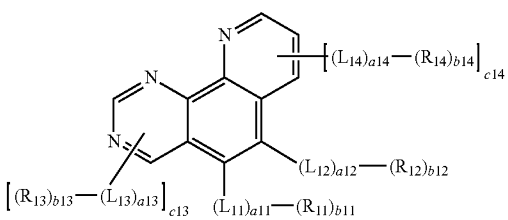

Formula 1E(10)

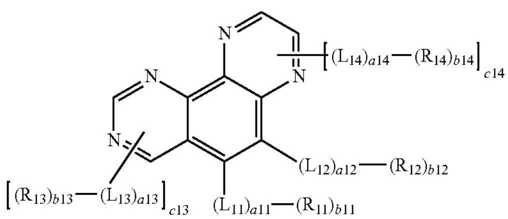

-continued

Formula 1E(11)

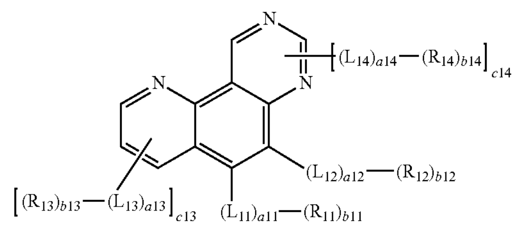

Formula 1E(12)

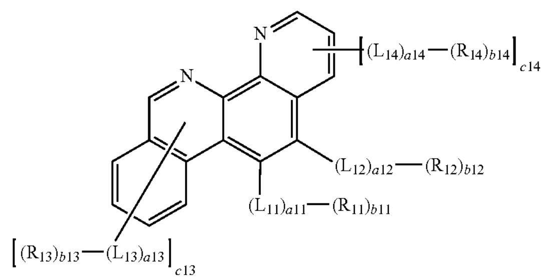

In Formulae 1A(1) to 1A(3), 1B(1) to 1B(5), 1C(1) to 1C(4), 1D(1) to 1D(3), and 1E(1) to 1E(12), $L_1$ to $L_{14}$, a1 to a14, $R_1$ to $R_{14}$, b1 to b14, c13, and c14 may each independently be the same as described herein in connection with Formulae 1A to 1E.

In one or more embodiments, the first compound represented by one selected from Formulae 1A to 1E may be selected from Compounds 1-1 to 1-329:

1-1

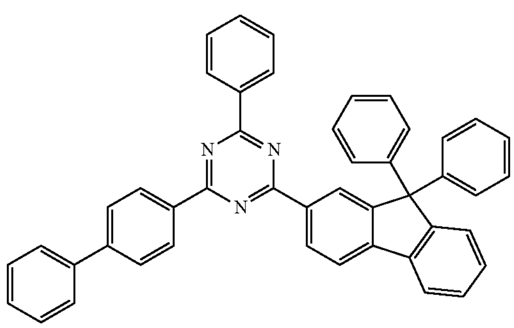

1-2

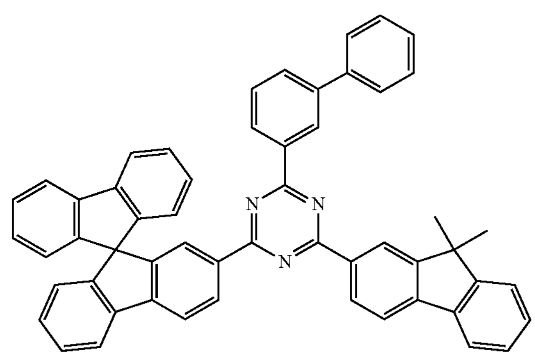

1-3

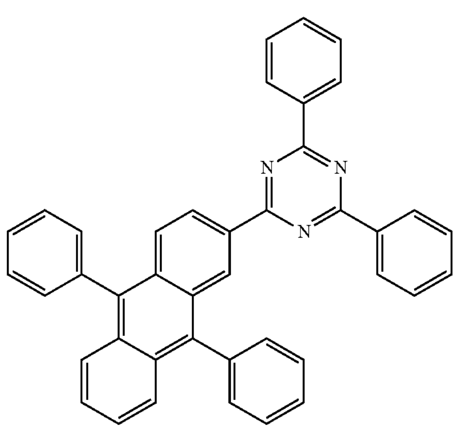

1-4

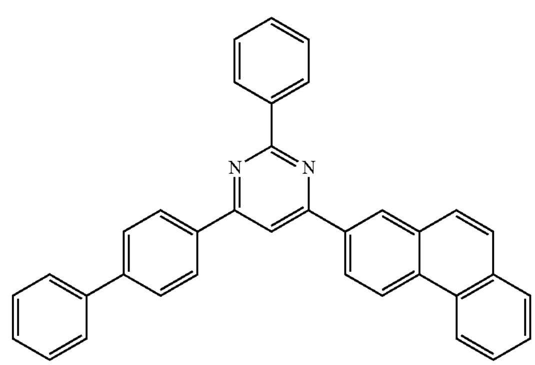

-continued
1-5
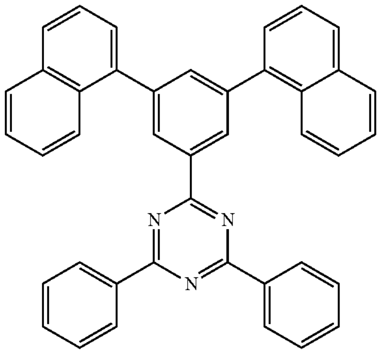
1-6
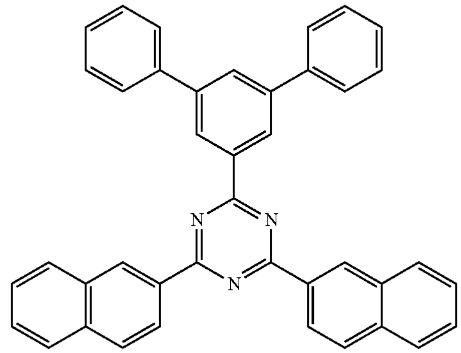
1-7
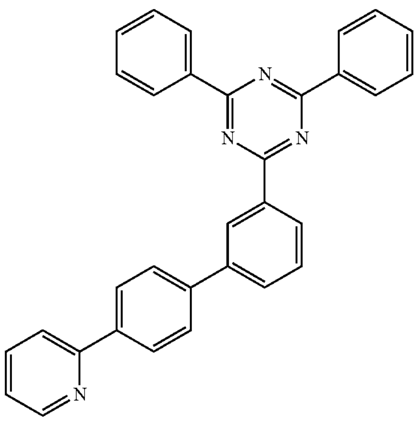
1-8
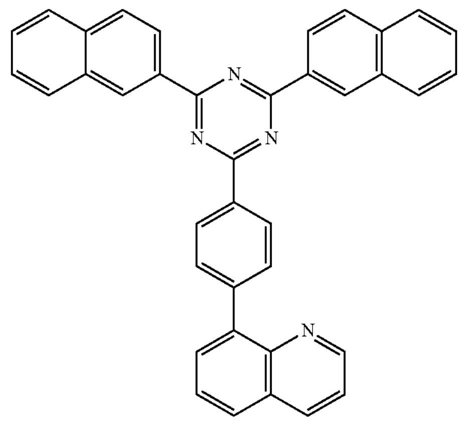
1-9
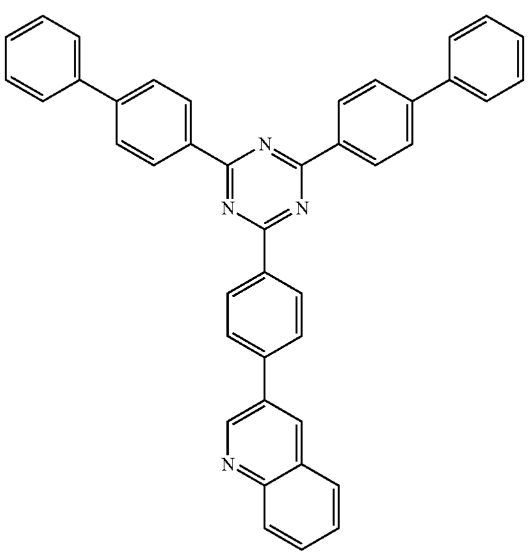
1-10
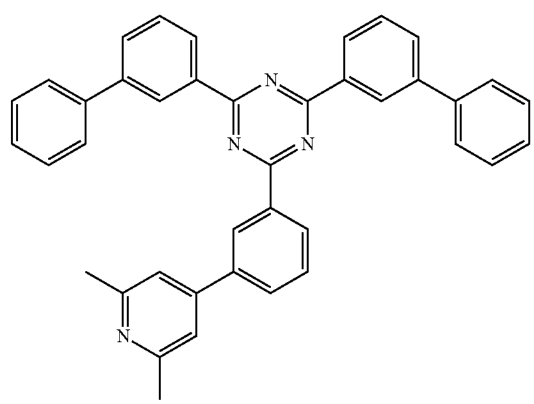

-continued
1-11
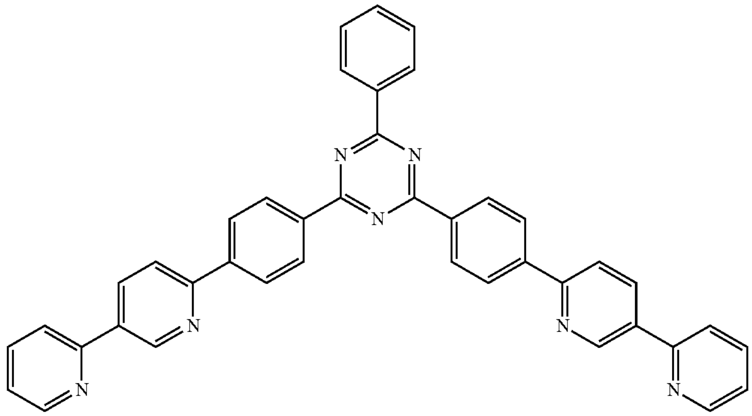
1-12
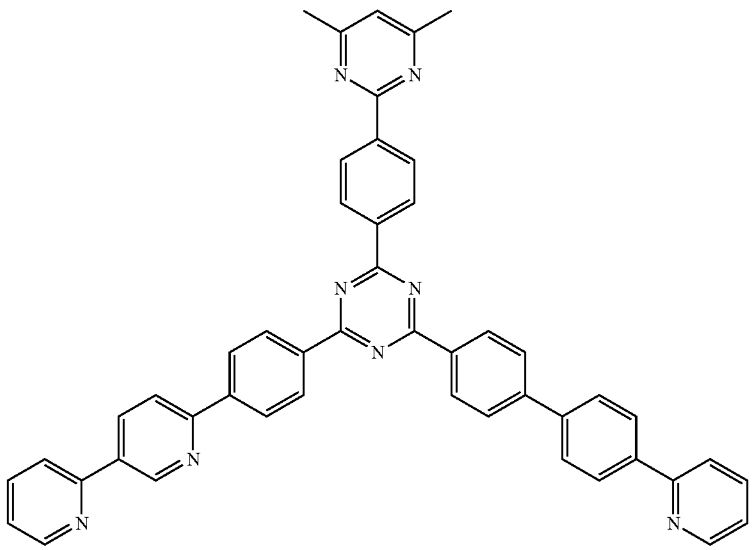
1-13
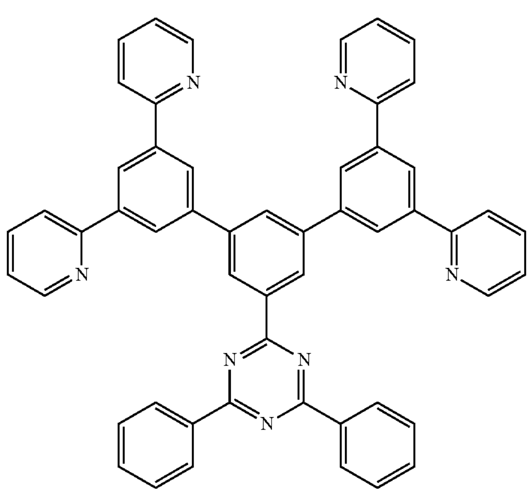
1-14
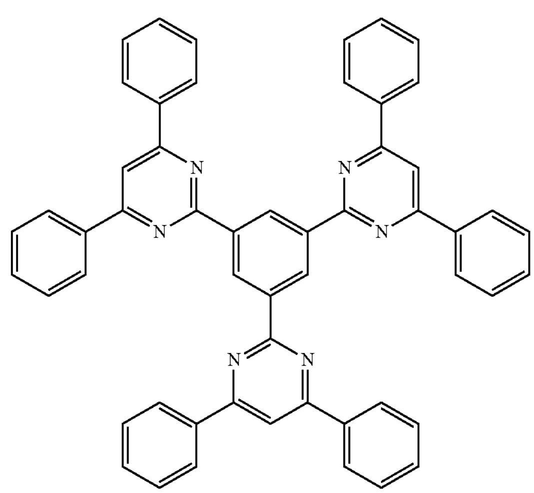

-continued
1-15
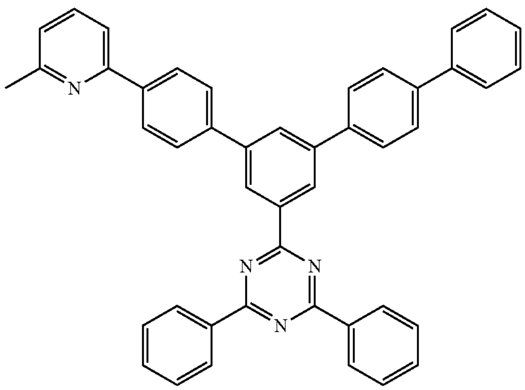
1-16
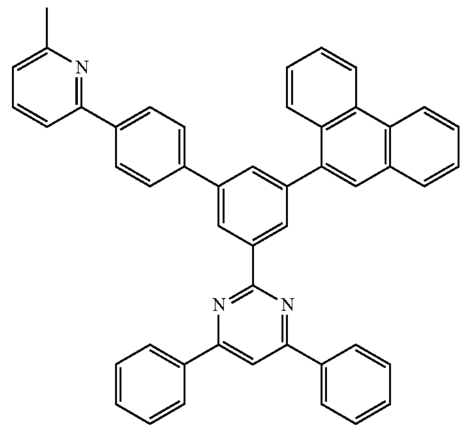
1-17
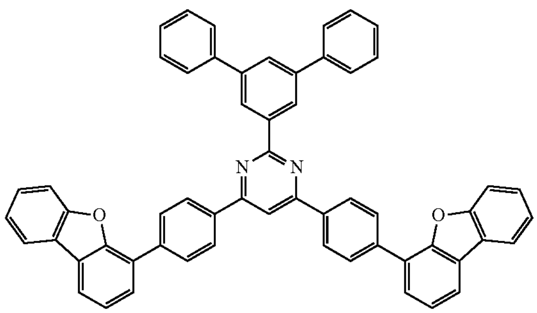
1-18
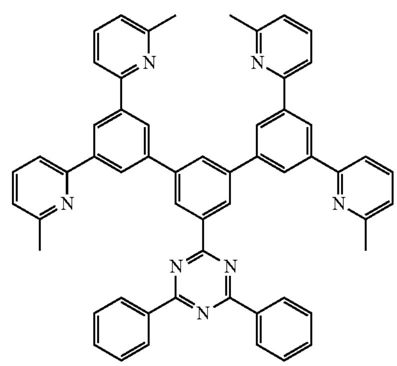
1-19
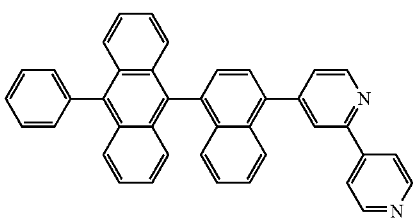
1-20
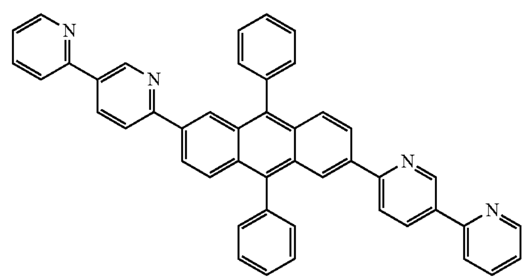
1-21
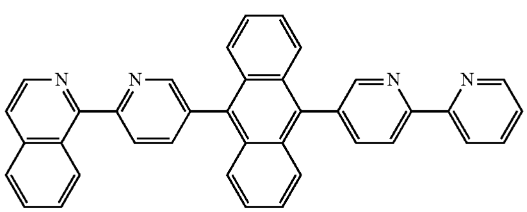
1-22
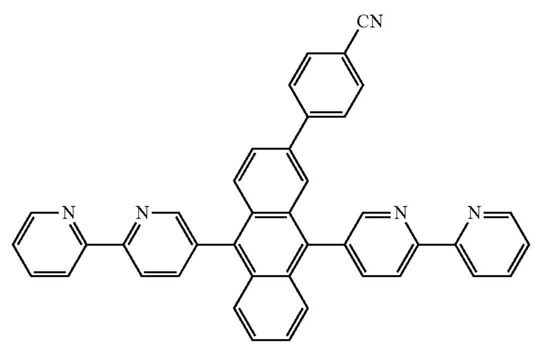

-continued
1-23
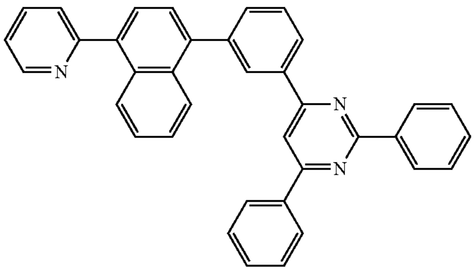
1-24
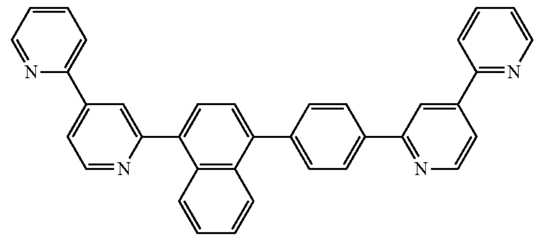
1-25
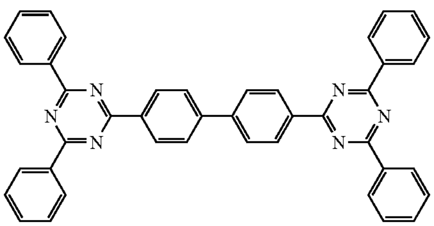
1-26
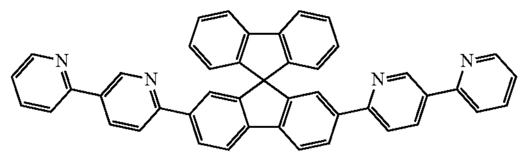
1-27
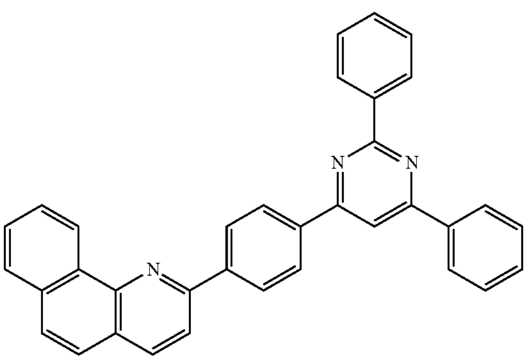
1-28
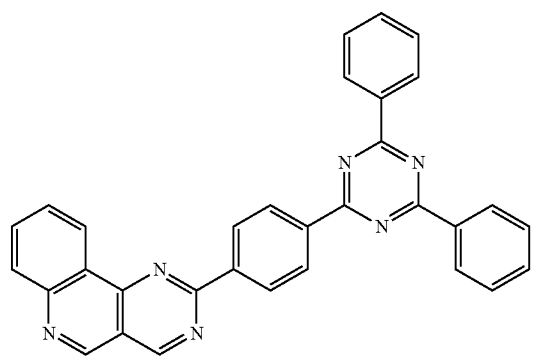
1-29
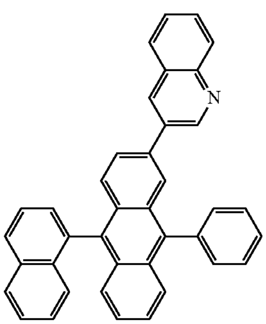
1-30
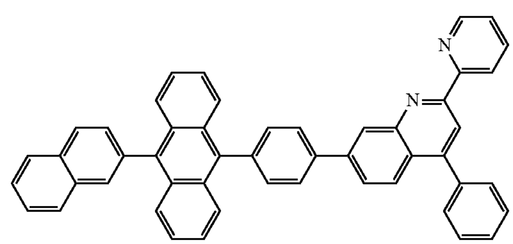
1-31
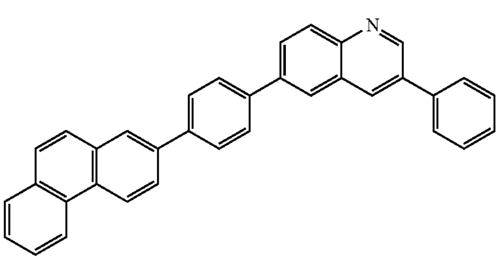
1-32
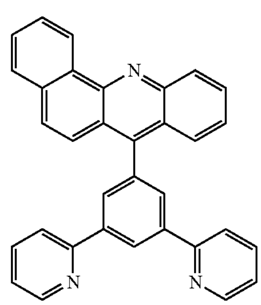

-continued
1-33
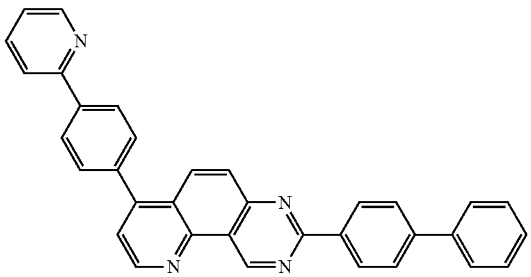
1-34
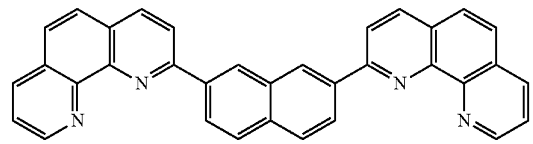
1-35
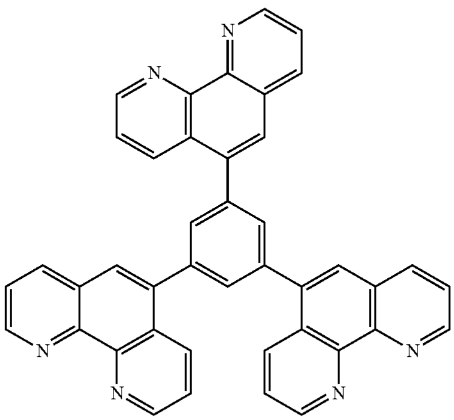
1-36
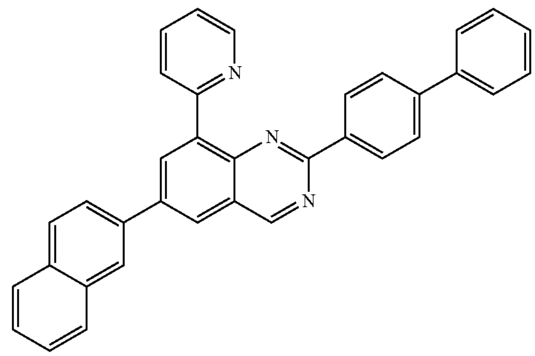
1-37
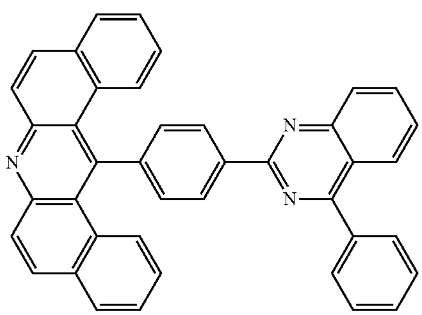
1-38
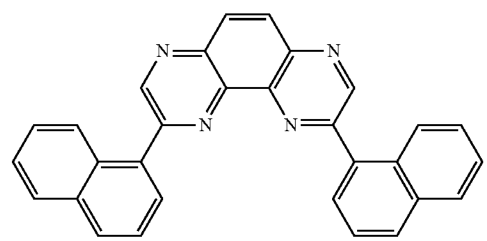
1-39
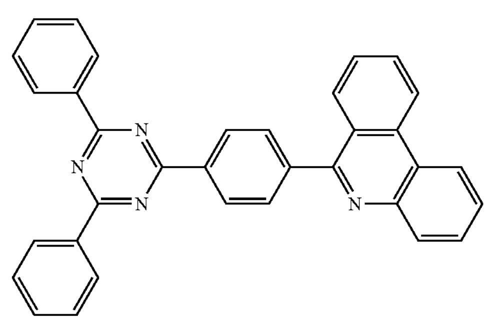
1-40
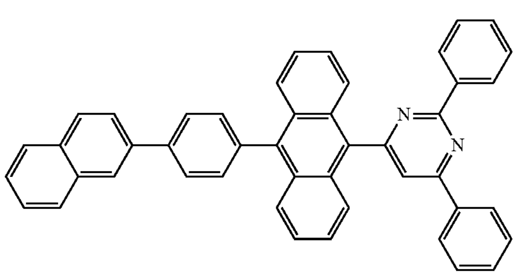
1-41
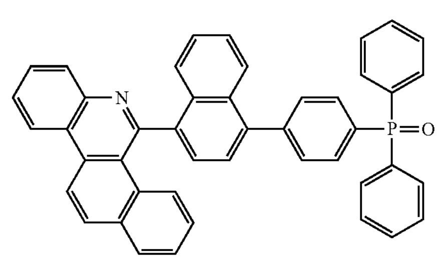

-continued
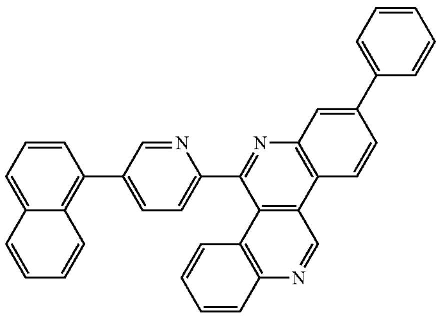
1-42
1-43
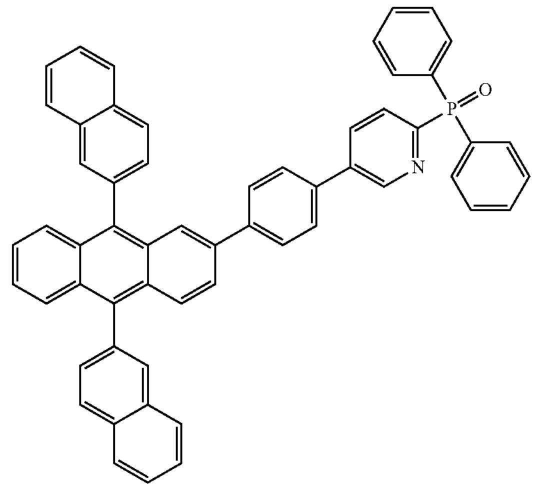
1-44
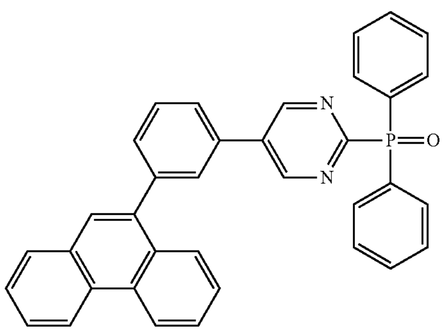
1-45
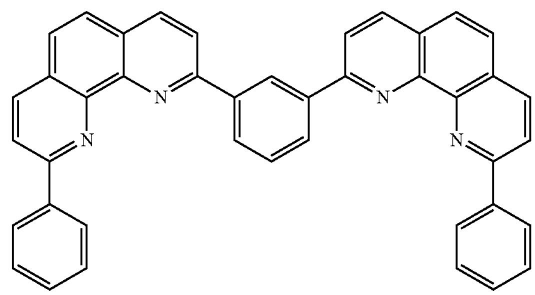
1-46
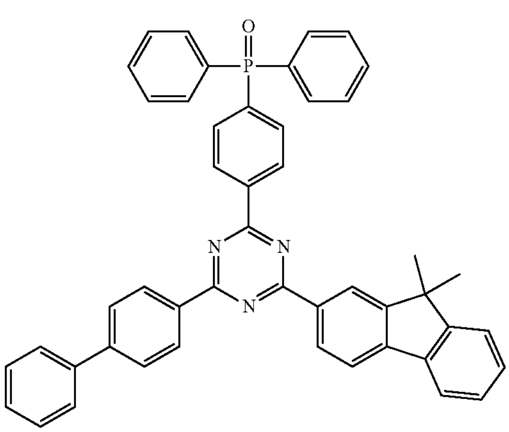
1-47
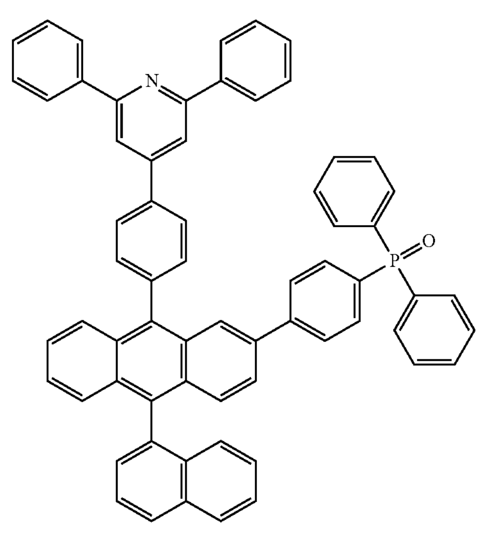

-continued
1-48
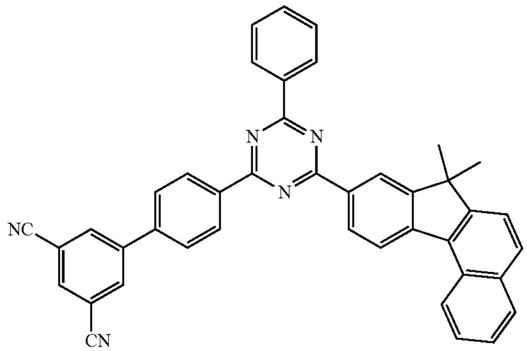
1-49
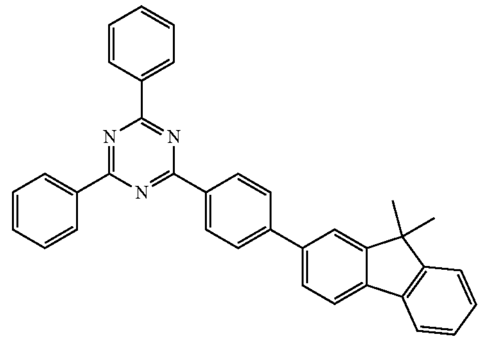
1-50
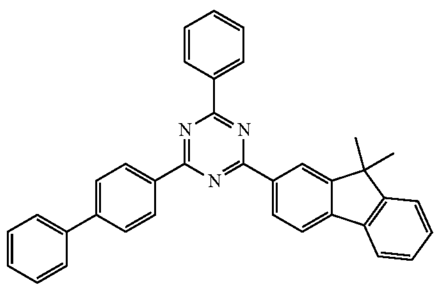
1-51
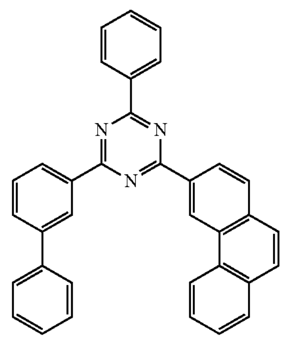
1-52
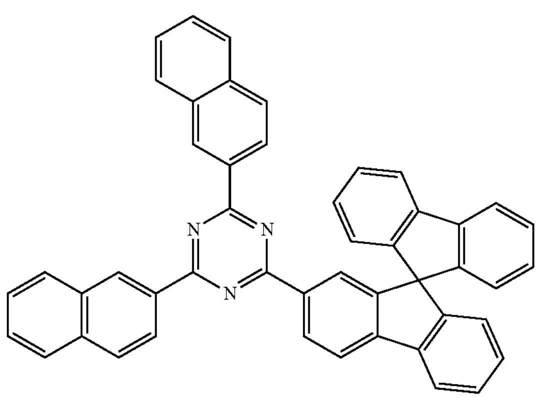
1-53
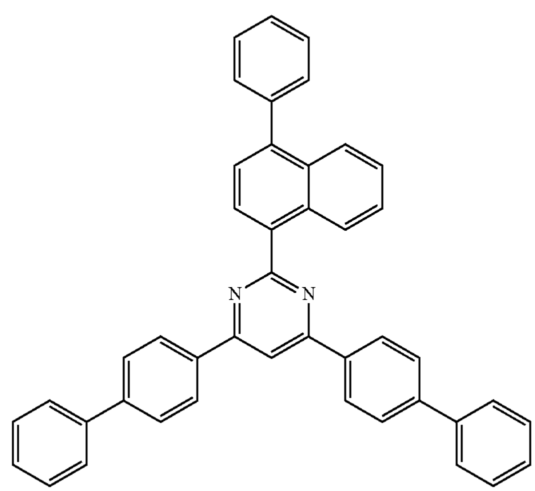
1-54
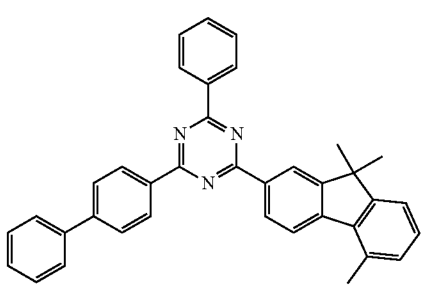
1-55
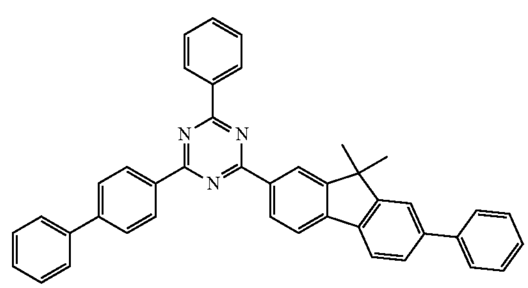

-continued
1-56
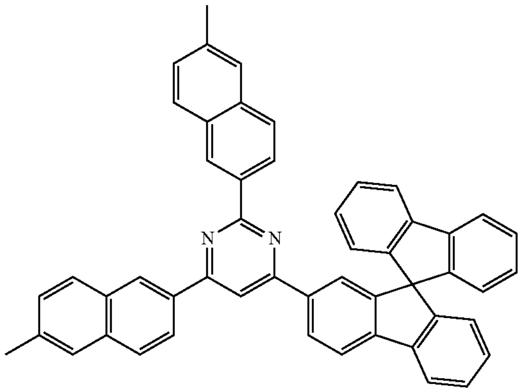
1-57
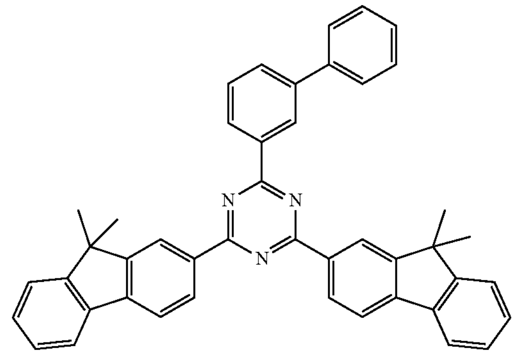
1-58
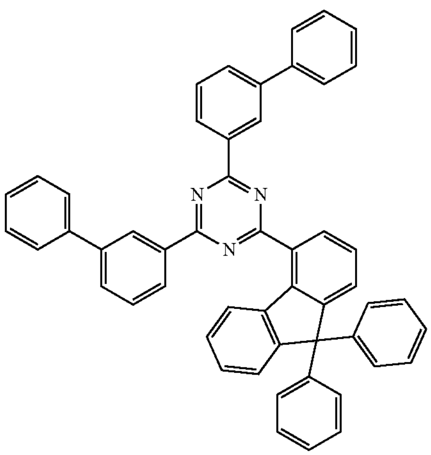
1-59
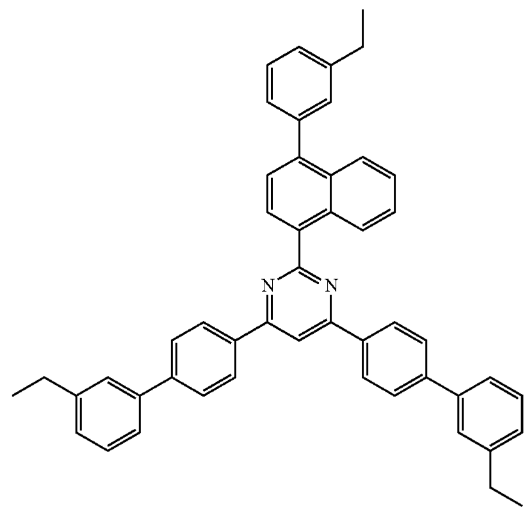
1-60
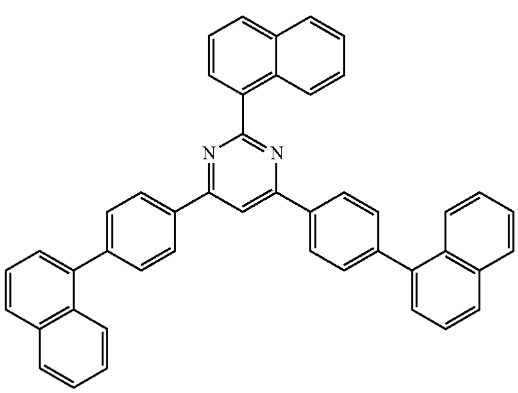
1-61
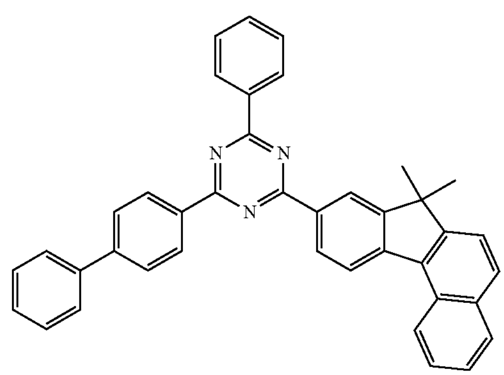

-continued
1-62
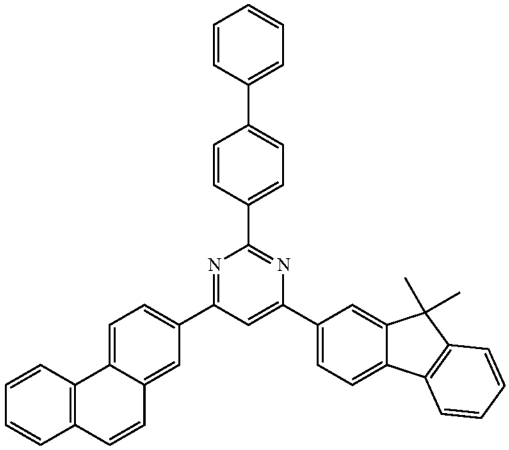
1-63
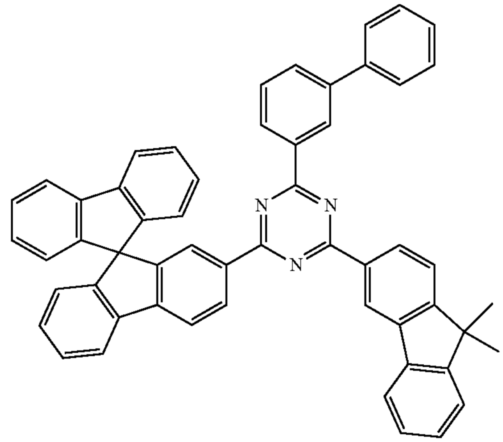
1-64
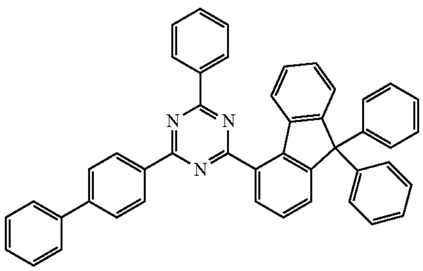
1-65
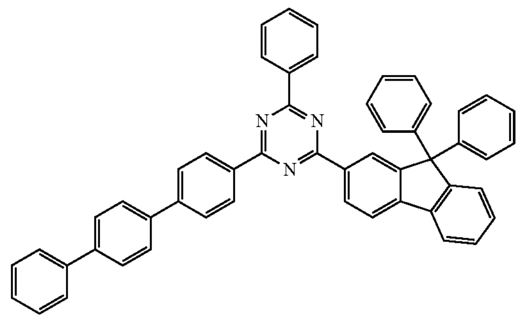
1-66
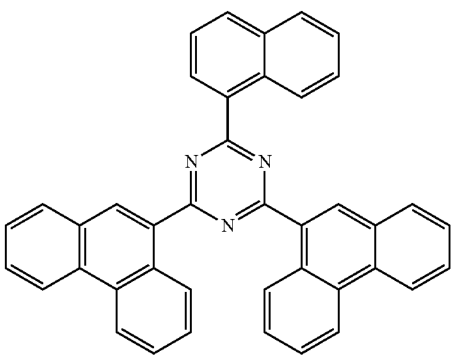
1-67
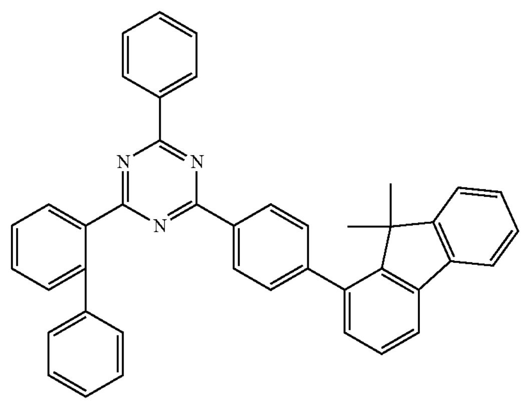
1-68
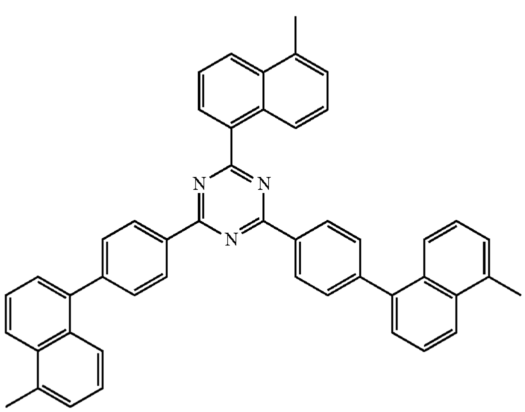
1-69
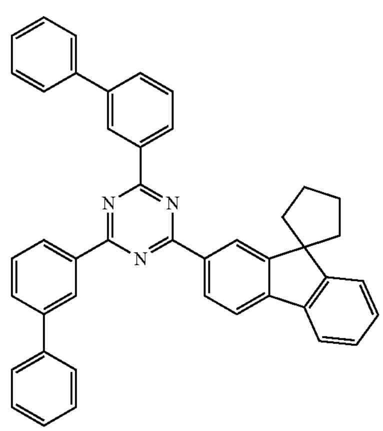

-continued
1-70
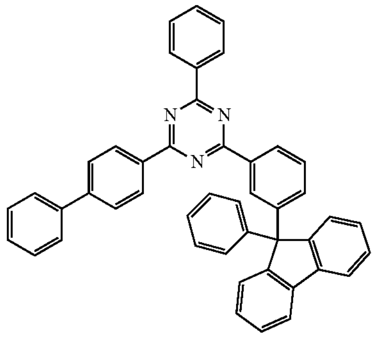
1-71
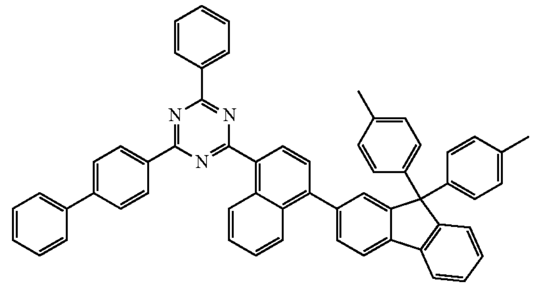
1-72
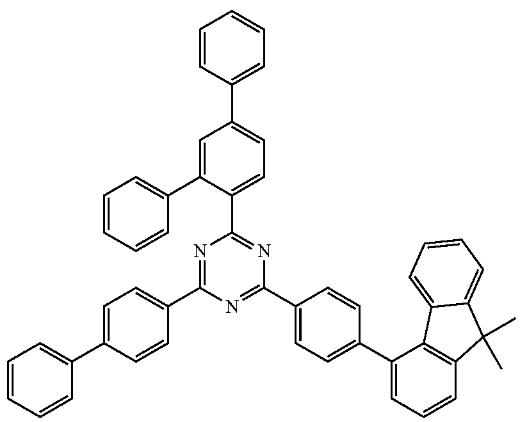
1-73
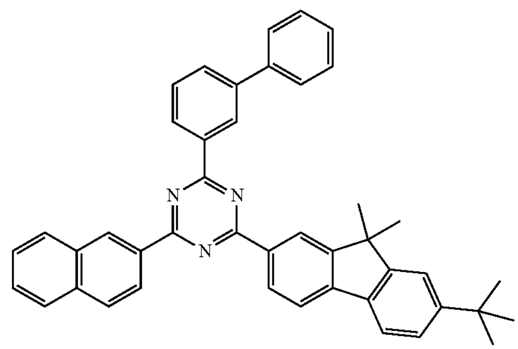
1-74
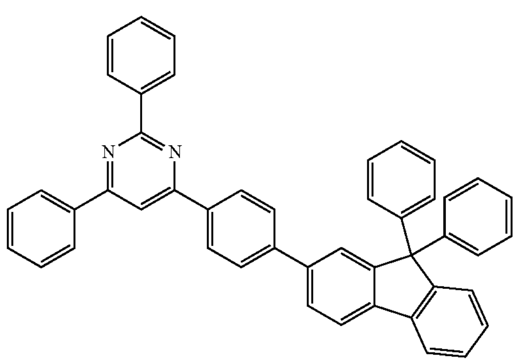
1-75
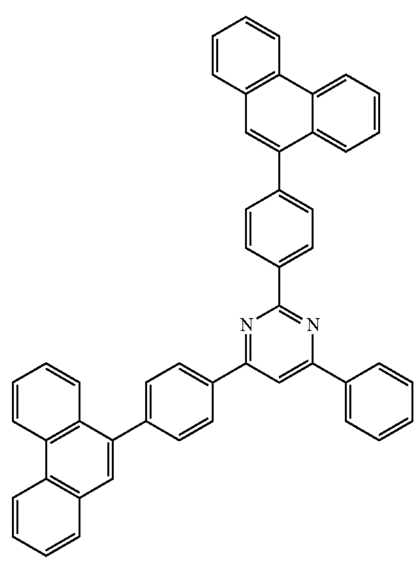

-continued
1-76
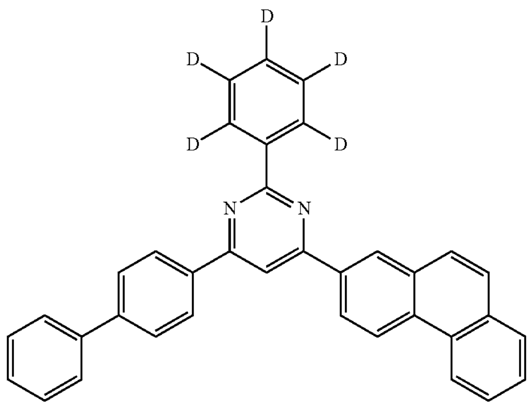
1-77
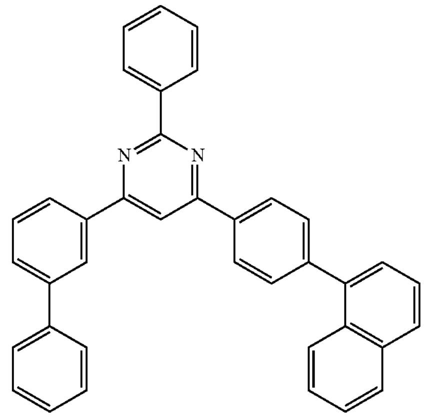
1-78
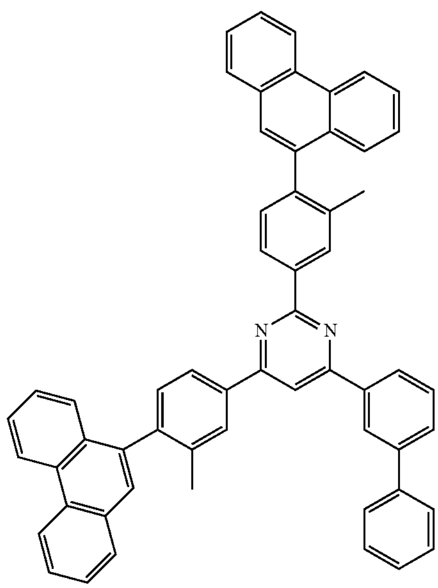
1-79
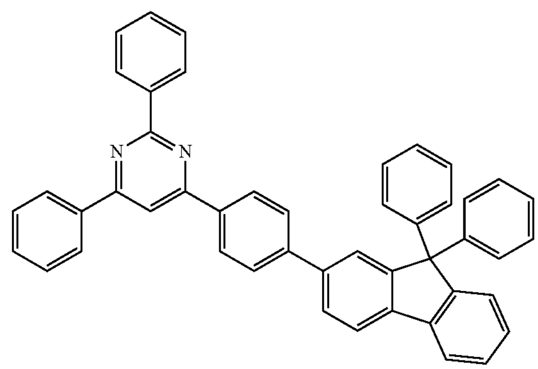
1-80
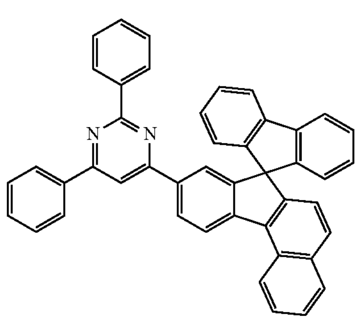
1-81
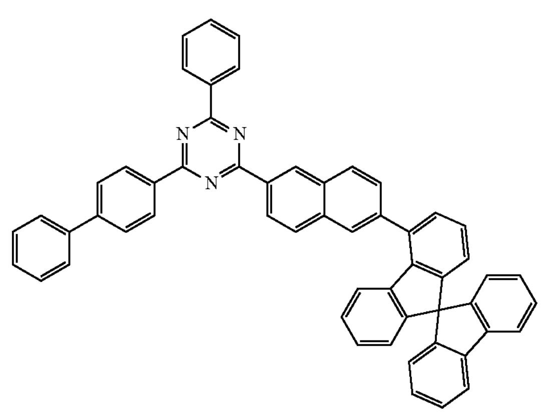

-continued
1-82
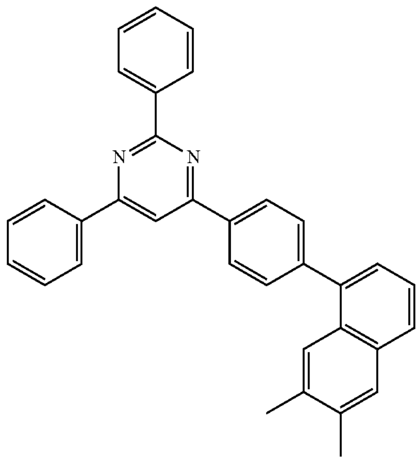
1-83
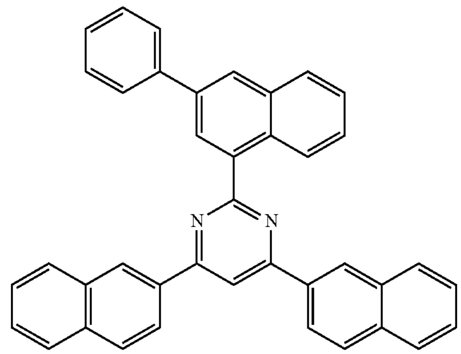
1-84
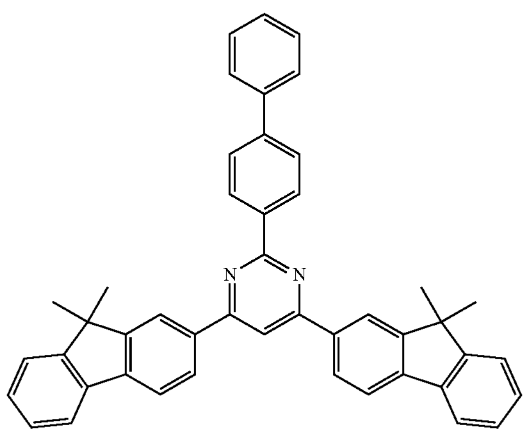
1-85
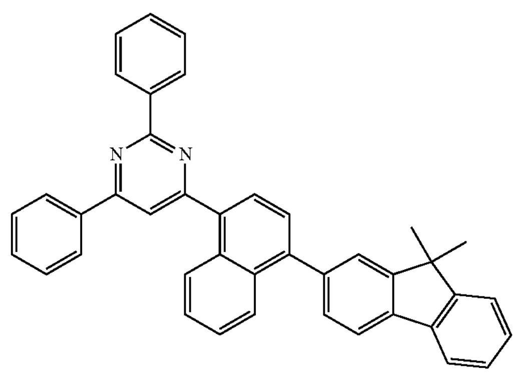
1-86
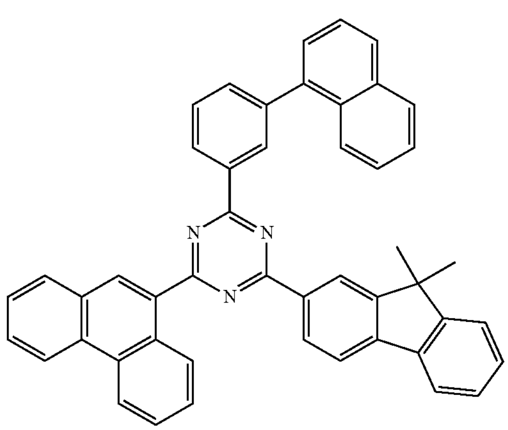
1-87
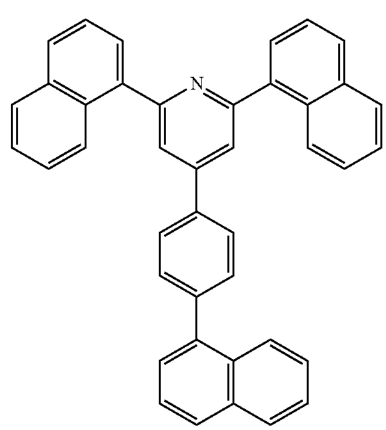

-continued
1-88
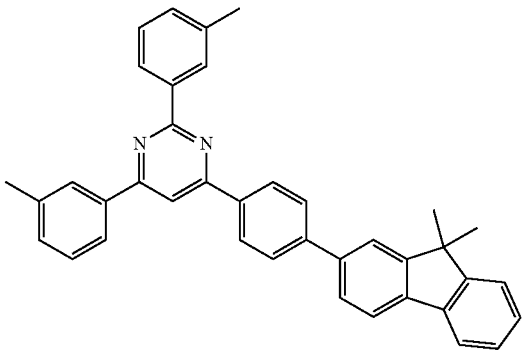
1-89
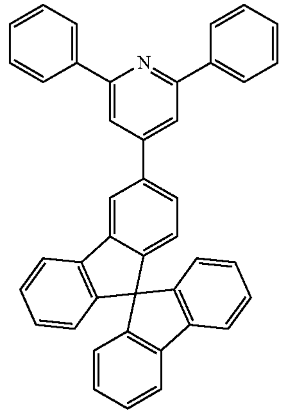
1-90
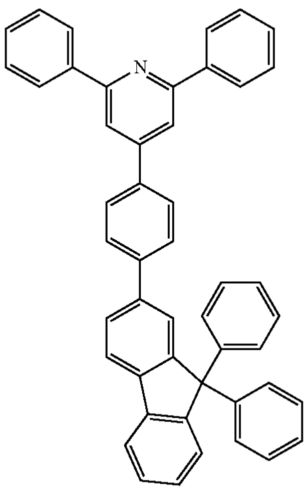
1-91
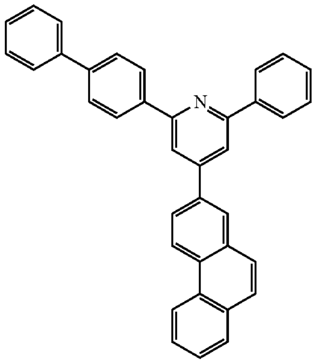
1-92
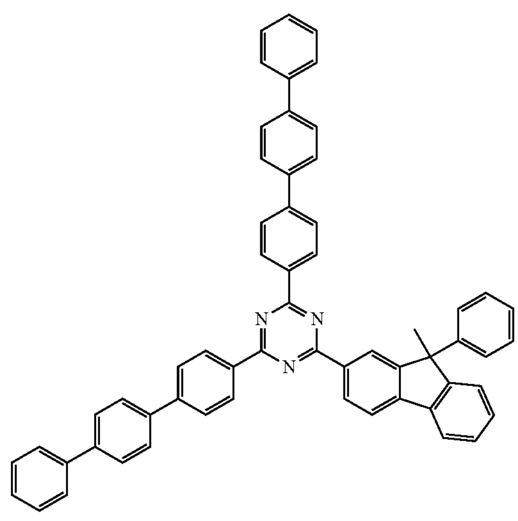

-continued
1-93
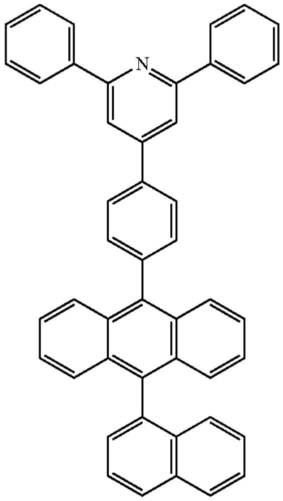
1-94
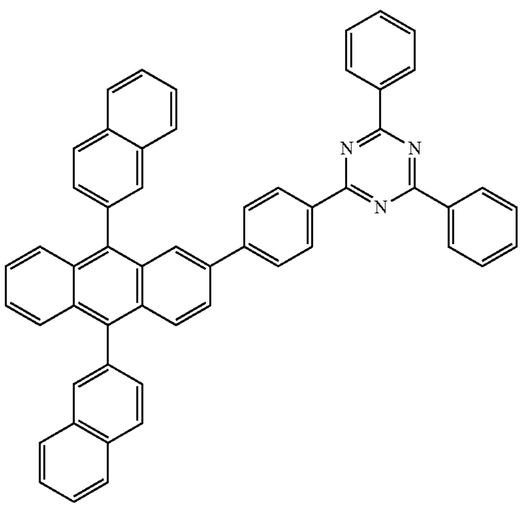
1-95
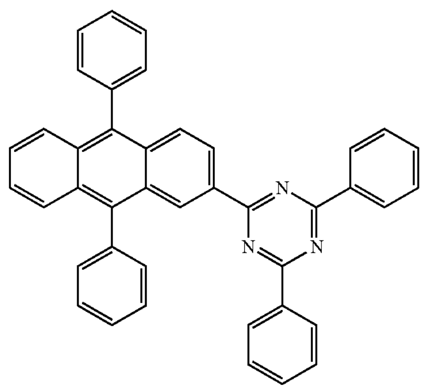
1-96
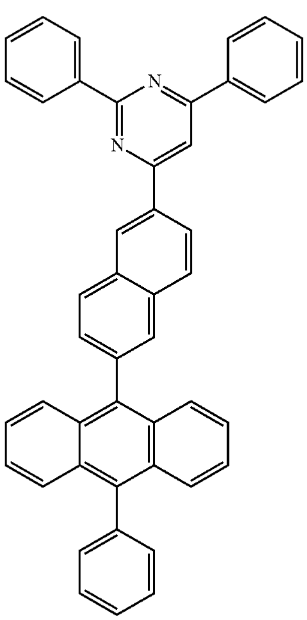
1-97
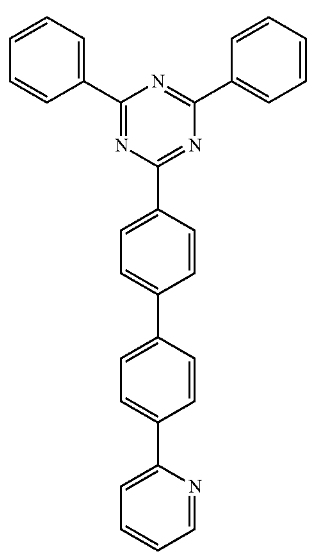

-continued
1-98
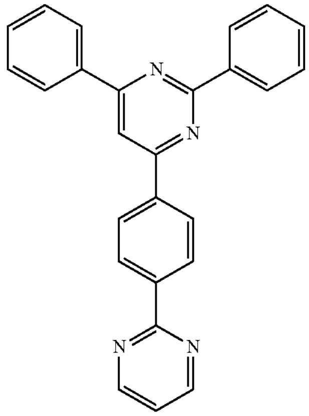
1-99
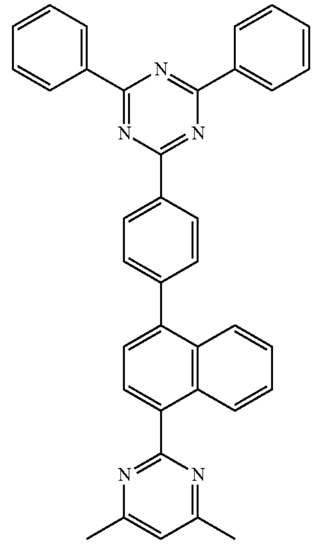
1-100
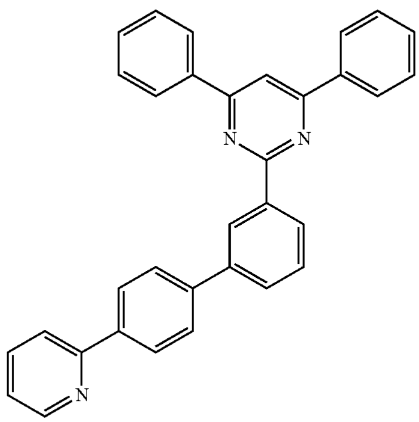
1-101
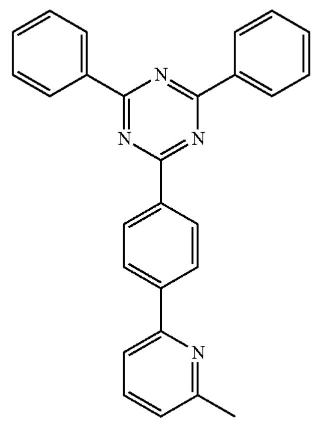
1-102
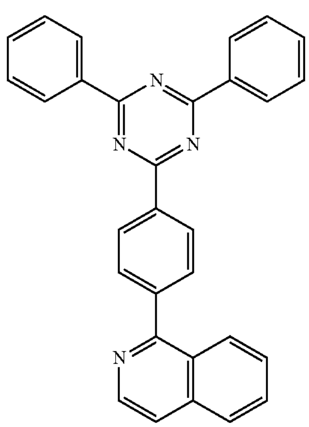
1-103
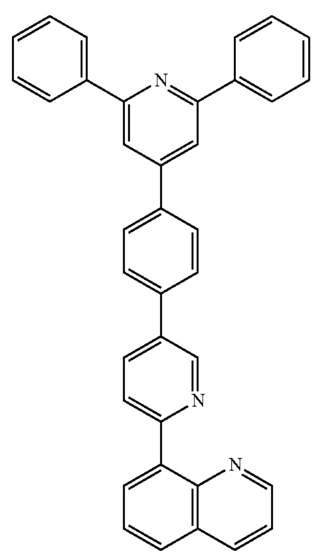

-continued
1-104
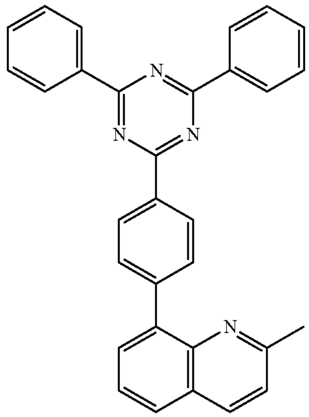
1-105
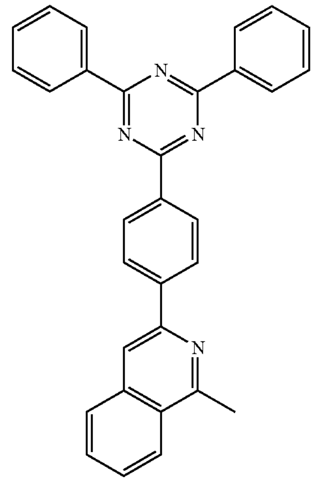
1-106
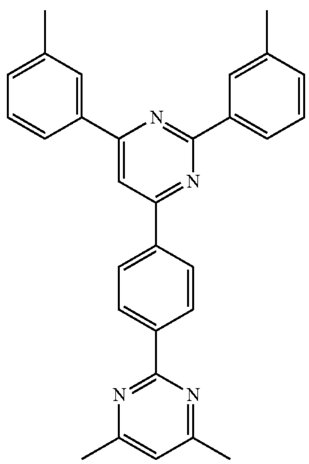
1-107
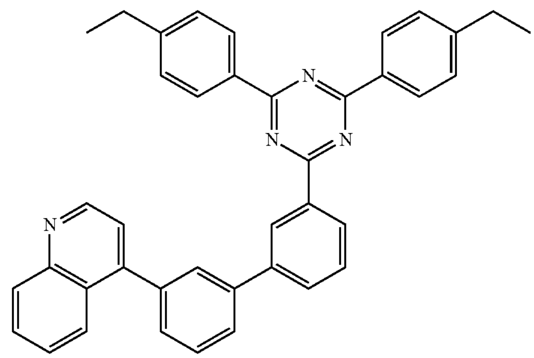
1-108
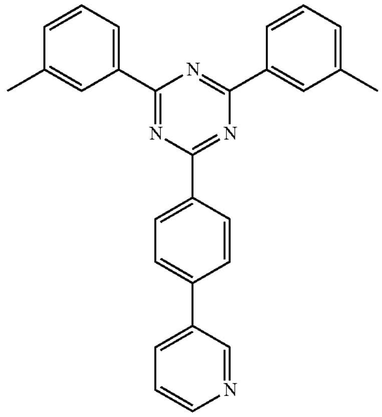
1-109
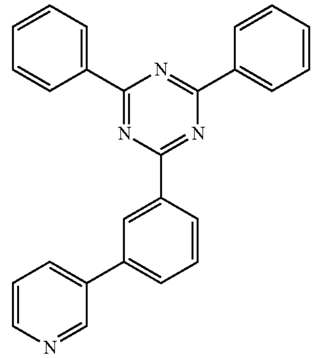

-continued
1-110
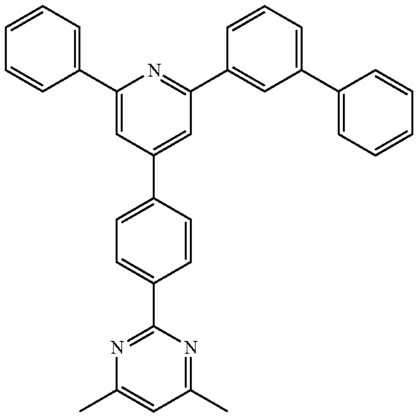
1-111
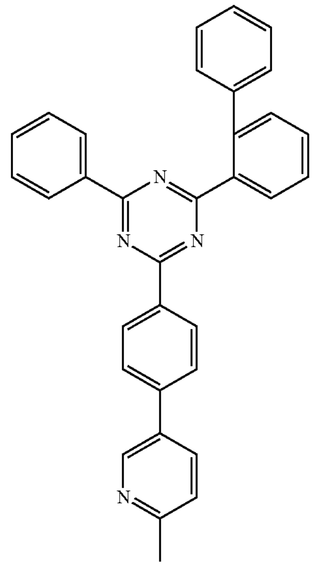
1-112
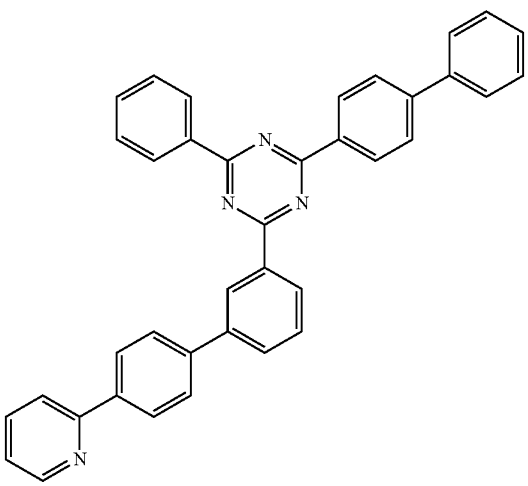
1-113
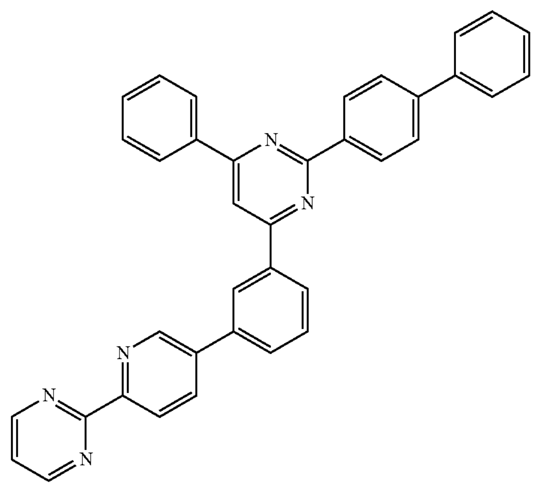
1-114
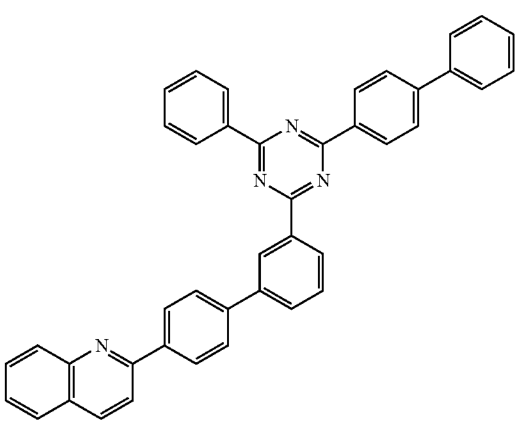
1-115
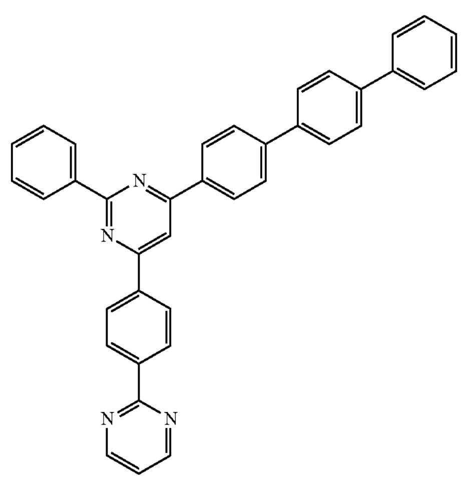

-continued
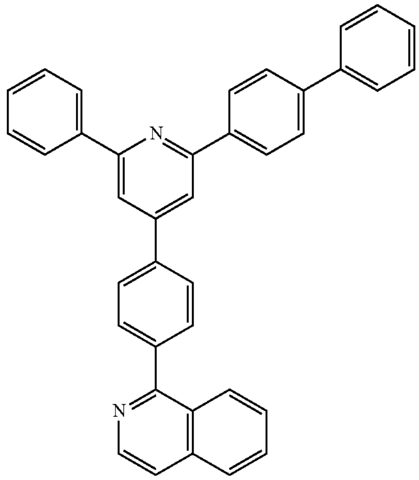
1-116
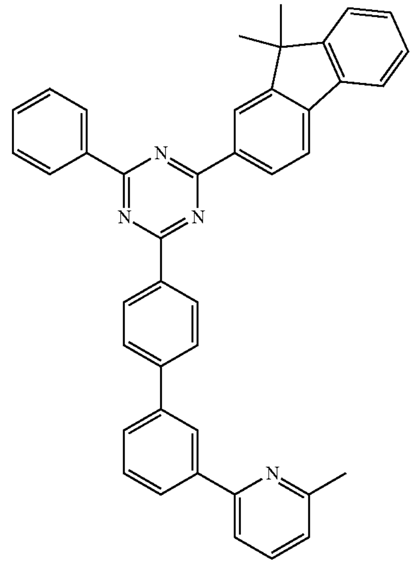
1-117
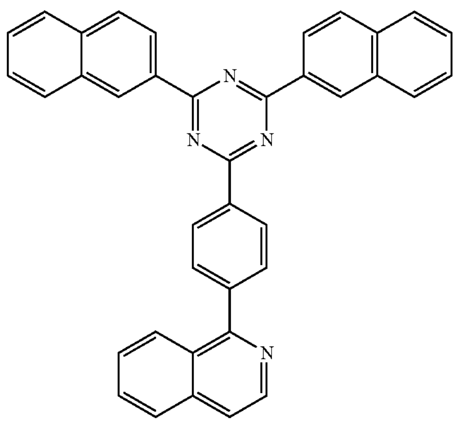
1-118
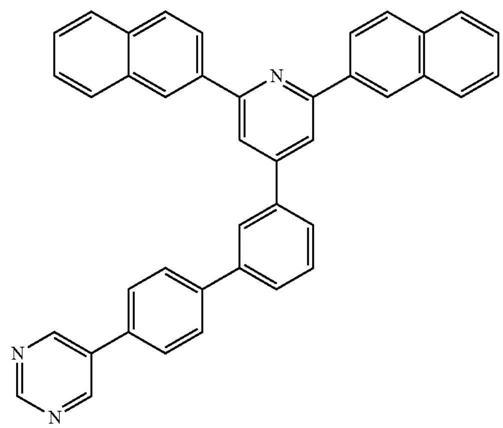
1-119
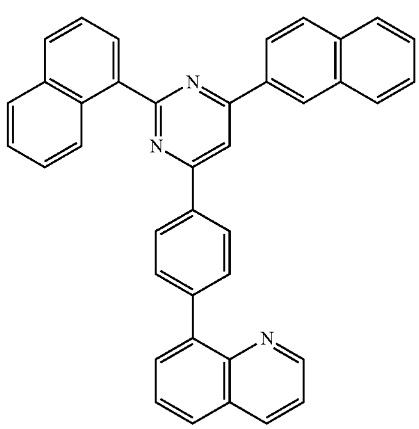
1-120
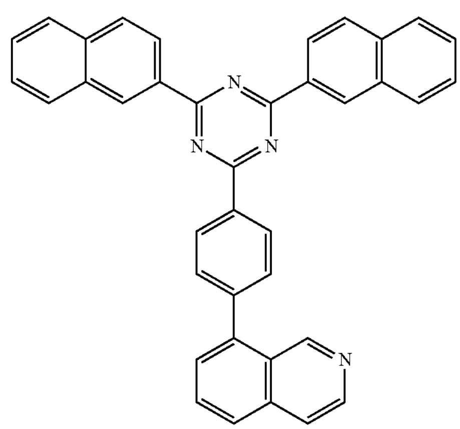
1-121

-continued
1-122
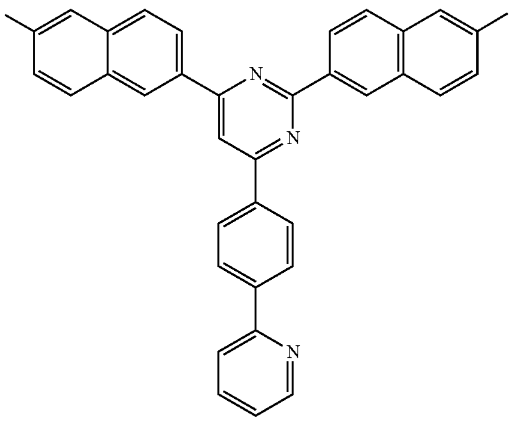
1-123
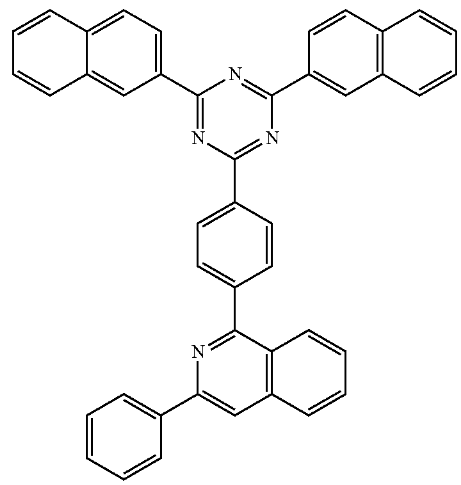
1-124
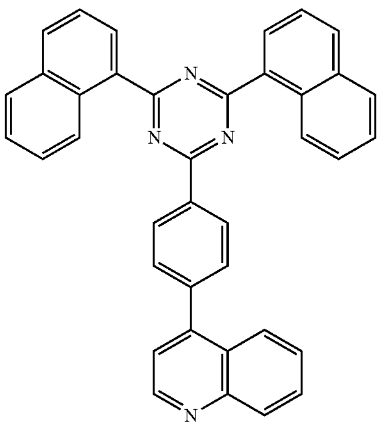
1-125
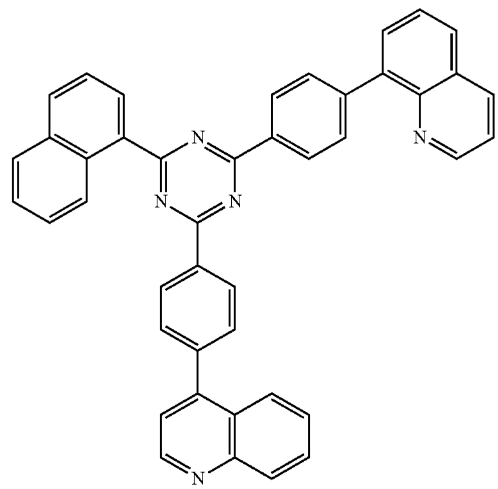
1-126
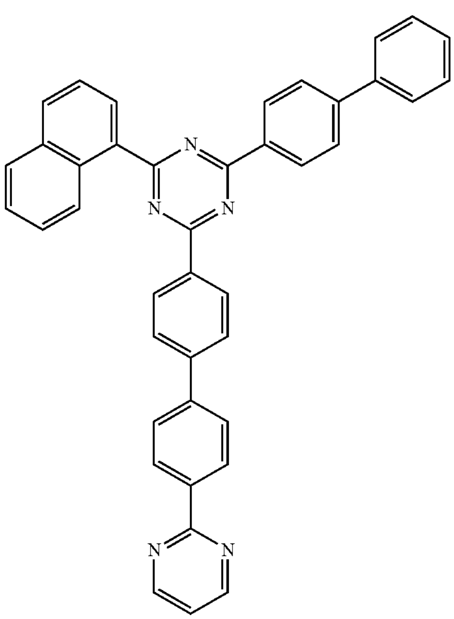
1-127
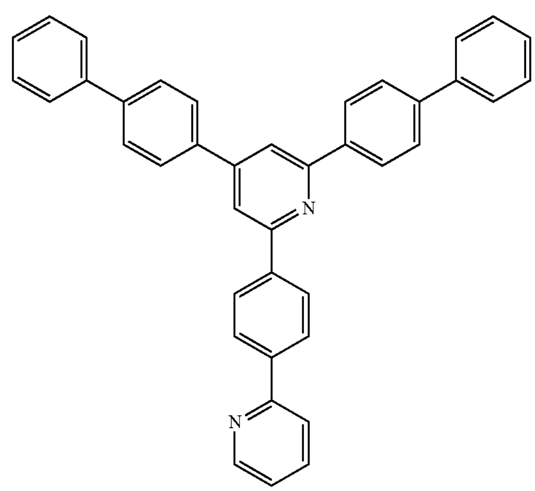

-continued
1-128
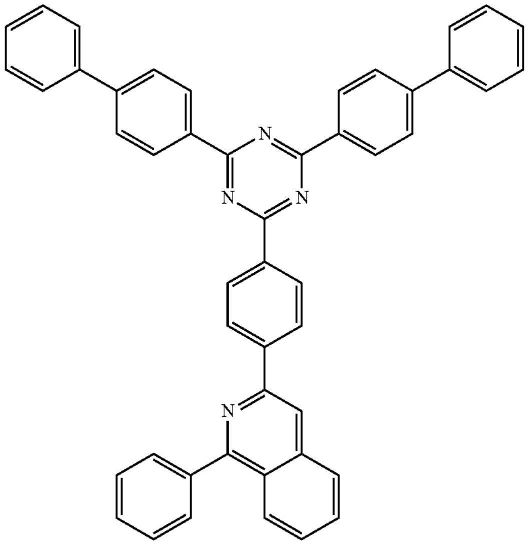
1-129
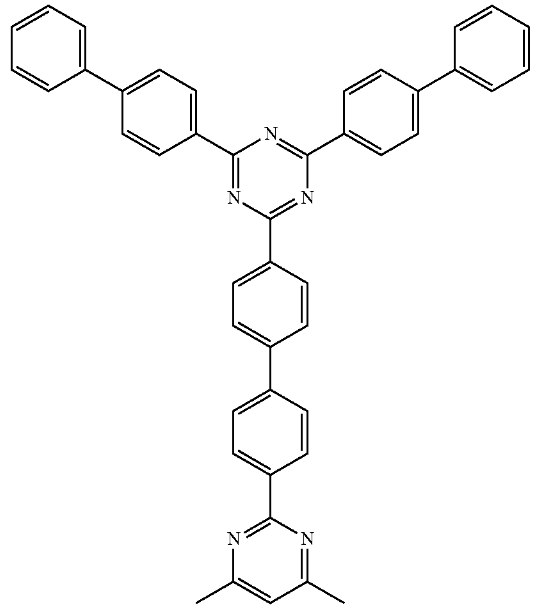
1-130
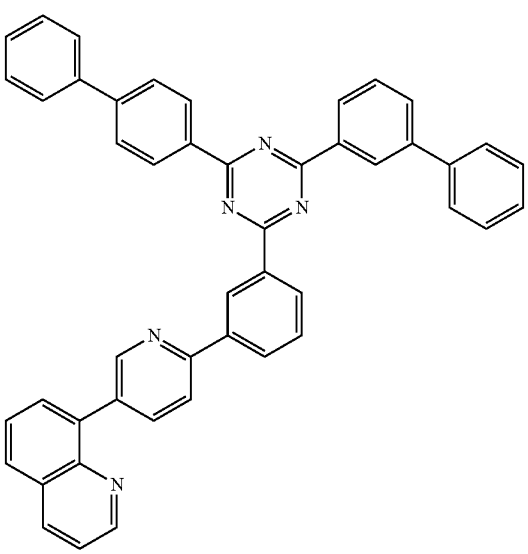
1-131
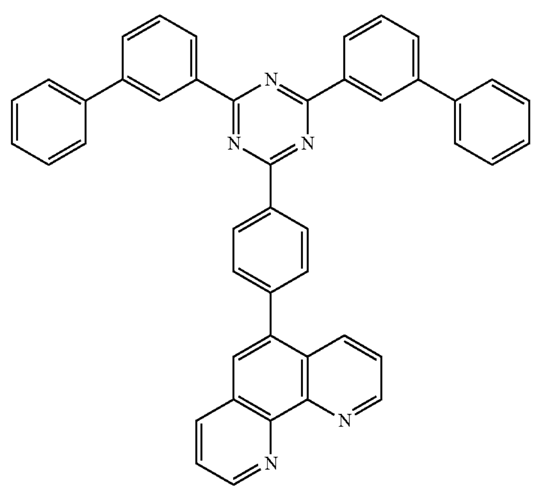

-continued
1-132
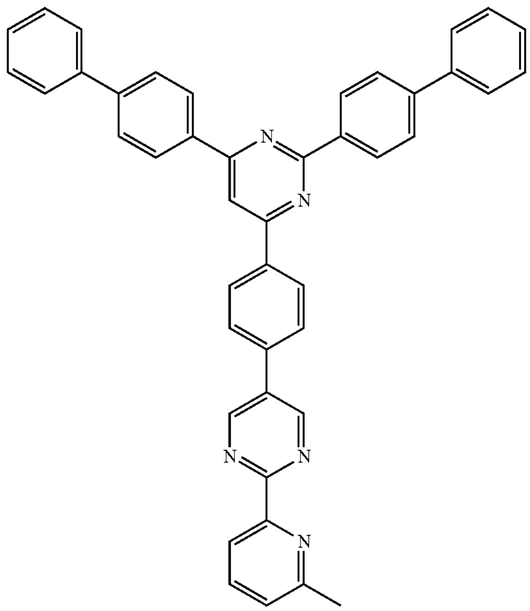
1-133
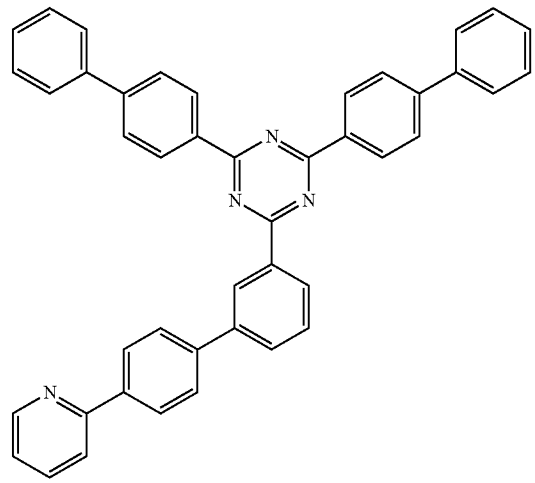
1-134
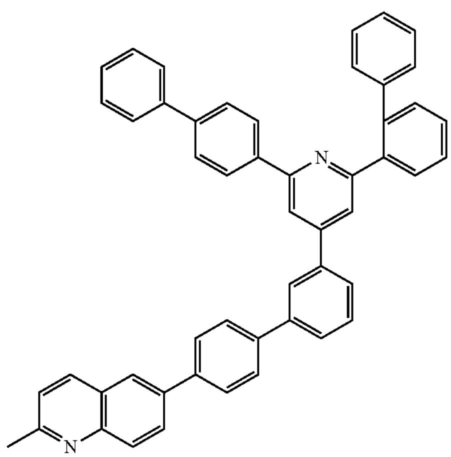
1-135
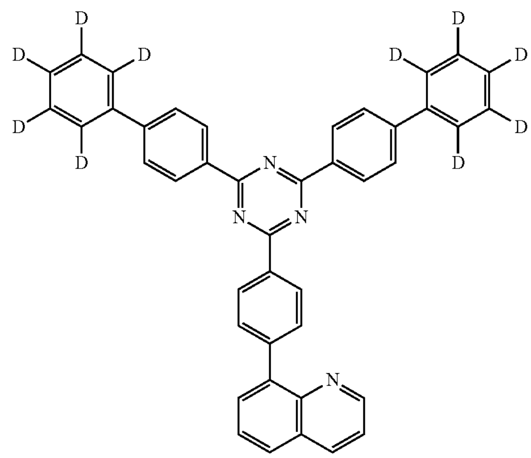
1-136
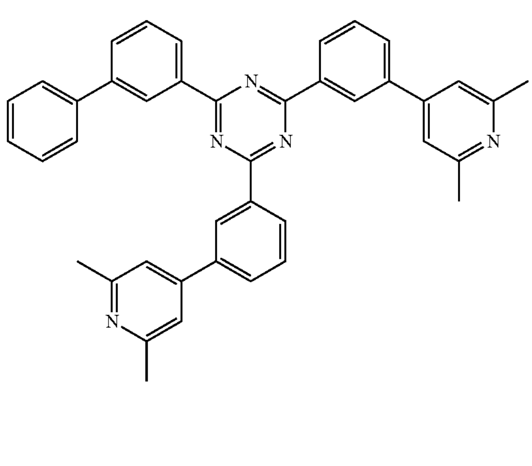
1-137
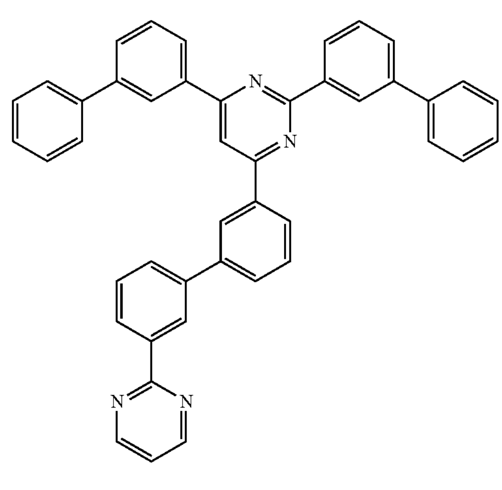

-continued
1-138
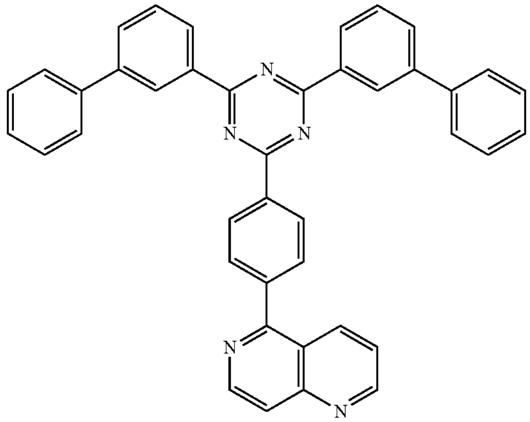
1-139
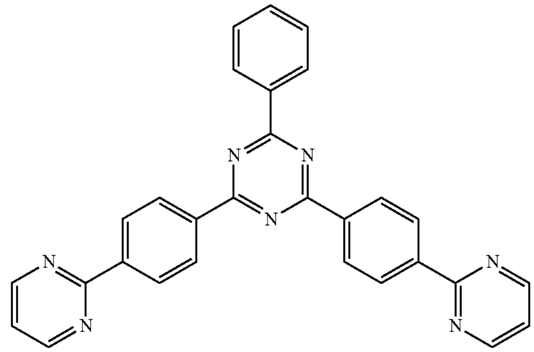
1-140
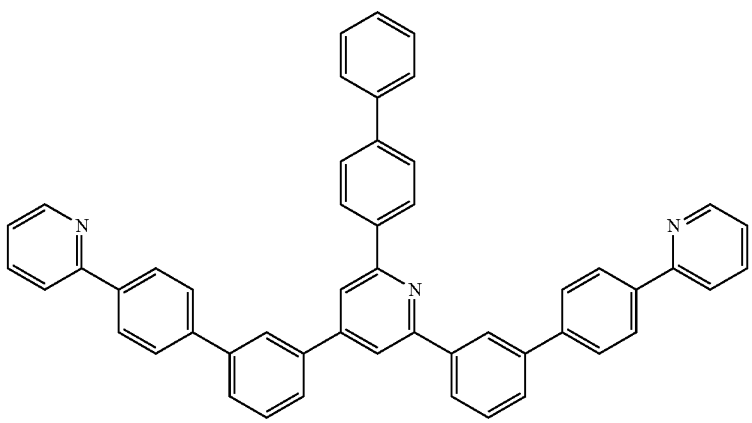
1-141
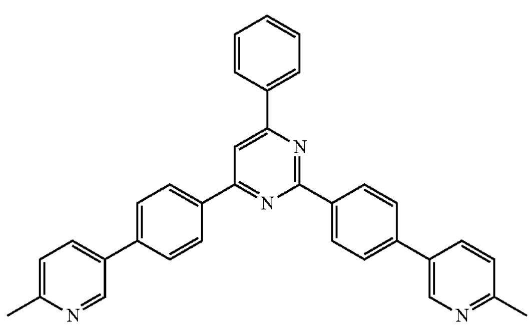

-continued
1-142
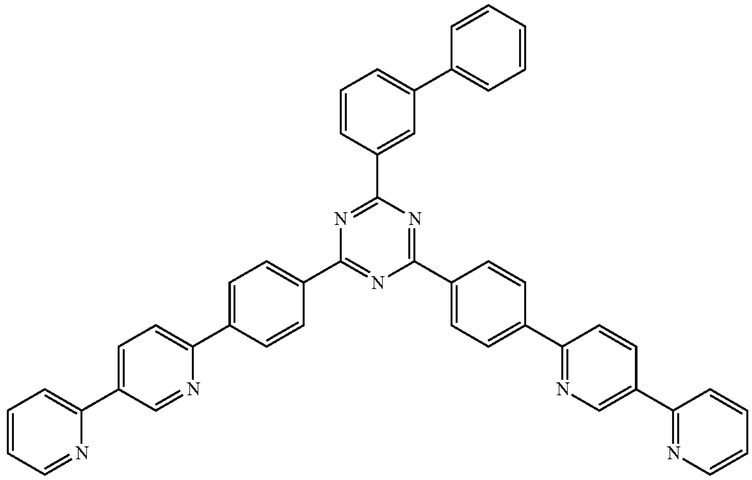
1-143
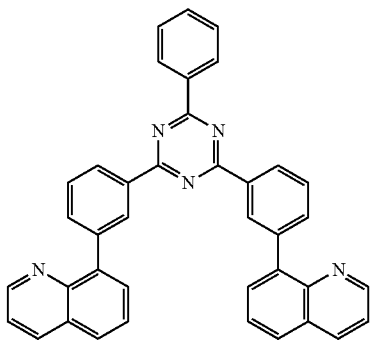
1-144
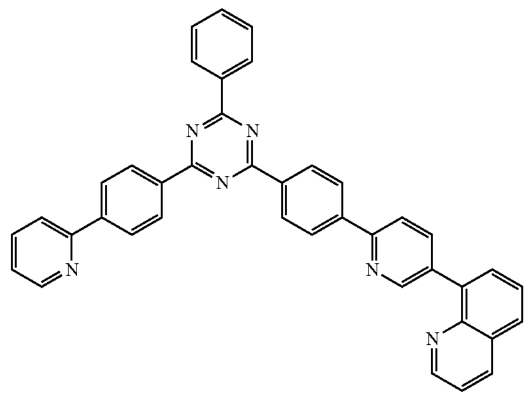
1-145
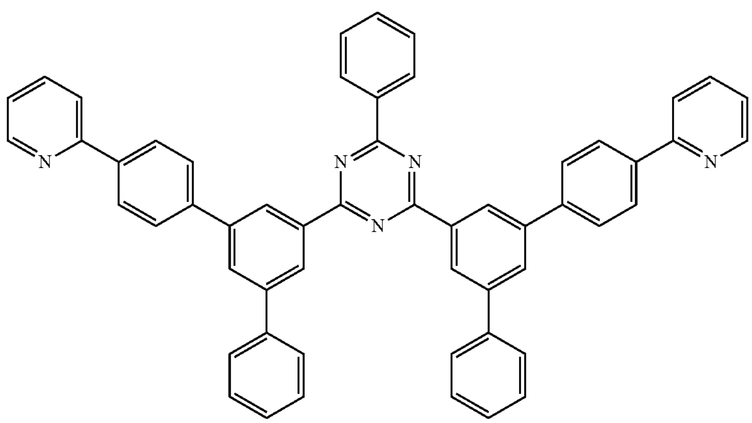
1-146
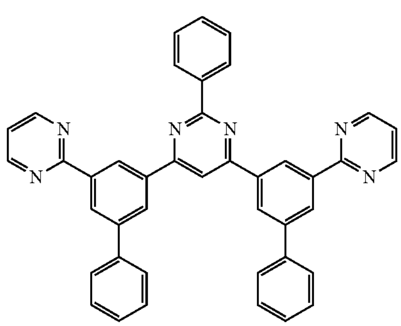
1-147
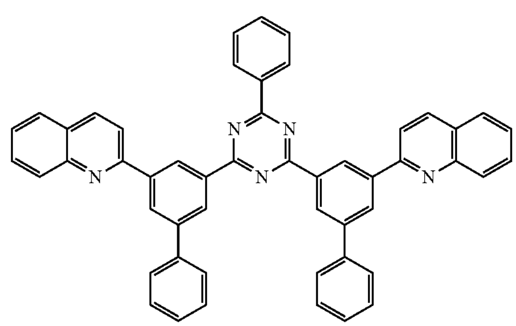

-continued
1-148
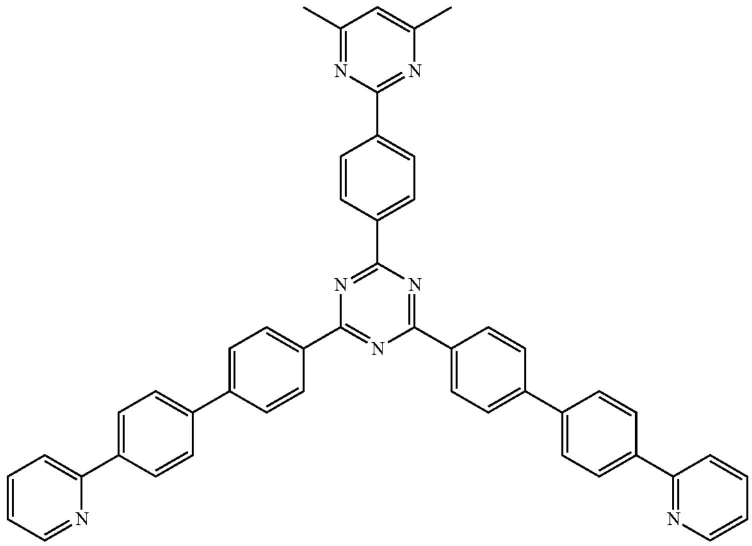
1-149
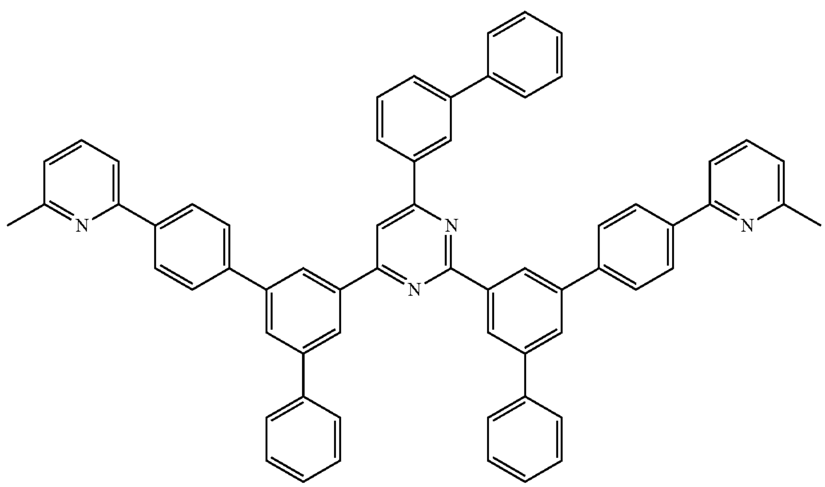
1-150
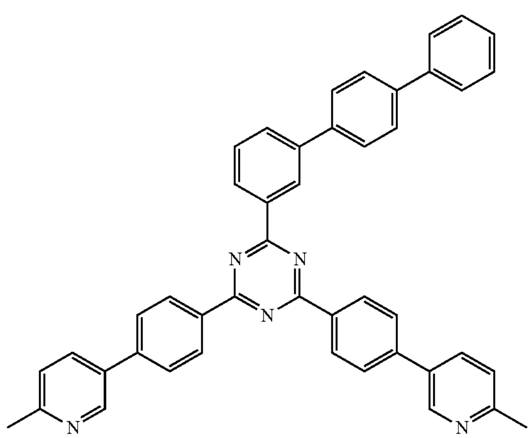
1-151
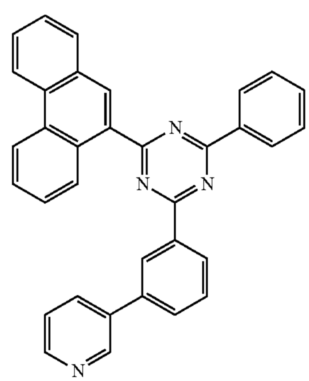

-continued
1-152
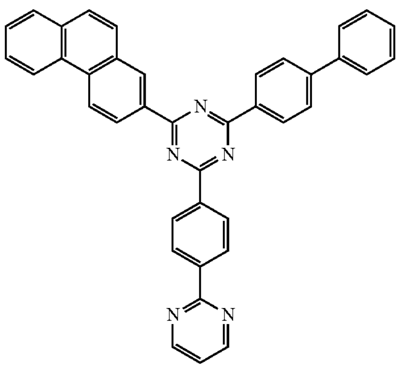
1-153
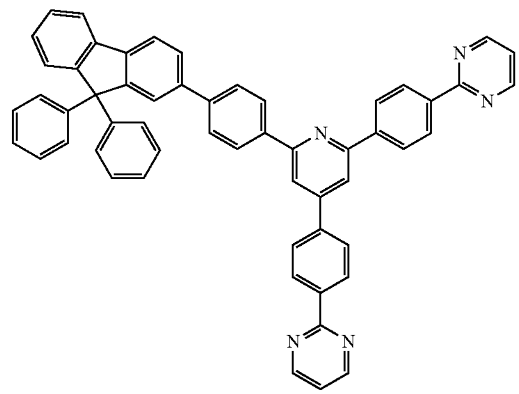
1-154
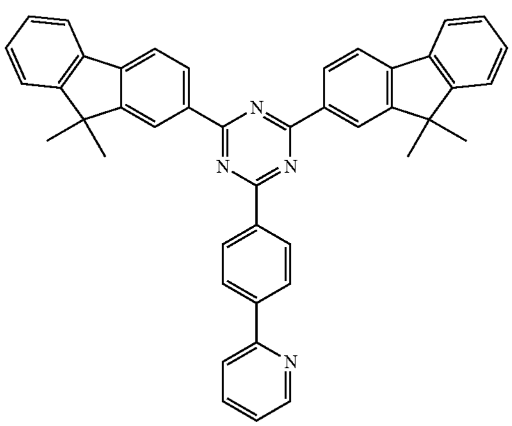
1-155
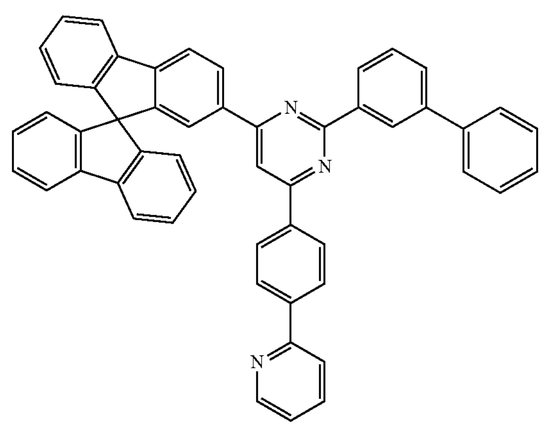
1-156
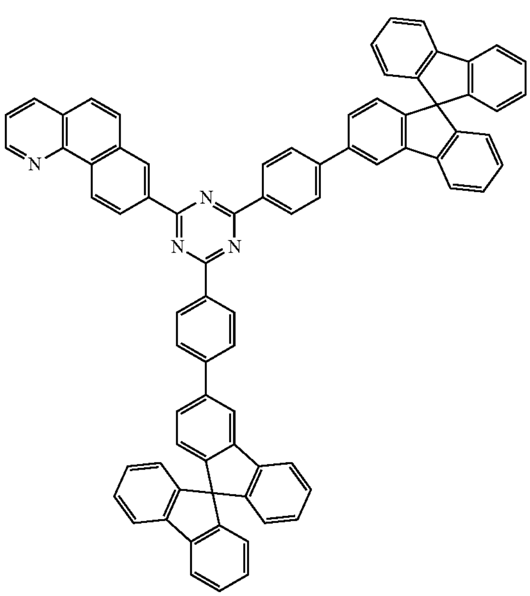
1-157
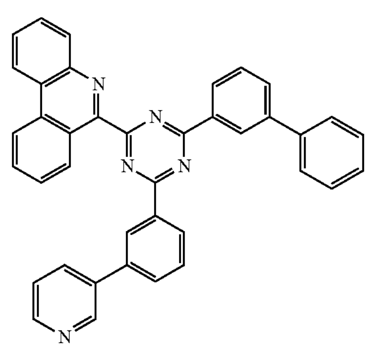

-continued
1-158
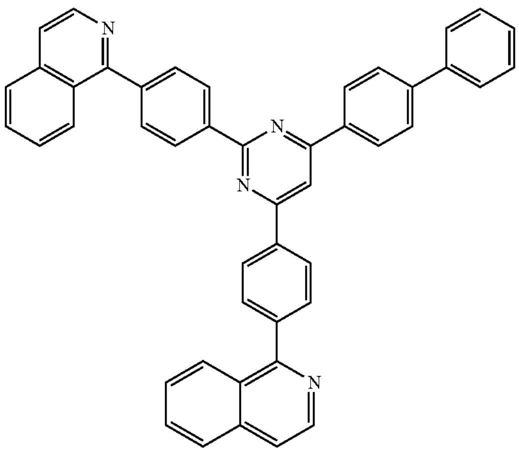
1-159
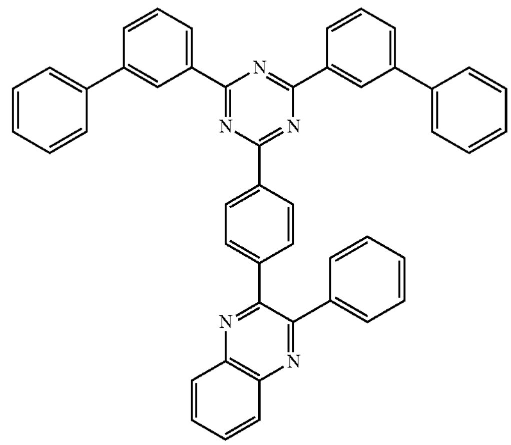
1-160
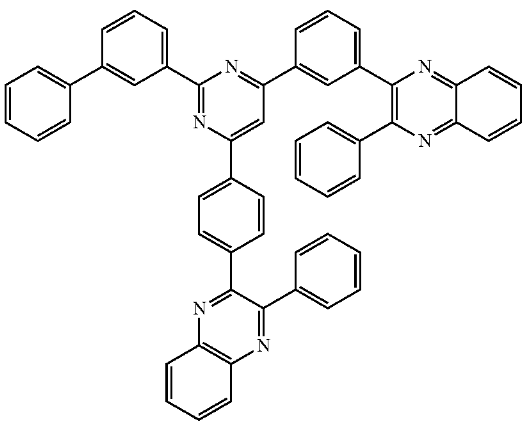
1-161
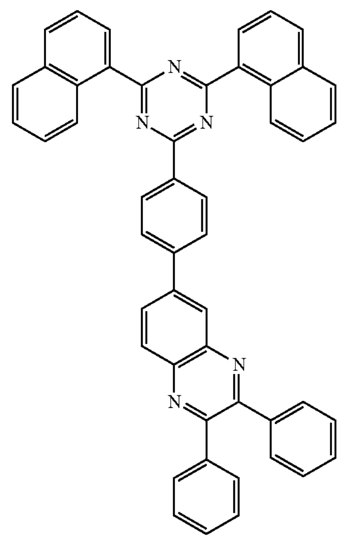
1-162
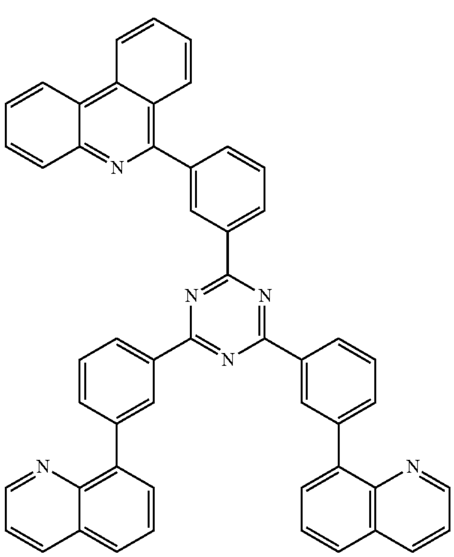
1-163
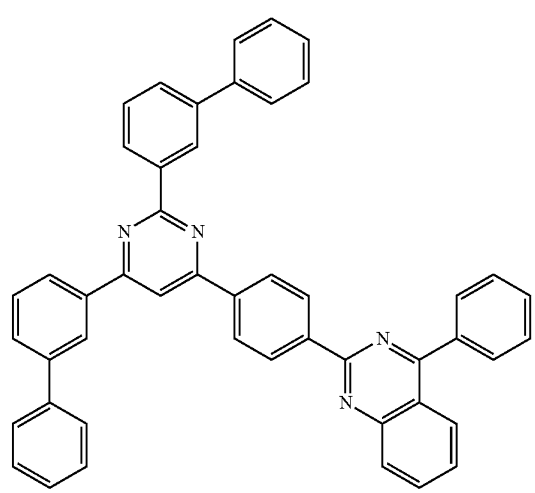

-continued
1-164
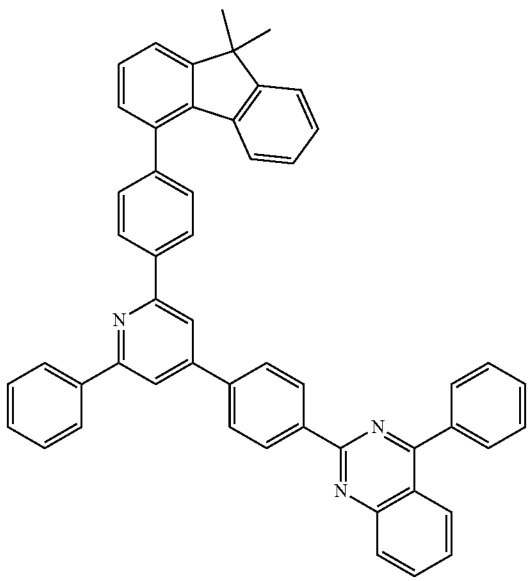
1-165
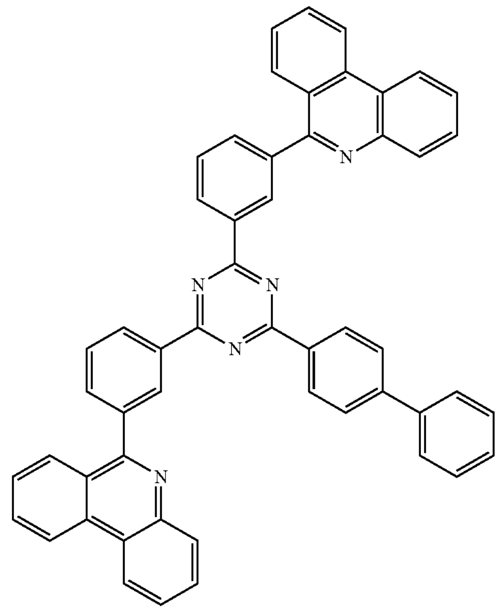
1-166
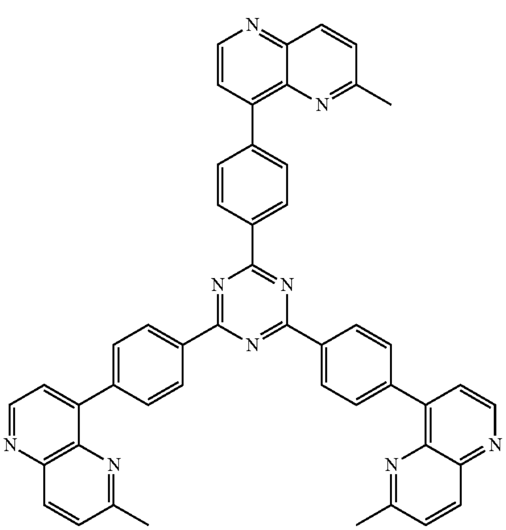
1-167
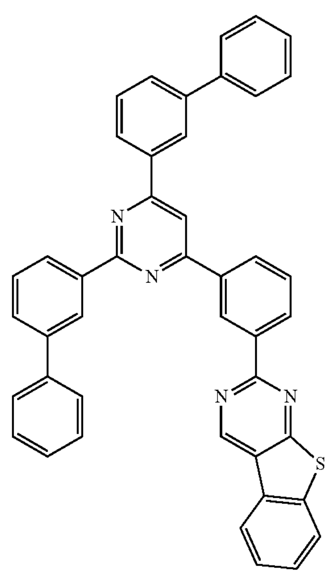

-continued
1-168
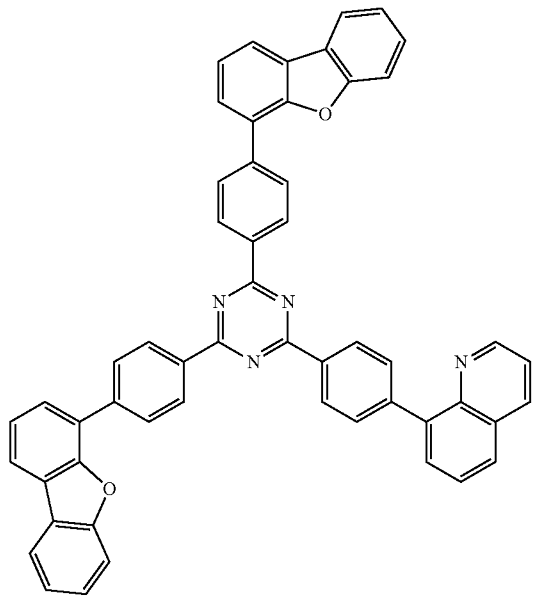
1-169
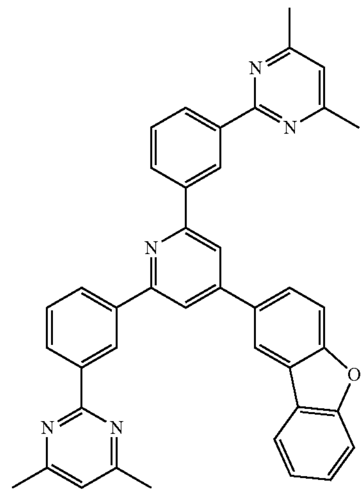
1-170
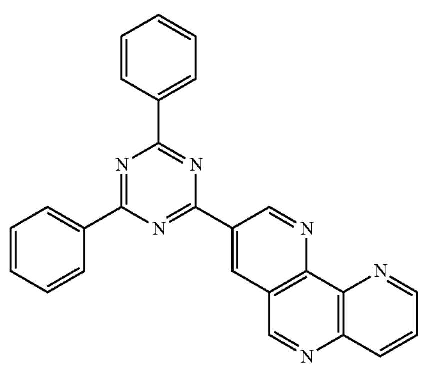
1-171
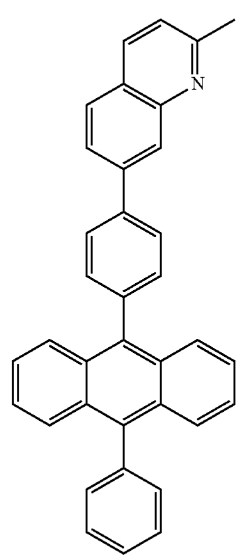

-continued
1-172
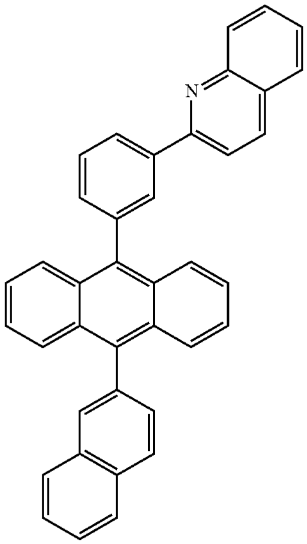
1-173
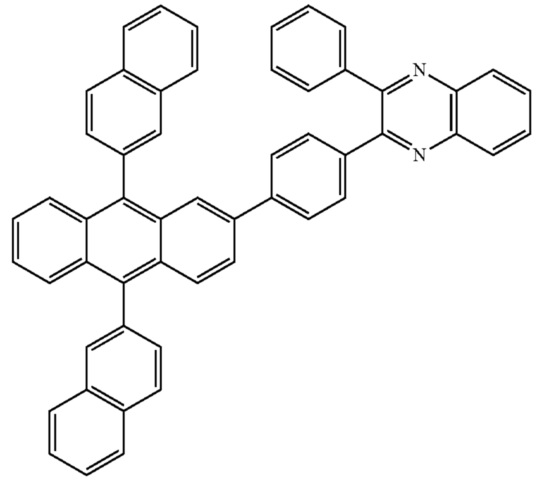
1-174
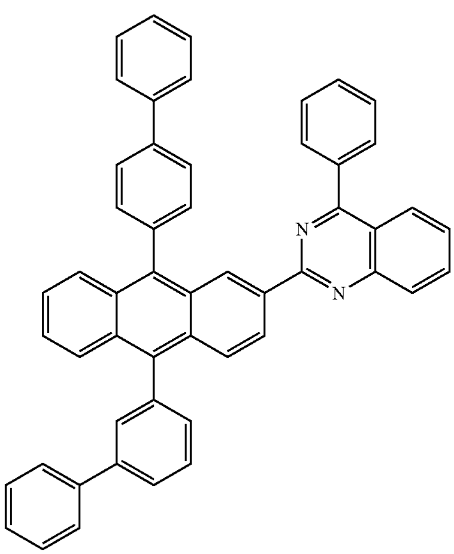
1-175
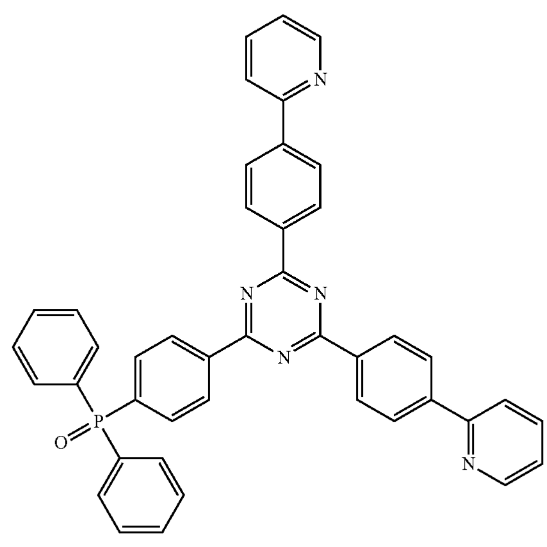

-continued
1-176
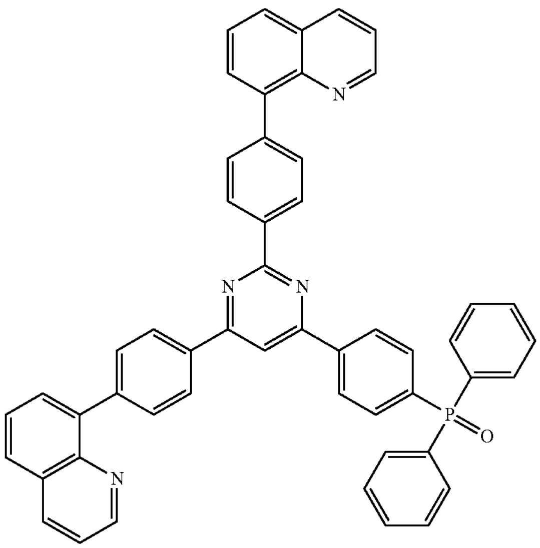
1-177
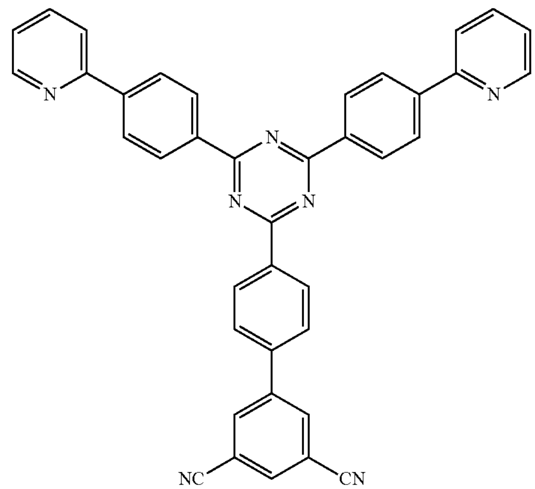
1-178
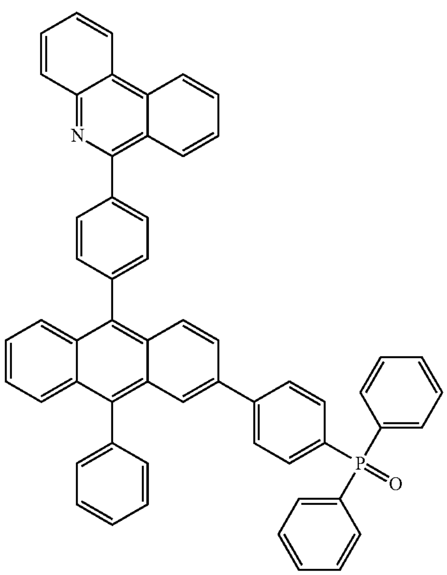
1-179
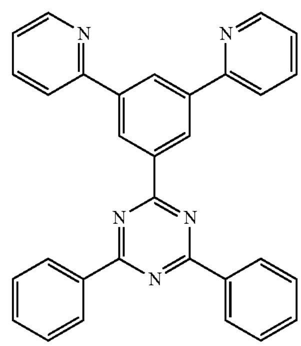
1-180
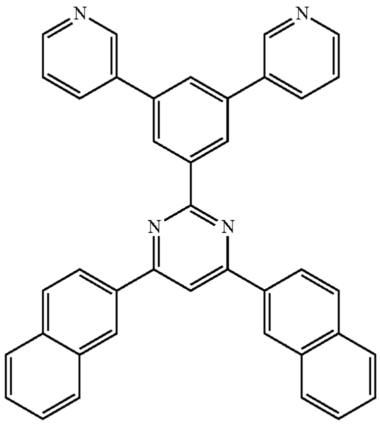
1-181
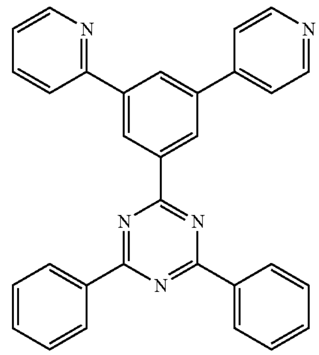

-continued
1-182
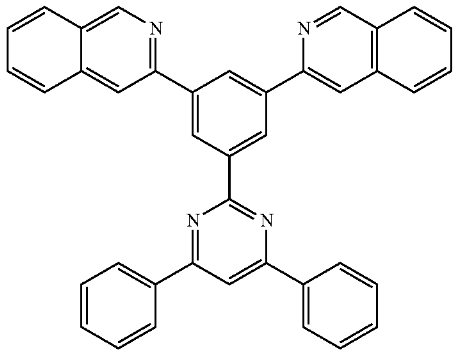
1-183
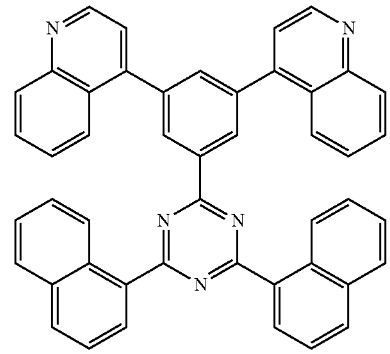
1-184
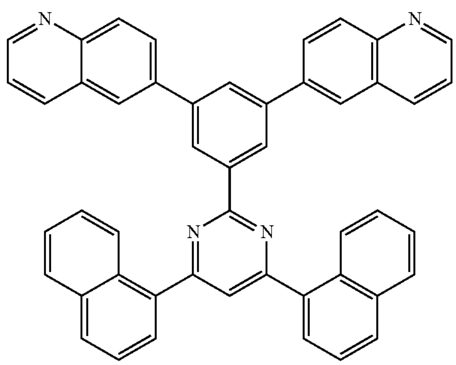
1-185
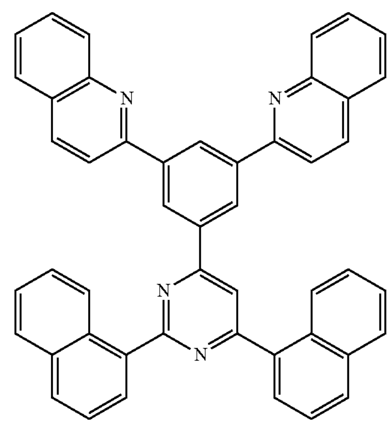
1-186
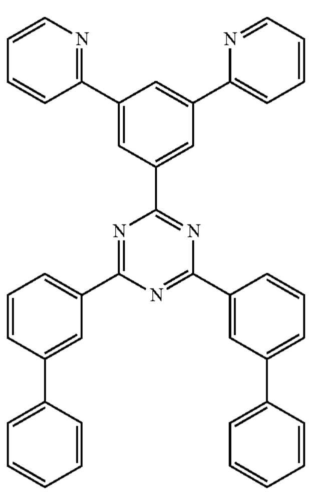
1-187
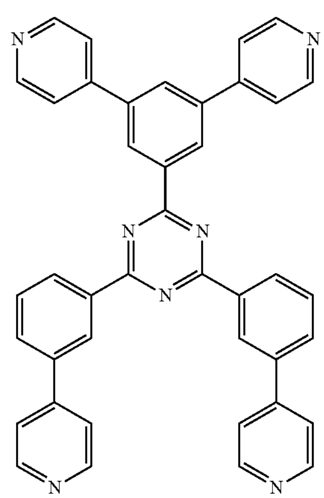

-continued
1-188
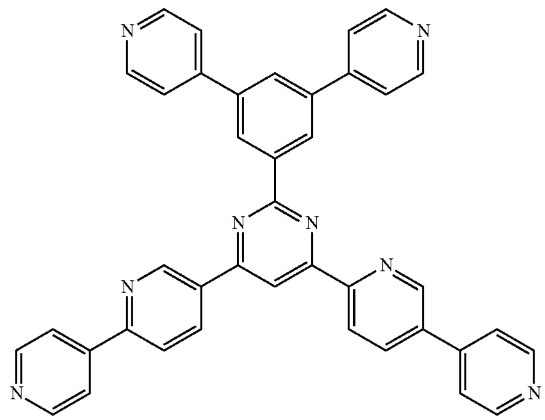
1-189
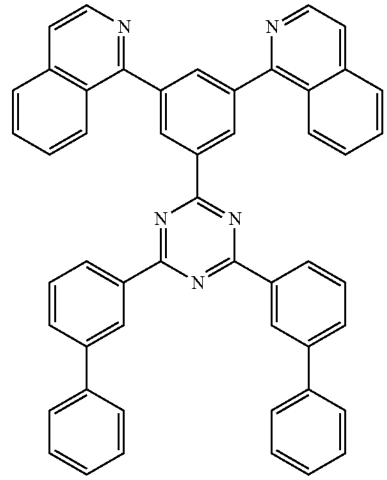
1-190
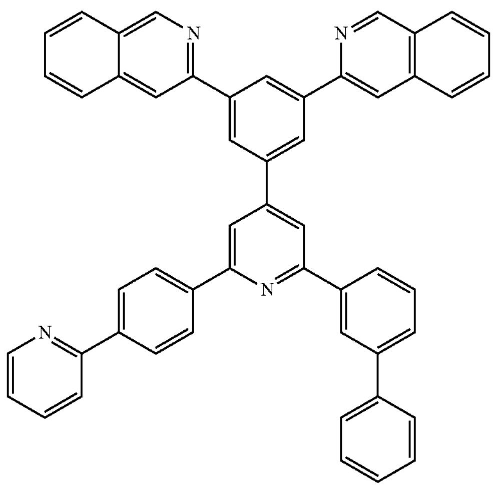
1-191
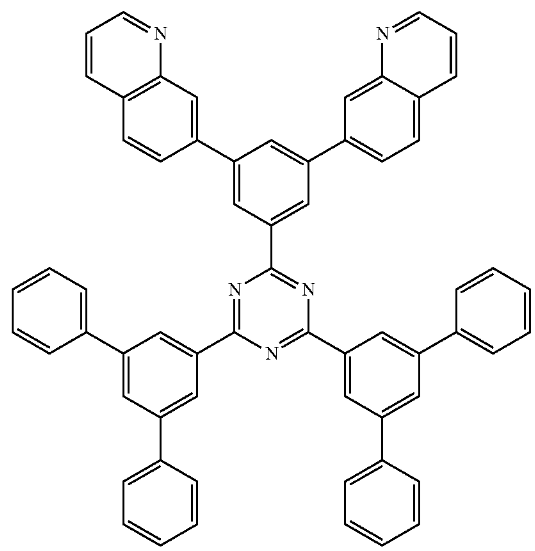
1-192
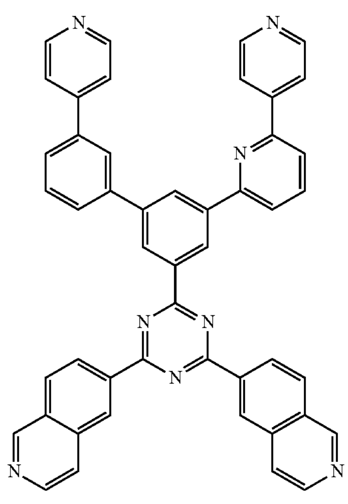
1-193
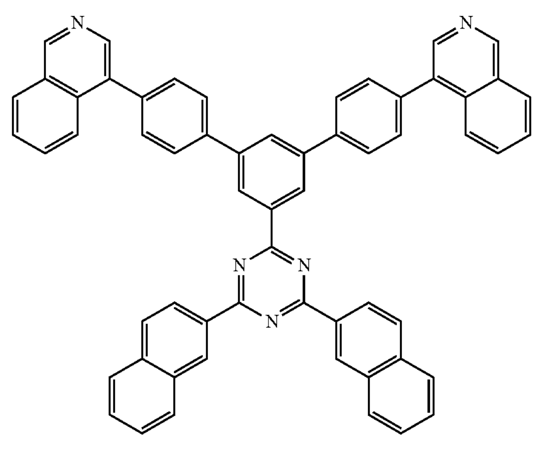

-continued
1-194
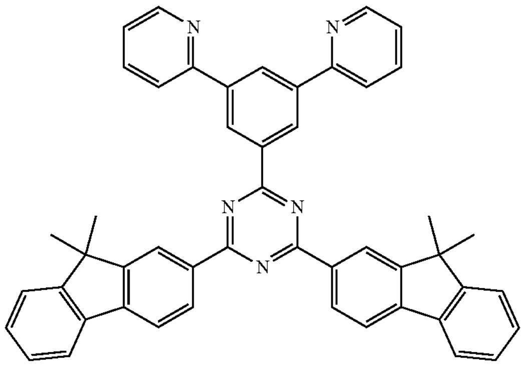
1-195
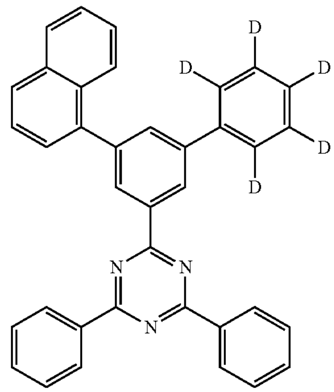
1-196
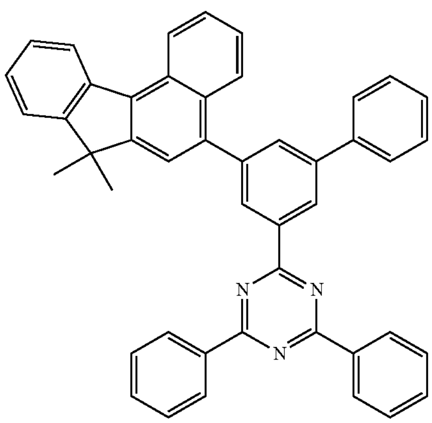
1-197
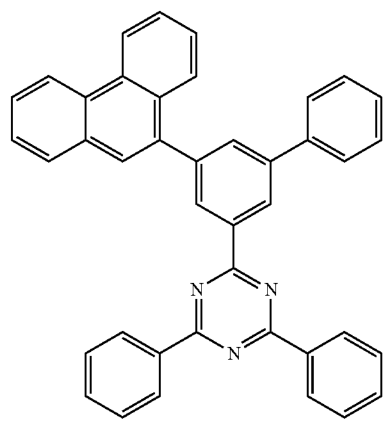
1-198
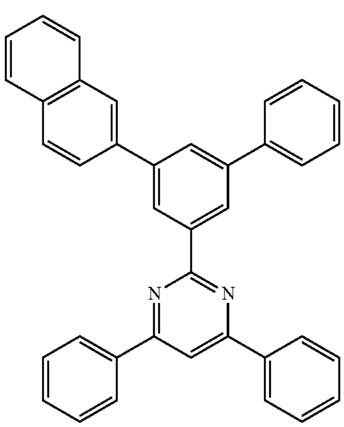
1-199
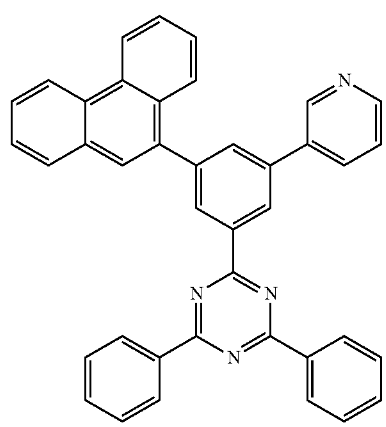

-continued
1-200
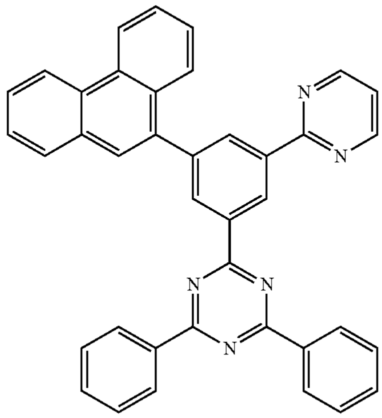
1-201
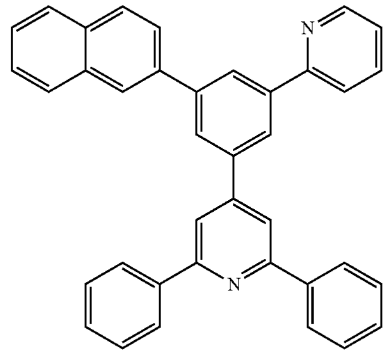
1-202
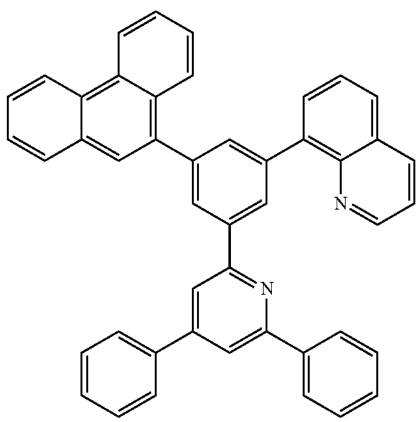
1-203
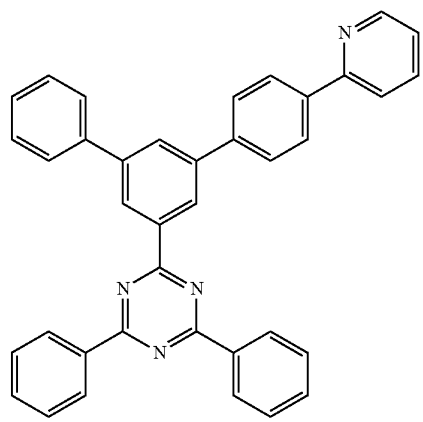
1-204
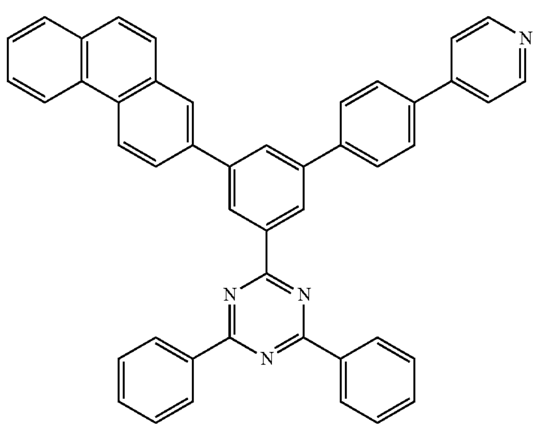
1-205
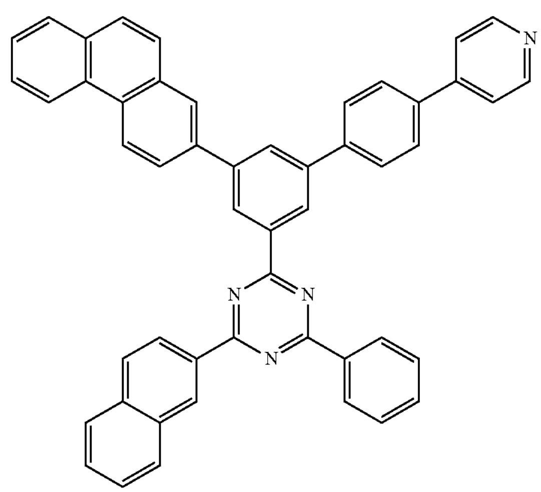

-continued
1-206
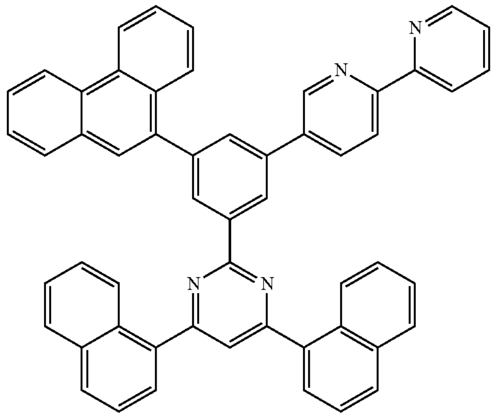
1-207
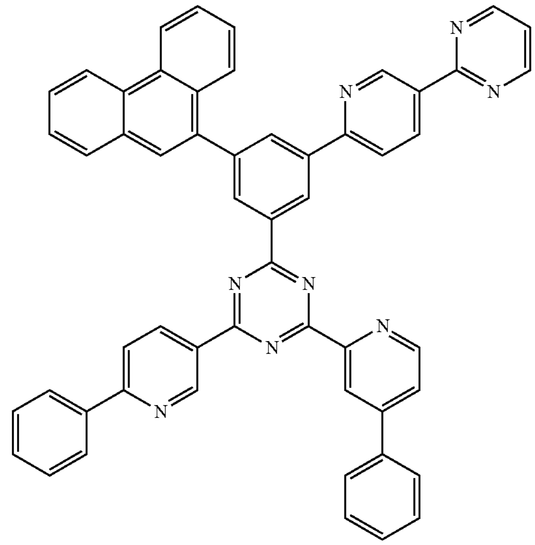
1-208
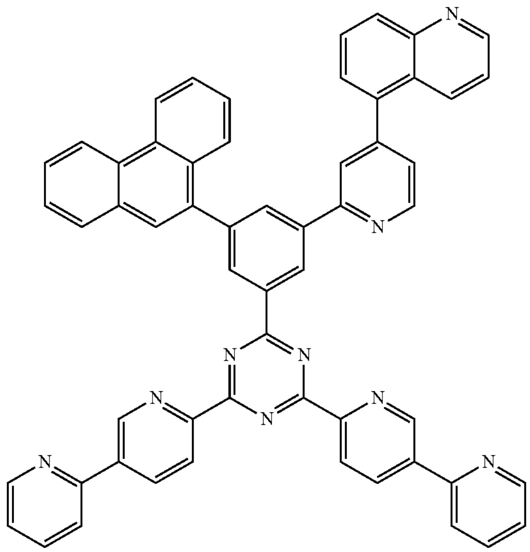
1-209
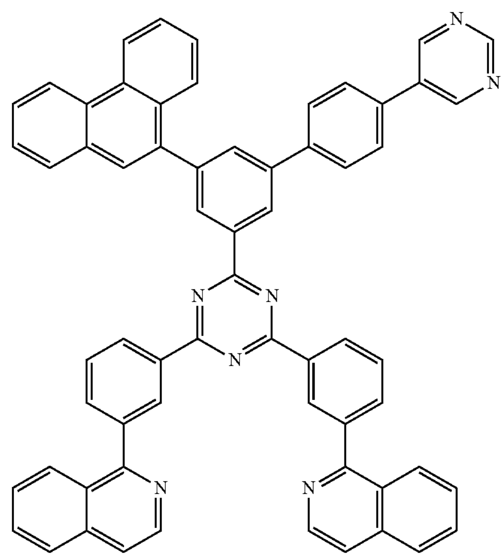
1-210
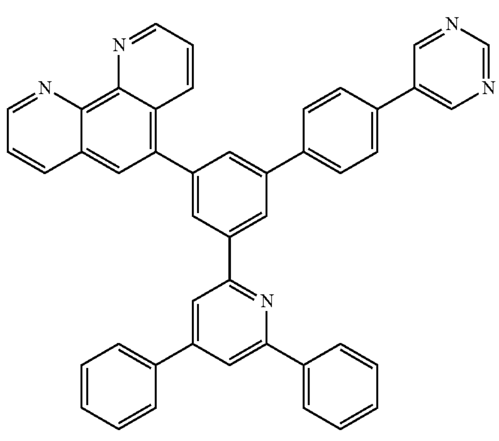
1-211
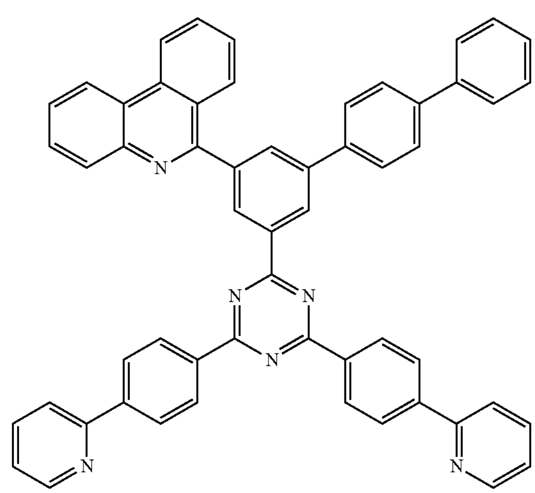

-continued
1-212
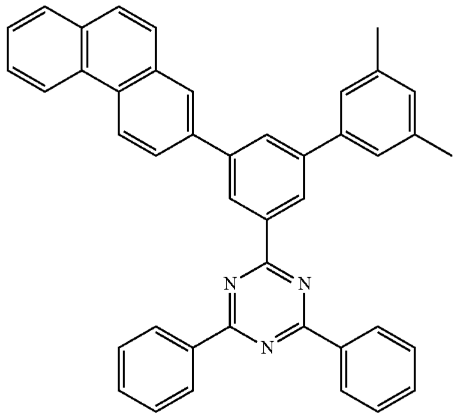
1-213
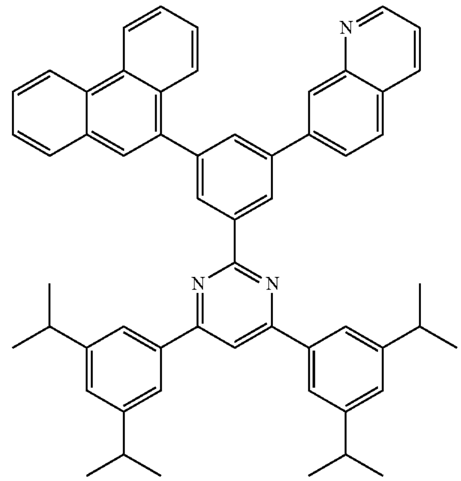
1-214
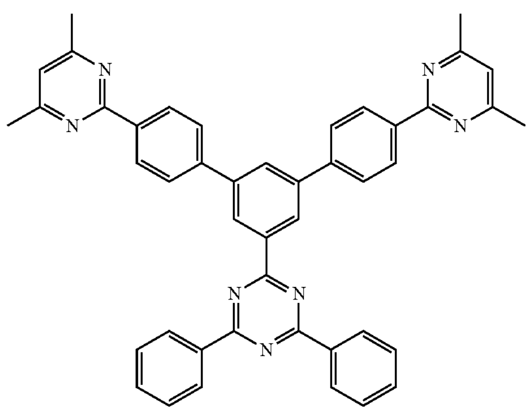
1-215
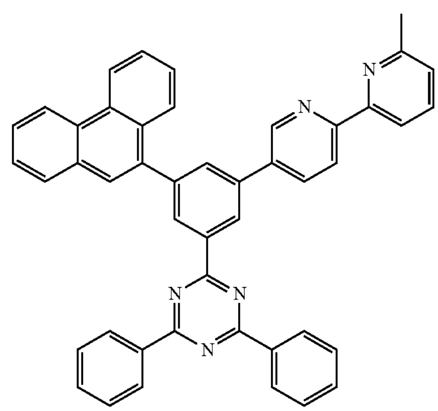
1-216
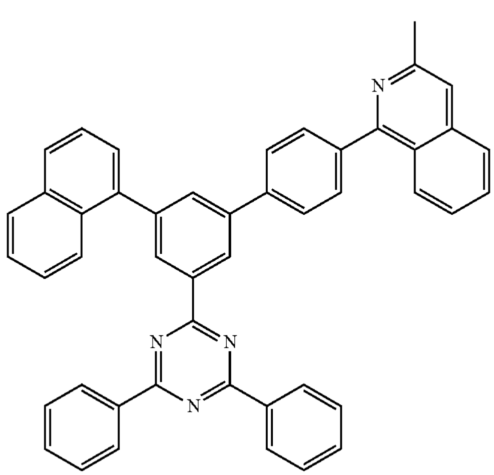
1-217
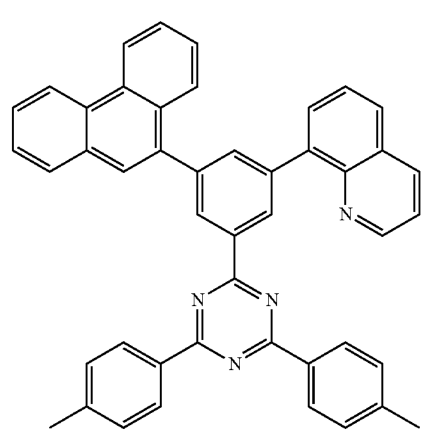

-continued
1-218
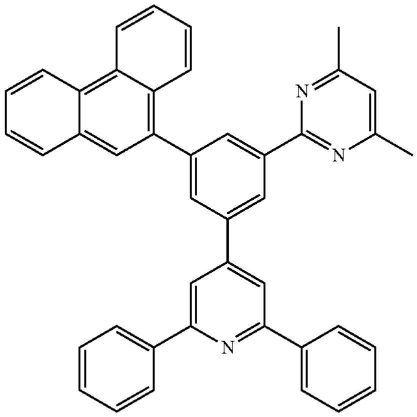
1-219
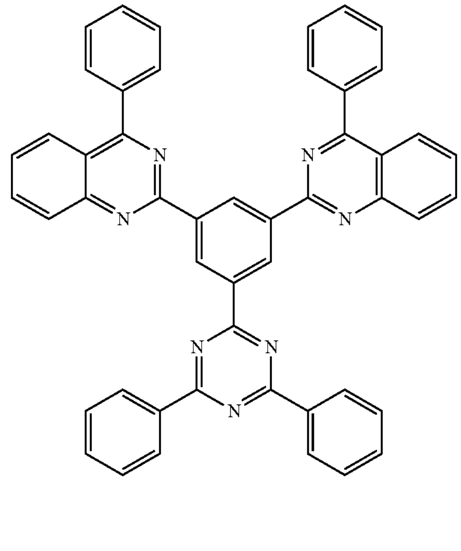
1-220
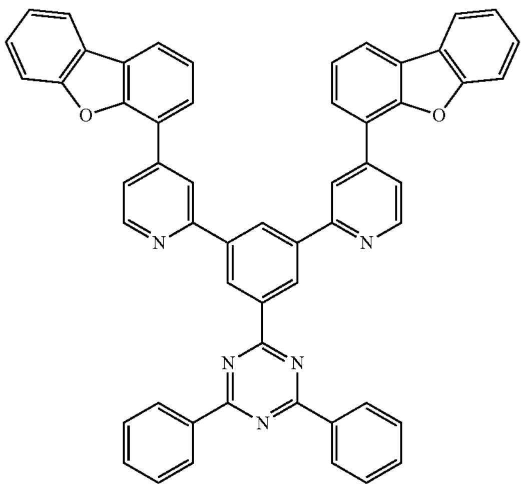
1-221
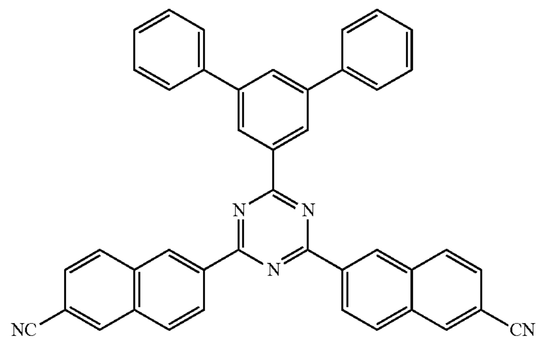
1-222
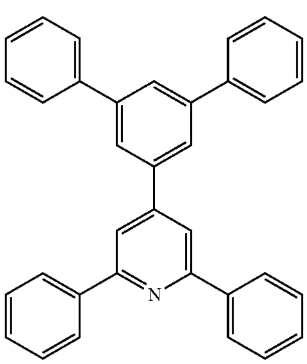
1-223
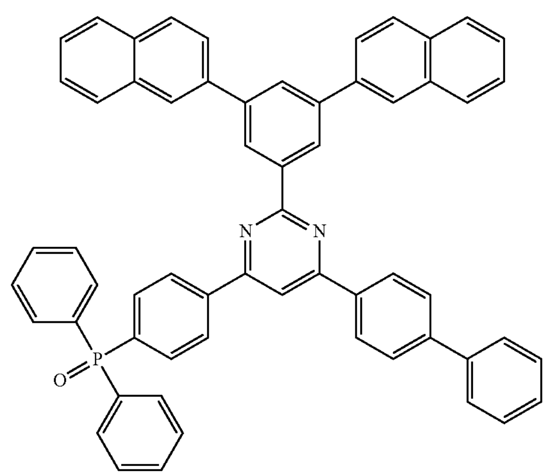

-continued
1-224
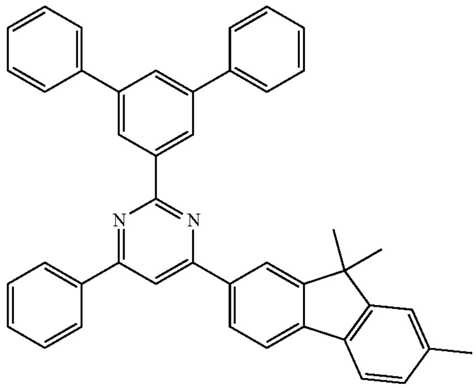
1-225
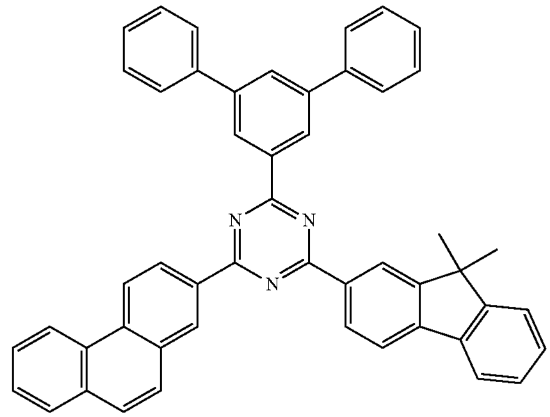
1-226
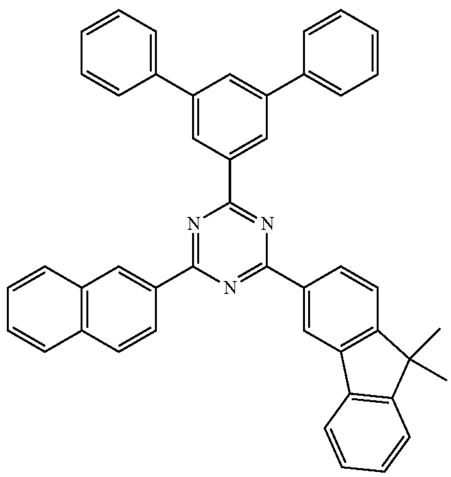
1-227
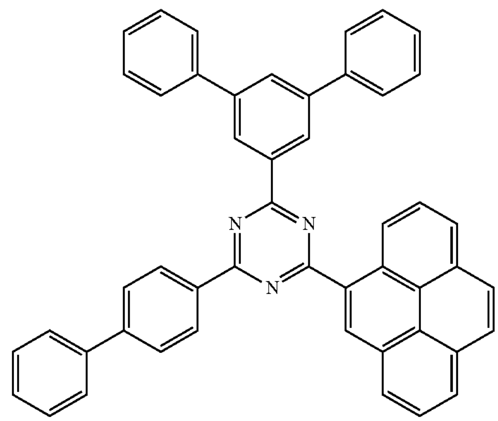
1-228
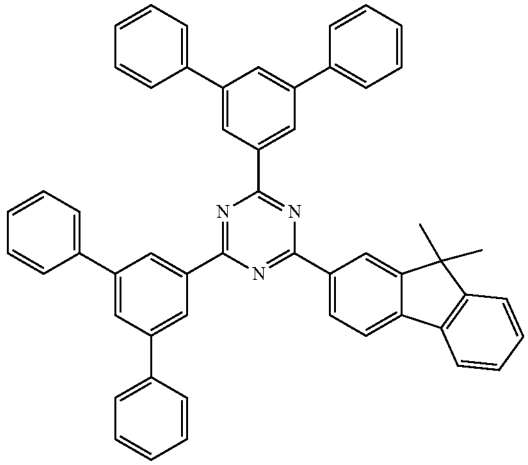
1-229
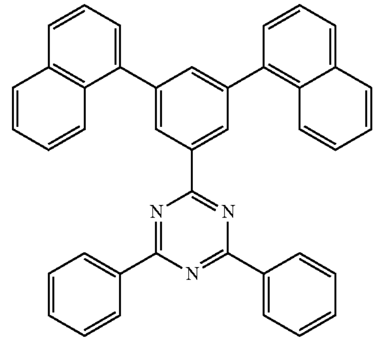

-continued
1-230
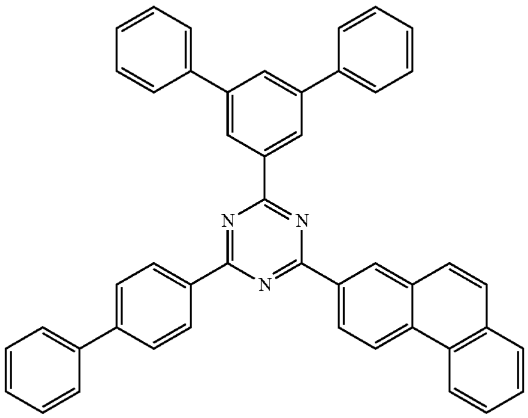
1-231
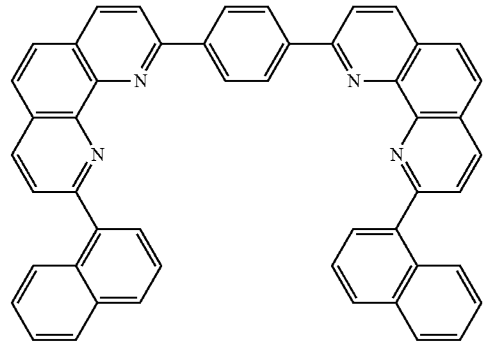
1-232
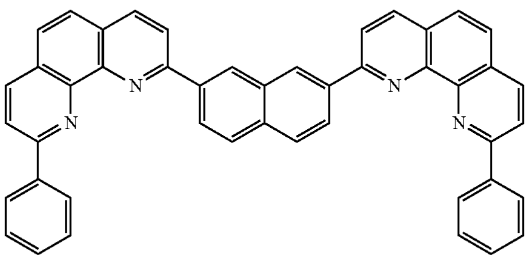
1-233
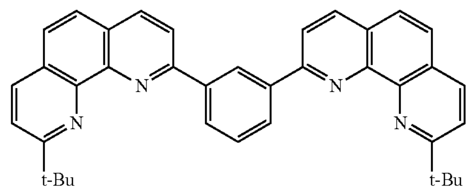
1-234
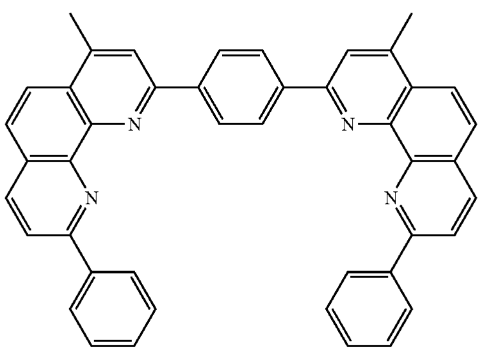
1-135
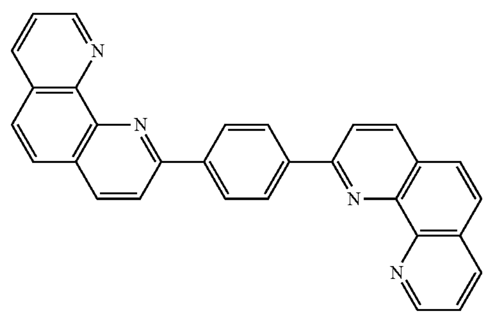
1-236
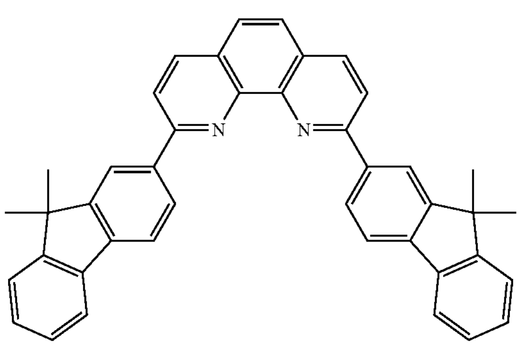
1-237
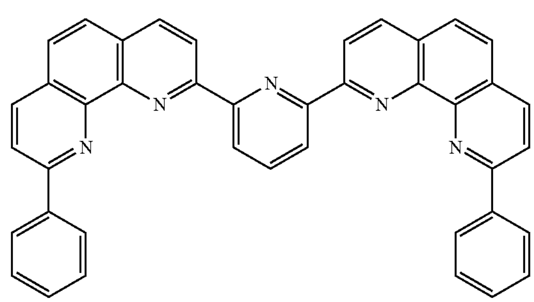

-continued
1-238
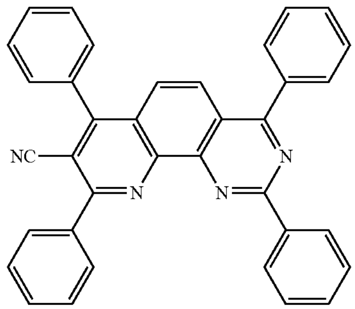
1-239
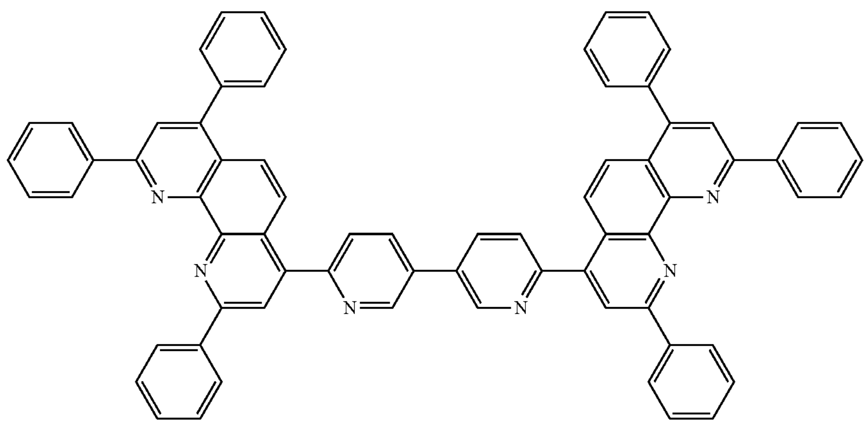
1-240
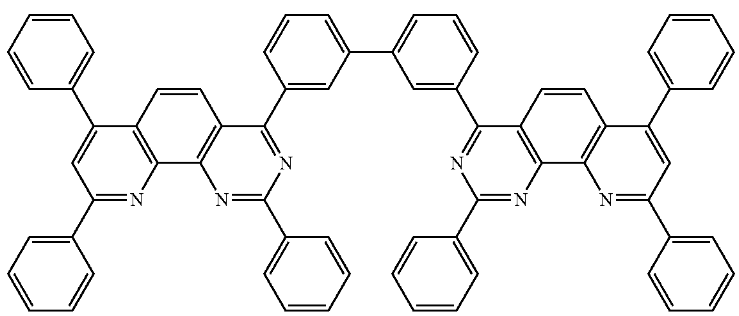
1-241
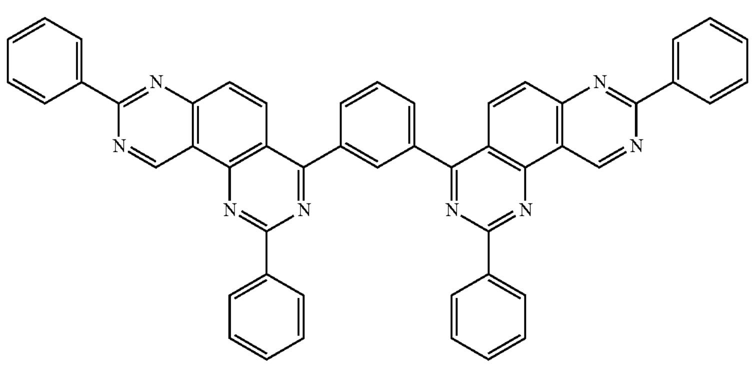

-continued
1-242
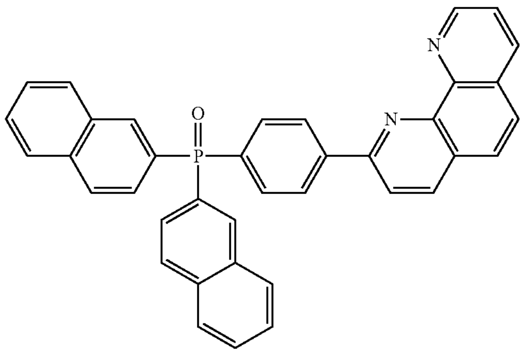
1-243
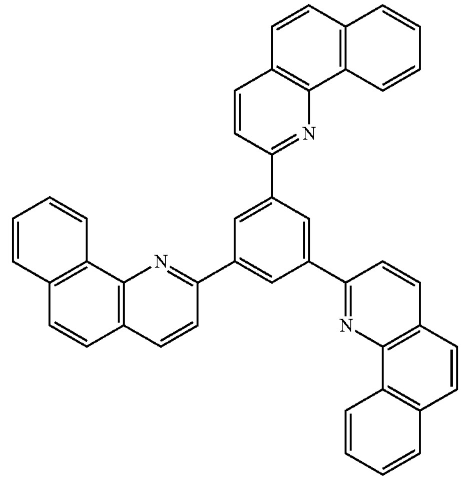
1-244
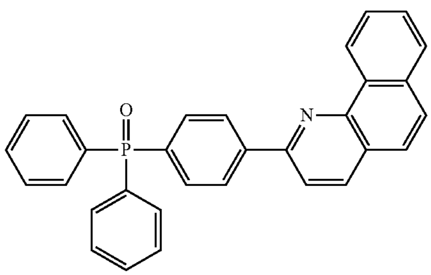
1-245
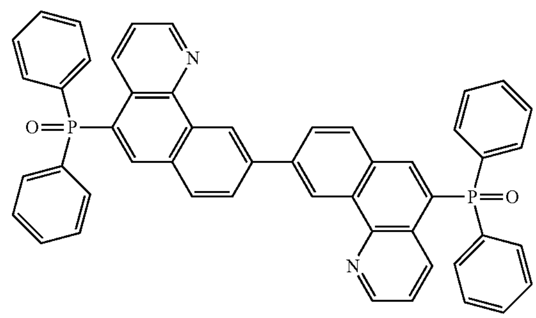
1-246
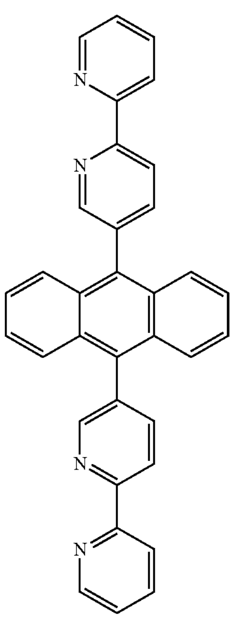
1-247
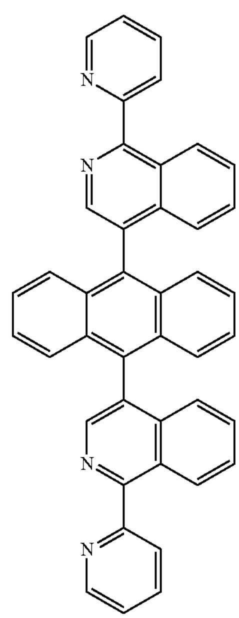

-continued
1-248
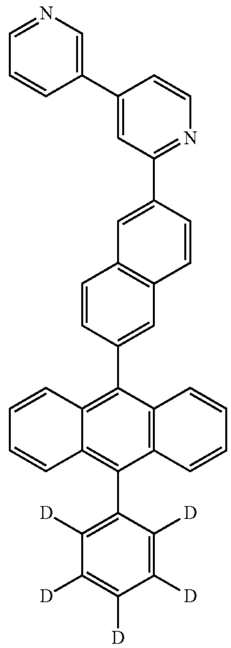
1-249
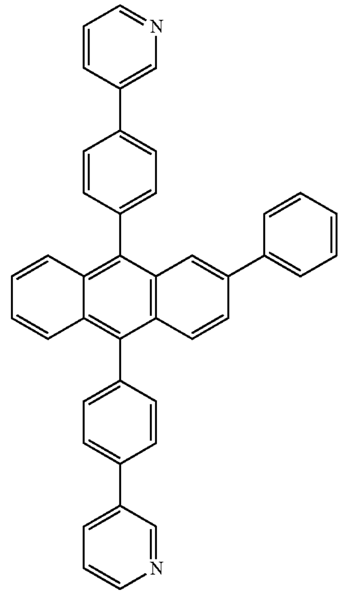
1-250
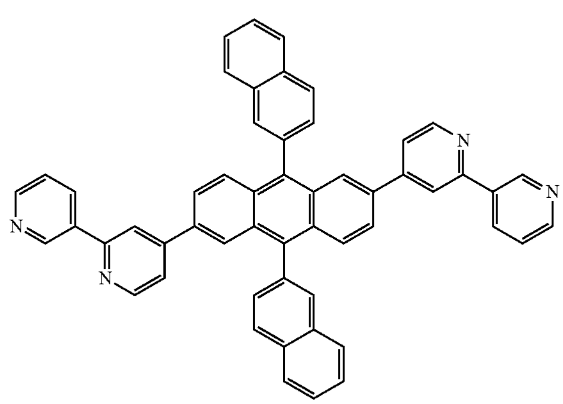
1-251
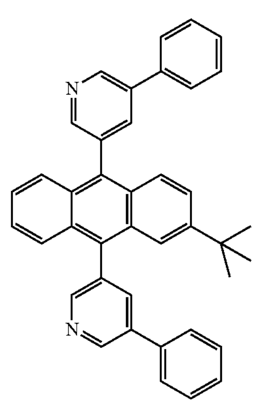

-continued
1-252
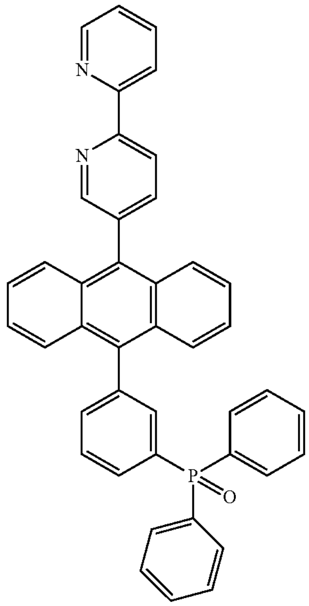
1-253
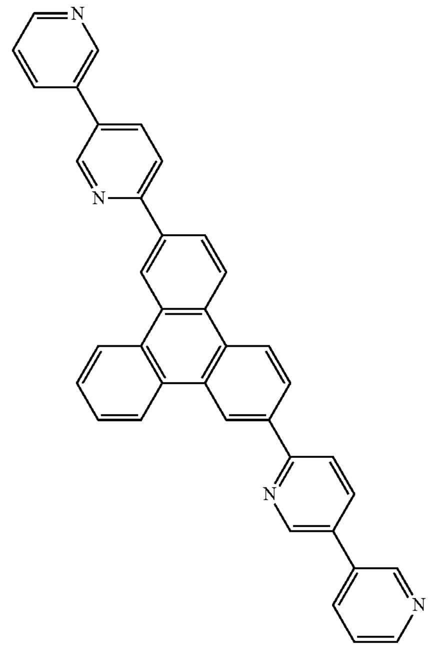
1-255
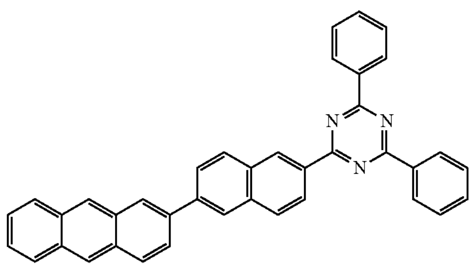
1-254
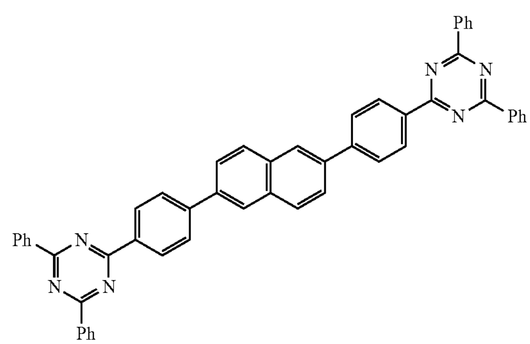
1-256
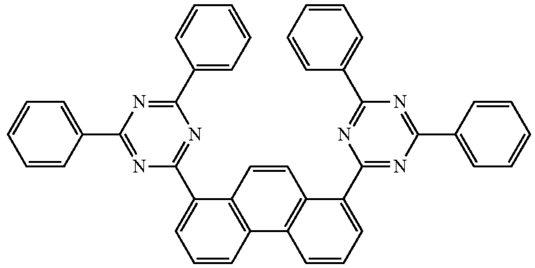
1-257
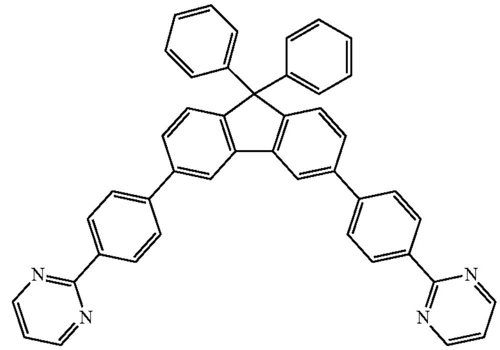

-continued
1-258
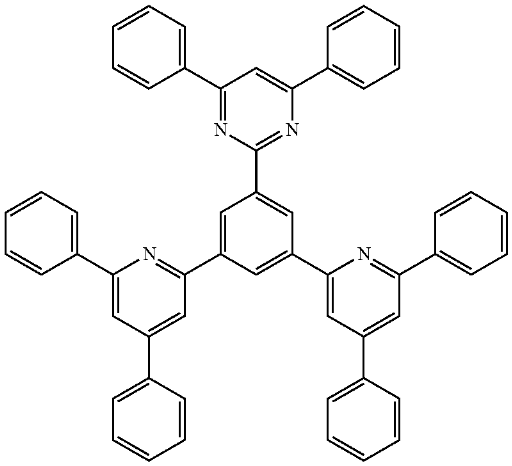
1-259
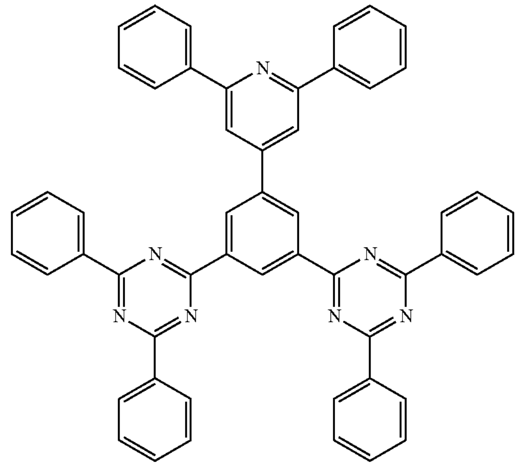
1-260
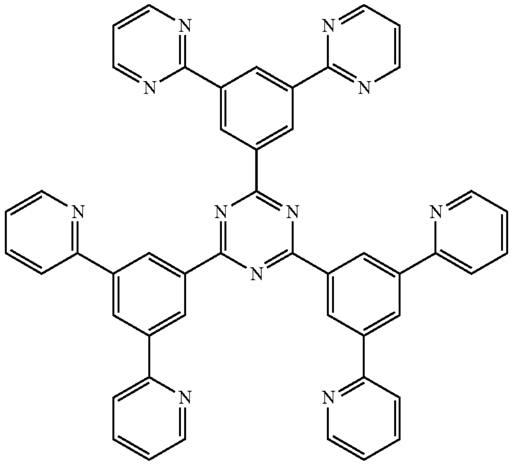
1-261
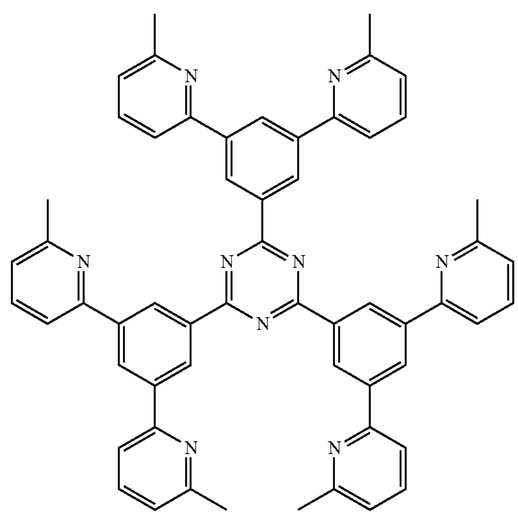
1-262
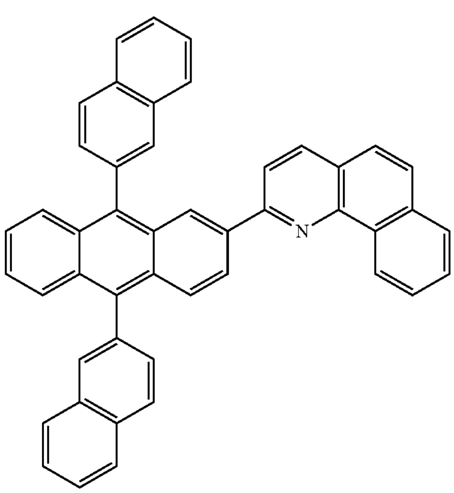
1-263
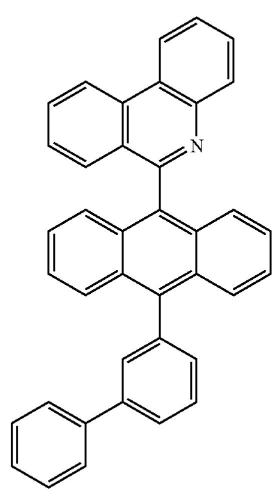

-continued
1-264
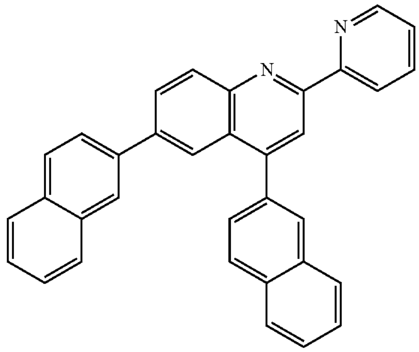
1-265
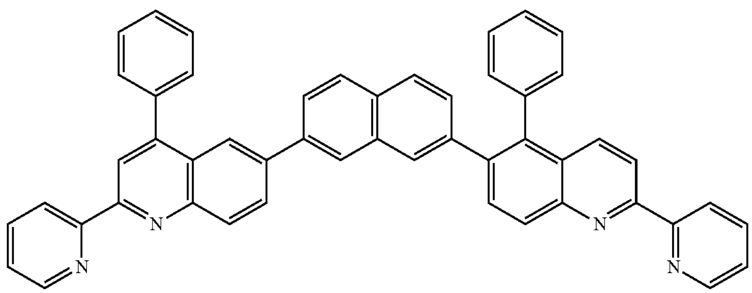
1-266
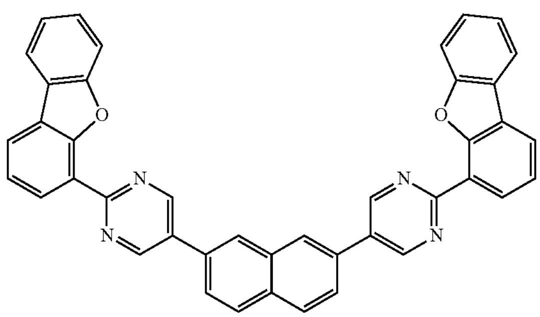
1-267
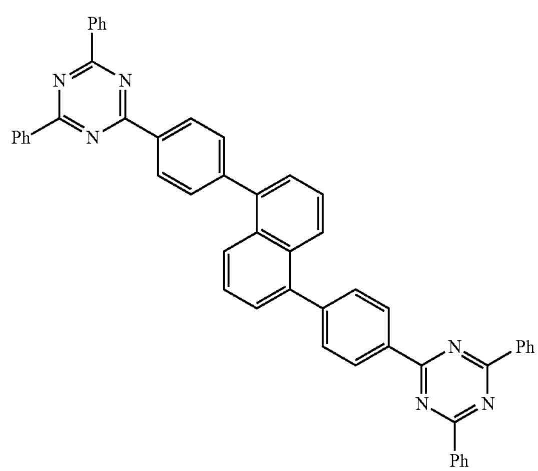

-continued
1-268
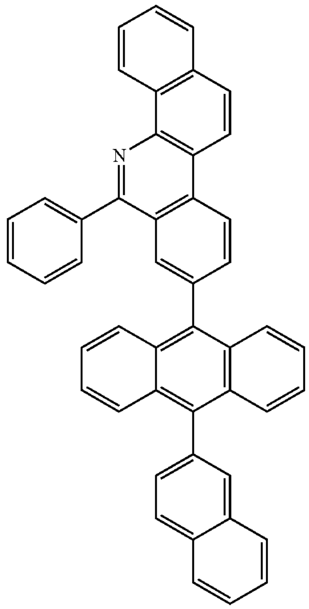
1-269
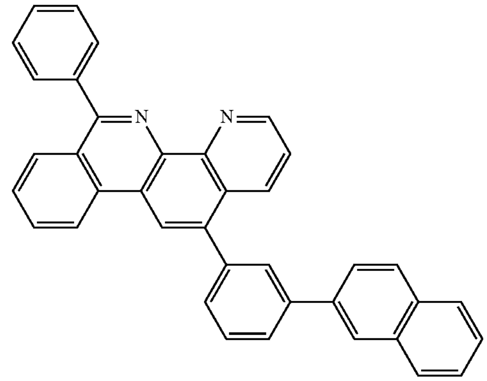
1-270
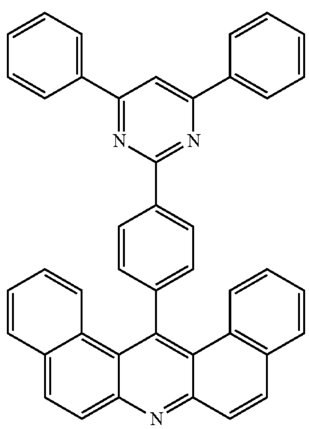
1-271
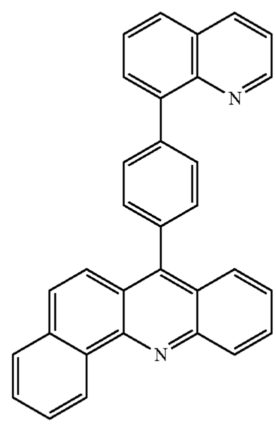
1-272
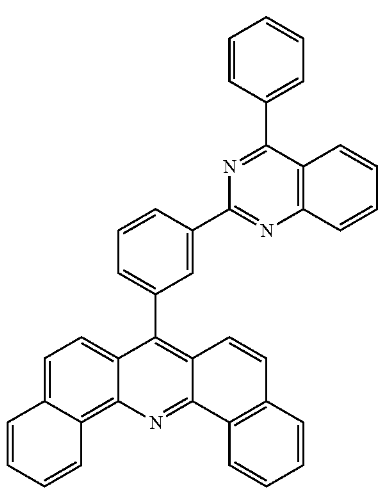
1-273
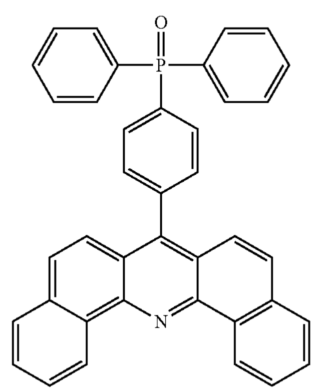

-continued
1-274
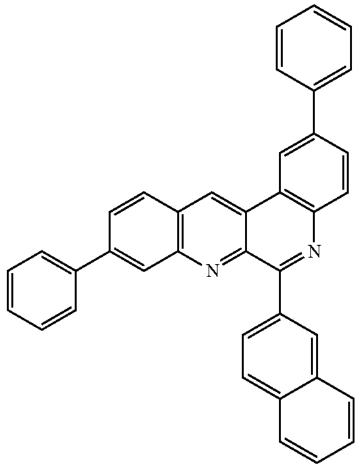
1-275
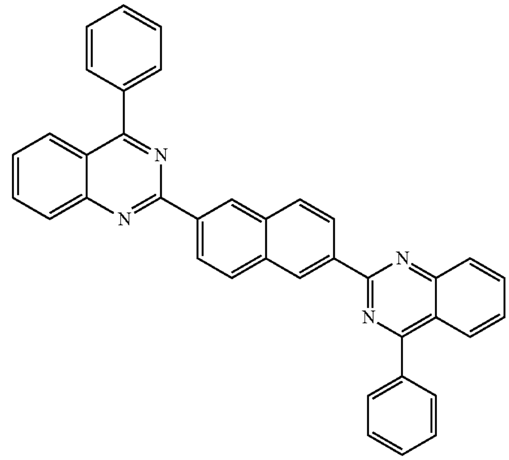
1-276
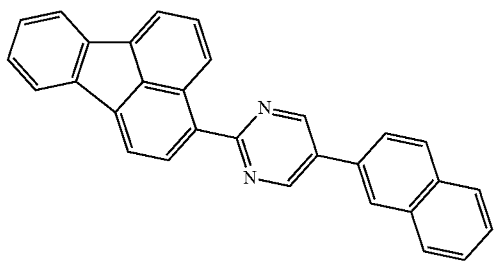
1-277
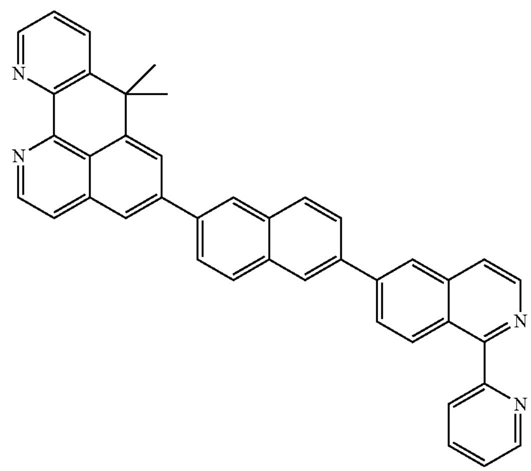
1-278
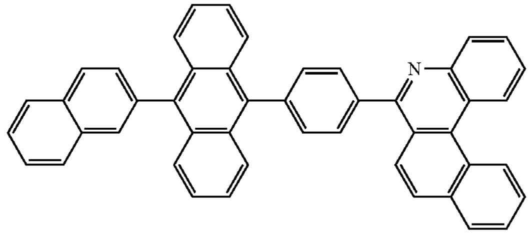
1-279
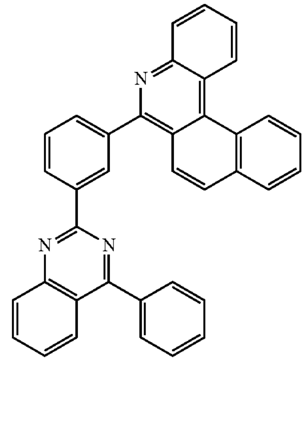

-continued
1-280
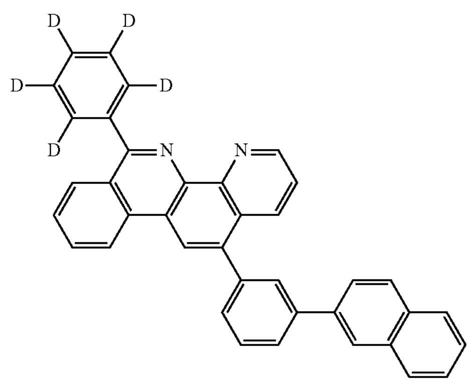
1-281
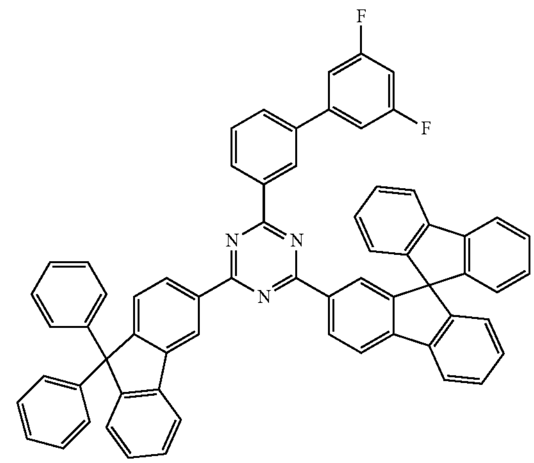
1-282
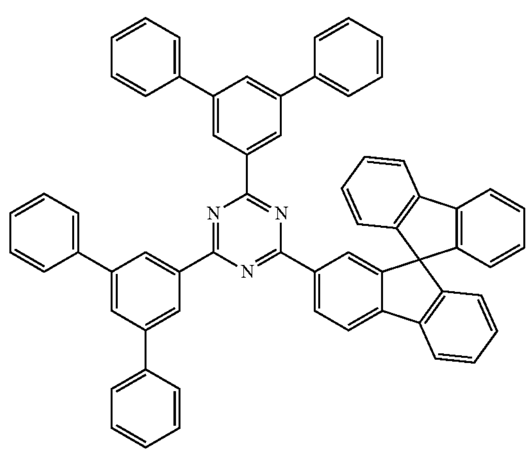
1-283
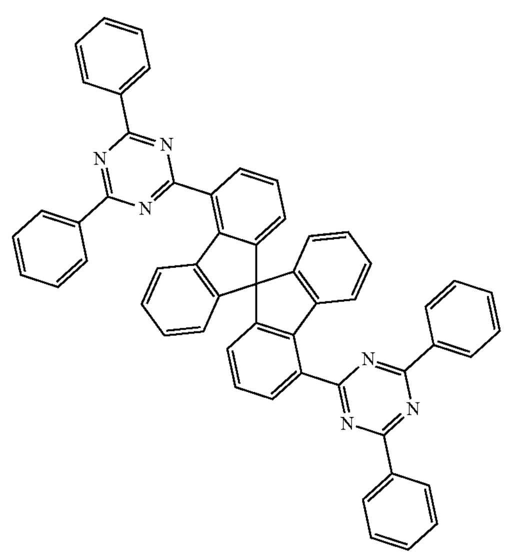
1-284
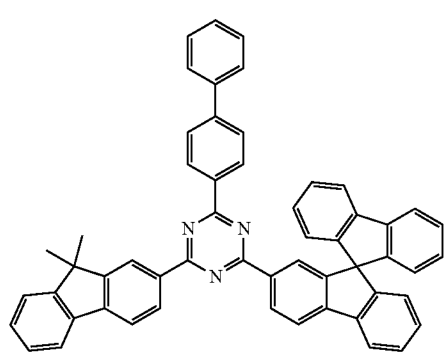
1-285
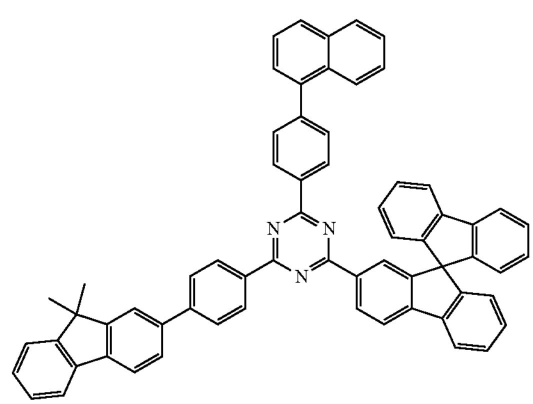

-continued
1-286
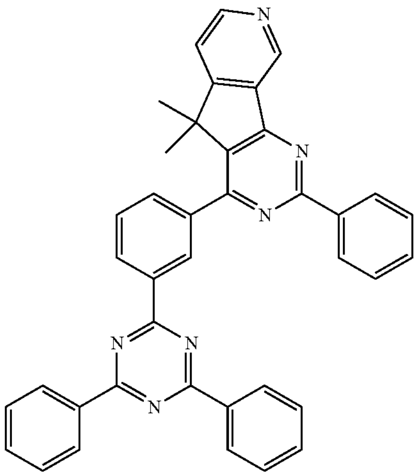
1-287
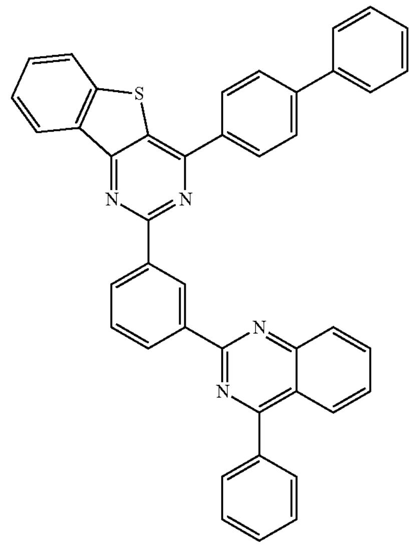
1-288
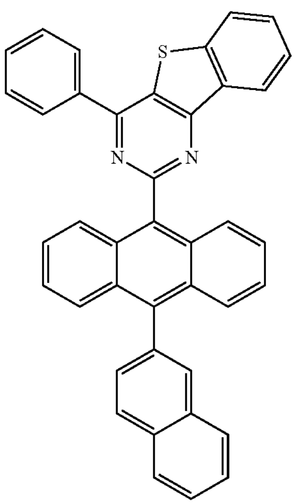
1-289
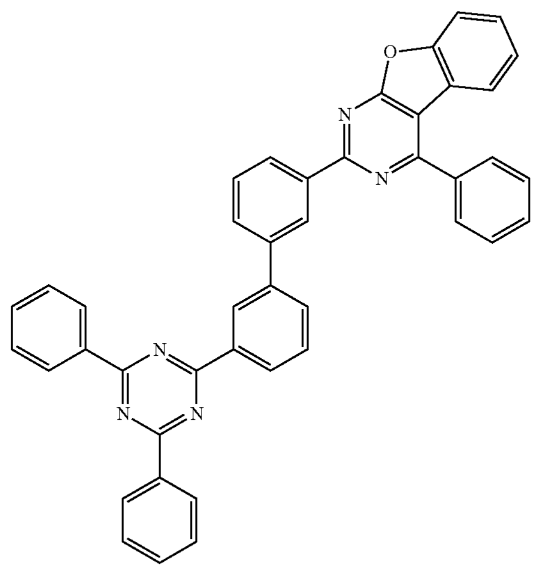
1-290
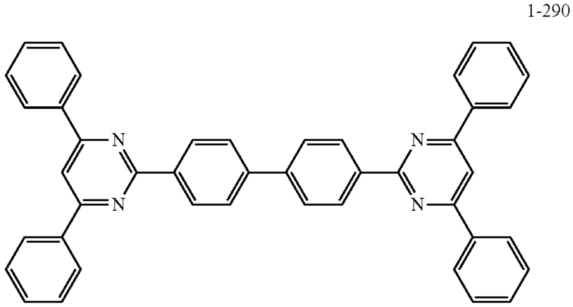
1-291
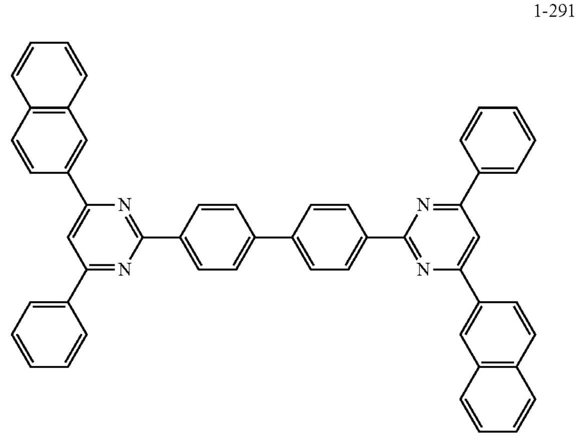

-continued
1-292
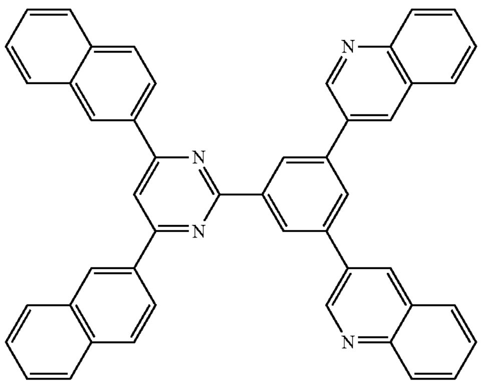
1-293
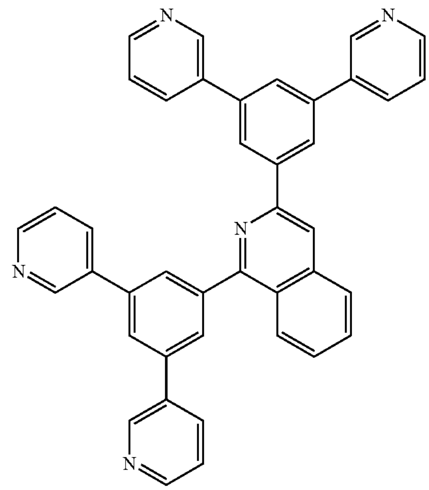
1-294
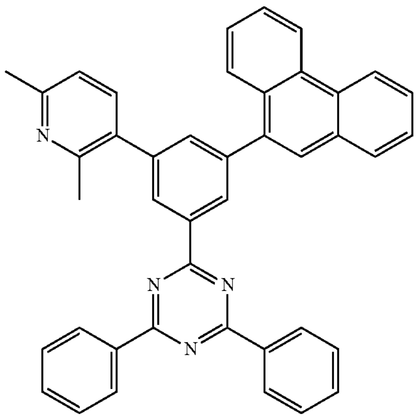
1-295
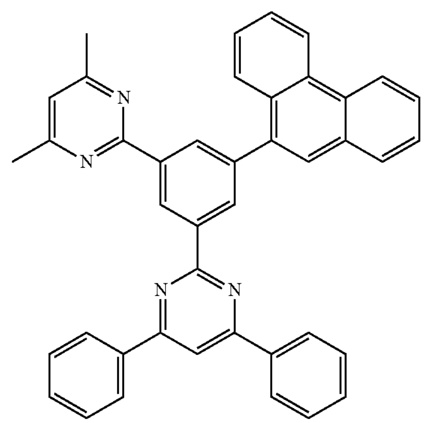
1-296
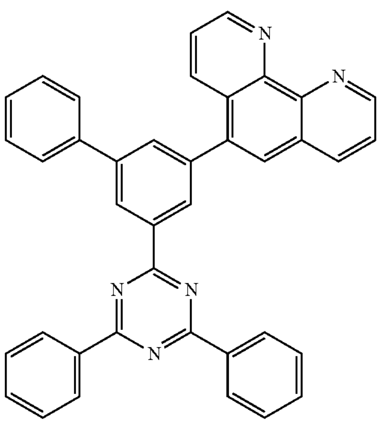
1-297
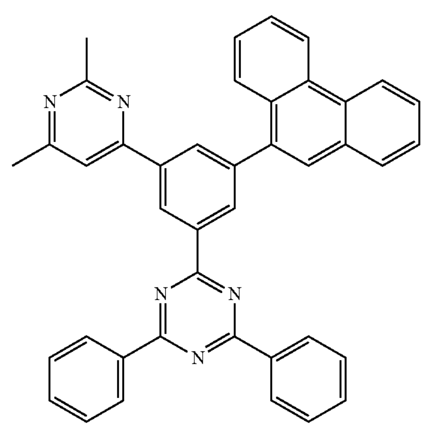

-continued
1-298
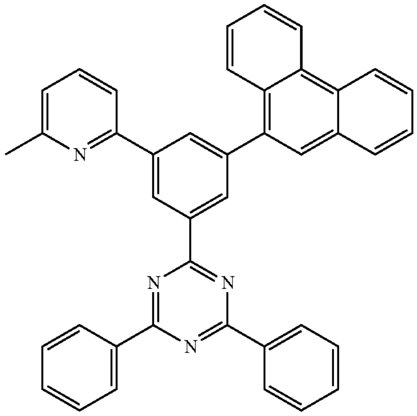
1-299
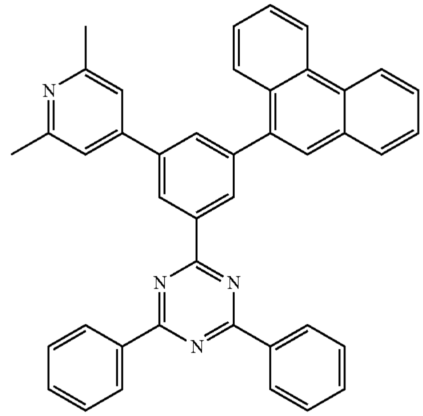
1-300
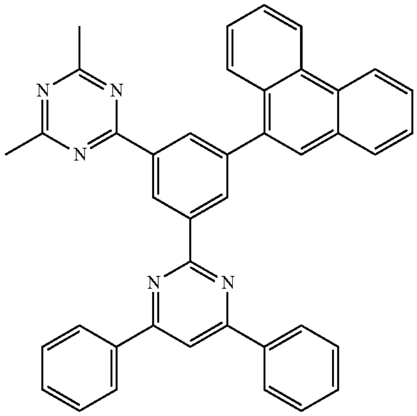
1-301
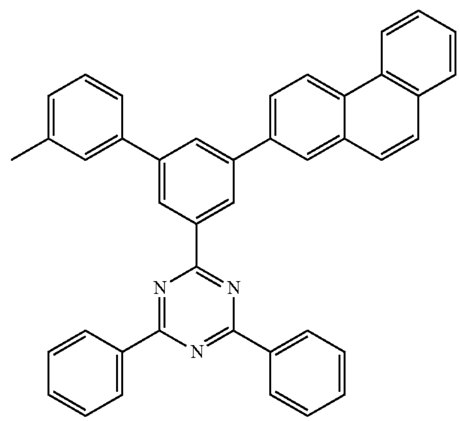
1-302
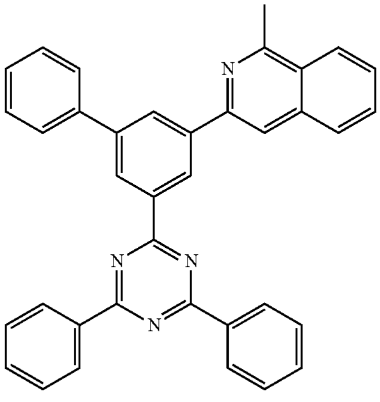
1-303
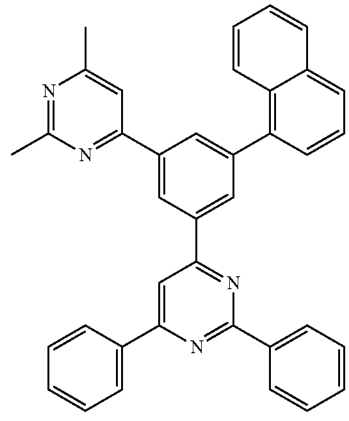

-continued
1-304
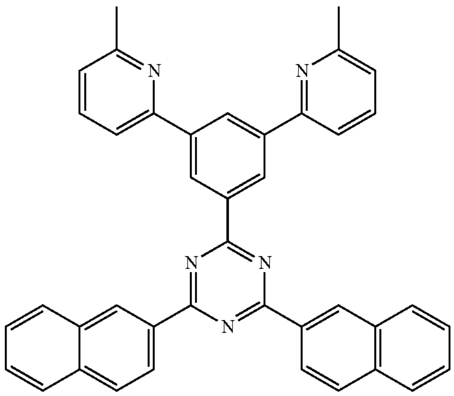
1-305
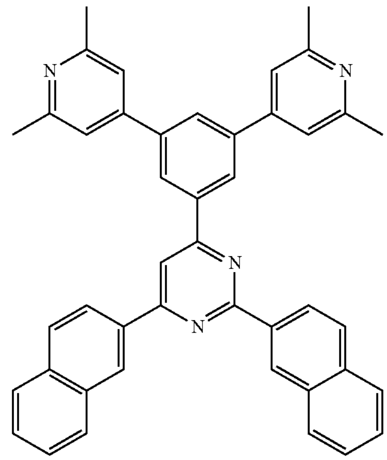
1-306
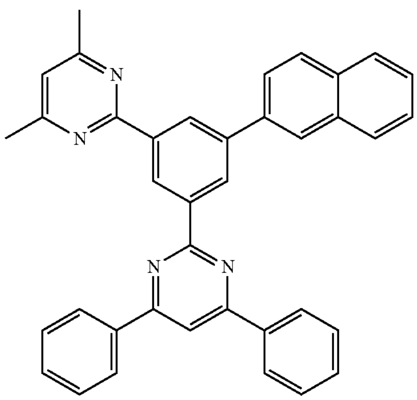
1-307
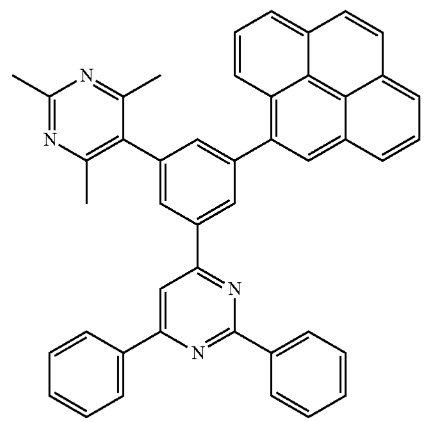
1-308
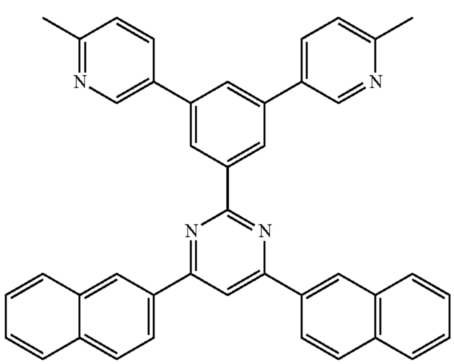
1-309
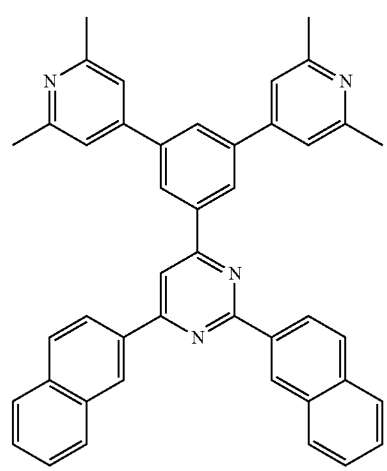

-continued
1-310
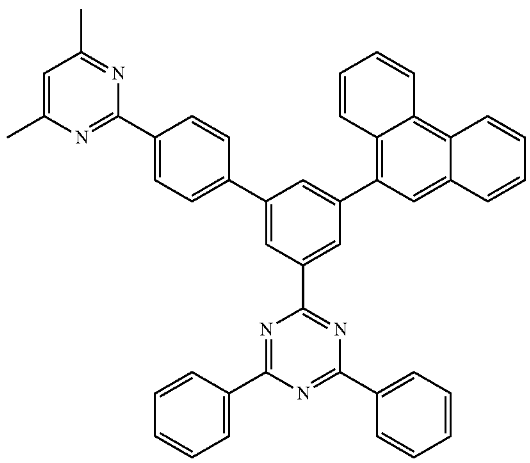
1-311
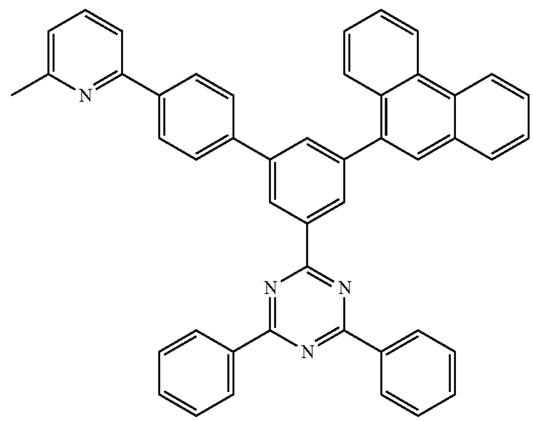
1-312
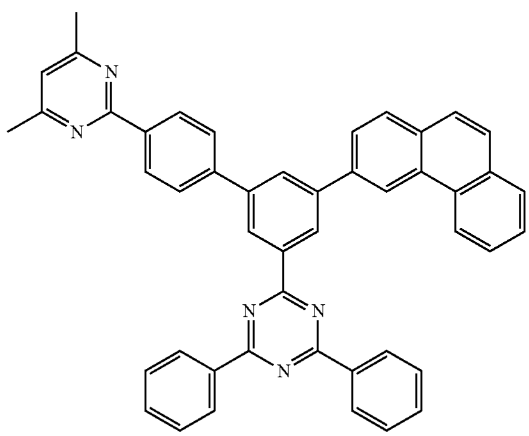
1-313
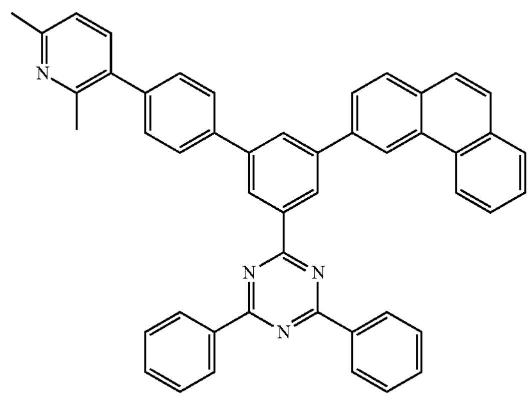
1-314
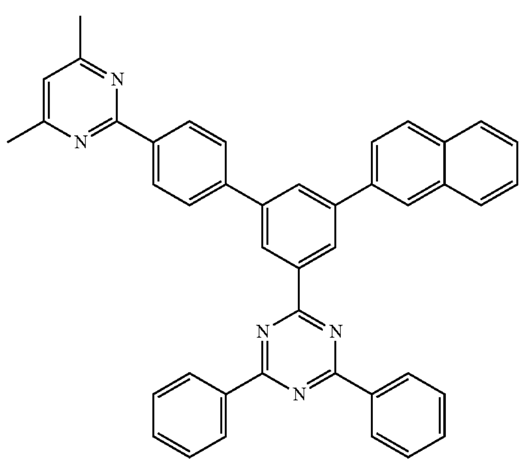
1-315
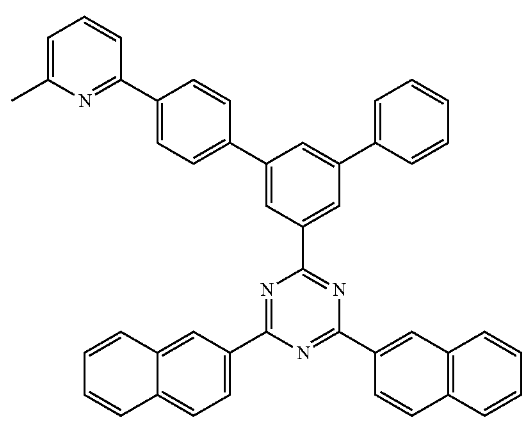

-continued
1-316
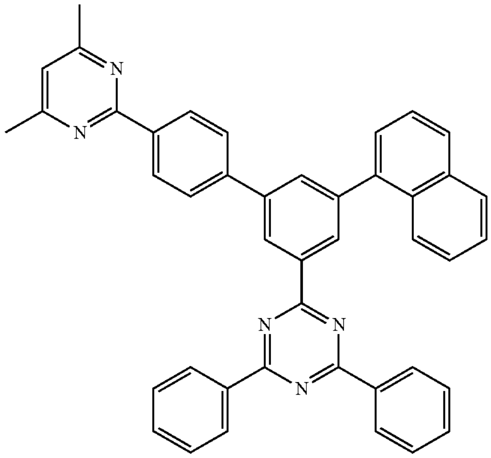
1-317
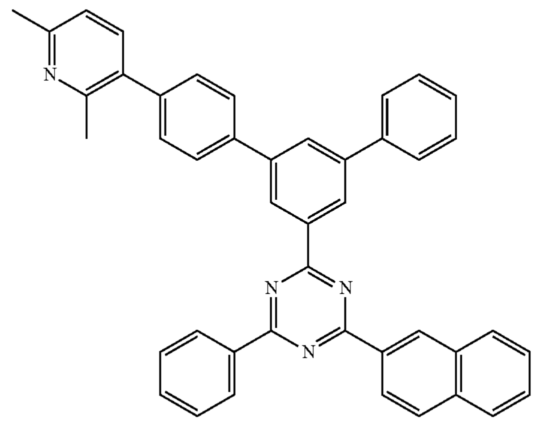
1-318
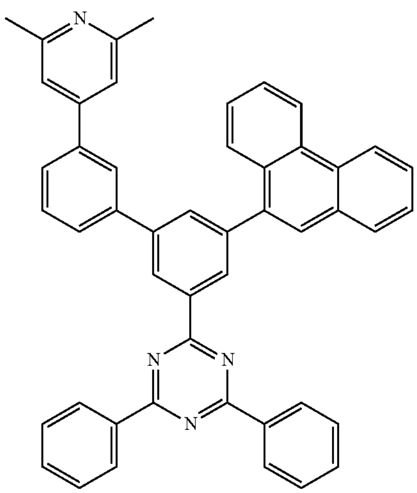
1-319
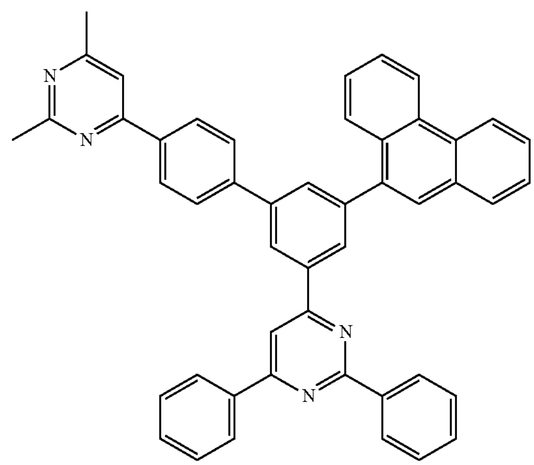
1-320
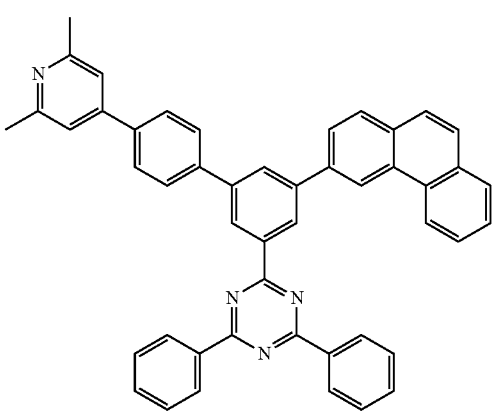
1-321
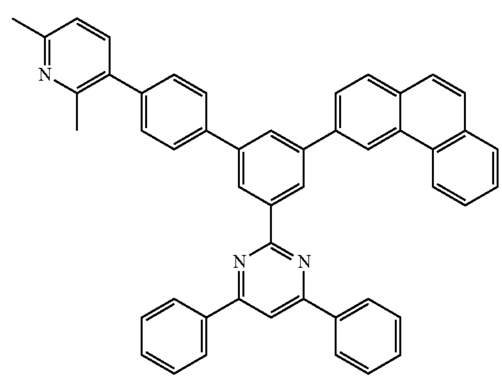

-continued
1-322
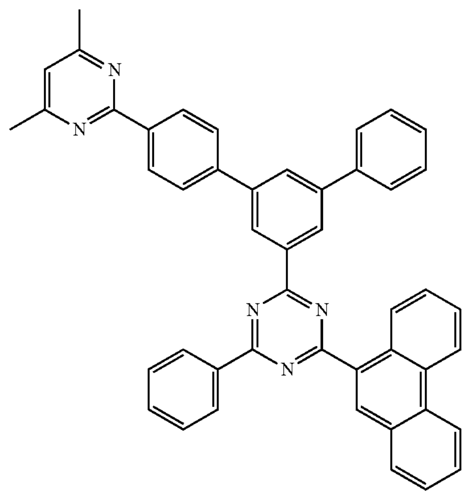
1-323
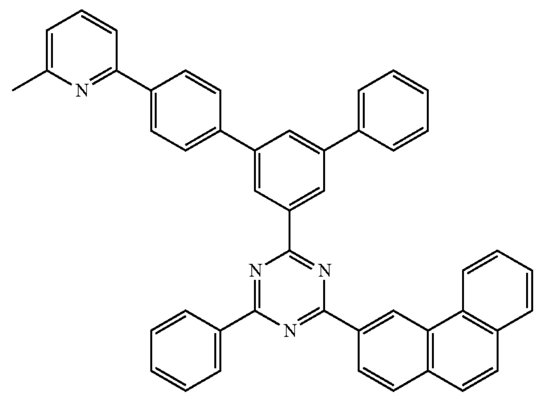
1-324
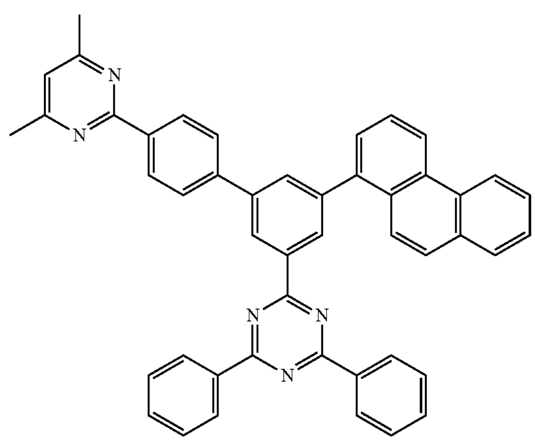
1-325
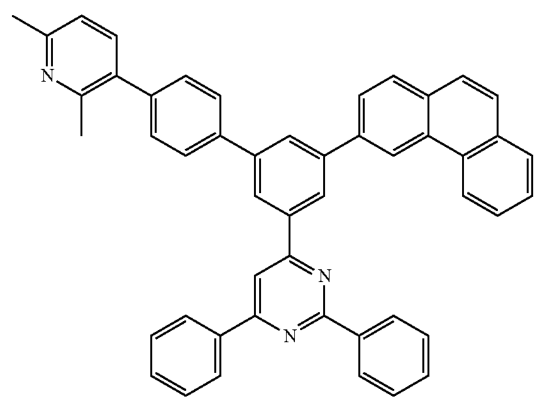
1-326
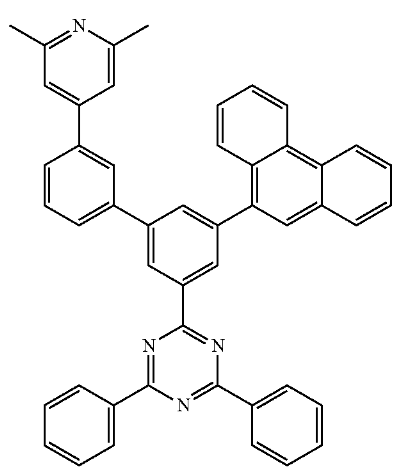
1-327
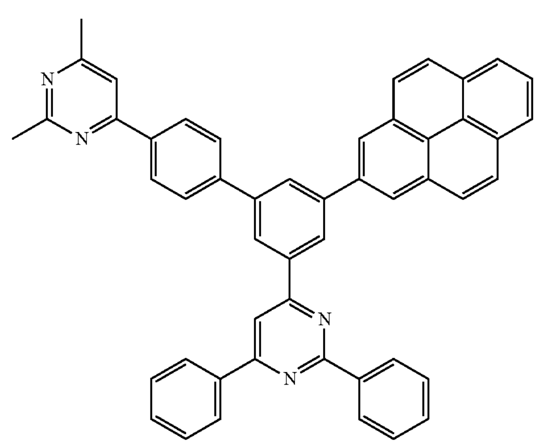

-continued
1-328
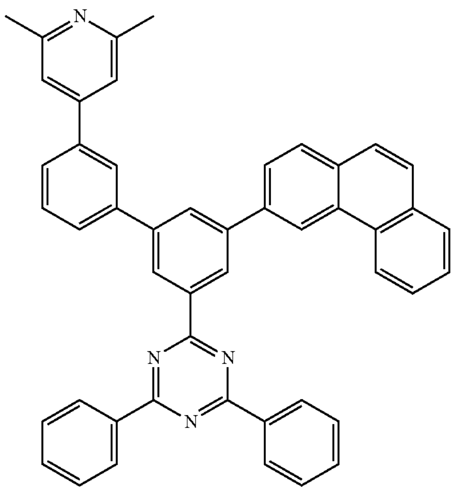
1-329
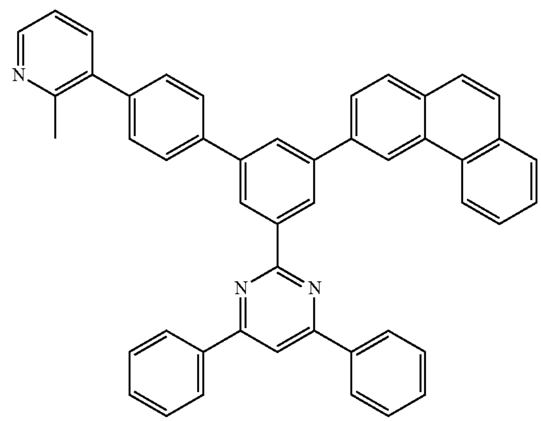
In one or more embodiments, the second compound represented by Formula 2A or 2B may be selected from Compounds 2-la to 2-172a and 2-1 to 2-262, but embodiments of the present disclosure are not limited thereto:
2-1a
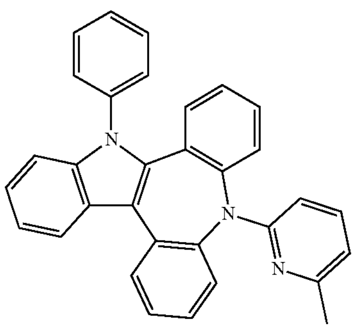
2-2a
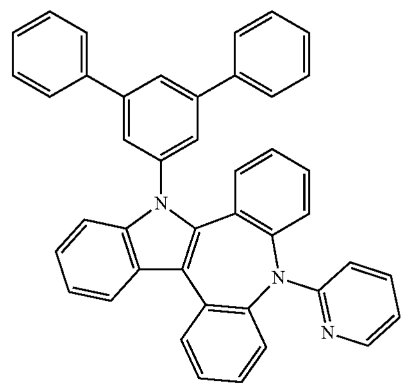
2-3a
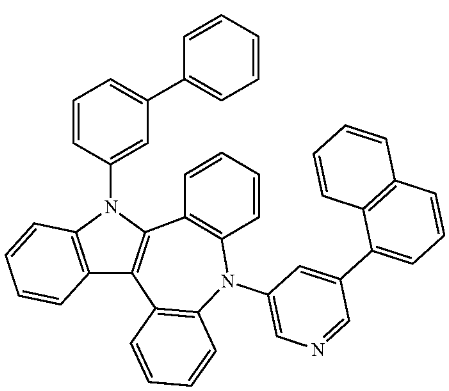
2-4a
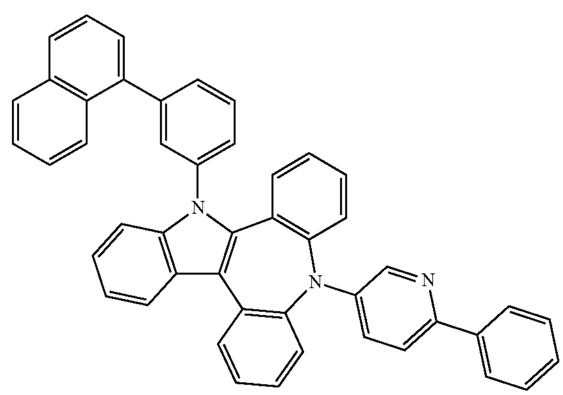

-continued
2-5a
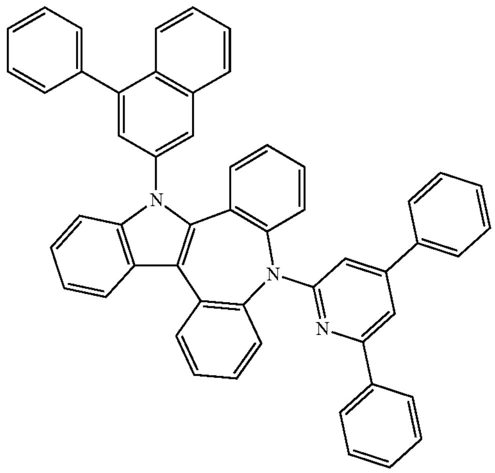
2-6a
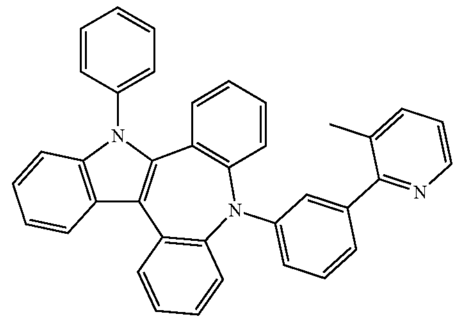
2-7a
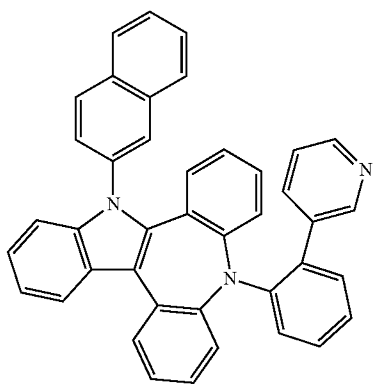
2-8a
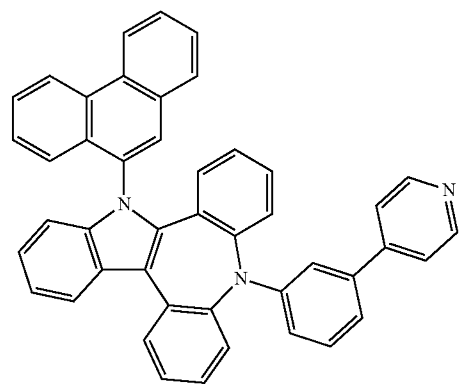
2-9a
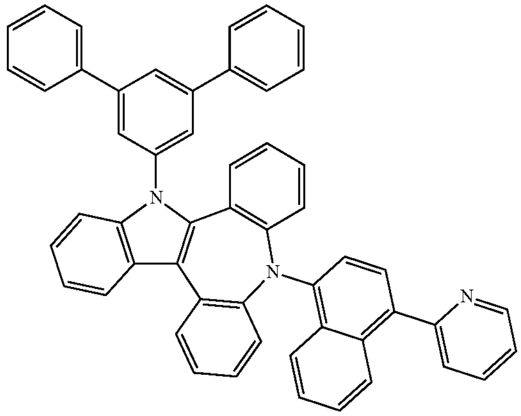
2-10a
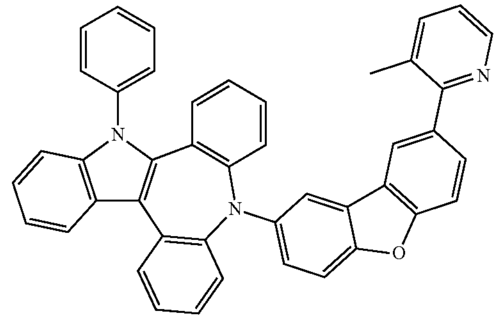

-continued
2-11a
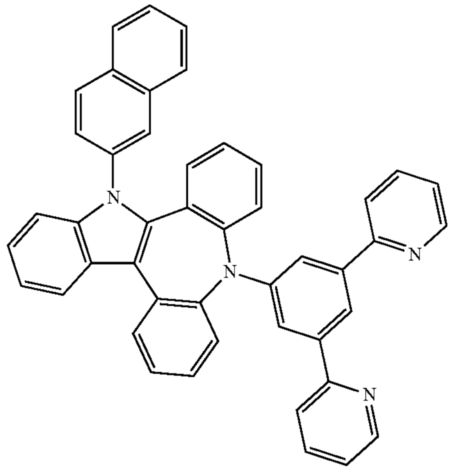
2-12a
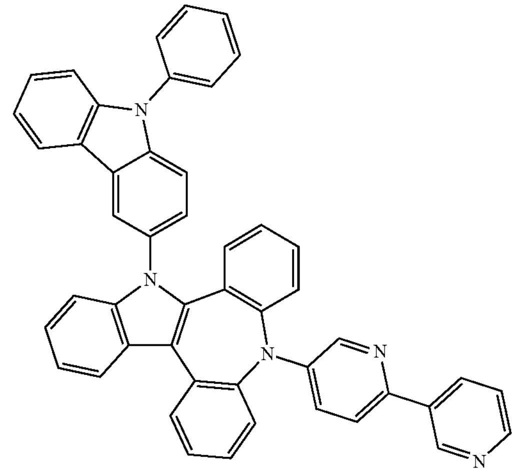
2-13a
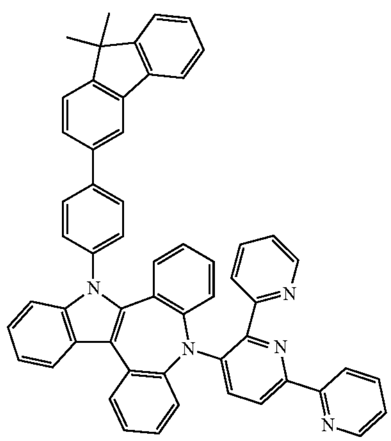
2-14a
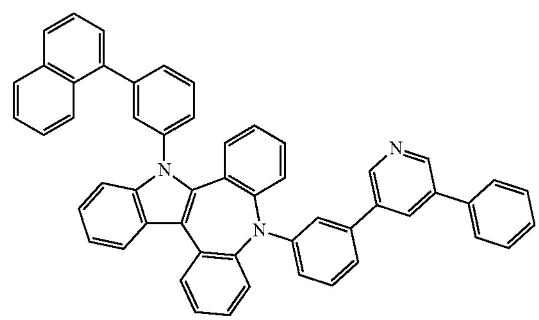
2-15a
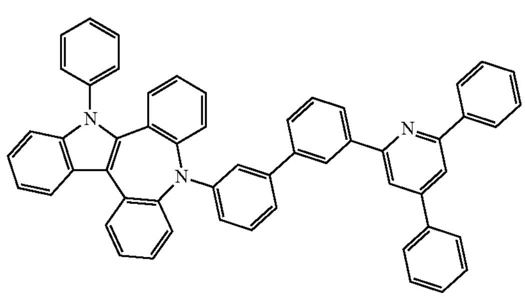
2-16a
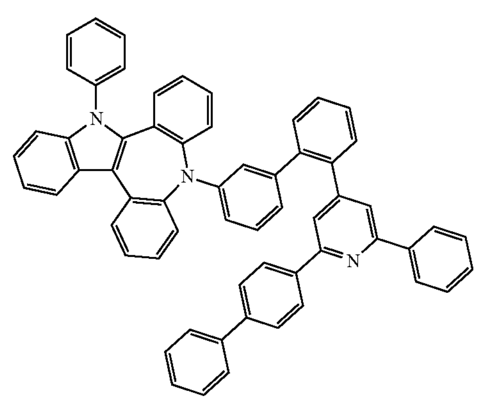

-continued
2-17a
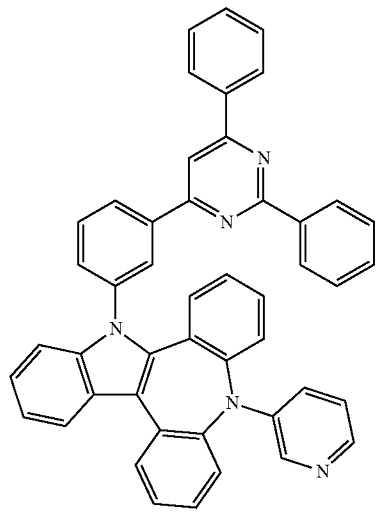
2-18a
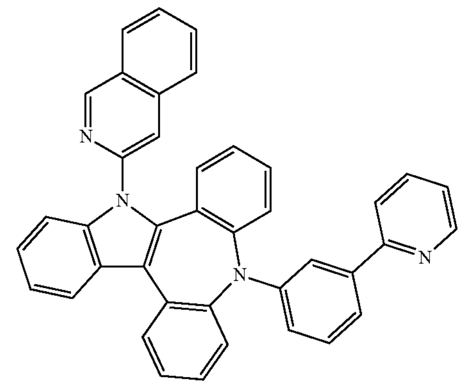
2-19a
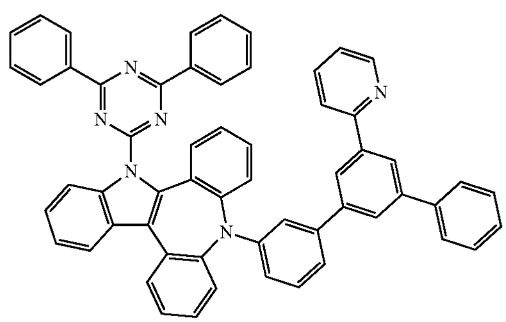
2-20a
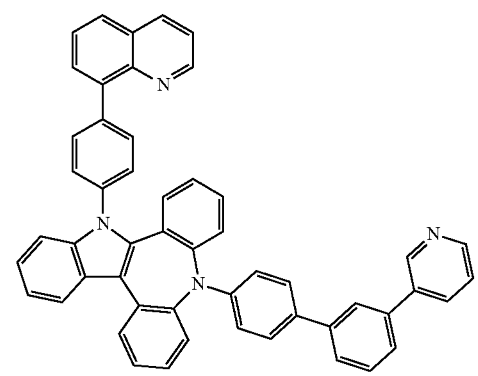
2-21a
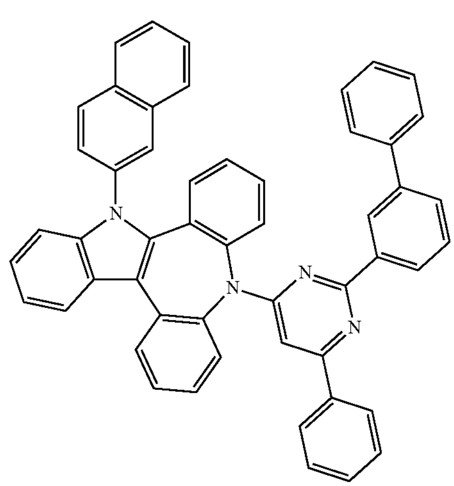
2-22a
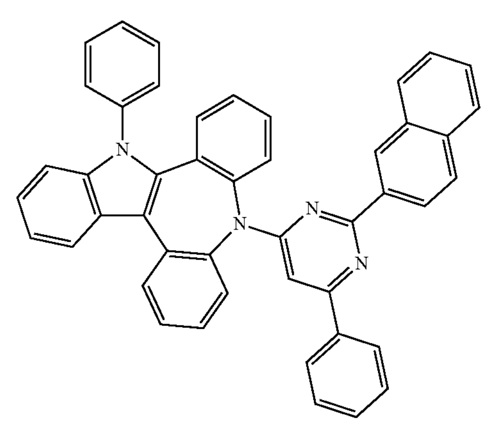

-continued
2-23a
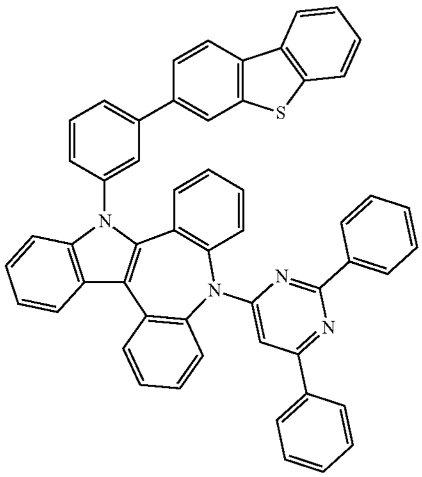
2-24a
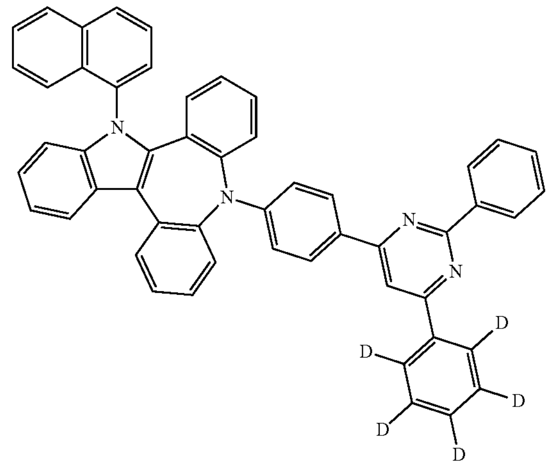
2-25a
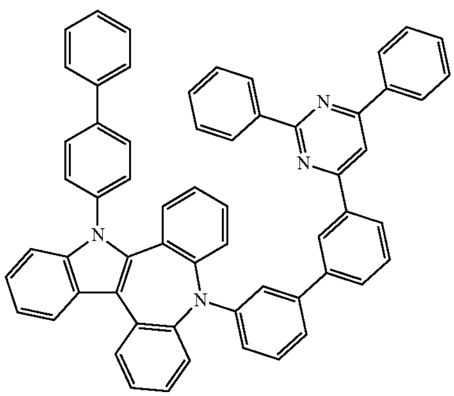
2-26a
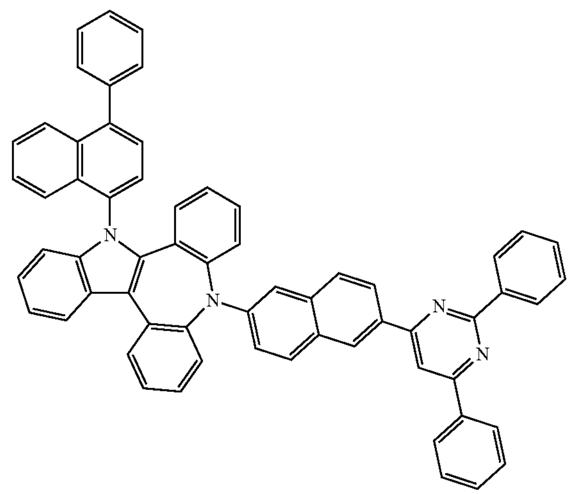
2-27a
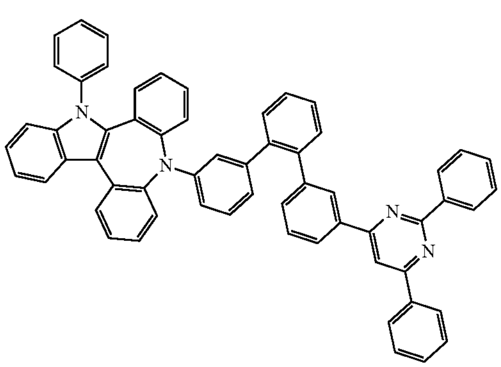
2-28a
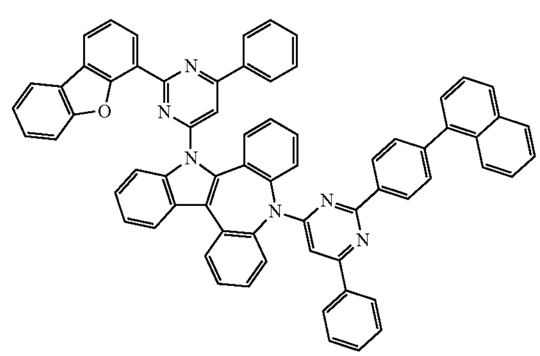

-continued
2-29a
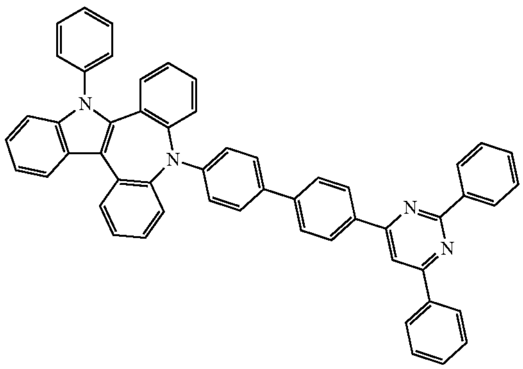
2-30a
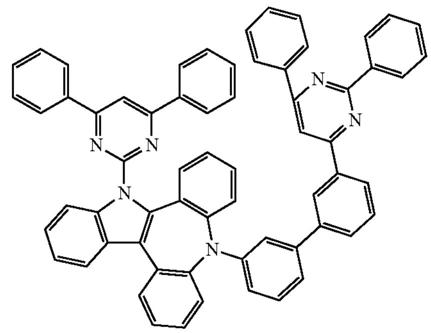
2-31a
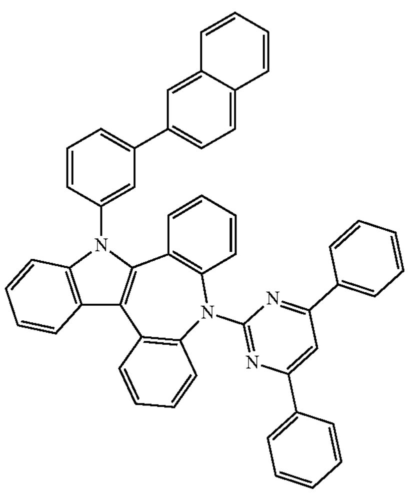
2-32a
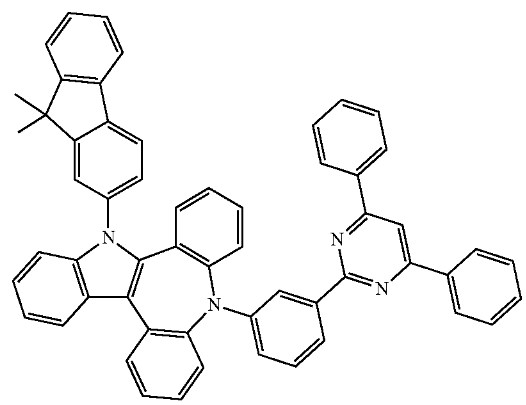
2-33a
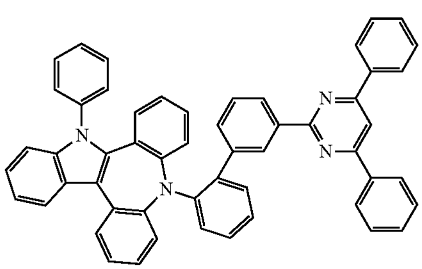
2-34a
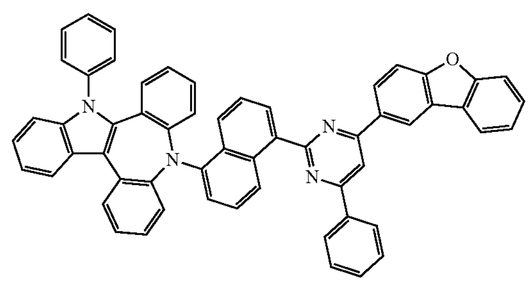
2-35a
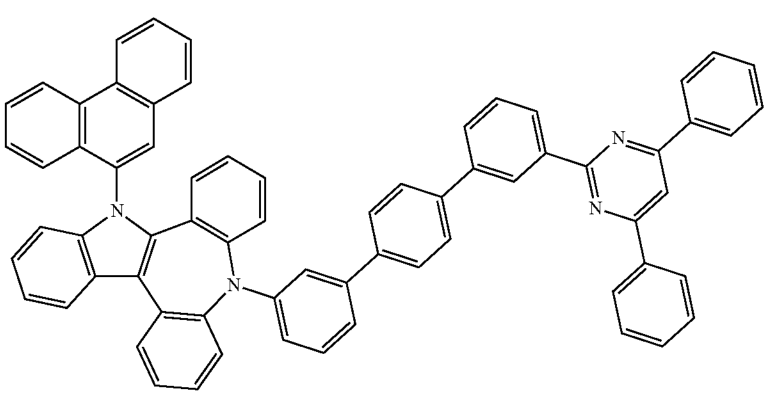

-continued
2-36a
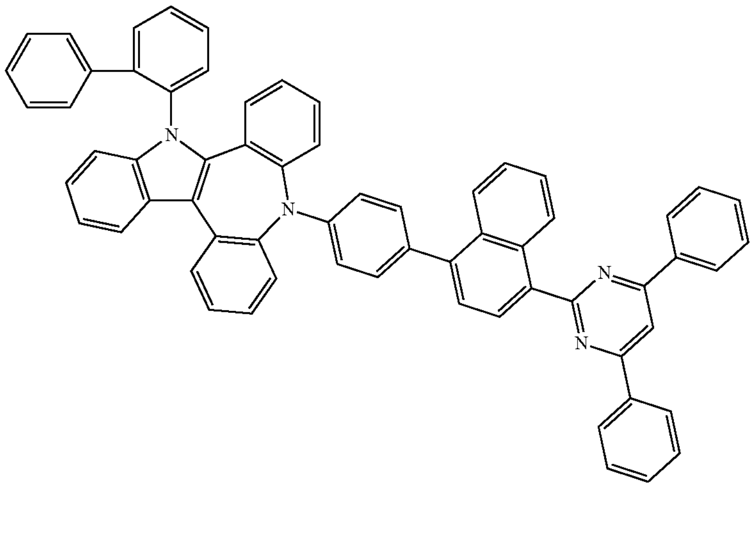
2-37a
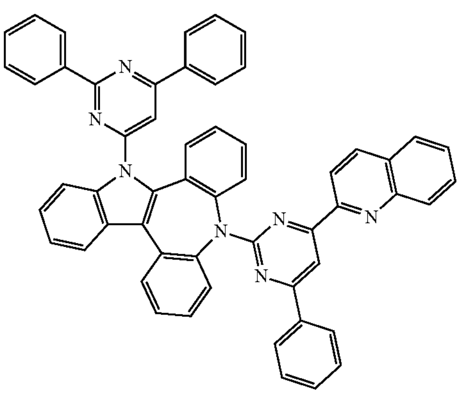
2-38a
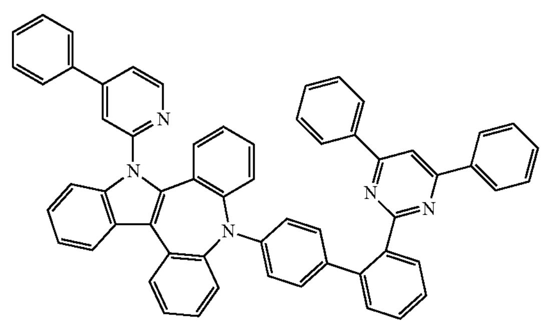
2-39a
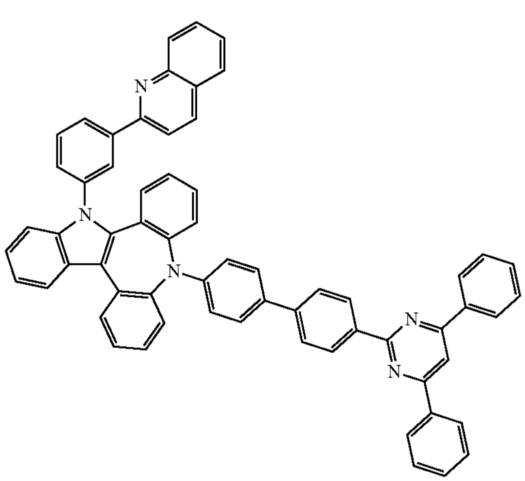
2-40a
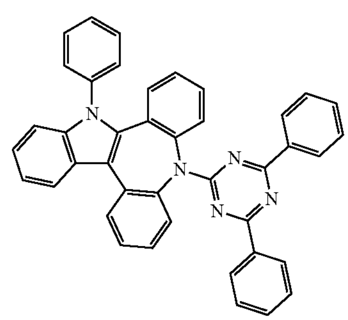

-continued
2-41a
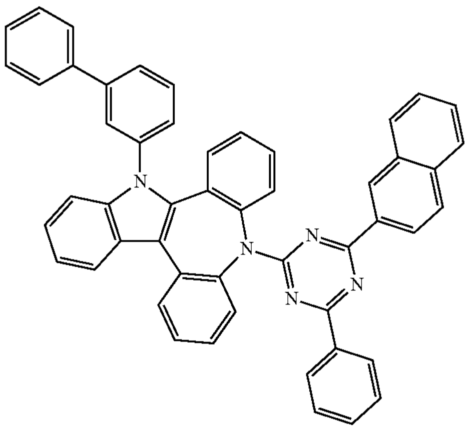
2-42a
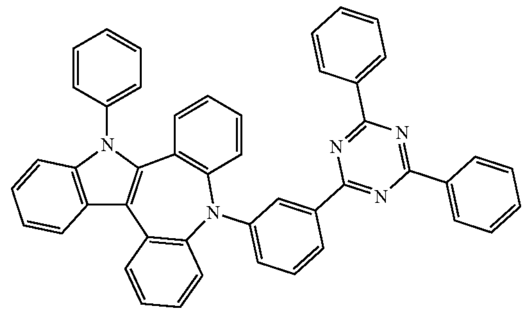
2-43a
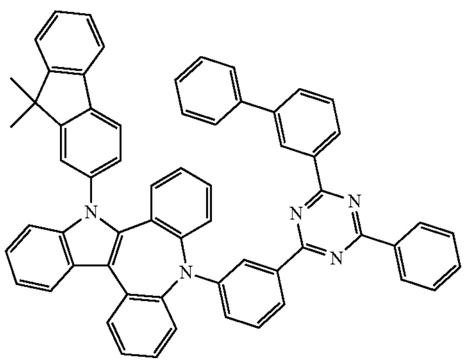
2-44a
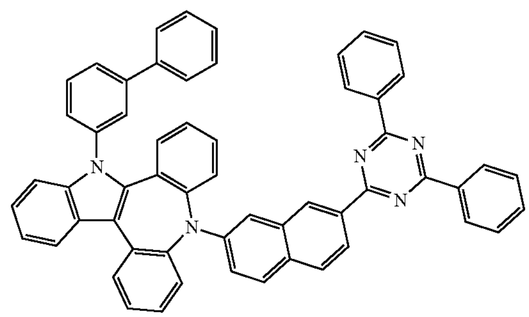
2-45a
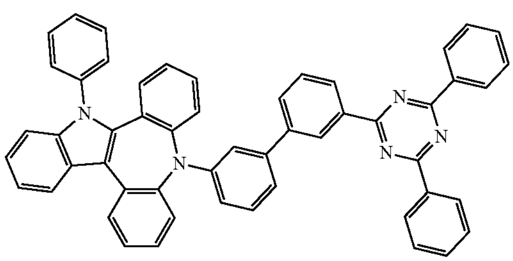
2-46a
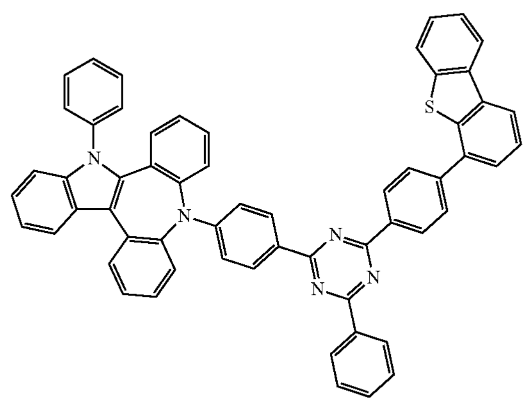
2-47a
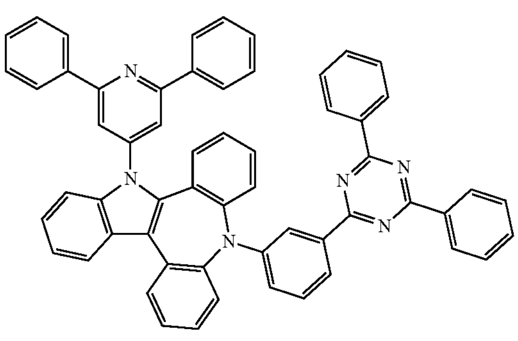

-continued
2-48a
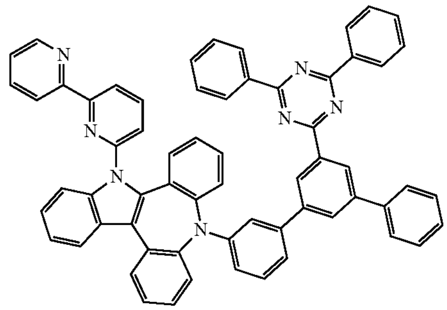
2-49a
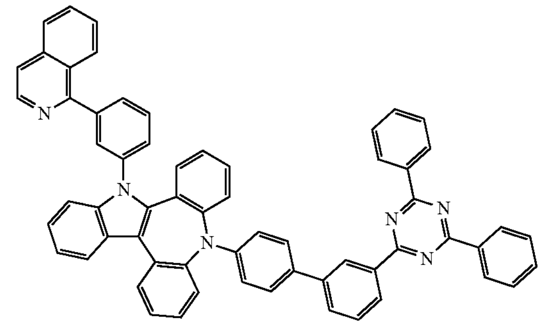
2-50a
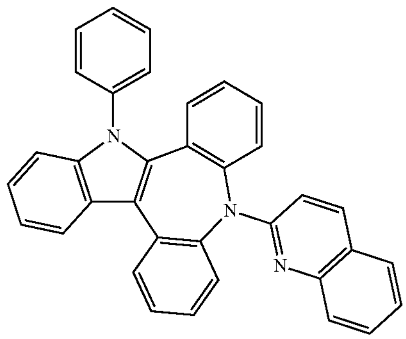
2-51a
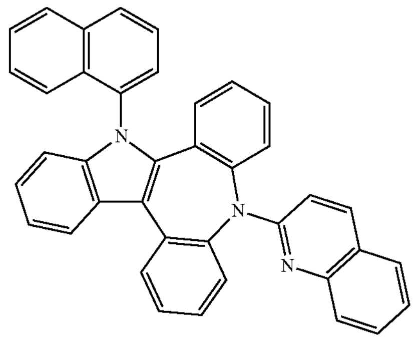
2-52a
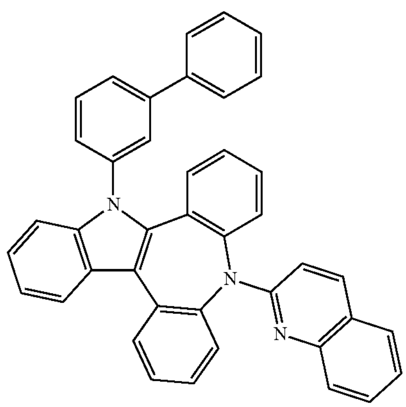
2-53a
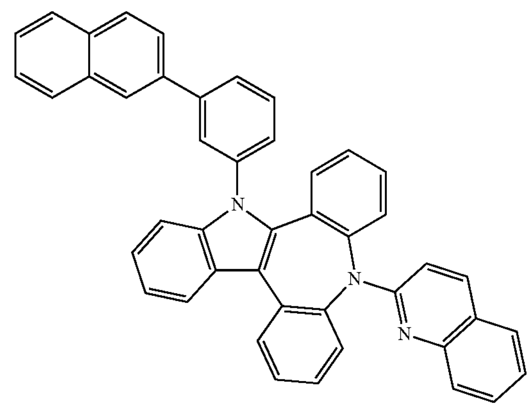
2-54a
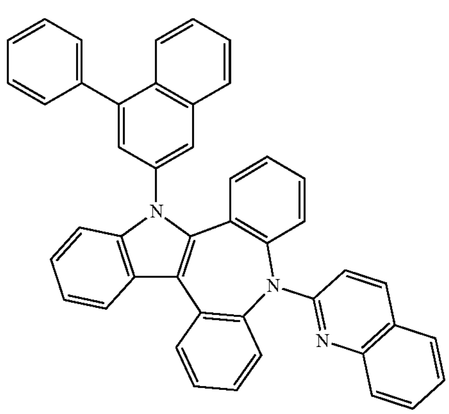
2-55a
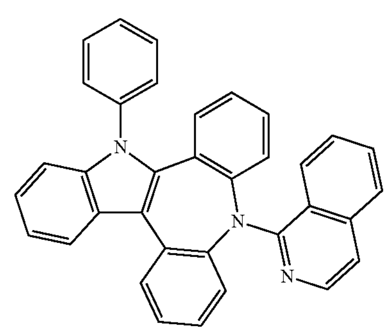

-continued
2-56a
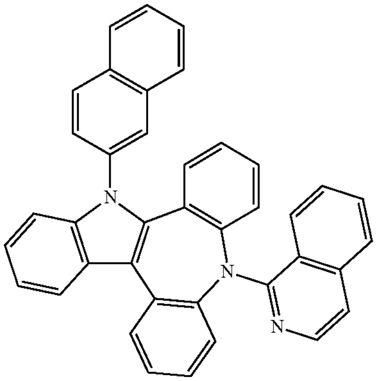
2-57a
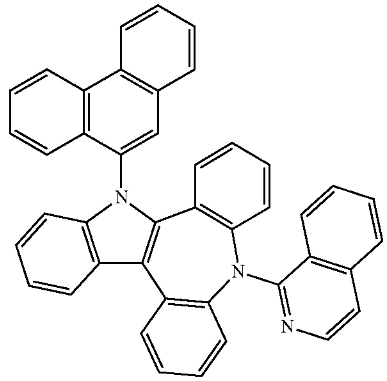
2-58a
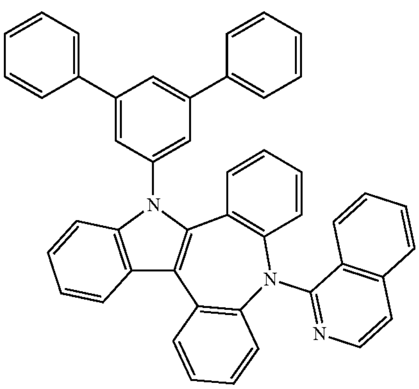
2-59a
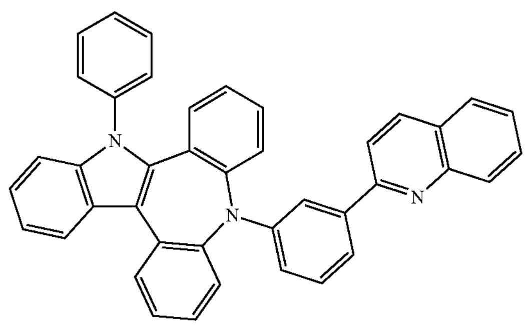
2-60a
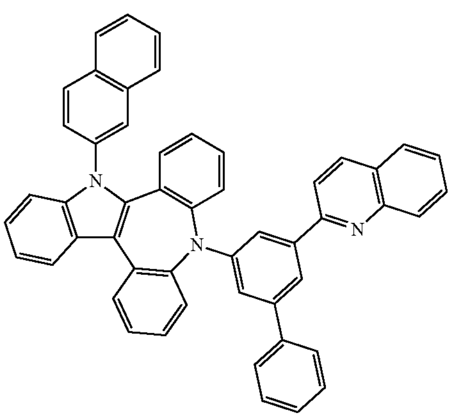
2-61a
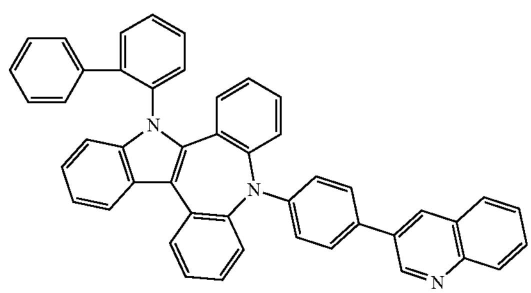

-continued
2-62a
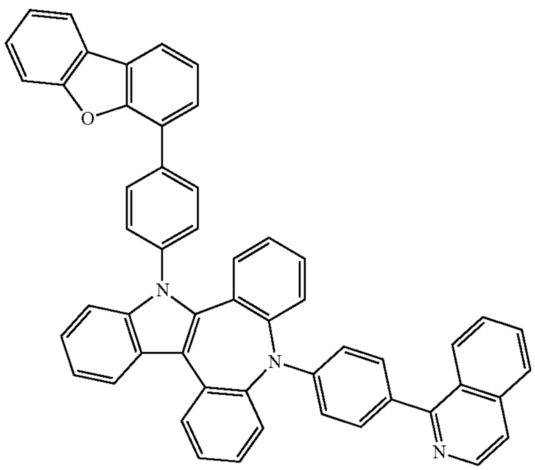
2-63a
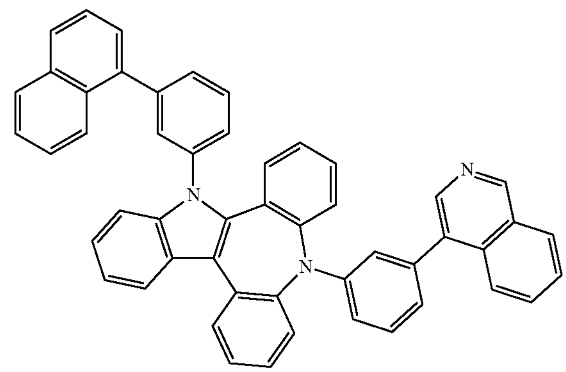
2-64a
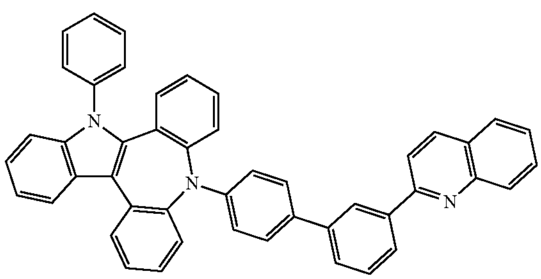
2-65a
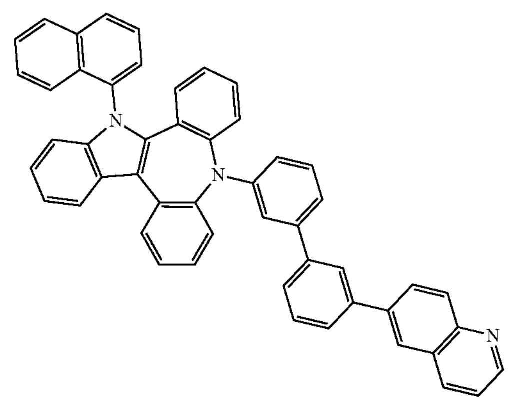
2-66a
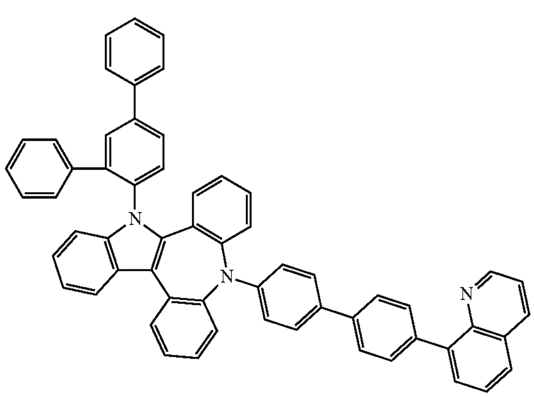
2-67a
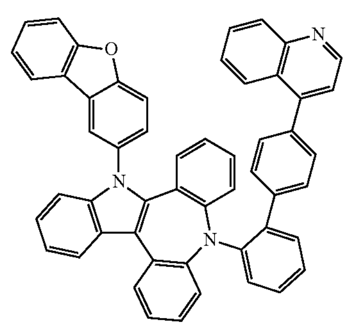

-continued
2-68a
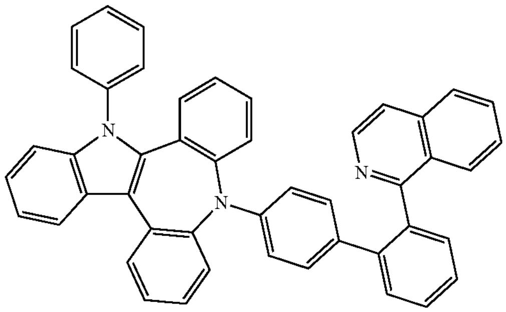
2-69a
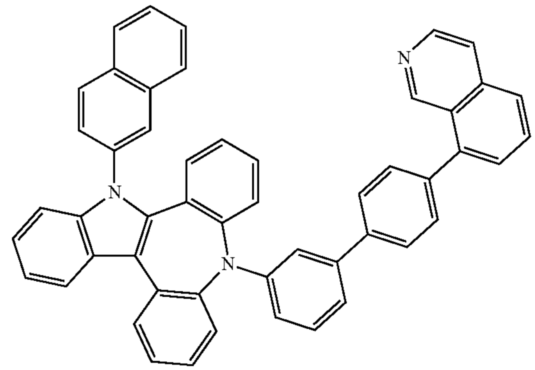
2-70a
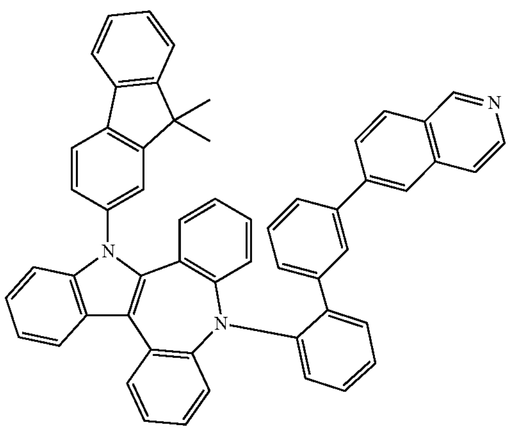
2-71a
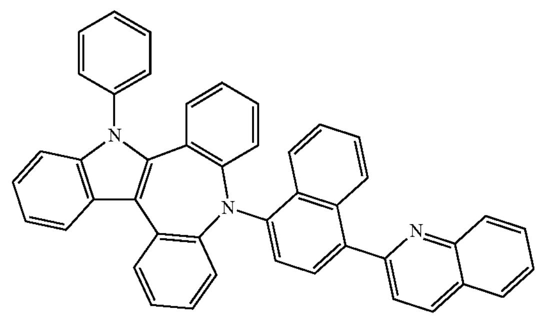
2-72a
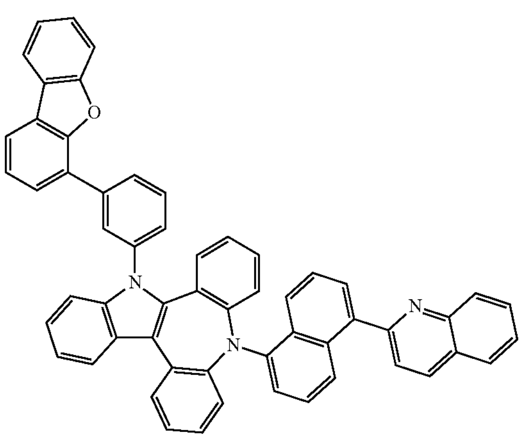
2-73a
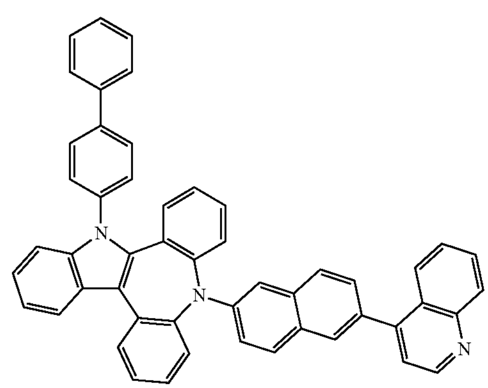

-continued
2-74a
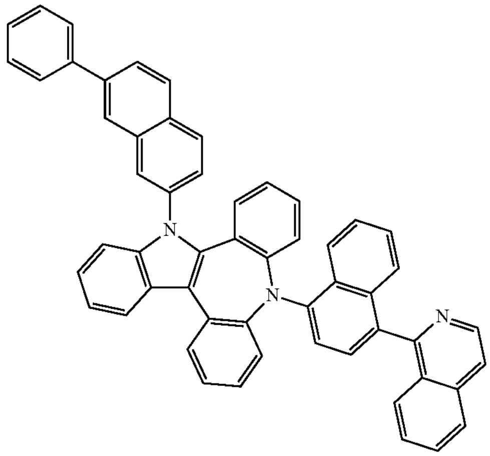
2-75a
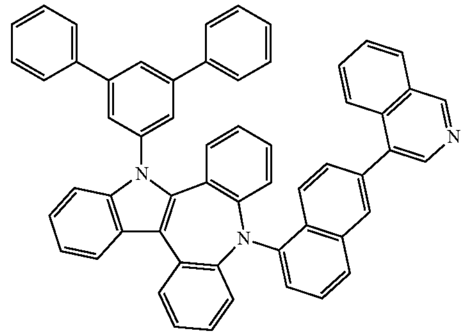
2-76a
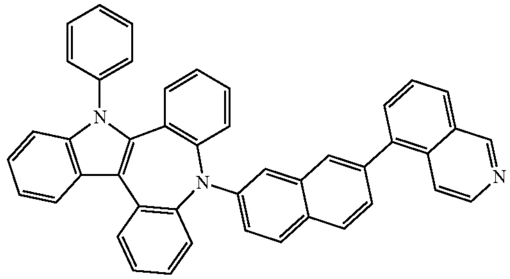
2-77a
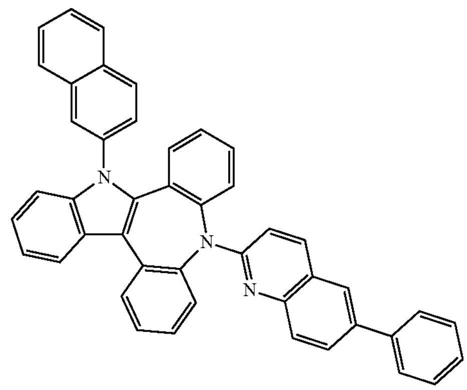
2-78a
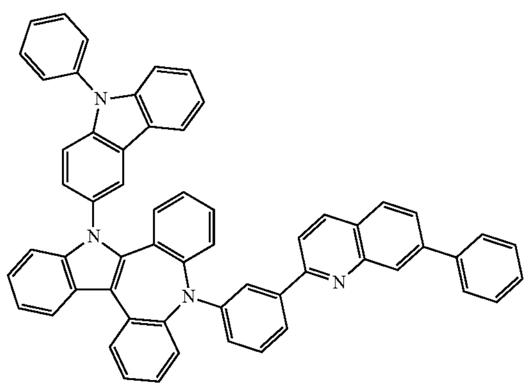
2-79a
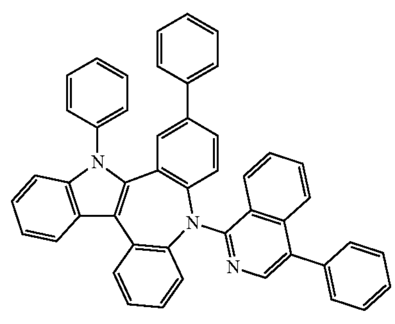
2-80a
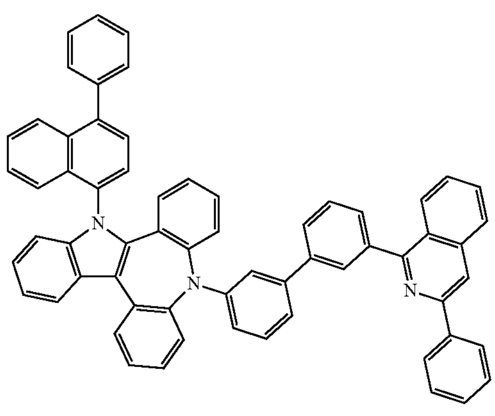
2-81a
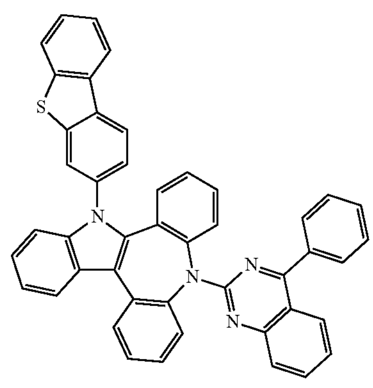

-continued
2-82a
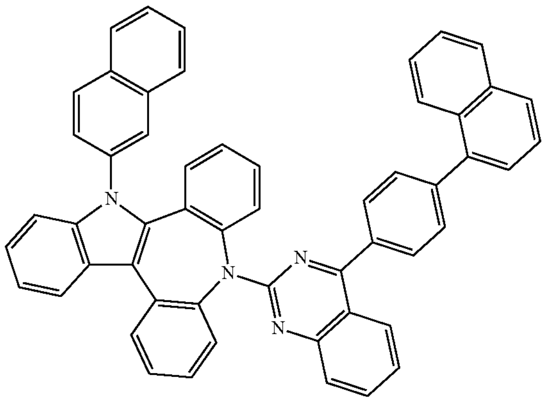
2-83a
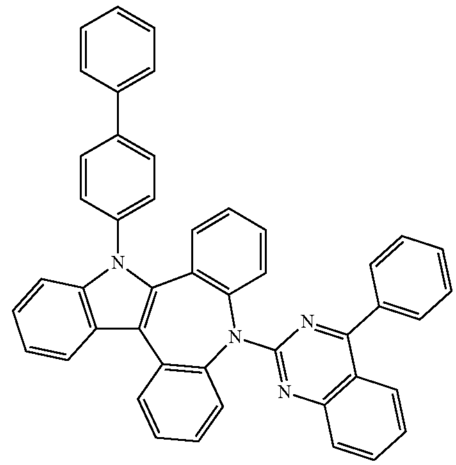
2-84a
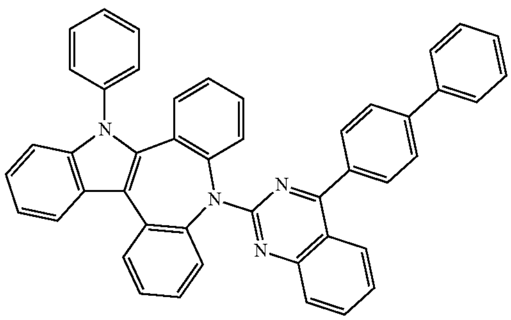
2-85a
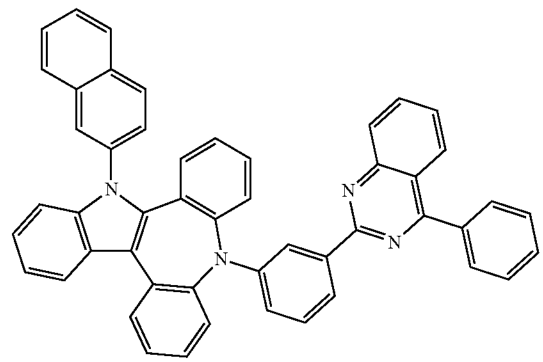
2-86a
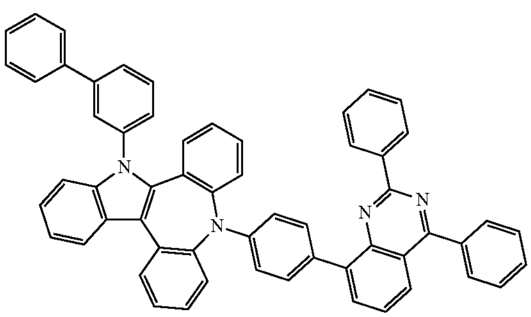
2-87a
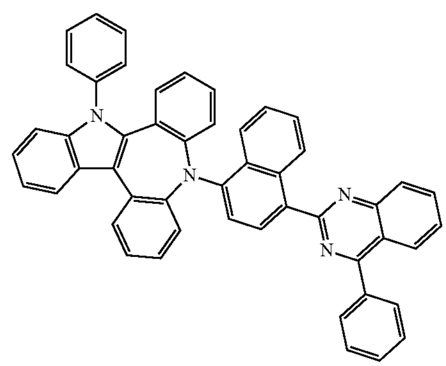
2-88a
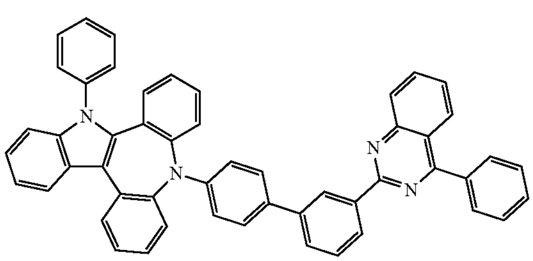
2-89a
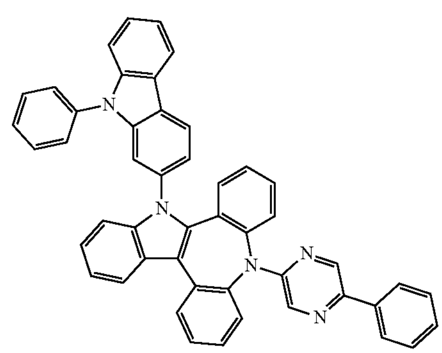

-continued
2-90a
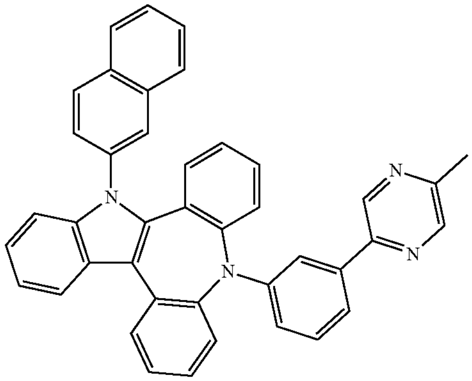
2-91a
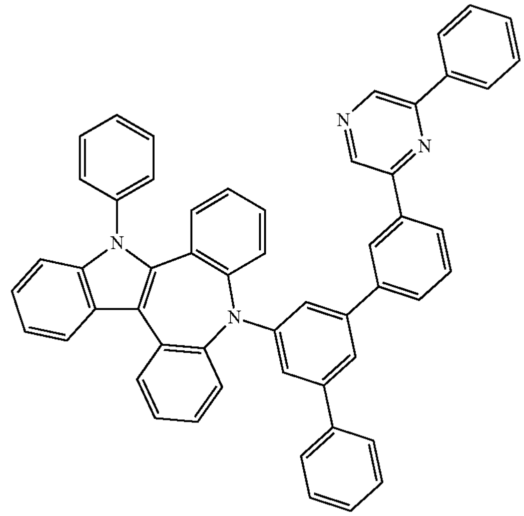
2-92a
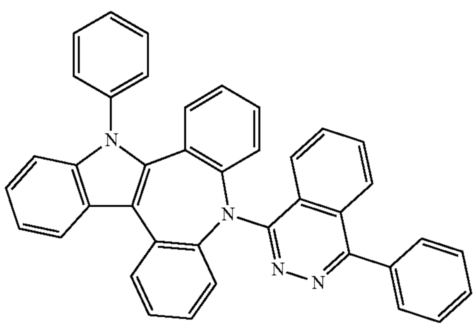
2-93a
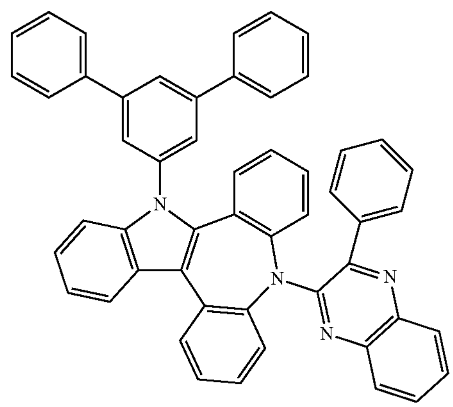
2-94a
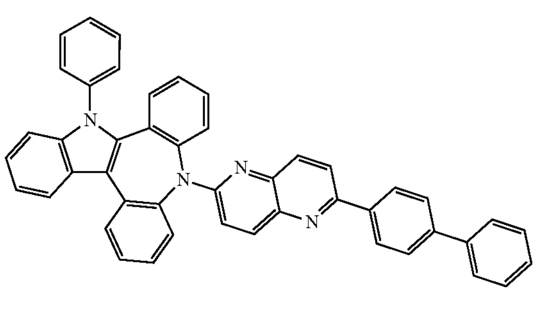
2-95a
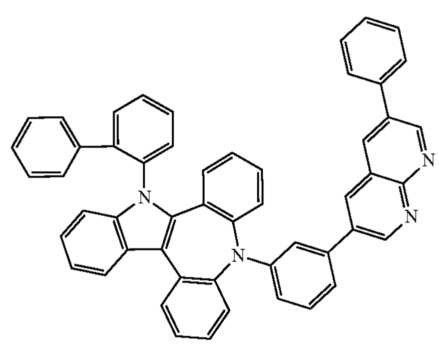

-continued
2-96a
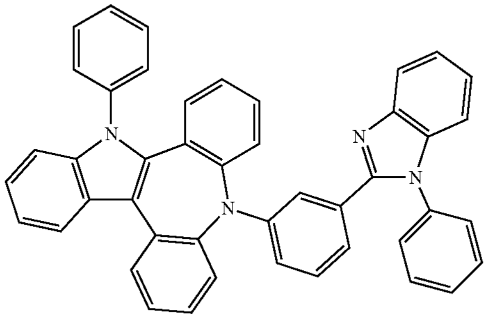
2-97a
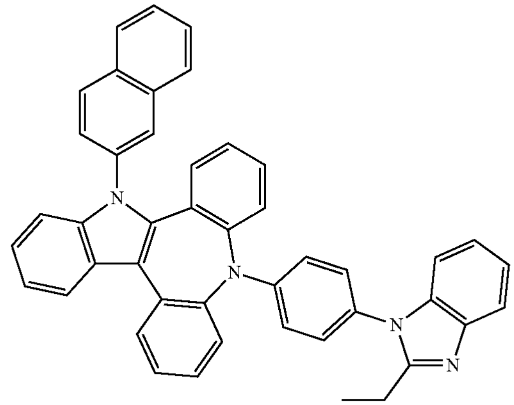
2-98a
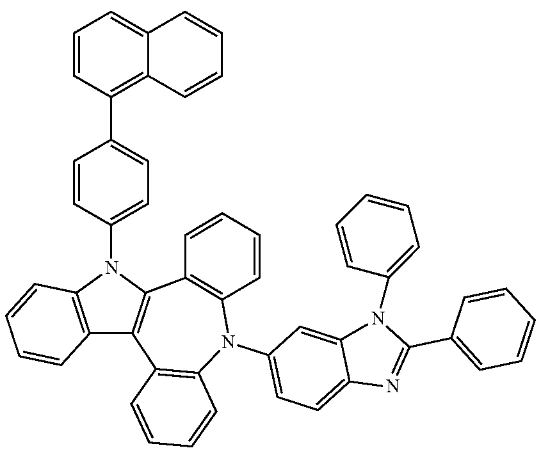
2-99a
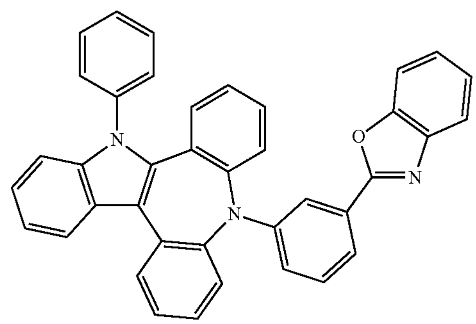
2-100a
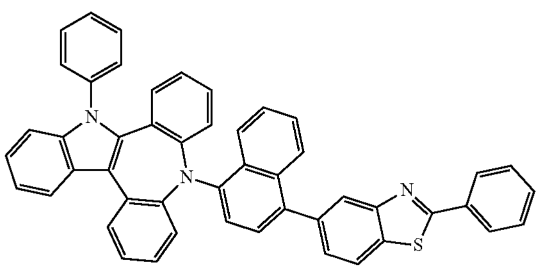
2-101a
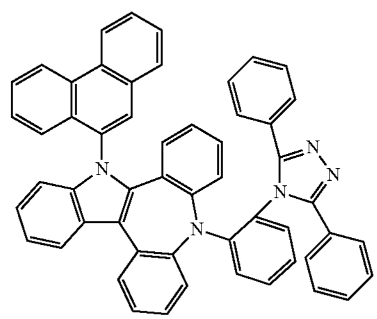
2-102a
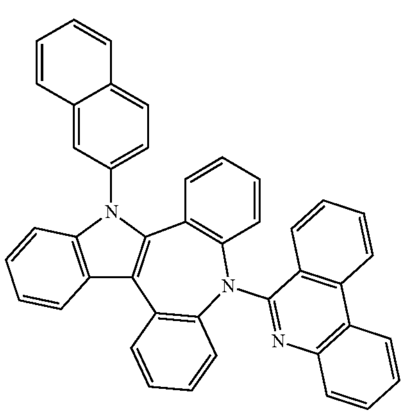
2-103a
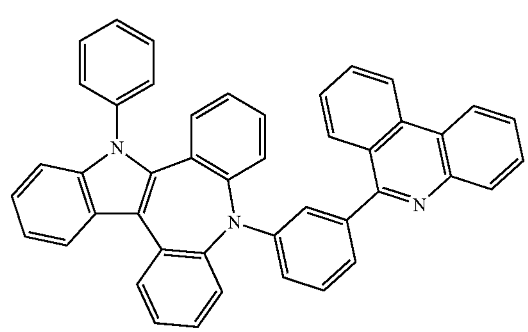

-continued
2-104a
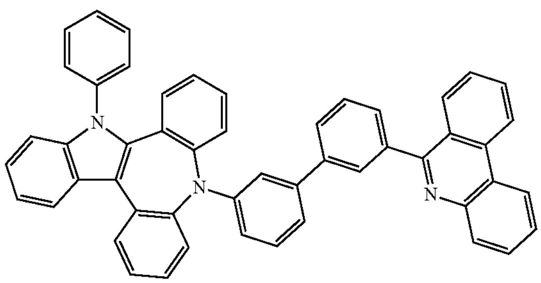
2-105a
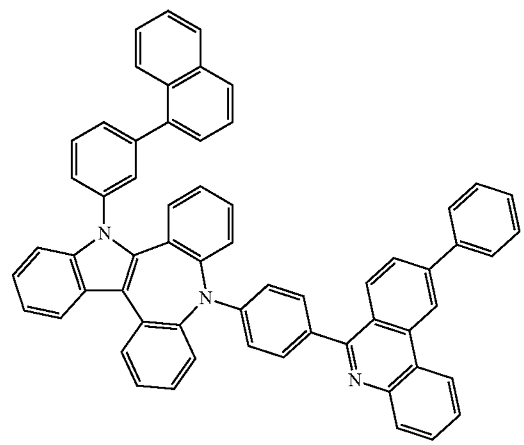
2-106a
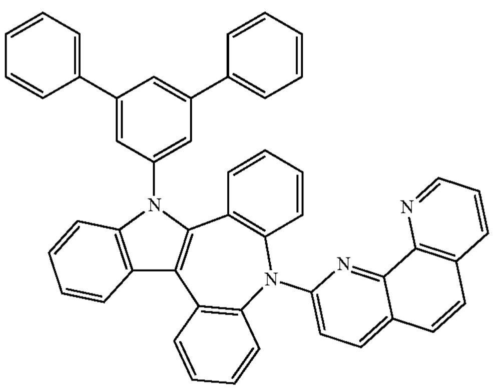
2-107a
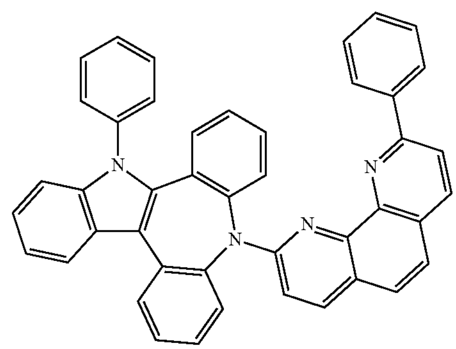
2-108a
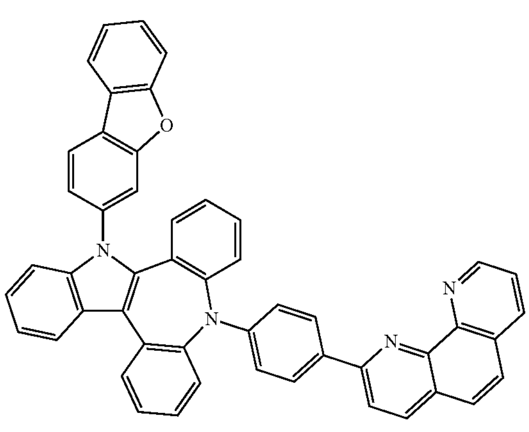
2-109a
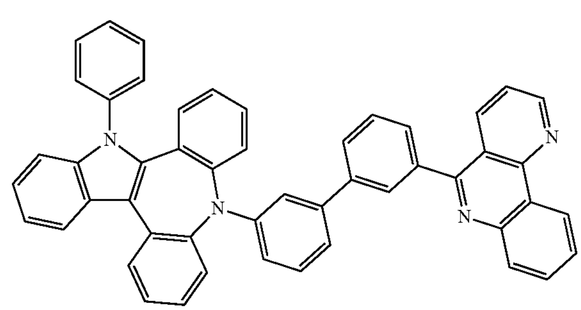

-continued
2-110a
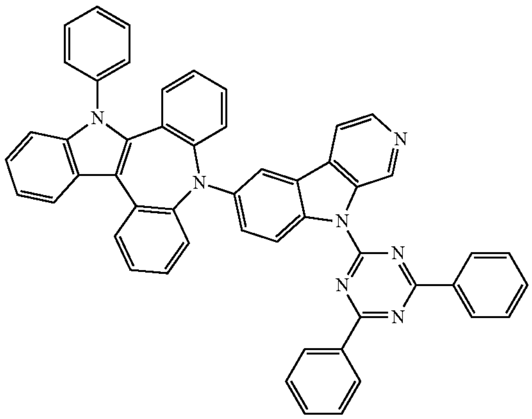
2-111a
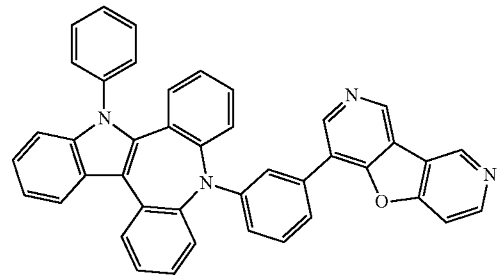
2-112a
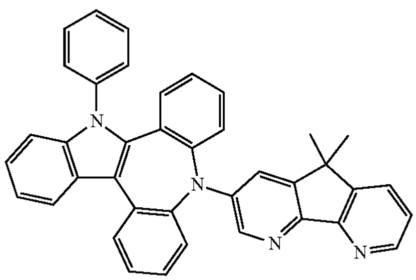
2-113a
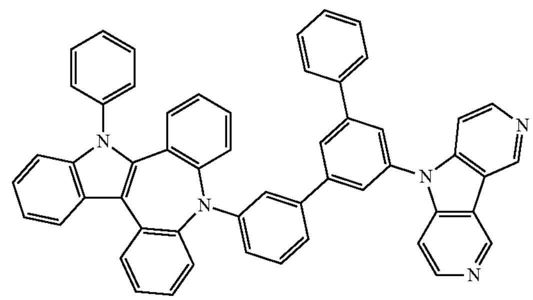
2-114a
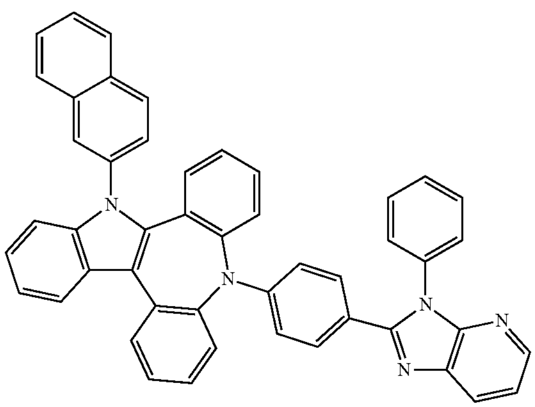
2-115a
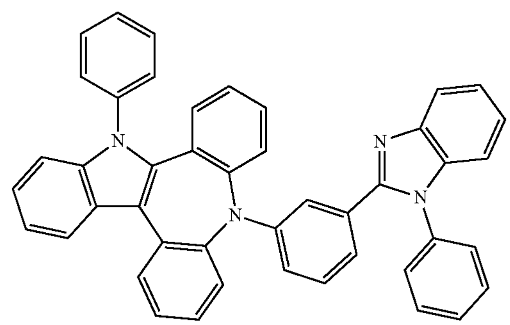
2-116a
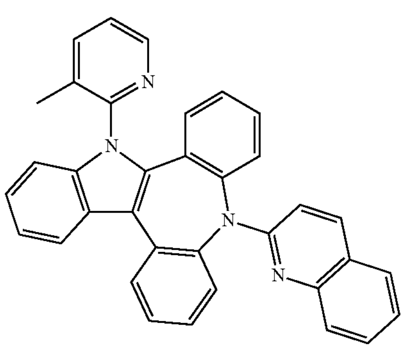
2-117a
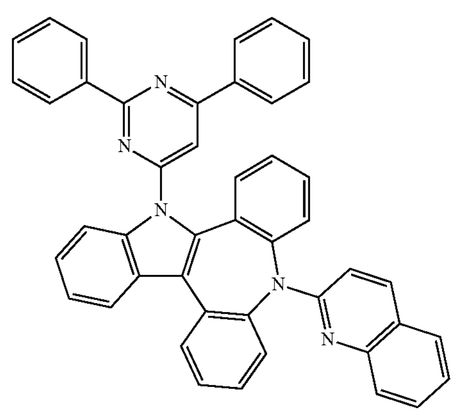

-continued
2-118a
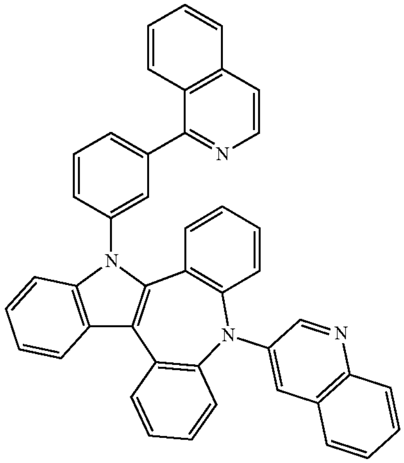
2-119a
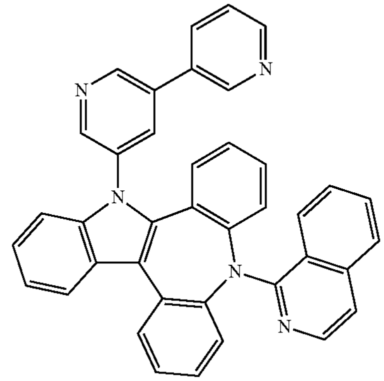
2-120a
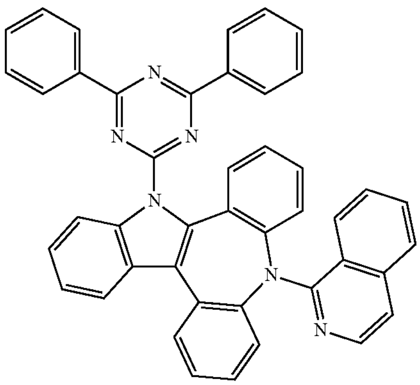
2-121a
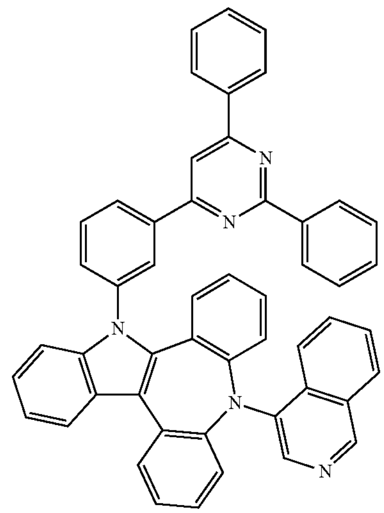
2-122a
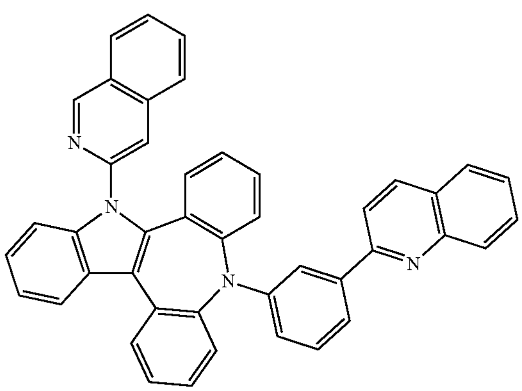
2-123a
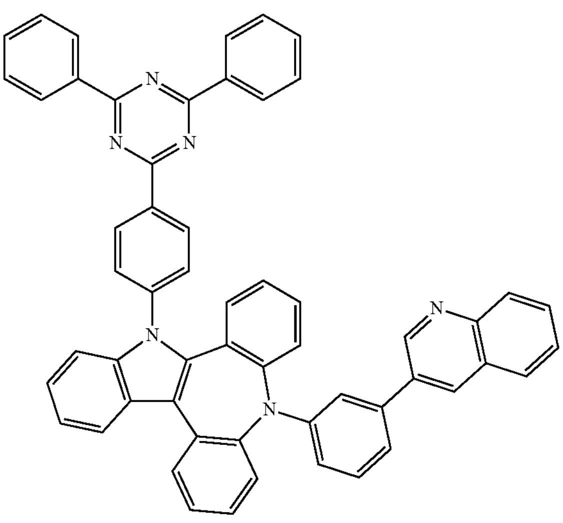

-continued
2-124a
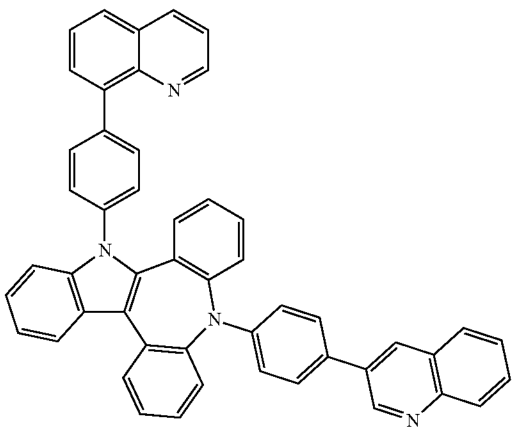
2-125a
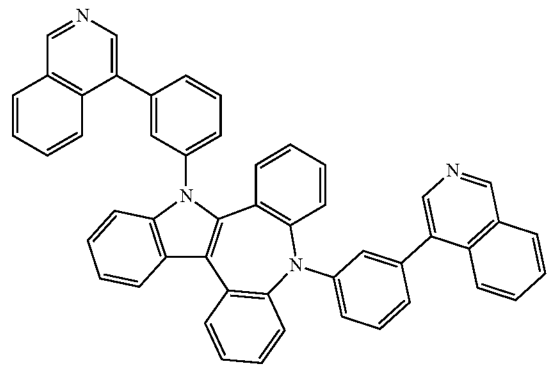
2-126a
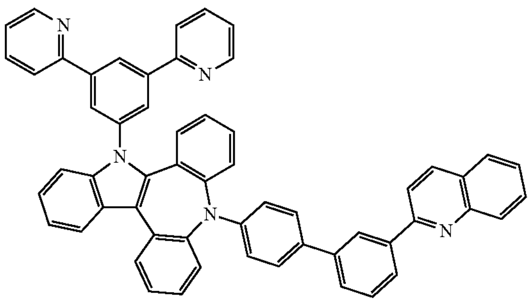
2-127a
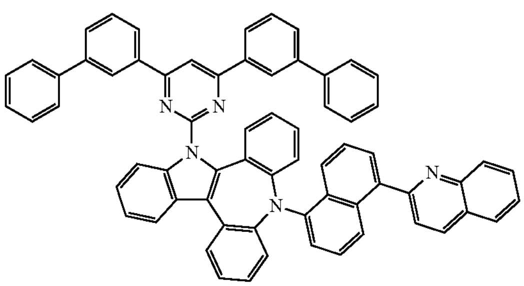
2-128a
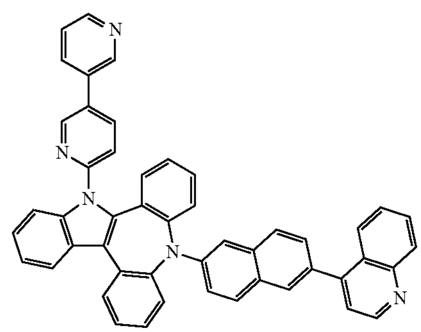
2-129a
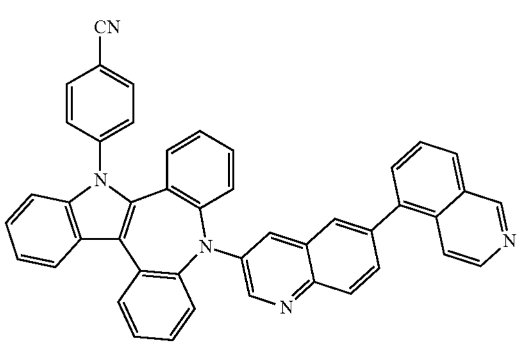
2-130a
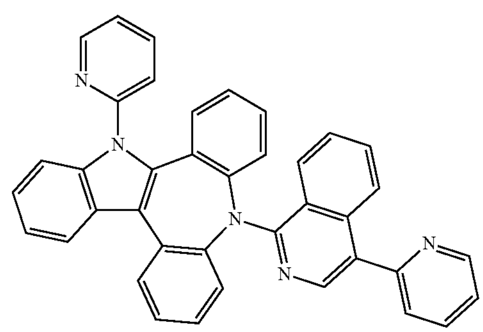

-continued
2-131a
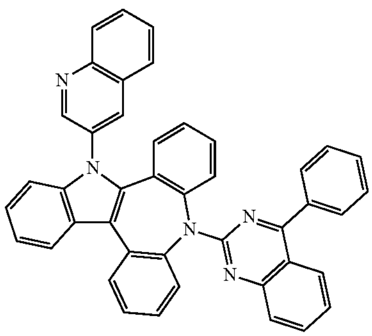
2-132a
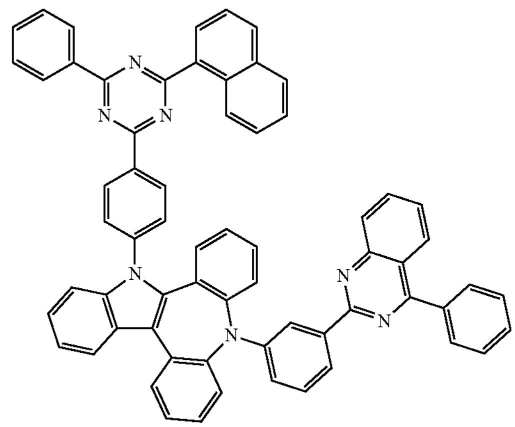
2-133a
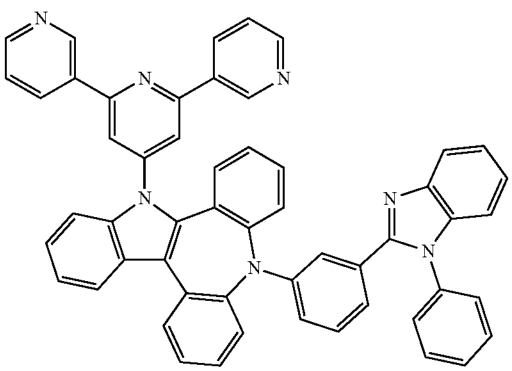
2-134a
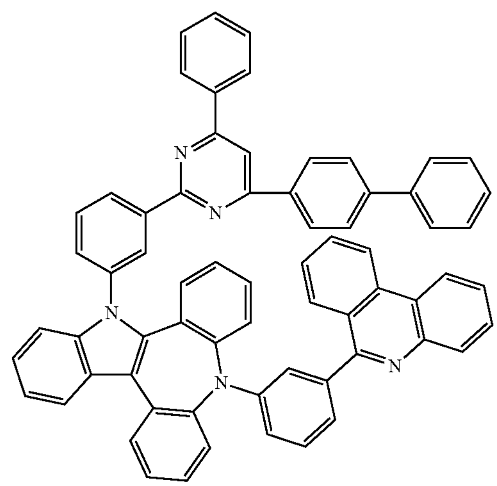
2-135a
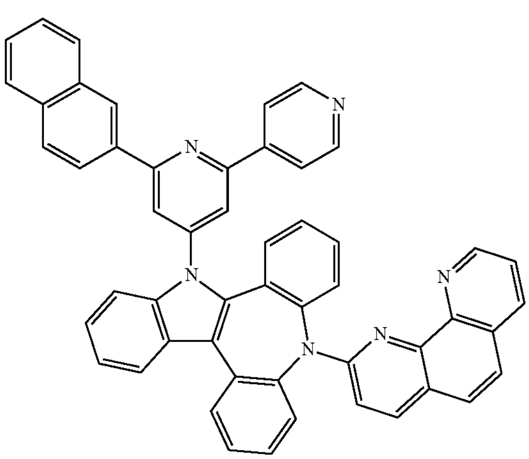
2-136a
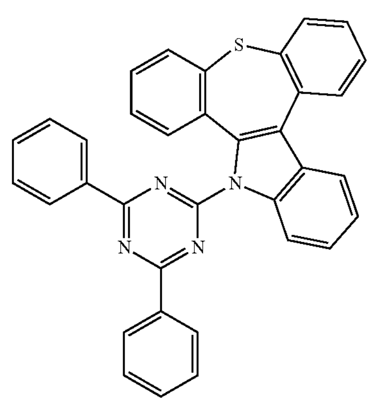

-continued
2-137a
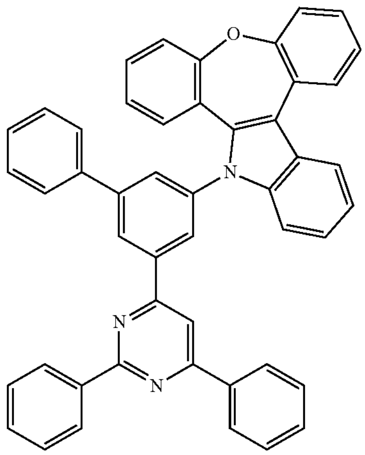
2-138a
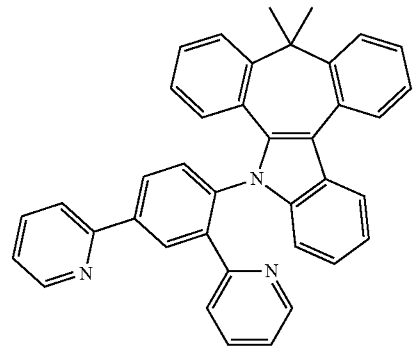
2-139a
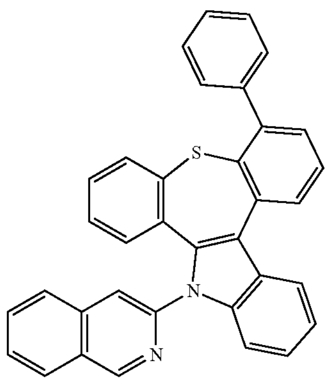
2-140a
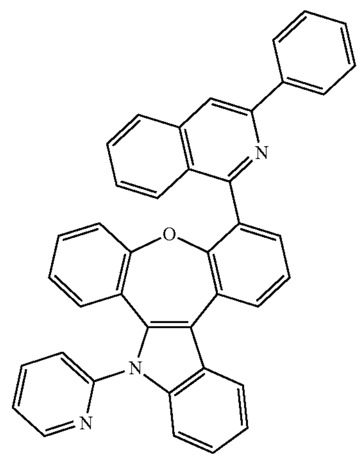
2-141a
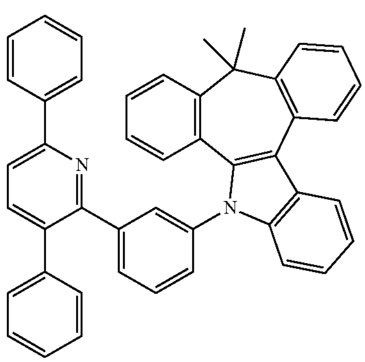
2-142a
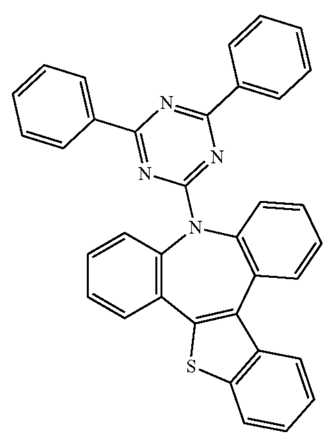

-continued
2-143a
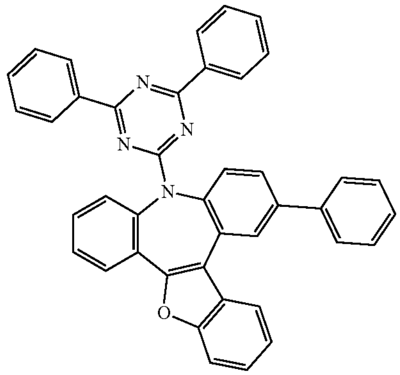
2-144a
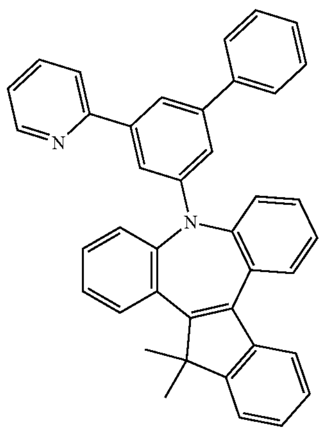
2-145a
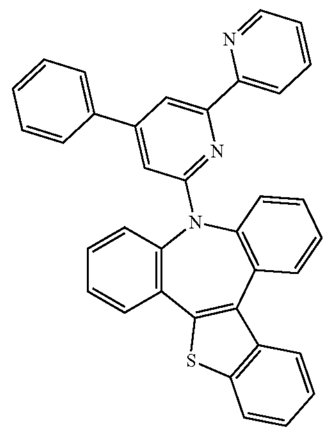
2-146a
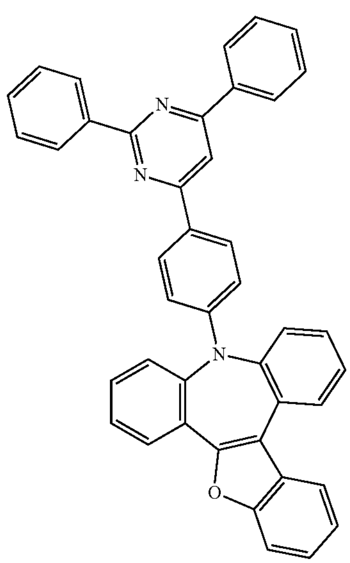
2-147a
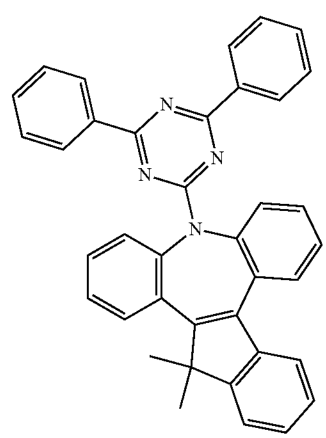

-continued
2-148a
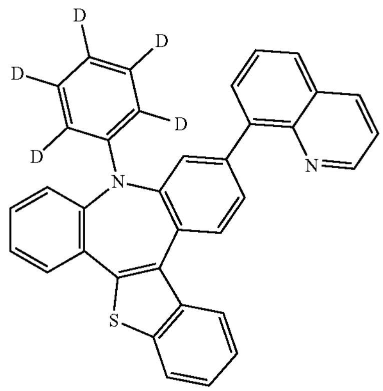
2-149a
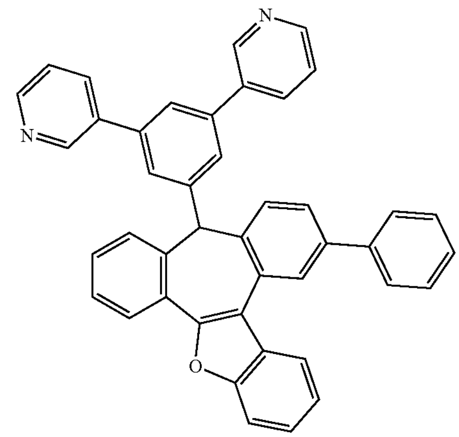
2-150a
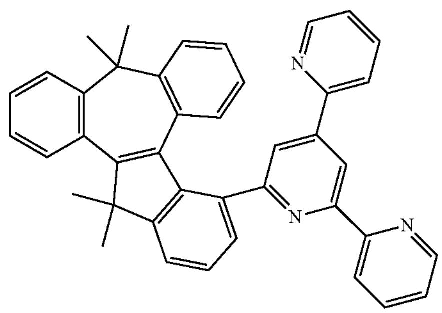
2-151a
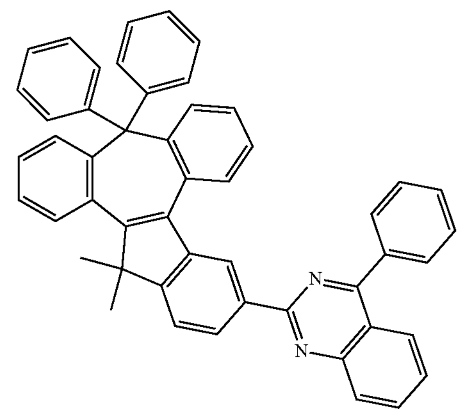
2-152a
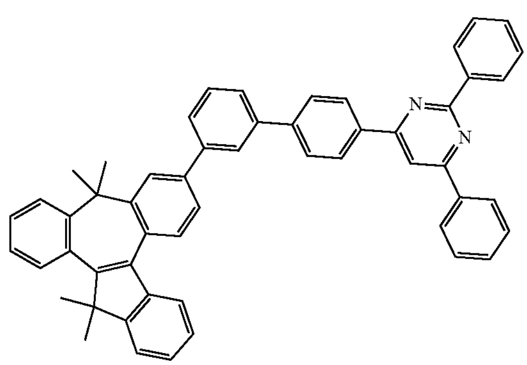
2-153a
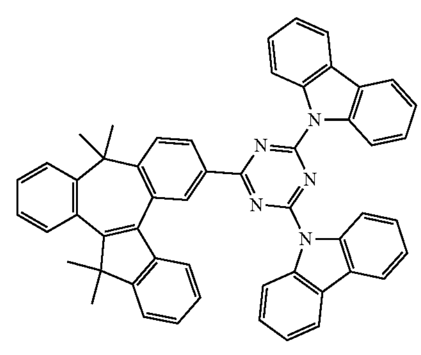
2-154a
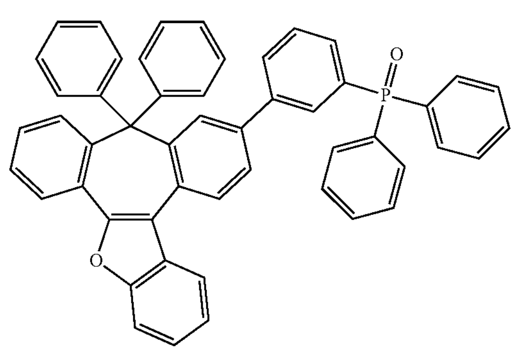
2-155a
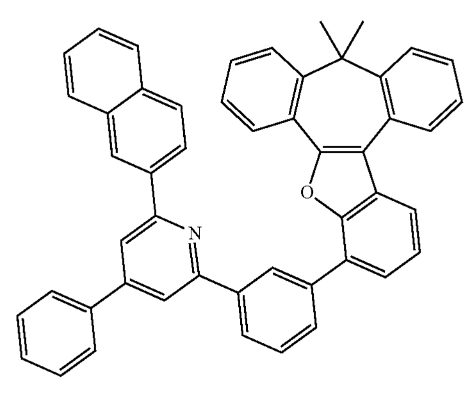

-continued
2-156a
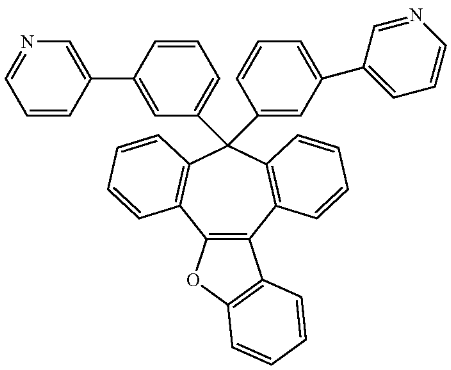
2-157a
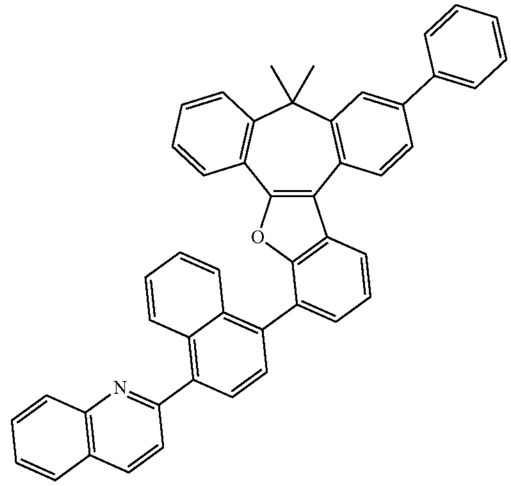
2-158a
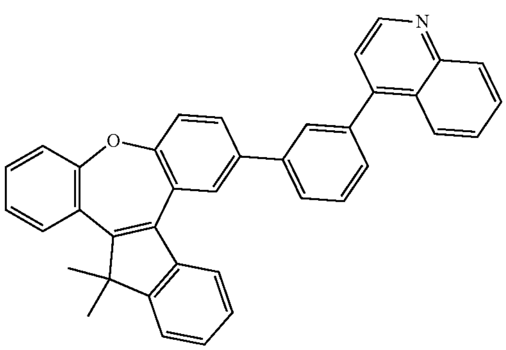
2-159a
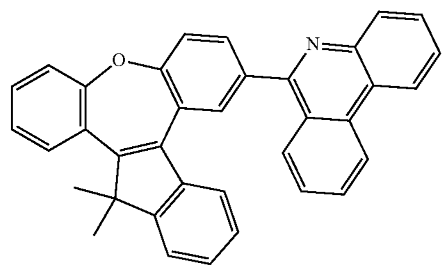
2-160a
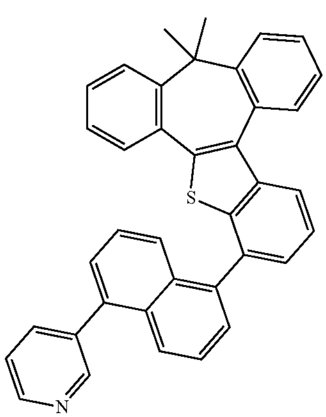
2-161a
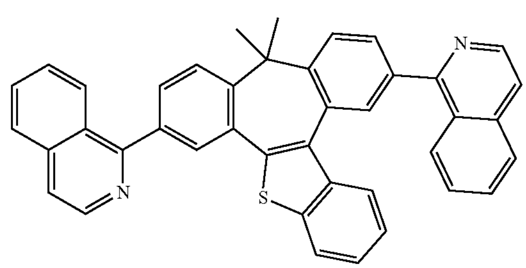

-continued
2-162a
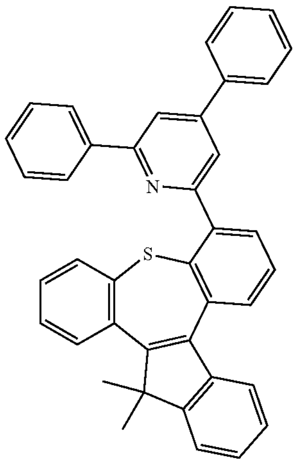
2-163a
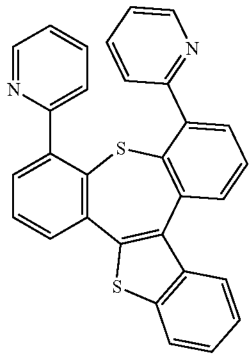
2-164a
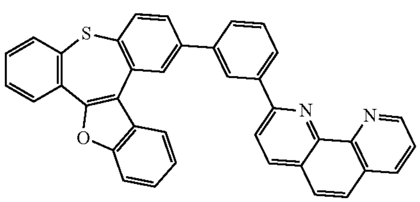
2-165a
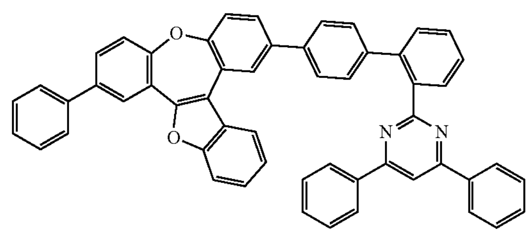
2-166a
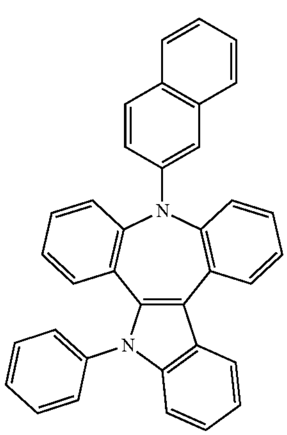
2-167a
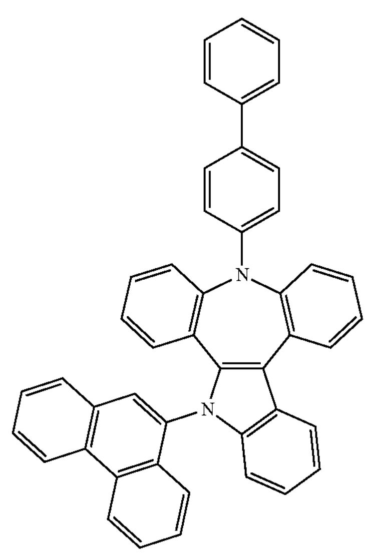

-continued
2-168a
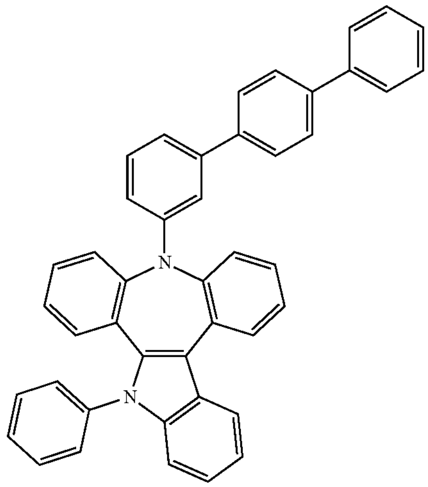
2-169a
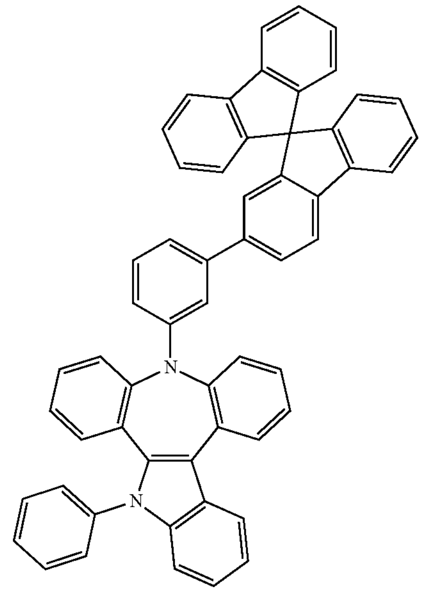
2-170a
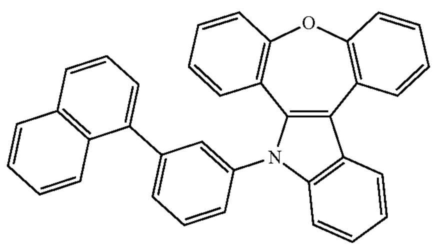
2-171a
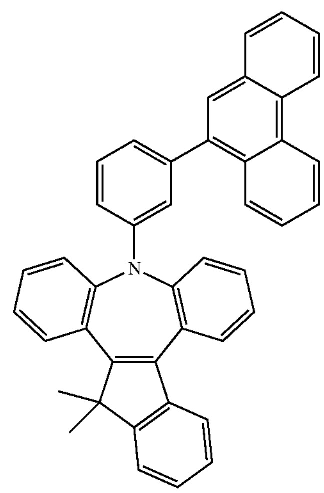
2-172a
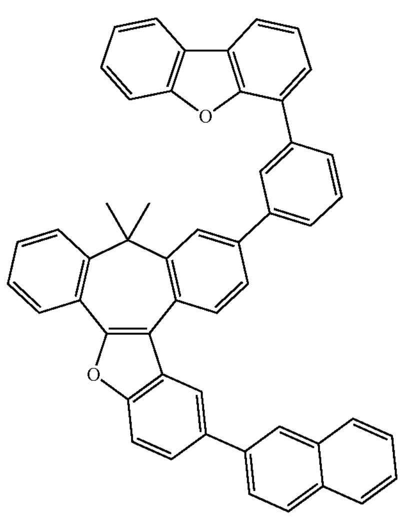
2-1
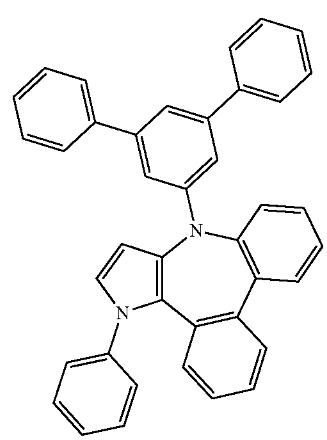

-continued
2-2
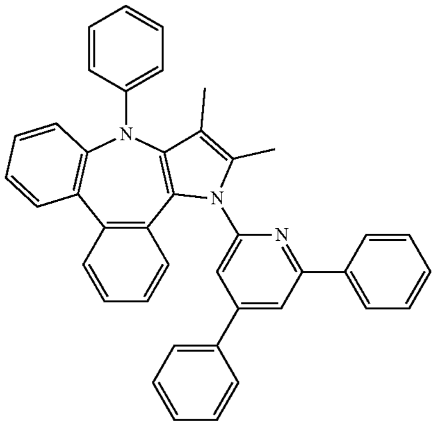
2-3
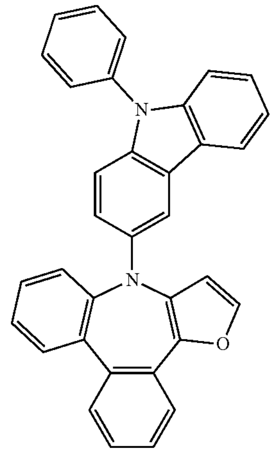
2-4
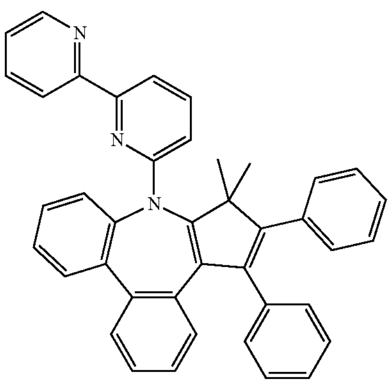
2-5
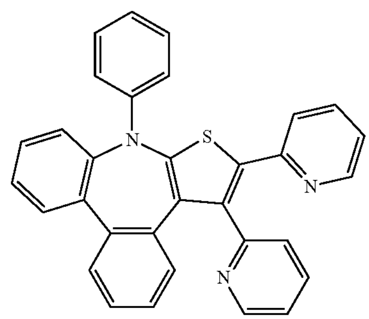
2-6
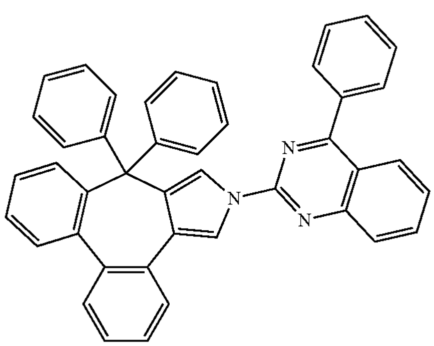
2-7
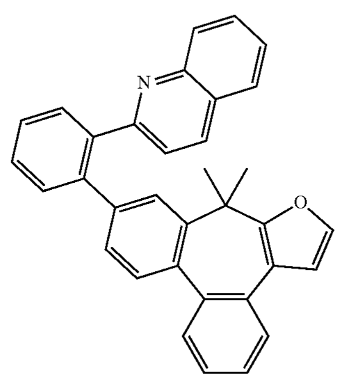
2-8
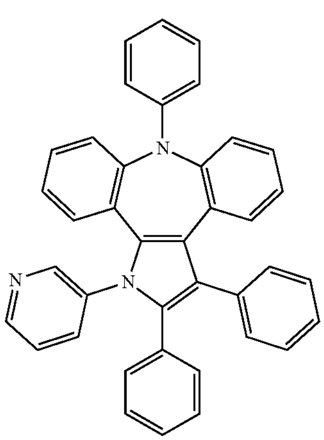
2-9
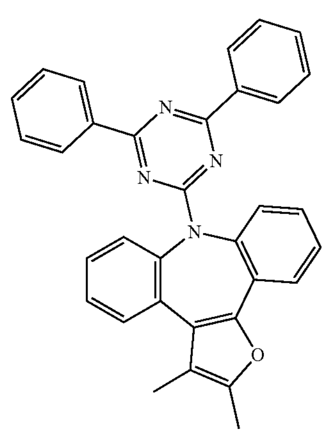

-continued
2-10
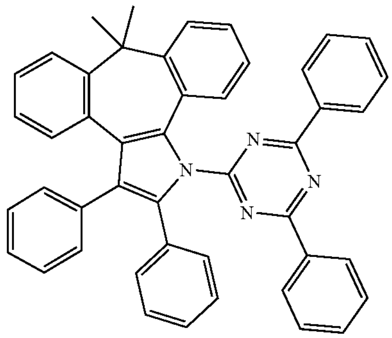
2-11
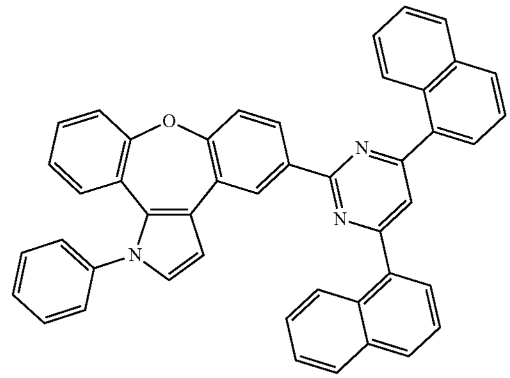
2-12
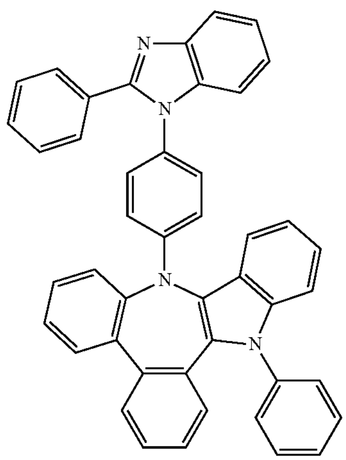
2-13
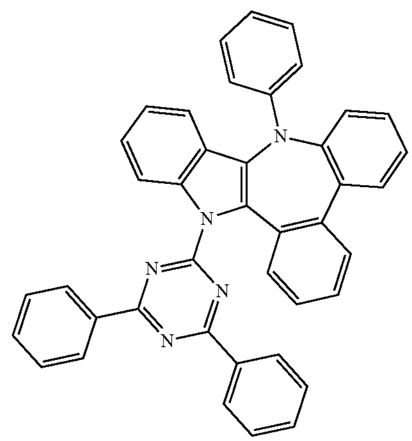
2-14
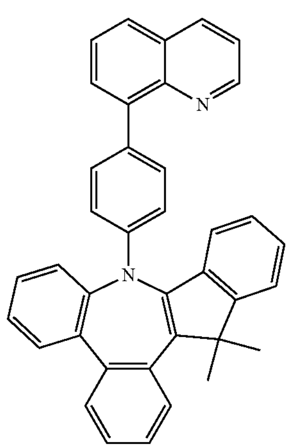
2-15
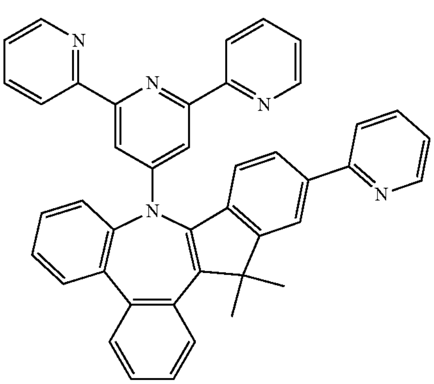

-continued
2-16
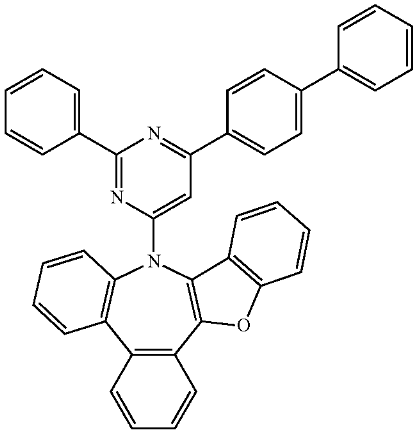
2-17
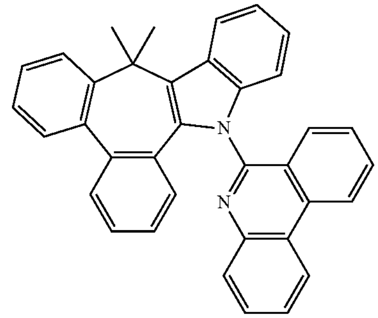
2-18
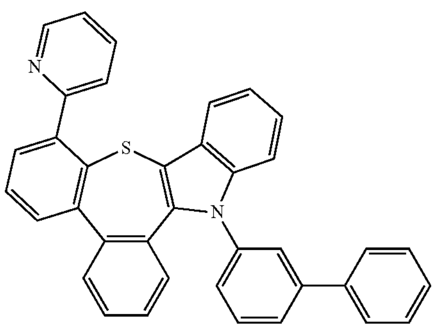
2-19
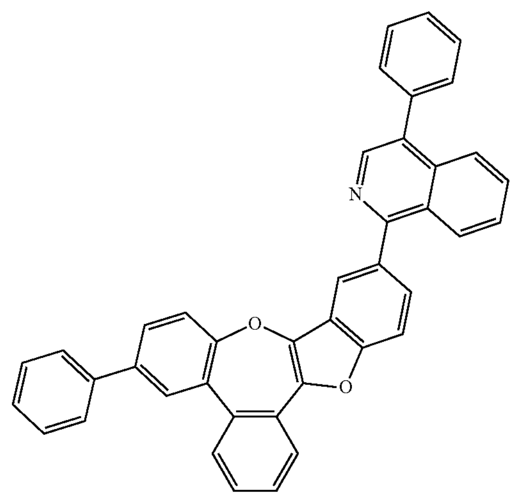
2-20
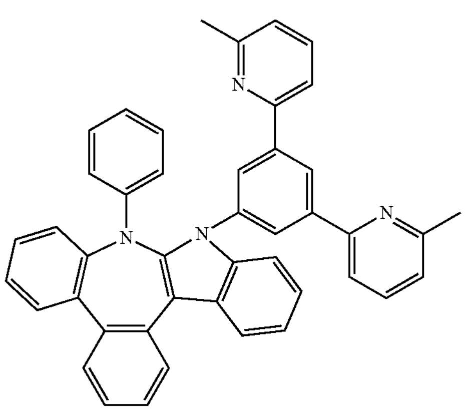
2-21
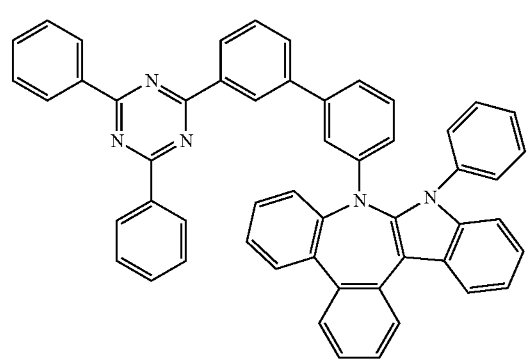

-continued
2-22
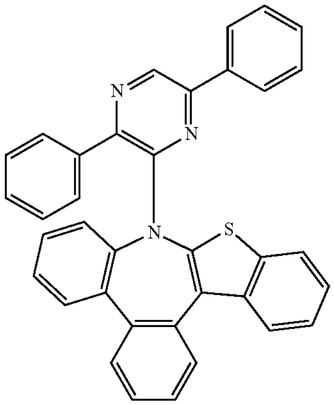
2-23
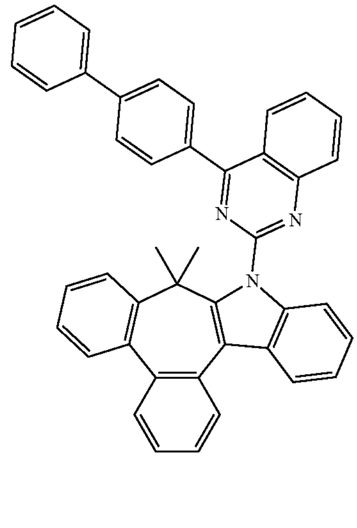
2-24
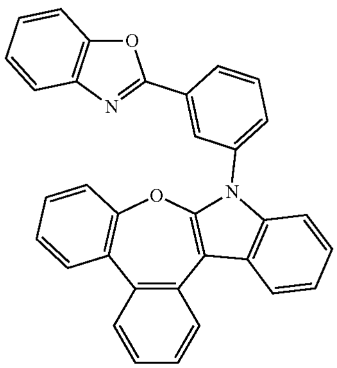
2-25
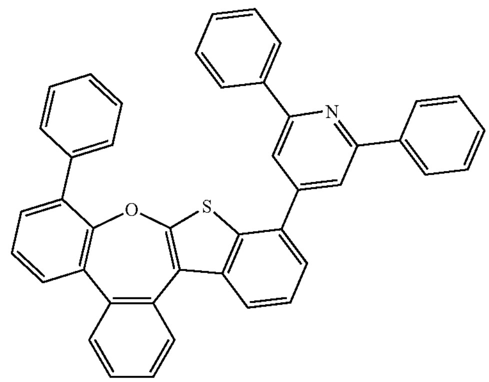
2-26
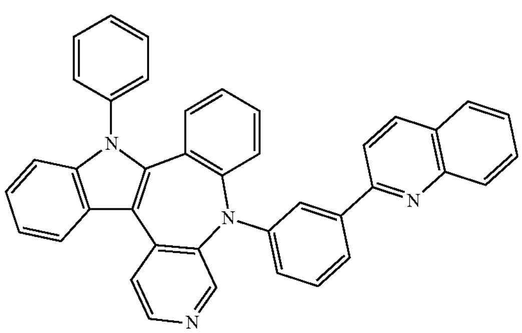
2-27
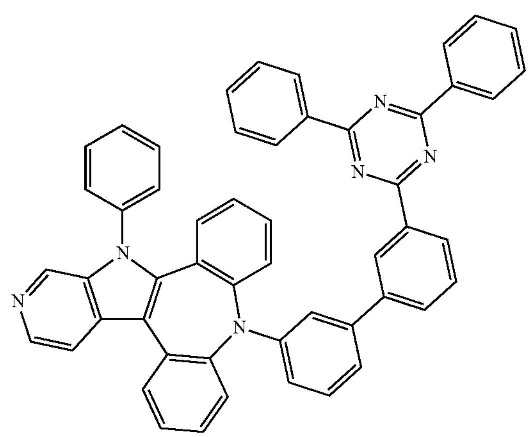

-continued
2-28
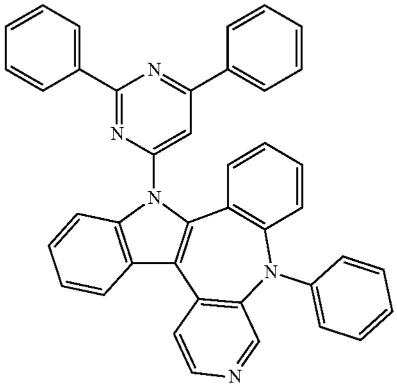
2-29
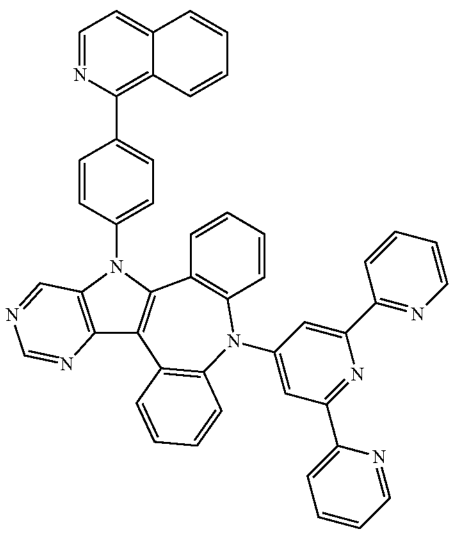
2-30
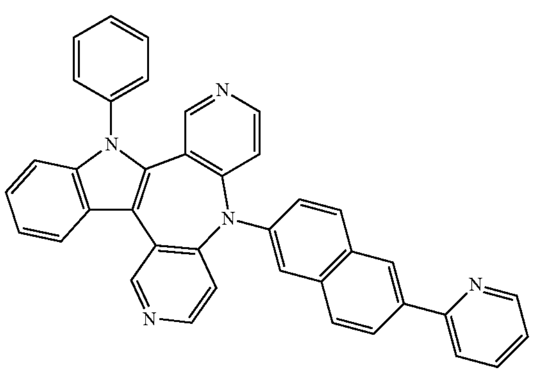
-continued
2-31
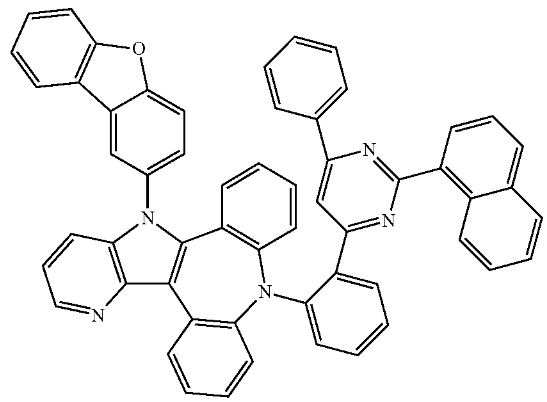
2-32
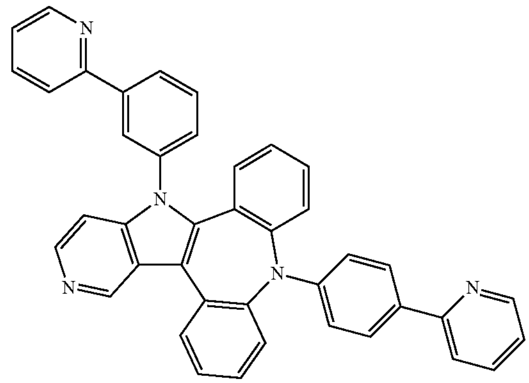

-continued
2-33
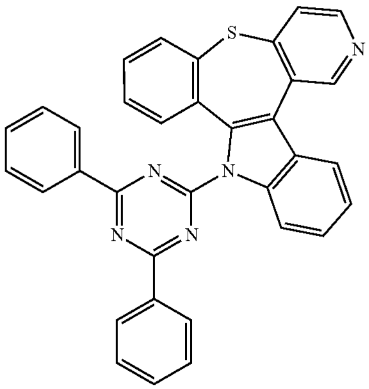
2-34
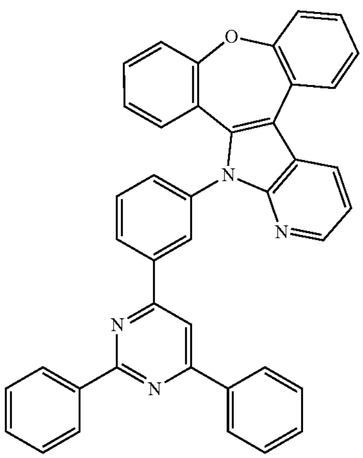
2-35
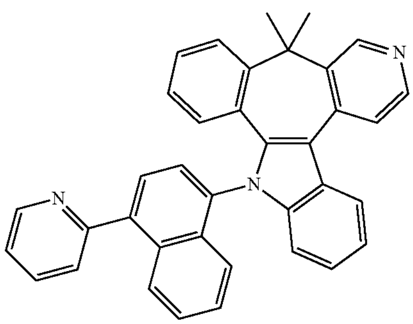
2-36
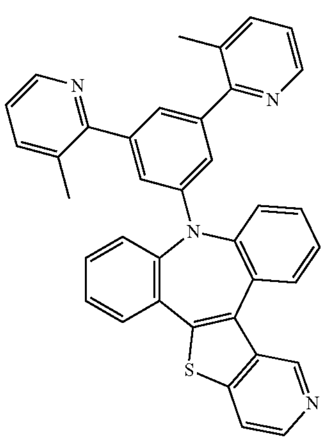
-continued
2-37
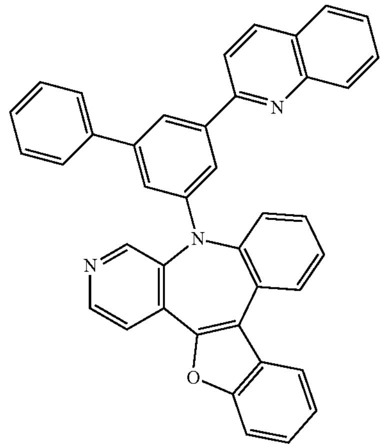
2-38
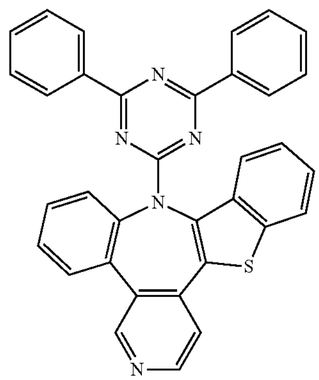
2-39
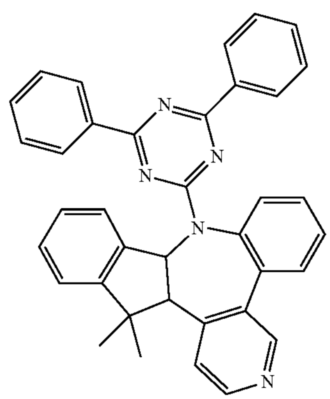
2-40
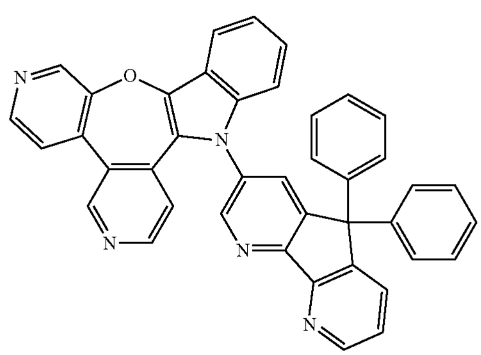

-continued
2-41
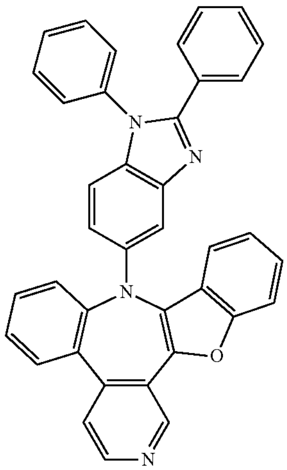
2-42
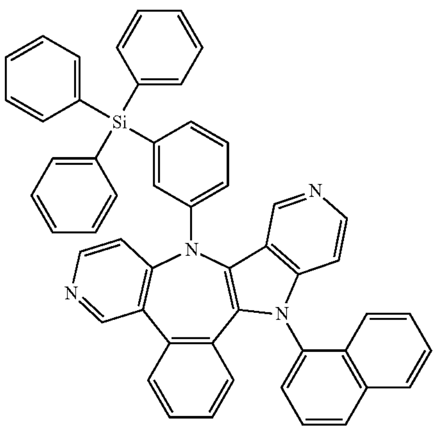
2-43
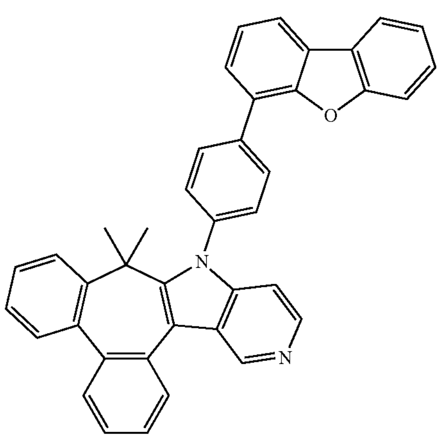
-continued
2-44
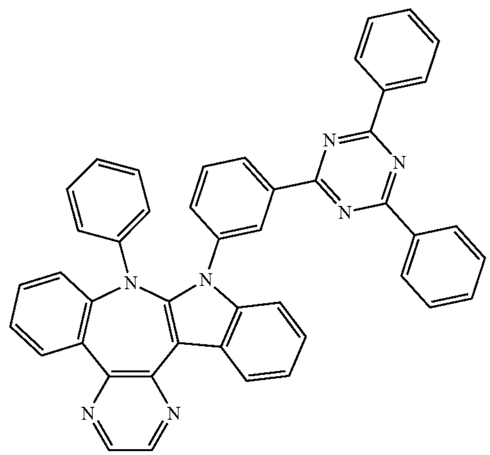
2-45
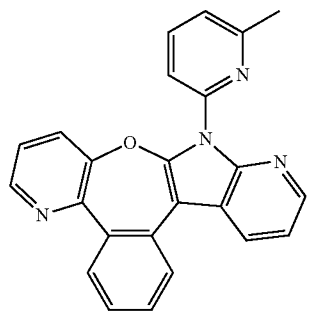
2-46
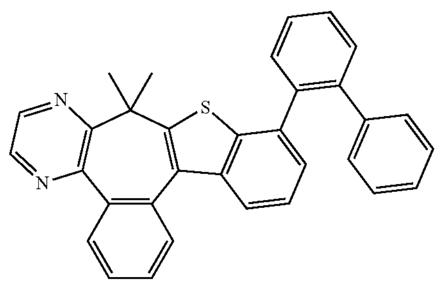
2-47
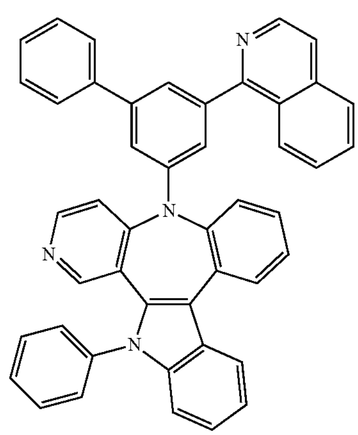

-continued
2-48
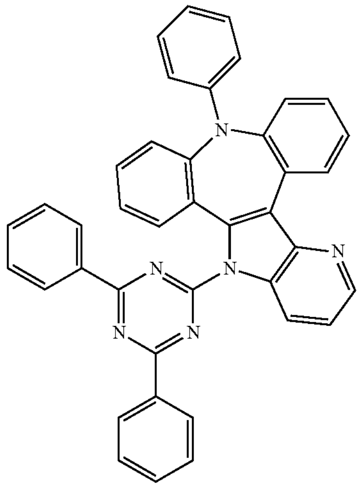
2-49
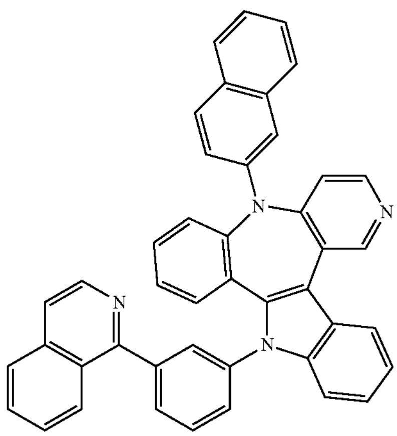
2-50
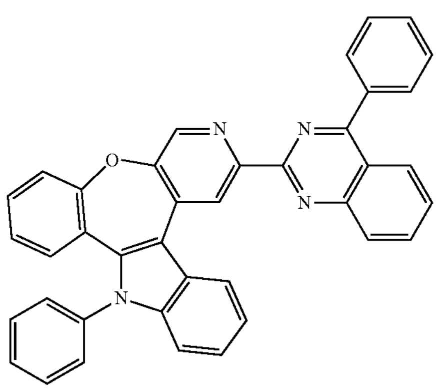
-continued
2-51
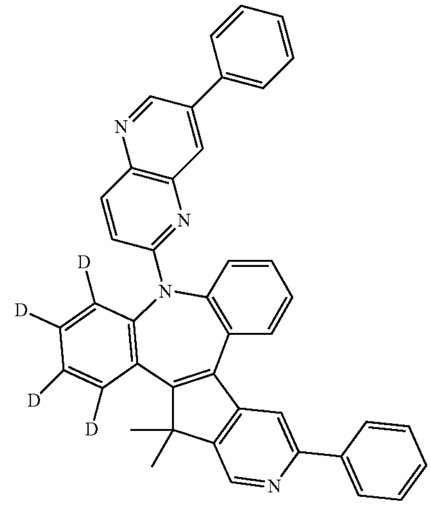
2-52
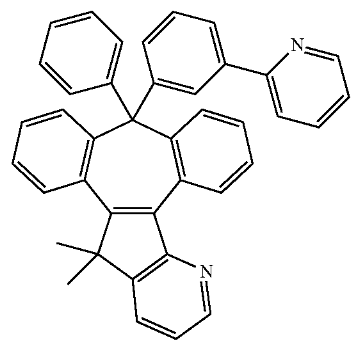
2-53
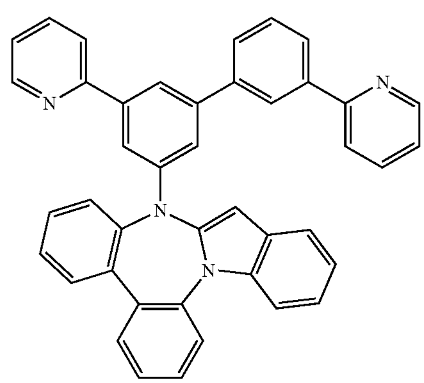

-continued
2-54
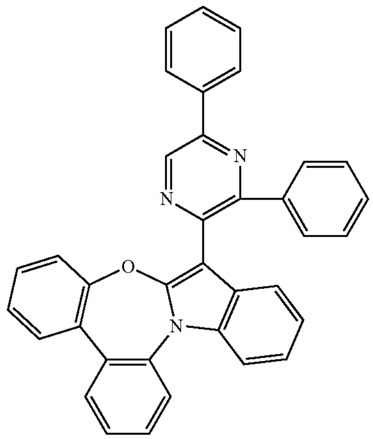
2-55
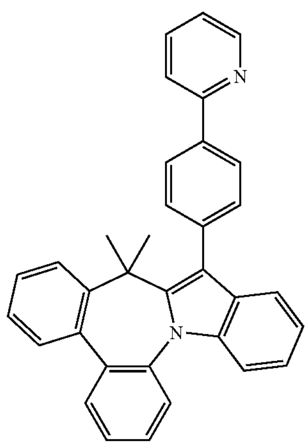
2-56
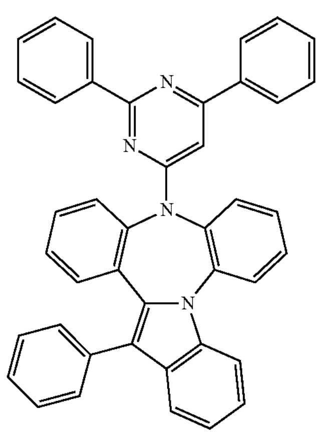
-continued
2-57
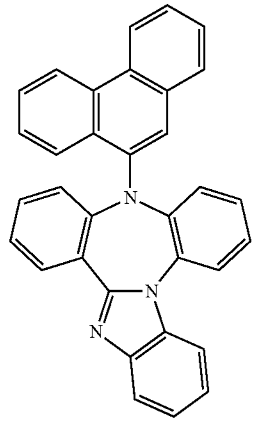
2-58
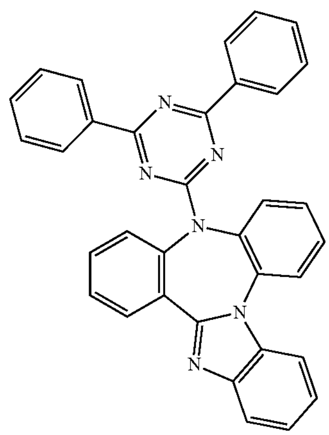
2-59
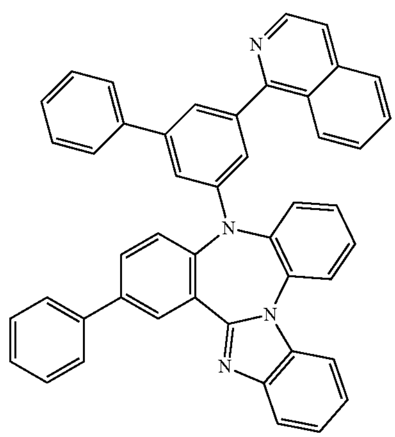

2-60
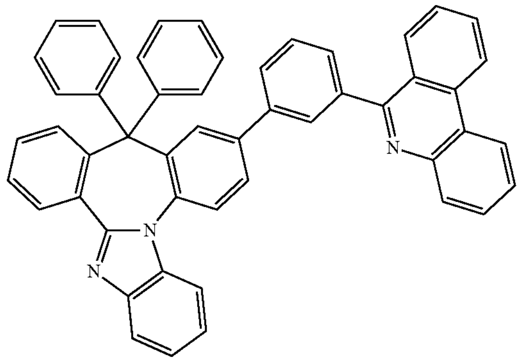
2-61
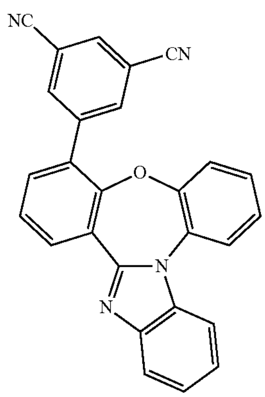
2-62
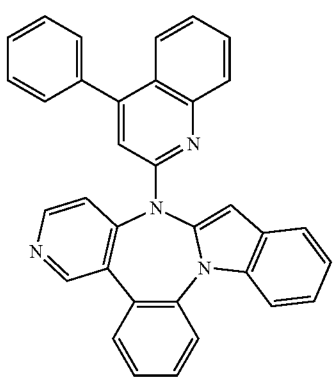
2-63
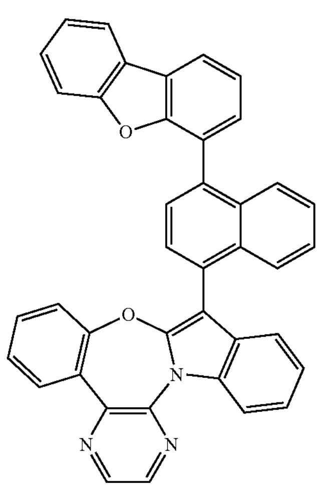
2-64
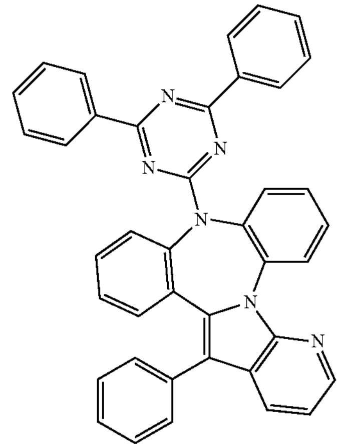
2-65
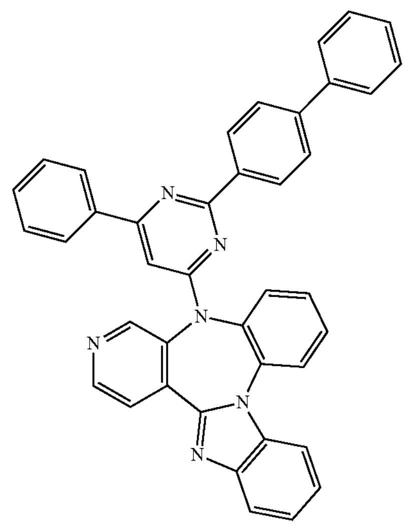
2-66
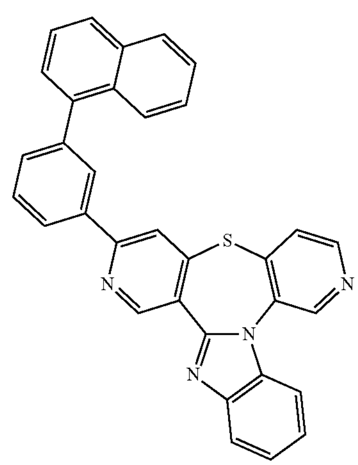

2-67
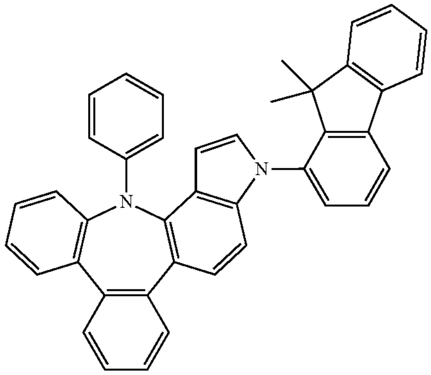
2-68
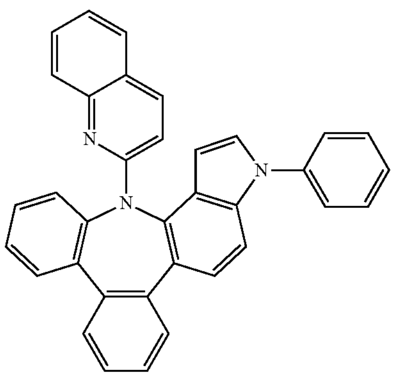
2-69
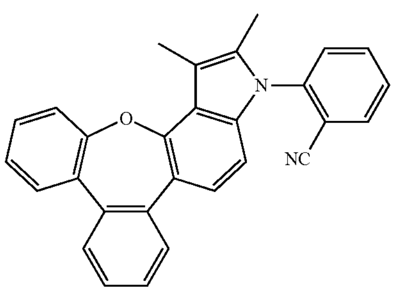
2-70
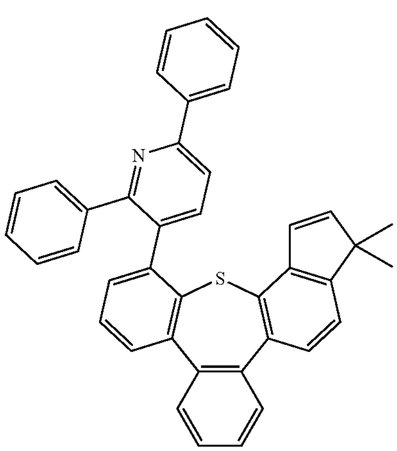
2-71
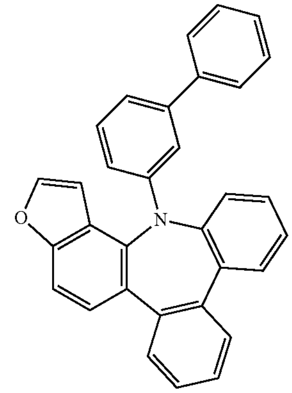
2-72
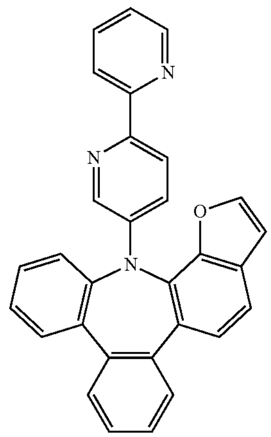
2-73
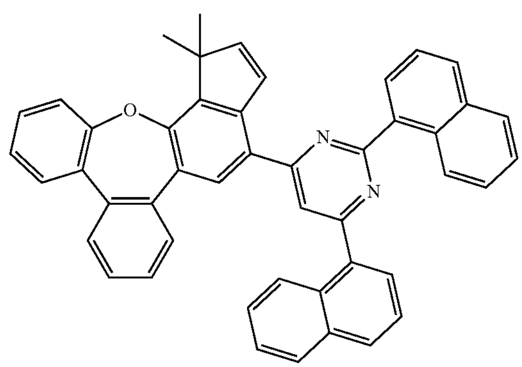
2-74
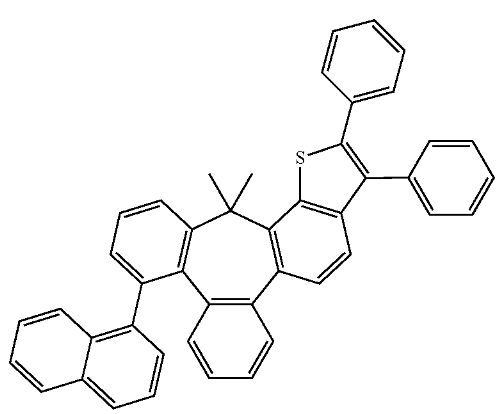

-continued
2-75
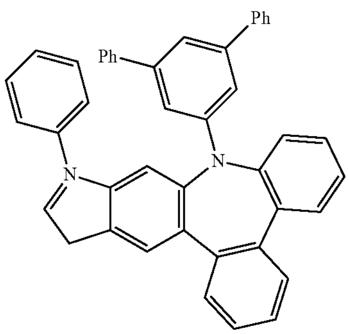
2-76
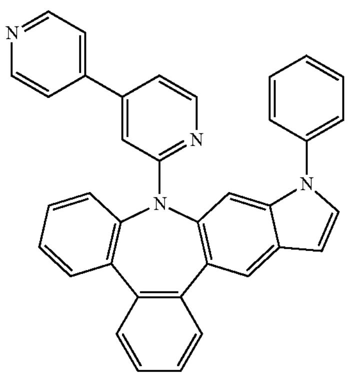
2-77
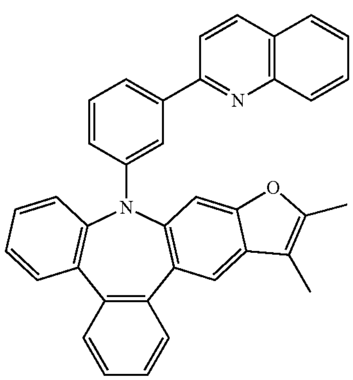
2-78
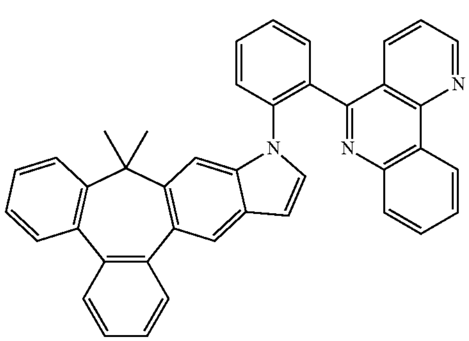
-continued
2-79
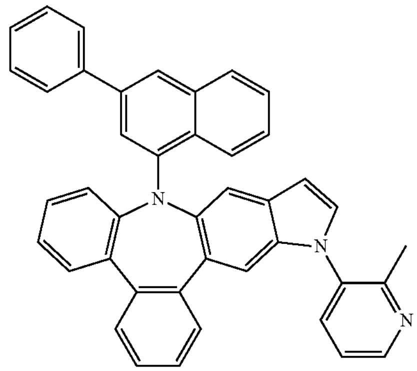
2-80
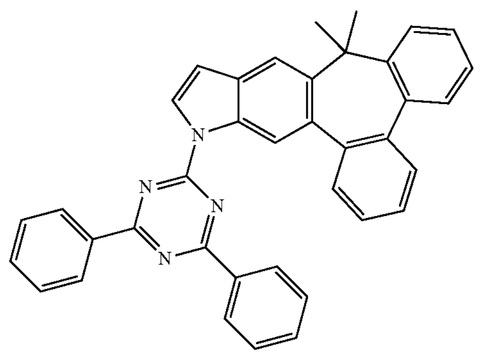
2-81
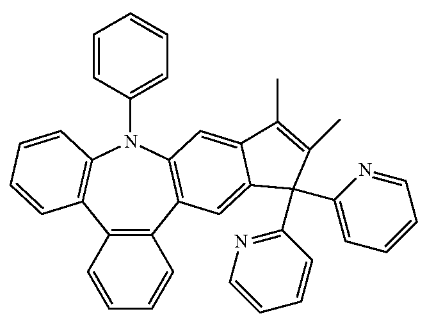
2-82
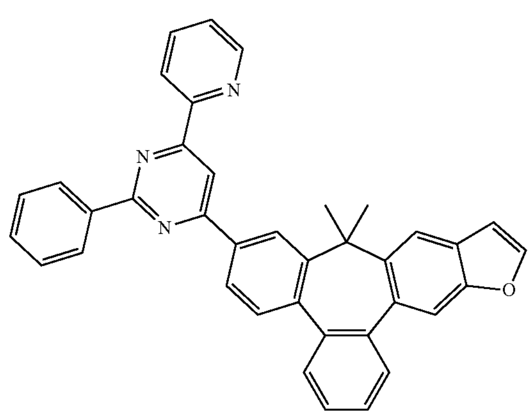

-continued
2-83
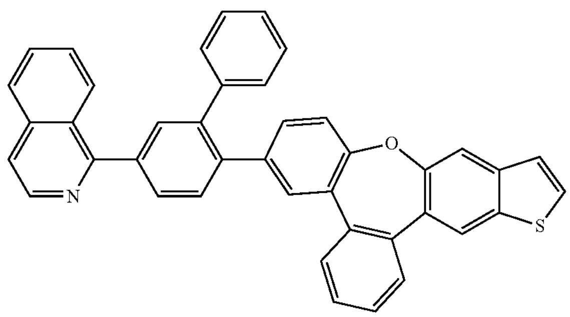
2-84
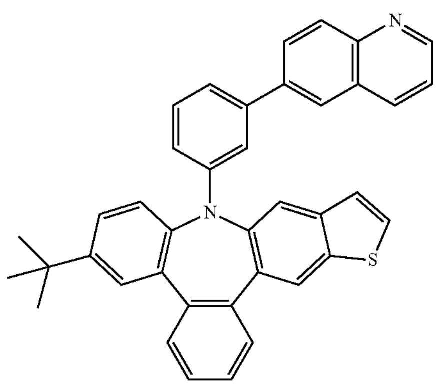
2-85
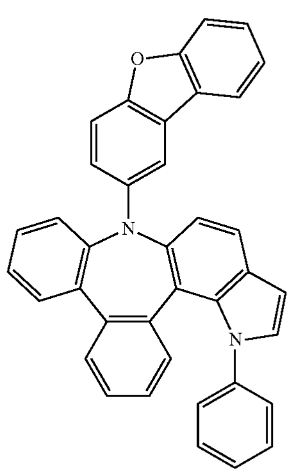
-continued
2-86
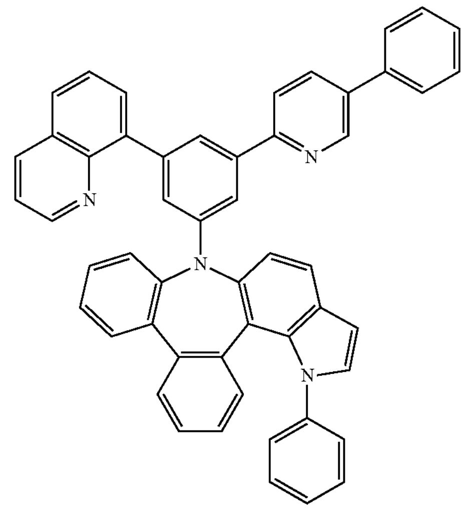
2-87
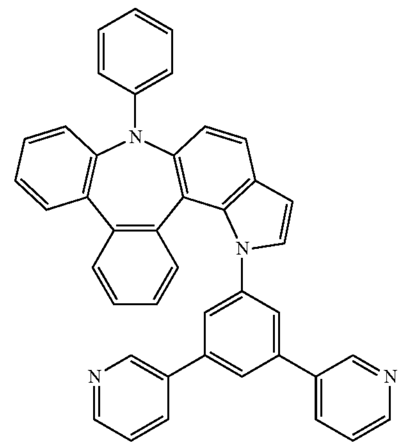
2-88
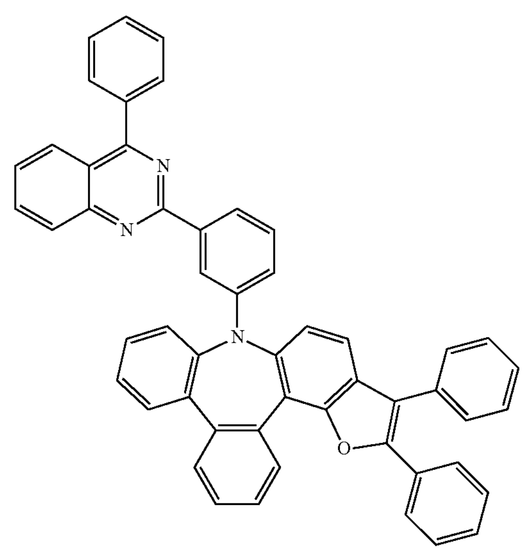

-continued
2-89
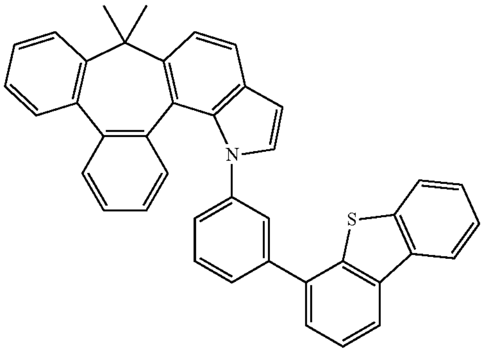
2-90
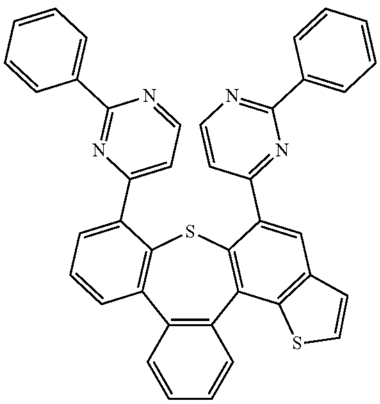
2-91
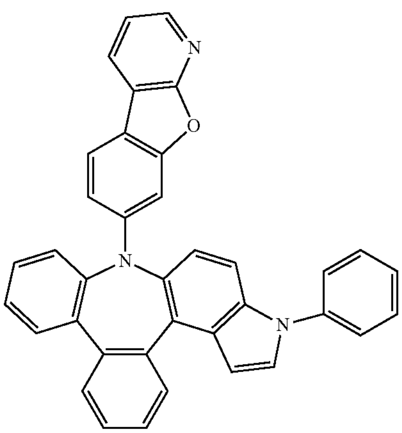
2-92
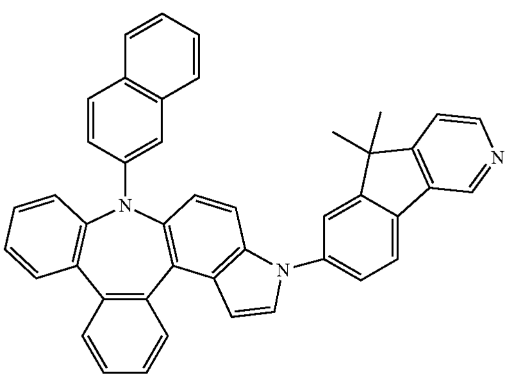
-continued
2-93
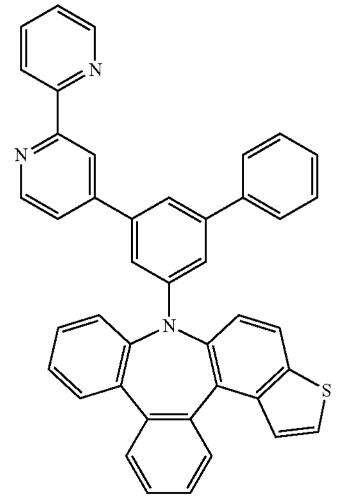
2-94
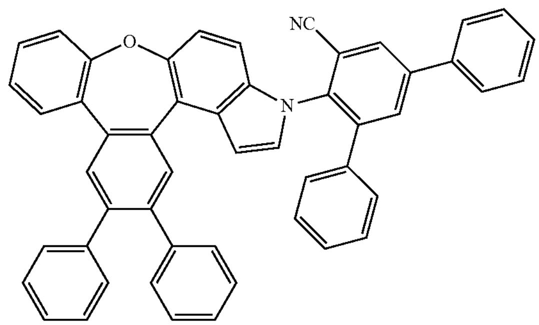
2-95
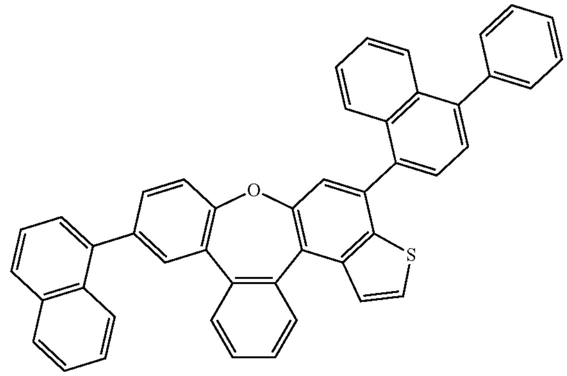

-continued
2-96
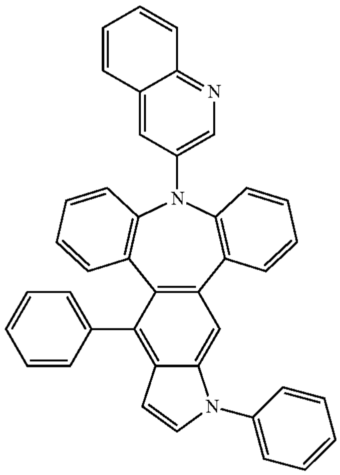
2-97
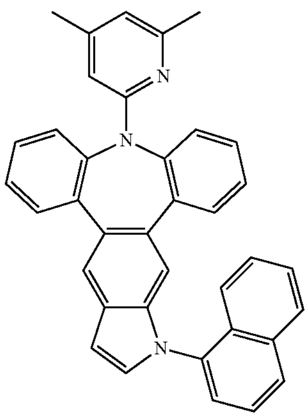
2-98
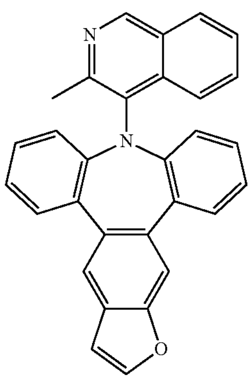
2-99
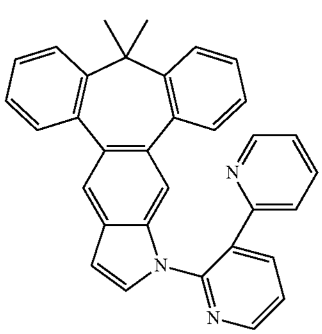
-continued
2-100
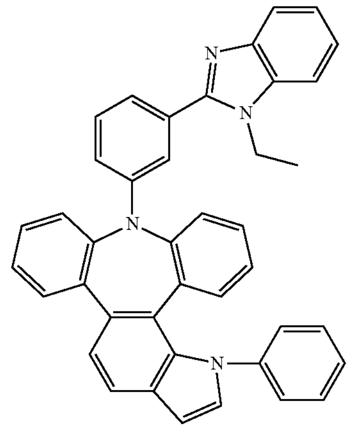
2-101
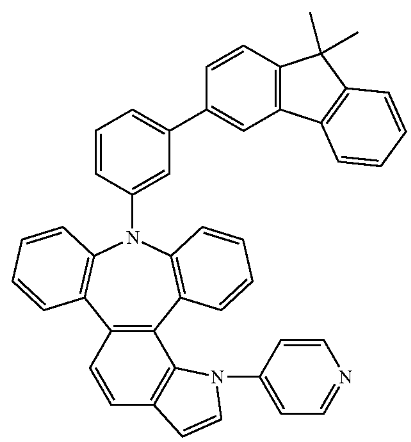
2-102
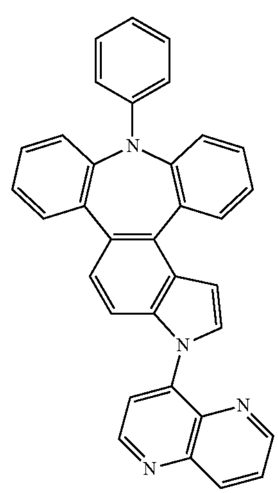

-continued
1-103
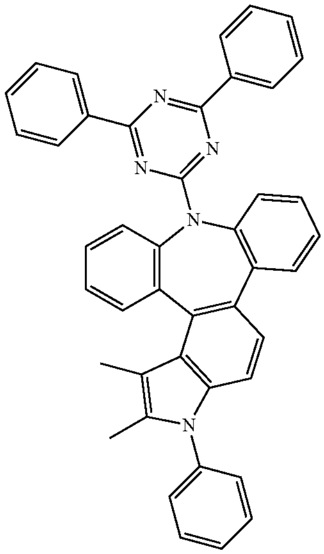
2-104
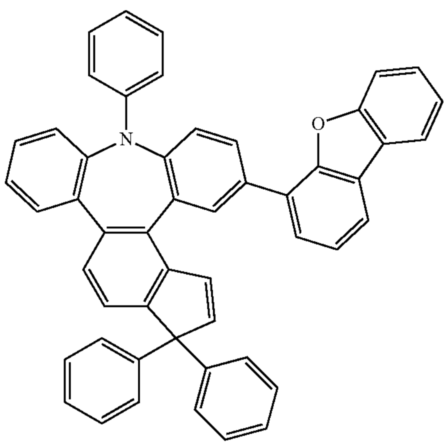
2-105
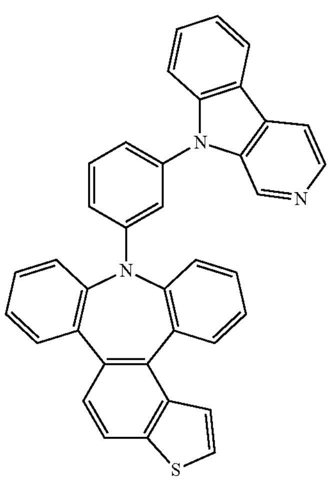
-continued
2-106
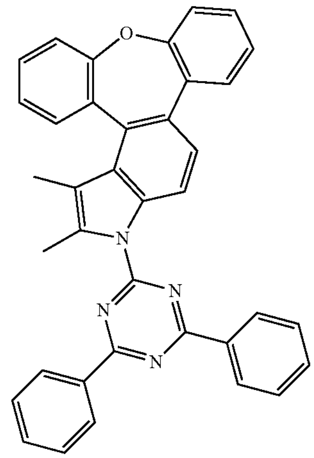
2-107
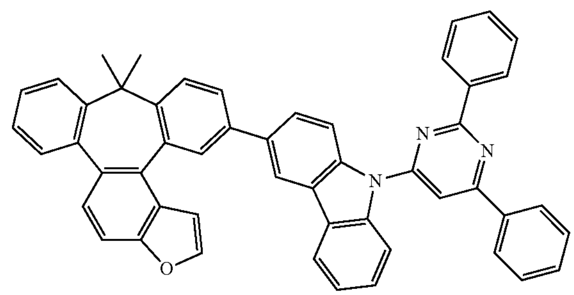
2-108
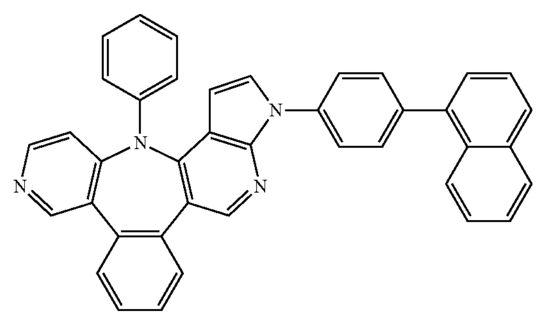
2-109
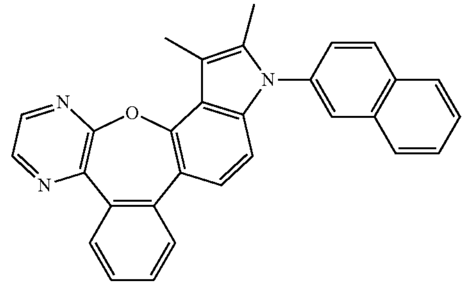

2-110
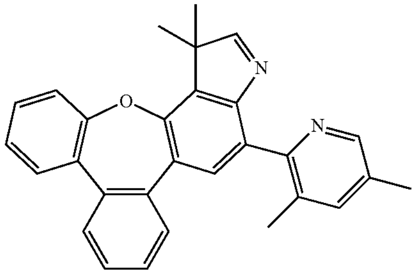
2-111
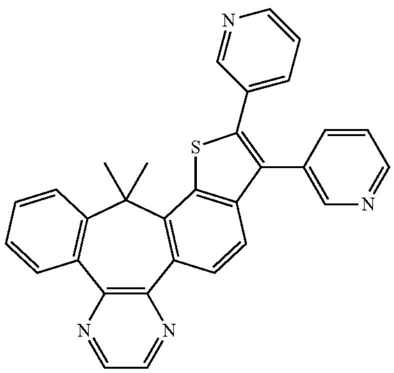
2-112
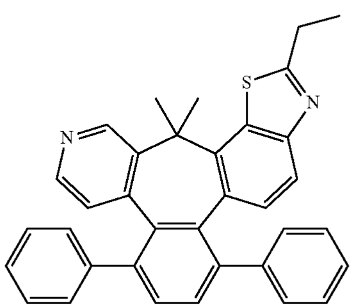
2-113
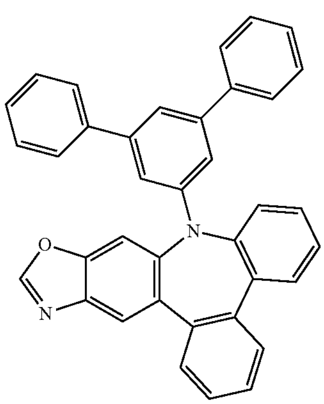
2-114
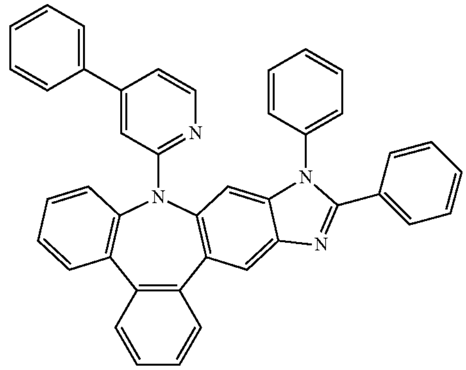
2-115
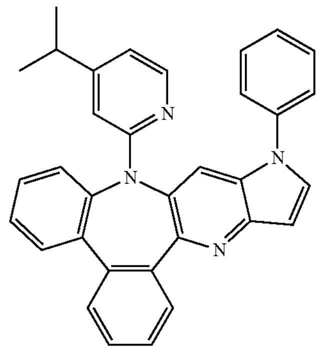
2-116
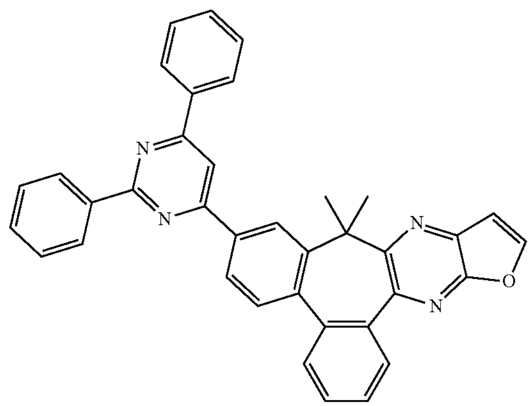
2-117
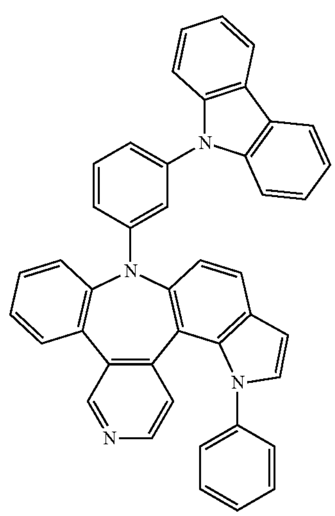

2-118
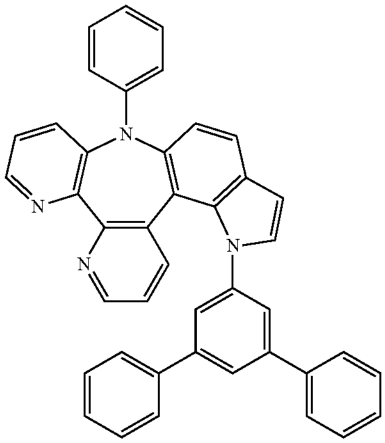
2-119
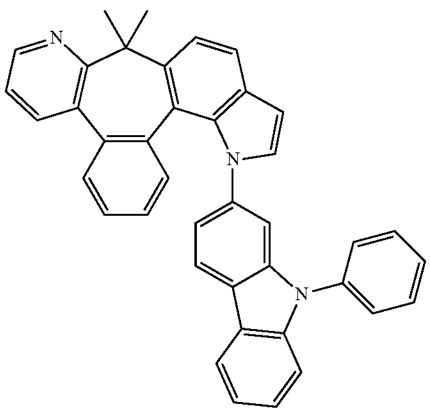
2-220
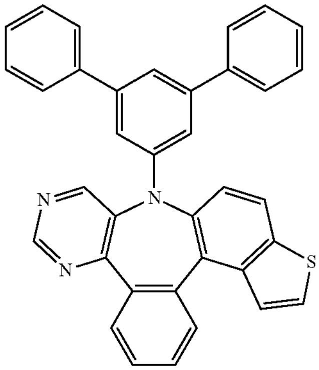
2-121
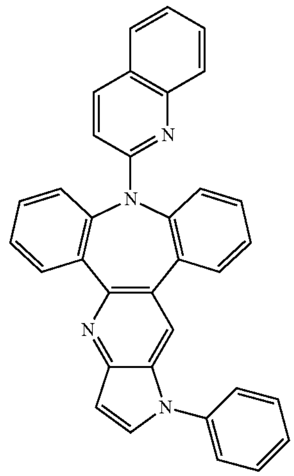
2-122
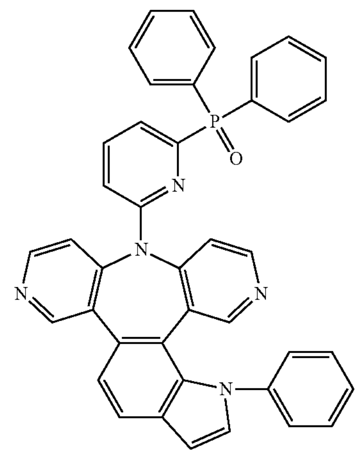
2-123
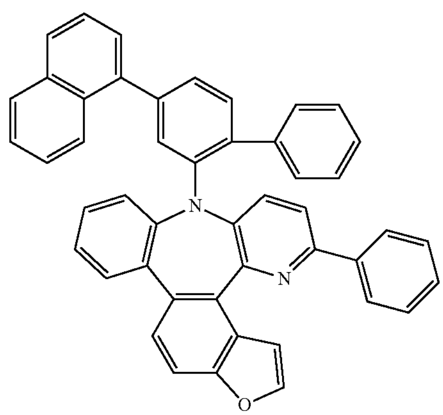

-continued
2-124
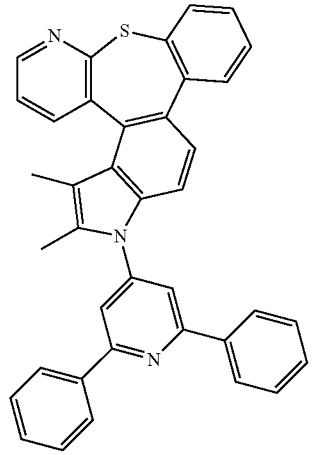
2-125
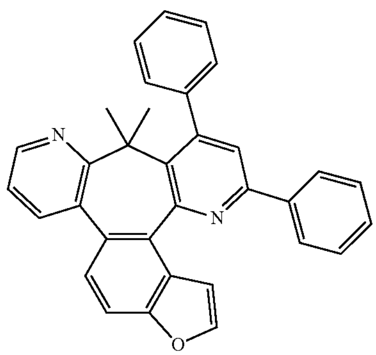
2-126
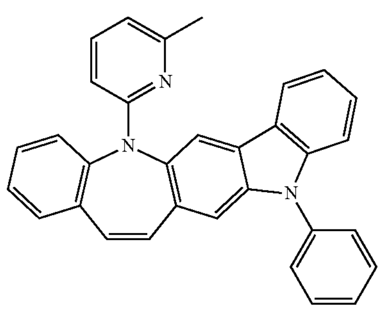
2-127
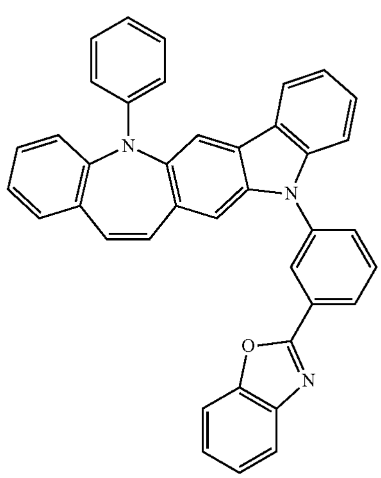
-continued
2-128
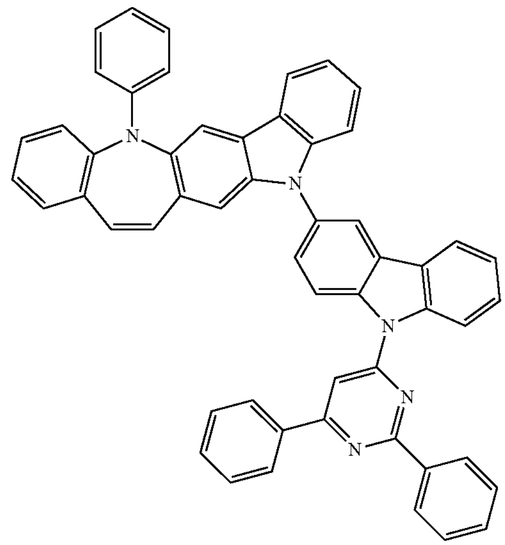
2-129
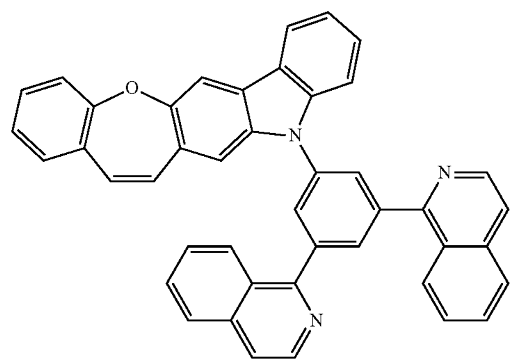
2-130
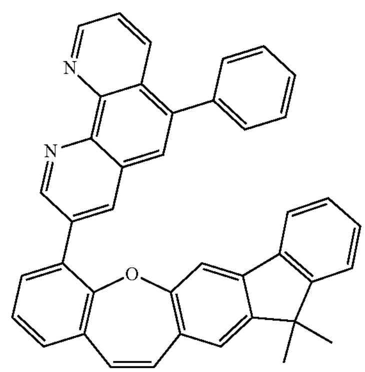
2-131
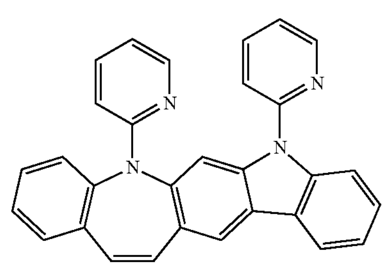

-continued
2-132
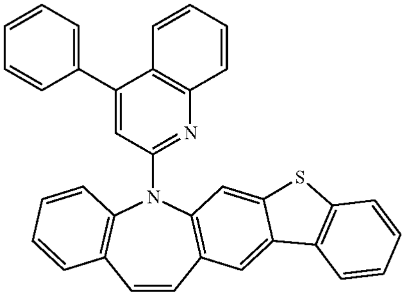
2-133
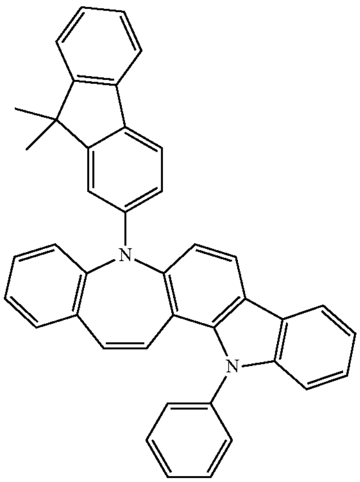
134
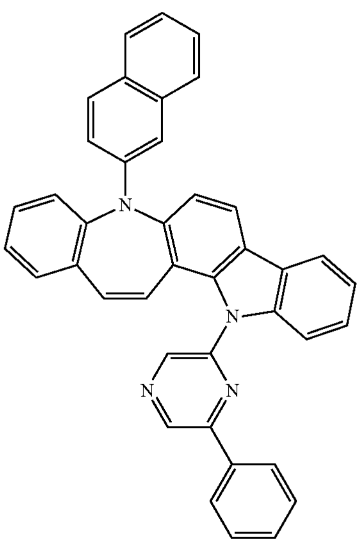
2-135
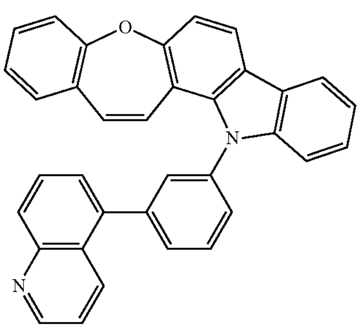
-continued
2-136
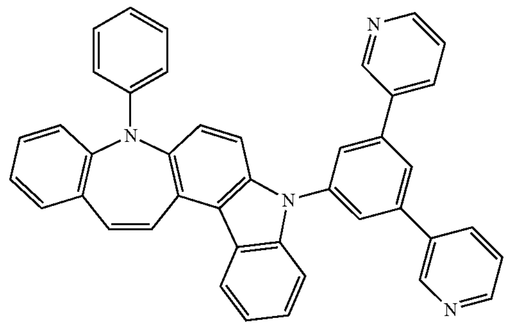
2-137
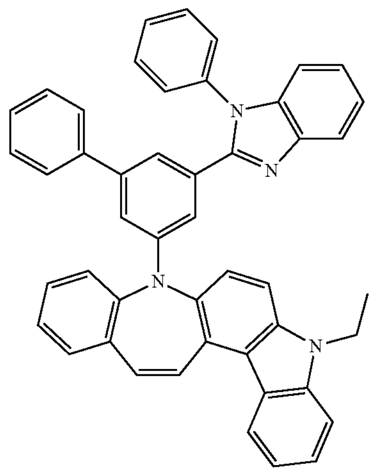
2-138
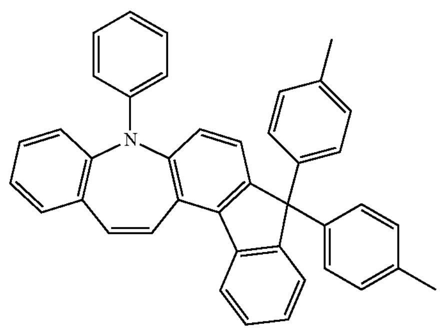
2-139
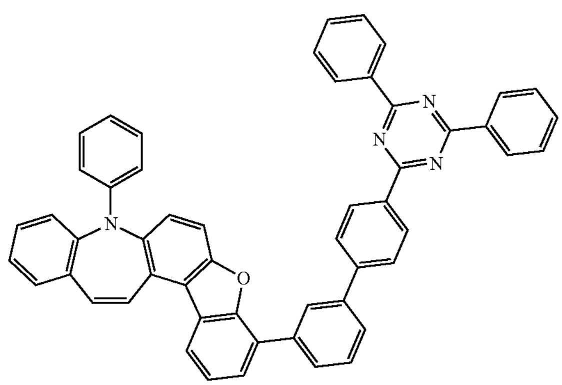

-continued
2-140
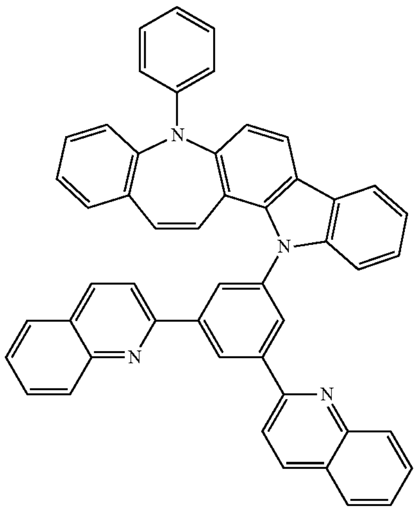
2-141
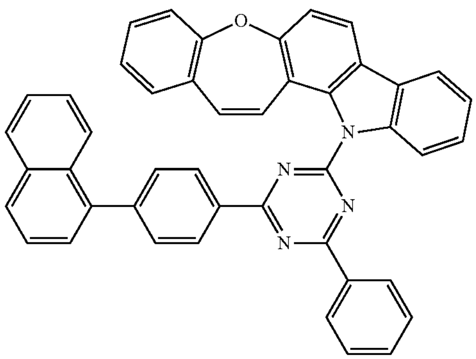
2-142
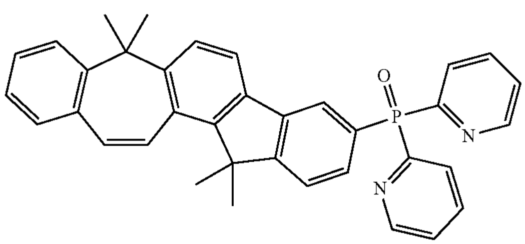
2-143
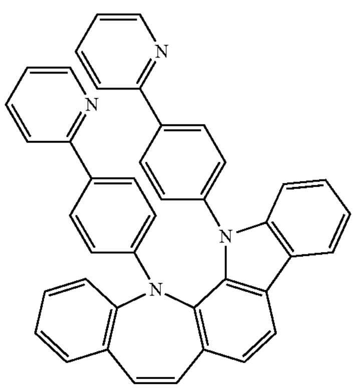
-continued
2-144
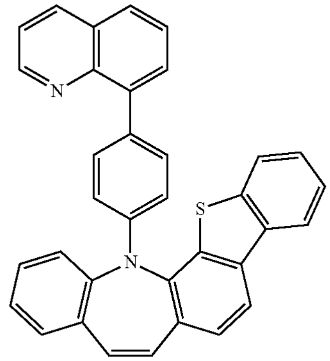
2-145
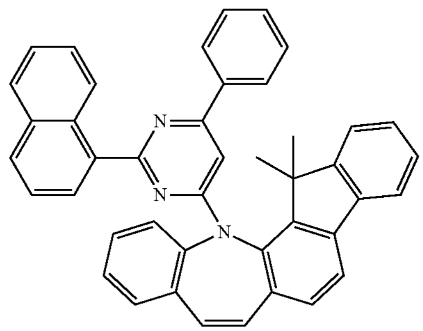
2-146
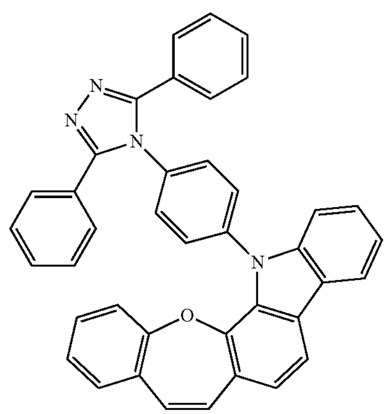
2-147
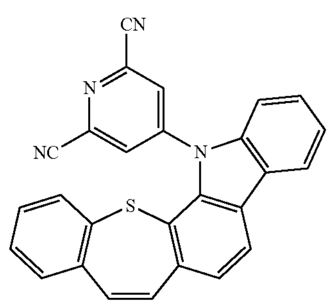

-continued
2-148
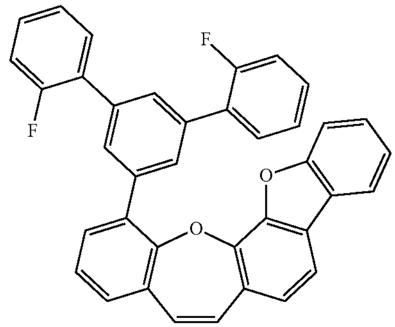
2-149
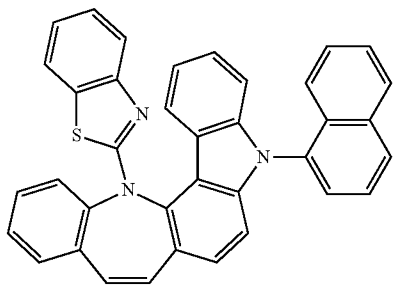
2-150
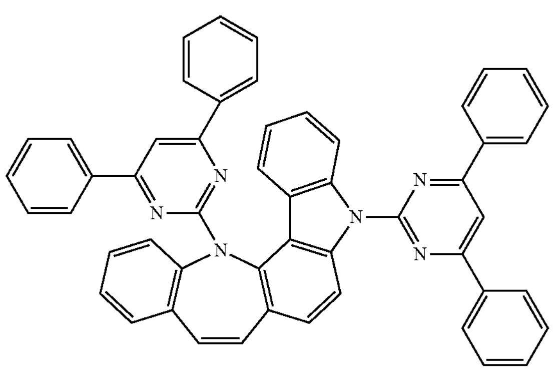
2-151
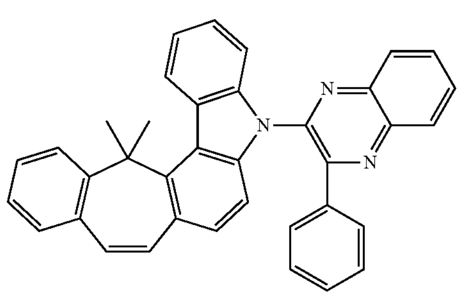
-continued
2-152
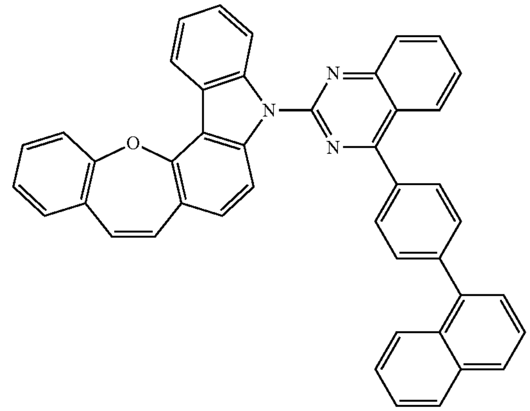
2-153
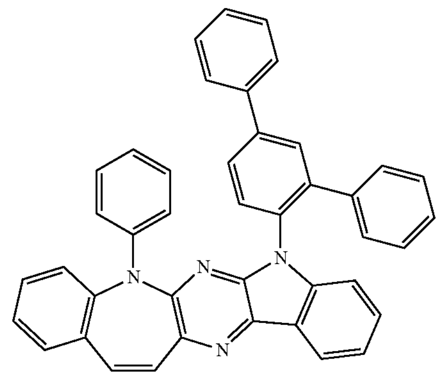
2-154
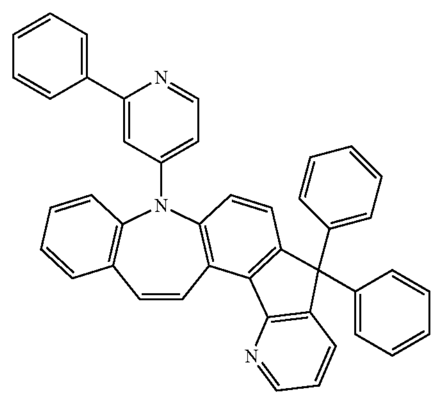
2-155
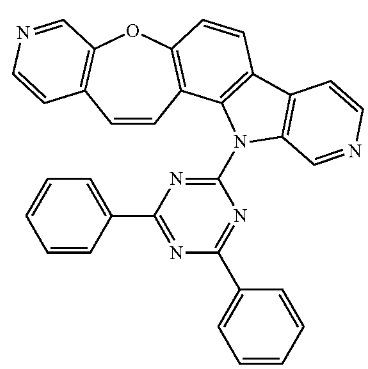

-continued
2-156
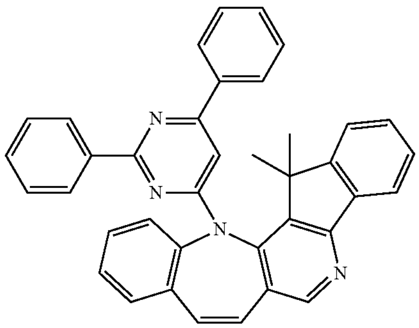
2-157
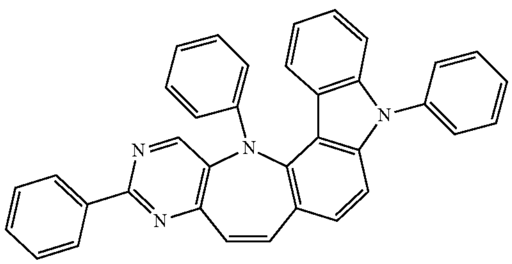
2-158
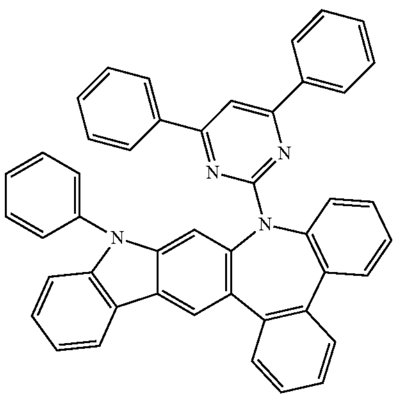
2-159
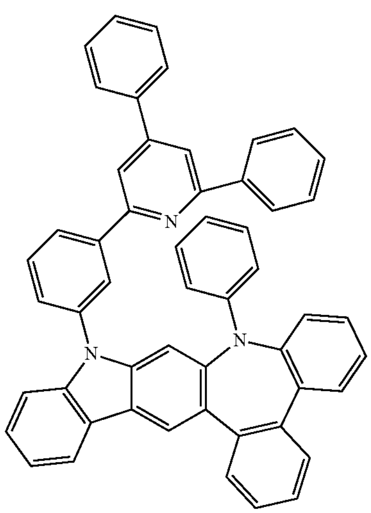
-continued
2-160
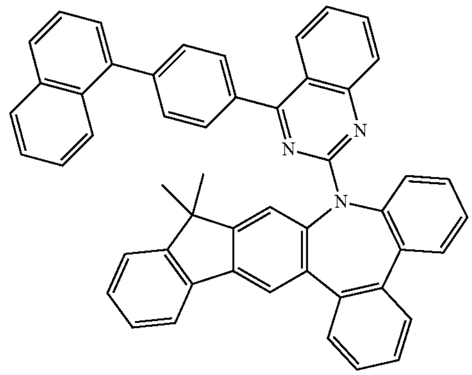
2-161
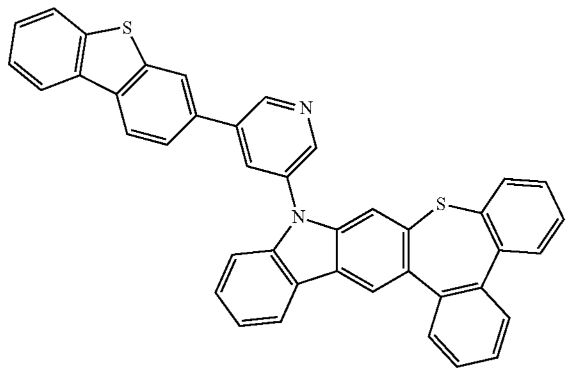
2-162
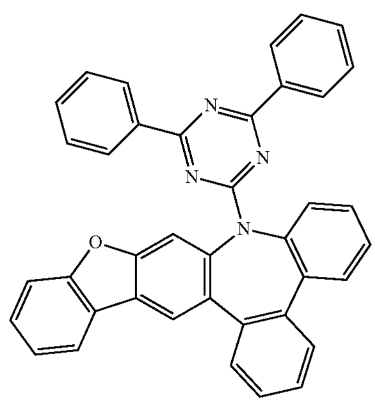
2-163
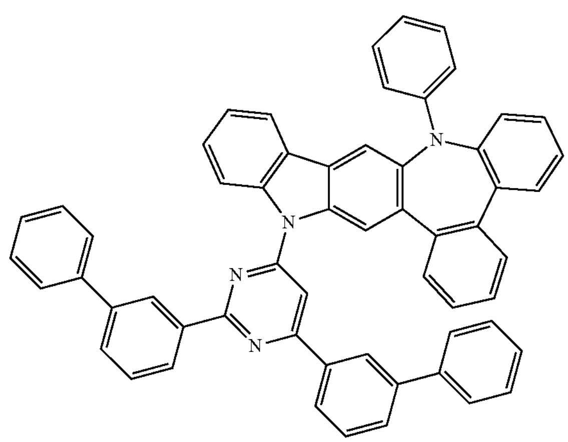

2-164
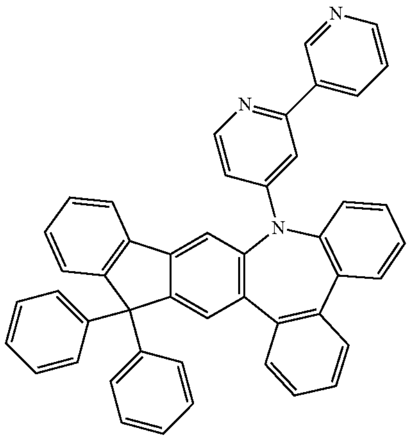
2-165
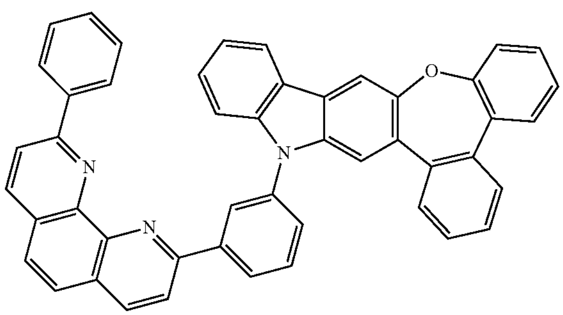
2-166
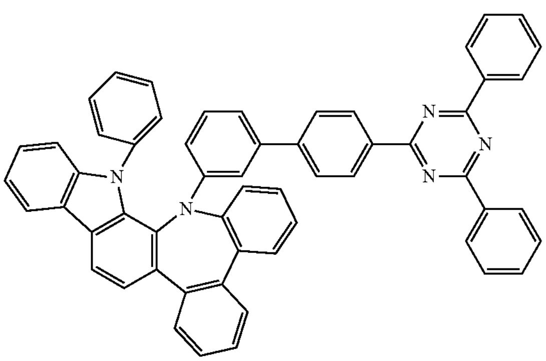
2-167
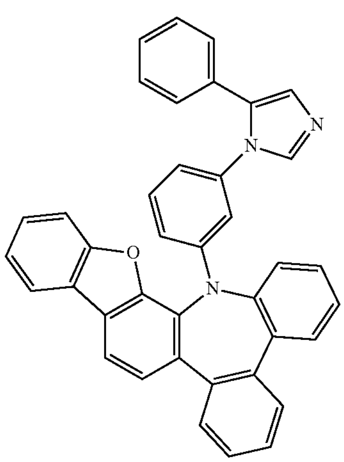
2-168
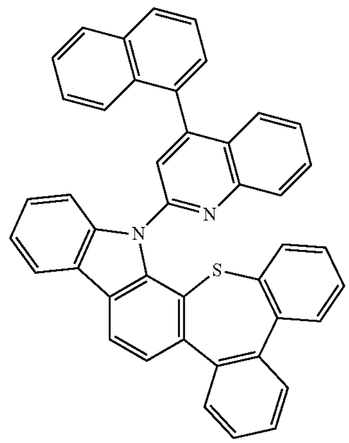
2-169
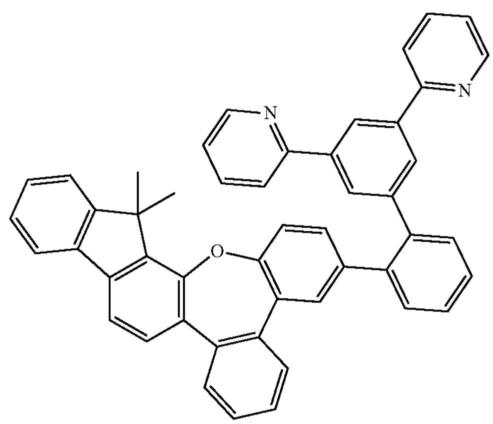
2-170
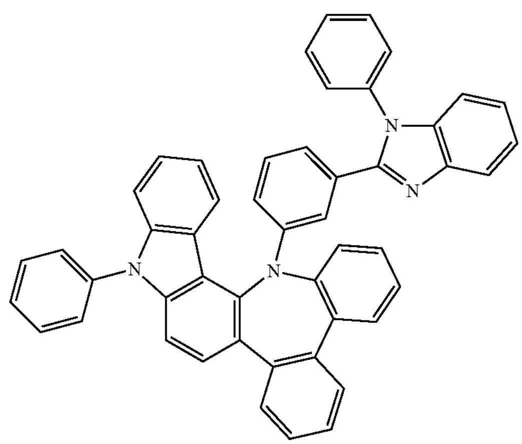

2-171
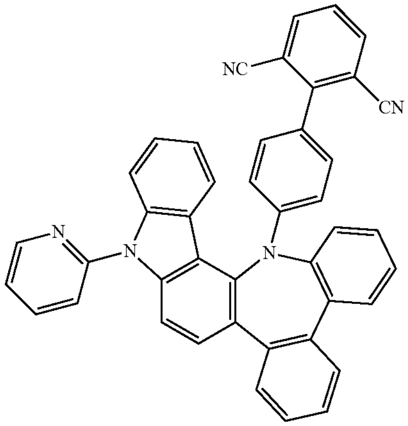
2-172
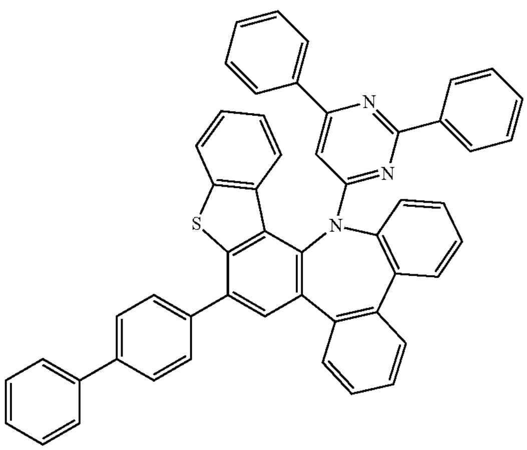
2-173
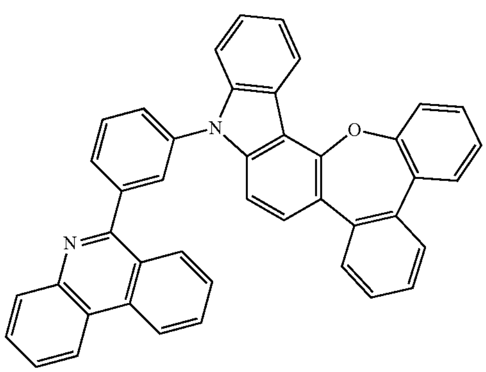
2-174
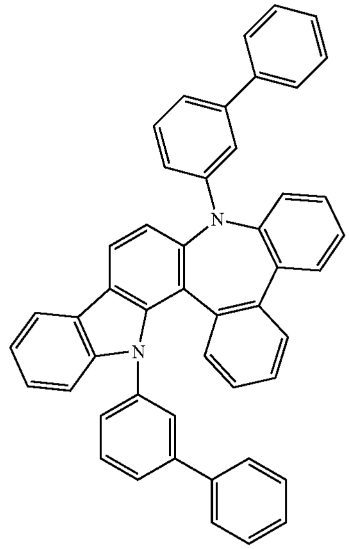
2-175
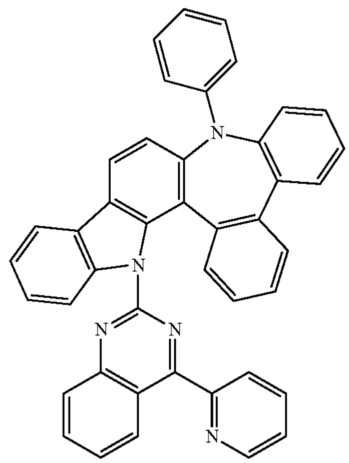
2-176
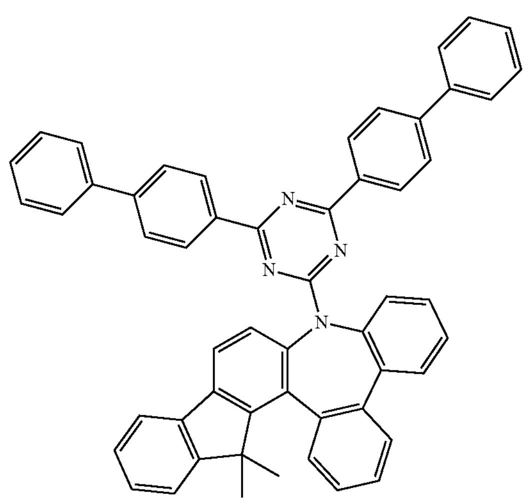

2-177
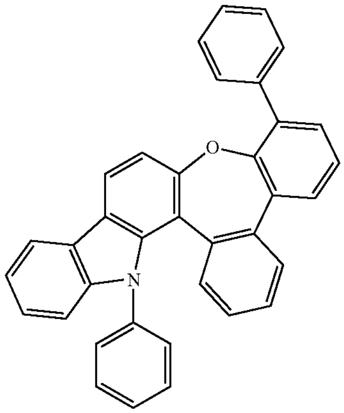
2-178
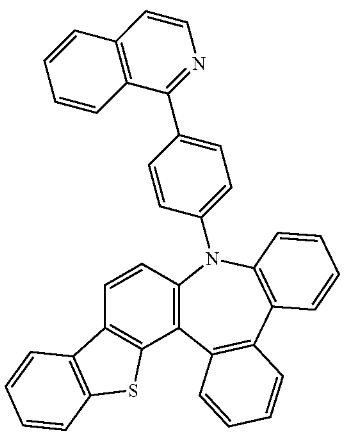
2-179
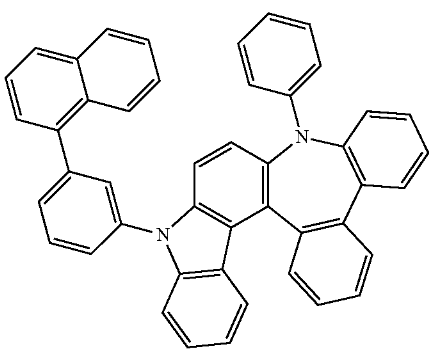
2-180
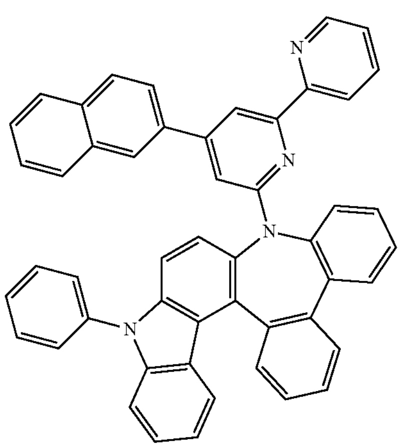
2-181
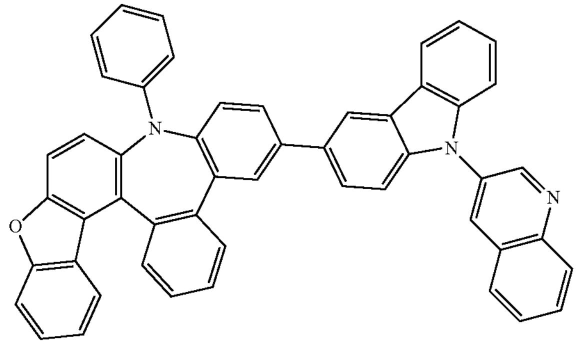
2-182
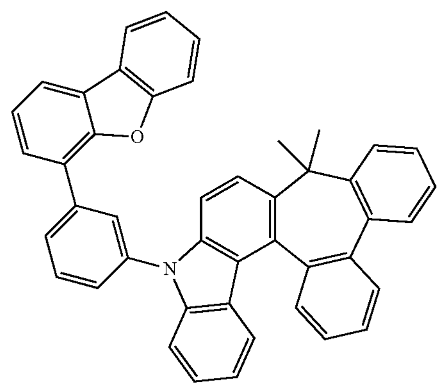
2-183
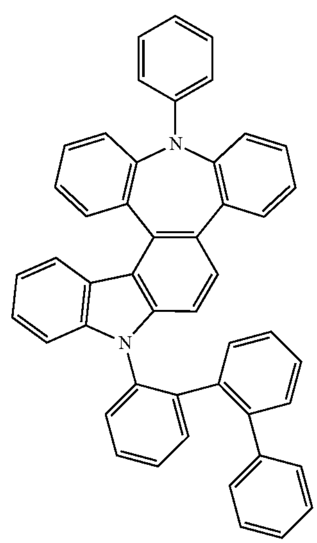

-continued
2-184
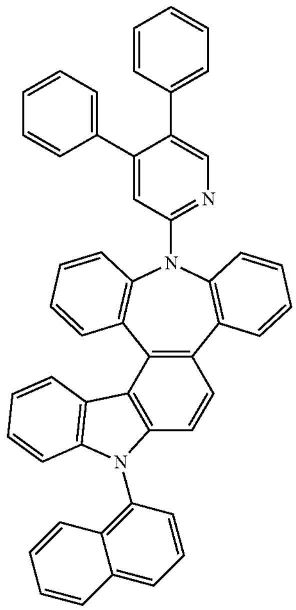
2-185
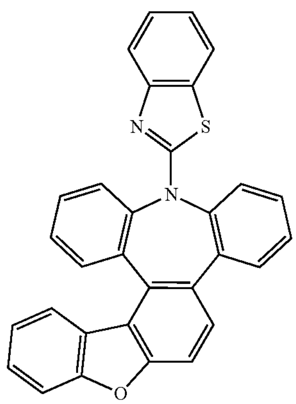
2-186
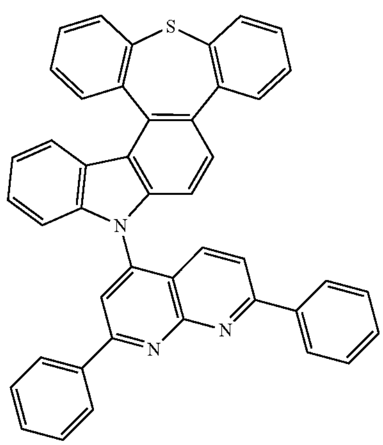
-continued
2-187
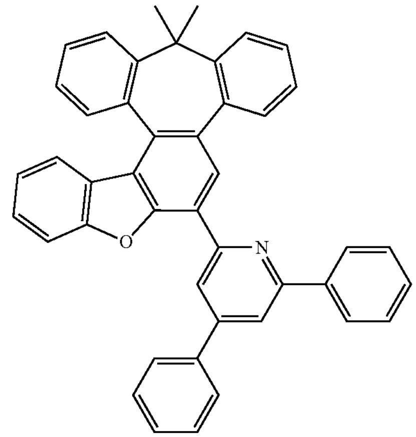
2-188
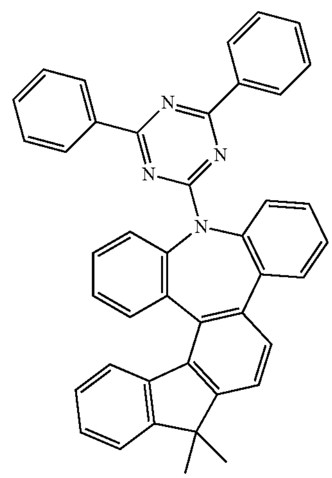
2-189
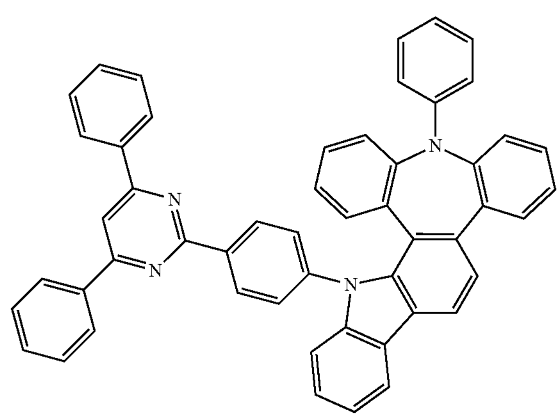

-continued
2-190
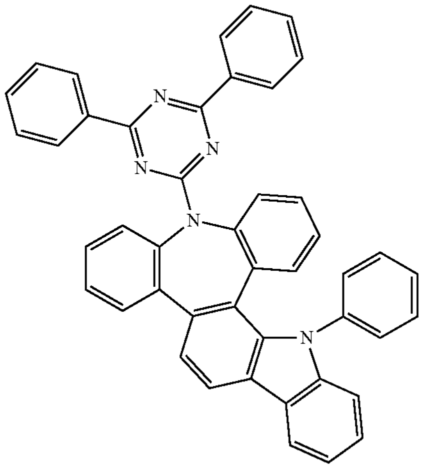
2-191
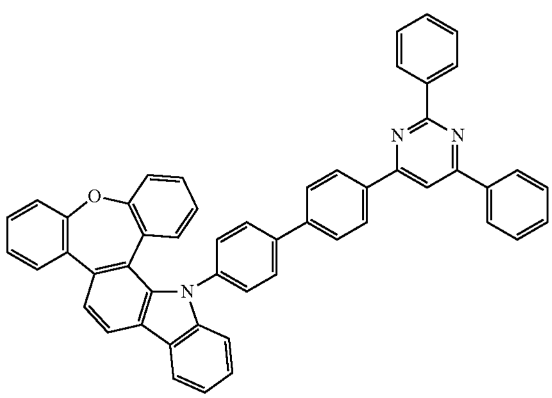
2-192
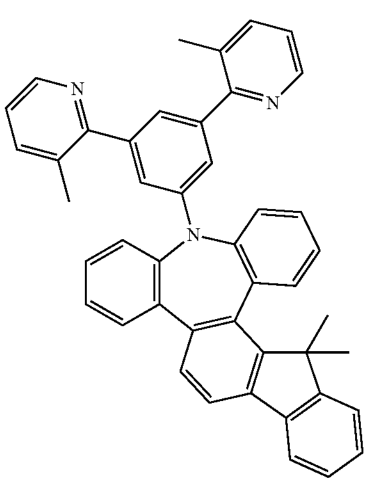
-continued
2-193
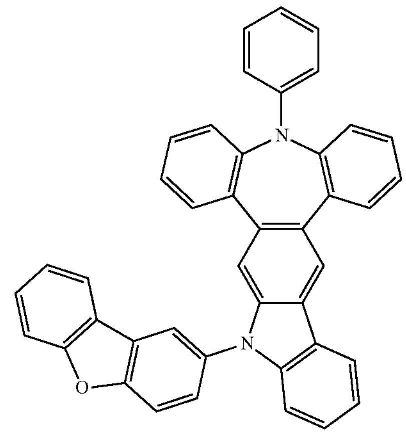
2-194
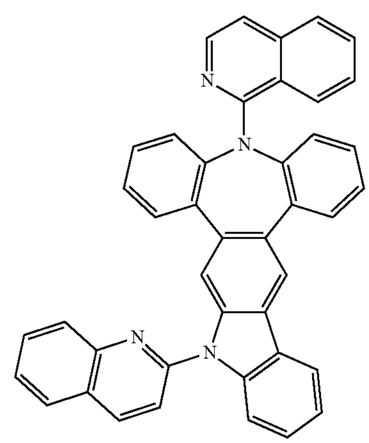
2-195
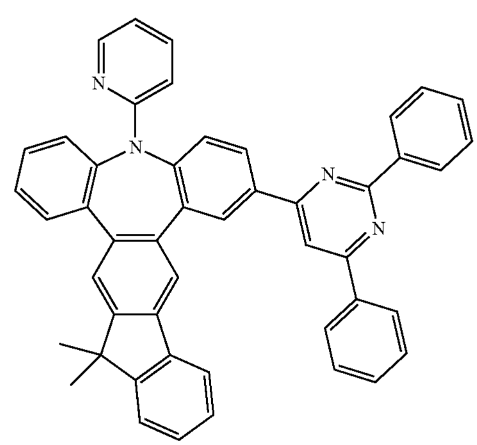

-continued
2-196
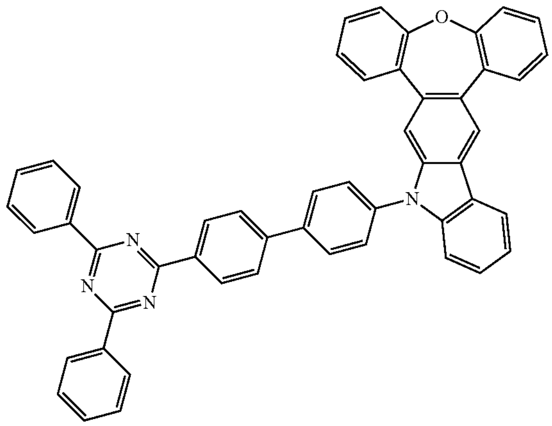
2-197
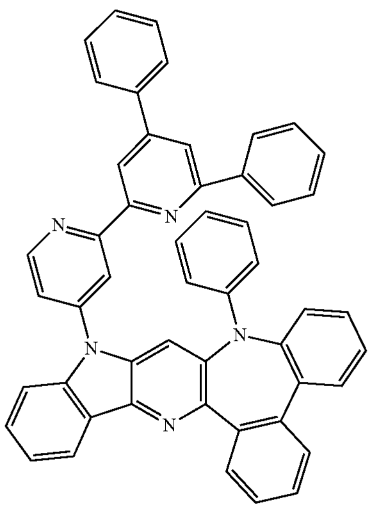
2-198
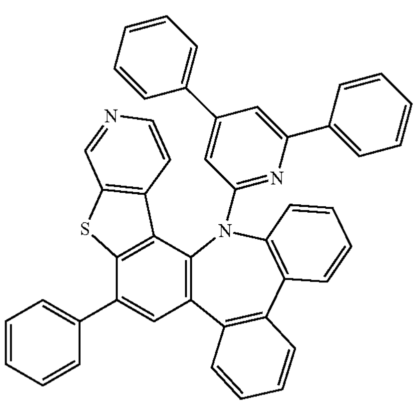
-continued
2-199
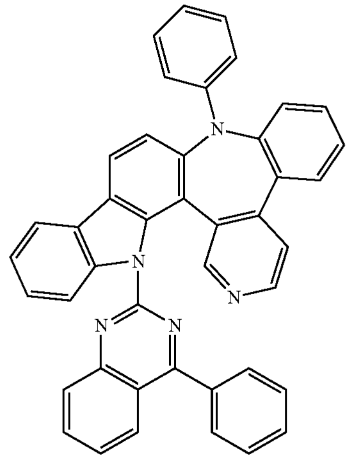
2-200
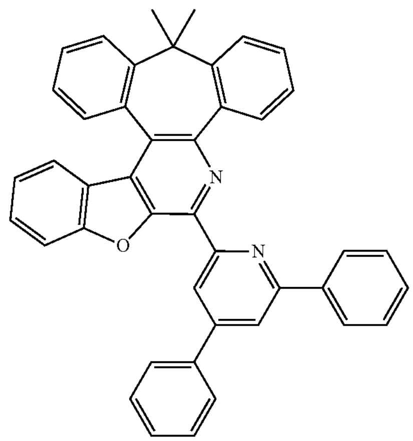
2-201
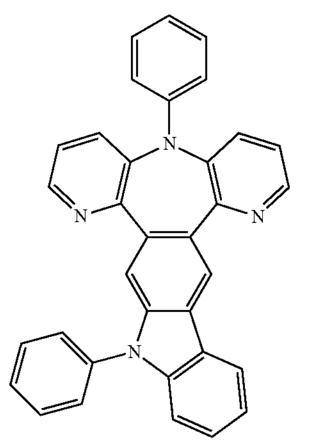

-continued
2-202
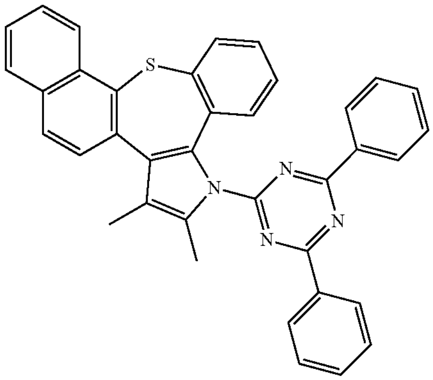
2-203
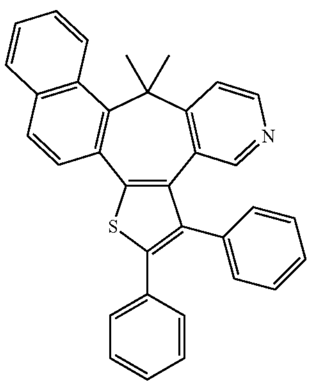
2-204
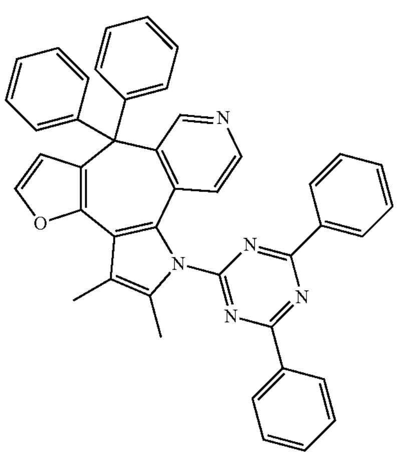
-continued
2-205
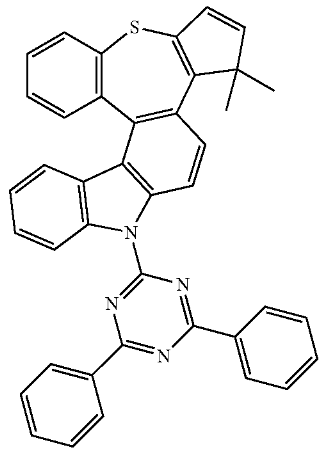
2-206
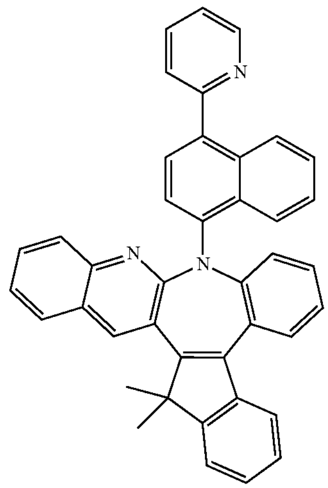
2-207
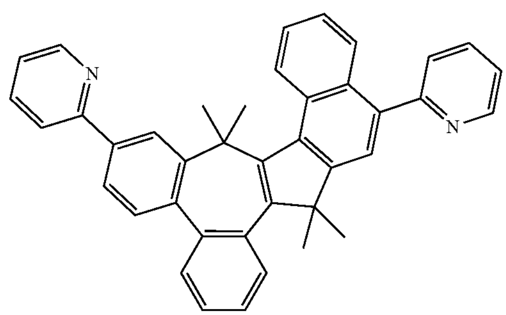
2-208
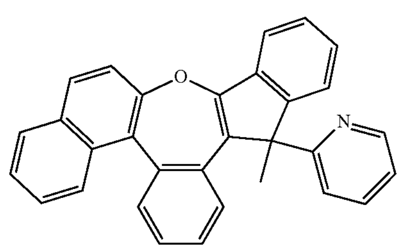

2-209
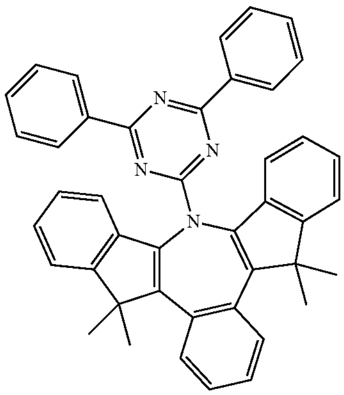
2-210
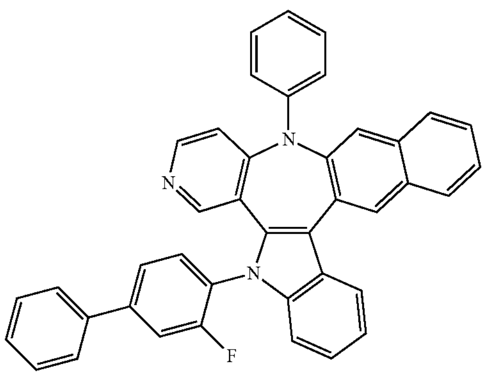
2-211
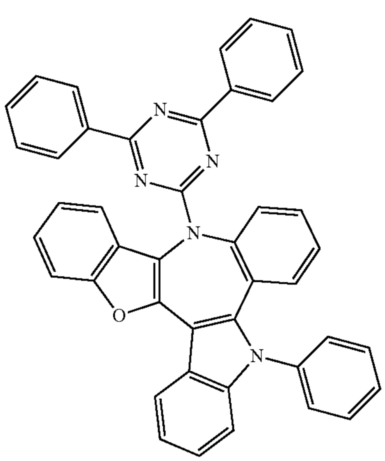
2-212
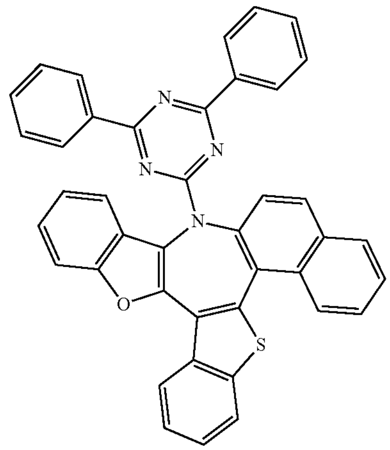
2-213
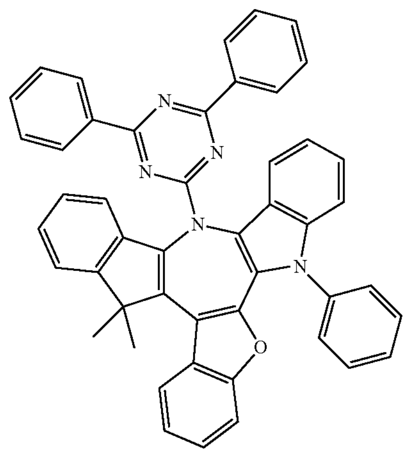
2-214
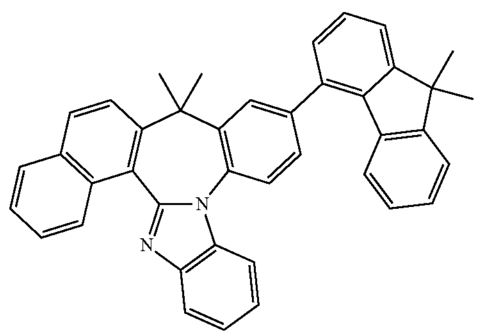
2-215
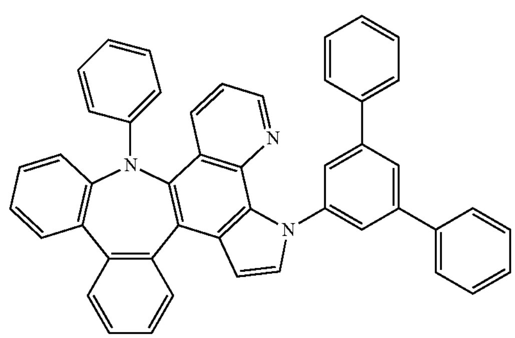

-continued
2-216
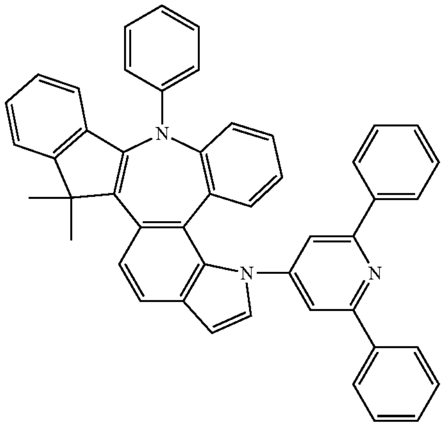
2-217
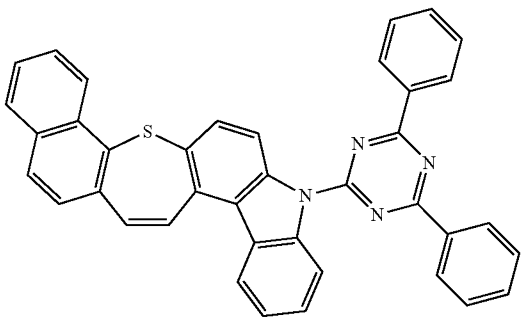
2-218
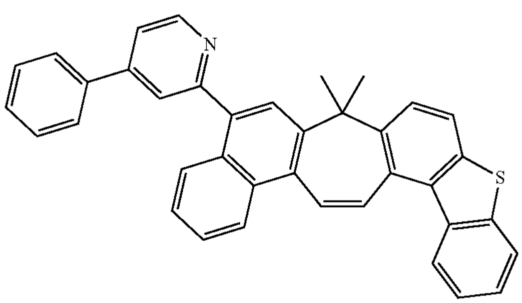
2-219
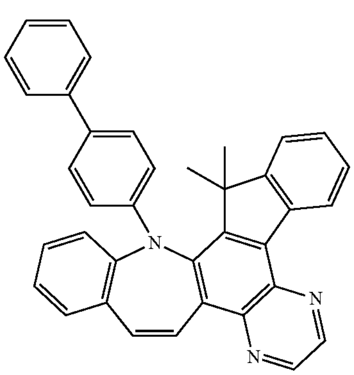
-continued
2-220
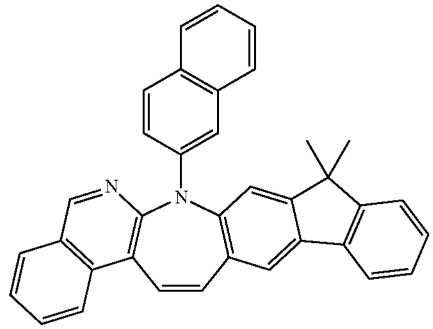
2-221
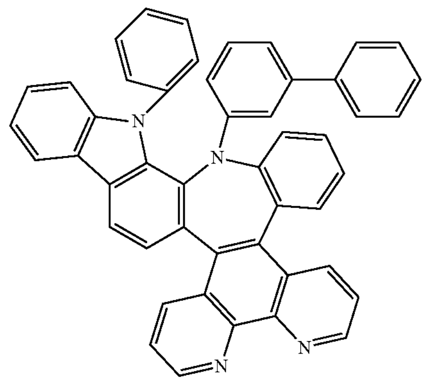
2-222
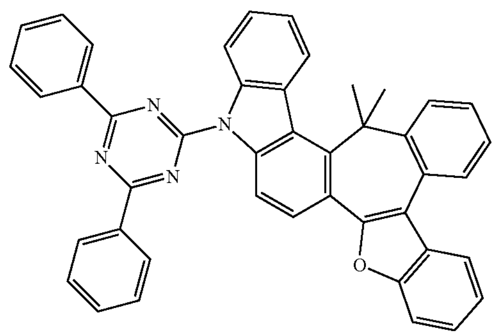
2-223
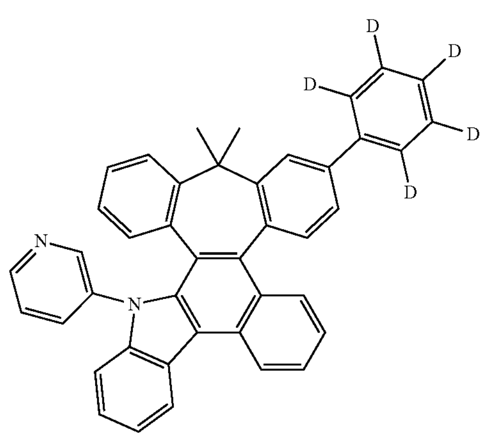

2-224
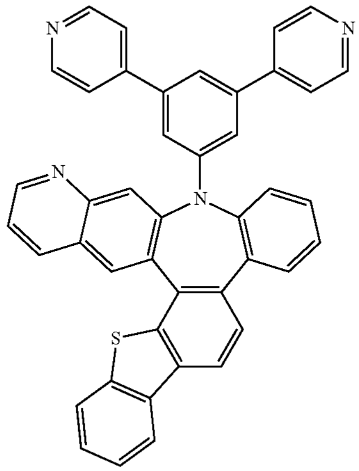
2-225
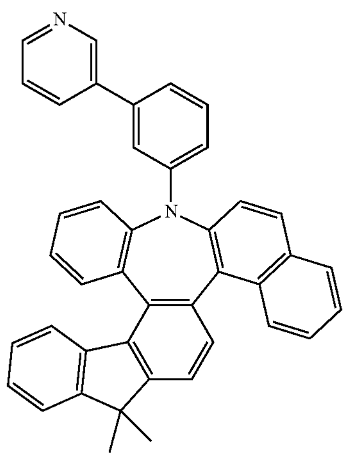
2-226
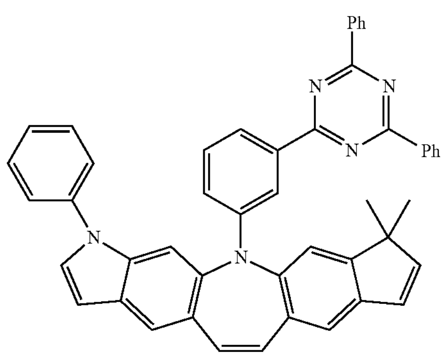
2-227
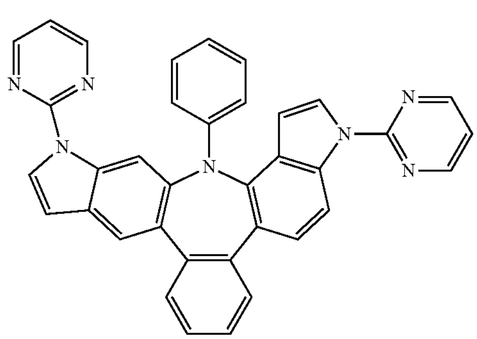
2-228
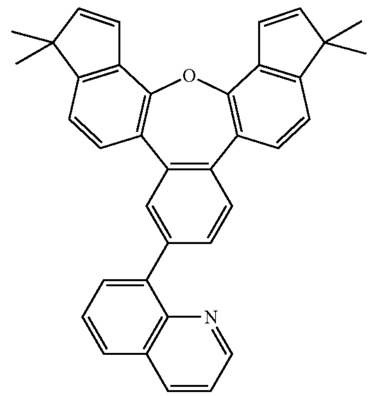
2-229
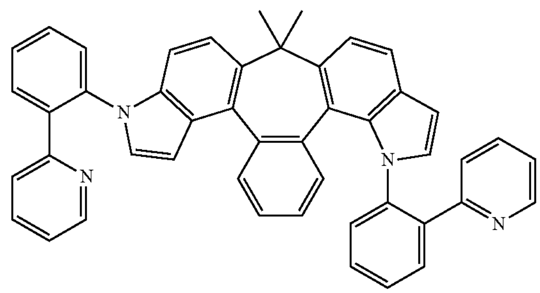
2-230
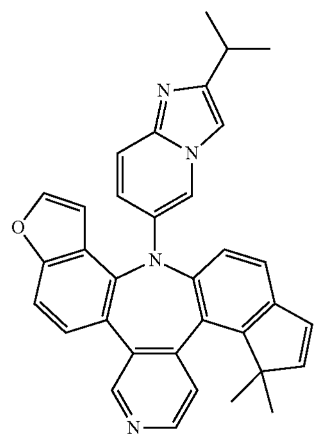
2-231
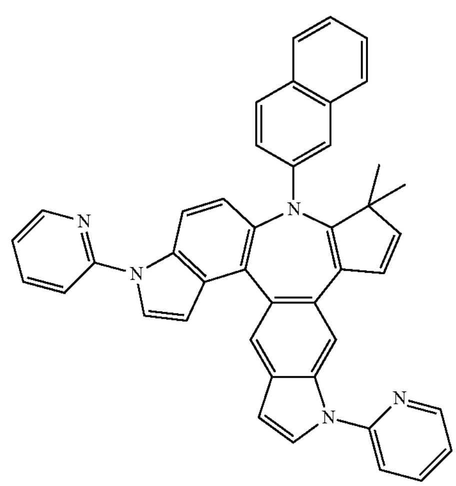

-continued
2-232
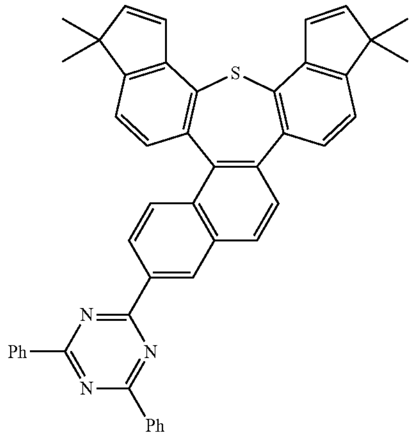
2-233
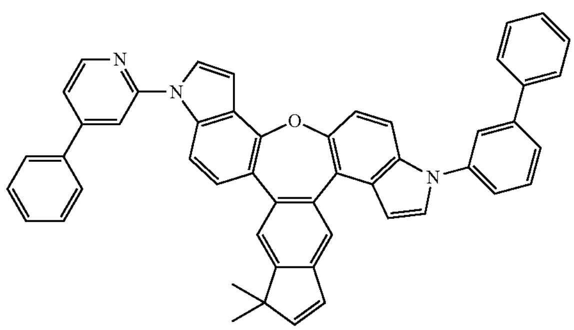
2-234
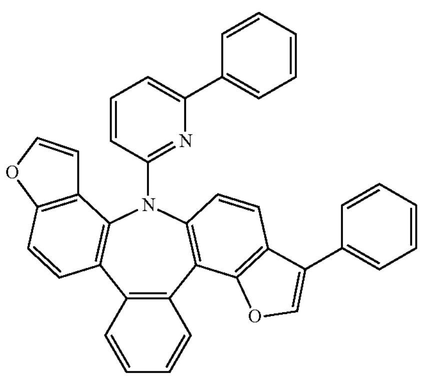
2-235
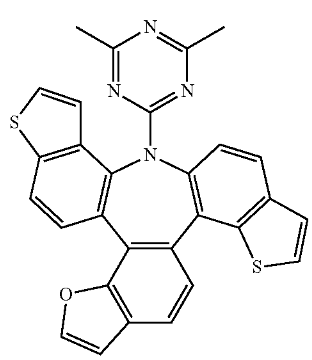
-continued
2-236
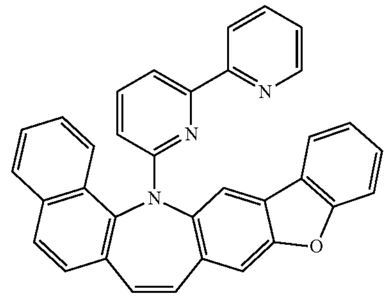
2-237
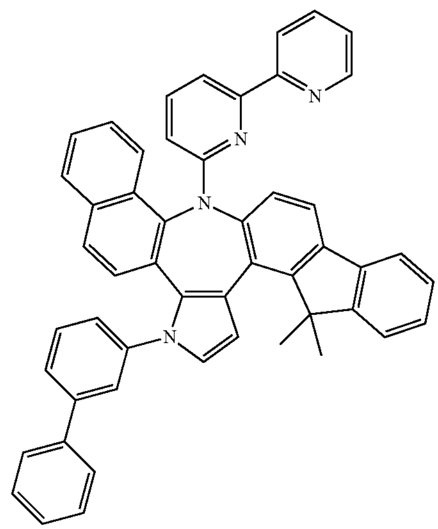
2-238
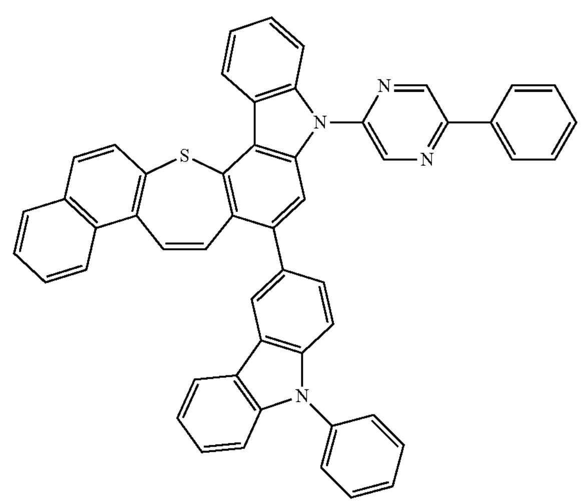

-continued
2-239
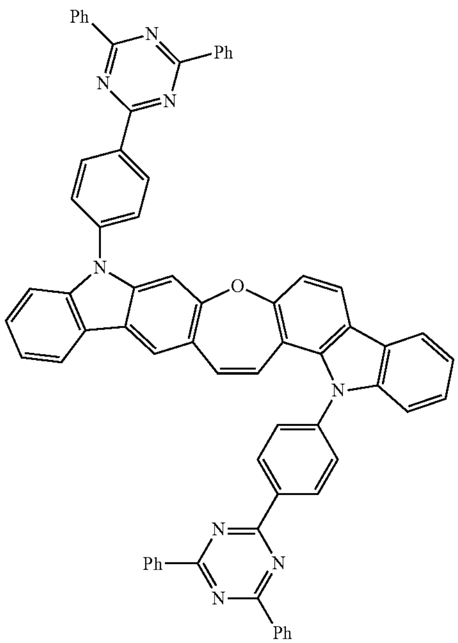
2-241
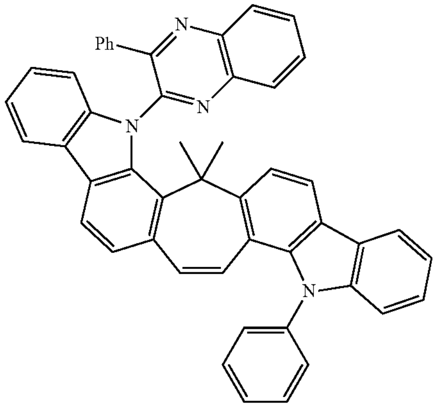
2-241
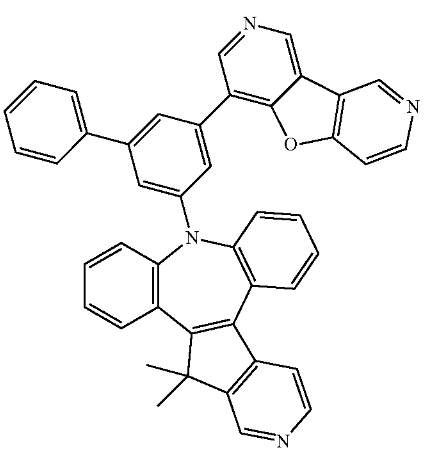
-continued
2-242
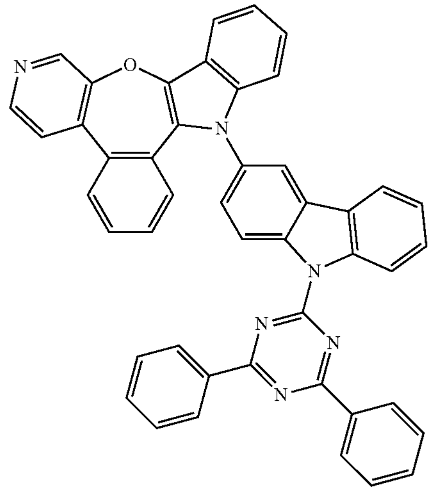
2-243
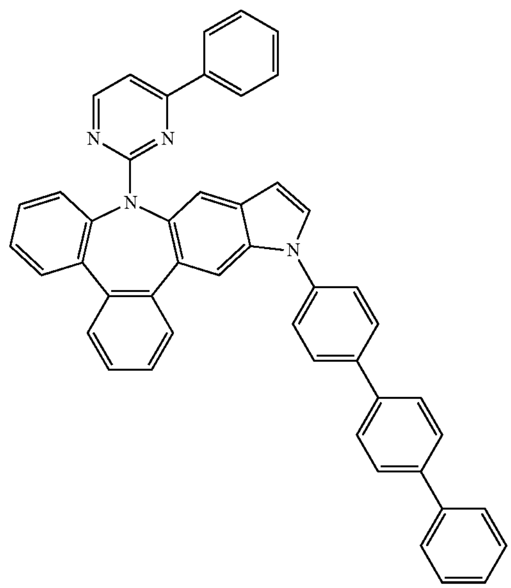
2-244
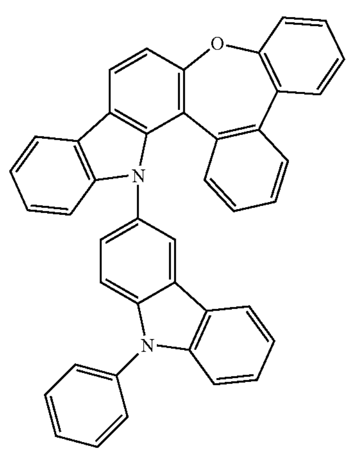

-continued
2-245
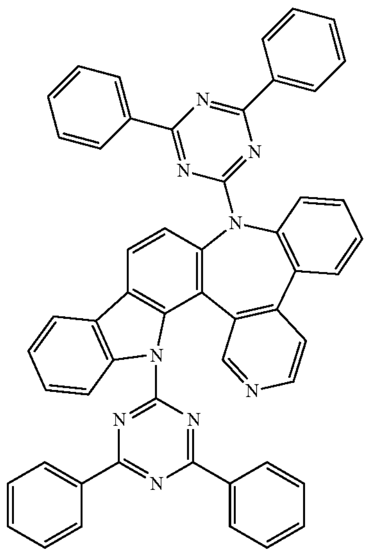
2-246
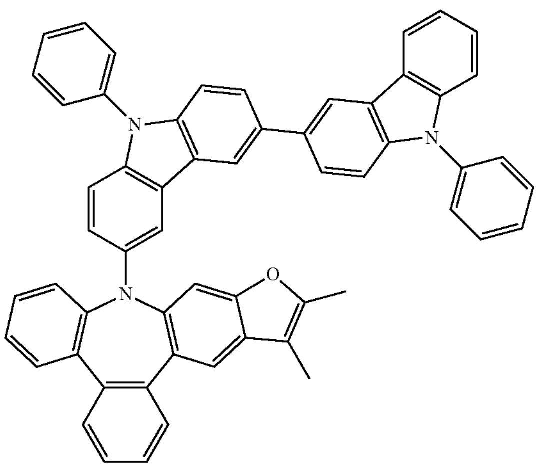
2-247
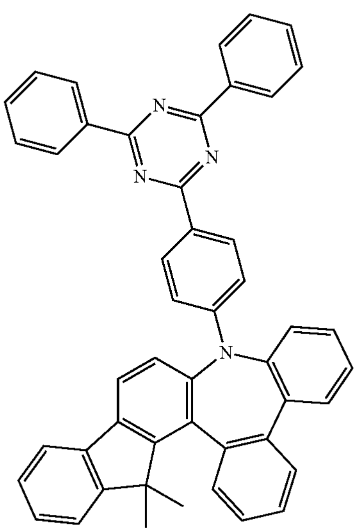
-continued
2-248
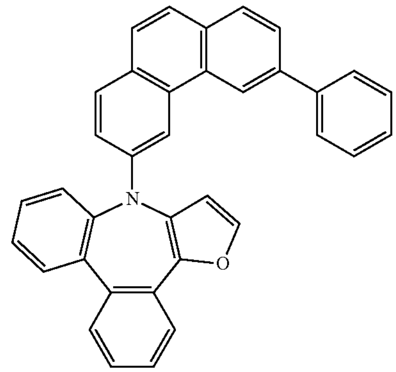
2-249
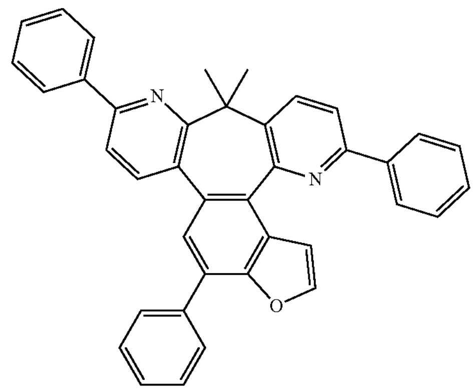
2-250
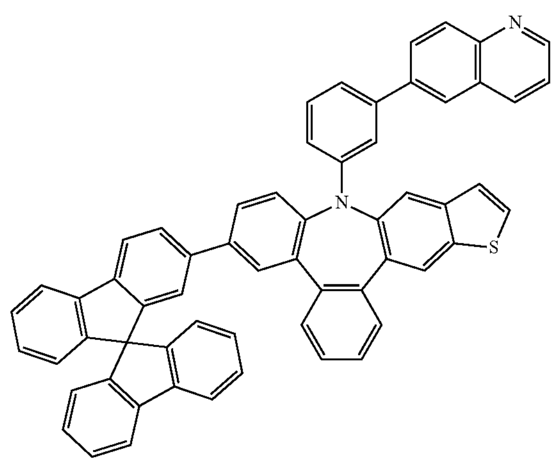
2-251
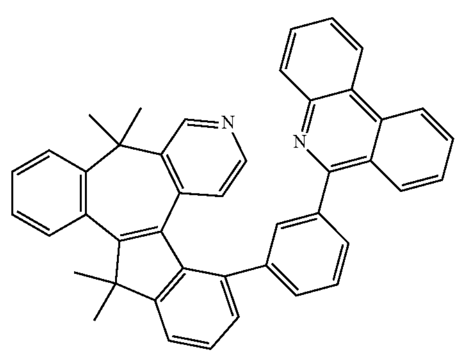

-continued
2-252
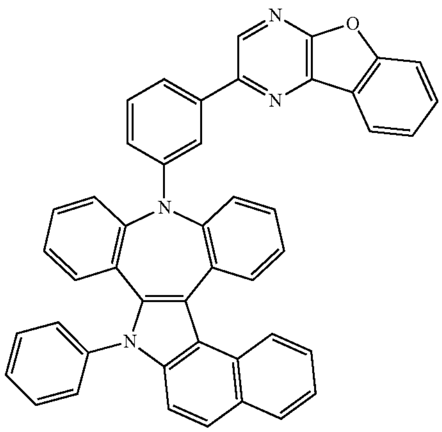
2-253
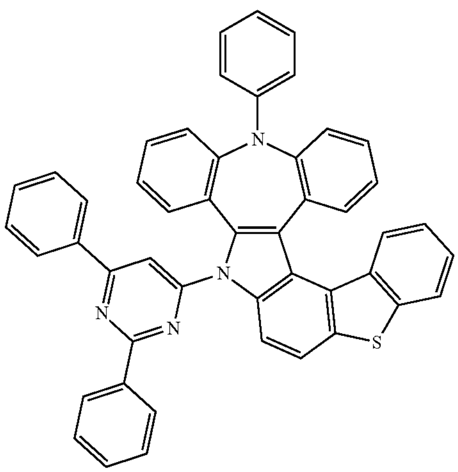
2-254
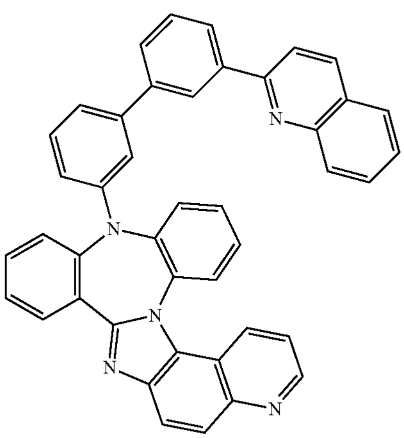
-continued
2-255
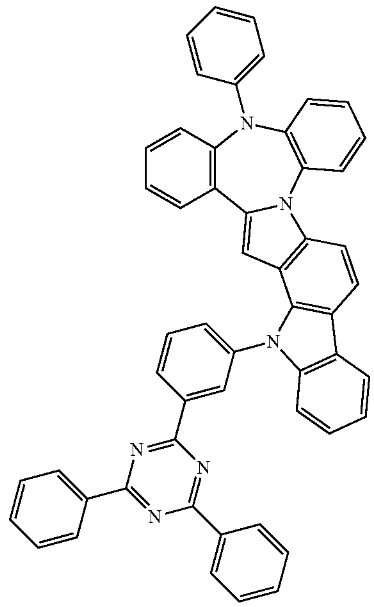
2-256
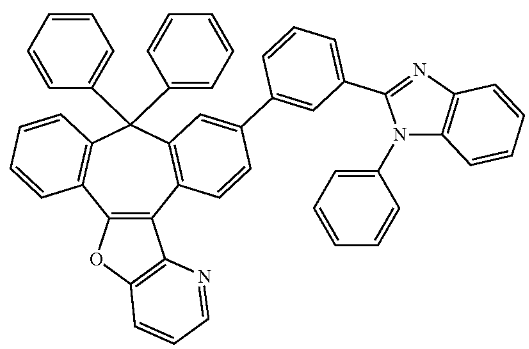
2-257
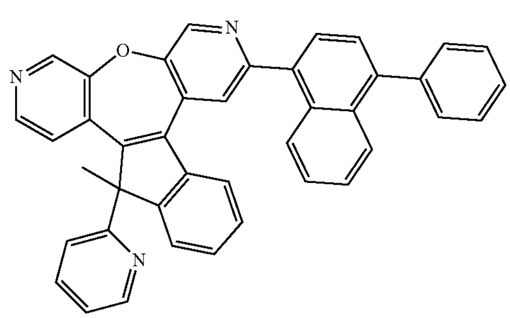

-continued 2-258

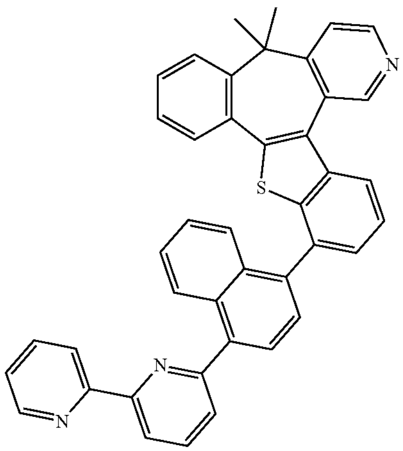

2-259

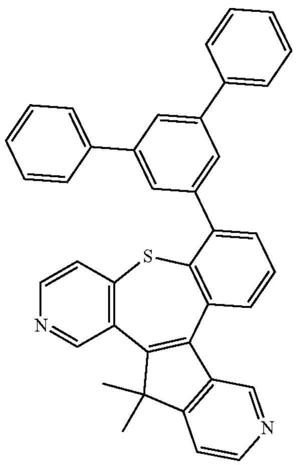

2-260

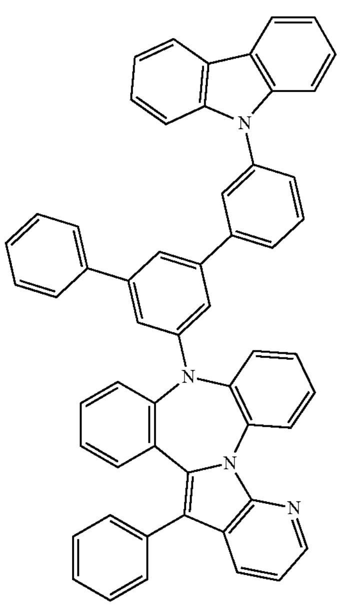

-continued 2-261

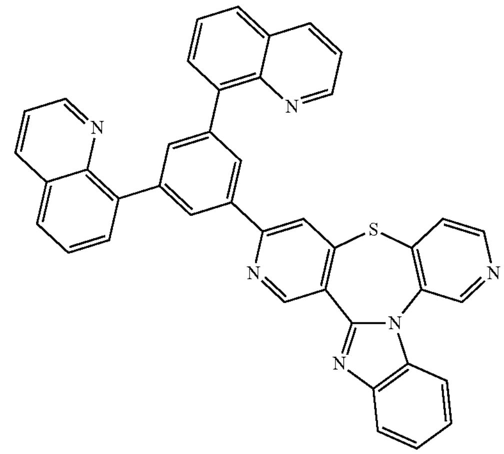

2-262

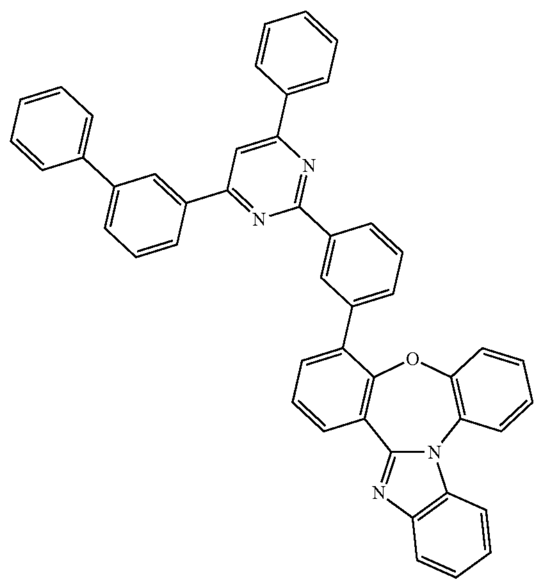

In Formulae 1A to 1E, any suitable combinations of ring $A_1$, ring $A_2$, $L_1$ to $L_{14}$, a1 to a14, $R_1$ to $R_{14}$, b1 to b14, c13, and c14 may be used within the scopes described herein.

In Formulae 2A and 2B, any suitable combinations of ring $A_{21}$, ring $A_{22}$, ring $A_{23}$, $X_{21}$, and $T_{11}$ to $T_{14}$ may be used within the scopes described herein.

Regarding $*\text{-}[(L_{22})_{a22}\text{-}(R_{22})_{b22}]$, $C(R_{23})(R_{24})$, $Si(R_{23})(R_{24})$, and $N\text{-}[(L_{21})_{a21}\text{-}(R_{21})_{b21}]$, any suitable combinations of $L_{21}$, $L_{22}$, a21, a22, $R_{21}$ to $R_{24}$, b21, and b22 may be used within the scopes described herein.

In one or more embodiments, the hole transport region may include an emission auxiliary layer. The emission auxiliary layer may directly contact the emission layer, and the second compound represented by Formula 2A or 2B may be included in the emission auxiliary layer.

In one or more embodiments, the electron transport region may include a buffer layer. The buffer layer may directly contact the emission layer, and the second compound represented by Formula 2A or 2B may be included in the buffer layer, but embodiments of the present disclosure are not limited thereto.

When both the hole transport region and the electron transport region in the organic light-emitting device include the second compound represented by Formula 2A or 2B as described above, the second compound included in the hole transport region and the second compound included in the electron transport region may be identical to or different from each other.

The electron transport region may include an electron transport layer, and the first compound represented by one selected from Formulae 1A to 1E may be included in the electron transport layer.

In one or more embodiments, the electron transport region may include a buffer layer, as well as an electron transport layer between the buffer layer and the second electrode. The second compound represented by Formula 2A or 2B may be included in the buffer layer, and the first compound represented by one selected from Formulae 1A to 1E may be included in the electron transport layer.

Description of FIG. 1

FIG. 1 is a schematic view of an organic light-emitting device 10 according to an embodiment of the present disclosure. The organic light-emitting device 10 may include a first electrode 110, an organic layer 150, and a second electrode 190.

Hereinafter, the structure of the organic light-emitting device 10 according to an embodiment of the present disclosure and a method of manufacturing the organic light-emitting device 10 will be described in connection with FIG. 1.

First Electrode 110

In FIG. 1, a substrate may be under the first electrode 110 or above the second electrode 190. The substrate may be a glass substrate or a plastic substrate, each having excellent mechanical strength, thermal stability, transparency, surface smoothness, ease of handling, and/or water-resistance.

The first electrode 110 may be formed by depositing and/or sputtering a material for forming the first electrode 110 on the substrate. When the first electrode 110 is an anode, the material for forming the first electrode may be selected from materials with a high work function in order to facilitate hole injection.

The first electrode 110 may be a reflective electrode, a semi-transmissive electrode, or a transmissive electrode. When the first electrode 110 is a transmissive electrode, the material for forming the first electrode may be selected from indium tin oxide (ITO), indium zinc oxide (IZO), tin oxide ($SnO_2$), zinc oxide (ZnO), and combinations thereof, but embodiments of the present disclosure are not limited thereto. In one or more embodiments, when the first electrode 110 is a semi-transmissive electrode or a reflective electrode, the material for forming the first electrode may be selected from magnesium (Mg), silver (Ag), aluminum (Al), aluminum-lithium (Al—Li), calcium (Ca), magnesium-indium (Mg—In), magnesium-silver (Mg—Ag), and combinations thereof, but embodiments of the present disclosure are not limited thereto.

The first electrode 110 may have a single-layered structure, or a multi-layered structure including two or more layers. For example, the first electrode 110 may have a three-layered structure of ITO/Ag/ITO, but embodiments of the structure thereof are not limited thereto.

Organic Layer 150

The organic layer 150 is on the first electrode 110. The organic layer 150 may include an emission layer.

The organic layer 150 may include a hole transport region between the first electrode 110 and the emission layer, and an electron transport region between the emission layer and the second electrode 190.

Hole Transport Region in Organic Layer 150

The hole transport region may have: i) a single-layered structure including a single layer including a single material, ii) a single-layered structure including a single layer including a plurality of different materials, or iii) a multi-layered structure having a plurality of layers including a plurality of different materials.

The hole transport region may include at least one layer selected from a hole injection layer, a hole transport layer, an emission auxiliary layer, and an electron blocking layer.

For example, the hole transport region may have a single-layered structure including a single layer including a plurality of different materials, or a multi-layered structure having a structure of hole injection layer/hole transport layer, hole injection layer/hole transport layer/emission auxiliary layer, hole injection layer/emission auxiliary layer, hole transport layer/emission auxiliary layer, or hole injection layer/hole transport layer/electron blocking layer, wherein layers of each structure are sequentially stacked on the first electrode 110 in each stated order, but embodiments of the structure of the hole transport region are not limited thereto.

The hole transport region may include the second compound represented by Formula 2A or 2B as described above.

In one or more embodiments, the hole transport region may include an emission auxiliary layer. The emission auxiliary layer may directly contact the emission layer.

In one or more embodiments, the hole transport region may include a hole injection layer and a hole transport layer stacked in this stated order on the first electrode 110, a hole injection layer and an emission auxiliary layer stacked in this stated order on the first electrode 110, or a hole injection layer, a hole transport layer, and an emission auxiliary layer stacked in this stated order on the first electrode 110, but embodiments of the present disclosure are not limited thereto.

When the hole transport region includes an emission auxiliary layer, the emission auxiliary layer may further include the second compound represented by Formula 2A or 2B.

The hole transport region may include at least one selected from m-MTDATA, TDATA, 2-TNATA, NPB (NPD), β-NPB, TPD, Spiro-TPD, Spiro-NPB, methylated NPB, TAPC, HMTPD, 4,4',4"-tris(N-carbazolyl)triphenylamine (TCTA), polyaniline/dodecylbenzenesulfonic acid (PANI/DBSA), poly(3,4-ethylenedioxythiophene)/poly(4-styrenesulfonate) (PEDOT/PSS), polyaniline/camphor sulfonic acid (PANI/CSA), polyaniline/poly(4-styrenesulfonate) (PANI/PSS), a compound represented by Formula 201, and a compound represented by Formula 202:

-continued
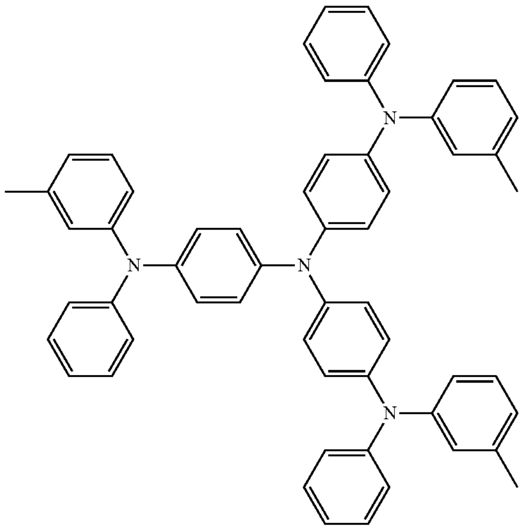
m-MTDATA
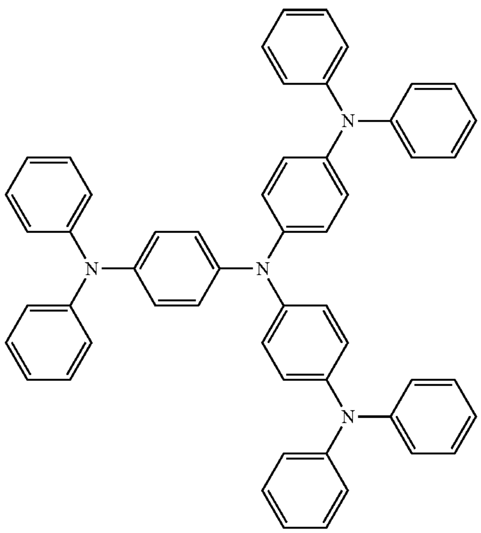
TDATA
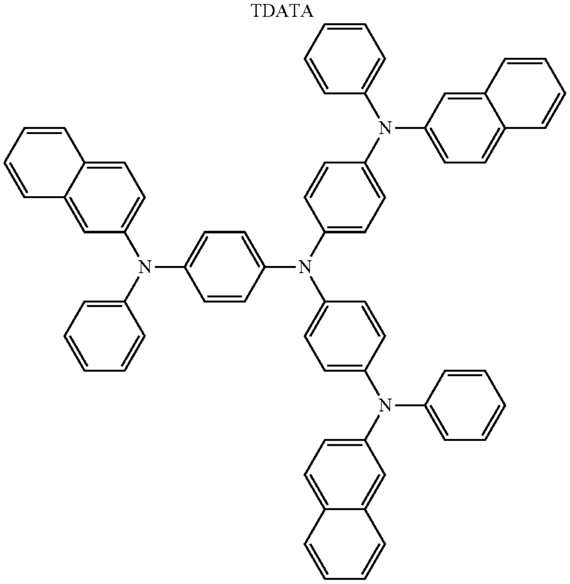
2-TNATA
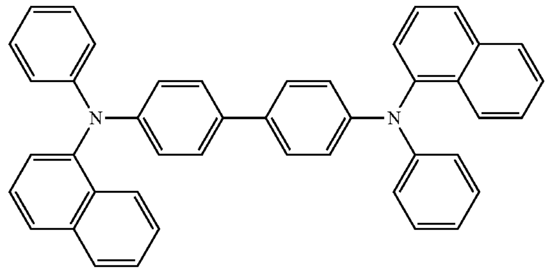
NPB
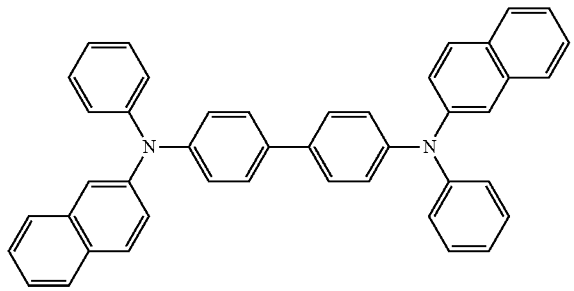
β-NPB
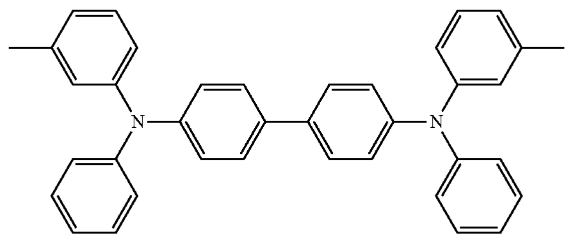
TPD
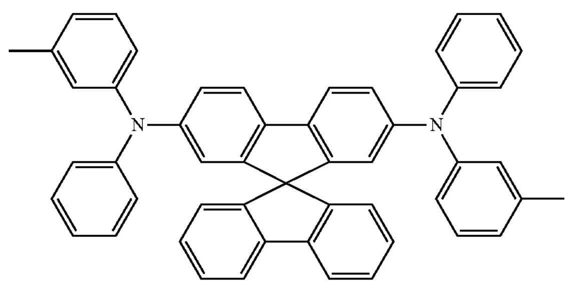
Spiro-TPD
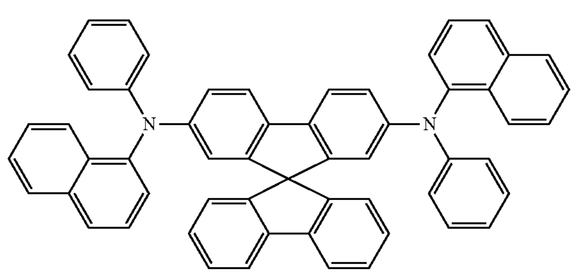
Spiro-NPB -continued

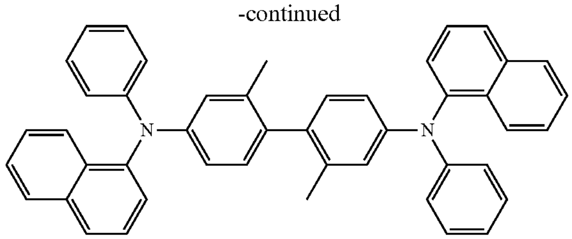

methylated NPB

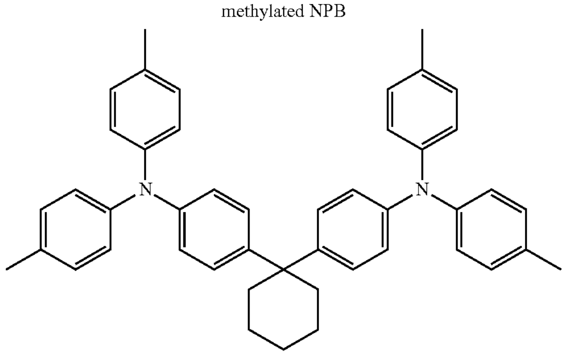

TAPC

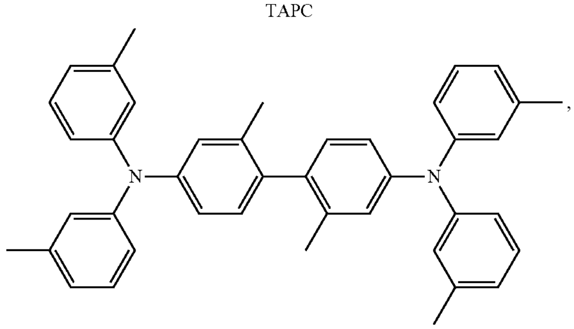

HMTPD

Formula 201

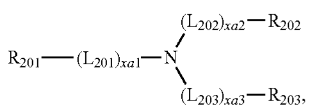

Formula 202

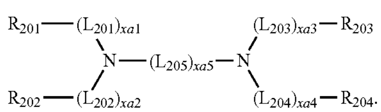

In Formulae 201 and 202, $L_{201}$ to $L_{204}$ may each independently be selected from a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group, $L_{205}$ may be selected from *—O—*', *—S—*', *—N($Q_{201}$)-*', a substituted or unsubstituted $C_1$-$C_{20}$ alkylene group, a substituted or unsubstituted $C_2$-$C_{20}$ alkenylene group, a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group, xa1 to xa4 may each independently be an integer selected from 0 to 3, xa5 may be an integer selected from 1 to 10, and $R_{201}$ to $R_{204}$ and $Q_{201}$ may each independently be selected from a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group.

For example, $R_{201}$ and $R_{202}$ in Formula 202 may be optionally connected (e.g., coupled) via a single bond, a dimethyl-methylene group, or a diphenyl-methylene group, and $R_{203}$ and $R_{204}$ may be optionally connected (e.g., coupled) via a single bond, a dimethyl-methylene group, or a diphenyl-methylene group.

In one or more embodiments, in Formulae 201 and 202, $L_{201}$ to $L_{205}$ may each independently be selected from the group consisting of:

a phenylene group, a pentalenylene group, an indenylene group, a naphthylene group, an azulenylene group, a heptalenylene group, an indacenylene group, an acenaphthylene group, a fluorenylene group, a spiro-bifluorenylene group, a benzofluorenylene group, a dibenzofluorenylene group, a phenalenylene group, a phenanthrenylene group, an anthracenylene group, a fluoranthenylene group, a triphenylenylene group, a pyrenylene group, a chrysenylene group, a naphthacenylene group, a picenylene group, a perylenylene group, a pentaphenylene group, a hexacenylene group, a pentacenylene group, a rubicenylene group, a coronenylene group, an ovalenylene group, a thiophenylene group, a furanylene group, a carbazolylene group, an indolylene group, an isoindolylene group, a benzofuranylene group, a benzothiophenylene group, a dibenzofuranylene group, a dibenzothiophenylene group, a benzocarbazolylene group, a dibenzocarbazolylene group, a dibenzosilolylene group, and a pyridinylene group; and a phenylene group, a pentalenylene group, an indenylene group, a naphthylene group, an azulenylene group, a heptalenylene group, an indacenylene group, an acenaphthylene group, a fluorenylene group, a spiro-bifluorenylene group, a benzofluorenylene group, a dibenzofluorenylene group, a phenalenylene group, a phenanthrenylene group, an anthracenylene group, a fluoranthenylene group, a triphenylenylene group, a pyrenylene group, a chrysenylene group, a naphthacenylene group, a picenylene group, a perylenylene group, a pentaphenylene group, a hexacenylene group, a pentacenylene group, a rubicenylene group, a coronenylene group, an ovalenylene group, a thiophenylene group, a furanylene group, a carbazolylene group, an indolylene group, an isoindolylene group, a benzofuranylene group, a benzothiophenylene group, a dibenzofuranylene group, a dibenzothiophenylene group, a benzocarbazolylene group, a dibenzocarbazolylene group, a dibenzosilolylene group, and a pyridinylene group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a biphenyl group, a terphenyl group, a phenyl group substituted with a $C_1$-$C_{10}$ alkyl group, a phenyl group substituted with —F, a pentalenyl group, an indenyl group, a naphthyl group, an azulenyl group, a heptalenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, —Si($Q_{31}$)($Q_{32}$)($Q_{33}$), and —N($Q_{31}$)($Q_{32}$), wherein $Q_{31}$ to $Q_{33}$ may each independently be selected from a $C_1$-$C_{10}$ alkyl group, a $C_1$-$C_{10}$ alkoxy group, a phenyl group, a biphenyl group, a terphenyl group, and a naphthyl group.

In one or more embodiments, xa1 to xa4 may each independently be 0, 1, or 2.

In one or more embodiments, xa5 may be 1, 2, 3, or 4.

In one or more embodiments, $R_{201}$ to $R_{204}$ and $Q_{201}$ may each independently be selected from the group consisting of:

a phenyl group, a biphenyl group, a terphenyl group, a pentalenyl group, an indenyl group, a naphthyl group, an azulenyl group, a heptalenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, and a pyridinyl group; and a phenyl group, a biphenyl group, a terphenyl group, a pentalenyl group, an indenyl group, a naphthyl group, an azulenyl group, a heptalenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, and a pyridinyl group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a biphenyl group, a terphenyl group, a phenyl group substituted with a $C_1$-$C_{10}$ alkyl group, a phenyl group substituted with —F, a pentalenyl group, an indenyl group, a naphthyl group, an azulenyl group, a heptalenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, —Si($Q_{31}$)($Q_{32}$)($Q_{33}$), and —N($Q_{31}$)($Q_{32}$), wherein $Q_{31}$ to $Q_{33}$ may each independently be the same as described herein.

In one or more embodiments, at least one selected from $R_{201}$ to $R_{203}$ in Formula 201 may be selected from the group consisting of:

a fluorenyl group, a spiro-bifluorenyl group, a carbazolyl group, a dibenzofuranyl group, and a dibenzothiophenyl group; and a fluorenyl group, a spiro-bifluorenyl group, a carbazolyl group, a dibenzofuranyl group, and a dibenzothiophenyl group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a biphenyl group, a terphenyl group, a phenyl group substituted with a $C_1$-$C_{10}$ alkyl group, a phenyl group substituted with —F, a naphthyl group, a fluorenyl group, a spiro-bifluorenyl group, a carbazolyl group, a dibenzofuranyl group, and a dibenzothiophenyl group, but embodiments of the present disclosure are not limited thereto.

In one or more embodiments, in Formula 202, i) $R_{201}$ and $R_{202}$ may be connected (e.g., coupled) via a single bond, and/or ii) $R_{203}$ and $R_{204}$ may be connected (e.g., coupled) via a single bond.

In one or more embodiments, at least one selected from $R_{201}$ to $R_{204}$ in Formula 202 may be selected from the group consisting of:

a carbazolyl group; and a carbazolyl group substituted with deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a biphenyl group, a terphenyl group, a phenyl group substituted with a $C_1$-$C_{10}$ alkyl group, a phenyl group substituted with —F, a naphthyl group, a fluorenyl group, a spiro-bifluorenyl group, a carbazolyl group, a dibenzofuranyl group, and a dibenzothiophenyl group, but embodiments of the present disclosure are not limited thereto.

The compound represented by Formula 201 may be represented by Formula 201A:

Formula 201A

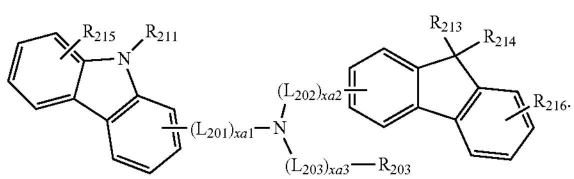

For example, the compound represented by Formula 201 may be represented by Formula 201A(1), but embodiments of the present disclosure are not limited thereto:

Formula 201A(1)

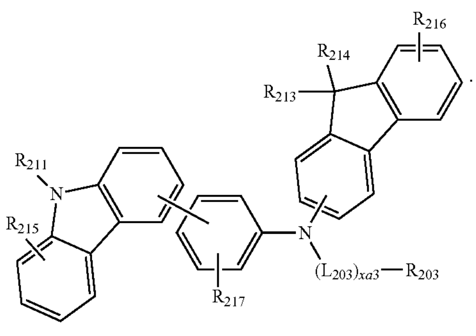

In one or more embodiments, the compound represented by Formula 201 may be represented by Formula 201A-1, but embodiments of the present disclosure are not limited thereto:

Formula 201A-1

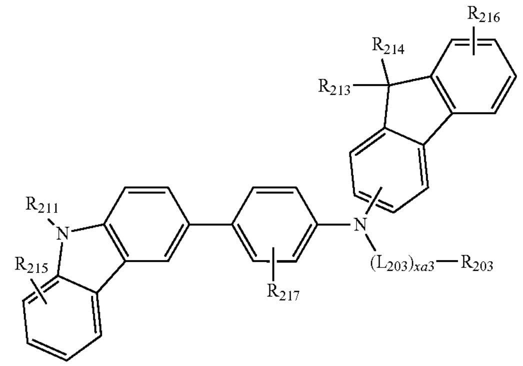

The compound represented by Formula 202 may be represented by Formula 202A:

Formula 202A

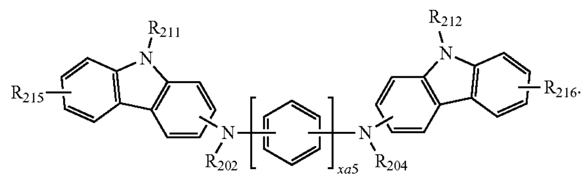

In one or more embodiments, the compound represented by Formula 202 may be represented by Formula 202A-1:

Formula 202A-1

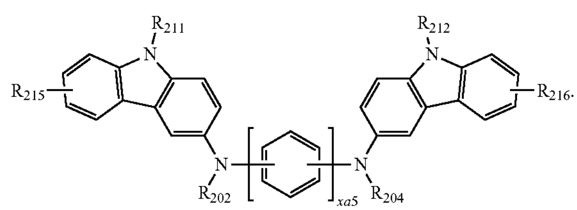

In Formulae 201A, 201A(1), 201A-1, 202A, and 202A-1, $L_{201}$ to $L_{203}$, xa1 to xa3, xa5, and $R_{202}$ to $R_{204}$ may each independently be the same as described herein, $R_{211}$ and $R_{212}$ may each independently be the same as described herein in connection with $R_{203}$, and $R_{213}$ to $R_{217}$ may each independently be selected from hydrogen, deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a biphenyl group, a terphenyl group, a phenyl group substituted with a $C_1$-$C_{10}$ alkyl group, a phenyl group substituted with —F, a pentalenyl group, an indenyl group, a naphthyl group, an azulenyl group, a heptalenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, and a pyridinyl group.

The hole transport region may include at least one compound selected from Compounds HT1 to HT39, but embodiments of the present disclosure are not limited thereto:

HT1

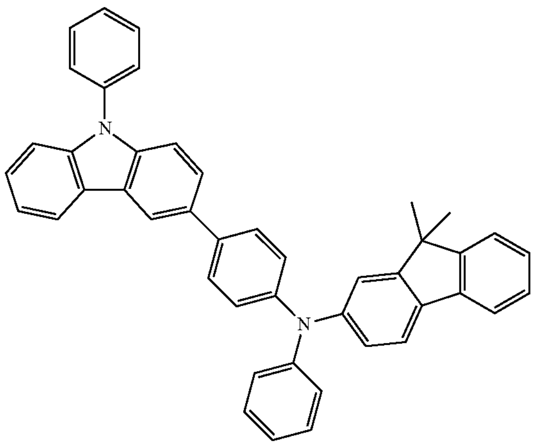

HT2

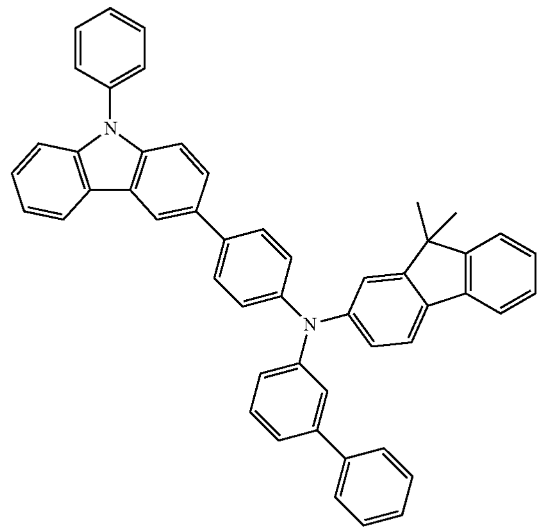

HT3

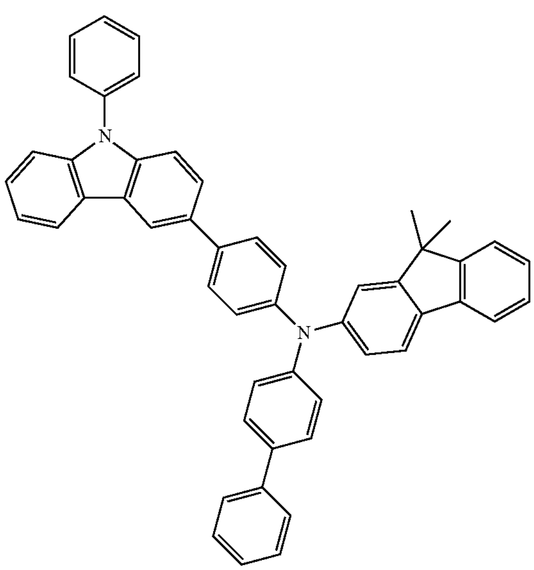

HT4

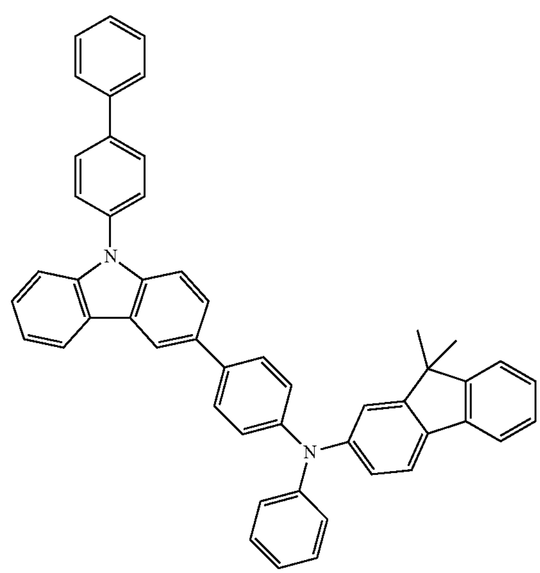

-continued
HT5
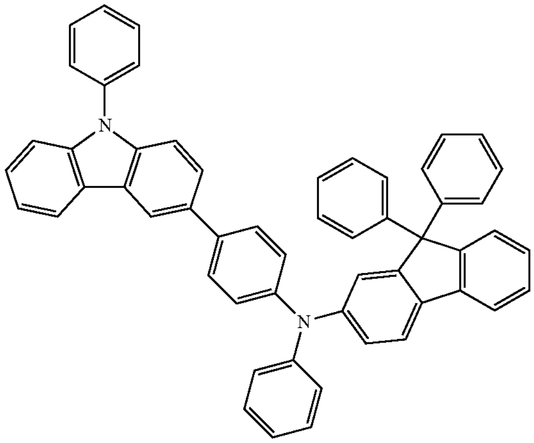
HT6
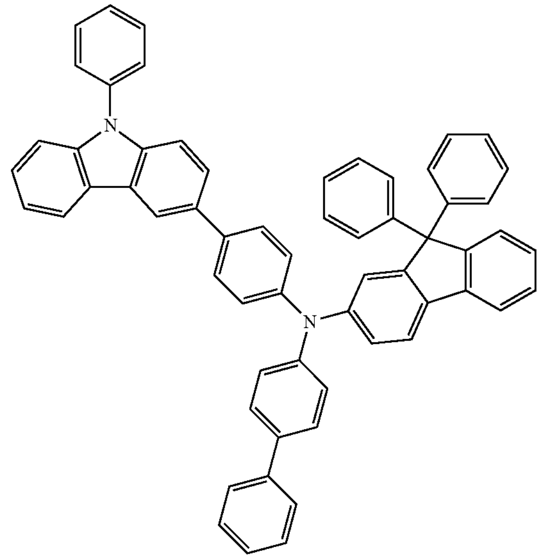
HT7
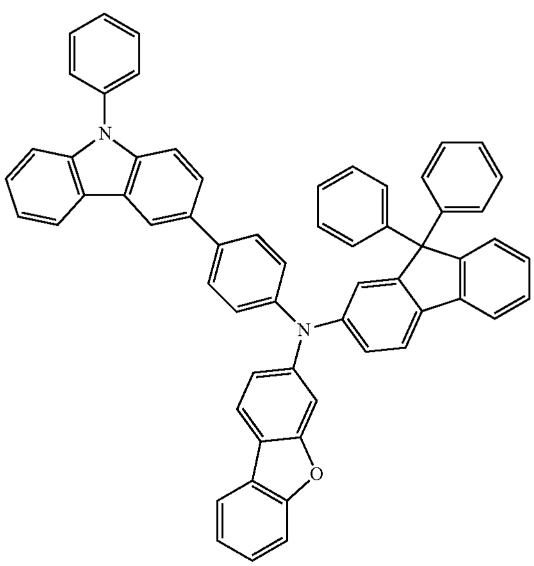
HT8
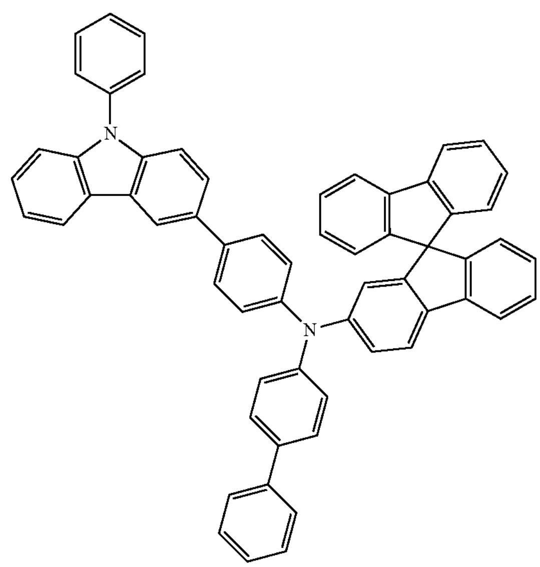

-continued
HT9
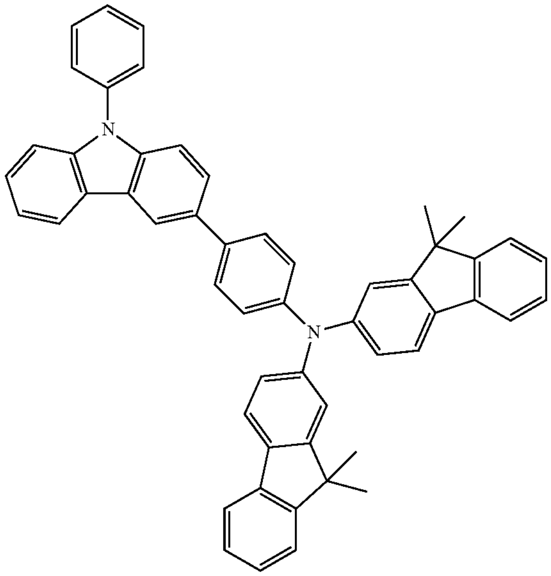
HT10
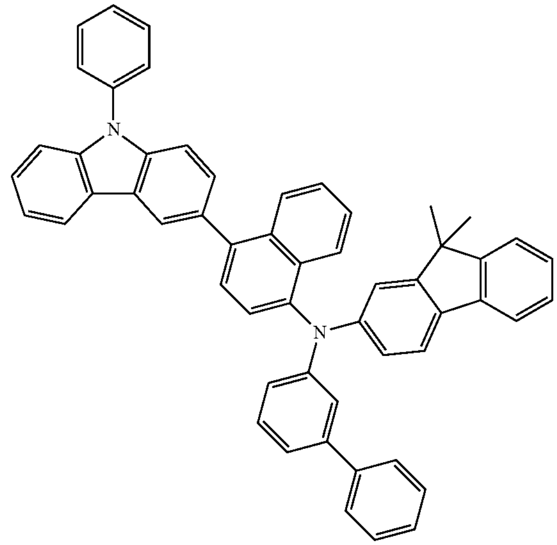
HT11
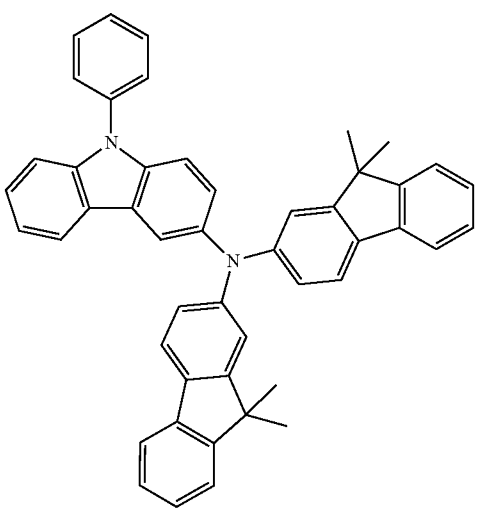
HT12
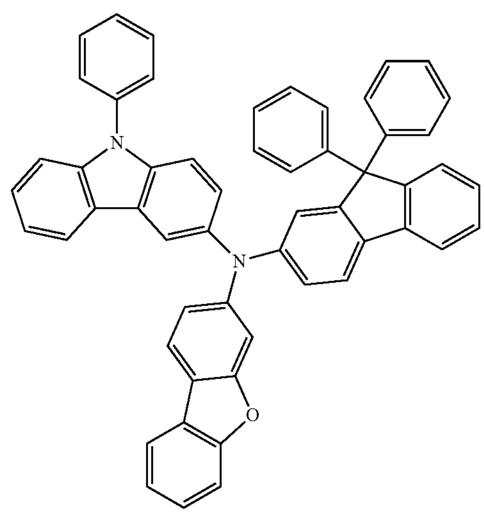

-continued
HT13
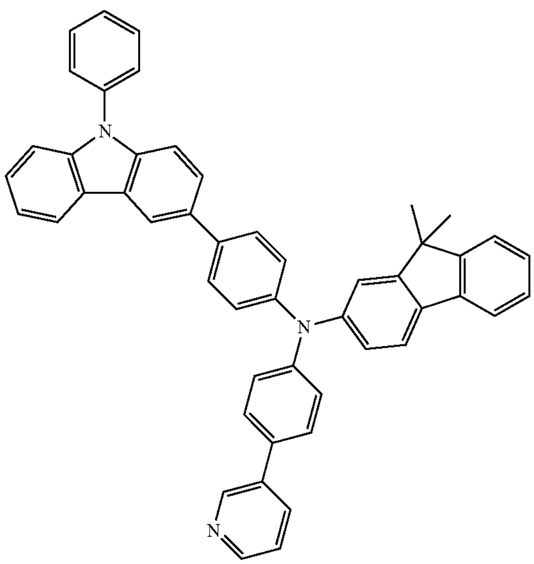
HT14
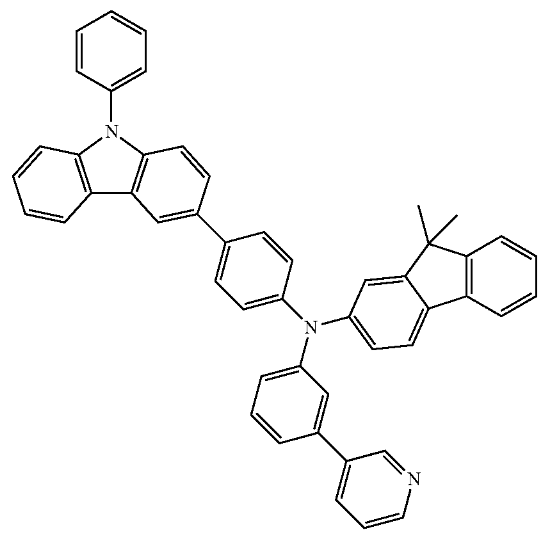
HT15
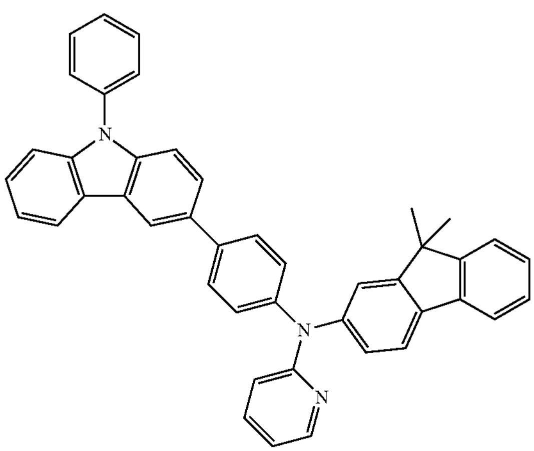
HT16
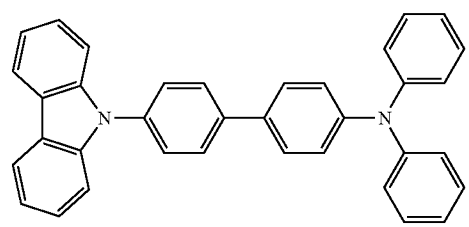
HT17
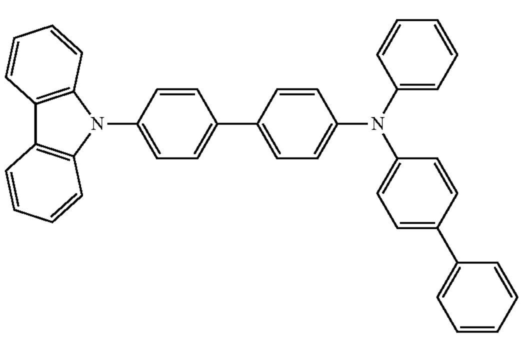
HT18
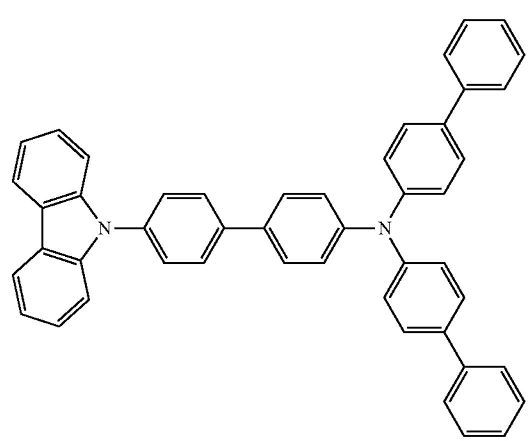

-continued
HT19
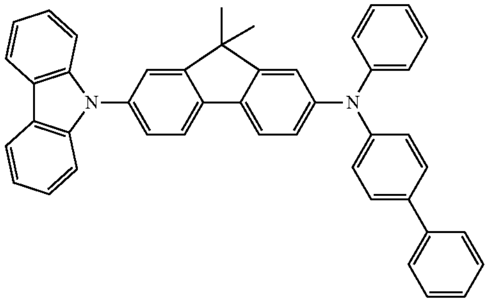
HT20
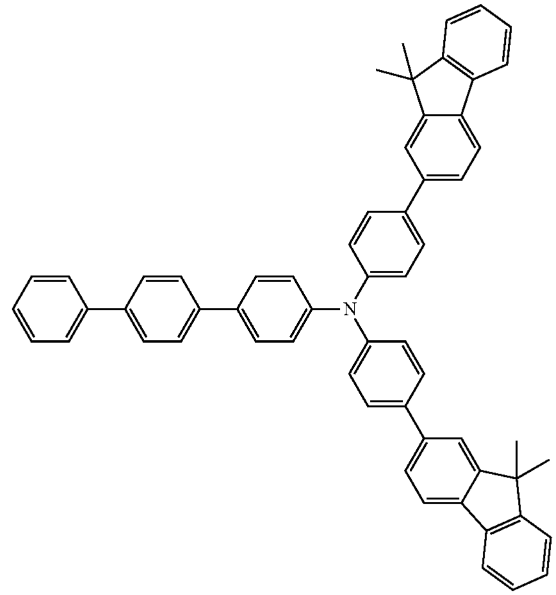
HT21
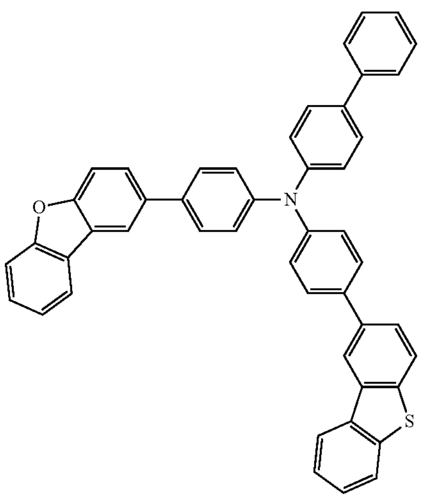
HT22
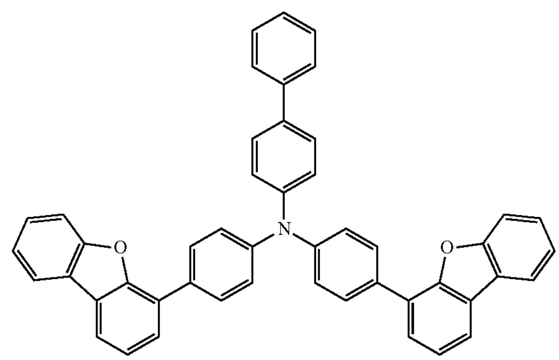
HT23
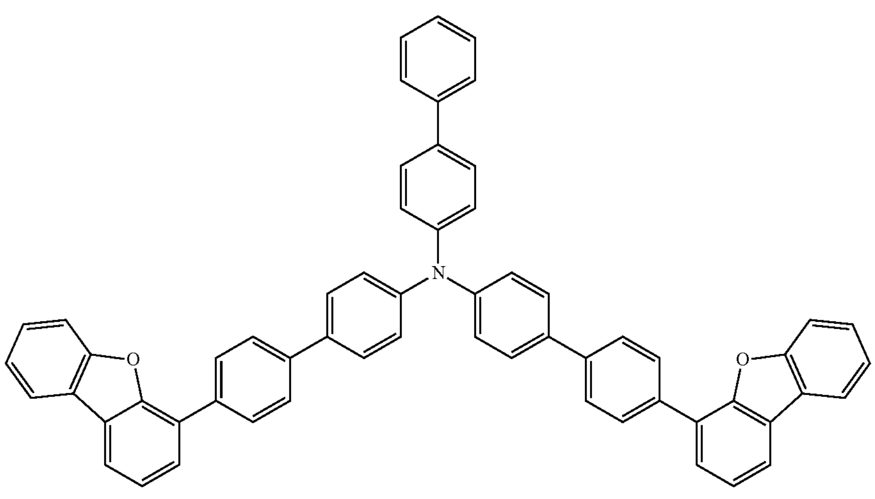

-continued
HT24
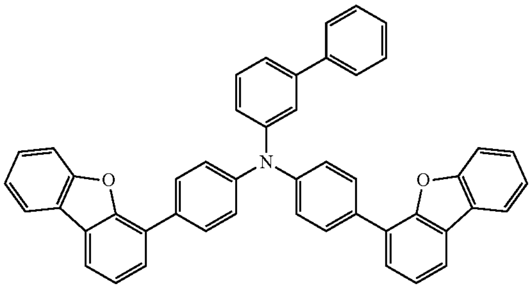
HT25
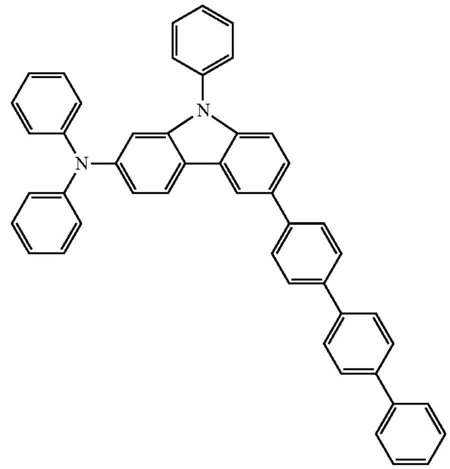
HT26
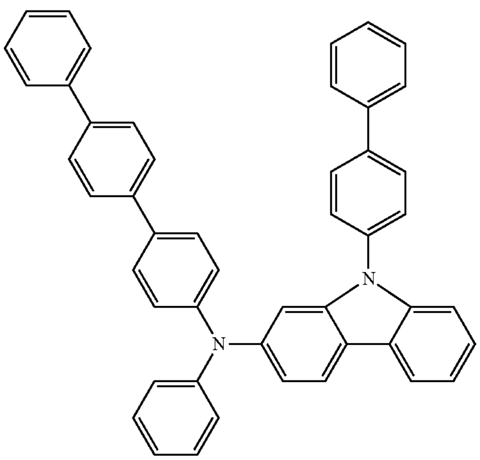
HT27
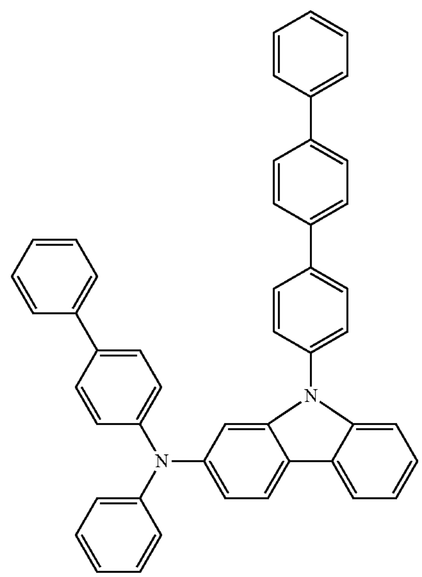
HT28
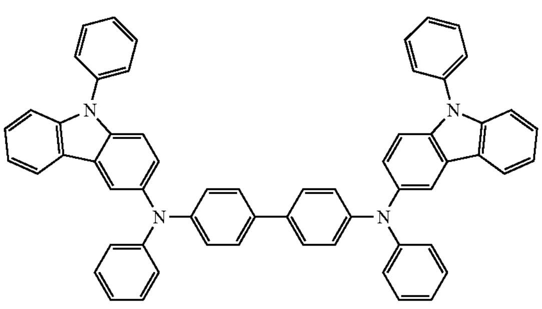
HT29
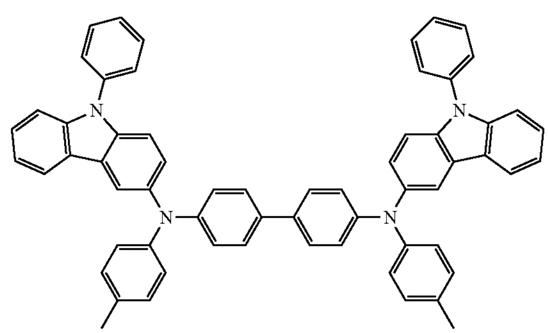

-continued
HT30
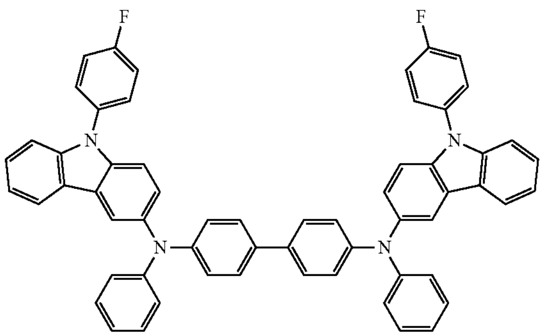
HT31
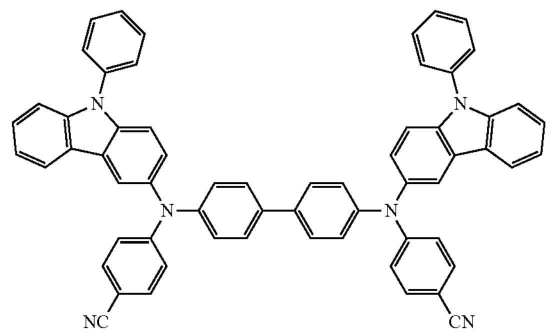
HT32
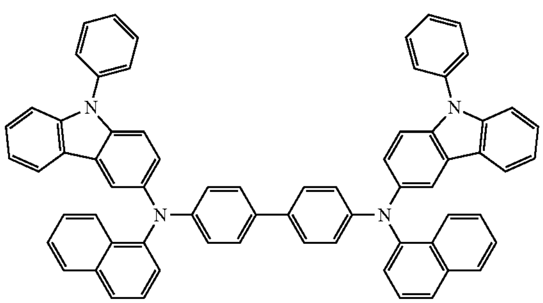
HT33
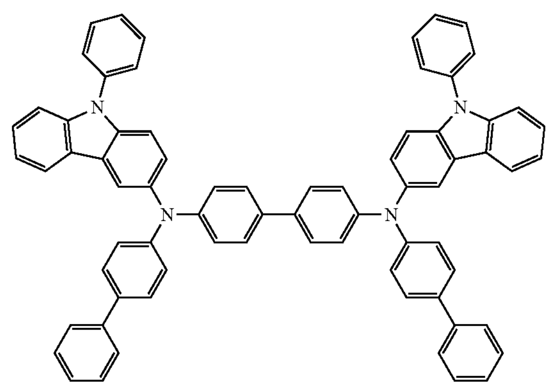
HT34
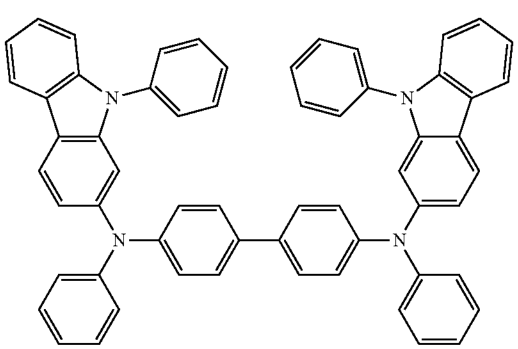
HT35
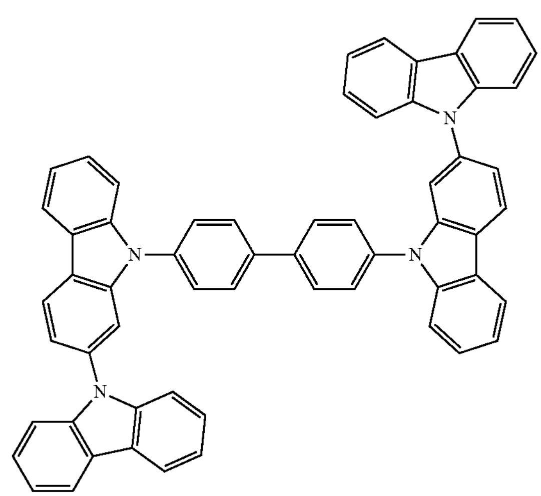

-continued

HT36

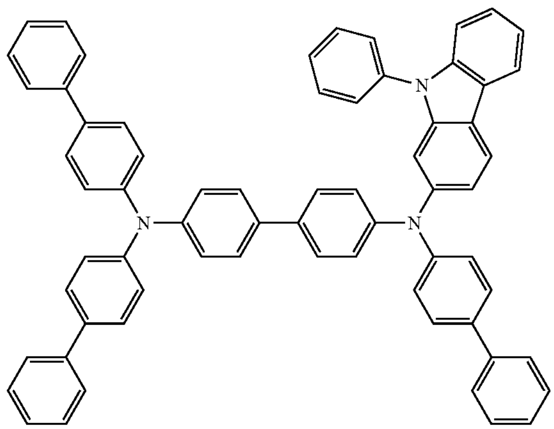

HT37

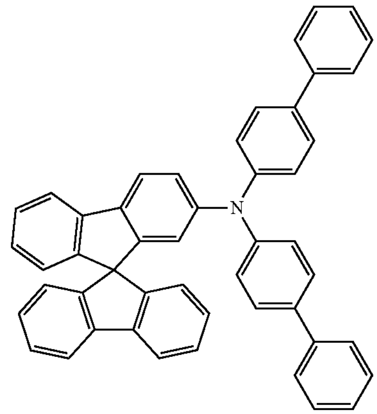

HT38

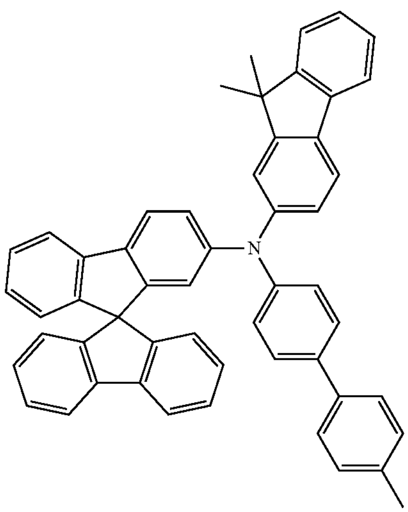

HT39

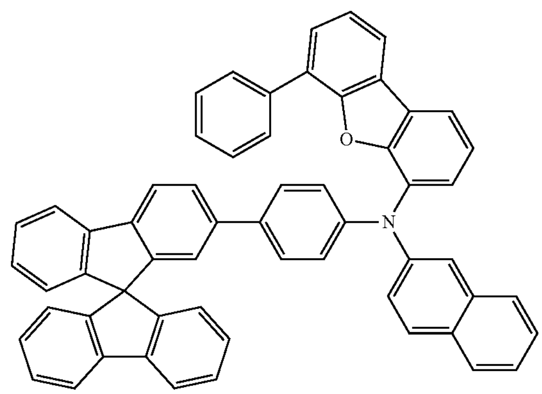

The thickness of the hole transport region may be about 100 Å to about 10,000 Å, and in some embodiments, about 100 Å to about 1,000 Å. When the hole transport region includes at least one selected from a hole injection layer and a hole transport layer, the thickness of the hole injection layer may be about 100 Å to about 9,000 Å, and in some embodiments, about 100 Å to about 1,000 Å; the thickness of the hole transport layer may be about 50 Å to about 2,000 Å, and in some embodiments, about 100 Å to about 1,500 Å. When the thicknesses of the hole transport region, the hole injection layer and the hole transport layer are each within these ranges, satisfactory hole transporting characteristics may be obtained without a substantial increase in driving voltage.

The emission auxiliary layer may increase the light-emission efficiency of the device by compensating for an optical resonance distance according to the wavelength of light emitted by an emission layer (e.g., by adjusting the optical resonance distance to match the wavelength of light emitted from the emission layer), and the electron blocking layer may block or reduce the flow of electrons from an electron transport region. The emission auxiliary layer and the electron blocking layer may each include the materials as described above.

p-Dopant

The hole transport region may further include, in addition to these materials, a charge-generation material for the improvement of conductive properties. The charge-generation material may be homogeneously or non-homogeneously dispersed in the hole transport region.

The charge-generation material may be, for example, a p-dopant.

In one or more embodiments, the p-dopant may have a lowest unoccupied molecular orbital (LUMO) energy level of −3.5 eV or less.

The p-dopant may include at least one selected from a quinone derivative, a metal oxide, and a cyano group-containing compound, but embodiments of the present disclosure are not limited thereto.

For example, the p-dopant may include at least one selected from the group consisting of:

a quinone derivative (such as tetracyanoquinodimethane (TCNQ) and/or 2,3,5,6-tetrafluoro-7,7,8,8-tetracyano-quinodimethane (F4-TCNQ));

a metal oxide (such as tungsten oxide and/or molybdenum oxide);

1,4,5,8,9,11-hexaazatriphenylene-hexacarbonitrile (HAT-CN); and a compound represented by Formula 221, but embodiments of the present disclosure are not limited thereto:

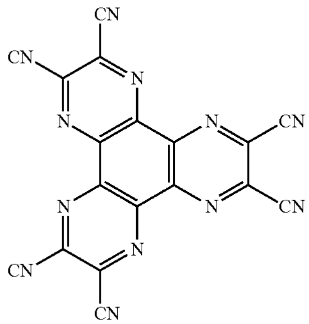

HAT-CN

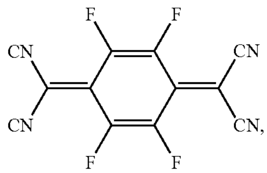

F4-TCNQ

Formula 221

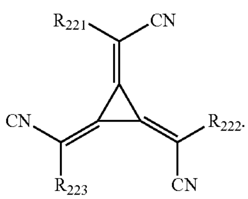

In Formula 221, $R_{221}$ to $R_{223}$ may each independently be selected from a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group, wherein at least one selected from $R_{221}$ to $R_{223}$ has at least one substituent selected from a cyano group, —F, —Cl, —Br, —I, a $C_{20}$-$C_{20}$ alkyl group substituted with —F, a $C_1$-$C_{20}$ alkyl group substituted with —Cl, a $C_1$-$C_{20}$ alkyl group substituted with —Br, and a $C_1$-$C_{20}$ alkyl group substituted with —I.

Emission Layer in Organic Layer 150

When the organic light-emitting device 10 is a full color organic light-emitting device, the emission layer may be patterned into a red emission layer, a green emission layer, and/or a blue emission layer, according to a sub-pixel. In one or more embodiments, the emission layer may have a stacked structure of two or more layers selected from a red emission layer, a green emission layer, and a blue emission layer, in which the two or more layers may contact each other or may be separated from each other. In one or more embodiments, the emission layer may include two or more materials selected from a red-light emission material, a green-light emission material, and a blue-light emission material, in which the two or more materials may be mixed together in a single layer to thereby emit white light.

In one or more embodiments, the emission layer of the organic light-emitting device 10 may be a first-color-light emission layer, the organic light-emitting device 10 may further include: i) at least one second-color-light emission layer, or ii) at least one second-color-light emission layer and at least one third-color-light emission layer between the first electrode 110 and the second electrode 190, a maximum emission wavelength of the first-color-light emission layer, a maximum emission wavelength of the second-color-light emission layer, and a maximum emission wavelength of the third-color-light emission layer may be identical to or different from one another, and the organic light-emitting device 10 may emit a mixed light including a first-color-light and a second-color-light, or a mixed light including the first-color-light, the second-color-light, and a third-color-light, but embodiments of the present disclosure are not limited thereto.

For example, the maximum emission wavelength of the first-color-light emission layer may be different from the maximum emission wavelength of the second-color-light emission layer, and the mixed light including a first-color-light and a second-color-light may be white light, but embodiments of the present disclosure are not limited thereto.

In one or more embodiments, the maximum emission wavelength of the first-color-light emission layer, the maximum emission wavelength of the second-color-light emission layer, and the maximum emission wavelength of the third-color-light emission layer may be different from one another, and the mixed light including the first-color-light, the second-color-light, and the third-color-light may be white light. However, embodiments of the present disclosure are not limited thereto.

The emission layer may include a host and a dopant. The dopant may include at least one selected from a phosphorescent dopant and a fluorescent dopant.

The amount of the dopant in the emission layer may be about 0.01 to about 15 parts by weight based on 100 parts by weight of the host, but embodiments of the present disclosure are not limited thereto.

The thickness of the emission layer may be about 100 Å to about 1,000 Å, and in some embodiments, about 200 Å to about 600 Å. When the thickness of the emission layer is within these ranges, excellent light-emission characteristics may be obtained without a substantial increase in driving voltage.

Host in Emission Layer

In one or more embodiments, the host may include a compound represented by Formula 301:

$$[Ar_{301}]_{xb11}\text{-}[(L_{301})_{xb1}\text{-}R_{301}]_{xb21}. \qquad \text{Formula 301}$$

In Formula 301, $Ar_{301}$ may be a substituted or unsubstituted $C_5$-$C_{60}$ carbocyclic group or a substituted or unsubstituted $C_1$-$C_{60}$ heterocyclic group, xb11 may be 1, 2, or 3, $L_{301}$ may be selected from a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group, xb1 may be an integer selected from 0 to 5, $R_{301}$ may be selected from deuterium, —F, —Cl, —Br, —I, a hydroxyl group, a cyano group, a nitro group, an amidino group, a hydrazino group, a hydrazono group, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —Si($Q_{301}$)($Q_{302}$)($Q_{303}$), —N($Q_{301}$)($Q_{302}$), —B($Q_{301}$)($Q_{302}$), —C(=O)($Q_{301}$), —S(=O)$_2$($Q_{301}$), and —P(=O)($Q_{301}$)($Q_{302}$), and xb21 may be an integer selected from 1 to 5, wherein $Q_{301}$ to $Q_{303}$ may each independently be selected from a $C_1$-$C_{10}$ alkyl group, a $C_1$-$C_{10}$ alkoxy group, a phenyl group, a biphenyl group, a terphenyl group, and a naphthyl group, but embodiments of the present disclosure are not limited thereto.

In one or more embodiments, $Ar_{301}$ in Formula 301 may be selected from the group consisting of:

a naphthalene group, a fluorene group, a spiro-bifluorene group, a benzofluorene group, a dibenzofluorene group, a phenalene group, a phenanthrene group, an anthracene group, a fluoranthene group, a triphenylene group, a pyrene group, a chrysene group, a naphthacene group, a picene group, a perylene group, a pentaphene group, an indenoanthracene group, a dibenzofuran group, and a dibenzothiophene group; and a naphthalene group, a fluorene group, a spiro-bifluorene group, a benzofluorene group, a dibenzofluorene group, a phenalene group, a phenanthrene group, an anthracene group, a fluoranthene group, a triphenylene group, a pyrene group, a chrysene group, a naphthacene group, a picene group, a perylene group, a pentaphene group, an indenoanthracene group, a dibenzofuran group, and a dibenzothiophene group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, a naphthyl group, —Si($Q_{31}$)($Q_{32}$)($Q_{33}$), —N($Q_{31}$)($Q_{32}$), —B($Q_{31}$)($Q_{32}$), —C(=O)($Q_{31}$), —S(=O)$_2$($Q_{31}$), and —P(=O)($Q_{31}$)($Q_{32}$), wherein $Q_{31}$ to $Q_{33}$ may each independently be selected from a $C_1$-$C_{10}$ alkyl group, a $C_1$-$C_{10}$ alkoxy group, a phenyl group, a biphenyl group, a terphenyl group, and a naphthyl group, but embodiments of the present disclosure are not limited thereto.

When xb11 in Formula 301 is two or more, two or more $Ar_{301}$(s) may be connected (e.g., coupled) via one or more single bonds.

In one or more embodiments, the compound represented by Formula 301 may be represented by Formula 301-1 or 301-2:

Formula 301-1

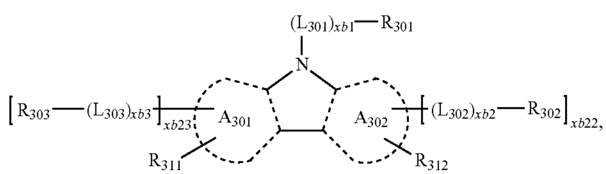

Formula 301-2

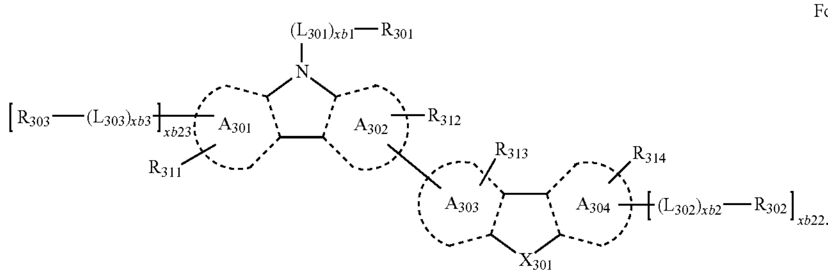

In Formulae 301-1 to 301-2, $A_{301}$ to $A_{304}$ may each independently be selected from a benzene group, a naphthalene group, a phenanthrene group, a fluoranthene group, a triphenylene group, a pyrene group, a chrysene group, a pyridine group, a pyrimidine group, an indene group, a fluorene group, a spiro-bifluorene group, a benzofluorene group, a dibenzofluorene group, an indole group, a carbazole group, a benzocarbazole group, a dibenzocarbazole group, a furan group, a benzofuran group, a dibenzofuran group, a naphthofuran group, a benzonaphthofuran group, a dinaphthofuran group, a thiophene group, a benzothiophene group, a dibenzothiophene group, a naphthothiophene group, a benzonaphthothiophene group, and a dinaphthothiophene group, $X_{301}$ may be 0, S or N-[$(L_{304})_{xb4}$-$R_{304}$], $R_{311}$ to $R_{314}$ may each independently be selected from hydrogen, deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, a naphthyl group, —Si($Q_{31}$)($Q_{32}$)($Q_{33}$), —N($Q_{31}$)($Q_{32}$), —B($Q_{31}$)($Q_{32}$), —C(=O)($Q_{31}$), —S(=O)$_2$($Q_{31}$), and —P(=O)($O_{31}$)($Q_{32}$), xb22 and xb23 may each independently be 0, 1, or 2, $L_{301}$, xb1, $R_{301}$, and $Q_{31}$ to $Q_{33}$ may each independently be the same as described herein in connection with Formula 301, $L_{302}$ to $L_{304}$ may each independently be the same as described herein in connection with $L_{301}$, xb2 to xb4 may each independently be the same as described herein in connection with xb1, and $R_{302}$ to $R_{304}$ may each independently be the same as described herein in connection with $R_{301}$.

For example, $L_{301}$ to $L_{304}$ in Formulae 301, 301-1, and 301-2 may each independently be selected from the group consisting of:

a phenylene group, a naphthylene group, a fluorenylene group, a spiro-bifluorenylene group, a benzofluorenylene group, a dibenzofluorenylene group, a phenanthrenylene group, an anthracenylene group, a fluoranthenylene group, a triphenylenylene group, a pyrenylene group, a chrysenylene group, a perylenylene group, a pentaphenylene group, a hexacenylene group, a pentacenylene group, a thiophenylene group, a furanylene group, a carbazolylene group, an indolylene group, an isoindolylene group, a benzofuranylene group, a benzothiophenylene group, a dibenzofuranylene group, a dibenzothiophenylene group, a benzocarbazolylene group, a dibenzocarbazolylene group, a dibenzosilolylene group, a pyridinylene group, an imidazolylene group, a pyrazolylene group, a thiazolylene group, an isothiazolylene group, an oxazolylene group, an isoxazolylene group, a thiadiazolylene group, an oxadiazolylene group, a pyrazinylene group, a pyrimidinylene group, a pyridazinylene group, a triazinylene group, a quinolinylene group, an isoquinolinylene group, a benzoquinolinylene group, a phthalazinylene group, a naphthyridinylene group, a quinoxalinylene group, a quinazolinylene group, a cinnolinylene group, a phenanthridinylene group, an acridinylene group, a phenanthrolinylene group, a phenazinylene group, a benzimidazolylene group, an isobenzothiazolylene group, a benzoxazolylene group, an isobenzoxazolylene group, a triazolylene group, a tetrazolylene group, an imidazopyridinylene group, an imidazopyrimidinylene group, and an azacarbazolylene group; and a phenylene group, a naphthylene group, a fluorenylene group, a spiro-bifluorenylene group, a benzofluorenylene group, a dibenzofluorenylene group, a phenanthrenylene group, an anthracenylene group, a fluoranthenylene group, a triphenylenylene group, a pyrenylene group, a chrysenylene group, a perylenylene group, a pentaphenylene group, a hexacenylene group, a pentacenylene group, a thiophenylene group, a furanylene group, a carbazolylene group, an indolylene group, an isoindolylene group, a benzofuranylene group, a benzothiophenylene group, a dibenzofuranylene group, a dibenzothiophenylene group, a benzocarbazolylene group, a dibenzocarbazolylene group, a dibenzosilolylene group, a pyridinylene group, an imidazolylene group, a pyrazolylene group, a thiazolylene group, an isothiazolylene group, an oxazolylene group, an isoxazolylene group, a thiadiazolylene group, an oxadiazolylene group, a pyrazinylene group, a pyrimidinylene group, a pyridazinylene group, a triazinylene group, a quinolinylene group, an isoquinolinylene group, a benzoquinolinylene group, a phthalazinylene group, a naphthyridinylene group, a quinoxalinylene group, a quinazolinylene group, a cinnolinylene group, a phenanthridinylene group, an acridinylene group, a phenanthrolinylene group, a phenazinylene group, a benzimidazolylene group, an isobenzothiazolylene group, a benzoxazolylene group, an isobenzoxazolylene group, a triazolylene group, a tetrazolylene group, an imidazopyridinylene group, an imidazopyrimidinylene group, and an azacarbazolylene group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, an imidazolyl group, a pyrazolyl group, a thiazolyl group, an isothiazolyl group, an oxazolyl group, an isoxazolyl group, a thiadiazolyl group, an oxadiazolyl group, a pyrazinyl group, a pyrimidinyl group, a pyridazinyl group, a triazinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, an isobenzothiazolyl group, a benzoxazolyl group, an isobenzoxazolyl group, a triazolyl group, a tetrazolyl group, an imidazopyridinyl group, an imidazopyrimidinyl group, an azacarbazolyl group, —Si($Q_{31}$)($Q_{32}$)($Q_{33}$), —N($Q_{31}$)($Q_{32}$), —B($Q_{31}$)($Q_{32}$), —C(=O)($Q_{31}$), —S(=O)$_2$($Q_{31}$), and —P(=O)($Q_{31}$)($Q_{32}$), wherein $Q_{31}$ to $Q_{33}$ may each independently be the same as described herein.

In one or more embodiments, $R_{301}$ to $R_{304}$ in Formulae 301, 301-1, and 301-2 may each independently be selected from the group consisting of:

a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, an imidazolyl group, a pyrazolyl group, a thiazolyl group, an isothiazolyl group, an oxazolyl group, an isoxazolyl group, a thiadiazolyl group, an oxadiazolyl group, a pyrazinyl group, a pyrimidinyl group, a pyridazinyl group, a triazinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, an isobenzothiazolyl group, a benzoxazolyl group, an isobenzoxazolyl group, a triazolyl group, a tetrazolyl group, an imidazopyridinyl group, an imidazopyrimidinyl group, and an azacarbazolyl group; and a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, an imidazolyl group, a pyrazolyl group, a thiazolyl group, an isothiazolyl group, an oxazolyl group, an isoxazolyl group, a thiadiazolyl group, an oxadiazolyl group, a pyrazinyl group, a pyrimidinyl group, a pyridazinyl group, a triazinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, an isobenzothiazolyl group, a benzoxazolyl group, an isobenzoxazolyl group, a triazolyl group, a tetrazolyl group, an imidazopyridinyl group, an imidazopyrimidinyl group, and an azacarbazolyl group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, an imidazolyl group, a pyrazolyl group, a thiazolyl group, an isothiazolyl group, an oxazolyl group, an isoxazolyl group, a thiadiazolyl group, an oxadiazolyl group, a pyrazinyl group, a pyrimidinyl group, a pyridazinyl group, a triazinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, an isobenzothiazolyl group, a benzoxazolyl group, an isobenzoxazolyl group, a triazolyl group, a tetrazolyl group, an imidazopyridinyl group, an imidazopyrimidinyl group, an azacarbazolyl group, —Si($Q_{31}$)($Q_{32}$)($Q_{33}$), —N($Q_{31}$)($Q_{32}$), —B($Q_{31}$)($Q_{32}$), —C(=O)($Q_{31}$), —S(=O)$_2$($Q_{31}$), and —P(=O)($Q_{31}$)($Q_{32}$), wherein $Q_{31}$ to $Q_{33}$ may each independently be the same as described herein.

In one or more embodiments, the host may include an alkaline earth metal complex. For example, the host may be selected from a Be complex (e.g., Compound H55) and a Mg complex. In one or more embodiments, the host may be a Zn complex.

The host may include 9,10-di(2-naphthyl)anthracene (ADN), 2-methyl-9,10-bis(naphthalen-2-yl)anthracene (MADN), 9,10-di-(2-naphthyl)-2-t-butyl-anthracene (TBADN), 4,4'-bis(N-carbazolyl)-1,1-biphenyl (CBP), 1,3-di-9-carbazolylbenzene (mCP), 1,3,5-tri(carbazol-9-yl)benzene (TCP), and/or Compounds H1 to H55, but embodiments of the present disclosure are not limited thereto:

H1

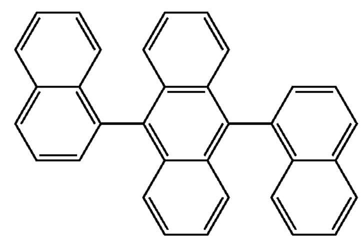

H2

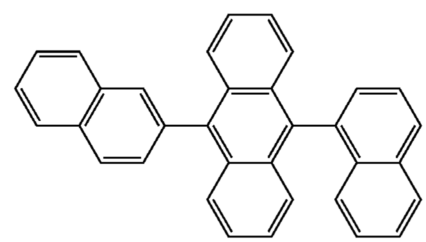

H3

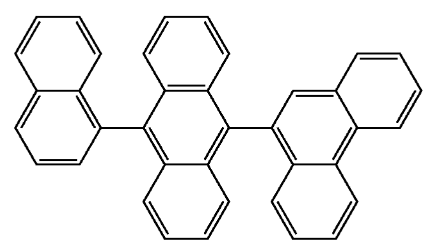

H4

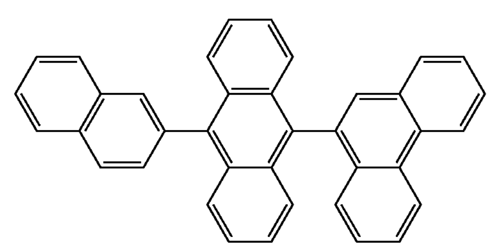

-continued
H5
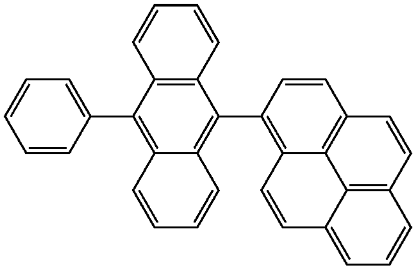
H6
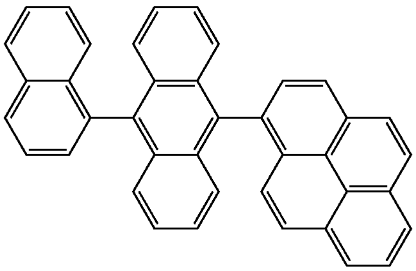
H7
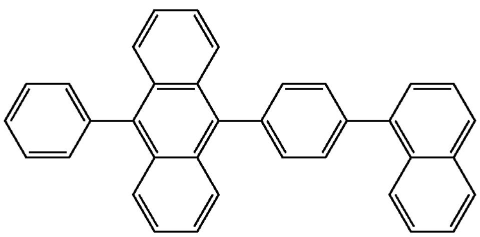
H8
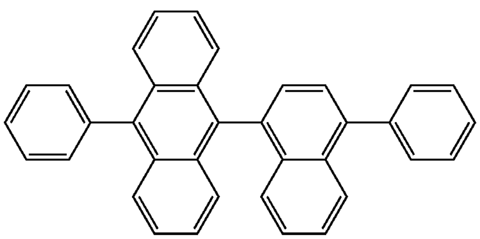
H9
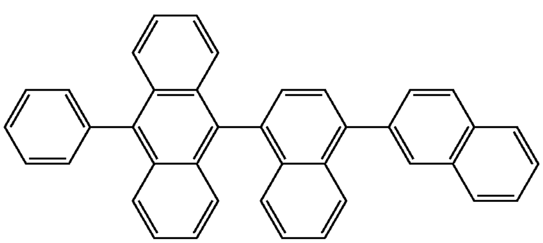
H10
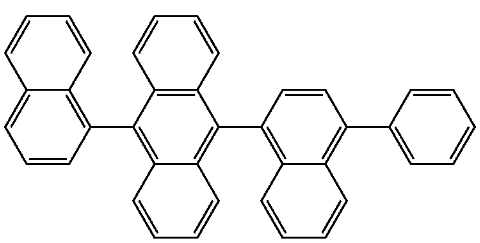
-continued
H11
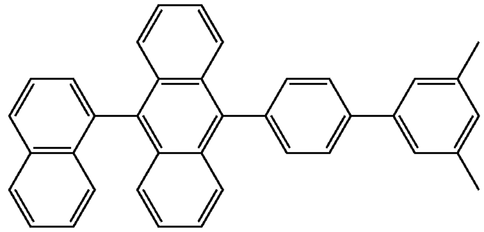
H12
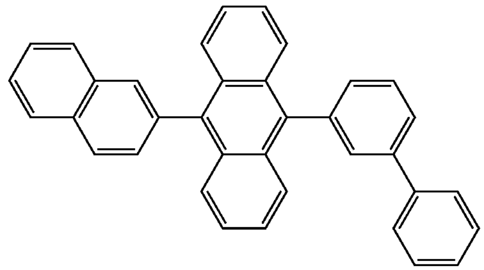
H13
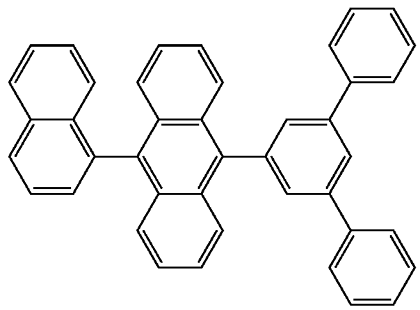
H14
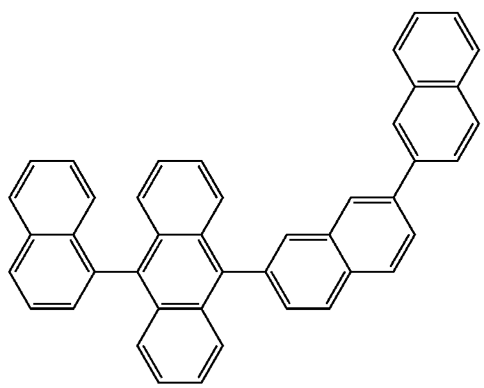
H15
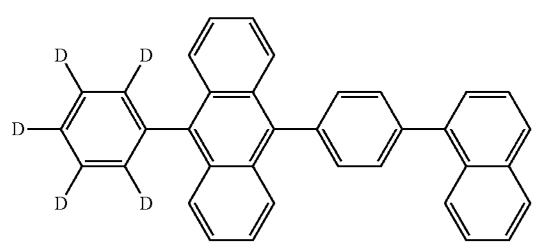

H16
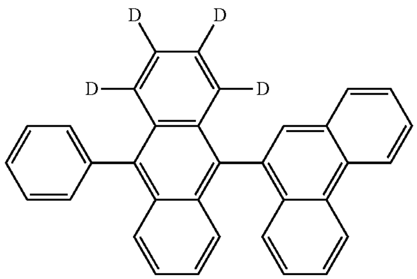
H17
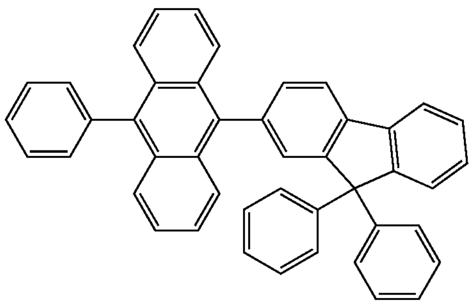
H18
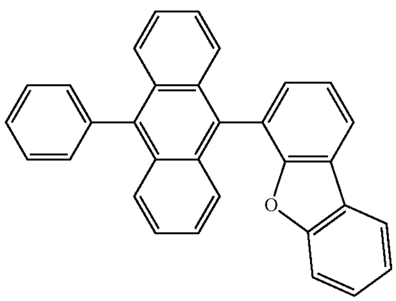
H19
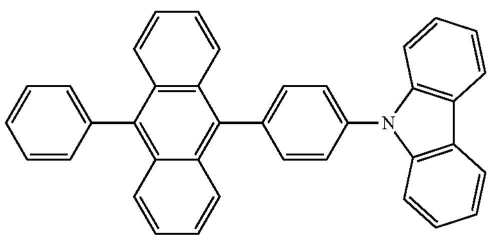
H20
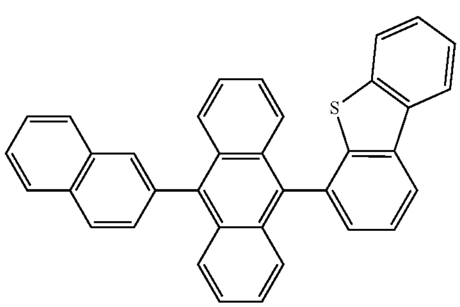
H21
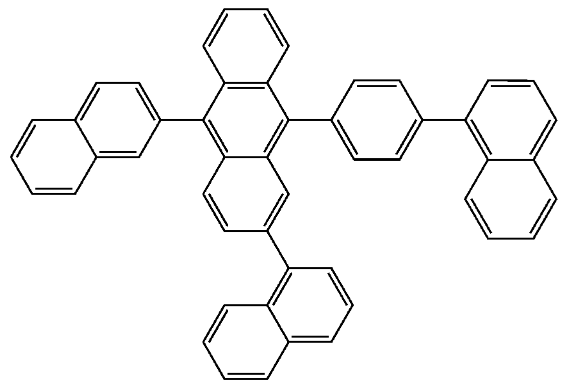
H22
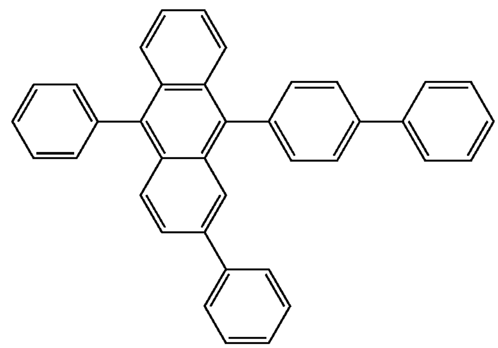
H23
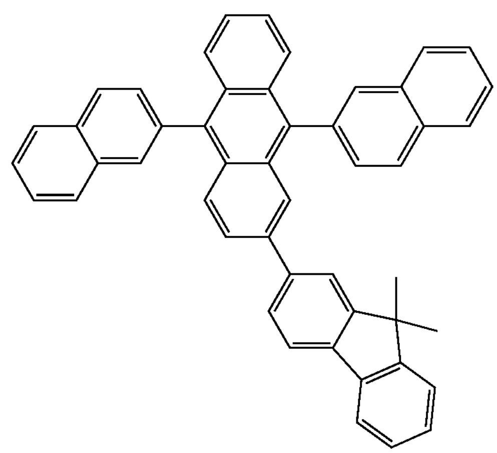
H24
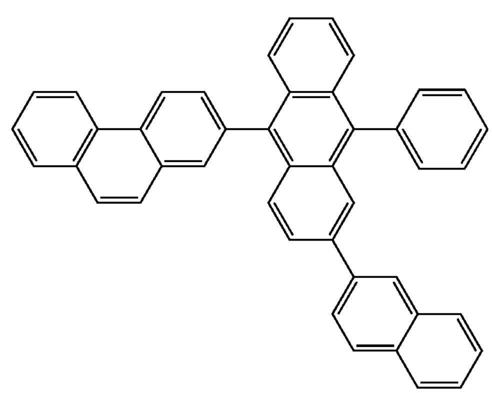

-continued
H25
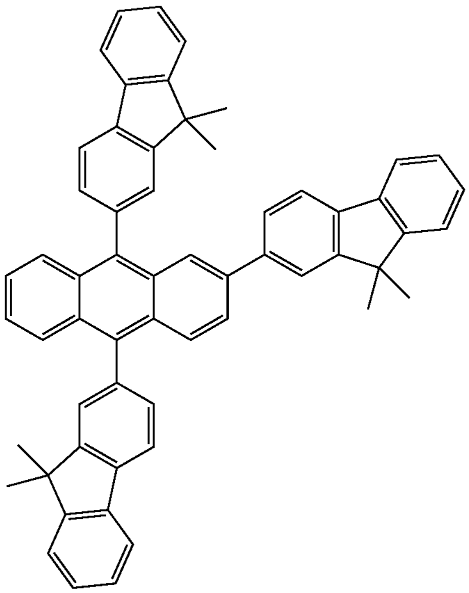
H26
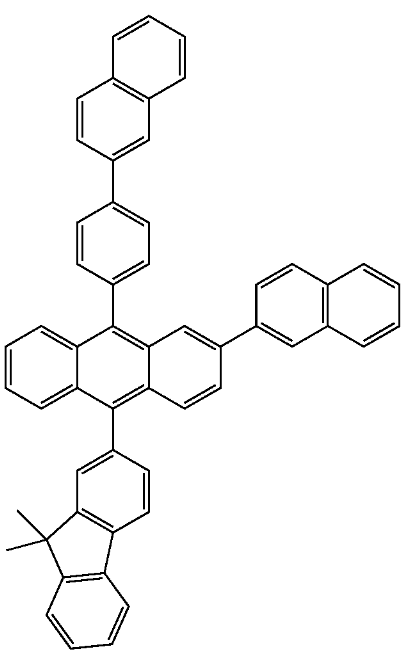
-continued
H27
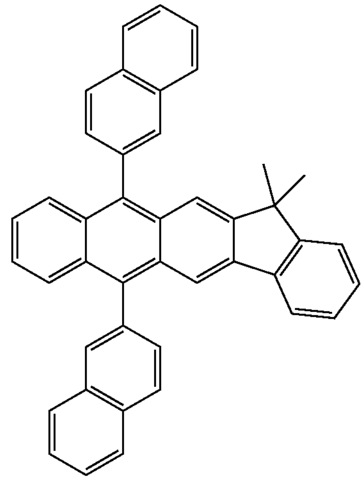
H28
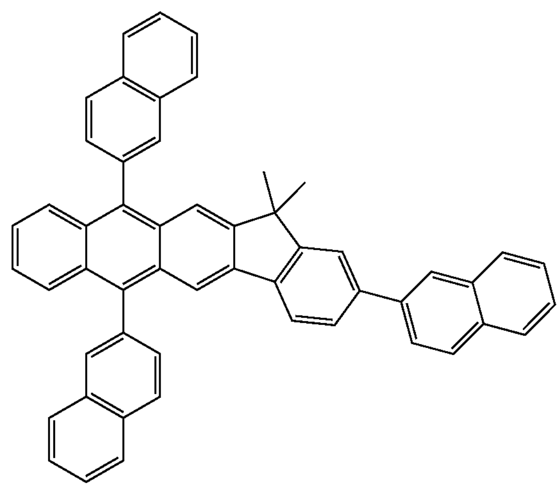
H29
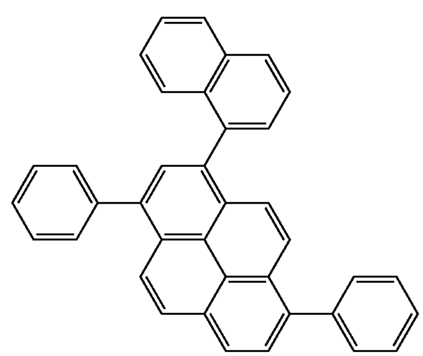

-continued
H30
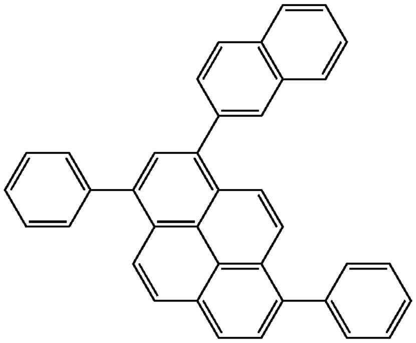
H31
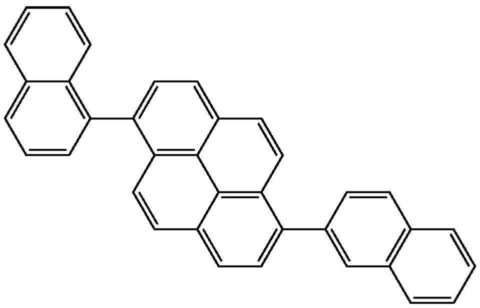
H32
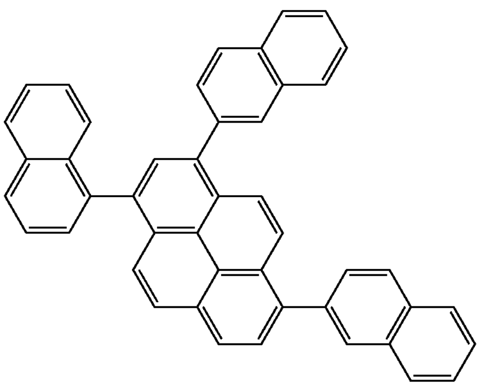
H33
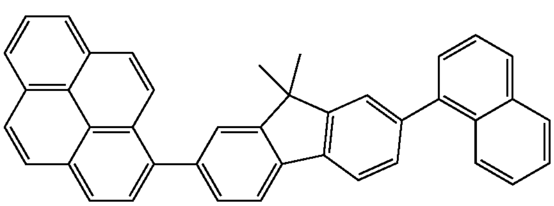
H34
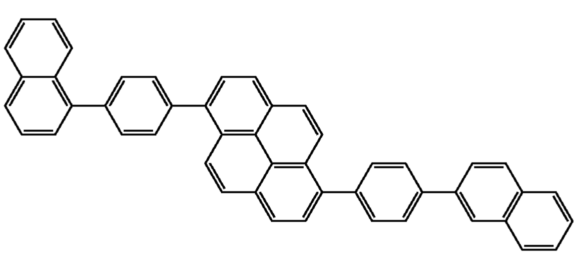
-continued
H35
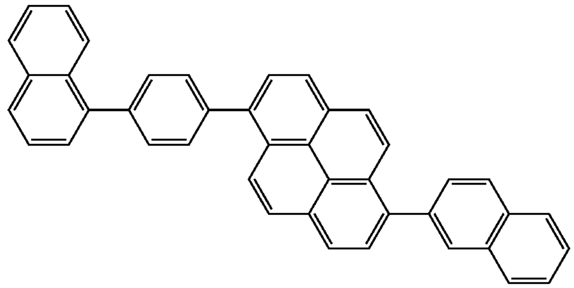
H36
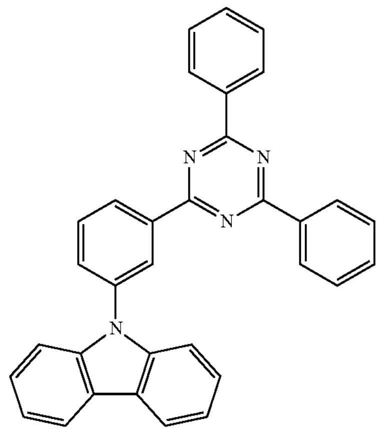
H37
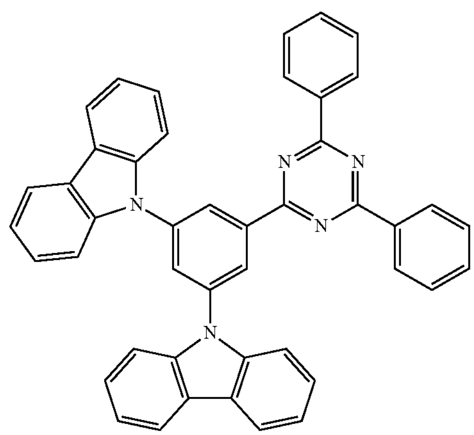
H38
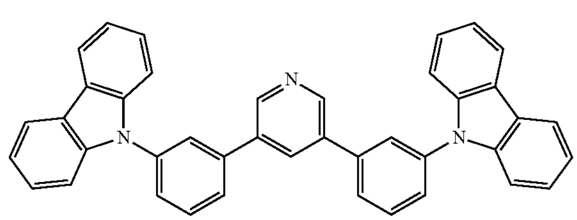

-continued
H39
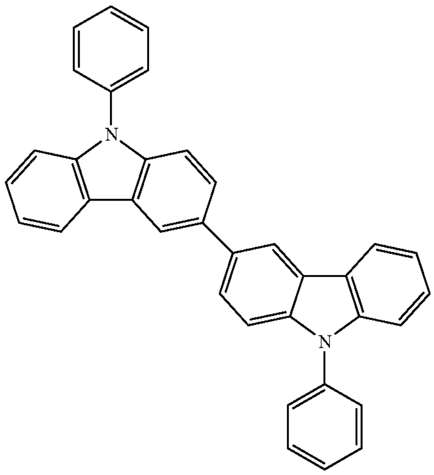
H40
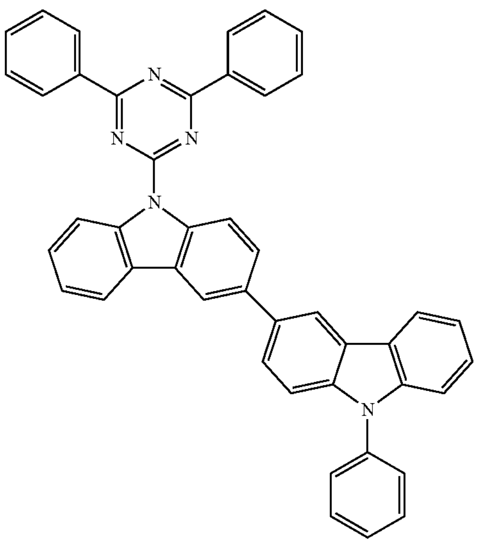
H41
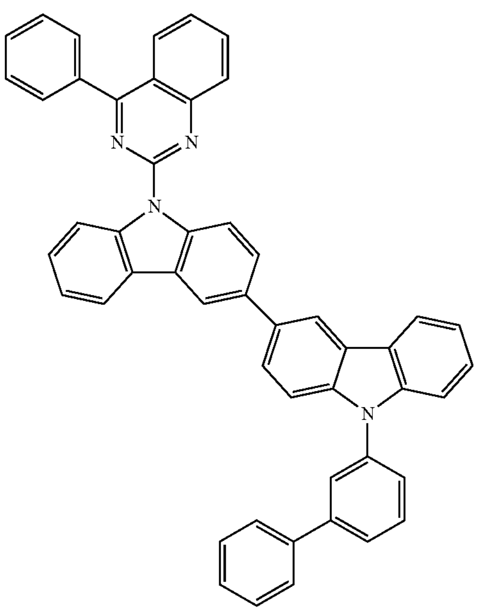
-continued
H42
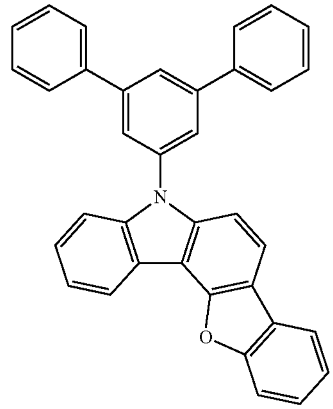
H43
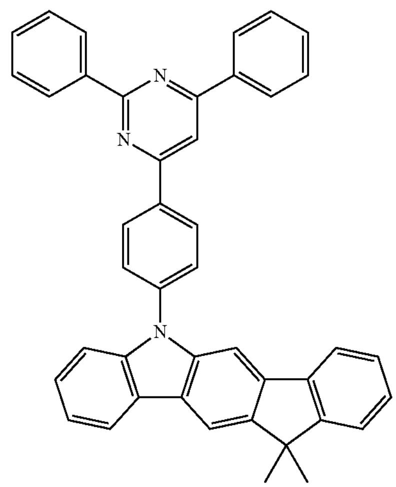
H44
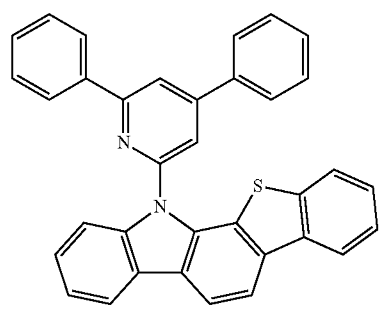
H45
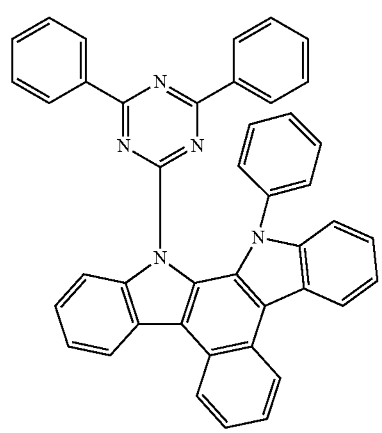

H46
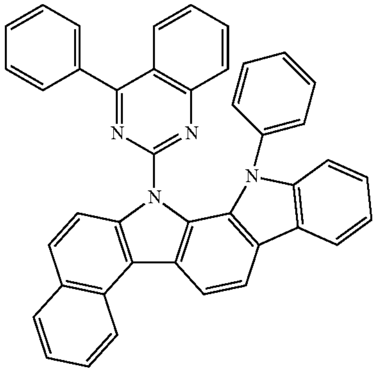
H47
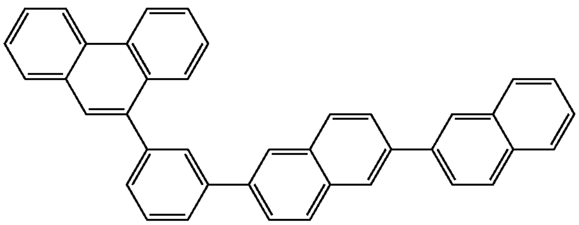
H48
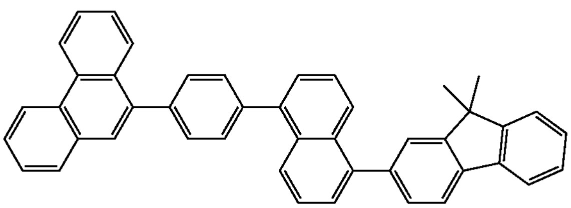
H49
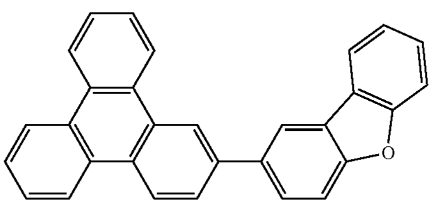
H50
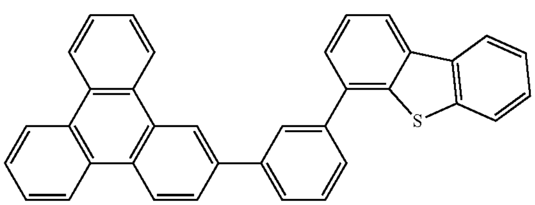
H51
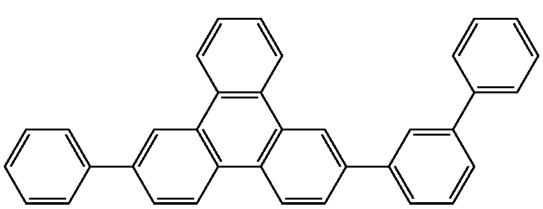
H52
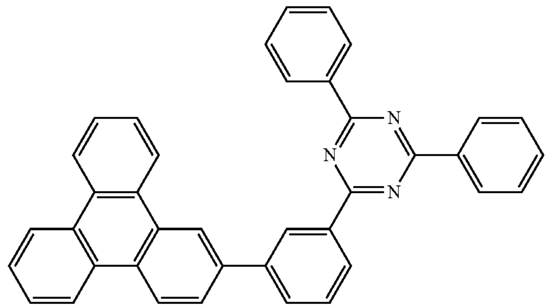
H53
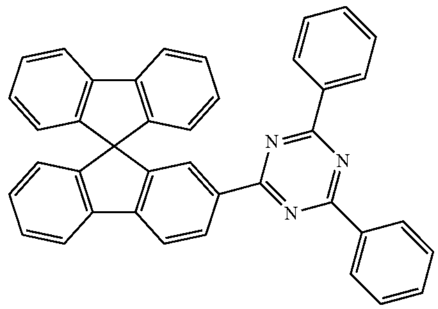
H54
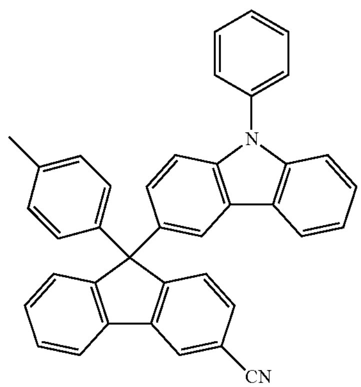
H55
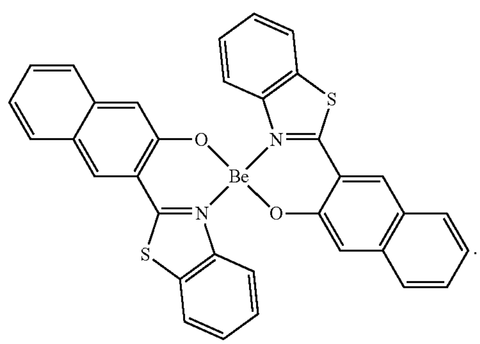
Phosphorescent Dopant Included in Emission Layer in Organic Layer 150
The phosphorescent dopant may include an organometallic complex represented by Formula 401:
$$M(L_{401})_{xc1}(L_{402})_{xc2},$$ Formula 401

-continued

Formula 402

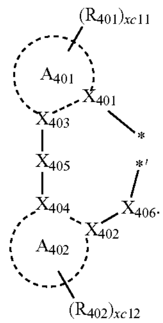

In Formulae 401 and 402,

M may be selected from iridium (Ir), platinum (Pt), palladium (Pd), osmium (Os), titanium (Ti), zirconium (Zr), hafnium (Hf), europium (Eu), terbium (Tb), rhodium (Rh), and thulium (Tm), $L_{401}$ may be selected from ligands represented by Formula 402, xc1 may be 1, 2, or 3, and when xc1 is two or more, two or more $L_{401}$(s) may be identical to or different from each other, $L_{402}$ may be an organic ligand, xc2 may be an integer selected from 0 to 4, and when xc2 is two or more, two or more $L_{402}$(s) may be identical to or different from each other, $X_{401}$ to $X_{404}$ may each independently be nitrogen or carbon, $X_{401}$ and $X_{403}$ may be connected (e.g., coupled) via a single bond or a double bond, and $X_{402}$ and $X_{404}$ may be connected (e.g., coupled) via a single bond or a double bond, $A_{401}$ and $A_{402}$ may each independently be a $C_5$-$C_{60}$ carbocyclic group or a $C_1$-$C_{60}$ heterocyclic group, $X_{405}$ may be a single bond, *—O-', *—S-', *—C(═O)—*', *—N($Q_{411}$)-*', *—C($Q_{411}$)($Q_{412}$)-*', *—C($Q_{411}$)═C($Q_{412}$)-*', *—C($Q_{411}$)═', or *═C($Q_{411}$)═*, wherein $Q_{411}$ and $Q_{412}$ may each independently be selected from hydrogen, deuterium, a $C_1$-$C_{20}$ alkyl group, a $C_1$-$C_{20}$ alkoxy group, a phenyl group, a biphenyl group, a terphenyl group, and a naphthyl group, $X_{406}$ may be a single bond, O, or S, $R_{401}$ and $R_{402}$ may each independently be selected from hydrogen, deuterium, —F, —Cl, —Br, —I, a hydroxyl group, a cyano group, a nitro group, an amidino group, a hydrazino group, a hydrazono group, a substituted or unsubstituted $C_1$-$C_{20}$ alkyl group, a substituted or unsubstituted $C_1$-$C_{20}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —Si($Q_{401}$)($Q_{402}$)($Q_{403}$), —N($Q_{401}$)($Q_{402}$), —B($Q_{401}$)($Q_{402}$), —C(═O)($Q_{401}$), —S(═O)$_2$($Q_{401}$), and —P(═O)($Q_{401}$)($Q_{402}$), wherein $Q_{401}$ to $Q_{403}$ may each independently be selected from a $C_1$-$C_{10}$ alkyl group, a $C_1$-$C_{10}$ alkoxy group, a $C_6$-$C_{20}$ aryl group, and a $C_1$-$C_{20}$ heteroaryl group, xc11 and xc12 may each independently be an integer selected from 0 to 10, and

* and *' in Formula 402 may each independently indicate a binding site to M in Formula 401.

In one or more embodiments, $A_{401}$ and $A_{402}$ in Formula 402 may each independently be selected from a benzene group, a naphthalene group, a fluorene group, a spiro-bifluorene group, an indene group, a pyrrole group, a thiophene group, a furan group, an imidazole group, a pyrazole group, a thiazole group, an isothiazole group, an oxazole group, an isoxazole group, a pyridine group, a pyrazine group, a pyrimidine group, a pyridazine group, a quinoline group, an isoquinoline group, a benzoquinoline group, a quinoxaline group, a quinazoline group, a carbazole group, a benzimidazole group, a benzofuran group, a benzothiophene group, an isobenzothiophene group, a benzoxazole group, an isobenzoxazole group, a triazole group, a tetrazole group, an oxadiazole group, a triazine group, a dibenzofuran group, and a dibenzothiophene group.

In one or more embodiments, in Formula 402, i) $X_{401}$ may be nitrogen and $X_{402}$ may be carbon, or ii) both $X_{401}$ and $X_{402}$ may be nitrogen.

In one or more embodiments, $R_{401}$ and $R_{402}$ in Formula 402 may each independently be selected from the group consisting of:

hydrogen, deuterium, —F, —Cl, —Br, —I, a hydroxyl group, a cyano group, a nitro group, an amidino group, a hydrazino group, a hydrazono group, a $C_1$-$C_{20}$ alkyl group, and a $C_1$-$C_{20}$ alkoxy group;

a $C_1$-$C_{20}$ alkyl group and a $C_1$-$C_{20}$ alkoxy group, each substituted with at least one selected from deuterium, —F, —Cl, —Br, —I, a hydroxyl group, a cyano group, a nitro group, an amidino group, a hydrazino group, a hydrazono group, a phenyl group, a naphthyl group, a cyclopentyl group, a cyclohexyl group, an adamantanyl group, a norbornanyl group, and a norbornenyl group;

a cyclopentyl group, a cyclohexyl group, an adamantanyl group, a norbornanyl group, a norbornenyl group, a phenyl group, a biphenyl group, a terphenyl group, a naphthyl group, a fluorenyl group, a pyridinyl group, a pyrazinyl group, a pyrimidinyl group, a pyridazinyl group, a triazinyl group, a quinolinyl group, an isoquinolinyl group, a quinoxalinyl group, a quinazolinyl group, a carbazolyl group, a dibenzofuranyl group, and a dibenzothiophenyl group;

a cyclopentyl group, a cyclohexyl group, an adamantanyl group, a norbornanyl group, a norbornenyl group, a phenyl group, a biphenyl group, a terphenyl group, a naphthyl group, a fluorenyl group, a pyridinyl group, a pyrazinyl group, a pyrimidinyl group, a pyridazinyl group, a triazinyl group, a quinolinyl group, an isoquinolinyl group, a quinoxalinyl group, a quinazolinyl group, a carbazolyl group, a dibenzofuranyl group, and a dibenzothiophenyl group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a cyclopentyl group, a cyclohexyl group, an adamantanyl group, a norbornanyl group, a norbornenyl group, a phenyl group, a biphenyl group, a terphenyl group, a naphthyl group, a fluorenyl group, a pyridinyl group, a pyrazinyl group, a pyrimidinyl group, a pyridazinyl group, a triazinyl group, a quinolinyl group, an isoquinolinyl group, a quinoxalinyl group, a quinazolinyl group, a carbazolyl group, a dibenzofuranyl group, and a dibenzothiophenyl group; and —Si($Q_{401}$)($Q_{402}$)($Q_{403}$), —N($Q_{401}$)($Q_{402}$), —B($Q_{401}$)($Q_{402}$), —C(=O)($Q_{401}$), —S(=O)$_2$($Q_{401}$), and —P(=O)($Q_{401}$)($Q_{402}$), wherein $Q_{401}$ to $Q_{403}$ may each independently be selected from a $C_1$-$C_{10}$ alkyl group, a $C_1$-$C_{10}$ alkoxy group, a phenyl group, a biphenyl group, and a naphthyl group, but embodiments of the present disclosure are not limited thereto.

In one or more embodiments, when xc1 in Formula 401 is two or more, two $A_{401}$ (s) selected from two or more $L_{401}$(s) may be optionally connected (e.g., coupled) via a linking group $X_{407}$, and/or two $A_{402}$(s) may be optionally connected (e.g., coupled) via a linking group $X_{408}$ (see Compounds PD1 to PD4 and PD7). $X_{407}$ and $X_{408}$ may each independently be a single bond, *—O-', *—S-', *—C(=O)—*', *—N($Q_{413}$)-*', *—C($Q_{413}$)($Q_{414}$)-*', or *—C($Q_{413}$)=C($Q_{414}$)-' (wherein $Q_{413}$ and $Q_{414}$ may each independently be hydrogen, deuterium, a $C_1$-$C_{20}$ alkyl group, a $C_1$-$C_{20}$ alkoxy group, a phenyl group, a biphenyl group, a terphenyl group, or a naphthyl group), but embodiments of the present disclosure are not limited thereto.

$L_{402}$ in Formula 401 may be any monovalent, divalent, or trivalent organic ligand. For example, $L_{402}$ may be selected from a halogen, a diketone (for example, an acetylacetonate), a carboxylic acid (for example, a picolinate), —C(=O), an isonitrile, —CN, and a phosphorus-based ligand (for example, a phosphine or a phosphite), but embodiments of the present disclosure are not limited thereto.

In one or more embodiments, the phosphorescent dopant may be selected from, for example, Compounds PD1 to PD25, but embodiments of the present disclosure are not limited thereto:

PD1

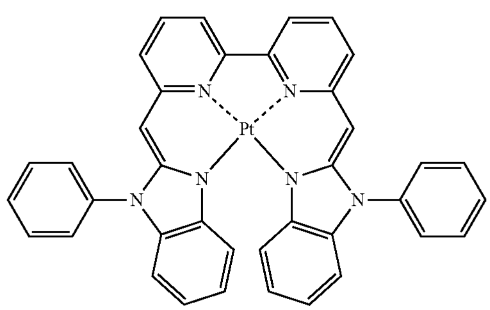

PD2

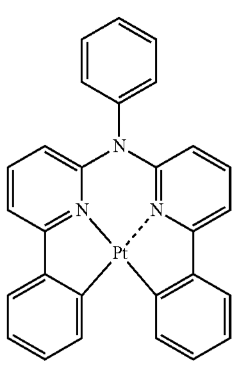

-continued

PD3

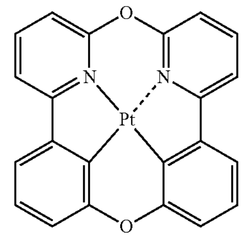

PD4

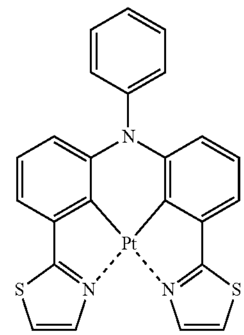

PD5

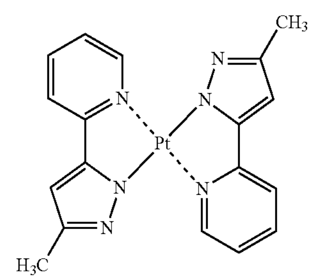

PD6

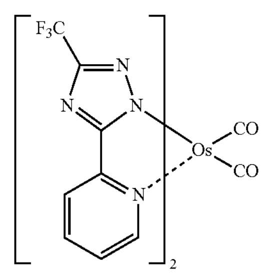

PD7

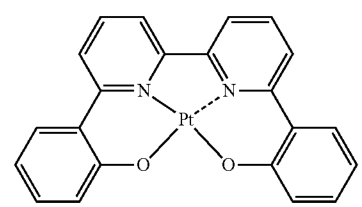

PD8

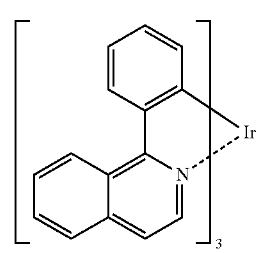

-continued
PD9
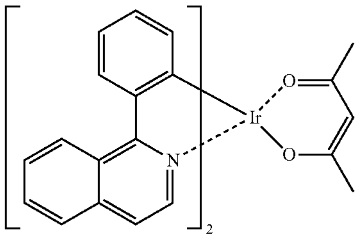
PD10
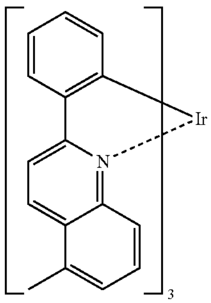
PD11
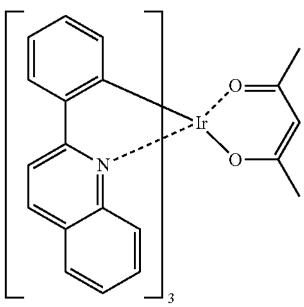
PD12
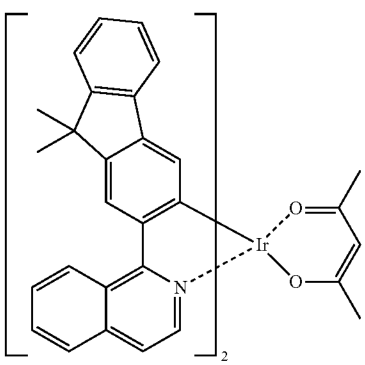
PD13
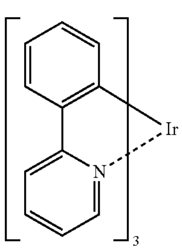
-continued
PD14
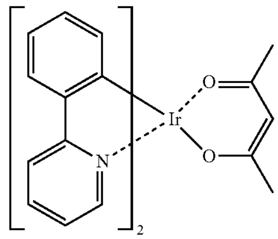
PD15
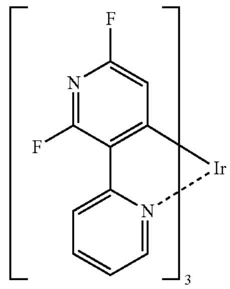
PD16
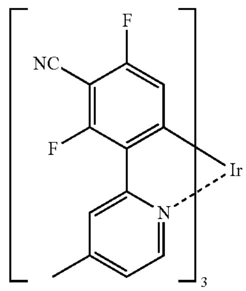
PD17
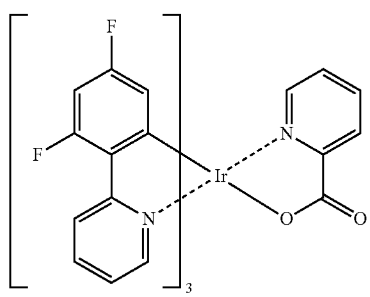
PD18
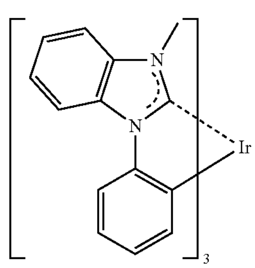

-continued

PD19

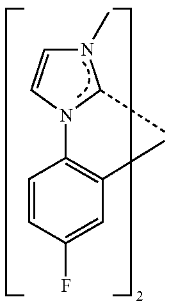

PD20

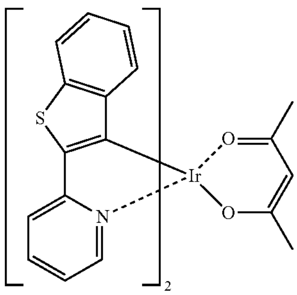

PD21

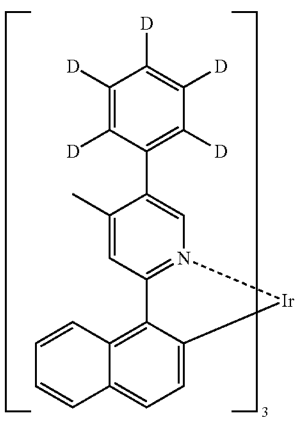

PD22

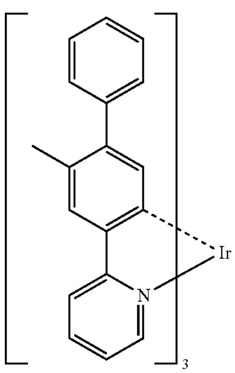

-continued

PD23

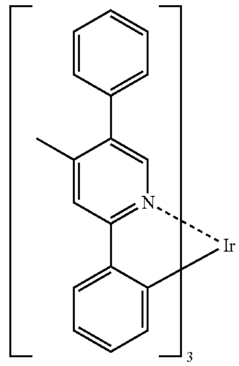

PD24

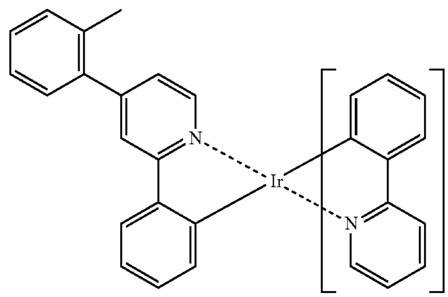

PD25

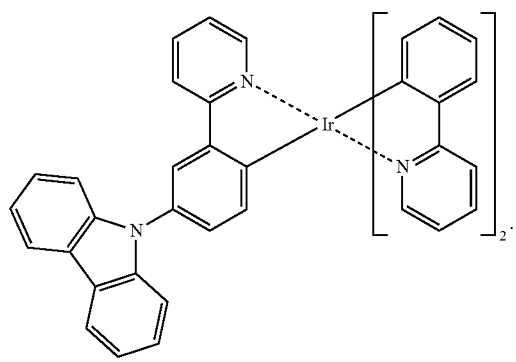

Fluorescent Dopant in Emission Layer

The fluorescent dopant may include an arylamine compound or a styrylamine compound.

In one or more embodiments, the fluorescent dopant may include a compound represented by Formula 501:

Formula 501

$$Ar_{501}\left[(L_{503})_{xd3}-N\begin{matrix}(L_{501})_{xd1}-R_{501}\\(L_{502})_{xd2}-R_{502}\end{matrix}\right]_{xd4}.$$

In Formula 501, $Ar_{501}$ may be a substituted or unsubstituted $C_5$-$C_{60}$ carbocyclic group or a substituted or unsubstituted $C_1$-$C_{60}$ heterocyclic group, $L_{501}$ to $L_{503}$ may each independently be selected from a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group, xd1 to xd3 may each independently be an integer selected from 0 to 3, $R_{501}$ and $R_{502}$ may each independently be selected from a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group, and xd4 may be an integer selected from 1 to 6.

In one or more embodiments, $Ar_{501}$ in Formula 501 may be selected from the group consisting of:

a naphthalene group, a heptalene group, a fluorene group, a spiro-bifluorene group, a benzofluorene group, a dibenzofluorene group, a phenalene group, a phenanthrene group, an anthracene group, a fluoranthene group, a triphenylene group, a pyrene group, a chrysene group, a naphthacene group, a picene group, a perylene group, a pentaphene group, an indenoanthracene group, and an indenophenanthrene group; and a naphthalene group, a heptalene group, a fluorene group, a spiro-bifluorene group, a benzofluorene group, a dibenzofluorene group, a phenalene group, a phenanthrene group, an anthracene group, a fluoranthene group, a triphenylene group, a pyrene group, a chrysene group, a naphthacene group, a picene group, a perylene group, a pentaphene group, an indenoanthracene group, and an indenophenanthrene group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, and a naphthyl group.

In one or more embodiments, $L_{501}$ to $L_{503}$ in Formula 501 may each independently be selected from the group consisting of:

a phenylene group, a naphthylene group, a fluorenylene group, a spiro-bifluorenylene group, a benzofluorenylene group, a dibenzofluorenylene group, a phenanthrenylene group, an anthracenylene group, a fluoranthenylene group, a triphenylenylene group, a pyrenylene group, a chrysenylene group, a perylenylene group, a pentaphenylene group, a hexacenylene group, a pentacenylene group, a thiophenylene group, a furanylene group, a carbazolylene group, an indolylene group, an isoindolylene group, a benzofuranylene group, a benzothiophenylene group, a dibenzofuranylene group, a dibenzothiophenylene group, a benzocarbazolylene group, a dibenzocarbazolylene group, a dibenzosilolylene group, and a pyridinylene group; and a phenylene group, a naphthylene group, a fluorenylene group, a spiro-bifluorenylene group, a benzofluorenylene group, a dibenzofluorenylene group, a phenanthrenylene group, an anthracenylene group, a fluoranthenylene group, a triphenylenylene group, a pyrenylene group, a chrysenylene group, a perylenylene group, a pentaphenylene group, a hexacenylene group, a pentacenylene group, a thiophenylene group, a furanylene group, a carbazolylene group, an indolylene group, an isoindolylene group, a benzofuranylene group, a benzothiophenylene group, a dibenzofuranylene group, a dibenzothiophenylene group, a benzocarbazolylene group, a dibenzocarbazolylene group, a dibenzosilolylene group, and a pyridinylene group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, and a pyridinyl group.

In one or more embodiments, $R_{501}$ and $R_{502}$ in Formula 501 may each independently be selected from the group consisting of:

a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, and a pyridinyl group; and a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, and a pyridinyl group, each substituted with deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, and —$Si(Q_{31})(Q_{32})(Q_{33})$, wherein $Q_{31}$ to $Q_{33}$ may each independently be selected from a $C_1$-$C_{10}$ alkyl group, a $C_1$-$C_{10}$ alkoxy group, a phenyl group, a biphenyl group, a terphenyl group, and a naphthyl group.

In one or more embodiments, xd4 in Formula 501 may be 2, but embodiments of the present disclosure are not limited thereto.

For example, the fluorescent dopant may be selected from Compounds FD1 to FD22:

FD1

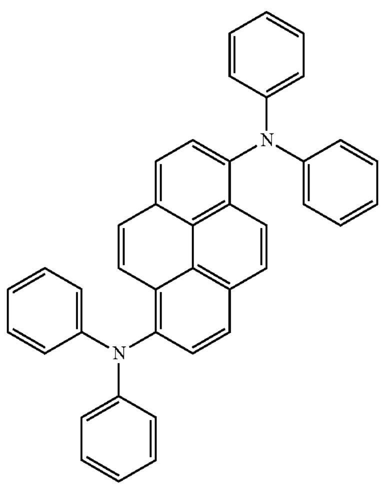

FD2

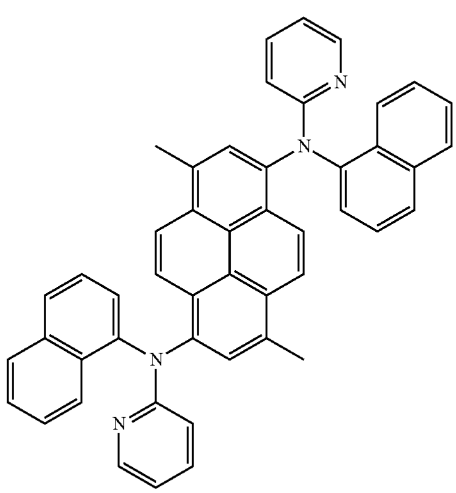

-continued

FD3

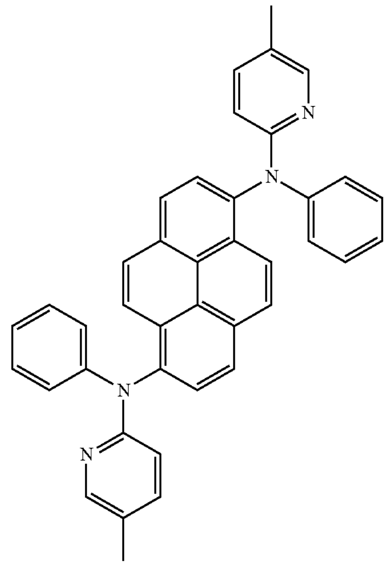

FD4

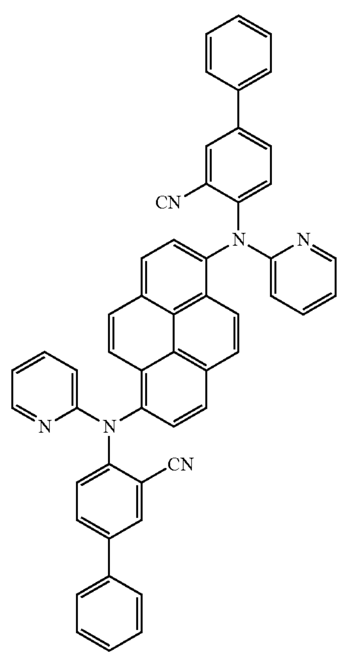

FD5
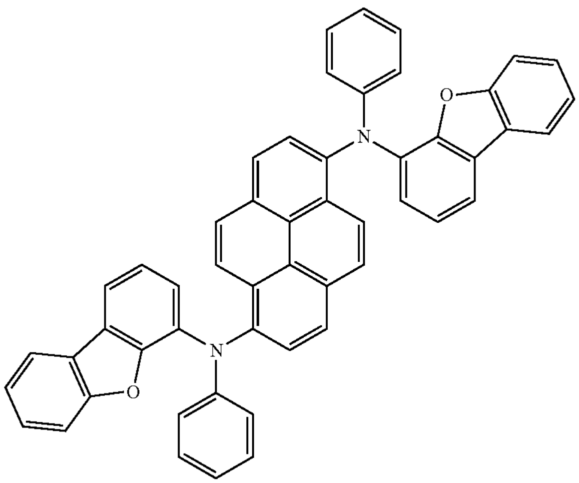
FD6
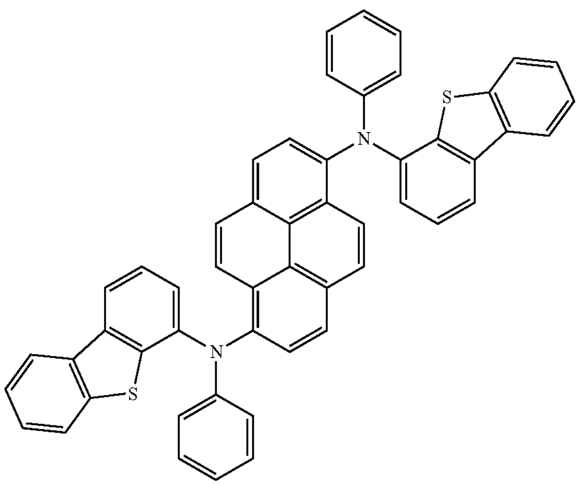
FD7
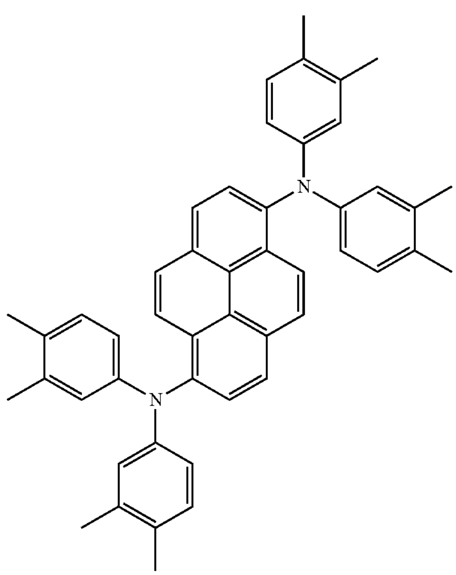
FD8
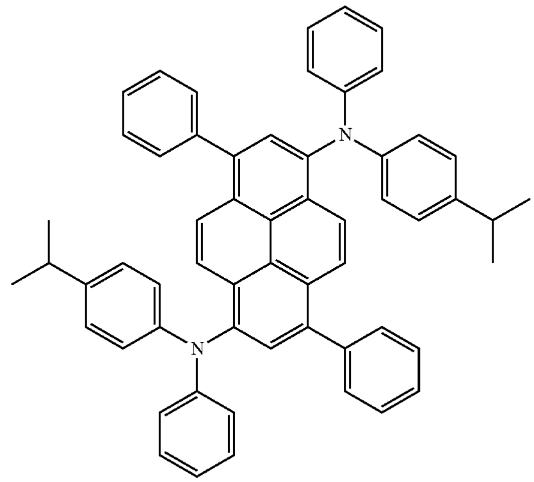
FD9
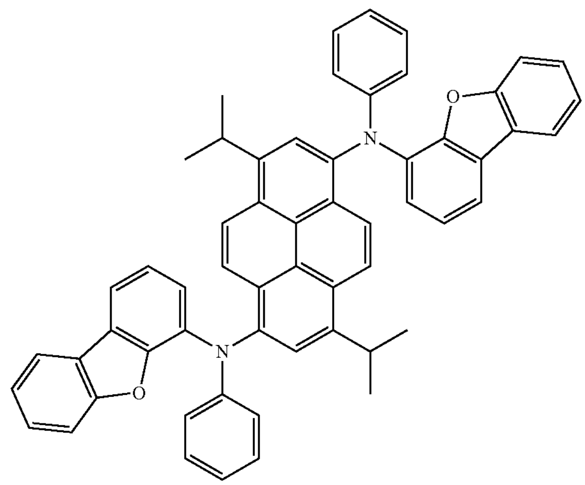
FD10
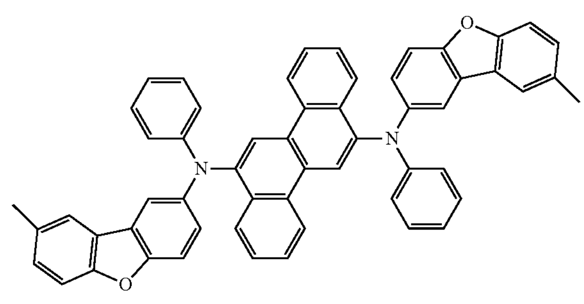
FD11
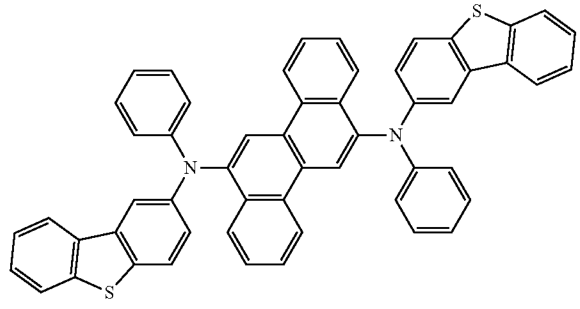

-continued
FD12
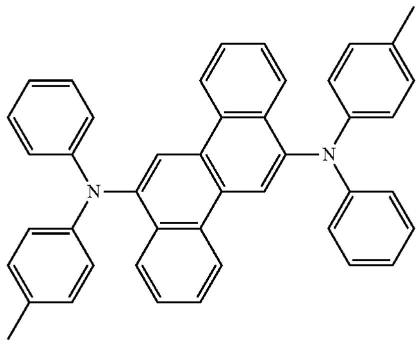
FD13
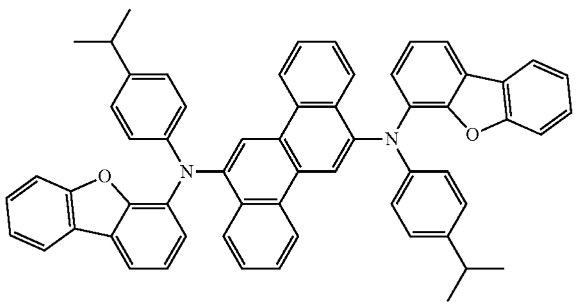
FD14
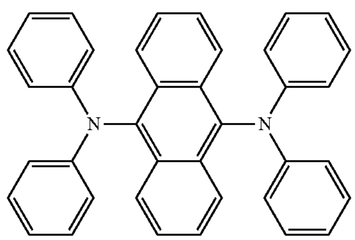
FD15
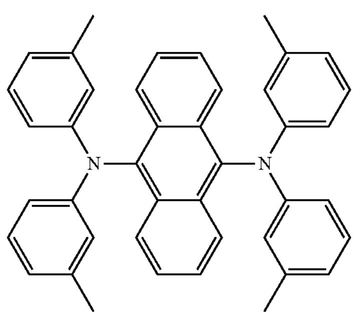
FD16
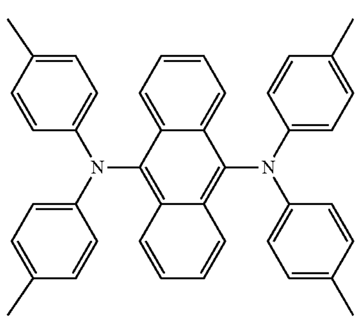
-continued
FD17
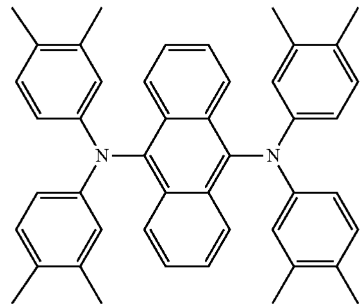
FD18
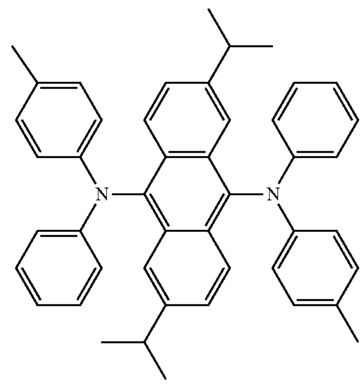
FD19
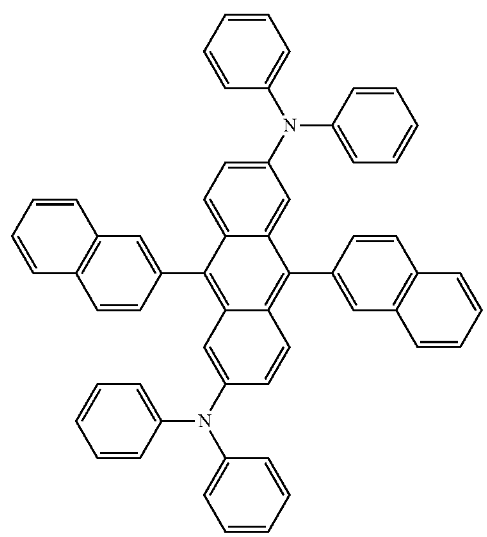
FD20
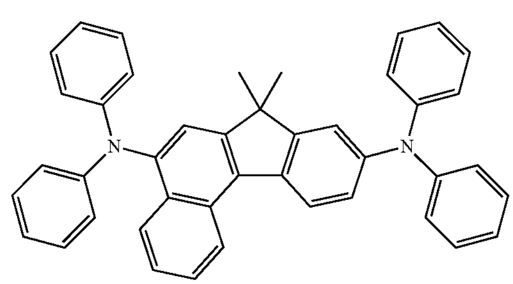

-continued
FD21
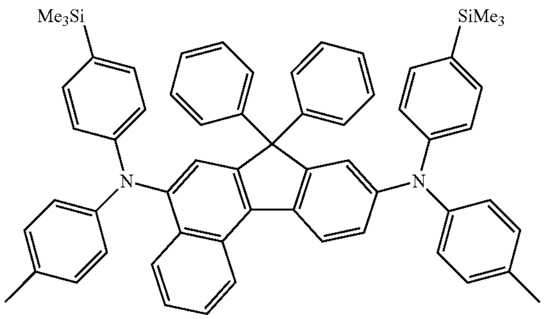
-continued
FD22
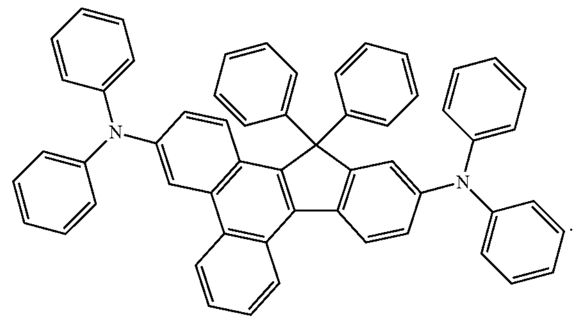
In one or more embodiments, the fluorescent dopant may be selected from the compounds illustrated below, but embodiments of the present disclosure are not limited thereto:
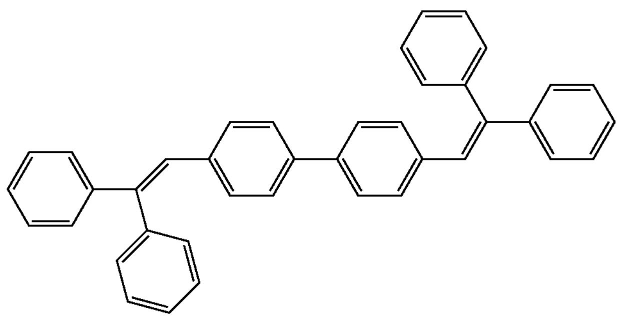
DPVBi
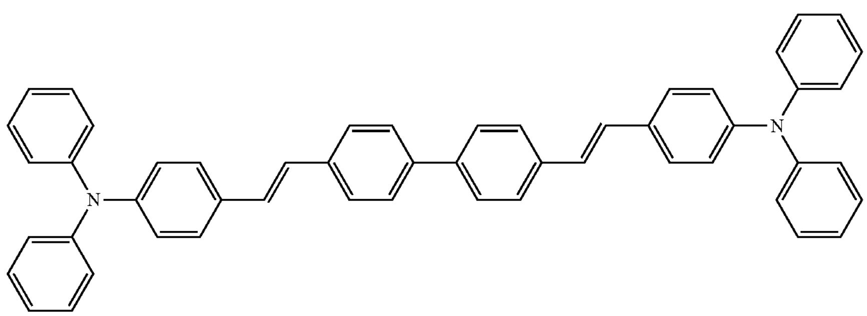
DPAVBi
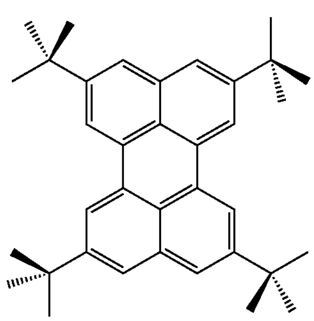
TBPe
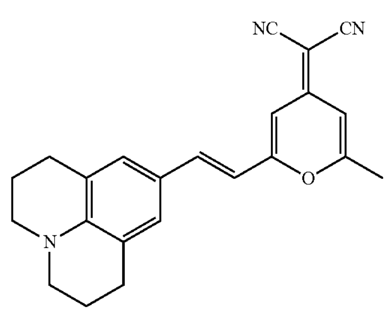
DCM -continued

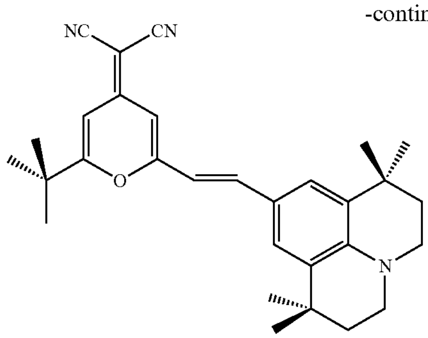

DCJTB

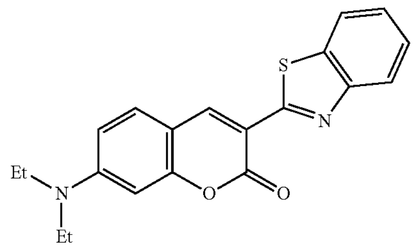

Coumarin 6

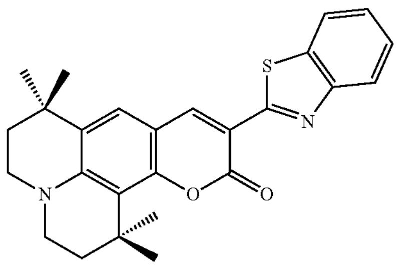

C545T

Electron Transport Region in Organic Layer 150

The electron transport region may have: i) a single-layered structure including (e.g., consisting of) a single layer including a single material, ii) a single-layered structure including (e.g., consisting of) a single layer including a plurality of different materials, or iii) a multi-layered structure having a plurality of layers including a plurality of different materials.

The electron transport region may include a buffer layer, a hole blocking layer, an electron control layer, an electron transport layer, an electron injection layer, or a combination thereof, but embodiments of the present disclosure are not limited thereto.

In one or more embodiments, the electron transport region may include the first compound represented by one selected from Formulae 1A to 1E and the second compound represented by Formula 2A or 2B. The first compound and the second compound may each independently be the same as described herein.

In one or more embodiments, the electron transport region may include an electron transport layer, as well as a buffer layer between the emission layer and the electron transport layer. The first compound represented by one selected from Formulae 1A to 1E may be included in the electron transport layer, and the second compound represented by Formula 2A or 2B may be included in the buffer layer.

In one or more embodiments, the buffer layer may directly contact the emission layer.

In one or more embodiments, the electron transport region may include, in addition to the first compound represented by one selected from Formulae 1A to 1E and the second compound represented by Formula 2A or 2B, at least one compound selected from 2,9-dimethyl-4,7-diphenyl-1,10-phenanthroline (BCP), 4,7-diphenyl-1,10-phenanthroline (Bphen), $Alq_3$, BAlq, 3-(biphenyl-4-yl)-5-(4-tert-butylphenyl)-4-phenyl-4H-1,2,4-triazole (TAZ), and NTAZ.

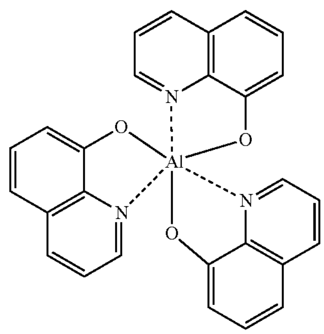

$Alq_3$

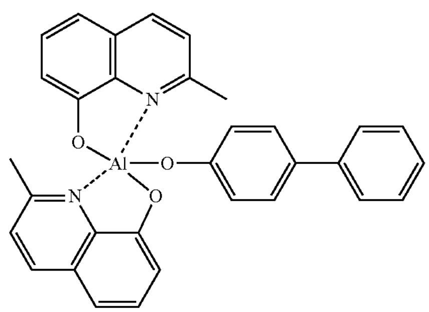

BAlq

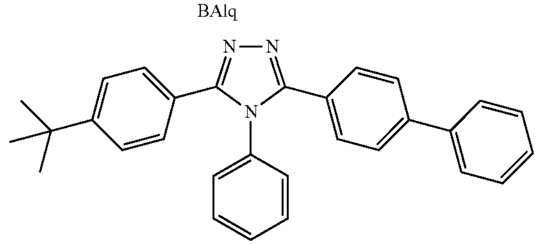

TAZ

-continued

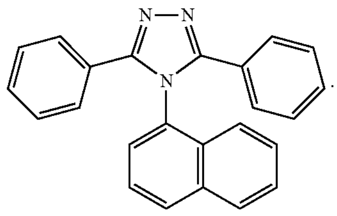

NTAZ

The thicknesses of the buffer layer, the hole blocking layer, and/or the electron control layer may be about 20 Å to about 1,000 Å, and in some embodiments, about 30 Å to about 300 Å. When the thicknesses of the buffer layer, the hole blocking layer, and the electron control layer are each within these ranges, the electron blocking layer may have excellent electron blocking characteristics and/or electron control characteristics without a substantial increase in driving voltage.

The thickness of the electron transport layer may be about 100 Å to about 1,000 Å, and in some embodiments, about 150 Å to about 500 Å. When the thickness of the electron transport layer is within these ranges, the electron transport layer may have satisfactory electron transport characteristics without a substantial increase in driving voltage.

The electron transport region (for example, the electron transport layer in the electron transport region) may further include, in addition to the materials described above, a metal-containing material.

The metal-containing material may include at least one selected from an alkali metal complex and an alkaline earth metal complex. The alkali metal complex may include a metal ion selected from a lithium (Li) ion, a sodium (Na) ion, a potassium (K) ion, a rubidium (Rb) ion, and a cesium (Cs) ion, and the alkaline earth metal complex may include a metal ion selected from a Be ion, a Mg ion, a calcium (Ca) ion, an strontium (Sr) ion, and a barium (Ba) ion. Each ligand coordinated with the metal ion of the alkali metal complex or the alkaline earth metal complex may independently be selected from a hydroxyquinoline, a hydroxyisoquinoline, a hydroxybenzoquinoline, a hydroxyacridine, a hydroxyphenanthridine, a hydroxyphenyl oxazole, a hydroxyphenyl thiazole, a hydroxydiphenyl oxadiazole, a hydroxydiphenyl thiadiazole, a hydroxyphenyl pyridine, a hydroxyphenyl benzimidazole, a hydroxyphenyl benzothiazole, a bipyridine, a phenanthroline, and a cyclopentadiene, but embodiments of the present disclosure are not limited thereto.

For example, the metal-containing material may include a Li complex. The Li complex may include, for example, Compound ET-D1 (lithium quinolate, LiQ) and/or ET-D2:

ET-D1

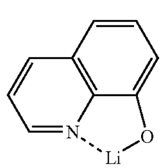

-continued

ET-D2

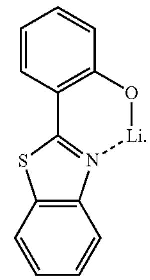

The electron transport region may include an electron injection layer that facilitates injection of electrons from the second electrode 190. The electron injection layer may directly contact the second electrode 190.

The electron injection layer may have i) a single-layered structure including a single layer including a single material, ii) a single-layered structure including a single layer including a plurality of different materials, or iii) a multi-layered structure having a plurality of layers including a plurality of different materials.

The electron injection layer may include an alkali metal, an alkaline earth metal, a rare earth metal, an alkali metal compound, an alkaline earth metal compound, a rare earth metal compound, an alkali metal complex, an alkaline earth metal complex, a rare earth metal complex, or a combination thereof.

In one or more embodiments, the electron injection layer may include Li, Na, K, Rb, Cs, Mg, Ca, Er, Tm, Yb, or a combination thereof. However, embodiments of the material included in the electron injection layer are not limited thereto.

The alkali metal may be selected from Li, Na, K, Rb, and Cs. In one or more embodiments, the alkali metal may be Li, Na, or Cs. In one or more embodiments, the alkali metal may be Li or Cs, but embodiments of the present disclosure are not limited thereto.

The alkaline earth metal may be selected from Mg, Ca, Sr, and Ba.

The rare earth metal may be selected from scandium (Sc), yttrium (Y), cerium (Ce), ytterbium (Yb), gadolinium (Gd), and terbium (Tb).

The alkali metal compound, the alkaline earth metal compound, and the rare earth metal compound may be selected from oxides and halides (for example, fluorides, chlorides, bromides, and/or iodides) of the alkali metal, the alkaline earth metal, and the rare earth metal, respectively.

The alkali metal compound may be selected from alkali metal oxides (such as $Li_2O$, $Cs_2O$, and/or $K_2O$) and alkali metal halides (such as LiF, NaF, CsF, KF, LiI, NaI, CsI, and/or KI). In one or more embodiments, the alkali metal compound may be selected from LiF, $Li_2O$, NaF, LiI, NaI, CsI, and KI, but embodiments of the present disclosure are not limited thereto.

The alkaline earth metal compound may be selected from alkaline earth metal compounds (such as BaO, SrO, CaO, $Ba_xSr_{1-x}O$ ($0<x<1$), and/or $Ba_xCa_{1-x}O$ ($0<x<1$)). In one or more embodiments, the alkaline earth metal compound may be selected from BaO, SrO, and CaO, but embodiments of the present disclosure are not limited thereto.

The rare earth metal compound may be selected from $YbF_3$, $ScF_3$, $ScO_3$, $Y_2O_3$, $Ce_2O_3$, $GdF_3$, and $TbF_3$. In one or more embodiments, the rare earth metal compound may be selected from $YbF_3$, $ScF_3$, $TbF_3$, $YbI_3$, $ScI_3$, and $TbI_3$, but embodiments of the present disclosure are not limited thereto.

The alkali metal complex, the alkaline earth metal complex, and the rare earth metal complex may respectively include an alkali metal ion, an alkaline earth metal ion, and a rare earth metal ion as described above, and each ligand coordinated with the metal ion of the alkali metal complex, the alkaline earth metal complex, and the rare earth metal complex may independently be selected from a hydroxyquinoline, a hydroxyisoquinoline, a hydroxybenzoquinoline, a hydroxyacridine, a hydroxyphenanthridine, a hydroxyphenyl oxazole, a hydroxyphenyl thiazole, a hydroxydiphenyl oxadiazole, a hydroxydiphenyl thiadiazole, a hydroxyphenyl pyridine, a hydroxyphenyl benzimidazole, a hydroxyphenyl benzothiazole, a bipyridine, a phenanthroline, and a cyclopentadiene, but embodiments of the present disclosure are not limited thereto.

The electron injection layer may include an alkali metal, an alkaline earth metal, a rare earth metal, an alkali metal compound, an alkaline earth metal compound, a rare earth metal compound, an alkali metal complex, an alkaline earth metal complex, a rare earth metal complex, or a combination thereof, as described above. In one or more embodiments, the electron injection layer may further include an organic material. When the electron injection layer further includes an organic material, the alkali metal, the alkaline earth metal, the rare earth metal, the alkali metal compound, the alkaline earth metal compound, the rare earth metal compound, the alkali metal complex, the alkaline earth metal complex, the rare earth metal complex, or the combination thereof may be homogeneously or non-homogeneously dispersed in a matrix including the organic material.

The thickness of the electron injection layer may be about 1 Å to about 100 Å, and in some embodiments, about 3 Å to about 90 Å. When the thickness of the electron injection layer is within these ranges, the electron injection layer may have satisfactory electron injection characteristics without a substantial increase in driving voltage.

In one or more embodiments, the electron transport region of the organic light-emitting device 10 may include a buffer layer, an electron transport layer, and an electron injection layer, and at least one layer selected from the electron transport layer and the electron injection layer may include an alkali metal, an alkaline earth metal, a rare earth metal, an alkali metal compound, an alkaline earth metal compound, a rare earth metal compound, an alkali metal complex, an alkaline earth metal complex, a rare earth metal complex, or a combination thereof.

Second Electrode 190

The second electrode 190 may be on the organic layer 150. The second electrode 190 may be a cathode that is an electron injection electrode, and in this regard, the material for forming the second electrode 190 may be selected from a metal, an alloy, an electrically conductive compound, and mixtures thereof, each having a relatively low work function.

The second electrode 190 may include at least one selected from lithium (Li), silver (Ag), magnesium (Mg), aluminum (Al), aluminum-lithium (Al—Li), calcium (Ca), magnesium-indium (Mg—In), magnesium-silver (Mg—Ag), ITO, and IZO, but embodiments of the present disclosure are not limited thereto. The second electrode 190 may be a transmissive electrode, a semi-transmissive electrode, or a reflective electrode.

The second electrode 190 may have a single-layered structure, or a multi-layered structure including two or more layers.

Description of FIGS. 2 to 6

Figure 2:
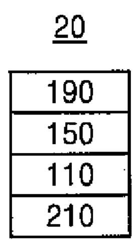
Figure 3:
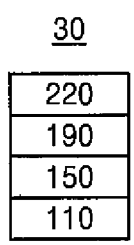
Figure 4:
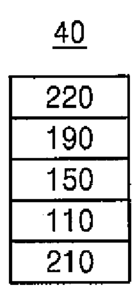

FIG. 2 is a schematic view of an organic light-emitting device 20 according to an embodiment of the present disclosure. The organic light-emitting device 20 includes a first capping layer 210, a first electrode 110, an organic layer 150, and a second electrode 190 sequentially stacked in this stated order. FIG. 3 is a schematic view of an organic light-emitting device 30 according to an embodiment of the present disclosure. The organic light-emitting device 30 includes a first electrode 110, an organic layer 150, a second electrode 190, and a second capping layer 220 sequentially stacked in this stated order. FIG. 4 is a schematic view of an organic light-emitting device 40 according to an embodiment of the present disclosure. The organic light-emitting device 40 includes a first capping layer 210, a first electrode 110, an organic layer 150, a second electrode 190, and a second capping layer 220 sequentially stacked in this stated order.

Regarding FIGS. 2 to 4, the first electrode 110, the organic layer 150, and the second electrode 190 may each independently be the same as described herein in connection with FIG. 1.

In the organic layer 150 of each of the organic light-emitting devices 20 and 40, light generated in an emission layer may pass through the first electrode 110 (which may be a semi-transmissive electrode or a transmissive electrode) and the first capping layer 210 toward the outside. In the organic layer 150 of each of the organic light-emitting devices 30 and 40, light generated in an emission layer may pass through the second electrode 190 (which may be a semi-transmissive electrode or a transmissive electrode) and the second capping layer 220 toward the outside.

The first capping layer 210 and the second capping layer 220 may increase the external luminescent efficiency of the device according to the principle of constructive interference.

In one or more embodiments, the first capping layer 210 and the second capping layer 220 may each independently be an organic capping layer including an organic material, an inorganic capping layer including an inorganic material, or a composite capping layer including an organic material and an inorganic material.

At least one selected from the first capping layer 210 and the second capping layer 220 may include at least one material selected from carbocyclic compounds, heterocyclic compounds, amine-based compounds, porphyrin derivatives, phthalocyanine derivatives, naphthalocyanine derivatives, alkali metal-based complexes, and alkaline earth metal-based complexes. The carbocyclic compounds, the heterocyclic compounds, and the amine-based compounds may each be optionally substituted with a substituent containing at least one element selected from O, N, sulfur (S), selenium (Se), silicon (Si), fluorine (F), chlorine (Cl), bromine (Br), and iodine (I). In one or more embodiments, at least one selected from the first capping layer 210 and the second capping layer 220 may include an amine-based compound.

In one or more embodiments, at least one selected from the first capping layer 210 and the second capping layer 220 may include the compound represented by Formula 201 and/or the compound represented by Formula 202.

In one or more embodiments, at least one selected from the first capping layer 210 and the second capping layer 220 may include a compound selected from Compounds HT28 to HT33 and Compounds CP1 to CP5, but embodiments of the present disclosure are not limited thereto:

CP1

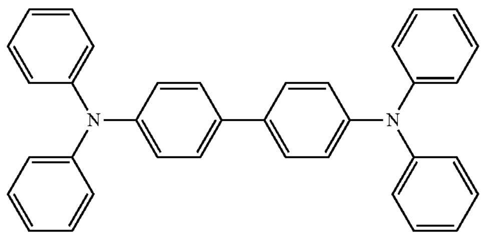

CP2

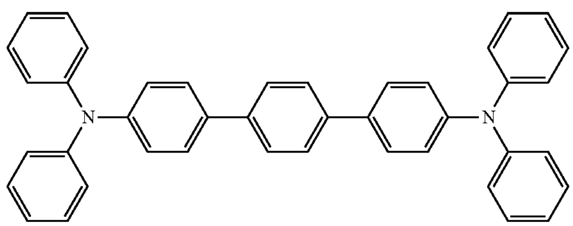

CP3

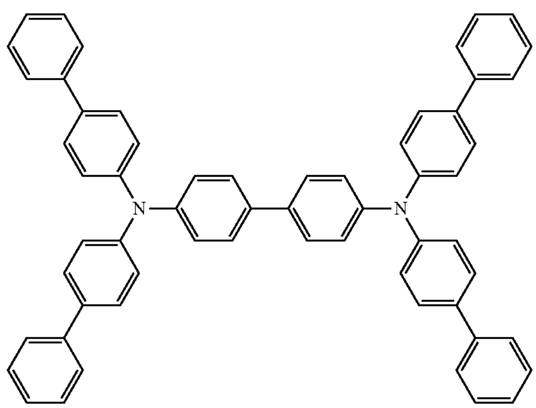

CP4

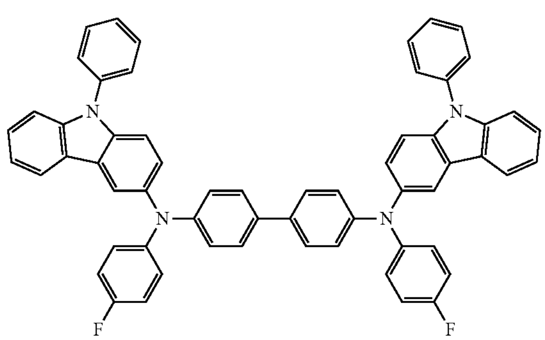

-continued

CP5

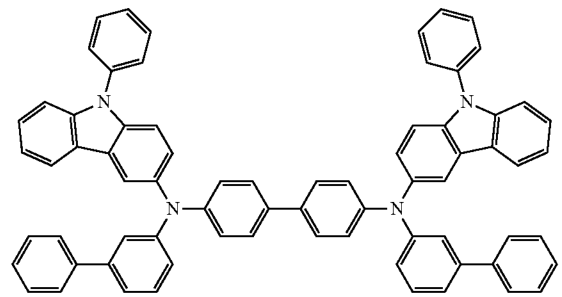

Figure 5:
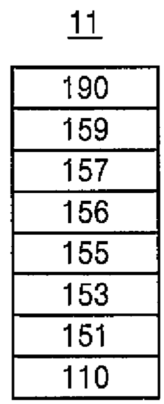

FIG. 5 is a schematic view of an organic light-emitting device 11 according to an embodiment of the present disclosure. The organic light-emitting device 11 may include a first electrode 110, a hole injection layer 151, a hole transport layer 153, an emission layer 155, a buffer layer 156, an electron transport layer 157, an electron injection layer 159, and a second electrode 190 sequentially stacked in this stated order.

Figure 6:
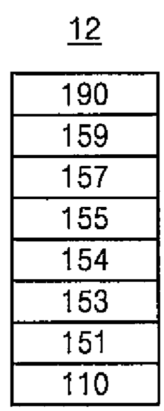

FIG. 6 is a schematic view of an organic light-emitting device 12 according to an embodiment of the present disclosure. The organic light-emitting device 12 includes a first electrode 110, a hole injection layer 151, a hole transport layer 153, an emission auxiliary layer 154, an emission layer 155, an electron transport layer 157, an electron injection layer 159, and a second electrode 190 sequentially stacked in this stated order.

Explanations of the layers included in organic light-emitting devices 11 and 12 illustrated in FIGS. 5 and 6 may be the same as described above.

Hereinbefore, an organic light-emitting device according to an embodiment of the present disclosure has been described in connection with FIGS. 1-6. However, embodiments of the present disclosure are not limited thereto.

The layers constituting the hole transport region, the emission layer, and the layers constituting the electron transport region may be formed in a specific region using one or more suitable methods selected from vacuum deposition, spin coating, casting, Langmuir-Blodgett (LB) deposition, ink-jet printing, laser-printing, and laser-induced thermal imaging.

When the layers constituting the hole transport region, the emission layer, and the layers constituting the electron transport region are each formed by vacuum deposition, for example, the vacuum deposition may be performed at a deposition temperature of about 100 to about 500° C., at a vacuum degree of about $10^{-8}$ to about $10^{-3}$ torr, and at a deposition rate of about 0.01 to about 100 Å/sec, depending on the compound to be included in each layer, and the structure of each layer to be formed.

When the layers constituting the hole transport region, the emission layer, and the layers constituting the electron transport region are each formed by spin coating, the spin coating may be performed at a coating speed of about 2,000 rpm to about 5,000 rpm and at a heat treatment temperature of about 80° C. to 200, depending on the compound to be included in each layer, and the structure of each layer to be formed.

General Definitions of Substituents

The term "$C_1$-$C_{60}$ alkyl group", as used herein, refers to a linear or branched aliphatic saturated hydrocarbon monovalent group having 1 to 60 carbon atoms, and non-limiting examples thereof may include a methyl group, an ethyl group, a propyl group, an isobutyl group, a sec-butyl group, a tert-butyl group, a pentyl group, an iso-amyl group, and a hexyl group. The term "$C_1$-$C_{60}$ alkylene group", as used herein, refers to a divalent group having substantially the same structure as the $C_1$-$C_{60}$ alkyl group.

The term "$C_2$-$C_{60}$ alkenyl group", as used herein, refers to a hydrocarbon group having at least one carbon-carbon double bond in the body (e.g., middle) or at the terminus of the $C_2$-$C_{60}$ alkyl group, and non-limiting examples thereof may include an ethenyl group, a propenyl group, and a butenyl group. The term "$C_2$-$C_{60}$ alkenylene group", as used herein, refers to a divalent group having substantially the same structure as the $C_2$-$C_{60}$ alkenyl group.

The term "$C_2$-$C_{60}$ alkynyl group", as used herein, refers to a hydrocarbon group having at least one carbon-carbon triple bond in the body (e.g., middle) or at the terminus of the $C_2$-$C_{60}$ alkyl group, and non-limiting examples thereof may include an ethynyl group and a propynyl group. The term "$C_2$-$C_{60}$ alkynylene group", as used herein, refers to a divalent group having substantially the same structure as the $C_2$-$C_{60}$ alkynyl group.

The term "$C_1$-$C_{60}$ alkoxy group", as used herein, refers to a monovalent group represented by —O-$A_{101}$ (wherein $A_{101}$ is a $C_1$-$C_{60}$ alkyl group), and non-limiting examples thereof may include a methoxy group, an ethoxy group, and an isopropyloxy group.

The term "$C_3$-$C_{10}$ cycloalkyl group", as used herein, refers to a monovalent saturated hydrocarbon monocyclic group having 3 to 10 carbon atoms, and non-limiting examples thereof may include a cyclopropyl group, a cyclobutyl group, a cyclopentyl group, a cyclohexyl group, and a cycloheptyl group. The term "$C_3$-$C_{10}$ cycloalkylene group", as used herein, refers to a divalent group having substantially the same structure as the $C_3$-$C_{10}$ cycloalkyl group.

The term "$C_1$-$C_{10}$ heterocycloalkyl group", as used herein, refers to a monovalent monocyclic group having at least one heteroatom selected from N, O, Si, phosphorus (P), and S as a ring-forming atom and 1 to 10 carbon atoms, and non-limiting examples thereof may include a 1,2,3,4-oxatriazolidinyl group, a tetrahydrofuranyl group, and a tetrahydrothiophenyl group. The term "$C_1$-$C_{10}$ heterocycloalkylene group", as used herein, refers to a divalent group having substantially the same structure as the $C_1$-$C_{10}$ heterocycloalkyl group.

The term "$C_3$-$C_{10}$ cycloalkenyl group", as used herein, refers to a monovalent saturated monocyclic group that has 3 to 10 carbon atoms and at least one carbon-carbon double bond in the ring thereof and does not have aromaticity, and non-limiting examples thereof may include a cyclopentenyl group, a cyclohexenyl group, and a cycloheptenyl group. The term "$C_3$-$C_{10}$ cycloalkenylene group", as used herein, refers to a divalent group having substantially the same structure as the $C_3$-$C_{10}$ cycloalkenyl group.

The term "$C_1$-$C_{10}$ heterocycloalkenyl group", as used herein, refers to a monovalent monocyclic group that has at least one heteroatom selected from N, O, Si, P, and S as a ring-forming atom, 1 to 10 carbon atoms, and at least one double bond in its ring. Non-limiting examples of the $C_1$-$C_{10}$ heterocycloalkenyl group may include a 4,5-dihydro-1,2,3,4-oxatriazolyl group, a 2,3-dihydrofuranyl group, and a 2,3-dihydrothiophenyl group. The term "$C_1$-$C_{10}$ heterocycloalkenylene group", as used herein, refers to a divalent group having substantially the same structure as the $C_1$-$C_{10}$ heterocycloalkenyl group.

The term "$C_6$-$C_{60}$ aryl group", as used herein, refers to a monovalent group having an aromatic system having 6 to 60 carbon atoms, and the term "$C_6$-$C_{60}$ arylene group", as used herein, refers to a divalent group having an aromatic system having 6 to 60 carbon atoms. Non-limiting examples of the $C_6$-$C_{60}$ aryl group may include a phenyl group, a naphthyl group, an anthracenyl group, a phenanthrenyl group, a pyrenyl group, and a chrysenyl group. When the $C_6$-$C_{60}$ aryl group and the $C_6$-$C_{60}$ arylene group each include two or more rings, the rings may be condensed (e.g., fused).

The term "$C_1$-$C_{60}$ heteroaryl group", as used herein, refers to a monovalent group having a heterocyclic aromatic system that has at least one heteroatom selected from N, O, Si, P, and S as a ring-forming atom, and 1 to 60 carbon atoms. The term "$C_1$-$C_{60}$ heteroarylene group", as used herein, refers to a divalent group having a heterocyclic aromatic system that has at least one heteroatom selected from N, O, P, and S as a ring-forming atom, and 1 to 60 carbon atoms. Non-limiting examples of the $C_1$-$C_{60}$ heteroaryl group may include a pyridinyl group, a pyrimidinyl group, a pyrazinyl group, a pyridazinyl group, a triazinyl group, a quinolinyl group, and an isoquinolinyl group. When the $C_1$-$C_{60}$ heteroaryl group and the $C_1$-$C_{60}$ heteroarylene group each include two or more rings, the rings may be condensed (e.g., fused).

The term "$C_6$-$C_{60}$ aryloxy group", as used herein, indicates —O-$A_{102}$ (wherein $A_{102}$ is a $C_6$-$C_{60}$ aryl group), and the term "$C_6$-$C_{60}$ arylthio group", as used herein, indicates —S-$A_{103}$ (wherein $A_{103}$ is a $C_6$-$C_{60}$ aryl group).

The term "monovalent non-aromatic condensed polycyclic group", as used herein, refers to a monovalent group that has two or more rings condensed (e.g., fused), only carbon atoms as ring-forming atoms (for example, 8 to 60 carbon atoms), and non-aromaticity in the entire molecular structure. The term "divalent non-aromatic condensed polycyclic group", as used herein, refers to a divalent group having substantially the same structure as the monovalent non-aromatic condensed polycyclic group.

The term "monovalent non-aromatic condensed heteropolycyclic group", as used herein, refers to a monovalent group that has two or more rings condensed to each other, has at least one heteroatom selected from N, O, Si, P, and S in addition to carbon atoms (for example, 1 to 60 carbon atoms) as ring-forming atoms, and has non-aromaticity in the entire molecular structure. The term "divalent non-aromatic condensed heteropolycyclic group", as used herein, refers to a divalent group having substantially the same structure as the monovalent non-aromatic condensed heteropolycyclic group.

The term "$C_5$-$C_{60}$ carbocyclic group", as used herein, refers to a monocyclic or polycyclic group having 5 to 60 carbon atoms as the only ring-forming atoms. The term "$C_5$-$C_{60}$ carbocyclic group", as used herein, refers to an aromatic carbocyclic group or a non-aromatic carbocyclic group. The term "$C_5$-$C_{60}$ carbocyclic group", as used herein, refers to a ring (such as a benzene), a monovalent group (such as a phenyl group), or a divalent group (such as a phenylene group). In one or more embodiments, depending on the number of substituents connected to the $C_5$-$C_{60}$ carbocyclic group, the $C_5$-$C_{60}$ carbocyclic group may be a trivalent group or a quadrivalent group.

The term "$C_1$-$C_{60}$ heterocyclic group", as used herein, refers to a group having substantially the same structure as the $C_1$-$C_{60}$ carbocyclic group, except that at least one heteroatom selected from N, O, Si, P, and S is used in addition to carbon (for example, 1 to 60 carbon atoms) as ring-forming atoms.

At least one substituent of the substituted $C_5$-$C_{60}$ carbocyclic group, the substituted $C_1$-$C_{60}$ heterocyclic group, the substituted $C_3$-$C_{10}$ cycloalkylene group, the substituted $C_1$-$C_{10}$ heterocycloalkylene group, the substituted $C_3$-$C_{10}$ cycloalkenylene group, the substituted $C_1$-$C_{10}$ heterocycloalkenylene group, the substituted $C_6$-$C_{60}$ arylene group, the substituted $C_1$-$C_{60}$ heteroarylene group, the substituted divalent non-aromatic condensed polycyclic group, the substituted divalent non-aromatic condensed heteropolycyclic group, the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_6$-$C_{60}$ aryloxy group, the substituted $C_6$-$C_{60}$ arylthio group, the substituted $C_1$-$C_{60}$ heteroaryl group, the substituted monovalent non-aromatic condensed polycyclic group, and the substituted monovalent non-aromatic condensed heteropolycyclic group may be selected from the group consisting of:

deuterium (-D), —F, —Cl, —Br, —I, a hydroxyl group, a cyano group, a nitro group, an amidino group, a hydrazino group, a hydrazono group, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from deuterium, —F, —Cl, —Br, —I, a hydroxyl group, a cyano group, a nitro group, an amidino group, a hydrazino group, a hydrazono group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —Si($Q_{11}$)($Q_{12}$)($Q_{13}$), —N($Q_{11}$)($Q_{12}$), —B($Q_{11}$)($Q_{12}$), —C(=O)($Q_{11}$), —S(=O)$_2$($Q_{11}$), and —P(=O)($Q_{11}$)($Q_{12}$), a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group, each substituted with at least one selected from deuterium, —F, —Cl, —Br, —I, a hydroxyl group, a cyano group, a nitro group, an amidino group, a hydrazino group, a hydrazono group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —Si($Q_{21}$)($Q_{22}$)($Q_{23}$), —N($Q_{21}$)($Q_{22}$), —B($Q_{21}$)($Q_{22}$), —C(=O)($Q_{21}$), —S(=O)$_2$($Q_{21}$), and —P(=O)($Q_{21}$)($Q_{22}$); and —Si($Q_{31}$)($Q_{32}$)($Q_{33}$), —N($Q_{31}$)($Q_{32}$), —B($Q_{31}$)($Q_{32}$), —C(=O)($Q_{31}$), —S(=O)$_2$($Q_{31}$), and —P(=O)($Q_{31}$)($Q_{32}$), wherein $Q_1$ to $Q_3$, $Q_{11}$ to $Q_{13}$, $Q_{21}$ to $Q_{23}$, and $Q_{31}$ to $Q_{33}$ may each independently be selected from hydrogen, deuterium, —F, —Cl, —Br, —I, a hydroxyl group, a cyano group, a nitro group, an amidino group, a hydrazino group, a hydrazono group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryl group substituted with a $C_1$-$C_{60}$ alkyl group, a $C_6$-$C_{60}$ aryl group substituted with a $C_6$-$C_{60}$ aryl group, a terphenyl group, a $C_1$-$C_{60}$ heteroaryl group, a $C_1$-$C_{60}$ heteroaryl group substituted with a $C_1$-$C_{60}$ alkyl group, a $C_1$-$C_{60}$ heteroaryl group substituted with a $C_6$-$C_{60}$ aryl group, a monovalent non-aromatic condensed polycyclic group, and a monovalent non-aromatic condensed heteropolycyclic group.

The term "Ph" as used herein represents a phenyl group, the term "Me" as used herein represents a methyl group, the term "Et" as used herein represents an ethyl group, the term "ter-Bu" or "$Bu^t$" as used herein represents a tert-butyl group, and the term "OMe" as used herein represents a methoxy group.

The term "biphenyl group" as used herein refers to a "phenyl group substituted with a phenyl group". In other words, a biphenyl group is a substituted phenyl group having a $C_6$-$C_{60}$ aryl group as a substituent.

The term "terphenyl group" as used herein refers to a "phenyl group substituted with a biphenyl group". In other words, a terphenyl group is a substituted phenyl group having a $C_6$-$C_{60}$ aryl group substituted with a $C_6$-$C_{60}$ aryl group as a substituent.

Symbols * and *' used herein, unless defined otherwise, refer to a binding site to a neighboring atom in a corresponding formula.

Hereinafter, compounds according to an embodiment of the present disclosure and an organic light-emitting device according to an embodiment of the present disclosure will be described in more detail with reference to Synthesis Examples and Examples. The expression "B was used instead of A" used in describing Synthesis Examples refers to that an identical number of molar equivalents of B was used in place of A.

EXAMPLES

Example 1

An anode was prepared by cutting an ITO glass substrate (manufactured by Corning), on which ITO was formed to a thickness of 15 Ω/cm$^2$ (1,200 Å), to a size of 50 mm×50 mm×0.7 mm, ultrasonically cleaning the ITO glass substrate using isopropyl alcohol and pure water for 5 minutes each, and exposing the ITO glass substrate to UV irradiation and ozone for 30 minutes to clean. Then, the ITO glass substrate was loaded into a vacuum deposition apparatus.

m-MTDATA was vacuum-deposited on the ITO glass substrate (anode) to form a hole injection layer having a thickness of 700 Å. Then, NPB was vacuum-deposited on the hole injection layer to form a hole transport layer having a thickness of 100 Å.

ADN (as a host) and FBD (as a dopant) were co-deposited on the hole transport layer at a weight ratio of 95:5 to form an emission layer having a thickness of 300 Å.

Compound 2-48 was deposited on the emission layer to form a buffer layer having a thickness of 100 Å, and Compound 1-1 was deposited on the buffer layer to form an electron transport layer having a thickness of 200 Å. LiF was deposited on the electron transport layer to form an electron injection layer having a thickness of 10 Å. Al was vacuum-deposited on the electron injection layer to form a cathode having a thickness of 2,000 Å, thereby completing the manufacture of an organic light-emitting device.

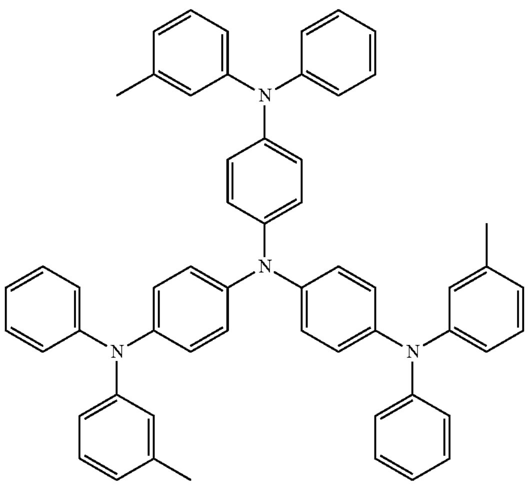

m-MTDATA

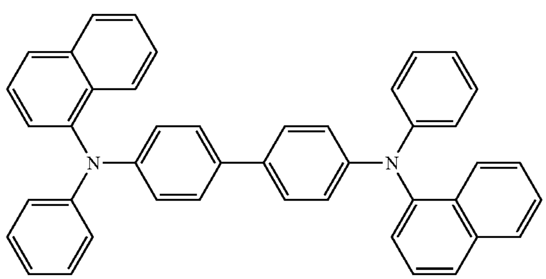

NPB

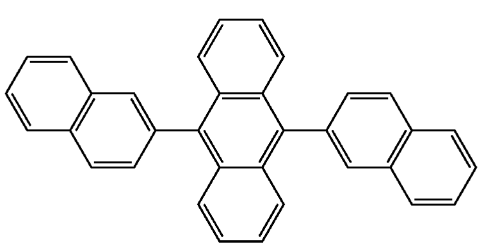

ADN

-continued

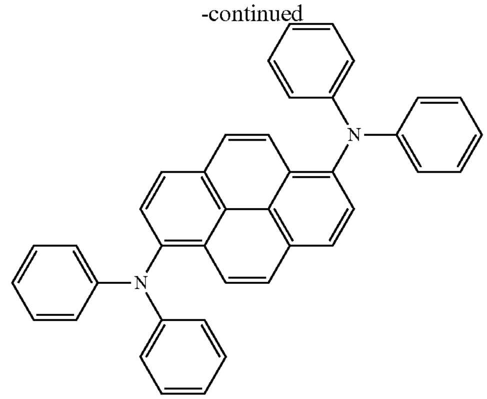

FBD

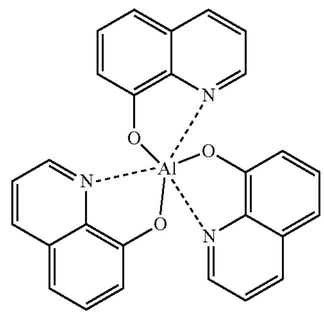

$Alq_3$

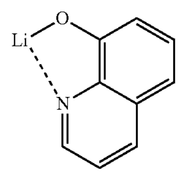

LiQ

Examples 2 to 34 and Comparative Examples 1 and 5

Additional organic light-emitting devices were manufactured in substantially the same manner as in Example 1, except that the compounds shown in Table 5 were used instead of Compounds 2-48 and 1-1 in forming each buffer layer and each electron transport layer.

Evaluation Example 1

The driving voltage and efficiency of each of the organic light-emitting devices of Examples 1 to 34 and Comparative Examples 1 to 5 were evaluated using a Keithley SMU 236 meter. The results thereof are shown in Table 5:

TABLE 5

| | Buffer layer | Electron transport layer (weight ratio) | Driving voltage (V) | Efficiency (cd/A) |
|---|---|---|---|---|
| Example 1 | Compound 2-48 | Compound 1-1 | 4.6 | 4.9 |
| Example 2 | Compound 2-147a | Compound 1-1 | 4.5 | 4.8 |
| Example 3 | Compound 2-162 | Compound 1-1 | 4.3 | 5.0 |
| Example 4 | Compound 2-147a | Compound 1-1:LiQ (5:5) | 4.6 | 5.0 |
| Example 5 | Compound 2-136a | Compound 1-8 | 4.6 | 4.8 |
| Example 6 | Compound 2-58 | Compound 1-8 | 4.6 | 4.9 |

TABLE 5-continued

| | Buffer layer | Electron transport layer (weight ratio) | Driving voltage (V) | Effi-ciency (cd/A) |
|---|---|---|---|---|
| Example 7 | Compound 2-190 | Compound 1-8 | 4.6 | 5.0 |
| Example 8 | Compound 2-58 | Compound 1-8:LiQ (5:5) | 4.5 | 4.9 |
| Example 9 | Compound 2-48 | Compound 1-9 | 4.7 | 4.6 |
| Example 10 | Compound 2-48 | Compound 1-13 | 4.5 | 5.0 |
| Example 11 | Compound 2-136a | Compound 1-13 | 4.6 | 4.9 |
| Example 12 | Compound 2-64 | Compound 1-13 | 4.5 | 5.0 |
| Example 13 | Compound 2-64 | Compound 1-13:LiQ (5:5) | 4.4 | 5.0 |
| Example 14 | Compound 2-147a | Compound 1-14 | 4.7 | 4.9 |
| Example 15 | Compound 2-58 | Compound 1-14 | 4.5 | 5.2 |
| Example 16 | Compound 2-190 | Compound 1-14 | 4.6 | 5.0 |
| Example 17 | Compound 2-190 | Compound 1-14 LiQ (5:5) | 4.5 | 5.1 |
| Example 18 | Compound 2-58 | Compound 1-15 | 4.6 | 5.0 |
| Example 19 | Compound 2-162 | Compound 1-15 | 4.7 | 5.2 |
| Example 20 | Compound 2-190 | Compound 1-15 | 4.5 | 5.0 |
| Example 21 | Compound 2-64 | Compound 1-15 LiQ (5:5) | 4.6 | 5.0 |
| Example 22 | Compound 2-48 | Compound 1-19 | 4.7 | 4.6 |
| Example 23 | Compound 2-48 | Compound 1-22 | 4.6 | 4.8 |
| Example 24 | Compound 2-190 | Compound 1-25 | 4.6 | 4.7 |
| Example 25 | Compound 2-190 | Compound 1-43 | 4.6 | 4.8 |
| Example 26 | Compound 2-48 | Compound 1-34 | 4.7 | 4.8 |
| Example 27 | Compound 2-48 | Compound 1-34:Li (98:2) | 4.6 | 4.7 |
| Example 28 | Compound 2-58 | Compound 1-37 | 4.7 | 4.8 |
| Example 29 | Compound 2-58 | Compound 1-37:Li (98:2) | 4.5 | 4.8 |
| Example 30 | Compound 2-162 | Compound 1-38 | 4.6 | 4.7 |
| Example 31 | Compound 2-162 | Compound 1-38:Li (98:2) | 4.6 | 4.8 |
| Example 32 | Compound 2-190 | Compound 1-45 | 4.7 | 4.9 |
| Example 33 | Compound 2-190 | Compound 1-45:LiQ (5:5) | 4.6 | 4.8 |
| Example 34 | Compound 2-190 | Compound 1-45:Li (98:2) | 4.5 | 5.0 |
| Comparative Example 1 | | $Alq_3$ | 4.9 | 4.4 |
| Comparative Example 2 | | Compound 1-8 | 4.6 | 4.6 |
| Comparative Example 3 | | Compound 1-13 | 4.7 | 4.55 |
| Comparative Example 4 | Compound 2-48 | $Alq_3$ | 4.7 | 4.5 |
| Comparative Example 5 | Compound 2-190 | $Alq_3$ | 4.7 | 4.5 |

Referring to Table 5, each of the organic light-emitting devices of Examples 1 to 34 had a low driving voltage and high efficiency compared to each of the organic light-emitting devices of Comparative Examples 1 to 5.

Example 35

An anode was prepared by cutting an ITO glass substrate (manufactured by Corning), on which ITO was formed to a thickness of 15 Ω/cm$^2$ (1,200 Å), to a size of 50 mm×50 mm×0.7 mm, ultrasonically cleaning the ITO glass substrate using isopropyl alcohol and pure water for 5 minutes each, and exposing to UV irradiation and ozone for 30 minutes to clean. Then, the ITO glass substrate was loaded into a vacuum deposition apparatus.

m-MTDATA was vacuum-deposited on the ITO glass substrate (anode) to form a hole injection layer having a thickness of 700 Å. Then, TCTA was vacuum-deposited on the hole injection layer to form a hole transport layer having a thickness of 100 Å.

CBP (as a host) and Ir(ppy)$_3$ (as a dopant) were co-deposited on the hole transport layer at a weight ratio of 90:10 to form an emission layer having a thickness of 300 Å.

Compound 2-147a was deposited on the emission layer to form a buffer layer having a thickness of 100 Å, and Compound 1-1 was deposited on the buffer layer to form an electron transport layer having a thickness of 200 Å. LiF was deposited on the electron transport layer to form an electron injection layer having a thickness of 10 Å. Al was vacuum-deposited on the electron injection layer to form a cathode having a thickness of 2,000 Å, thereby completing the manufacture of an organic light-emitting device.

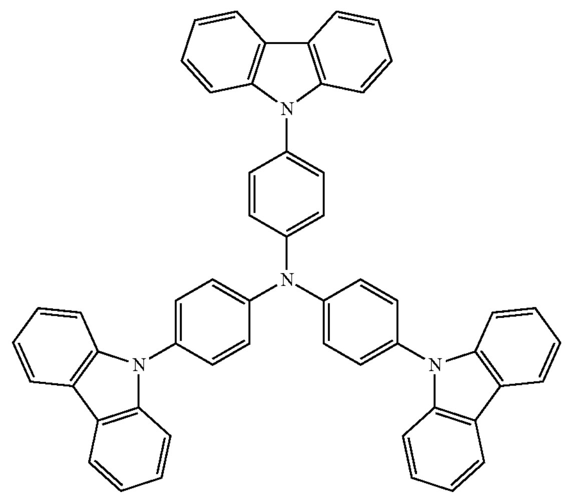

TCTA

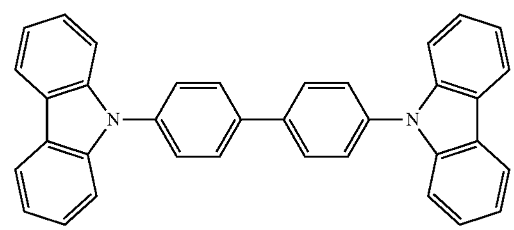

CBP

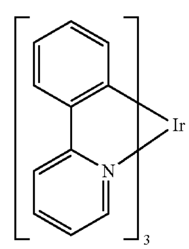

Ir(ppy)$_3$

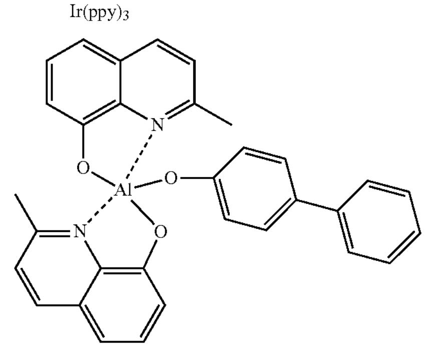

BAlq

Examples 36 to 57 and Comparative Examples 6 to 10

Additional organic light-emitting devices were manufactured in substantially the same manner as in Example 35, except that the compounds shown in Table 6 were used instead of Compounds 2-147a and 1-1 in forming each buffer layer and each electron transport layer.

Evaluation Example 2

The driving voltage and efficiency of each of the organic light-emitting devices of Examples 35 to 57 and Comparative Examples 6 to 10 were evaluated using a Keithley SMU 236 meter. The results thereof are shown in Table 6:

TABLE 6

| | Buffer layer | Electron transport layer (weight ratio) | Driving voltage (V) | Efficiency (cd/A) |
|---|---|---|---|---|
| Example 35 | Compound 2-147a | Compound 1-1 | 5.6 | 39.0 |
| Example 36 | Compound 2-58 | Compound 1-1 | 5.7 | 39.2 |
| Example 37 | Compound 2-58 | Compound 1-1:LiQ (5:5) | 5.6 | 40.5 |
| Example 38 | Compound 2-64 | Compound 1-8 | 5.6 | 40.0 |
| Example 39 | Compound 2-162 | Compound 1-8 | 5.6 | 41.0 |
| Example 40 | Compound 2-162 | Compound 1-8:LiQ (5:5) | 5.6 | 41.5 |
| Example 41 | Compound 2-147a | Compound 1-9 | 5.8 | 39.0 |
| Example 42 | Compound 2-136a | Compound 1-13 | 5.6 | 40.5 |
| Example 43 | Compound 2-162 | Compound 1-13 | 5.7 | 40.2 |
| Example 44 | Compound 2-162 | Compound 1-13:LiQ (5:5) | 5.6 | 41.2 |
| Example 45 | Compound 2-58 | Compound 1-14 | 5.6 | 40.1 |
| Example 46 | Compound 2-162 | Compound 1-14 | 5.6 | 41.5 |
| Example 47 | Compound 2-58 | Compound 1-14:LiQ (5:5) | 5.7 | 40.5 |
| Example 48 | Compound 2-48 | Compound 1-15 | 5.7 | 39.5 |
| Example 49 | Compound 2-190 | Compound 1-15 | 5.8 | 39.7 |
| Example 50 | Compound 2-190 | Compound 1-15:LiQ (5:5) | 5.7 | 39.0 |
| Example 51 | Compound 2-136a | Compound 1-19 | 5.8 | 39.5 |
| Example 52 | Compound 2-64 | Compound 1-43 | 5.7 | 39.0 |
| Example 53 | Compound 2-48 | Compound 1-34 | 5.7 | 39.2 |
| Example 54 | Compound 2-48 | Compound 1-34:Li (98:2) | 5.6 | 40.0 |
| Example 55 | Compound 2-64 | Compound 1-45 | 5.8 | 38.5 |
| Example 56 | Compound 2-64 | Compound 1-45:LiQ (5:5) | 5.7 | 38.8 |
| Example 57 | Compound 2-64 | Compound 1-45:Li (98:2) | 5.6 | 40.0 |
| Comparative Example 6 | BAlq | $Alq_3$ | 6.1 | 36.1 |
| Comparative Example 7 | BAlq | Compound 1-8 | 5.8 | 37.5 |
| Comparative Example 8 | BAlq | Compound 1-13 | 5.7 | 38.0 |
| Comparative Example 9 | Compound 2-136a | $Alq_3$ | 6.0 | 38.0 |
| Comparative Example 10 | Compound 2-58 | $Alq_3$ | 5.9 | 37.3 |

Referring to Table 6, each of the organic light-emitting devices of Examples 35 to 57 had a low driving voltage and high efficiency compared to each of the organic light-emitting devices of Comparative Examples 6 to 10.

Example 58

An anode was prepared by cutting an ITO glass substrate (manufactured by Corning), on which ITO was formed to a thickness of 15 $\Omega/cm^2$ (1,200 Å), to a size of 50 mm×50 mm×0.7 mm, ultrasonically cleaning the ITO glass substrate using isopropyl alcohol and pure water for 5 minutes each, and exposing to UV irradiation and ozone for 30 minutes to clean. Then, the ITO glass substrate was loaded into a vacuum deposition apparatus.

m-MTDATA was vacuum-deposited on the ITO glass substrate (anode) to form a hole injection layer having a thickness of 700 Å. Then, TCTA was vacuum-deposited on the hole injection layer to form a hole transport layer having a thickness of 100 Å.

CBP (as a host) and $Ir(bzq)_3$ (as a dopant) were co-deposited on the hole transport layer at a weight ratio of 96:4 to form an emission layer having a thickness of 300 Å.

Compound 2-136a was deposited on the emission layer to form a buffer layer having a thickness of 100 Å, and Compound 1-1 was deposited on the buffer layer to form an electron transport layer having a thickness of 200 Å. LiF was deposited on the electron transport layer to form an electron injection layer having a thickness of 10 Å. Al was vacuum-deposited on the electron injection layer to form a cathode having a thickness of 2,000 Å, thereby completing the manufacture of an organic light-emitting device.

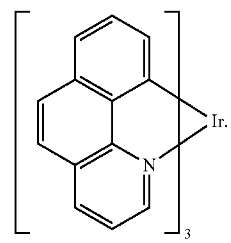

$Ir(bzq)_3$

Example 59 to 75 and Comparative Example 11 to 15

Additional organic light-emitting devices were manufactured in substantially the same manner as in Example 35, except that the compounds shown in Table 7 were each used instead of Compounds 2-136a and 1-1 in forming a buffer layer and an electron transport layer.

Evaluation Example 3

The driving voltage and efficiency of each of the organic light-emitting devices of Examples 58 to 75 and Comparative Examples 11 to 15 were evaluated using a Keithley SMU 236 meter. The results thereof are shown in Table 7:

TABLE 7

| | Buffer layer | Electron transport layer (weight ratio) | Driving voltage (V) | Efficiency (cd/A) |
|---|---|---|---|---|
| Example 58 | Compound 2-136a | Compound 1-1 | 5.9 | 24 |
| Example 59 | Compound 2-64 | Compound 1-1 | 5.8 | 23.7 |
| Example 60 | Compound 2-64 | Compound 1-1:LiQ 5:5 | 5.7 | 24.2 |
| Example 61 | Compound 2-48 | Compound 1-8 | 5.8 | 24.1 |
| Example 62 | Compound 2-147a | Compound 1-8 | 5.8 | 23.5 |
| Example 63 | Compound 2-48 | Compound 1-8:LiQ (5:5) | 5.6 | 24.0 |
| Example 64 | Compound 2-147a | Compound 1-9 | 5.7 | 23.5 |
| Example 65 | Compound 2-147a | Compound 1-13 | 5.6 | 24.0 |
| Example 66 | Compound 2-190 | Compound 1-13 | 5.6 | 24.1 |
| Example 67 | Compound 2-147a | Compound 1-13:LiQ (5:5) | 5.6 | 24.5 |

TABLE 7-continued

| | Buffer layer | Electron transport layer (weight ratio) | Driving voltage (V) | Efficiency (cd/A) |
|---|---|---|---|---|
| Example 68 | Compound 2-136a | Compound 1-14 | 5.7 | 23.2 |
| Example 69 | Compound 2-64 | Compound 1-14 | 5.7 | 24.2 |
| Example 70 | Compound 2-136a | Compound 1-14:LiQ (5:5) | 5.6 | 24.0 |
| Example 71 | Compound 2-136a | Compound 1-15 | 5.7 | 24.5 |
| Example 72 | Compound 2-162 | Compound 1-15 | 5.7 | 24.0 |
| Example 73 | Compound 2-136a | Compound 1-15:LiQ (5:5) | 5.6 | 24.2 |
| Example 74 | Compound 2-64 | Compound 1-45 | 5.8 | 23.5 |
| Example 75 | Compound 2-64 | Compound 1-45:Li (98:2) | 5.8 | 23.3 |
| Comparative Example 11 | BAlq | $Alq_3$ | 6.2 | 21.6 |
| Comparative Example 12 | BAlq | Compound 1-8 | 6.0 | 22.5 |
| Comparative Example 13 | BAlq | Compound 1-13 | 6.1 | 23.0 |
| Comparative Example 14 | Compound 2-136a | $Alq_3$ | 6.1 | 23.1 |
| Comparative Example 15 | Compound 2-58 | $Alq_3$ | 6.0 | 23.3 |

Referring to Table 7, each of the organic light-emitting devices of Examples 58 to 75 had a low driving voltage and high efficiency compared to each of the organic light-emitting devices of Comparative Examples 11 to 15.

Example 76

An anode was prepared by cutting an ITO glass substrate (manufactured by Corning), on which ITO was formed to a thickness of 15 Ω/cm² (1,200 Å), to a size of 50 mm×50 mm×0.7 mm, ultrasonically cleaning the ITO glass substrate using isopropyl alcohol and pure water for 5 minutes each, and exposing to UV irradiation and ozone for 30 minutes to clean. Then, the ITO glass substrate was loaded into a vacuum deposition apparatus.

m-MTDATA was vacuum-deposited on the ITO glass substrate (anode) to form a hole injection layer having a thickness of 700 Å. Then, TCTA was vacuum-deposited on the hole injection layer to form a hole transport layer having a thickness of 100 Å.

CBP (as a host) and $Ir(pq)_2(acac)$ (as a dopant) were co-deposited on the hole transport layer at a weight ratio of 96:4 to form an emission layer having a thickness of 300 Å.

Compound 2-48 was deposited on the emission layer to form a buffer layer having a thickness of 100 Å, and Compound 1-13 was deposited on the buffer layer to form an electron transport layer having a thickness of 200 Å. LiF was deposited on the electron transport layer to form an electron injection layer having a thickness of 10 Å. Al was vacuum-deposited on the electron injection layer to form a cathode having a thickness of 2,000 Å, thereby completing the manufacture of an organic light-emitting device.

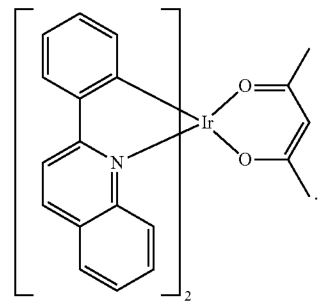

$Ir(pq)_2(acac)$

Comparative Example 16

An additional organic light-emitting device was manufactured in substantially the same manner as in Example 76, except that the compounds shown in Table 8 were each used instead of Compounds 2-48 and 1-13 in forming a buffer layer and an electron transport layer.

Evaluation Example 4

The driving voltage and efficiency of each of the organic light-emitting devices of Example 76 and Comparative Example 16 were evaluated using a Keithley SMU 236 meter. The results thereof are shown in Table 8:

TABLE 8

| | Buffer layer | Electron transport layer | Driving voltage (V) | Efficiency (cd/A) |
|---|---|---|---|---|
| Example 76 | Compound 2-48 | Compound 1-13 | 5.7 | 28.0 |
| Comparative Example 16 | BAlq | $Alq_3$ | 6.2 | 25.4 |

Referring to Table 8, the organic light-emitting device of Example 76 had a low driving voltage and high efficiency compared to the organic light-emitting device of Comparative Example 16.

According to one or more embodiments of the present disclosure, an organic light-emitting device may have a low driving voltage and high efficiency.

It should be understood that the example embodiments described herein should be considered in a descriptive sense only and not for purposes of limitation. Descriptions of features or aspects within each embodiment should typically be considered as being available for other similar features or aspects in other embodiments.

As used herein, the terms "use", "using", and "used" may be considered synonymous with the terms "utilize", "utilizing", and "utilized", respectively. Further, the use of "may" when describing embodiments of the present disclosure refers to "one or more embodiments of the present disclosure".

As used herein, the terms "substantially", "about", and similar terms are used as terms of approximation and not as terms of degree, and are intended to account for the inherent deviations in measured or calculated values that would be recognized by those of ordinary skill in the art.

Also, any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, For example, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein. Accordingly, Applicant reserves the right to amend this specification, including the claims and equivalents thereof, to expressly recite any sub-range subsumed within the ranges expressly recited herein.

While one or more embodiments have been described with reference to the drawings, it will be understood by those of ordinary skill in the art that various changes in form and details may be made therein without departing from the spirit and scope of the present disclosure as defined by the following claims and equivalents thereof.

What is claimed is:

1. An organic light-emitting device comprising:

a first electrode;

a second electrode facing the first electrode;

an emission layer between the first electrode and the second electrode;

a hole transport region between the first electrode and the emission layer; and an electron transport region between the emission layer and the second electrode, wherein the emission layer include a host and a dopant, the dopant is represented by Formula 501, the electron transport region comprises a buffer layer, an electron transport layer, and an electron injection layer, the electron transport layer comprises a first compound, the buffer layer comprises a second compound, the first compound is represented by one of Formulae 1A to 1E, Formula 1A

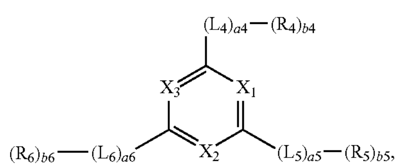

Formula 1B

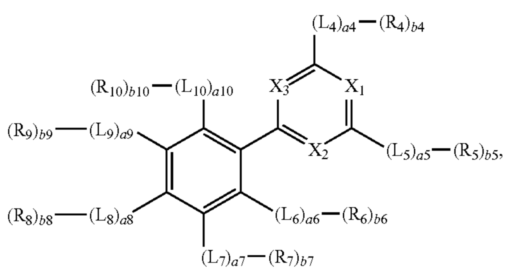

Formula 1C

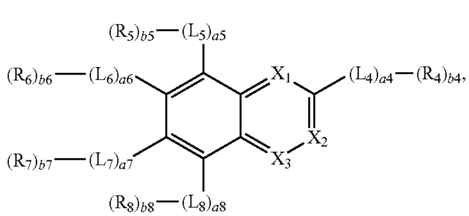

-continued

Formula 1D

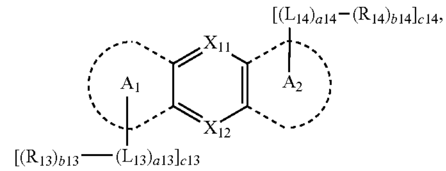

Formula 1E

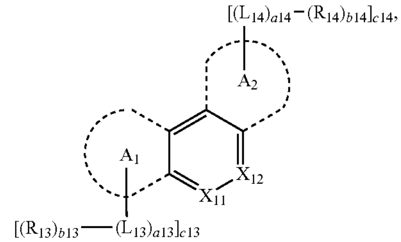

wherein, in Formulae 1A to 1E, rings $A_1$ and $A_2$ are each independently a $C_5$-$C_{60}$ carbocyclic group or a $C_1$-$C_3$ heterocyclic group, $X_1$ is N or C-$(L_1)_{a1}$-$(R_1)_{b1}$, $X_2$ is N or C-$(L_2)_{a2}$-$(R_2)_{b2}$, $X_3$ is N or C-$(L_3)_{a3}$-$(R_3)_{b3}$, and at least one selected from $X_1$ to $X_3$ is N, $X_{11}$ is N or C-$(L_{11})_{a11}$-$(R_{11})_{b11}$, and $X_{12}$ is N or C-$(L_{12})_{a12}$-$(R_{12})_{b12}$, $L_1$ to $L_{14}$ are each independently selected from a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group, a1 to a14 are each independently an integer selected from 0 to 5, $R_1$ to $R_{14}$ are each independently selected from hydrogen, deuterium, —F, —Cl, —Br, —I, a hydroxyl group, a cyano group, a nitro group, an amidino group, a hydrazino group, a hydrazono group, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —Si$(Q_1)(Q_2)(Q_3)$, —N$(Q_1)(Q_2)$, —B$(Q_1)(Q_2)$, —C(=O)$(Q_1)$, —S(=O)$_2(Q_1)$, and —P(=O)$(Q_1)(Q_2)$, b1 to b14 are each 1, c13 and c14 are each independently an integer selected from 0 to 5, $R_1$ and $R_4$ are optionally connected to form a saturated or unsaturated ring, and $R_1$ and $R_5$ are optionally connected to form a saturated or unsaturated ring, Formula 501

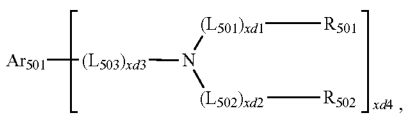

wherein, in Formula 501, $Ar_{501}$ is a substituted or unsubstituted $C_5$-$C_{60}$ carbocyclic group or a substituted or unsubstituted $C_1$-$C_{60}$ heterocyclic group, $L_{501}$ to $L_{503}$ are each independently selected from a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_6$ heteroarylene group, a substituted or unsubstituted divalent non-aromatic condensed polycyclic group, and a substituted or unsubstituted divalent non-aromatic condensed heteropolycyclic group, xd1 to xd3 are each independently an integer selected from 0 to 3, $R_{501}$ and $R_{502}$ are each independently selected from a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group, and xd4 is an integer selected from 1 to 6, and at least one substituent of the substituted $C_3$-$C_{10}$ cycloalkylene group, the substituted $C_1$-$C_{10}$ heterocycloalkylene group, the substituted $C_3$-$C_{10}$ cycloalkenylene group, the substituted $C_1$-$C_{10}$ heterocycloalkenylene group, the substituted $C_6$-$C_{60}$ arylene group, the substituted $C_1$-$C_6$ heteroarylene group, the substituted divalent non-aromatic condensed polycyclic group, the substituted divalent non-aromatic condensed heteropolycyclic group, the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_6$-$C_{60}$ aryloxy group, the substituted $C_6$-$C_{60}$ arylthio group, the substituted $C_1$-$C_{60}$ heteroaryl group, the substituted monovalent non-aromatic condensed polycyclic group, and the substituted monovalent non-aromatic condensed heteropolycyclic group is selected from the group consisting of:

deuterium, —F, —Cl, —Br, —I, a hydroxyl group, a cyano group, a nitro group, an amidino group, a hydrazino group, a hydrazono group, a $C_1$-$C_{60}$ alkyl group, a $C_2$-$C_{60}$ alkenyl group, a $C_2$-$C_{60}$ alkynyl group, and a $C_1$-$C_6$ alkoxy group;

a $C_1$-$C_{60}$ alkyl group, a $C_2$-$C_{60}$ alkenyl group, a $C_2$-$C_{60}$ alkynyl group, and a $C_1$-$C_6$ alkoxy group, each substituted with at least one selected from deuterium, —F, —Cl, —Br, —I, a hydroxyl group, a cyano group, a nitro group, an amidino group, a hydrazino group, a hydrazono group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —Si($Q_{11}$)($Q_{12}$)($Q_{13}$), —N($Q_{11}$)($Q_{12}$), —B($Q_{11}$)($Q_{12}$), —C(═O)($Q_{11}$), —S(=Q)$_2$($Q_{11}$), and —P(═O)($Q_{11}$)($Q_{12}$);

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, a biphenyl group, and a terphenyl group;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group, each substituted with at least one selected from deuterium, —F, —Cl, —Br, —I, a hydroxyl group, a cyano group, a nitro group, an amidino group, a hydrazino group, a hydrazono group, a $C_1$-$C_{60}$ alkyl group, a $C_2$-$C_{60}$ alkenyl group, a $C_2$-$C_{60}$ alkynyl group, a $C_1$-$C_6$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_6$ heteroaryl group, a monovalent non-aromatic condensed polycyclic group, a monovalent non-aromatic condensed heteropolycyclic group, —Si($Q_{21}$)($Q_{22}$)($Q_{23}$), —N($Q_{21}$)($Q_{22}$), —B($Q_{21}$)($Q_{22}$), —C(═O)($Q_{21}$), —S(═O)$_2$($Q_{21}$), and —P(═O)($Q_{21}$)($Q_{22}$); and —Si($Q_{31}$)($Q_{32}$)($Q_{33}$), —N($Q_{31}$)($Q_{32}$), —B($Q_{31}$)($Q_{32}$), —C(═O)($Q_{31}$), —S(═O)$_2$($Q_{31}$), and —P(═O)($Q_{31}$)($Q_{32}$), wherein $Q_1$ to $Q_3$, $Q_{11}$ to $Q_{13}$, $Q_{21}$ to $Q_{23}$, and $Q_{31}$ to $Q_{33}$ are each independently selected from hydrogen, deuterium, —F, —Cl, —Br, —I, a hydroxyl group, a cyano group, a nitro group, an amidino group, a hydrazino group, a hydrazono group, a $C_1$-$C_6$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryl group substituted with a $C_1$-$C_{60}$ alkyl group, a $C_6$-$C_{60}$ aryl group substituted with a $C_6$-$C_{60}$ aryl group, a terphenyl group, a $C_1$-$C_{60}$ heteroaryl group, a $C_1$-$C_{60}$ heteroaryl group substituted with a $C_1$-$C_{60}$ alkyl group, a $C_1$-$C_{60}$ heteroaryl group substituted with a $C_6$-$C_{60}$ aryl group, a monovalent non-aromatic condensed polycyclic group, and a monovalent non-aromatic condensed heteropolycyclic group, and the second compound is selected from Compounds 2-147a, 2-58, 2-64, 2-162, and 2-190:

2-147a

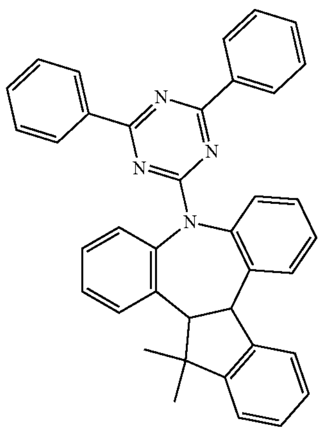

2-58

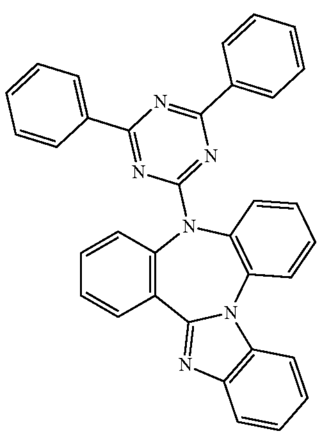

2-64

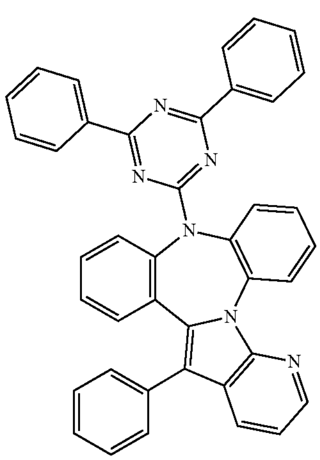

-continued 2-162

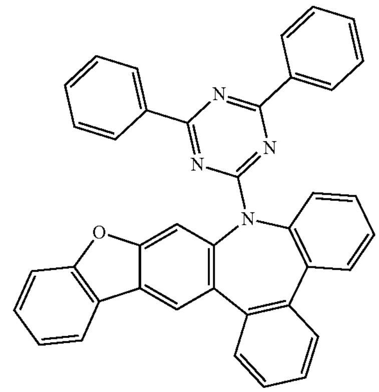

2-190

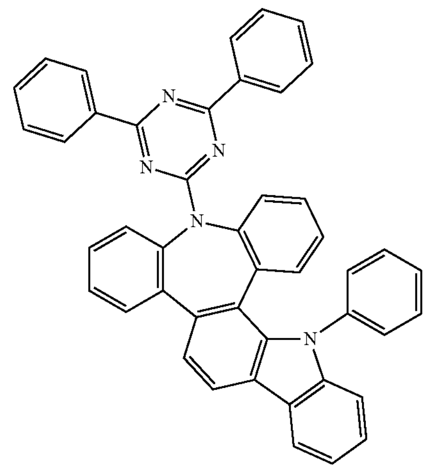

2. The organic light-emitting device of claim 1, wherein, in Formula 1D:

i) when at least one selected from $X_{11}$ and $X_{12}$ is N, rings $A_1$ and A2 are each independently selected from a benzene group, a naphthalene group, an anthracene group, an indene group, a fluorene group, a pyridine group, a pyrimidine group, a pyrazine group, a pyridazine group, a quinoline group, and an isoquinoline group, and ii) when $X_{11}$ is C-$(L_{11})_{a11}$-$(R_{11})_{b11}$ and $X_{12}$ is C-$(L_{12})_{a12}$-$(R_{12})_{b12}$, rings $A_1$ and $A_2$ are each independently selected from a pyridine group, a pyrimidine group, a pyrazine group, a pyridazine group, a quinoline group, and an isoquinoline group.

3. The organic light-emitting device of claim 1, wherein: in Formula 1 D, $X_{11}$ is N, and $X_{12}$ is C-$(L_{12})_{a12}$-$(R_{12})_{b12}$.

4. The organic light-emitting device of claim 1, wherein: $L_{13}$ and $L_{14}$ are each independently selected from the group consisting of:

a phenylene group, a pentalenylene group, an indenylene group, a naphthylene group, an azulenylene group, a heptalenylene group, an indacenylene group, an acenaphthylene group, a fluorenylene group, a spiro-bifluorenylene group, a spiro-benzofluorene-fluorenylene group, a benzofluorenylene group, a dibenzofluorenylene group, a phenalenylene group, a phenanthrenylene group, an anthracenylene group, a fluoranthenylene group, a triphenylenylene group, a pyrenylene group, a chrysenylene group, a naphthacenylene group, a picenylene group, a perylenylene group, a pentaphenylene group, a hexacenylene group, a pentacenylene group, a rubicenylene group, a coronenylene group, an ovalenylene group, a pyridinylene group, a pyrazinylene group, a pyrimidinylene group, a pyridazinylene group, a quinolinylene group, an isoquinolinylene group, a benzoquinolinylene group, a phthalazinylene group, a naphthyridinylene group, a quinoxalinylene group, a quinazolinylene group, a cinnolinylene group, a phenanthridinylene group, an acridinylene group, a phenanthrolinylene group, a phenazinylene group, a triazinylene group, a dibenzofuranylene group, a dibenzothiophenylene group, a dibenzosilolylene group, a carbazolylene group, a benzocarbazolylene group, a dibenzocarbazolylene group, a benzonaphthyridinylene group, an azafluorenylene group, an azaspiro-bifluorenylene group, an azacarbazolylene group, an azadibenzofuranylene group, an azadibenzothiophenylene group, and an azadibenzosilolylene group; and a phenylene group, a pentalenylene group, an indenylene group, a naphthylene group, an azulenylene group, a heptalenylene group, an indacenylene group, an acenaphthylene group, a fluorenylene group, a spiro-bifluorenylene group, a spiro-benzofluorene-fluorenylene group, a benzofluorenylene group, a dibenzofluorenylene group, a phenalenylene group, a phenanthrenylene group, an anthracenylene group, a fluoranthenylene group, a triphenylenylene group, a pyrenylene group, a chrysenylene group, a naphthacenylene group, a picenylene group, a perylenylene group, a pentaphenylene group, a hexacenylene group, a pentacenylene group, a rubicenylene group, a coronenylene group, an ovalenylene group, a pyridinylene group, a pyrazinylene group, a pyrimidinylene group, a pyridazinylene group, a quinolinylene group, an isoquinolinylene group, a benzoquinolinylene group, a phthalazinylene group, a naphthyridinylene group, a quinoxalinylene group, a quinazolinylene group, a cinnolinylene group, a phenanthridinylene group, an acridinylene group, a phenanthrolinylene group, a phenazinylene group, a triazinylene group, a dibenzofuranylene group, a dibenzothiophenylene group, a dibenzosilolylene group, a carbazolylene group, a benzocarbazolylene group, a dibenzocarbazolylene group, a benzonaphthyridinylene group, an azafluorenylene group, an azaspiro-bifluorenylene group, an azacarbazolylene group, an azadibenzofuranylene group, an azadibenzothiophenylene group, and an azadibenzosilolylene group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_1$-$C_{60}$ heteroaryl group, a monovalent non-aromatic condensed polycyclic group, a monovalent non-aromatic condensed heteropolycyclic group, a biphenyl group, a terphenyl group, —Si($Q_{31}$)($Q_{32}$)($Q_{33}$), —N($Q_{31}$)($Q_{32}$), —B($Q_{31}$)($Q_{32}$), —C(=O)($Q_{31}$), —S(=O)$_2$($Q_{31}$), and —P(=O)($Q_{31}$)($Q_{32}$), and wherein $Q_{31}$ to $Q_{33}$ are each independently selected from the group consisting of:

a $C_1$-$C_{10}$ alkyl group, a $C_1$-$C_{10}$ alkoxy group, a phenyl group, a biphenyl group, a terphenyl group, a naphthyl group, a pyridinyl group, a pyrimidinyl group, a pyrazinyl group, a quinolinyl group, an isoquinolinyl group, a quinoxalinyl group, and a quinazolinyl group; and a phenyl group, a biphenyl group, a terphenyl group, a naphthyl group, a pyridinyl group, a pyrimidinyl group, a pyrazinyl group, a quinolinyl group, an isoquinolinyl group, a quinoxalinyl group, and a quinazolinyl group, each substituted with at least one selected from a $C_1$-$C_{10}$ alkyl group, a $C_1$-$C_{10}$ alkoxy group, and a phenyl group.

5. The organic light-emitting device of claim 1, wherein:

$R_{13}$ and $R_{14}$ are each independently selected from the group consisting of:

hydrogen, deuterium, —F, —Cl, —Br, —I, a hydroxyl group, a cyano group, a nitro group, an amidino group, a hydrazino group, a hydrazono group, a $C_1$-$C_{20}$ alkyl group, and a $C_1$-$C_{20}$ alkoxy group;

a $C_1$-$C_{20}$ alkyl group and a $C_1$-$C_{20}$ alkoxy group, each substituted with at least one selected from deuterium, —F, —Cl, —Br, —I, a hydroxyl group, a cyano group, a nitro group, an amidino group, a hydrazino group, and a hydrazono group;

a phenyl group, a biphenyl group, a terphenyl group, a pentalenyl group, an indenyl group, a naphthyl group, an azulenyl group, an indacenyl group, an acenaphthyl group, a fluorenyl group, a spiro-bifluorenyl group, a benzofluorenyl group, a dibenzofluorenyl group, a spiro-benzofluorene-fluorenyl group, an indenofluorenyl group, a phenalenyl group, a phenanthrenyl group, an anthracenyl group, a fluoranthenyl group, a triphenylenyl group, a pyrenyl group, a chrysenyl group, a perylenyl group, a pentaphenyl group, a tetraphenyl group, a pyridinyl group, a pyrazinyl group, a pyrimidinyl group, a pyridazinyl group, a quinolinyl group, an isoquinolinyl group, a benzoquinolinyl group, a phthalazinyl group, a naphthyridinyl group, a quinoxalinyl group, a quinazolinyl group, a carbazolyl group, a phenanthridinyl group, an acridinyl group, a phenanthrolinyl group, a phenazinyl group, a triazinyl group, a dibenzofuranyl group, a dibenzothiophenyl group, a benzocarbazolyl group, a dibenzocarbazolyl group, a dibenzosilolyl group, an azafluorenyl group, an azaspiro-bifluorenyl group, an azacarbazolyl group, an azadibenzofuranyl group, an azadibenzothiophenyl group, an azadibenzosilolyl group, a benzofuranopyrimidinyl group, a benzothienopyrimidyl group, a pyrimidinoquinoxalinyl group, and an azaindenopyridinyl group; and a phenyl group, a biphenyl group, a terphenyl group, a pentalenyl group, an indenyl group, a naphthyl group, an azulenyl group, an indacenyl group, an acenaphthyl group, a fluorenyl group, a spiro-bifluorenyl group, a benzofluorenyl group, a dibenzofluorenyl group, a spiro-benzofluorene-fluorenyl group, an indenofluorenyl group, a phenalenyl group, a phenanthrenyl group, an anthracenyl group, a fluoranthenyl group, a triphenylenyl group, a pyrenyl group, a chrysenyl group, a perylenyl group, a pentaphenyl group, a tetraphenyl group, a pyridinyl group, a pyrazinyl group, a pyrimidinyl group, a pyridazinyl group, a quinolinyl group, an isoquinolinyl group, a benzoquinolinyl group, a phthalazinyl group, a naphthyridinyl group, a quinoxalinyl group, a quinazolinyl group, a carbazolyl group, a phenanthridinyl group, an acridinyl group, a phenanthrolinyl group, a phenazinyl group, a triazinyl group, a dibenzofuranyl group, a dibenzothiophenyl group, a benzocarbazolyl group, a dibenzocarbazolyl group, a dibenzosilolyl group, an azafluorenyl group, an azaspiro-bifluorenyl group, an azacarbazolyl group, an azadibenzofuranyl group, an azadibenzothiophenyl group, an azadibenzosilolyl group, a benzofuranopyrimidinyl group, a benzothienopyrimidyl group, a pyrimidinoquinoxalinyl group, and an azaindenopyridinyl group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a $C_3$-$C_{20}$ cycloalkyl group, a $C_6$-$C_{20}$ aryl group, a $C_3$-$C_{20}$ heteroaryl group, —Si($Q_{31}$)($Q_{32}$)($Q_{33}$), —N($Q_{31}$)($Q_{32}$), —B($Q_{31}$)($Q_{32}$), —C(═O)($Q_{31}$), —S(═O)$_2$($Q_{31}$), and —P(═O)($Q_{31}$)($Q_{32}$), wherein $Q_{31}$ to $Q_{33}$ are each independently selected from the group consisting of:

a $C_1$-$C_{10}$ alkyl group, a $C_1$-$C_{10}$ alkoxy group, a phenyl group, a biphenyl group, a terphenyl group, a naphthyl group, a pyridinyl group, a pyrimidinyl group, a pyrazinyl group, a quinolinyl group, an isoquinolinyl group, a quinoxalinyl group, and a quinazolinyl group; and a phenyl group, a biphenyl group, a terphenyl group, a naphthyl group, a pyridinyl group, a pyrimidinyl group, a pyrazinyl group, a quinolinyl group, an isoquinolinyl group, a quinoxalinyl group, and a quinazolinyl group, each substituted with at least one selected from a $C_1$-$C_{10}$ alkyl group, a $C_1$-$C_{10}$ alkoxy group, and a phenyl group.

6. The organic light-emitting device of claim 1, wherein:

the first compound is represented by one selected from Formulae 1 D(1) to 1D(3), 1E(1) to 1E(6), 1E(9), and 1E(12):

Formula 1D(1)

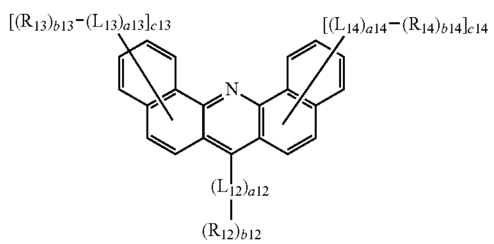

Formula 1D(2)

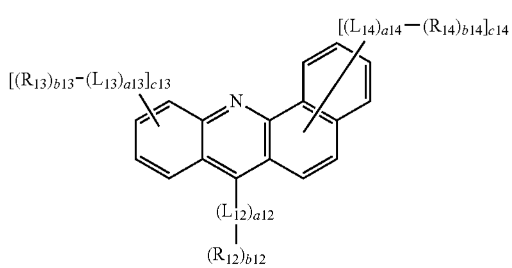

Formula 1D(3)

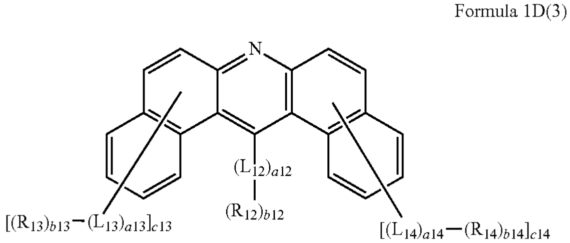

-continued

Formula 1E(1)

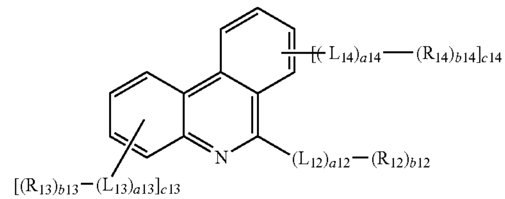

Formula 1E(2)

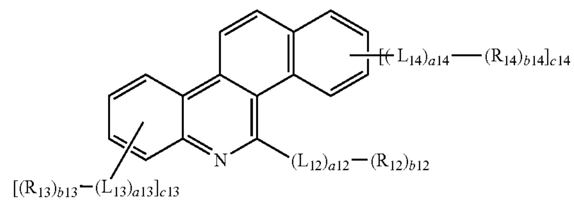

Formula 1E(3)

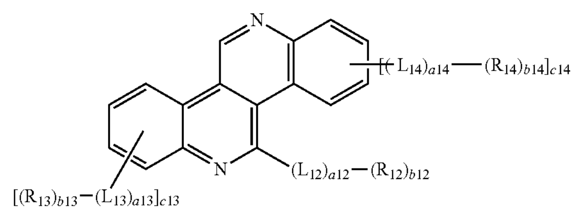

Formula 1E(4)

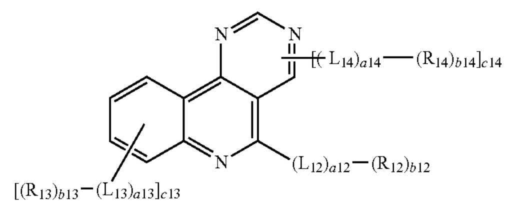

Formula 1E(5)

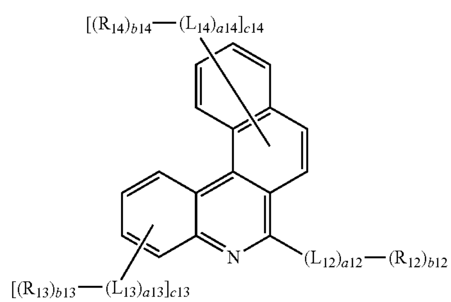

Formula 1E(6)

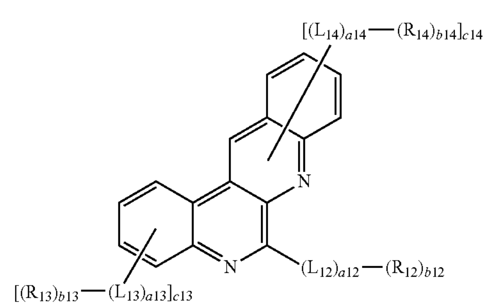

-continued

Formula 1E(9)

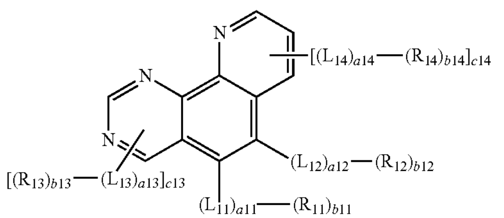

Formula 1E(12)

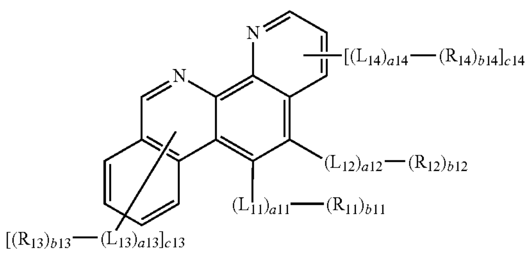

wherein $L_{11}$ to $L_{14}$, a11 to a14, $R_{11}$ to $R_{14}$, b11 to b14, c13, and c14 in Formulae 1D(1) to 1D(3), 1E(1) to 1E(6), 1E(9), and 1E(12) are each independently the same as described in connection with Formulae 1A to 1E.

7. The organic light-emitting device of claim 1, wherein: the electron transport layer further comprises an alkali metal, an alkaline earth metal, a rare earth metal, an alkali metal compound, an alkaline earth metal compound, a rare earth metal compound, an alkali metal complex, an alkaline earth metal complex, a rare earth metal complex, or a combination thereof.

8. The organic light-emitting device of claim 1, wherein: the electron injection layer comprises an alkali metal, an alkaline earth metal, a rare earth metal, an alkali metal compound, an alkaline earth metal compound, a rare earth metal compound, an alkali metal complex, an alkaline earth metal complex, a rare earth metal complex, or a combination thereof.

9. The organic light-emitting device of claim 8, wherein: the electron injection layer comprises Li, Na, K, Rb, Cs, Mg, Ca, Er, Tm, Yb, or a combination thereof.

10. The organic light-emitting device of claim 1, wherein: the hole transport region comprises a p-dopant, and the p-dopant has a lowest unoccupied molecular orbital (LUMO) energy level of about −3.5 eV or less.

11. The organic light-emitting device of claim 10, wherein the p-dopant comprises a cyano group-containing compound.

12. The organic light-emitting device of claim 1, wherein: the emission layer is a first-color-light emission layer, the organic light-emitting device further comprises: i) at least one second-color-light emission layer, or ii) at least one second-color-light emission layer and at least one third-color-light emission layer, each between the first electrode and the second electrode, a maximum emission wavelength of the first-color-light emission layer, a maximum emission wavelength of the second-color-light emission layer, and a maximum emission wavelength of the third-color-light emission layer are identical to or different from one another, and the organic light-emitting device is configured to emit a mixed light comprising a first-color-light and a second-color-light, or a mixed light comprising the first-color-light, the second-color-light, and a third-color-light.

* * * * *